US007546232B2

(12) United States Patent
Brooks et al.

(10) Patent No.: US 7,546,232 B2
(45) Date of Patent: Jun. 9, 2009

(54) MECHANICAL-ELECTRICAL TEMPLATE BASED METHOD AND APPARATUS

(75) Inventors: Ruven E. Brooks, Shorewood, WI (US); David W. Grooms, Delafield, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 350 days.

(21) Appl. No.: 11/206,721

(22) Filed: Aug. 18, 2005

(65) Prior Publication Data

US 2005/0278670 A1 Dec. 15, 2005

Related U.S. Application Data

(63) Continuation of application No. 10/674,588, filed on Sep. 30, 2003, now Pat. No. 6,993,456, which is a continuation of application No. 10/614,634, filed on Jul. 7, 2003, now Pat. No. 7,266,476, which is a continuation of application No. 10/304,190, filed on Nov. 26, 2002, now Pat. No. 6,862,553, which is a continuation of application No. 09/410,270, filed on Sep. 30, 1999, now Pat. No. 6,556,950.

(51) Int. Cl.
*G06F 11/30* (2006.01)
*G21C 17/00* (2006.01)

(52) U.S. Cl. .......................... 703/183; 700/83; 700/86; 703/14; 705/9; 706/50

(58) Field of Classification Search ............ 702/81–84, 702/174–178, 182–183; 700/80, 83, 86, 700/87, 108, 174; 706/45–47, 50, 52, 60; 345/619; 703/14; 705/9
See application file for complete search history.

(56) References Cited

U.S. PATENT DOCUMENTS 5,422,833 A * 6/1995 Kelem et al. .................. 703/14
5,999,911 A * 12/1999 Berg et al. ..................... 705/9

* cited by examiner

*Primary Examiner*—John H Le
(74) *Attorney, Agent, or Firm*—Quarles & Brady LLP; William W. Walbrun

(57) ABSTRACT

A method and apparatus for identifying sections of an existing schematic that are consistent with best design practices, the method comprising the steps of providing a template set, each template specifying a sub-set of components and relationships that are consistent with best design practices and examining the existing schematic to identify sections of the existing schematic that are inconsistent with the best design practices specified in the template set.

12 Claims, 116 Drawing Sheets

FIG. 22
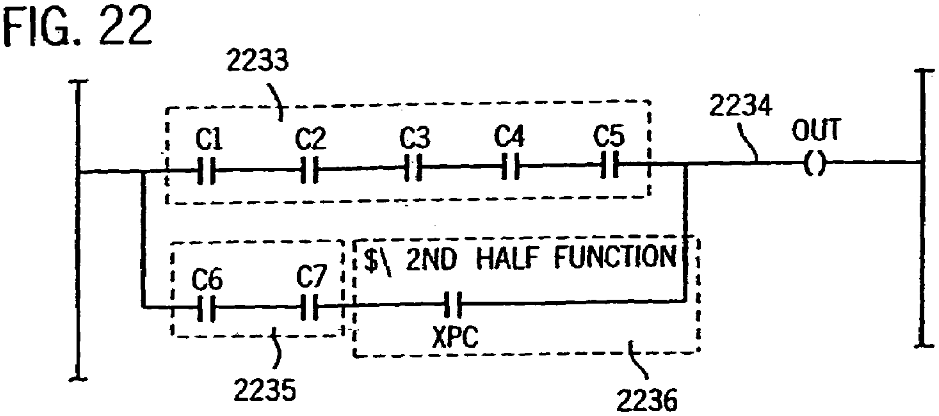
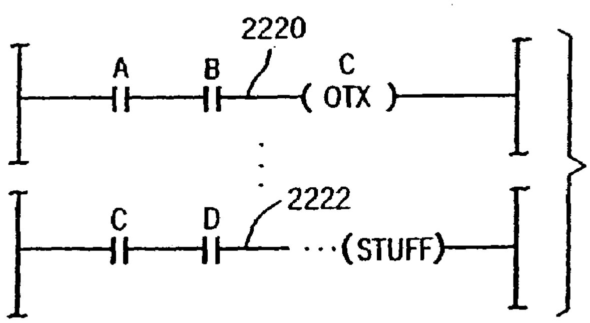
FIG. 22-1
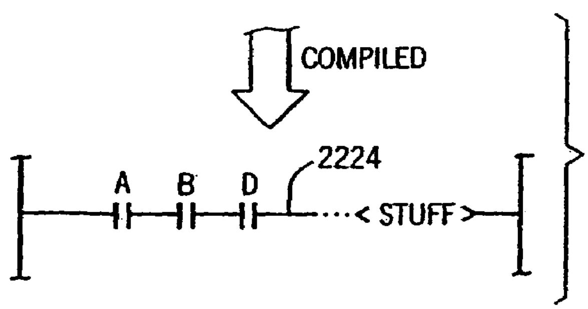
FIG. 22-2

5032

| ATTRIBUTES | A | B | C | D | E | F | G | H | I | J | K | L | M | N | O |
|---|---|---|---|---|---|---|---|---|---|---|---|---|---|---|---|
| STABLE | | | | | | | | | X | X | X | X | | | |
| UNSTABLE | X | X | X | X | X | X | X | X | | | | | | | |
| CANC BY OTHER | X | X | X | X | | | | | | | | | | | |
| CANC BY ME | | | | | X | X | X | X | | | | | | | |
| MY HALF OF CYC | X | | X | | X | | X | | X | | X | | | | |
| OTHER HALF | | X | | X | | X | | X | | X | | X | | | |
| POSITION | X | X | | | X | X | | | X | X | | | | | |
| LATCH | | | X | X | | | X | X | | | X | X | | | |
| MY START POS | | | | | | | | | | | | | X | | |
| PUSH BUTTON | | | | | | | | | | | | | | X | |
| SAFETY | | | | | | | | | | | | | | | X |

STATUS BASED DIAGNOSTICS SPECIFICATION (1ST CLAMPS)

| REQUEST | O1 | O2 | O3 | O4 | O5 | O6 | I1 | I2 | I3 | I4 | I5 | I6 | I7 | I8 | ACTIVITY |
|---|---|---|---|---|---|---|---|---|---|---|---|---|---|---|---|
| EXTEND | I | I | O | O | – | – | – | – | – | – | – | – | – | – | TEXT: "TWO-POSITION VALVE EXTEND" |
| ☐ | – | – | – | – | I | I | – | – | – | – | – | – | – | – | TEXT: "SPRING-RETURN VALVE EXTEND" |
| | – | – | – | – | – | – | I | O | – | – | – | – | – | – | TEXT: "1ST CYLINDICATOR EXTEND" |
| ☐ | – | – | – | – | – | – | – | – | I | O | – | – | – | – | TEXT: "2ND CYLINDICATOR EXTEND" |
| ☐ | – | – | – | – | – | – | – | – | – | – | I | O | – | – | TEXT: "3RD CYLINDICATOR EXTEND" |
| ☐ | – | – | – | – | – | – | – | – | – | – | – | – | I | O | TEXT: "4TH CYLINDICATOR EXTEND" |
| RETRACT | O | O | I | I | – | – | – | – | – | – | – | – | – | – | TEXT: "TWO-POSITION VALVE RETRACT" |
| ☐ | – | – | – | – | O | O | – | – | – | – | – | – | – | – | TEXT: "SPRING-RETURN VALVE RETRACT" |
| | – | – | – | – | – | – | O | I | – | – | – | – | – | – | TEXT: "1ST CYLINDICATOR RETRACT" |
| ☐ | – | – | – | – | – | – | – | – | O | I | – | – | – | – | TEXT: "2ND CYLINDICATOR RETRACT" |
| ☐ | – | – | – | – | – | – | – | – | – | – | O | I | – | – | TEXT: "3RD CYLINDICATOR RETRACT" |
| ☐ | – | – | – | – | – | – | – | – | – | – | – | – | O | I | TEXT: "4TH CYLINDICATOR RETRACT" |

FIG. 87A

| 01 | 02 | 03 | 04 | 05 | 06 | I1 | I2 | VIDEO CLIP |
|---|---|---|---|---|---|---|---|---|
| I | I | 0 | 0 | I | I | 0 | – | 1 (EXTEND) |
| I | I | 0 | 0 | I | I | I | – | 3 (STATIONARY) |
| I | I | 0 | 0 | 0 | 0 | 0 | – | 1 |
| 0 | 0 | 0 | 0 | 0 | 0 | – | 0 | 2 (RETRACT) |
| ⋮ | | | | | | | | ⋮ |
| 0 | 0 | I | I | 0 | 0 | – | I | 3 |

8401

HMI BUILDING TABLE 8403 8411 8413 8405 8725 8417 8407 8419 8735 8029 8727 8729 8731 8733

| | MONITORABLE (INDICATORS) | | | CONTROLLABLE (BUTTONS) | | |
|---|---|---|---|---|---|---|
| CA TYPE | I/O | LABEL | LINK TO | I/O REQ | LABEL | LINK TO |
| PART-PRESENT | ... | ... | | ... | ... | |
| NACHISA 160-CONT. | ... | ... | | ... | ... | |
| SAFEBULKHEADCLAMP SET | 01 | 2-POSITION VALVE HOT EXTEND OUTPUT | "NAME" 01 | 01 | 2-POSITION VALVE HOT EXTEND | "NAME" 01 CONTROL |
| | 02 ⋮ | 2-POSITION VALVE COMMON EXTEND OUTPUT ⋮ | "NAME" 02 ⋮ | 02 ⋮ | 2-POSITION VALVE COMMON EXTEND ⋮ | "NAME" 02 CONTROL |
| | I1 | 1ST CYLINDICATOR EXTEND SIGNAL | "NAME" I1 | EXTEND | EXTEND | "NAME" EXTEND REQUEST CONTROL |
| | I2 | 1ST CYLINDICATOR RETRACT SIGNAL ⋮ | "NAME" I2 ⋮ | RETRACT | RETRACT ⋮ | "NAME" RETRACT REQUEST CONTROL ⋮ |
| | | | | | | |
| PIN-SET | ... | | | | | |
| ⋮ | ⋮ | ⋮ | ⋮ | ⋮ | ⋮ | |

FIG. 110

FIG. 117
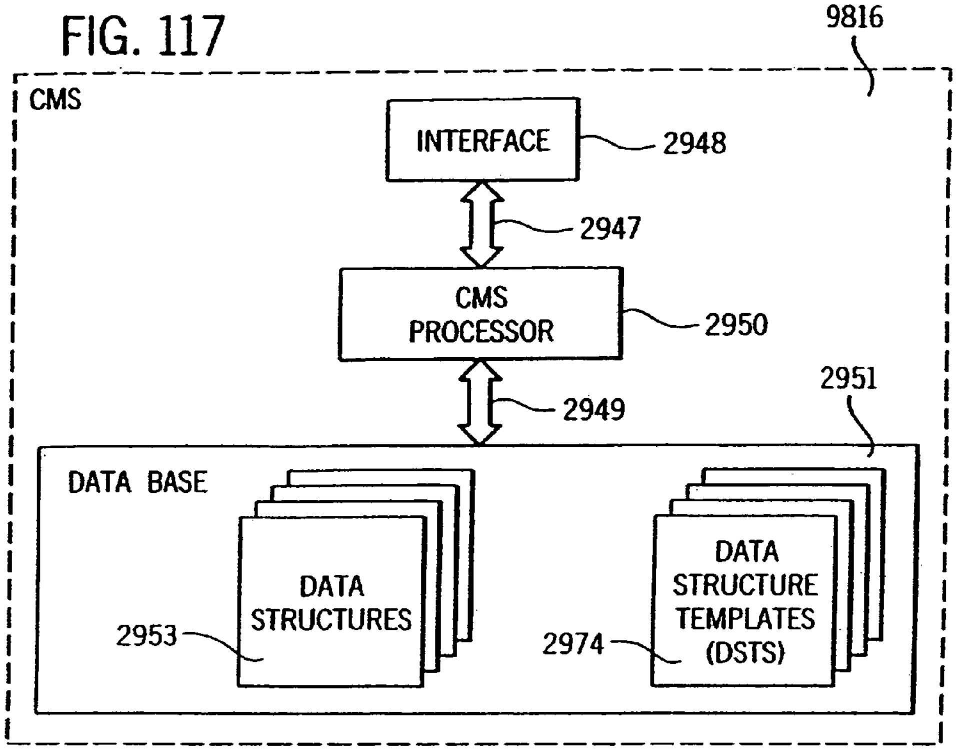
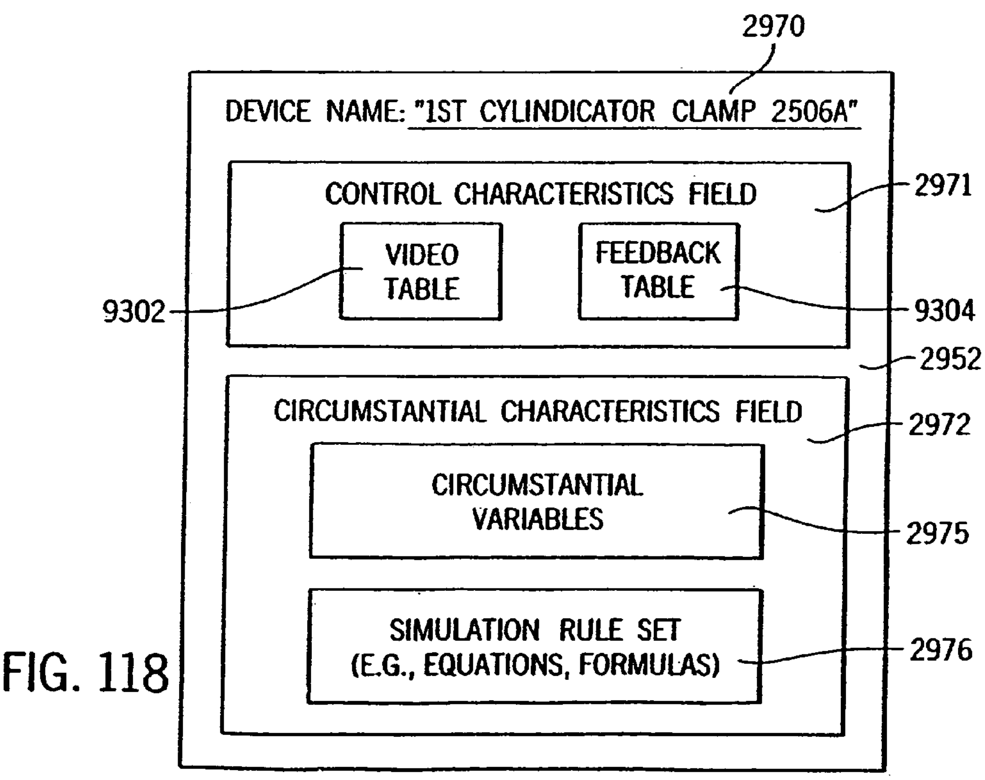
FIG. 118

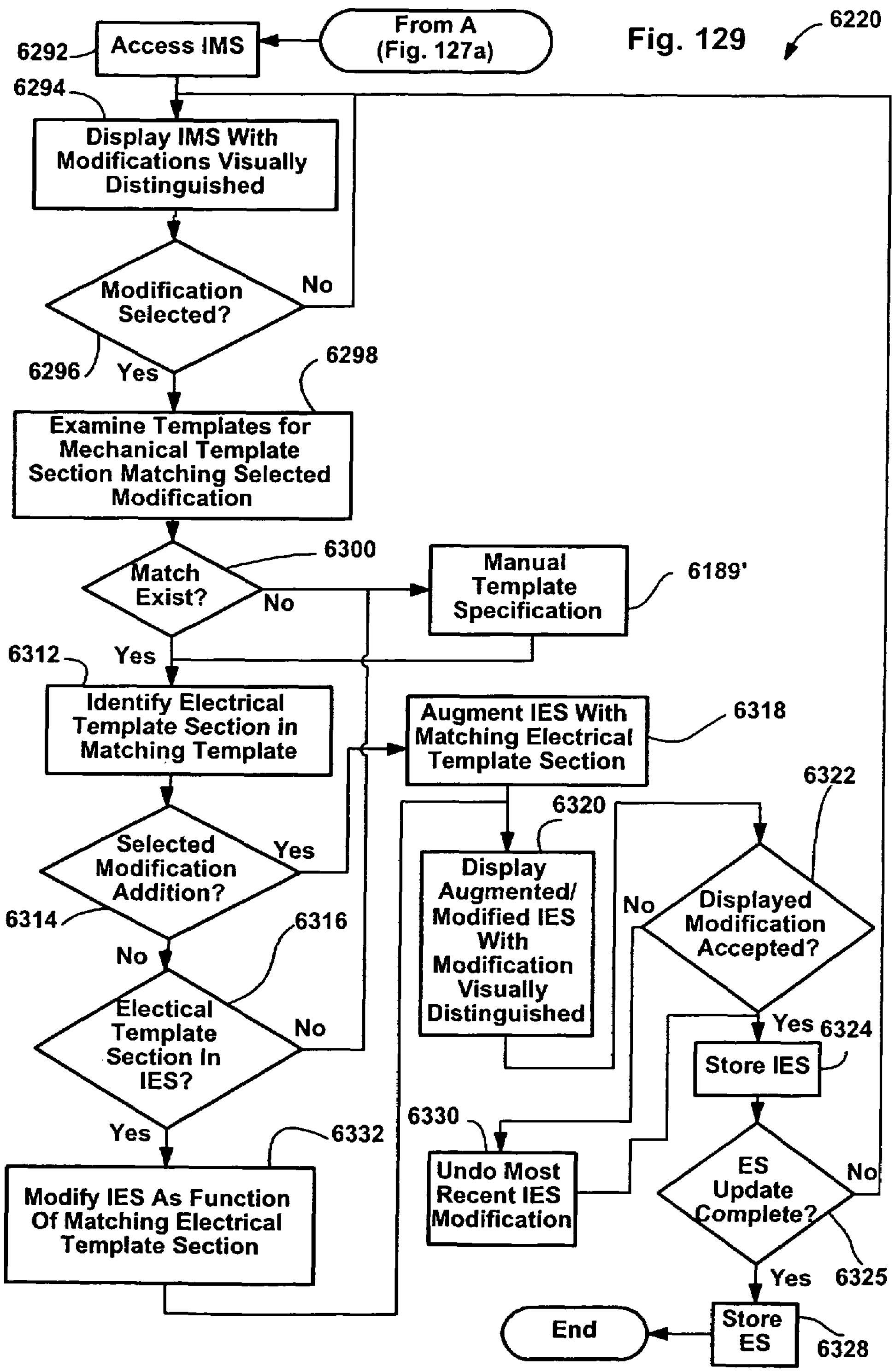

Fig. 129
6220
From A (Fig. 127a)
Access IMS
6292
6294
Display IMS With Modifications Visually Distinguished
Modification Selected?
No
Yes
6296
6298
Examine Templates for Mechanical Template Section Matching Selected Modification
Match Exist?
6300
No
Manual Template Specification
6189'
Yes
6312
Identify Electrical Template Section in Matching Template
Selected Modification Addition?
Yes
6314
No
Electrical Template Section In IES?
6316
No
Yes
Modify IES As Function Of Matching Electrical Template Section
6332
Augment IES With Matching Electrical Template Section
6318
6320
Display Augmented/ Modified IES With Modification Visually Distinguished
6322
Displayed Modification Accepted?
No
Yes
6324
Store IES
6330
Undo Most Recent IES Modification
ES Update Complete?
No
Yes
6325
Store ES
6328
End

MECHANICAL-ELECTRICAL TEMPLATE BASED METHOD AND APPARATUS

CROSS-REFERENCE TO RELATED APPLICATIONS

This is a continuation of U.S. patent application Ser. No. 10/674,588 which was filed on Sep. 30, 2003 now U.S. Pat. No. 6,993,456 and which is entitled "Mechanical-Electrical Template Based Method and Apparatus" which was a continuation of U.S. patent application Ser. No. 10/614,634 which was filed on Jul. 7, 2003 now U.S. Pat. No. 7,266,476 and is titled "Simulation Method And Apparatus For Use In Enterprise Controls" which was a continuation of U.S. patent application Ser. No. 10/304,190 which was filed on Nov. 26, 2002 now U.S. Pat No. 6,862,553 and is titled "Diagnostics Method and Apparatus For Use With Enterprise Controls" which was a continuation of U.S. patent application Ser. No. 09/410,270 which was filed on Sep. 30, 1999 which issued on Apr. 29, 2003 as U.S. Pat. No. 6,556,950 and is also titled "Diagnostics Method and Apparatus For Use With Enterprise Controls".

COPYRIGHT NOTIFICATION

Portions of this patent application contain materials that are subject to copyright protection. The copyright owner has no objection to the facsimile reproduction by anyone of the patent document, or the patent disclosure, as it appears in the Patent and Trademark Office.

STATEMENT REGARDING FEDERALLY SPONSORED RESEARCH OR DEVELOPMENT

Not applicable.

BACKGROUND OF THE INVENTION

Additional Background Section

The field of the invention is object oriented design and more specifically object oriented methods and apparatus for associating and modifying existing and related mechanical and electrical systems in a simplified fashion.

This section of this document is intended to introduce various aspects of art that may be related to various aspects of the present invention described and/or claimed below. This section provides background information to facilitate a better understanding of the various aspects of the present invention and it should be understood that the statements in this section of this document are to be read in this light, and not as admissions of prior art.

Automated control systems are often used in industrial facilities to control machine lines including manufacturing equipment such as drills, mills, transfer lines, stitching machines, gluing machines, material handlers, and so on. While most of the machine line equipment includes mechanical components, the control systems typically include electrical components such as programmable logic controllers (PLCs), transformers, relays, switches, resistors, capacitors, inductors, memories, registers and so on. Hereinafter, unless indicated otherwise, a machine line-control system will be referred to as a line-control system.

The design/build process for a line-control system typically includes several different stages during which engineers having different and specific skill sets perform various functions. During one stage a mechanical engineer specifies mechanical schematics that are suitable to perform an automated process. After the mechanical schematics are complete, an electrical engineer typically uses the mechanical schematics to identify electrical components required to control the mechanical components and specifies a set of electrical schematics. After the electrical schematics are complete one or more line engineers typically build the machine line specified by the mechanical schematics and the control system specified by the electrical schematics.

After a line-control system is configured, a debugging process is performed during which the system is tested to ensure that the system correctly performs the automated process. If the system does not perform correctly, one or more engineers usually go back to the schematics to identify the sources of the errors, change the schematics, and then use the modified schematics to modify the system.

In many industries, while a basic product may remain unchanged for long periods, product features may be changed regularly. For example, life preserver features may be updated routinely despite the fact that basic preserver design may only be overhauled every several years. As one instance of a preserver change, a manufacturer may decide to change a securing mechanism from a snap fit to a Velcro mechanism while leaving the other preserver features unchanged.

Where only some product features are altered while most features remain unchanged, many manufacturers opt to use as much of their legacy line-control system as possible and only change the parts of the system that are required to facilitate the small number of feature changes. For instance, in the case of the life preserver example above, assuming a complete line-control system including twenty different machine and control sub-systems where three of the sub-systems are for providing the preserver securing mechanism, the manufacturer may opt to replace the three sub-systems instead of redesigning the complete line-control system. Partial system replacement reduces system downtime and also saves costs associated with redesigning a completely new line-control system, tearing down the old system, constructing the new system and debugging the new system.

Unfortunately current systems that support mechanical and electrical schematic specification have several shortcomings. First, in many cases several thousands and even tens of thousands of electrical and mechanical components are required to configure a complete system. Here, while the task of specifying mechanical components is substantial, the added task of specifying complimentary electrical components exacerbates the specifying process appreciably.

Second, in most cases mechanical and electrical schematics comprise segments of schematics where the segment size is selected to fit on paper (e.g., 11 by 14 inches, etc.) that can be printed out for use by an engineer charged with the task of building the system on a facility floor. The mechanical and electrical components for even simple systems typically include more components than can fit within a single component segment (i.e., on a single sheet of paper) and therefore most schematics include a plurality of segments to be printed on a plurality of sheets of paper. In many cases the electrical schematics will include several hundreds or even thousands of sheets of paper, each sheet including a different segment of the electrical components. Where schematics are broken into segment sized sub-sets of components, it is very difficult to move from mechanical components on the mechanical schematics to associated electrical components and vice versa. For instance, in a case where a mechanical schematic includes 500 segments and a roller assembly on the $189^{th}$ segment, an electrical schematic includes 700 segments and components for controlling the roller assembly are illustrated on the $512^{th}$ electrical schematic segment, where an engineer wants to examine the electrical components associated with the roller assembly, the difficulty of locating the controlling components on the 512$^{th}$ electrical schematic segment is clear.

Third, in most cases, mechanical and electrical design engineers are free to name components however they choose. Thus, for instance, a mechanical engineer that develops the mechanical components and generates the mechanical schematics and an electrical engineer that develops the electrical components and generates the electrical schematics may use different nomenclature for associated mechanical and electrical components. In these cases, moving between mechanical and associated electrical components is very difficult. For instance, instead of associating components on the different schematic types using common labels, when identifying electrical components that are associated with mechanical components on a set of schematics, engineers are often forced to identify specific relationships between mechanical components on the mechanical schematics, surmise a likely relationship or relationships between electrical components required to control the mechanical components and then search the electrical schematics for the electrical components having the surmised relationship. In some cases there are only slight distinctions between sets of electrical components on the electrical schematics so that temporary confusion regarding related electrical and mechanical components is common. In addition to causing confusion, lack of naming rules also means that personnel training costs must be increased appreciably to provide engineers with required skills.

Fourth, often the electrical components associated with a set of proximate mechanical components on a mechanical schematic are not proximately located on the electrical schematics. Thus, for instance, a mechanical schematic may include, among other components, components associated with a drill press station including a first drill press, a second drill press, two activation switches (i.e., a separate one for each of the drill presses) and three mechanical limit switches. In this case, an engineer may expect to find two inverters, a programmable logic controller (PLC) having I/O ports linked to each of the two separate inverters (i.e., one for each drill press) and three PLC I/O ports receiving limit switch signals. Here, the controller and two separate inverters may all be on different electrical schematic segments (i.e., on different pages) thereby complicating the task of locating the components based on expected relationships surmised from the mechanical component relationships on the mechanical schematics.

Fifth, in many cases legacy line-control systems may outlast the job cycles of their creators so that engineers slated to make changes to line-control systems are different than the engineers that actually designed and constructed the systems. Here the adverse effects of inconsistent naming and segmentation of schematics are exacerbated as new engineers may not be familiar with naming systems employed by previous engineers.

Previous Background Section

This invention generally relates to improvements in computer systems, and more particularly, to system software for managing the design, simulation, implementation and maintenance of a manufacturing process.

A visit to virtually any modern manufacturing facility in the world leaves room for little doubt that assembly and machining lines have become an integral part of the manufacturing process. Robots, computers, programmable logic controllers, mills, drills, stamps, clamps, sensors, transfer bars, assemblers, etc., are more numerous than people in most modern manufacturing facilities. This is because almost every industry has recognized that use of automated assembly and machining lines to form and assemble product components and assemblies reduces manufacturing time, reduces product costs and increases product quality. Hereinafter, automated assembly and machining will be referred to collectively as automated manufacturing.

Unfortunately, while automated manufacturing has a large number of advantages, such manufacturing also has a number of shortcomings. In particular, the process (hereinafter "the development process") of designing, constructing and debugging a manufacturing process has a large number of shortcomings. To understand the shortcomings of the development process, it is helpful to consider an exemplary development process. To this end, an exemplary development process will be described in the context of developing a manufacturing line for producing a basic automobile door frame assembly (i.e. the door without the window, window motors, activation buttons and other trim components).

To this end, initially a body engineer designs a door assembly based on experience of parts, structural knowledge and welding information. To facilitate the door frame design process a body engineer typically uses a standard computer aided design (CAD) package (e.g. CATIA, Pro-Engineer, etc.). Using such a package the body engineer can change frame dimensions, component thicknesses, rivet numbers, angles, the shapes of curved surfaces and so on.

A. The Development Process

From beginning to end, including the skills of a body engineer, the development process required to design, build and debug an automated manufacturing line involves no less than four separate engineering disciplines, each of which has a different set of required engineering skills. The three disciplines in addition to body engineering include process engineering, mechanical engineering, controls engineering and manufacturing engineering.

Once the door frame assembly has been designed, the frame design information is given to a process engineer. The process engineer designs a process which will be required to manufacture the door frame assembly. To this end, the process engineer translates management numbers for finished door frame assemblies into a high-level process of actions and resources based on acquired experience. When specifying the high-level process the process engineer specifies required manufacturing tools (e.g. robots, clamps, workcells, etc.).

This tool defining process, like the door frame design process, has been streamlined by use of computer aided manufacturing (CAM) software packages which enable a process engineer to virtually specify different mechanical tool types and tool configurations including clamps, robots, mills, drills, assemblers, etc. which can be used to actually manufacture the door frame assembly. Sometimes a tool library will be provided in a CAM package which includes commonly used mechanical tools, the mechanical tools selectable for reuse when required. Where a required tool is not provided in a library, the CAM package and or CAD package can be used to design the required mechanical tool for use in the door frame manufacturing process and for storage in the library for subsequent use if desired.

In addition to specifying the mechanical tools, the process engineer may also specify mechanical tool movements required during the manufacturing process. For example, for a clamp, the process engineer may specify an open position and a closed position and thereby may define a range of movements therebetween. This ability to specify tool actions allows a process engineer to build a model of a mechanical tool in software such that the model has both static and kinematic characteristics. The virtual tool can then interact with other parts in an automated virtual manufacturing process in the time dimension.

Moreover, the process engineer also specifies mechanical tool timing and sequencing via either a bar chart timing diagram, a flow chart or some other suitable sequence specifying tool. This sequencing information indicates the sequence of tool movements during the automated manufacturing process. Furthermore, the process engineer specifies resources and goals to drive the manufacturing process and may attempt to generate a cost justification for the frame assembly manufacturing process.

Hereinafter, the term "mechanical resources" will be used to refer generally to the manufacturing tools which are specified by a process engineer and the specified tool movements will be referred to as "behavior". In addition the information as a whole provided by the process engineer will be referred to as "process information".

Next a control engineer receives the process information and, based on experience, uses the process information to select control mechanisms and determines how to configure the mechanisms for controlling the mechanical resources. The control system includes at least one PLC (i.e. a controller), sensors and actuators and electrical lines and hydraulic tubing for linking the PLC to the actuators and sensors. The actuators and sensors are control mechanisms.

The actuators are eventually linked to the mechanical resources for motivating the mechanical resources in a manner consistent with the process information. Sensors are eventually linked to mechanical resources or are positioned adjacent mechanical resources and indicate an instantaneous condition (e.g. the position of a resource, the temperature of a liquid, the position of a work item—the upper left corner of a door frame, etc.) in the manufacturing process.

In addition, the control engineer has to integrate the mechanical sequencing information, causal relationships, a Human Machine Interface (HMI), I/O tables and safety and diagnostic information into the control system design. To aid in the process of selecting and configuring control devices to control the mechanical resources and to provide a blue print for subsequent assembly of the control system, the control engineer also generates a control system schematic with representations of each control device and electrical and hydraulic links between devices and the PLC. Hereinafter the information provided by the control engineer will be referred to as "controls information".

Next, a manufacturing engineer receives the controls information and the process information, uses the process information to construct the line via specified mechanical resources, uses the controls information to construct the control system and links the control system to the mechanical resources.

After the line is completely developed, the control engineer further generates execution code to execute on the PLCs to implement the automated manufacturing processes. Then a control engineer performs tests on line tools to identify execution code bugs in the system design. For example, the control engineer may check to determine if a robot arm will crash into a work item on a transfer bar during a specified tooling process or if a sensor is operating properly to detect the presence of a clamp during a clamp extending movement. While an engineer other than the control engineer may be able to debug specific systems, in most cases the control engineer is required for the debugging process. This is because any change in the system may ripple through other parts of the control process which are not intuitive and which may only be known to the control engineer. In most cases many bugs show up during this debugging process and therefore this step in the automated manufacturing process is extremely tedious. This is particularly true in automated manufacturing which requires complex control systems.

Hereinafter, the separate sub-processes of the development process which are performed by the separate engineers will be referred to as "process phases".

B. Development Process Shortcomings

The above described development process has a large number of shortcomings. First, the development process is extremely time consuming. In fact, the typical time required for designing, building, testing and reworking a simple manufacturing line is often months and the time required for a relatively complex line often takes years of man hours. In many industries the import of time is exacerbated by competitive product cycles where getting a new product to market before a competitor is crucial to a companies competitive posture. For example, in the automotive industry fresh styling is extremely important to entice product turnover.

Second, while some of the development process phases have been streamlined using design software (e.g. CAD and CAM are used to design a door frame assembly and the mechanical tools required to construct the frame assembly), other process phases are not streamlined. This is particularly true of the PLC logic programming process.

While the industry is starting to employ various programming languages, most industrial PLCs are still programmed in Ladder Logic (LL) where instructions are represented graphically by "contacts" and "coils" of virtual relays connected and arranged in ladder-like rungs across power rails. LL, with its input contacts and output coils, reflects the emphasis in industrial control on the processing of large amounts of input and output data.

LL also reflects the fact that most industrial control is "real time"; that is, an ideal industrial controller behaves as if it were actually composed of multiple relays connected in parallel rungs to provide outputs in essentially instantaneous response to changing inputs. Present industrial PLCs do not, in fact, employ separate parallel relay-like structures, but instead simulate the parallel operation of the relays by means of a conventional Harvard or Von Neumann-type computer processor which executes instructions one at a time, sequentially. The practical appearance of parallel operation is obtained by employing extremely fast processors in the execution of the sequential control program.

As each rung is executed, inputs represented by the contacts are read from memory (as obtained from inputs from the controlled process or the previous evaluation of coils of other rungs). These inputs are evaluated according to the logic reflected in the connection of the contacts into one or more branches within the rungs. Contacts in series across a rung represent boolean AND logic whereas contacts in different branches and thus in parallel across a rung represent boolean OR logic.

Typically a single output coil at the end of each rung is set or reset. Based on the evaluation of that rung, this setting or resetting is reflected in the writing to memory of a bit (which ultimately becomes an output to the industrial process or to another LL rung).

Once a given rung is evaluated the next rung is evaluated and so forth. In the simplest form of LL programming there are no jumps, i.e. all rungs are evaluated in a cycle or "scan" through the rungs. This is in contrast to conventional computer programming where branch and jump instructions cause later instructions or groups of instructions to be skipped, depending on the outcome of a test associated with those branch or jump instructions.

While LL is well suited for controlling industrial processes like those in the automotive industry, LL programming is not an intuitive process and, therefore, requires highly skilled programmers. Where hundreds of machine tool movements must be precisely synchronized to provide a machining process, programming in LL is extremely time-consuming. The time and relative skill associated with LL programming together account for an appreciable percentage of overall costs associated with a control system.

Industry members have made several attempts to streamline the logic programming process. One way to streamline any type of programming is to provide predefined language modules, expressed in a language such as LL, which can be used repetitively each time a specific function is required. Because of the similar types of tools and movements associated with different mechanical tools, industrial control would appear to be an ideal industry for such language modules.

The predefined logic module approach works quite well for certain applications, like small parts-material handling or simple machining. The reason for this is that the LL required for these applications tends to be very simple. In small parts material handling applications the I/O count is low and the interfaces between modules are minimal. In fact, the mechanisms are often independent units, decoupled from neighboring mechanisms by part buffers such that no signals are required to be exchanged between modules. These “loosely coupled” systems lend themselves to “cut and paste” programming solutions.

Unfortunately the predefined, fixed logic module approach does not work well for other applications, for example metal-removing applications. There are several reasons for this. First, there can be considerable variation in how components, such as sensors and actuators, combine to produce even simple mechanisms. Second, processes like metal removing normally require tightly controlled interaction between many individual mechanisms. Exchanging signals called interlocks between the control logic modules of the individual mechanisms control the interaction. The application of specific interlocks depends on knowledge of the process and the overall control strategy, information not generally needed or knowable when the control logic for each mechanism is defined.

For example, a drill is a typical metal-removing tool used in the automotive industry. In this example an ideal drill is mounted on a carriage that rides along a rail between two separate limiting positions on a linear axis, an advanced position and a returned position. Two limit switches, referred to herein as returned and advanced LSs, are positioned below the carriage and, when tripped, signal that the drill is in the returned and advanced positions, respectively. Two separate dogs (i.e. trigger extensions), an advanced dog and a returned dog, extend downwardly from the bottom of the carriage to trip the LSs when the advanced and returned positions are reached, respectively. In the ideal case, both LSs may be assumed to be wired in the same “normally opened” manner, so that electrically speaking they are open when released and closed when triggered. In this ideal case, where the physical characteristics of the switches are limited, a single LL logic rung can determine when the drill is in the returned position and another rung can determine when the drill is in the advanced position.

Unfortunately, in reality, there are electrically two types of LSs, one LS type being wired normally opened and the other type wired normally closed. Furthermore, any LS can be mechanically installed in a tripped-when-activated configuration, or a released-when-activated configuration. All combinations of these types are used for various types of applications. Thus, application requirements may demand control logic capable of handling any configuration of LS types.

Simple mathematics demonstrates that with two different electrical types of LSs and two mechanical configurations, there are sixteen possible configurations of a two-position linear slide. Consider the language modules required to implement position logic for all these configurations. To accommodate all sixteen-switch configurations, there could be sixteen different language modules, each containing fixed LL logic, and each named for the case it could handle. In this case, there would be duplicate logic under different names. Alternatively, four unique language modules could be provided, but then the user would have difficulty identifying which of the sixteen physical configurations that the four modules could handle.

Clearly, even for a simple drill mounted on a two position linear slide, application variables make it difficult to provide a workable library of fixed language modules. Adding more switches to the linear slide only increases, to an unmanageable level, the number of language modules required in the library.

Moreover, the contents of a complete language module for a drill must also consider other variables. These variables include, for example, the number and type of actuators required; the type of spindle, if any; whether or not a bushing plate is required; what type of conveyor is used; whether or not the drill will include an operator panel to enable local control. If an operator panel is included, what type of controls (i.e. buttons, switches and indicator lights) are required, just to name a few. Each tool variable increases the required number of unique LL modules by more than a factor of two, which makes it difficult at best to provide an LL library module for each possible drill configuration.

Taking into account the large number of different yet possible machine-line tools, each tool having its own set of variables, the task of providing an all-encompassing library of fixed language modules becomes impractical. Even if such a library could be fashioned, the task of choosing the correct module to control a given tool would probably be more difficult than programming the required LL logic from scratch.

For these reasons, although attempts have been made at providing comprehensive libraries of fixed language modules, none has proven particularly successful and much LL programming is done from scratch.

Third, the process of generating schematic control diagrams is extremely labor intensive and thus time consuming. This is because most schematic control diagrams have to be constructed by hand linking electrical and hydraulic lines from one control mechanism to another, from devices to a PLC representation, linking control devices to mechanical tools and so on.

To reduce the time required to generate control system schematics, most control engineers now use one or more commercially available CAD systems specifically designed for generating schematic designs. These CAD systems enable an engineer to select standard representations for specific control mechanisms and enable relatively quick electrical and hydraulic linking representations to be generated. Nevertheless, these CAD systems can result in erroneous connection specification as a control engineer makes the decisions about how to link control mechanisms. This is particularly true in the case of a large control system where only a small portion of the entire control system can be viewed on a work station screen at one time. In this case, the possibility of linking electrical and hydraulic lines incorrectly is exacerbated.

Moreover, in complex control systems, while reducing the overall time required to form a control system schematic, the time is still appreciable.

Fourth, the process of generating diagnostic tools is also not streamlined. For example, there may be specific conditions which should not occur during a machining cycle. For instance, where the control mechanisms for a clamp include both extended and retracted limit switches, there should never be an instance when both the extended and retracted switches are triggered. Unlikely or unpredictable conditions are referred to hereinafter as interesting conditions. In current systems, a control engineer should identify the most troubling interesting conditions which should be identified during a machining cycle and provide logic outputs to support indicators of the interesting conditions.

In addition, some systems require actual diagnostic functions to be performed. For example, many times an interesting condition has only one or two possible causes. In these cases, the system may be required to, when the interesting condition occurs, identify the possible causes so that a system operator can locate the cause of the interesting condition and eliminate the cause. Here, the system usually includes a screen for providing an alphanumeric message to the operator.

Moreover, some applications may require a system to attempt to further identify or even eliminate the cause of an interesting condition. In this case, when an interesting condition occurs, the system may check other system I/O to further diagnose the cause of the condition, providing a report to the operator via a system screen. In the alternative, when an interesting condition occurs and there is only one possible cause, the system may attempt to eliminate the condition. For example, where a transfer bar is stuck, the system may be programmed to reverse the transfer bar prior to moving forward again.

Where a system requires diagnostic functions in addition to interesting condition reporting, in addition to identifying interesting conditions, the control engineer has to identify all possible causes of each interesting condition, compose informative instructions for display to an operator indicating the causes of the interesting conditions, provide logic to identify the interesting conditions and, in some cases, provide logic to eliminate the interesting conditions.

In addition to interesting conditions which should not occur, there may also be other interesting conditions which should be reported to a system operator. In these cases diagnostic logic should be provided to identify these other interesting conditions and provide some type of indication. Clearly identifying all interesting conditions and their causes, composing messages for each cause and providing logic to do the same is a complex and time consuming endeavor.

Fifth, the process of specifying HMI design and logic required to support HMI representations is not streamlined. Here the control engineer, while creating the control logic generally, has to weave HMI logic into the system which provides desired PLC input signals (e.g. signals from sensors) and enables control via PLC output signals to control actuators.

Sixth, the process of debugging is not streamlined. As indicated above, an entire mechanical line (including all tools and accompanying control system) has to actually be designed and constructed and PLC execution code has to be generated prior to performing the debugging process. Obviously, once tools have been constructed and execution code has been provided the process of backtracking to modify design is difficult and extremely costly.

Seventh, while the process described above may be manageable for a single door frame assembly, similar processes are required for virtually every separate part of a final product and similar processes are also required to assemble parts into the final product. For example, because a typical automobile requires many thousands of different parts, a development process similar to the process described above must be repeated several thousand times to provide a completed automobile.

In the end, if line throughput is not sufficient parts of the line or even the entire line may have to be modified to increase line throughput. Once again, line modification is expensive as any system change can ripple through the entire control system thereby requiring additional changes.

To streamline the debugging process and facilitate cost justification prior to actually building and testing a manufacturing line, the industry has attempted to debug an automated manufacturing line virtually. In theory, virtual building and simulation enables a designer to modify line design relatively inexpensively when a bug is identified or when the costs associated with a particular line design cannot be justified by an expected throughput.

One virtual simulation solution has been to effectively provide a cartoon or movie illustrating all mechanical tools on a line in three dimensions and to run the manufacturing line in the virtual world to illustrate system operation. One way to accomplish this is to provide a video module which includes a video clip for each separate mechanical tool included on an assembly line. The video module is driven by the mechanical timing diagram such that, when the timing diagram indicates a specific resource movement, the video module plays the video clip associated with the specific resource movement. The video module is capable of running several video clips at a time on different sections of a display screen so that, by arranging the separate video clips on the screen a general picture of a complete manufacturing process can be provided. While this solution is helpful in visualizing a manufacturing process, unfortunately this solution does not illustrate tool control in the real world which will result from actual execution code.

Another virtual simulation solution has been to provide off-line programming for certain tools which is then linked to virtual representations of those tools for simulating actual tool movements. For example, most robots are controlled by specialized controllers which execute controller specific languages (i.e. languages which typically are very different than the PLC language) in such a way that a robot can move a work piece through space along a variety of path profiles. Some companies have developed virtual simulation tools which enable robot programs which are developed off-line and in the controller specific languages to be used to drive virtual representations of the robot and a work piece handled thereby, including robot and work piece translation through virtual space. Importantly, the actual program used to drive the robot in the real world is used to drive the virtual robot in the virtual environment. As described above, the components in the work cell (including the part or part components) already exist in some mechanical CAD environment and are available to these programming tools. With these simulation tools a process engineer can interact with a virtual work cell and verify that his robot program does what he intends the program to do.

In order to truly debug the robot program in a virtual world, the rest of the robot's real world environment must also be simulated such that the environment interacts dynamically with the robot motion. For example, clamps need to open and close, parts need to move into and out of the work cell, humans need to start and stop processes, sensors need to sense part and manufacturing tool locations and so on.

Unfortunately, while the simulation tools described above are used to drive virtual robots with the actual robot programs which will be used in the real world, similar tools have not been developed for simulating the robot environment (e.g. clamps, sensors, actuators, stops and starts, contingencies, HMIs, etc.). Existing tools simulate the robot's environment in the virtual world through a combination of proprietary modeling languages and graphical interfaces which are wholly disconnected from the programs which are used to control the manufacturing tools in the real world. Thus, while the virtual environment is controlled via modeling languages, in the real world these non-robotic components are controlled via a PLC and a control language (e.g. LL).

It should also be noted that, while robots themselves are internally controlled via controller specific languages, ultimately, each robot is linked to other system tools via a PLC which provides commands and receives feedback via a more conventional control language.

To provide pre-construction cost justification, in addition to the virtual simulation tools described above, various systems have been developed for estimating both the costs associated with automated manufacturing lines and groups of related lines and the throughput for specific lines. While these justification system may sometimes fortuitously generate cost data which is close to the actual cost data corresponding to a completed system, in most cases these justification systems provide a ball park figure at best. Unfortunately, while a ball park figure may be acceptable in some industries, in other industries where competition is particularly keen, such ball park figures are not very helpful in strategic financial planning as even a few percent error may require line redesign.

Thus, it should be appreciated that despite industry efforts to streamline the development process, the development process remains extremely complex. The transition from part design to process design to mechanical design and then to controls is a paper activity. Each of these activities separately have their own software tools, and of course, a competent set of engineers. The barriers between the software tools aren't just a matter of bridging different data types. Because the tools used in each phase of the development process evolved through solving their respective user's unique problems, their views of the world are very different, even though they ultimately solve a common problem: how to build a product.

In addition to the system development problems discussed above, failure and interesting condition reporting diagnostics have a number of shortcomings. One important shortcoming is that a system which supports interesting condition or failure reporting typically provides insufficient information to enable a system operator to identify the cause of the failure. This is because system events may be contingent upon the conclusion of many other events and the diagnostics provided typically cannot indicate which of a long string of contingent events causes a failure or an interesting condition to occur. For example, where extension of a clamp is to be monitored and failure reported, if clamp extension is contingent upon 10 previous events, when clamp failure occurs and is reported, which of the 10 previous events failed is not reported and some investigation is required.

In addition, where prescriptive diagnostics are provided, the prescriptive messages (i.e., the text which indicates likely cause of the problem) are only pre-failure hunches as to what the actual cause of failure might be. While based on experience and hence correct much of the time, these hunches may not be correct and hence may lead an operator in the wrong direction to address the failure this wasting system and operator resources.

For example, while the process engineer can specify specific tools and movements required to carry out a process, the process information is in a form which, while providing specifying information to the control engineer, cannot be used directly by control engineers to perform his development tasks. Instead, each time the development process is handed from one engineer to another, the receiving engineer must start by generating his own set of information which is based on the information specified by the previous engineers and, only then can the receiving engineer begin to perform his task of specifying further information for the next engineer down stream. Thus, the development process is broken up into separate pieces despite the fact that common information threads pass through each of the separate phases of the development process.

For at least the aforementioned reasons, it would be advantageous to have a system which would streamline the entire development process including defining an automated manufacturing line, developing execution code to control the manufacturing line tools including tool movements, sequencing, emergency situations, etc., specifying and supporting HMIs for the line, specifying diagnostics for the line, simulating line operation in a virtual environment prior to building the line and using the actual real world control programs to drive a virtual line in the virtual environment, debugging the control programs, and providing schematic diagrams for a complete control system automatically. It would also be advantageous to have a system wherein the common threads of information which are provided by one engineer are sustained throughout the development process and automatically provided in a form which is useable by engineers in subsequent process phases.

Moreover, it would be advantageous to have a diagnostics scheme which could specifically and immediately identify the symptoms which are associated with a failure.

BRIEF SUMMARY OF THE INVENTION

Additional Summary

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

It has been recognized that, while specific components on a schematic may not individually be distinguishable from other specific components on the schematic, often relationships represented on schematics can be used to distinguish specific instances of similar components. For instance, a first drill press on a mechanical schematic may be schematically linked to three limit switches while a second drill press on the same mechanical schematic may be linked to only two limit switches. Here the first and second press instances are distinguishable via schematic linkages.

It has also been recognized that, in the case of existing and related mechanical and electrical schematics, schematic component relationships (i.e., intra-schematic linkages) can be used to associate specific components represented on one of the schematics with specific components on the other of the schematics. Thus, for instance, in the case of the drill press assembly linked to three limit switches described above, electronic components required to control the drill press as a function of the states of the three limit switches may require an inverter linked to DC bus lines and having three outputs linkable to a press motor, an I/O card linked to three limit switches and a controller linked to the inverter and linked to the I/O card. Herein the electronic components described above will be referred to as an electronics sub-set. In this case, where the electronics sub-set is unique on an electronic schematic, it can be assumed that the electronics sub-set is associated with the first roller assembly linked to three limit switches.

Moreover, it has been recognized that mechanical and electrical components and their relationships are determinable from existing schematic information including icons that represent the components and lines or other associating information that represent relationships.

Based on these realizations, according to at least one aspect, the present invention includes a system wherein electrical components on an existing schematic associated with mechanical components on an existing schematic can be automatically identified by using a processor to identify relationships between mechanical components, use the component relationships to identify expected relationships between electrical components, search the electrical schematics for components that match the expected relationships and, when an expected relationship exists, render the relevant section or segment of the electrical schematic accessible. In at least some embodiments a set of templates are provided that associate mechanical components and specific relationships to electrical components and relationships to facilitate the mechanical-electrical association.

In some embodiments the association is triggered by selection of a mechanical component or a sub-set of inter-related mechanical components on an electronically stored mechanical schematic. In other embodiments the association is triggered by deletion of mechanical components from a mechanical schematic so that associated electrical components to be deleted or at least modified can be identified.

According to another aspect of the present invention the same templates used to associate existing mechanical and electrical components can also be used to augment electrical schematics when mechanical components are added to mechanical schematics. In this regard, when mechanical components are added to a schematic and relationships therebetween are indicated in some fashion on the schematic, a processor may be programmed to identify a template, if such a template exists, that includes the added components and the indicated relationships. If a template matches the added components and relationships the processor may be programmed to suggest electrical components and relationships from the matching template or, in the alternative, may simply add electrical components and relationships from the matching template to an existing electrical schematic diagram. A similar process is contemplated to either suggest electrical components to be removed from an electrical schematic or to automatically remove electrical components from the schematic when mechanical components are removed from a related mechanical schematic. Moreover, a similar process is contemplated to generate new electrical schematics or at least sections thereof for supporting or association with existing mechanical schematics Furthermore, the processes describes above may be reversed according to at least some aspects of the present invention. Thus, for instance, changes to electrical schematics can be used to automatically identify likely or possible related changes to mechanical schematics. As another instance, selection of components on an electrical schematic may cause a processor to identify mechanical components on an associated mechanical schematic that are related to the selected electrical components.

In some cases, it is contemplated that template specifications could match more than one schematic component icon subset and relationships. In this case, in at least some embodiments, the invention may provide a list of instances of schematic component icons and relationships that match the template specification and enable a system user to select an option. Thus, for instance, where a user selects a specific roller component subset on a mechanical schematic that matches a first template and the electrical specification in the first template matches five instances of electrical component icons and relationships on an electrical schematic, a processor would provide the list of selectable instances.

Consistent with the above, at least some embodiments of the invention include a method for identifying at least a section of a first schematic associated with at least a section of a second schematic wherein each of the first and second schematics includes a set of components for configuring a system to perform a process and wherein the components of the first and second schematics are first and second different types, respectively, the method comprising the steps of identifying the components of the first type included in the first section of the first schematic, examining the second schematic to identify at least one instance of components of the second type that are associated with the identified components of the first type and when at least one instance of components of the second type is identified, rendering the at least one instance accessible.

Here, in at least some embodiments the first and second schematics include schematic icons of first and second types, respectively, and wherein the step of identifying the components of the first type includes identifying the icons in the first section of the first schematic. In some cases the method further includes the step of providing a specification that associates icons of the first type with icons of the second type and wherein the step of examining the second schematic includes using the specification to identify icons of the second type that are associated with the identified icons of the first type and searching the second schematic for the identified icons of the second type.

In some embodiments the first schematic is a mechanical schematic including icons corresponding to mechanical components in an automated facility and the second schematic is an electrical schematic associated with the mechanical schematic and including icons corresponding to electrical components used to control mechanical components in an automated facility. In some cases the step of providing a specification includes providing a set of templates, each template including a mechanical template icon subset corresponding to mechanical components and an electrical template icon sub-set corresponding to electrical components for controlling the components associated with the icons in the mechanical template set, the step of identifying icons in the first schematic including identifying at least one mechanical template sub-set in the mechanical schematic.

In some cases at least a sub-set of the templates include child template specifications, each child template specification indicating possible inclusion of at least one other template.

At least some inventive embodiments also include a method for generating electrical schematics including electrical icons indicating electrical components useable to control mechanical components that are indicated by mechanical icons on pre-existing mechanical schematics, the method comprising the steps of using a processor to perform the steps of identifying at least one sub-set of mechanical components on the mechanical schematic, identifying electrical components suitable for controlling the identified at least one sub-set of mechanical components and using the identified electrical components to generate an electrical schematic for controlling the identified at least sub-set of mechanical components on the mechanical schematic.

In addition, some embodiments of the invention include a method for use with pre-existing electronically stored electrical and mechanical schematics where the electrical schematics indicate a control system to be used to control mechanical components corresponding to the mechanical schematics, the method for identifying mechanical components on the mechanical schematics that are not supported by the control system defined by the electrical schematics, the method comprising the steps of using a processor to perform the steps of identifying at least a sub-set of mechanical components in the mechanical schematics that are not supported by the electrical components in the electrical schematics and indicating the identified sub-set of mechanical components.

According to at least one aspect of the invention, some embodiments include a method for use with pre-existing electronically stored electrical and mechanical schematics where the electrical schematic indicates a control system to be used to control mechanical components corresponding to the mechanical schematic, the method comprising the steps of monitoring for changes to the mechanical schematic, for each change to the mechanical schematic, storing an indication of the change in a database and after a change to the mechanical schematic is stored in the database and during an electrical schematic modifying process, when the mechanical schematic is accessed, indicating the changes to the mechanical schematic in a distinguishing manner.

In some cases the invention includes a method for use with pre-existing electronically stored electrical and mechanical schematics where the electrical schematic indicates a control system to be used to control mechanical components corresponding to the mechanical schematics, the method comprising the steps of monitoring for changes to the mechanical schematic and, for each change to the mechanical schematic, providing suggested changes to the electrical schematic.

Here, the method may be for use with a visual display and the step of providing suggested changes may include displaying via the interface segments of the electrical schematics including suggested changes to the electrical schematics where electrical components to be removed from the schematics are indicated in a first distinguishing manner, electrical components to be added to the schematics are indicated in a second distinguishing manner and electrical components that existed in the original electrical schematics but will be used in a different capacity in the augmented electrical schematics are illustrated in a third distinguishing manner.

Some embodiments include a method for use with pre-existing electronically stored electrical and mechanical schematics where the electrical schematic indicates a control system to be used to control mechanical components corresponding to the mechanical schematics, the method comprising the steps of providing a visual interface, displaying at least a segment of the mechanical schematics via the interface, when at least one mechanical component is selected on the mechanical schematics, identifying components on the electrical schematics associated with the selected mechanical component on the mechanical schematic and displaying at least the identified electrical components.

According to another aspect the invention includes a method for identifying sections of an existing schematic that are consistent with best design practices, the method comprising the steps of providing a template set, each template specifying a sub-set of components and relationships that are consistent with best design practices and examining the existing schematic to identify sections of the existing schematic that are inconsistent with the best design practices specified in the template set. Here, the section that is inconsistent with the best design practices is an inconsistent section and the method may further include the step of, when a section of the existing schematic is inconsistent with the best design practices specified in the template set, performing a function on the existing schematic. The function may be to visually display the inconsistent section in a distinguishing manner. The function may be to identify a template that indicates a possible replacement for the inconsistent section and providing at least a section of the identified template.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefore, to the claims herein for interpreting the scope of the invention.

Previous Summary

It has been recognized that during the development process there are certain common information threads which pass through various development process phases. By studying the information passed from one process phase to the next, inventive tools have been developed which enable one engineer to use information in the form provided by previous engineers to continue the development process without reworking the received information. In this manner, the common threads of information flow continuously through the development process from beginning to end.

It has further been recognized that the control engineering phase is a critical juncture for the common threads of information and, that by providing suitable tools to the control engineer which organize the development information, the entire development process can be streamlined and many advantages result. In effect, the inventive tools operate as a lynchpin which enables a control engineer to easily generate controls information from the process information (i.e. specified mechanical tools, behavior and sequencing) and which also enables controls information to be fed back and combined with the process information to virtually simulate a manufacturing process using the actual execution code which will be used in the real world.

To this end, among other things, the present invention includes a data construct referred to generally as a "control assembly" (CA). It is contemplated that a plurality of different CAS will be provided, a separate CA for each type of mechanical resource which may be specified by a process engineer. Each CA includes several different information types associated with the specific CA. For example, a CA for controlling a specific clamp may include: (1) specification of control mechanisms for controlling the clamp; (2) a schematic diagram of the clamp illustrating clamp control mechanisms and electrical and hydraulic links; (3) logic for controlling the control mechanisms used to in turn control the specific clamp; (4) diagnostic logic for indicating either erroneous conditions which occur, other interesting conditions or status of a process, (5) logic for supporting an HMI associated with the clamp; and (6) simulation specification for simulation purposes. Herein, the term "logic" is used to refer to sequencing rules associated with the control mechanisms corresponding to a specific CA.

As another example, a CA for controlling a robot may include: (1) specification mapping PLC I/O to robot I/O; (2)

a schematic diagram referencing the inputs and outputs and electrical and hydraulic links; (3) logic for interfacing to the robot; (4) diagnostic logic for indicating interesting conditions; (5) logic for supporting an HMI associated with the robot; and (6) simulation specification for simulation purposes. The CA is essentially an object in an object oriented system for specifying information which a control engineer must generate for an associated mechanical resource.

By observing the process information, including specified mechanical resources, mechanical resource behavior and mechanical resource sequencing, an engineer can divide the mechanical resources into separate mechanical blocks, each block assigned to a specific instance of a CA. By including each mechanical resource in a mechanical block and assigning a CA for each mechanical block, control information is easily specified for each mechanical resource.

After all CAS have been specified, an inventive compiler is used to compile all of the information in the CAS and to generate several different types of information. To this end, the compiler compiles the schematic diagrams of the separate control devices, linking the devices according to a schematic rule set (SRS) to generate a complete schematic illustrating all line control devices, controllers and electrical and hydraulic links therebetween.

In addition, the compiler uses the logic from each of the CAS to generate execution code for controlling and monitoring the entire manufacturing line.

Moreover, the compiler compiles the HMI logic from each of the CAS into HMI supporting code which enables a suitable HMI.

Furthermore, the compiler automatically compiles diagnostic information from each of the CAS and generates diagnostic code which is interweaved with the control code and which can be used to facilitate diagnostic functions during virtual testing and in real world operation.

In addition to the CA structure and the inventive compiler, the invention further include a CA editor which enable a control engineer to easily link to process information upstream thereby streamlining the processes of generating the controls information by carrying common threads of information from the process information into the controls information. To this end, mechanical resources, their behavior and their sequencing is displayed on a CA editor screen as a mechanical timing diagram with mechanical resources and specific behaviors along a vertical axis and behavior sequencing mapped along a horizontal timing axis.

Using the CA editor, the control engineer identifies specific mechanical resource types on the mechanical timing diagram and selects suitable CAS for controlling each of the mechanical resources or blocks of mechanical resources which can be controlled by a single CA. As a CA is selected, the CA editor automatically creates an instance of the CA and places the CA in a control bar chart. The control bar chart includes CAS and CA behavior along the vertical axis and sequencing of CA behavior along a horizontal time axis. To distinguish between CA behavior and mechanical resource behavior, CA behavior will be referred to hereinafter as CA requests.

In one embodiment, as CA requests are added to the timing diagram, the requests are sequenced in the same-timing sequence as associated mechanical resource behavior in the timing diagram. For example, if the first mechanical resource behavior in a process is to close a clamp within a first period, the CA request to extend a piston (i.e. an actuator) to close the clamp is placed in the bar chart during the first period. If the clamp behavior in the timing diagram is to open during a tenth period, the CA request to retract the piston to open the clamp is placed in the bar chart during the tenth period and so on.

After all CAS have been selected and the control bar chart is completely populated, the CA editor enables the control engineer to specify contingencies at the edges of each request in the bar chart. In addition to the CA editor, the invention is meant to be used with an HMI editor and a diagnostics editor, each of which use CA information to configure and specify HMI and diagnostics features, respectively. After all of the sequencing information required to completely control the control system has been provided, an inventive compiler is used to generate execution code as described above.

Moreover, the CA simulation specification can be used to provide at least a subset of data which is required by a simulator for virtually simulating a process via video screens or the like. To this end, a core modeling system (CMS) is a simulator which models all aspects of mechanical resources supported by a system and which are simulatable. For example, when suitably programmed a CMS may model several different mechanical resources including a clamp with position sensors. Clamp operation may have specific characteristics such as reversibility, average stroke speed, velocity limiting factors, a variable stroke speed curve between start and stop, operating characteristics which change as a function of environmental characteristics (e.g. temperature, humidity, etc.) and so on. To model mechanical resources a CMS requires a plurality of data structures, a separate data structure for each simulatable resource in each instantiated CA. Unlike a one-to-one I/O-function paring, advanced data structures reflect real world resource behavior wherein request execution varies as a function of a plurality of different circumstantial characteristics.

A CMS which is equipped with separate data structures for each simulatable resource in each instantiated CA can operate as an interface between a PLC and a movie module to receive PLC I/O combinations and, based thereon, cause the movie module to virtually simulate the mechanical resources. The CMS also provides feedback to the PLC. Behavior characteristics such as simulation speed are simulated by the CMS controlling movie frame speed.

To facilitate data structure specification, the present invention contemplates that information required to form the structures portion thereof may be specified in CA simulation specifications and could be imported by the CMS for simulation purposes. While any sub-set of simulation information required by a CMS may be specified in a CA simulation specification, there is a specific information sub-set which is particularly easy to support and which makes sense to specify within a CA. To this end, the characteristics of a mechanical resource set associated with a specific CA which affect resource operation can be divided into two general categories or first and second simulation information sets including control characteristics and circumstantial characteristics.

On one hand, with respect to control characteristics, from a controls perspective, a sub-set of resource characteristics are fundamental to the specific resource and do not vary as a function of the circumstances related to the resource (i.e., are universal for the specific resource). For example, many hardware vendor's provide clamps including control mechanisms (e.g., valves, cylindicators, etc.) which, although configured using different hardware, perform the same general functions in response to PLC I/O combinations. Thus, each clamp will attempt to extend when a PLC "extend" I/O combination is received and each clamp will attempt to retract when a PLC "retract" I/O combination is received and so on. In this case corresponding I/O-function is independent of hardware configuration. Similarly, in this case, the I/O-function pairings are independent of clamp environment including temperature, humidity, etc. (i.e., despite temperature and humidity, extension is attempted when a specific I/O combination is received). Thus, with respect to similar clamps provided by different vendors, I/O-function pairings are control characteristics which are universal for clamps which would be used to perform the functions required by a specific resource.

On the other hand, circumstantial characteristics include all secondary characteristics which are not control characteristics and which affect request execution. For example, a first manufacturers clamp may have a different closing speed than a second manufacturers clamp. Similarly, a first manufacturers clamp may close at different speeds depending upon temperature and humidity conditions or speed may vary as a function of recent clamp use (e.g., recent closing and opening may result in more rapid closure speed).

In a preferred embodiment the CA simulation specifications include only control characteristics and do not include circumstantial characteristics. The CMS preferably includes a database wherein circumstantial characteristics are stored which can be used to alter simulation events making simulation more realistic. The circumstantial characteristics are stored in simulation data structure templates (DSTs) and, upon export of the CA simulation specification, the control characteristics and circumstantial characteristics are combined to populate data structure fields required for simulation. Thereafter the CMS receives controller output signals and based on those output signals, modeling algorithms within the data structure and other data structure information, causes realistic simulation.

In this manner the CA simulation specification is made relatively general and the CMS facilitates modification of circumstantial characteristics without recompiling CAS. After a data structure is populated, circumstantial characteristics may be modified using a CMS interface to reflect various environmental or resource characteristics and simulation will also reflect such changes to facilitate realistic simulation.

In addition to facilitating circumstantial characteristic modifications, by including only control characteristics in the CA simulation specifications the number of CAS required to support design choices is minimized. In effect circumstantial parameterization is accomplished via the CMS instead of via the CA.

Moreover, dividing characteristics between control and circumstantial characteristics and including control characteristics in the CAS makes sense as the control characteristics can typically be gleaned from other CA information which is specified for other than simulation purposes. For example, where a CA may support anywhere between one and four clamps and a user specifies that a CA will support only two clamps such that a compiler will provide execution code for controlling two clamps, clearly this parameterization will be reflected in simulation such that, during simulation, only two clamp animations are generated. Thus, supported CA devices are specified for control purposes and such specification is also useful for simulation purposes. In effect, the effort required to specify two clamps for execution code purposes can be exploited a second time for generating control characteristics required for simulation. While this example is relatively simple, it should be appreciated that a huge amount of specification required for execution code purposes is exploited in this double-duty fashion thereby appreciably streamlining an otherwise daunting simulation specification process.

In another embodiment, the data required to populate essentially an entire data structure including both control and circumstantial characteristics may be specified within each CA simulation specification. In this case, upon compiling, sub-sets of the required simulation information for each simulatable resource are gleaned from each parameterized CA and are used to populate the data structures. After compiling, the data structure are imported by the CMS and then used for interfacing purposes. Other simulation specification embodiments may include other sub-sets of control and circumstantial characteristics.

In a simplified embodiment of the invention where a one-to-one pairing of PLC I/O and virtual simulation is supported without circumstantial characteristics, the parameterization simulation specification may simply be a PLC I/O mapping table which maps PLC I/O combinations to specific video clips. In this case, after the parameterized specification is compiled, the specification is imported by the CMS and used for interfacing purposes.

The inventive address mapper facilitates mapping of PLC I/O to virtual mechanical resources to cause virtual simulation, identifies mechanical resource conditions (e.g. position, temperature, etc.) which are to be sensed during real world operation and provides inputs to the PLC indicating identified conditions during virtual processing.

In addition to control and circumstantial characteristics, a third type of character referred to as a third entity characteristic is contemplated. Third entity characteristics include characteristics of entities other than mechanical resources which interact with the PLC or which only minimally interact with the PLC and which must be modeled to facilitate realistic simulation. For example, third entities include system operators, a shot pin used to lock two devices together, an E-stop and corresponding hardware and so on.

Thus, the invention provides a system which streamlines the entire development process including defining an automated manufacturing line, developing programs to control the manufacturing mechanical resources including resource movements, sequencing, emergency situations, etc., specifying and supporting HMIs for the line, simulating line operation in a virtual environment prior to building the line and using the actual real world execution code to drive a virtual line in the virtual environment, debugging the control programs, and automatically providing schematic diagrams for a complete control system.

In addition to the inventive aspects described above, in another aspect the invention includes status based diagnostics wherein every event which is to occur during a process is monitored and, when an expected event fails to occur, the failed event is reported. For example, where a clamp extension request is contingent upon the occurrence of ten previous events, when one of the previous events fails, status based diagnostics reports the failed event. In this manner, when a failure occurs, the specific symptoms of the failure are immediately reported and the operator can then surmise the cause of the failure quickly.

Request events are represented in the CAS and therefore status based diagnostics can easily be provided in each CA to minimize the task of programming diagnostics code for each event in a process. For example, where a clamp CA includes extend and retract requests and ten separate events, diagnostics can be provided once for each event in a template CA and, therefore, as CA instances are instantiated (i.e. selected by an operator for control purposes), the status based diagnostics are proliferated throughout the control process. In this manner, the task of providing status based diagnostics which seemed virtually impossible before can easily be accomplished through CA duplication (i.e., instantiation).

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefore, to the claims herein for interpreting the scope of the invention.

BRIEF DESCRIPTION OF THE SEVERAL VIEWS OF THE DRAWINGS

The invention will hereafter be described with reference to the accompanying drawings, wherein like reference numerals denote like elements, and:

FIG. 22 illustrates a required full set of conditions in accordance with a preferred embodiment;

FIG. 50 illustrates an attributes table in accordance with a preferred embodiment;

FIG. 87A is a schematic illustrating an exemplary status based diagnostics specifications;

FIG. 110 is an exemplary HMI building table;

FIG. 117 is a schematic diagram of the core modeling system of FIG. 90;

FIG. 118 is a schematic diagram of one of the data structures of FIG. 117;

FIG. 129 is a flow chart illustrating a sixth method according to the present invention;

DETAILED DESCRIPTION OF THE INVENTION

Additional Description

Figure 1A:
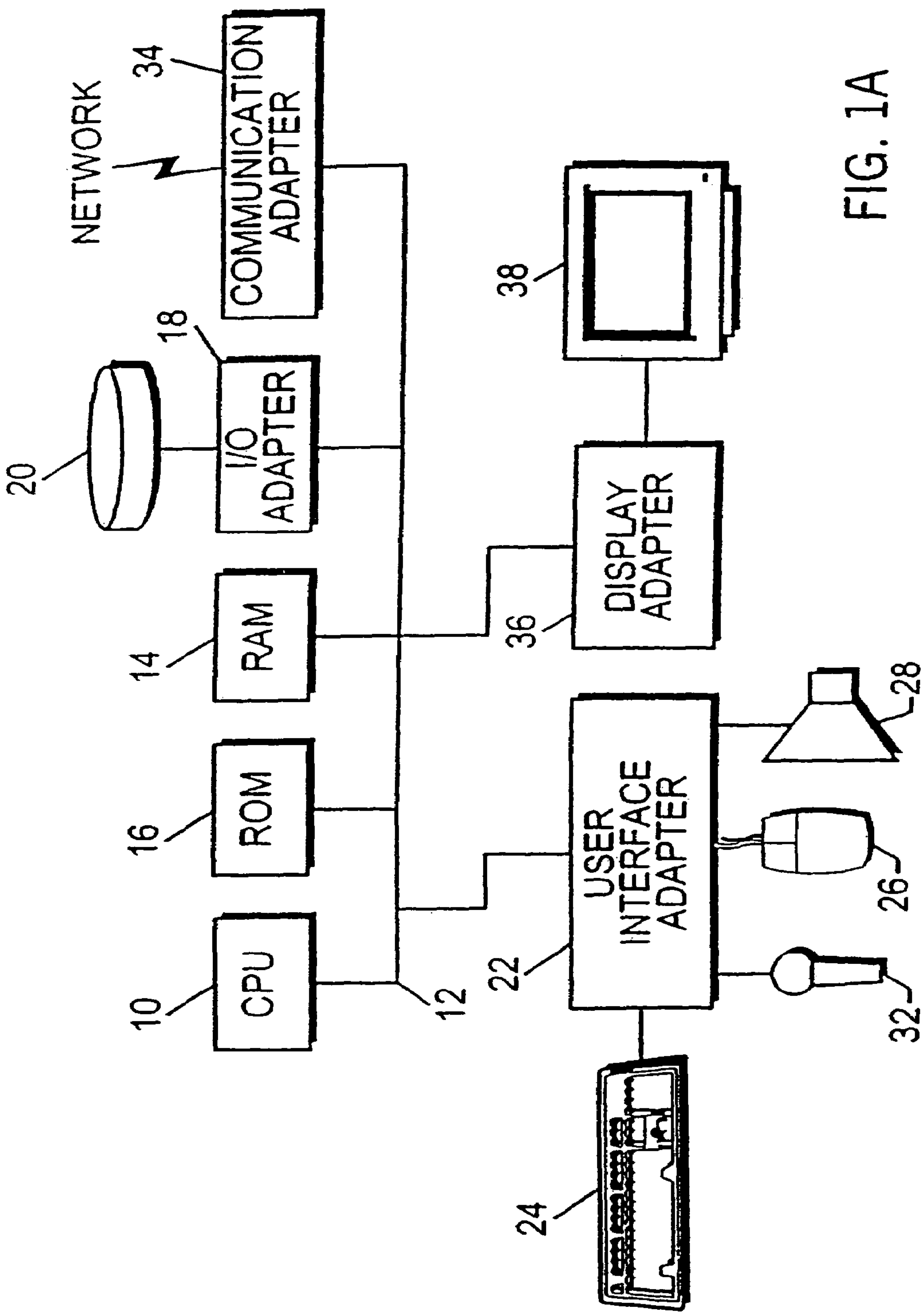
FIG. 1A is a block schematic diagram of a computer system for example, a personal computer system in accordance with a preferred embodiment.

One or more specific embodiments of the present invention will be described below. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Referring now to the drawings wherein like reference numerals correspond to similar elements throughout the several views and, more specifically, referring to FIG. 122, the present invention will be described in the context of an exemplary computer aided design (CAD) system 6010 including a workstation 6012 linked via a communication network (e.g., a local area network, a wide area network, an Ethernet, etc.) to both a schematic database 6014 and a specification database 6016. Referring also to FIG. 123, workstation 6012 includes, among other things, a process 6022 which is linked to an input device (e.g., a keyboard, a mouse or trackball, etc.) and to a visual display such as a flat panel display screen 6018.

One or more software programs are stored in a workstation database (not illustrated) and are accessible to processor 6022 to perform various methods and processes according to the present invention. In this regard, more specifically, processor 6022 has access to at least two different types of CAD programs that enable display and modification of various types of schematics. The first program enables specification, display and modification of mechanical drawings or schematics which illustrate mechanical components used to configure an automated industrial assembly via components specific icons. For example, a mechanical roller assembly may be represented by a first icon, a mechanical drill press may be represented by a second icon, a mechanical milling machine may be represented by a third icon, a transfer line may be represented by a fourth distinct icon, and so on. The relationships between mechanical components on schematics may be indicated in any of several different manners including relative juxtaposition of those components, actual lines between components to indicate linkage relationships, labels on or proximate the mechanical component icons, etc.

The second CAD program accessible to processor 6022 enables specification, display and modification of electrical schematics which illustrate electrical components used to configure a control system for an automated industrial facility via component specific icons. For example, a first electrical icon may correspond to a programmable logic controller (PLC), a second electrical icon may correspond to a resistor, a third electrical icon may correspond to a specific filter topology, a fourth electrical icon may correspond to a memory storage device, and so on.

Each of the mechanical schematic and electrical schematic programs may be independently accessed via workstation 6012 so that any of the various schematic pages is observable. Other programs accessible via workstation 6012 to facilitate the various aspects of the present invention will be described in greater detail below.

Figure 122:
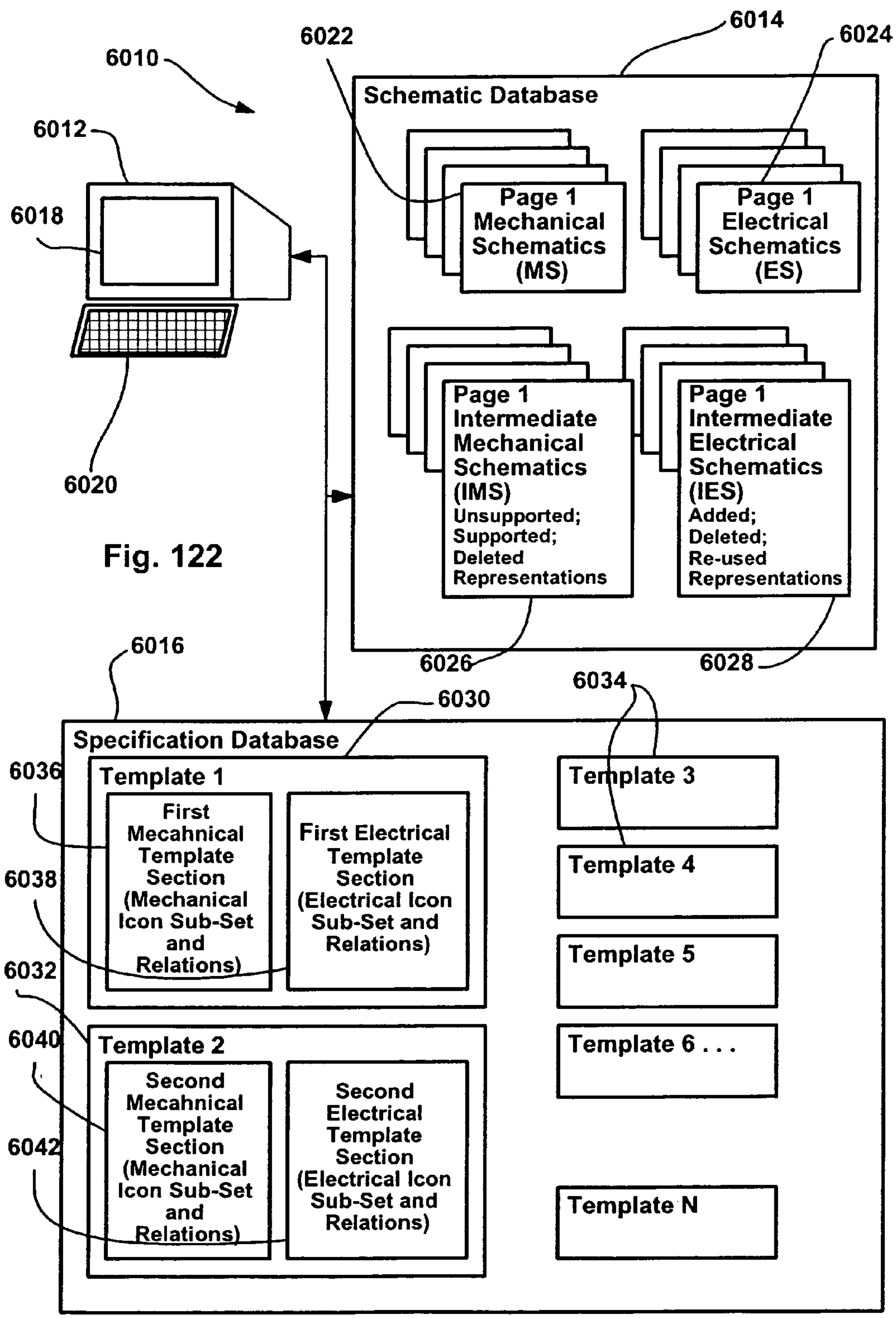
FIG. 122 is a schematic view illustrating an exemplary computer system according to the present invention.
Figure 123:
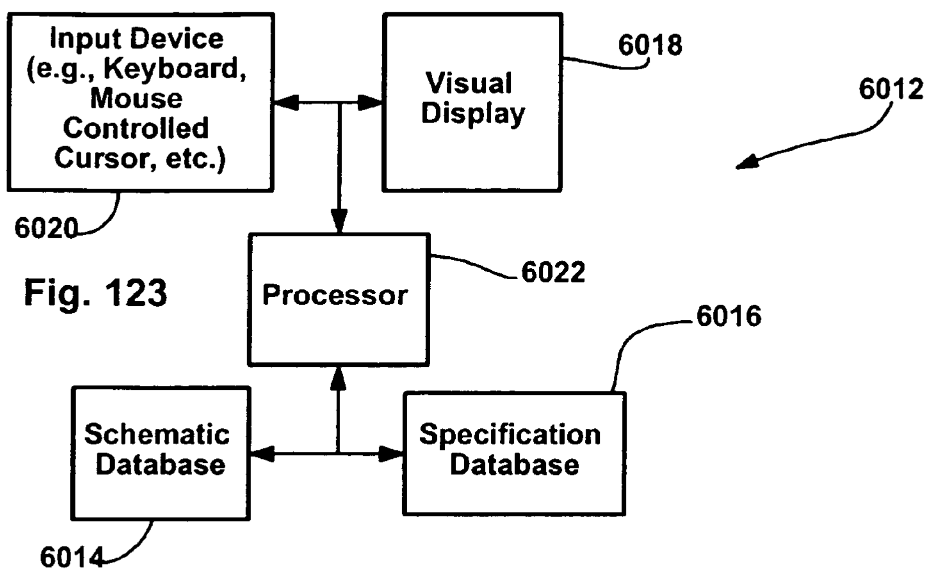
FIG. 123 is a schematic diagram illustrating the workstation and databases of FIG. 122.

Referring still to FIGS. 122 and 123, schematic database 6014, as its label implies, is a database wherein a plurality of different mechanical and electrical schematics associated with the mechanical and electrical schematic software described above are stored. In FIG. 122, a plurality of mechanical schematics (MSs) are collectively identified by numeral 6022 and include first through Nth mechanical schematics. Each of the mechanical schematics, as described above, includes mechanical icons, sometimes numbering in the tens of thousands, that are arranged on the schematics to indicate relationships between the mechanical icons and hence the associated mechanical components needed to perform an intended automated process.

A plurality of electrical schematics (ESs) including first through Nth schematics are collectively identified by numeral 6024 in FIG. 122. As in the case of the mechanical schematics, each electrical schematic includes a large number, often in the tens of thousands, of electrical component icons that correspond to electrical components required to control a related set of mechanical components represented by one of the mechanical schematics 6022. Thus, for instance, where a mechanical schematic 6022 includes a motor that has to be controlled by a PLC, an associated electrical schematic 6024 will include a PLC to be linked to the motor upon configuration of a working automated assembly. Hereinafter, although many electrical and mechanical schematics would typically be stored in database 6014, the present invention will be described in the context of a related schematic pair including one mechanical schematic and an associated electrical schematic unless indicated otherwise. In addition, it will be assumed that each schematic includes several hundreds of separate pages of schematic information.

Referring still to FIGS. 122 and 123, in addition to the mechanical and electrical schematics 6022 and 6024, respectively, schematic database 6014 also includes, at least at times during some methods according to the present invention, intermediate mechanical schematics (IMSs) and intermediate electrical schematics (IESs). In FIG. 122, first through Nth intermediate mechanical schematics are collectively identified by numeral 6026 and first through Nth intermediate electrical schematics are collectively identified by numeral 6028.

Generally, in at least some methods according to certain aspects of the present invention, when a mechanical schematic is modified, it has been recognized that it may be advantageous to generate a record of the changes made to the mechanical schematics to memorialize those changes including mechanical icons deleted from the schematics, mechanical icons added to the schematics as well as modifications to relationships between icons that previously existed on the schematics.

In addition, it has been recognized that where mechanical icons are added to a mechanical schematic, in some cases, is advantageous to divide added mechanical icons in to two different groups as a function of their associations with electrical component icons in related electrical schematics. In this regard, where a mechanical icon is added to a mechanical schematic and cannot be supported by electrical components associated with preexisting electrical icons on a related electrical schematic, the mechanical icon is placed into the first added group. In contrast, where a mechanical component associated with an added mechanical icon may be supported by an electrical component associated with a preexisting electrical icon on an associated electrical schematic, a mechanical icon is placed in the second group. Hereinafter, unless indicated otherwise, the first group of mechanical icons (i.e., icons corresponding to added mechanical components that are unsupportable by electrical components associated with preexisting electrical icons) will be referred to as "unsupported" mechanical icons and the added mechanical icons in the second group (i.e., mechanical icons corresponding to mechanical components that are supportable by electrical components associated with preexisting electrical icons in associated electrical schematics) will be referred to as "supported" mechanical icons.

As explained in greater detail below, in at least some embodiments, the IMSs 26 include mechanical schematics where icon deletions are memorialized and marked in a visually distinguishing manner, unsupported added icons are memorialized and marked in a visually distinguishing manner and supported added icons are memorialized and marked in a visually distinguishing manner. Moreover, IMSs 26 may also memorialize and indicate modifications to relationships between various schematic icons. In at least some embodiments of the present invention the deleted, unsupported added and supported added icons as well as associated relationships are all memorialized and marked and, when an IMS is accessed and displayed, all of the icons are shown in visually distinct manners to distinguish original (i.e., icons and relationships that remain unchanged from original mechanical schematics), deleted, supported and unsupported added mechanical icon components and relationships.

For example, when an IMS is accessed and where original mechanical components and relationships are illustrated in black, deleted icons and associated relationships may be illustrated in red, unsupported added icons and relationships may be illustrated in yellow and supported (or supportable) added icons and relationships may be illustrated in green.

Referring still to FIG. 122, the IESs 6028 are similar to the IMSs 6026 except that the IESs 6028 include electrical schematics where added icons, deleted icons and what are referred to hereinafter as "reused" electrical icons are memorialized and earmarked in distinguishing manners. As the label implies, reused icons on an IES 6028 indicate icons corresponding to electrical components that, when one or more mechanical component icons were deleted from an associated mechanical schematic, were rendered unnecessary to support the deleted icons but that, nevertheless, when one or more mechanical component icons were subsequently added to the associated mechanical schematic, were identified as reusable to support the added icons. Herein, while it is a fiction to state that an electrical icon "supports" a mechanical icon, this terminology is adopted to reflect the electrical-mechanical component relationship that is symbolized by the icons. Thus, where a set of electrical components are provided to control or "support" a set of mechanical components and the components are represented by electrical and mechanical component icons and relationships expressed on schematics, it can be said that the electrical icon set supports the mechanical icon set.

When an IES is displayed, as in the case of an IMS, the differently characterized icons and relationships (e.g., original, added, etc) may be visually distinguished. Thus, for instance, when an electrical component icon is deleted from an electrical schematic, the deleted component and associated relationships may be shown in red in a resulting IES 6028. Similarly, electrical icons added to a schematic may be shown in green, reused icons may be shown in yellow and original icons may be shown in black.

Referring still to FIGS. 122 and 123, specification database 6016 includes a plurality of data structures that relate mechanical component icons and groups of mechanical component icons having specific relationships with electrical component icons and groups of electrical component icons having specific relationships that are usable to support the mechanical components and mechanical component groupings. In FIG. 122 and throughout this specification, the data constructs are referred to as templates. A first template in specification database 6016 is identified by numeral 6030, a second template by numeral 6032 and a plurality of other templates collectively identified by numeral 6034. Each template, (e.g., 6030) includes a mechanical template section and a related or associated electrical template section. The mechanical template section includes a mechanical icon subset and associated relationships corresponding to a common mechanical component configuration that may be employed with other mechanical component configurations to configure an automated assembly. Similarly, the electrical template section includes an electrical icon subset and relationships corresponding to at least one set of electrical components and relationships that may be used to support mechanical components associated with the intra-template mechanical template section. The relationships may be indicated via lines or other symbolic structures on the schematics, via labels, via relative juxtapositions of subset icons, via location on the same page of a multi-page schematic, etc. In FIG. 122, the first template 6030 includes mechanical template section 6036 and electrical template section 6038, the second template 6032 includes mechanical template section 6040 and electrical template section 6042, and so on.

Referring once again to FIGS. 122 and 123, according to at least one inventive method, workstation 6012 and databases 6014 and 6016 are usable by a systems engineer to automatically and quickly identify electrical component icons on electrical schematics that are related to specific instances of mechanical component icons on related mechanical schematics. In this case, it is assumed that related mechanical and electrical schematics for a specific automated assembly already exist. In operation, a system user accesses a set of mechanical schematics via workstation 6012 and displays those schematics on display 6018. For large automated assemblies, the mechanical schematics may include several hundred or even thousand separate pages and therefore, workstation 6012 may be equipped with some type of scrolling software to enable a system user to easily jump back and forth between the various pages of an exemplary mechanical schematic.

With at least one segment of the mechanical schematics displayed via display 6018, the system user may select any of the mechanical schematic icons. In at least some embodiments of the invention, when a mechanical schematic icon or set of icons is selected, processor 6022 accesses specification database 6016 and attempts to match the mechanical icon subset and associated relationships in each of the mechanical template sections (e.g., 6036) with the selected icons and other related icons on the displayed schematic. Hereafter, when a mechanical component icon subset and relationships in a mechanical schematic match the subset and relationships specified by a specific database template, the template will be referred to as a "matching template" and the mechanical template section in the matching template section will be referred to as a "matching mechanical template section". In some cases, processor 6022 will not be able to find a matching template. In this case, processor 6022 may be programmed to simply indicate that no match occurs. However, where a matching template is identified, processor 6022 may be programmed to access the electrical icon subset and relationships specified in the electrical template section of the matching template. Where the electrical icon subset and relationships specified by the electrical template section are located in the related electrical schematic 6024, processor 6022, in at least some embodiments of the present invention, immediately displays the portion of the electrical schematic including the electrical icon subset and relationships for the system user to view.

Figure 124:
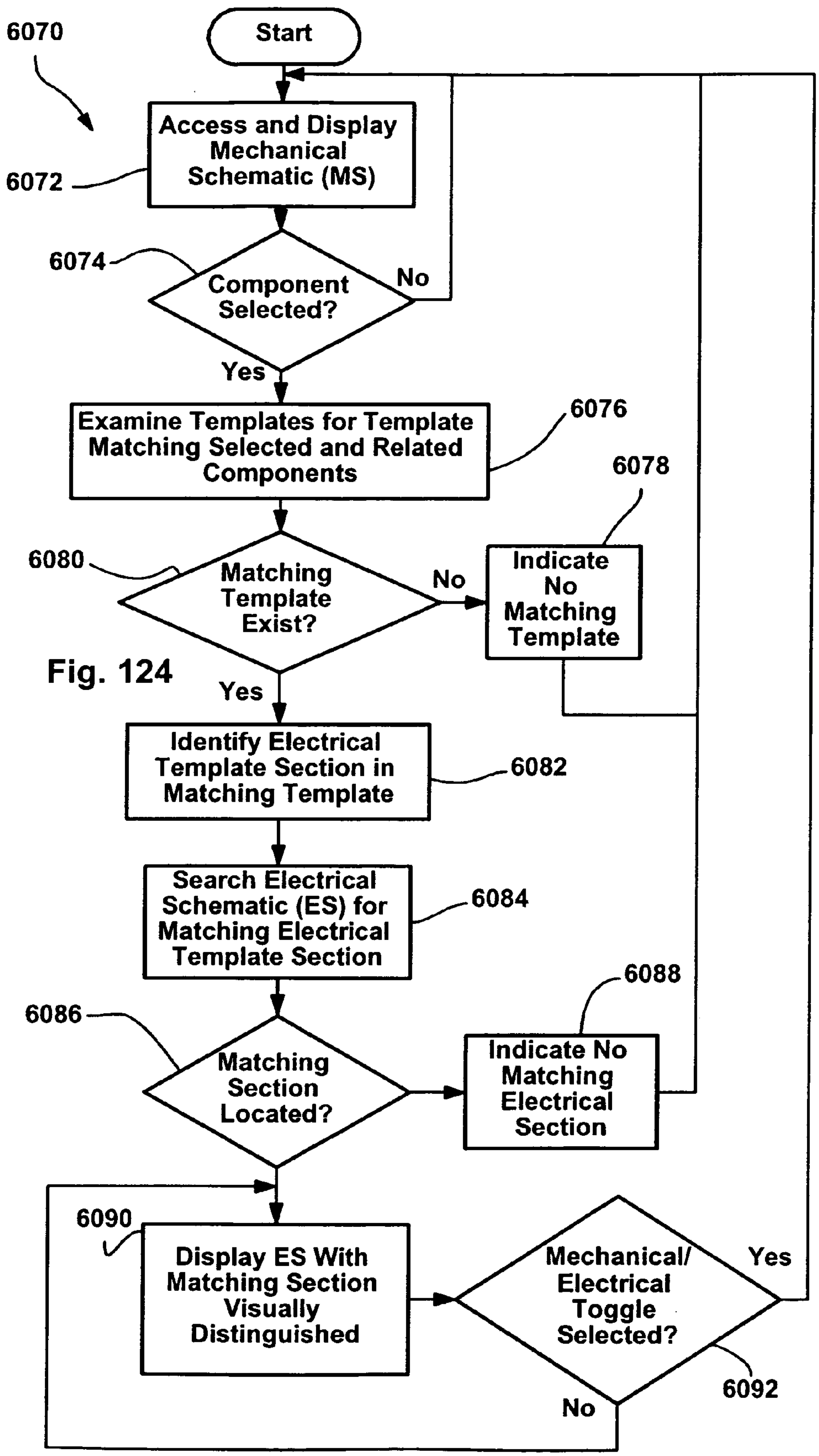
FIG. 124 is a flow chart illustrating one method according to the present invention.

Referring now to FIG. 124, an exemplary method 6070 consistent with the comments above, is illustrated. Referring also to FIGS. 122 and 123, at block 6072, a system user uses workstation 6022 to access and display a mechanical schematic. At block 6024, while the mechanical schematic is displayed on display 6018, the system user uses one of the interface devices 6020 to select one or a group of components from the mechanical schematic. For example, workstation 6012 may be programmed to provide a cursor selectable "submit" icon on display screen 6018, along with the mechanical schematic and to enable a user to select one or more component icons on a displayed schematic via a mouse controlled cursor. When a component is selected, processor 6022 may highlight the component (e.g., turn the component yellow). Hereinafter, the selected icons/relationships from the mechanical schematics will be referred to as a schematic segment of interest. After icon selection, when the submit icon is selected, control passes to block 6076 where processor 6022 examines the templates in specification database 6016 to identify a template including a mechanical template section (e.g., 6036) that matches the schematic section of interest. At block 6080, where no match is made, control passes to block 6078 where processor 6022 indicates via screen 6018 that no matching template exists in database 6016. After block 6078, in at least some embodiments, control passes back up to block 6072.

Referring still to FIGS. 122 through 124, where one of the mechanical template sections in database 6016 matches the mechanical schematic section of interest, control passes to block 6082. At block 6082, processor 6022 identifies the electrical template section in the matching template. For example, in FIG. 122, where second template 6032 includes a mechanical template section 6040 that matched the schematic section of interest, at block 6082 processor 6022 identifies the electrical template section 6042 in matching template 6032. At block 6084, processor 6022 searches the electrical schematic related to the mechanical schematic accessed at step 6072 for a set of related icons that match the electrical icon subset and relationships indicated by electrical template section 6042.

Continuing, at block 6086, where no match occurs, control passes to block 6088 where processor 6022 indicates via display 6018 that no matching electrical section has been identified. After block 6088 control passes back up to block 6072 where the mechanical schematic is displayed. At block 6086, where a related icon subset on the electrical schematic matches the electrical icon subset and relationships specified by electrical template section 6042, control passes to block 6090. At block 6090, processor 6022 displays the segment of the electrical schematic that includes the matching set of icons. Hereinafter, a matching segment on an electrical schematic will be referred to as a "matching schematic segment." In at least some embodiments, when an electrical schematic is displayed including a matching schematic segment, the icons and relationships that comprise the matching schematic segment are shown in a visually distinguishing manner (e.g., green as opposed to black).

After block 6090, control passes to block 6092 where processor 6022 monitors a mechanical/electrical toggle tool. Here, it is contemplated that processor 6022 may be programmed to provide a mouse selectable toggle icon on screen 6018 to switch between the electrical and mechanical schematics. Where the toggle icon is not selected, control loops back up to block 6090 where the electrical schematic is continually displayed. Once the toggle icon is selected, control passes from block 6092 back up to block 6072 where the mechanical schematic is again displayed.

In at least some embodiments of the present invention it is contemplated that more than one set of related electrical icons on an electrical schematic may match a related electrical icon subset specified by an electrical template section (e.g., 6042 in FIG. 122). Where more than a single match occurs, in at least some embodiments, it is contemplated that processor 6022 will be programmed to identify all instances of the related electrical icon subset specified by a template that occur in an electrical schematic and will provide the system user the ability to access all of the matching schematic segments in an intuitive fashion. For instance, in at least some embodiments, processor 6022 may provide a list of matching electrical schematic segments within a workstation window and allow the system user to hyperlink from any one of the instances to the section of the electrical schematic that includes the instance.

In another example, processor 6022 may identify the first matching schematic segment and display the electrical schematic section including the first matching schematic segment via screen 6018 along with some type of scrolling tools (e.g., mouse selectable forward and reverse arrow icons). In this case, the scrolling tools may be used to scroll to the other matching schematic segments and thereby access the other relevant parts of the electrical schematic.

According to yet one other aspect of at least some embodiments of the present invention, after a component or a group of related components are selected from a mechanical schematic, if no matching template is identified, processor 6022 may be programmed to help the system user specify a specific relationship of electrical components to be located in the electrical schematic. Once the specific set of components has been manually specified, processor 6022 may be programmed to search for the manually specified set and, when located, may render the set accessible via screen 6018 in a manner similar to that described above.

Figure 125:
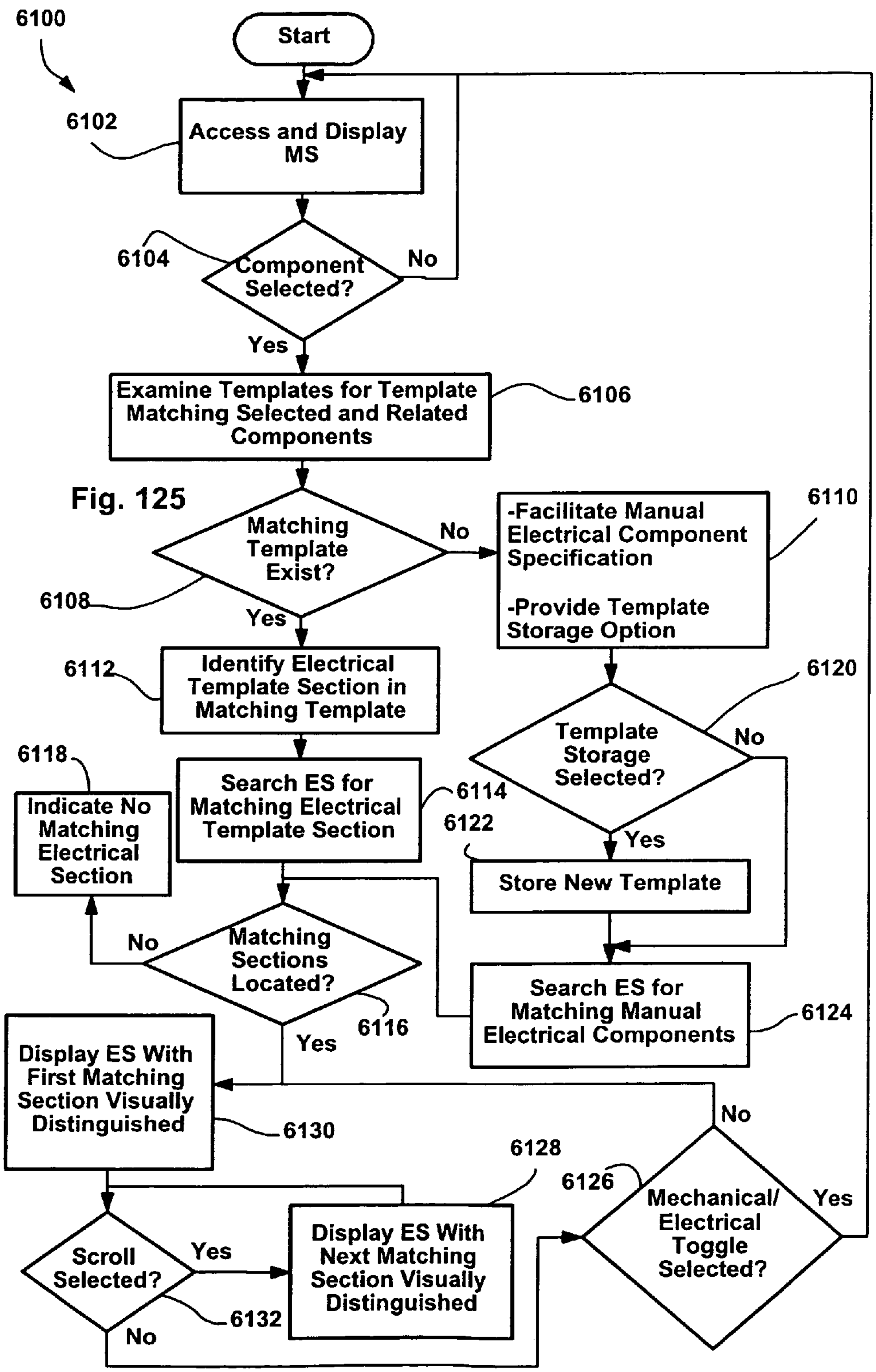
FIG. 125 is a flow chart illustrating the second method according to the present invention.

Referring now to FIG. 125, another inventive method 100 that includes several of the features described above is illustrated. Referring also to FIGS. 122 and 123, at block 6102, a system user uses workstation 6012 to access and display mechanical schematics. At block 6104, the system user selects one or more related mechanical component icons from the displayed mechanical schematic. At block 6106, processor 6022 examines the templates in database 6016 to identify a mechanical template section including a related mechanical icon subset that matches the schematic segment of interest. At block 6108, where the mechanical template section matches the schematic segment of interest, control passes to block 6112. At block 6112, processor 6022 identifies the electrical template section of the matching template. At block 6114 processor 6022 searches the electrical schematic for instances of the related electrical icon subset specified by the matching electrical template section. At block 6116, where no match occurs, control passes to block 6118 and processor 6022 indicates via screen 6018 that no match occurred. After block 6118 control passes back up to block 6102.

Where at least one electrical template section—electrical schematic match occurs, control passes to block 6130 where processor 6022 displays the section of the electrical schematic that includes the first matching schematic segment and, in at least some embodiments, visually distinguishes the matching schematic segment. At block 6132, where more than one instance of a match occurs, scrolling tools are provided on display 6018. Where a scrolling activity is selected, control passes to block 6128 where processor 6022 displays the next matching schematic segment via screen 6018. Where the scrolling activity is not selected, control passes to block 6126 where the mechanical/electrical toggle icon is monitored. While the toggle icon remains unselected, control loops back up to block 6030 and processor 6022 continues to display the first matching schematic segment. Once the toggle icon is selected, control again passes back up to block 6102 where the process is repeated. In FIG. 125, where only a single matching schematic segment is identified in some embodiments, it is contemplated that no scrolling tools would be provided and instead, control would pass from block 6130 to block 6126.

Referring again to FIG. 125 and, more specifically to block 6108, where the selected schematic segment of interest does not match one of the mechanical icon subsets and relationships specified by templates in database 6016, control passes to block 6110. At block 6110, processor 6022 facilitates manual electrical component specification whereby the system user may specify related mechanical components, related electrical components and a relationship between the mechanical and electrical components thereby, in effect, specifying a new template. Systems and software for specifying templates like the template described above should be well known to one of ordinary skill in the CAD art and therefore, in the interest of simplifying this explanation, those systems and software will not be described here in detail.

In addition, at block 6110, processor 6022, in at least some embodiments, provides a template storage option. At block 6120, where the system user does not want to store the newly specified template, control passes to block 6124. If, at block 6120, the system user elects to store the newly specified template, control passes to block 6122 where the new template is stored in specification database 6016 (see again FIG. 122).

Continuing, at block 6124, processor 6022 searches the electrical schematic related to the mechanical schematic accessed and displayed at block 6102 to identify instances of the electrical icon subset and relationships specified in the new template that occur in the electrical schematic. After block 6124, control passes again to block 6116 and the method proceeds as described above.

Thus, it should be appreciated that the FIG. 125 process differs from the FIG. 124 process in two important ways. First, in process 6100, where more than one matching electrical schematic segment is identified in an electrical schematic, processor 6022 renders all instances of the matching schematic segments rapidly accessible (see blocks 6130, 6132 and 6128). Second, where no match is identified between a schematic segment of interest (i.e., a segment selected on a mechanical schematic) and a mechanical template section, in process 6100, processor 6022 facilitates specification and optional storage of a new template for searching purposes.

While not illustrated, it should be appreciated that in at least some embodiments it is contemplated that the mechanical-electrical associating process described above may be performed prior to access by a system user to establish at least some of the associations automatically. Here, for instance, where pre-existing related mechanical-electrical schematics are accessible to processor 6022, processor 6022 may be programmed to automatically work through the mechanical schematics to identify schematic segments of interest that match mechanical template sections specified in database 6016 and, for each matching template, to search the related electrical schematics for electrical template sections to create mechanical-electrical associations. Where mechanical segment-electrical segment matches are identified or one-to-one relationships cannot be automatically resolved by processor 6022, processor 6022 may be programmed to earmark unassociated segments and potentially multiply-associated segments so that a system user can help resolve specific relationships in a manner similar to that described above with respect to FIG. 125. After all mechanical-electrical segment associations have been resolved, upon subsequent schematic access and selection of a set of related mechanical components, processor 6022 simply accesses the associated electrical segment and displays that segment for examination.

At this point, it should also be noted that while most users will use the inventive system to move from mechanical to electrical schematic segments, it has been recognized that movement and association in the opposite direction is also possible and in some cases will be desirable. The inventive system is applicable to facilitate movement in either direction between mechanical and electrical schematic segments. Thus, for instance, in at least some embodiments, a system user examining electrical schematics may access associated mechanical schematics by selecting a schematic segment of interest from the electrical schematic thereby causing processor 6022 to perform any of the associating methods described above or any combination thereof.

In addition to being useful for locating electrical schematic icons that are associated with mechanical schematic icons or vice versa, it has been recognized that the exemplary specification database described above may, in at least some embodiments, also be useful for generating an entirely new electrical schematic or at least a large part thereof, automatically, from existing mechanical schematics. Thus, for instance, in at least some embodiments of the invention, processor 6022 may be programmed to search a mechanical schematic for instances of mechanical icon subsets and relationships specified by mechanical template sections and, where an instance of a mechanical template section is identified, may add an instance of a related electrical template section to an electrical schematic. In many cases, it is believed that, given a well developed and relatively complete specification database 6016, 80% or more of an electrical schematic may be completely generated from a related mechanical schematic thereby substantially reducing the time and effort required to produce a set of electrical schematics for controlling mechanical components related to a set of mechanical schematics.

Figure 126:
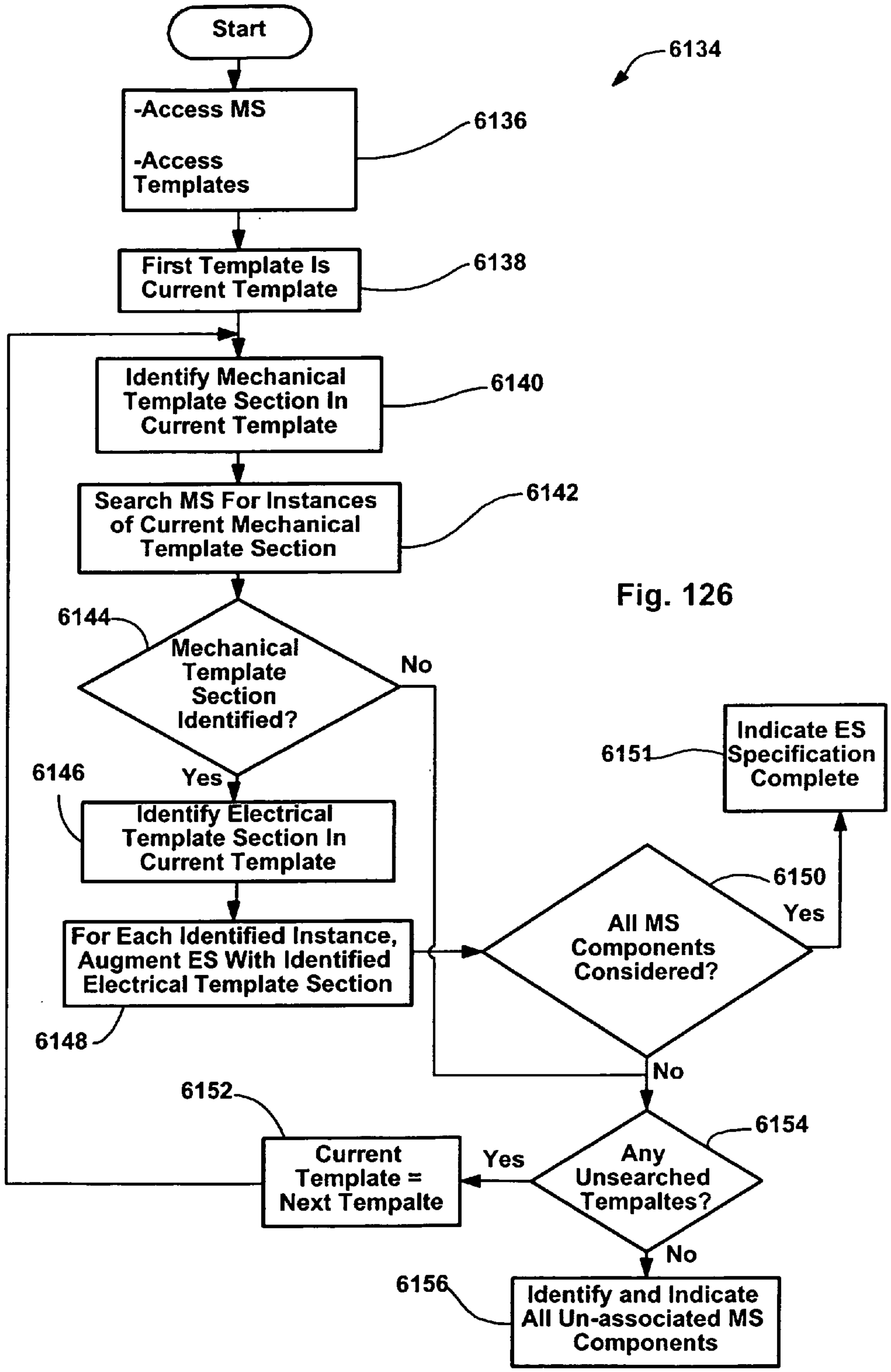
FIG. 126 is a flow chart illustrating a third method according to the present invention.

Referring now to FIG. 126, exemplary method 6134 for producing at least a portion of an electrical schematic from a related mechanical schematic is illustrated. Referring also to FIGS. 122 and 123, at block 6136, processor 6022 accesses a mechanical schematic and also accesses specification database 6016. At block 6138, processor 6022 begins with the first template 6030 and internally labels that first template 6030 the current template. At block 6140, processor 6024 identifies the mechanical template section 6036 of the current template 6030. At block 6142, processor 6022 searches the mechanical schematic for instances of the current mechanical templates section 6036. At block 6144, when processor 6022 identifies the related mechanical icons from a mechanical template section, control passes to block 6146. At block 6146 processor 6022 identifies the electrical template section in the current template. At block 6148, for each identified instance of the matching mechanical template section located in the mechanical schematic, processor 6022 adds an instance of the electrical template section to the electrical schematic. After block 6148 control passes to block 6150.

At block 150, processor 6022 determines whether or not a complete electrical schematic has been specified by processor 6022 by determining whether or not all of the mechanical schematic components have been associated with electrical schematic components. Where a complete electrical schematic has been specified, control passes to block 6151 where processor 6022 indicates that a complete electrical schematic has been specified. Where a complete electrical schematic has yet to be specified, control passes to block 6154.

Referring still to FIGS. 123 and 126, a block 6154, processor 6022 determines whether or not the mechanical template sections of all of the templates in database 6016 have been sought in the mechanical schematic. Where all of the mechanical template sections from all of the templates have been sought, control passes to block 6156 where processor 6022 identifies all unassociated mechanical schematic component icons and, in at least some embodiments, renders those icons visually distinguished via display 6018. Thereafter, the system use may be provided with a suite of tools for manually specifying related electrical schematic components in the form of icons to support the unassociated mechanical schematic component icons. At block 6154, when additional mechanical template sections of the template in database 6016 need to be searched, control passes to block 6152 where the current template is set equal to the next template. After block 6152, control again passes back up to block 6140 where processor 6022 repeats the loop illustrated until either the conditions of block 6150 or the conditions of block 6154 have been met. Thus, after method 6134 has been completed, at least a partially specified electrical schematic results and, in some cases, a complete electrical schematic including related icons for supporting the assembly specified in a related set of mechanical schematics is provided.

In addition to facilitating automatic generation of electrical schematics from mechanical schematics and facilitating access to sections of electrical schematics that are associated with specific sections of mechanical schematics as described above, it has been recognized that the specification database 6016 including templates as described above can also be used by a workstation user to update electrical schematics so that they are consistent with associated mechanical schematics when modifications are made to the mechanical schematics. To this end, referring now to FIGS. 127*a* and 127*b*, an exemplary method 6050 is illustrated.

In the examples that follow, it will be assumed that whenever processor 6022 (see again FIG. 123) accesses a mechanical or electrical schematic to facilitate modifications, from the time the schematic is accessed to the time when a system user indicates that schematic changes should no longer be memorialized, processor 6022 maintains some type of an intermediate schematic (e.g., IMS, IES) as described above. Thus, whenever a schematic is initially accessed by processor 6022, processor 6022 makes a copy of the accessed schematic as an intermediate schematic and, as modifications are made, those modifications are memorialized on the intermediate schematic in one form or another. In some cases, the intermediate schematic will reflect modifications made by actually deleting icons and eliminating relationships between icons that have been deleted or eliminated and by adding icons and indicating relationships between icons that have been added or indicated. In other cases the intermediate schematics will indicate additions and deletions by recording the additions and deletions in some distinguishing manner for subsequent use prior to an indication that a history of those changes should no longer be recorded.

Figure 127A:
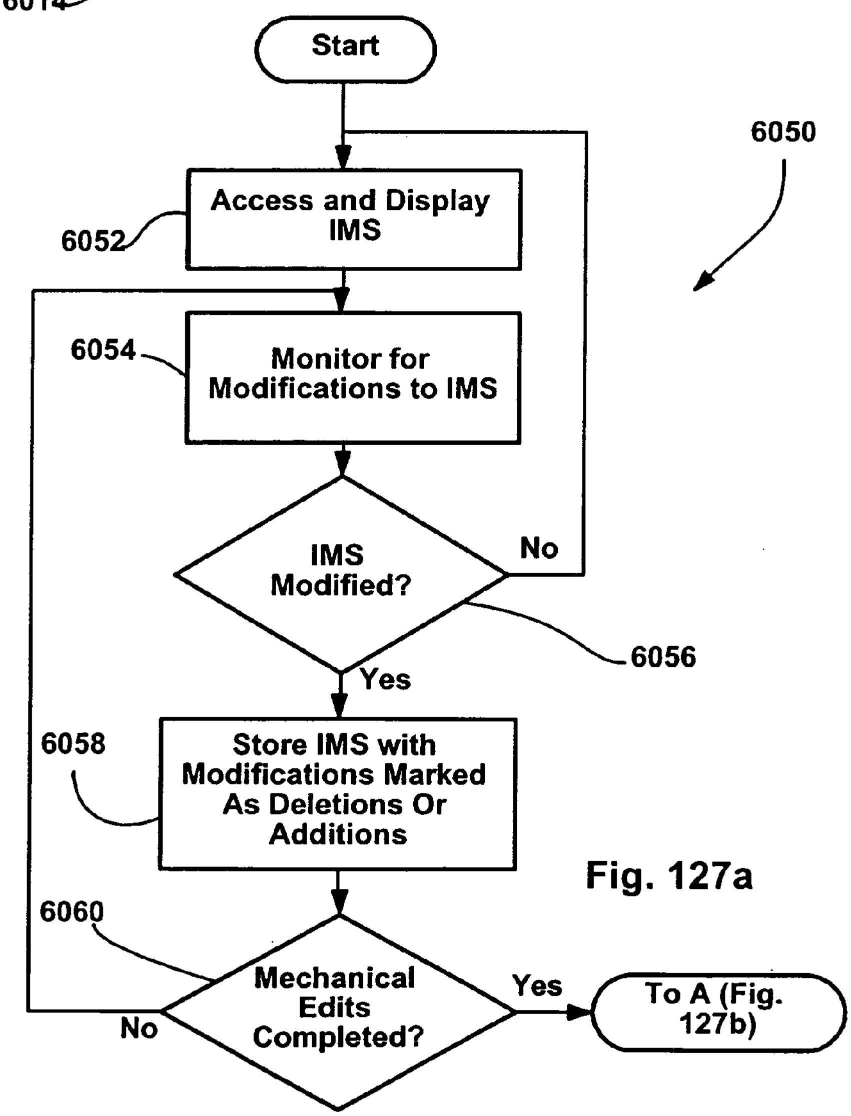
FIGS. 127*a* and 127*b* are a flow chart illustrating a fourth method according to the present invention.

Referring to FIG. 127*a* and also to FIGS. 122 and 123, at process block 6052, a system user using workstation 6012 causes processor 6022 to access and display an intermediate mechanical schematic. Consistent with the comments above, at this point, because no mechanical schematic modifications have made, the intermediate mechanical schematic is simply a copy of the mechanical schematic accessed by the system user. At block 6054, processor 6022 monitors workstation 6012 for modifications to the displayed intermediate mechanical schematic. Where no modifications are made, control loops through blocks 6056, 6052 and 6054 as processor 6022 monitors for modifications. Once a modification is made, control passes from block 6056 to block 6058 where processor 6022 stores the modified intermediate mechanical schematic with the modifications marked as deletions or additions. For instance, in at least some embodiments, deletions are represented in the intermediate mechanical schematic by icons and relationships in the same manner that they were represented in the initial mechanical schematic accept that they are earmarked in some fashion to indicate that they are to be deleted. Similarly, additions to the mechanical schematic are represented by icons and indications of relationships and are marked in some fashion to indicate that they are being added to the original mechanical schematic.

After block 6058, control passes to decision block 6060 where processor 6022 monitors workstation 6012 for an indication as to whether or not mechanical edits have been completed. In this regard, processor 6022 may provide some type of mouse selectable icon on screen 6018 for indicating when mechanical edits have completed. Where the complete icon is not selected and additional modifications are made to the intermediate mechanical schematic, control passes back up to block 6054 where the loop described above is repeated. Where the system user indicates that all of the mechanical edits have bene made, control passes from block 60 in FIG. 127*a* to block 6182 in FIG. 127*b*. Thus, after the sub-process of FIG. 127*a* has been completed, in at least some embodiment of the invention database 6014 will include several schematics relevant to the present inventive method including the original and un-altered mechanical schematics and electrical schematics as well as the intermediate mechanical schematic including a record of modifications to the original mechanical schematic. In addition, in at least some embodiments, the IMS will include information useable by processor 6022 to distinguish additions and deletions for subsequent use.

Figure 127B:
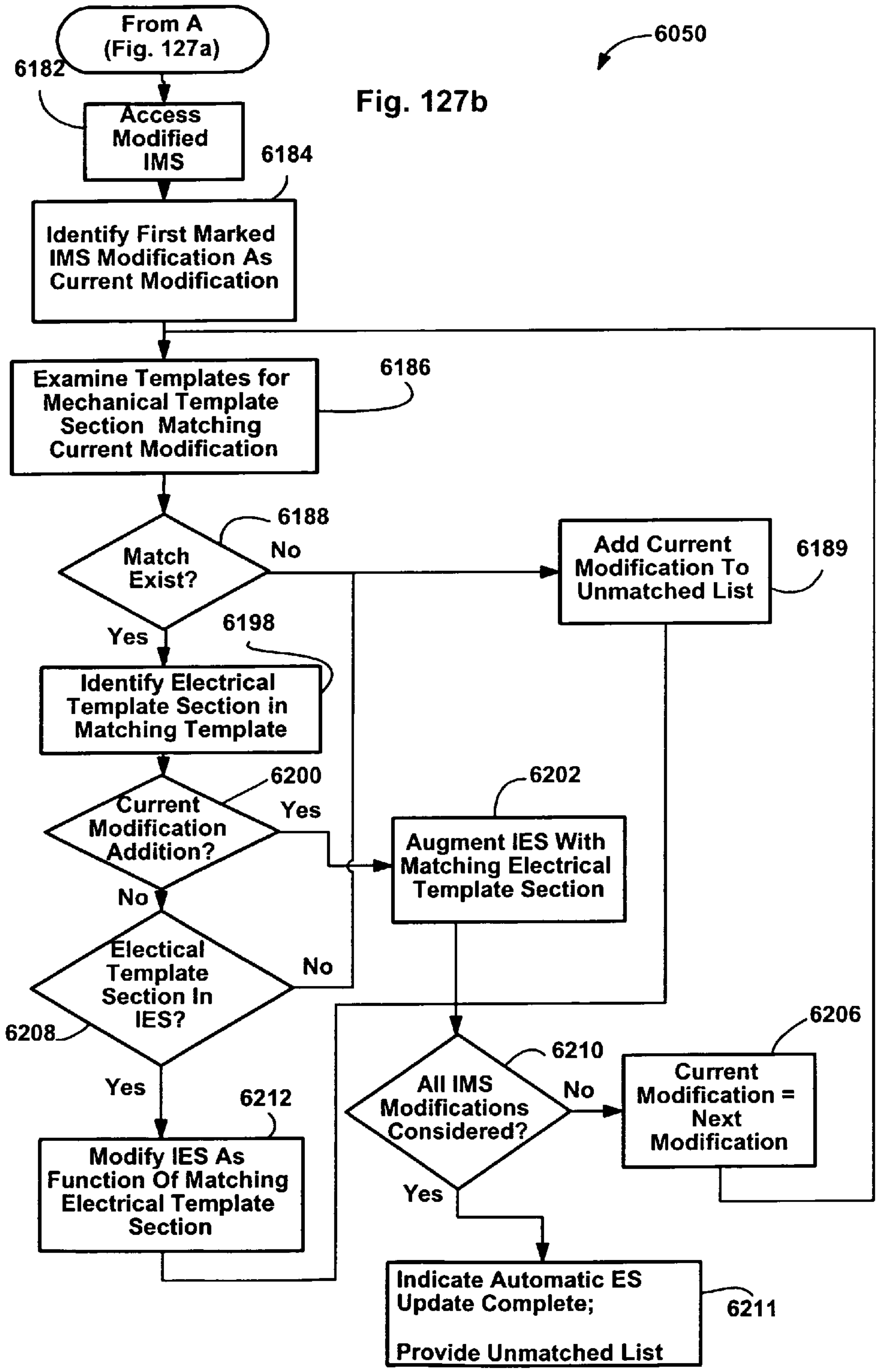

Referring now to FIG. 127*b*, an automatic electronic schematic updating portion of method 6050 is illustrated wherein processor 6022 attempts to update a preexisting electrical schematic corresponding to the IMS modified by the process illustrated in FIG. 127*a*. In this regard, at block 6182, processor 6022 accesses the modified IMS. At block 6184, processor 6022 identifies the first marked modification in the IMS as a current modification. Here, the current modification is akin to the schematic segment of interest in the above discussion related to FIGS. 3 and 4. At block 6186, processor 6022 examines the templates in database 6016 for a mechanical template section that matches the current modification. At block 6188, where no match is identified, control passes to block 6189 where processor 6022 maintains an unmatched modification list and adds the current modification to the unmatched list. After block 6189, control passes to block 6210.

Referring still to FIGS. 122, 123 and 127*b*, at block 6188, where one of the mechanical template sections matches the current modification, control passes to block 6198. At block 6198, processor 6022 identifies the electrical template section in the matching template. At decision block 6200, processor 6022 determines whether or not the current modification is an addition or a deletion. Where the current modification is an addition, control passes to block 6202 where processor 6022 augments the intermediate electrical schematic (IES) with the matching electrical template section. Here, augmentation may include adding an instance of the electronic template section to the intermediate electronic schematic and indicating suitable linkage to the associated mechanical component icons in the mechanical schematic as well as any required linkage to other icons in the electronic schematic. Rule sets and tables for specifying appropriate linkages may be included as part of each template. After block 6202 control passes to decision block 6210.

Referring again to decision block 6200, where the current modification is a deletion, control passes to decision block 6208 where processor 6022 attempts to locate the electrical template section identified at block 6198 in the IES. Where the electrical template section sought is not located in the IES, control passes to block 6189 where, once again, the current modification may be added to the unmatched list. At block 6208, where only one instance of the electrical template section is located in the IES, control passes to block 6212 where processor 6022 modified the IES as a function of the matching electrical template section. Here, augmentation may include deleting the matching schematic segment from the IES. In some cases the segment will simply be deleted while in other cases the segment will be marked as to be deleted but will remain as part of the IES to memorialize the modification. After block 6212 control passes to block 6210.

At decision block 6210, processor 6022 determine whether or not all of the IMS modifications have been considered. Where one ore more modifications have not been considered, control passes to block 6206 where processor 6022 identifies the next modification in the IMS as the current modification. After block 6206 control passes back up to block 6186 where the loop described above is repeated. At block 6210, where processor 6022 determines that all of the IMS modifications have been considered, control passes to block 6211. At block 6211, processor 6022 indicates, via screen 6018, that the automatic electrical schematic update process has been completed. In addition, in at least some embodiments, at process block 6211 processor 6022 may provide the unmatched modification list to quickly and automatically identify modifications to the mechanical schematic for which associated modifications to the electrical schematic could not be automatically made via the database templates.

Figure 7:
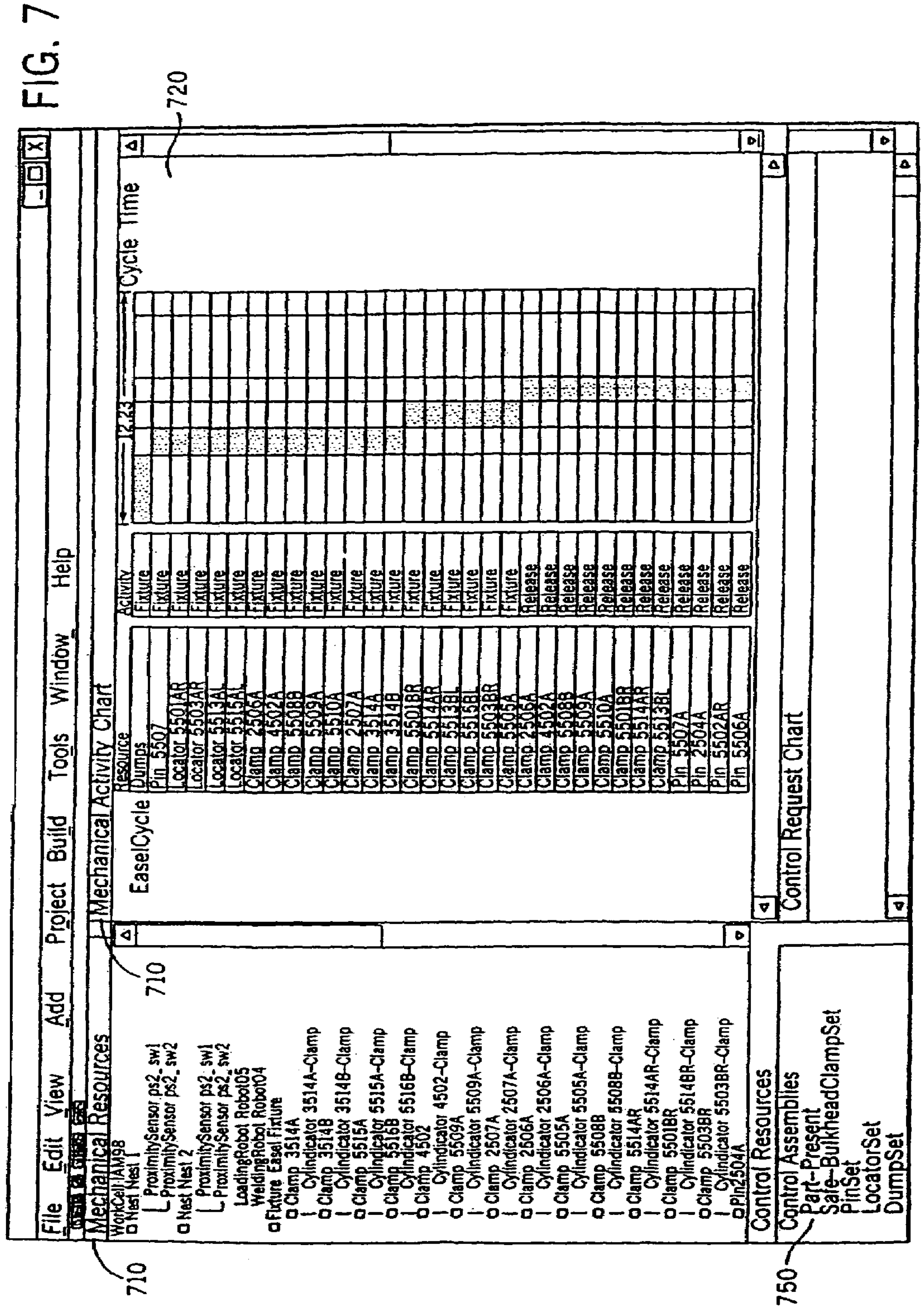
FIG. 7 is a Designer Studio window in accordance with a preferred embodiment.
Figure 128:
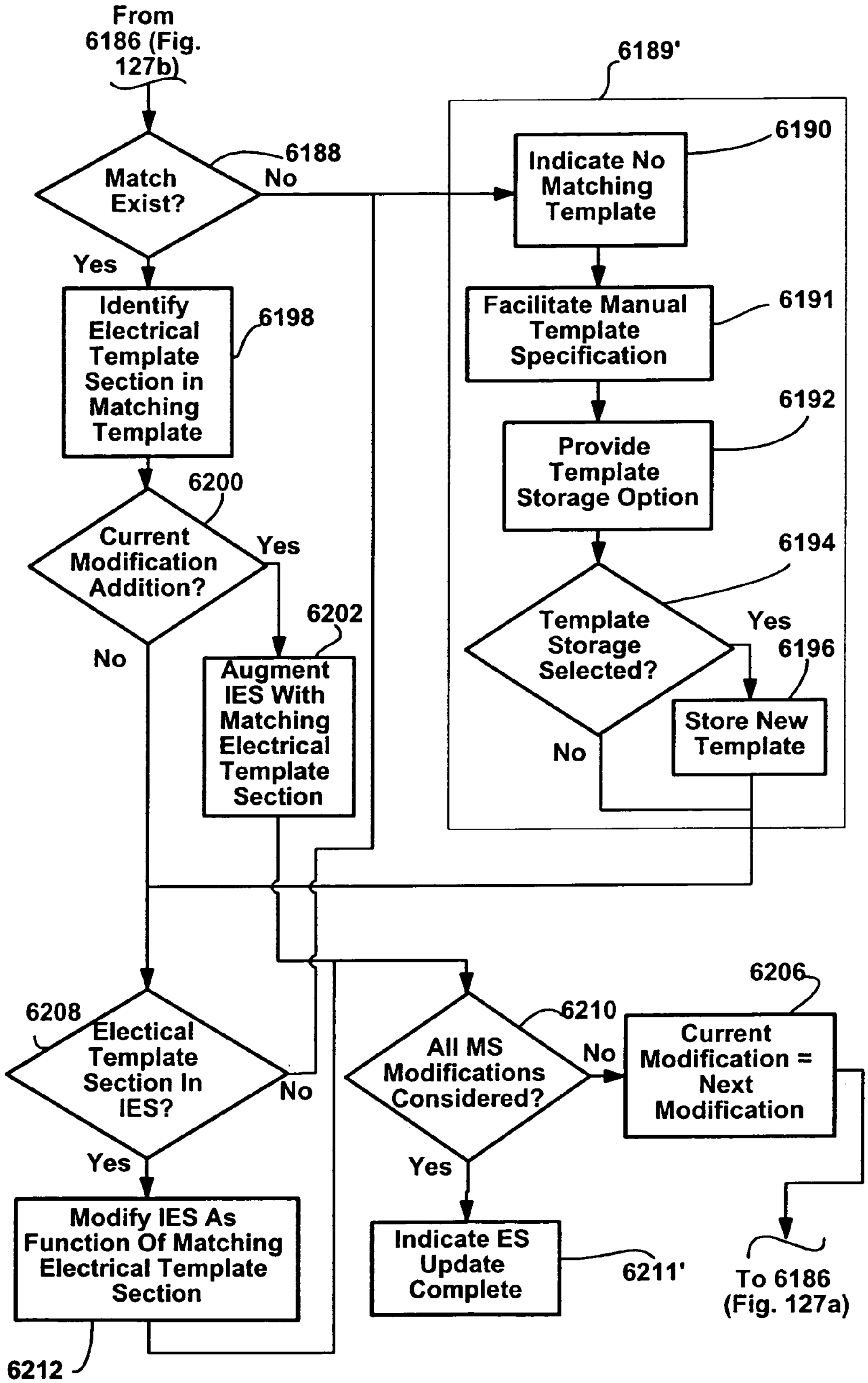
FIGS. 128*a* and 128*b* are a flow chart illustrating a fifth method according to the present invention.

A system user may also be provided with a suite of tools to manually modify the electrical schematic to support the mechanical schematic modifications included on the unmatched list. Referring now to FIG. 128, a sub-method 6101 which may be used to replace the portion of the method illustrated in FIG. 127*b* that follows block 6186 is illustrated wherein the sub-method 6101 includes steps that facilitate manual template specification when no match occurs at block 6188 between a current mechanical schematic modification and at least one of the mechanical template sections. In FIG. 128, many of the decision and process blocks illustrated are similar to the decision and process blocks described above with respect to FIG. 127*b* and therefore, in the interest of simplifying this explanation, those blocks will not be described again here in detail. Here, it should suffice to say that similar blocks in FIGS. 127*b* and 128 are similarly labeled. The primary differences between FIGS. 127*b* and 7 are that block 6189 in FIG. 127*b* has been replaced by block 6189' in FIG. 128 and block 6211 in FIG. 127*b* has been replaced by block 6211' in FIG. 128.

Referring now to FIGS. 122, 123, 127*b* and 128, after block 6186 in FIG. 127*b*, control passes to block 6188 in FIG. 128. At block 6188, processor 6022 determines whether or not a match exists between the current mechanical schematic modification and any of the mechanical template sections in any of the templates in specification database 6016. As in FIG. 127*b*, when a match exists, control passes from block 6188 to block 6198 where processor 6022 identifies the electrical template section in the matching template. At decision block 6200, processor 6022 determines whether or not the current modification is an addition or a deletion. Where the current modification is an addition, at block 6202, processor 6022 augments the IES as a function of the matching electrical template section and then control passes to block 6210.

At block 6200, where the current modification is a deletion, control passes to block 6208 where processor 6022 determines whether or not the identified electrical template section is located in the IES. Where the electrical template section is not located in the IES, control passes to block 6198'. Where the electrical template section is located in the IES, control passed to block 6212 where processor 6022 modifies the IES as a function of the matching electrical template section. After block 6212 control passes to block 6210.

Referring still to FIGS. 122, 123 and 128, where no match is identified at block 6188, control passes to block 6189'. As illustrated, block 6189' includes a plurality of other blocks which, generally, help a system user manually specify a template related to an unmatched mechanical schematic modification. In this regard, at block 6190, processor 6022 indicates via display 6018 that no matching template exists for the current mechanical modification. Here, this indication may be facilitated by actually presenting the current mechanical modification via display 6018 along with some type of textual indication. After block 6190, processor 6022 facilitates manual template specification at block 6191. Here, the manual template specification process may take any of several different forms and the present invention should not be limited to a specific form. In at least one exemplary embodiment a suite of CAD tools may be accessed by processor 6022 and provided to the system use via workstation 6012. Using the tools the system user specifies an electrical template section in the same fashion as a user would with prior types of electrical schematic specifying software suites.

After block 6191, control passes to block 6192 where processor 6022 provides a template storage option for the system user. If the user elects to store the new template at block 6194, control passes to block 6196 where the new template is stored. After block 6196 control passes to block 6208 described above and the electrical schematic specification process is repeated as described above. At block 6194, if the user opts not to store the new template control passes to block 6208 without storing the new template.

In some cases where electrical schematics are to be updated to reflect modifications to related mechanical schematics, a system user may want to have more control over the updating process. For example, while a template set may specify specific mechanical electrical relationships, a user may prefer to customize some relationships in other ways due to known limitations in electrical components. To this end, FIG. 129 illustrates a sub-method that may be used to replace the sub-method of FIG. 127*b* where the system user exercises greater control. Referring also to FIGS. 122 and 123, after an IMS modifying process like the process of FIG. 127*a* has been completed and the modified IMS has been stored in database 6014, control passes to block 6292 in FIG. 129. At block 6292, processor 6022 access the modified IMS. At block 6294, processor 6022 displays the modified IMS with all of the modifications visually distinguished. Here, for example, icons and relationships that have been deleted may be shown in red while icons and relationships that have been added may be shown in green. After block 6294, control passes to decision block 6296 where the system user uses an interface device (e.g., 6020 in FIG. 122) to select one of the visually distinguished modifications shown on screen 6018. Once one or more modifications is selected, control passes to block 6298 where processor 6022 examines the templates in database 6016 for a mechanical template section that matches the schematic segment of interest (i.e., the selected modification). After block 6298, at block 6300, where no match exists, control passes to block 6189' where processor 6022 facilitates manual template specification with aid from the system user as illustrated in FIG. 128 (i.e., see block 6189 ' in FIG. 7). After block 6189 ' control passes to block 6312.

Where a match does exist at decision block 6300, control passes to block 6312. At block 6312, processor 6022 identifies the electrical template section in the matching template. At block 6314, processor 6022 determines if the modification is an addition or a deletion. Where the modification is an addition, control passes to block 6318 where processor 6022 augments the IES as a function of the matching electrical template section. Control passes from block 6318 to block 6320.

At block 6314, where the selected modification is a deletion, control passes to block 6316 where processor 6022 determines whether or not at least one instance of the electrical template section is present in the IES. Where no instance of the electrical template section is present in the IES, control passes back up to block 6189' where processor 6022 walks the system user through the manual template specification process again. Where at least one instance of the electrical template section is found in the IES, control passes from block 6316 to block 6323 where processor 6022 modifies the IES as a function of the matching electrical template section. After block 6323, control passes to block 6320.

At block 6320, processor 6022 displays the augmented/modified IES with all of the modifications to the IES visually distinguished. Here, added icons and relationships may be shown in green while deleted icons and relationships may be shown in red. After block 6320, at decision block 6323, processor 6022 monitors workstation 6012 for an indication that the displayed modification is being affirmatively accepted by the system user. Where the user indicates that the modification should not be accepted, control passes to block 6330 where processor 6022 undoes the most recent IES modification. After block 6330 control passes to block 6324. At block 6322, where the user accepts the displayed modification, control passes to block 6324. At block 6324, processor 6022 stores the IES. Continuing, at block 6325, processor 6022 determines whether or not the electric schematic update process has been completed. When the update process has not been completed control loops back up to block 6294 where the process continues. When the update process has been completed, control passes to block 328 where processor 6022 stores the IES as the modified electric schematic and the process ends.

Thus, in FIG. 129, when processor 6022 identifies a modification to the IES based on a selected modification to the IMS, according to method 6220, prior to storing the identified IES modification, processor 6022 in effect, suggests the change to the system user and requests confirmation. Upon receiving affirmative confirmation that the change should be made, processor stores the change as part of the updated electronic schematic for subsequent use.

In at least some cases, it has been recognized that at least some electrical components used to configure an automated assembly can be reused when the automated assembly is reconfigured to perform some other process. This is particularly true in cases where only parts of an existing automated assembly are modified to perform a new process. To this end one method 6350 which provides a mechanical and electrical road map for modifying an existing automated assembly and reusing existing electrical components where possible is illustrated in FIGS. 130*a*-130*c*.

Although not always the case, in the interest of simplifying this aspect of the invention, it will be assumed that templates exist in database 6016 to correlate every related set of mechanical icons to a related set of electrical icons in the mechanical and electrical schematics so that no manual template specification is necessary. In more complex cases where database 6016 is less complete, a more complex process than method 6350 is contemplated including additional steps and sub-methods similar to those described above to manually specify templates. Similarly, here it will be assumed that only a single matching instance occurs between each electrical template section sought and a match in the IES so that processor 6022 can associate schematic sections without the help of a user.

Figure 130A:
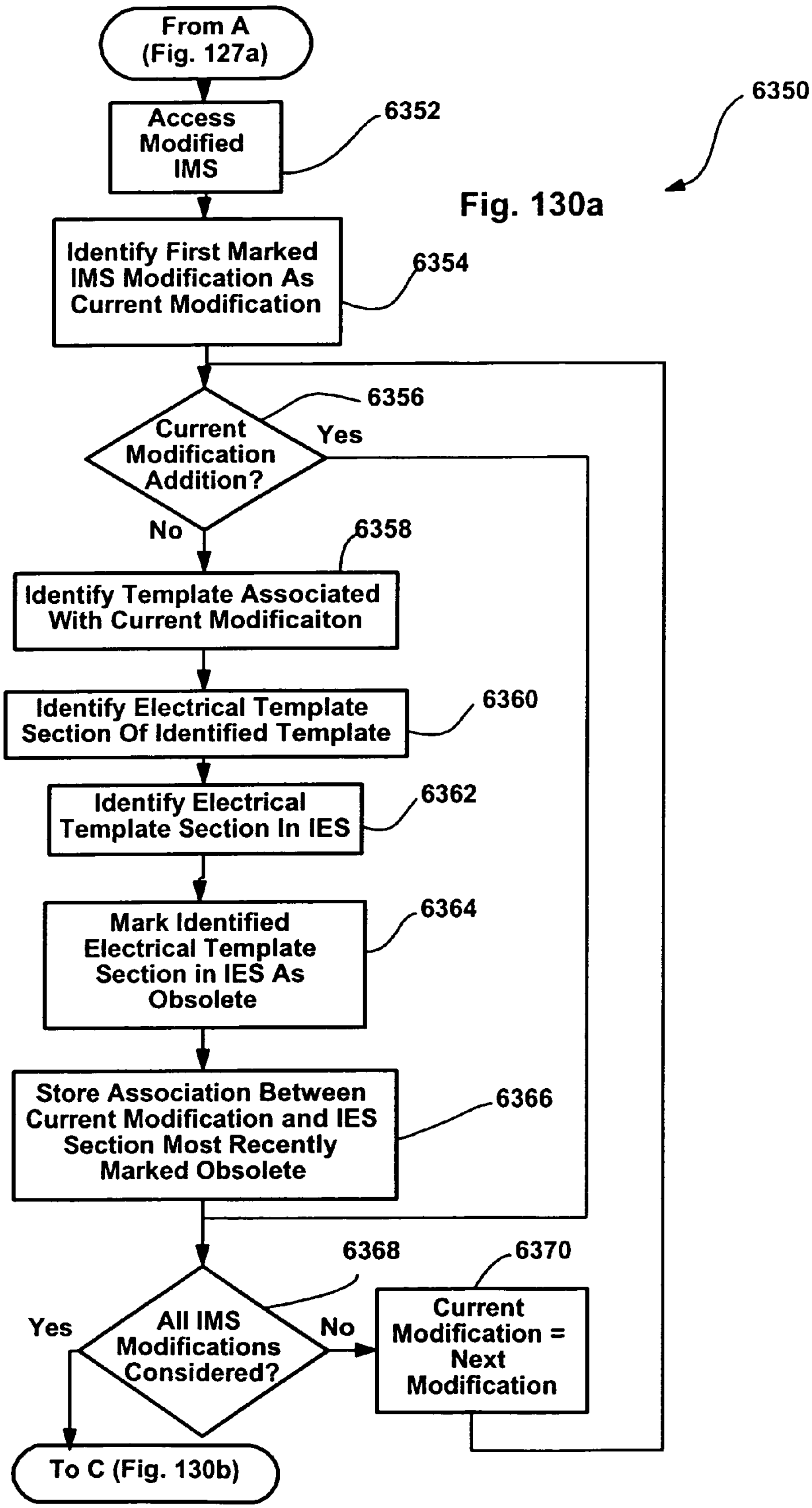
FIGS. 130*a*, 130*b* and 130*c* are a flow chart illustrating yet another method according to the present invention.
Figure 130B:
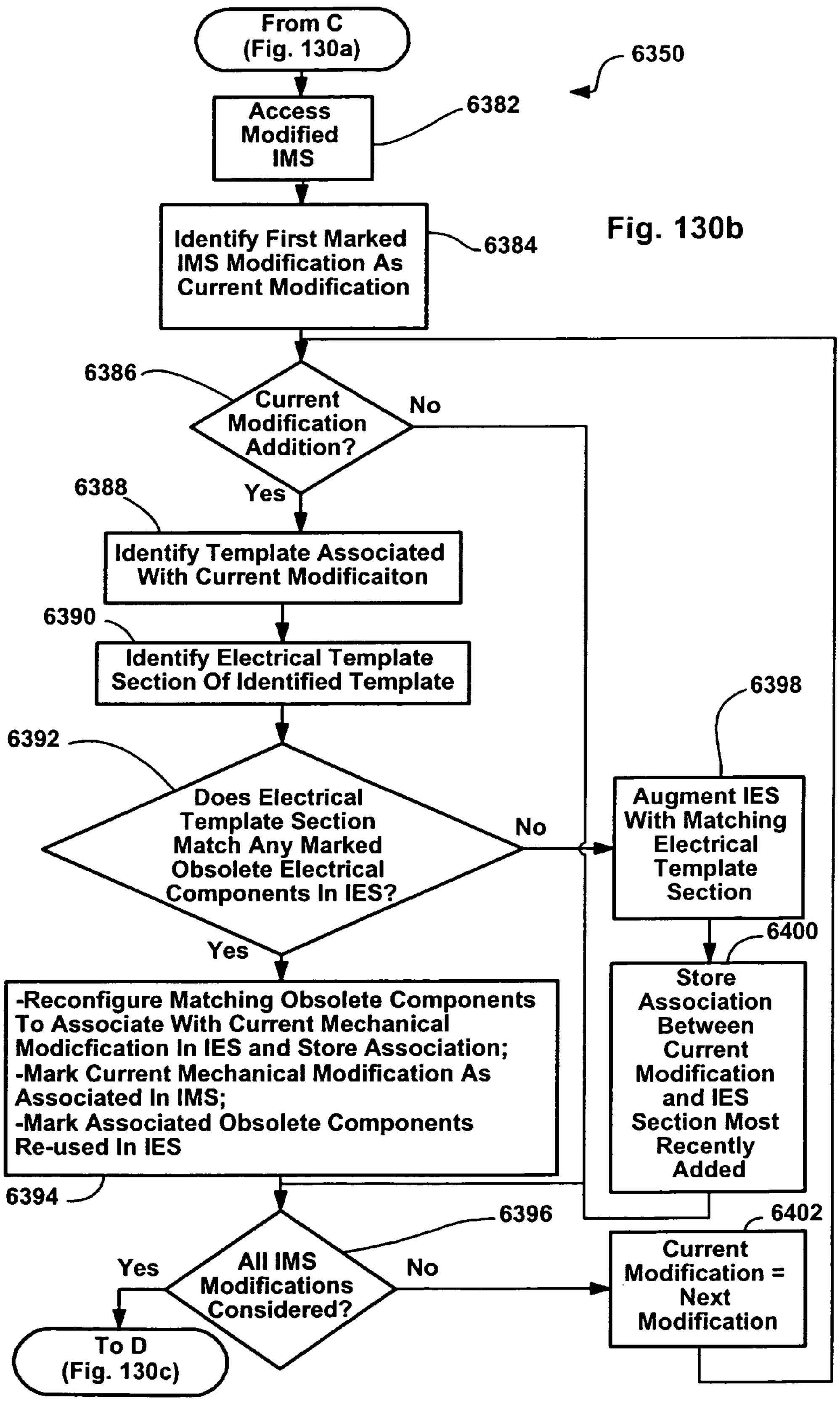
Figure 130C:
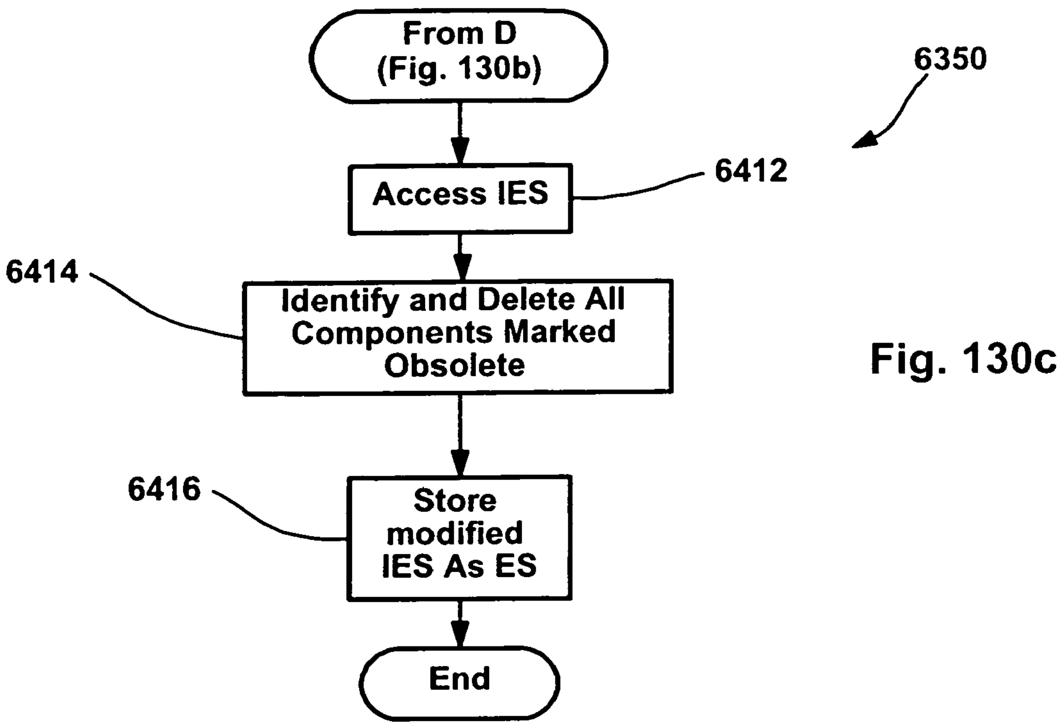

Method 6350 in FIGS. 130*a*-130*c* is to be used after a method similar to method 6050 described above with respect to FIG. 127*a* so that, prior to method 6350, a modified IMS already exists where added and deleted related mechanical schematic icons have been earmarked or indicated in some fashion in an IMS.

Referring now to FIG. 130*a* and also to FIGS. 122 and 123, at block 6352, processor 6022 access the modified IMS. At block 354, processor 6022 identifies the first marked IMS modification as a current modification. At block 6356 processor 6022 determines whether the current modification is an addition or a deletion. When the current modification is an addition, control passes to block 6368.

At block 6356, where the current modification is a deletion, control passes to block 6358. At block 6358, processor 6022 identifies the template associated with the current modification. At block 6350, processor 6022 identifies the electrical template section of the identified template. At block 6362, processor 6022 identifies the electrical template section in the IES. At block 6364, processor 6022 marks the identified electrical template section in the IES as obsolete. Here, the "obsolete" qualifier simply means that the component associated with the icon(s) is not required in light of the associated mechanical schematic modification. At block 6366, processor 6022 stores the association between the current modification and the IES section most recently marked as obsolete. After block 6366, control passes to block 6368.

At block 6368, processor 6022 determines whether or not all of the IMS modifications have been considered. Where one or more modifications have not been considered, control passes to block 6370 where processor 6022 identifies the next modification and sets the current modification equal to the next modification. After block 6370 control loops back up to block 6356 where the process described above is repeated. At block 6368, where all of the IMS modifications have been considered, control passes to block 6382 in FIG. 130*b*.

At block 6382, processor 6022 again access the modified IMS. At block 384, processor 6022 identifies the first marked IMS modification as the current modification. At block 6386, processor 6022 determines whether or not the current modification is an addition or a deletion. In this case, when the current modification is a deletion, control passes to block 6396. At block 6386, where the current modification is an addition, control passes to block 6388. At block 6388, processor 6022 identifies the template associated with the current modification. At block 6390, processor 6022 identifies the electrical template section of the identified template. At block 6392, processor 6022 determines whether or not the identified electrical template section matches any of the electrical components and relationships that are marked as obsolete in the IES. Here, again, the "obsolete" qualifier simply indicates that the components were represented in the original electrical schematic but, because of some mechanical schematic deletion, were rendered no longer needed to support the deleted mechanical components.

Where no match occurs at block 6392, control passes to block 6398 where processor 6022 augments the IES as a function of the matching electrical template section. Here, augmentation typically means that an instance of the electrical template section is added to the electrical schematic to support the component added to the mechanical schematic via the current modification. After block 6398, control passes to block 6400 where processor 6022 stores the association between the current modification and the IES section most recently added. After block 6400 control passes to block 6396.

Referring once again to block 6392, where the identified electrical template section matches some set of the obsolete electrical components in the IES, control passes to block 6394. At block 6394, processor 6022 reconfigures the matching obsolete components to associate those components with the current mechanical modification and stores the association. In addition, at block 6394, processor 6022 marks the current mechanical modification as associated or supported in the IMS. Furthermore, at block 6394, processor 6022 marks the associated obsolete components in the IES as reused. After block 6394, control passes to block 6396. At block 6396, processor 6022 determines whether or not all of the IMS modifications have been considered. Where additional modifications have to be considered, control passes to block 6402 where processor 6022 sets the current modification to the next modification. After block 6402, control passes back up to block 6386 where the loop described above is repeated. Where all of the IMS modifications have been considered at block 6396, in at lease some embodiments, control passes to block 6412 in FIG. 130*c*.

At block 6412, processor 6022 accesses the IES and, at block 6414, processor 6022 identifies and deletes all of the components in the IES that are still marked as obsolete (i.e., deletes components rendered obsolete by a mechanical schematic deletion and not reusable to fulfill a requirement due to a mechanical schematic addition). After block 6414, at block 6416, processor 6022 stores the modified IES as the electrical schematic.

Thus, it should be appreciated that the process of FIGS. 127*a* and 130*a*-130*c* provides a road map for accommodating mechanical schematic changes in a fashion that optimally reuses existing electrical components.

In at lease some cases, it has been recognized as advantageous to maintain information related to the changes made to mechanical and electrical schematics so that those changes can be mirrored by the engineer(s) charged with actually configuring the mechanical and electrical systems. Thus, for instance, the engineer that has to modify an existing mechanical assembly to match modified mechanical schematics likely would want schematics that show components to be removed, original components not to be modified and components to be added. Similarly, an engineer modifying an existing electrical system would likely find helpful schematics distinguishing original components to remain unchanged, components to be deleted, components to be added and components to be reused.

Here, referring again to FIG. 130*b*, at block 6396, after all IMS modifications have been considered, the IMS and IES prior to block 6412 in FIG. 130*c* include all of the information necessary to provide a richly detailed road map of schematics including all of the distinguishing information described above. Thus, in at lease some embodiments, instead of passing control to block 6412 in FIG. 130*c*, processor 6022 may store the fully distinguishing IMS and IES for subsequent use.

Figure 131:
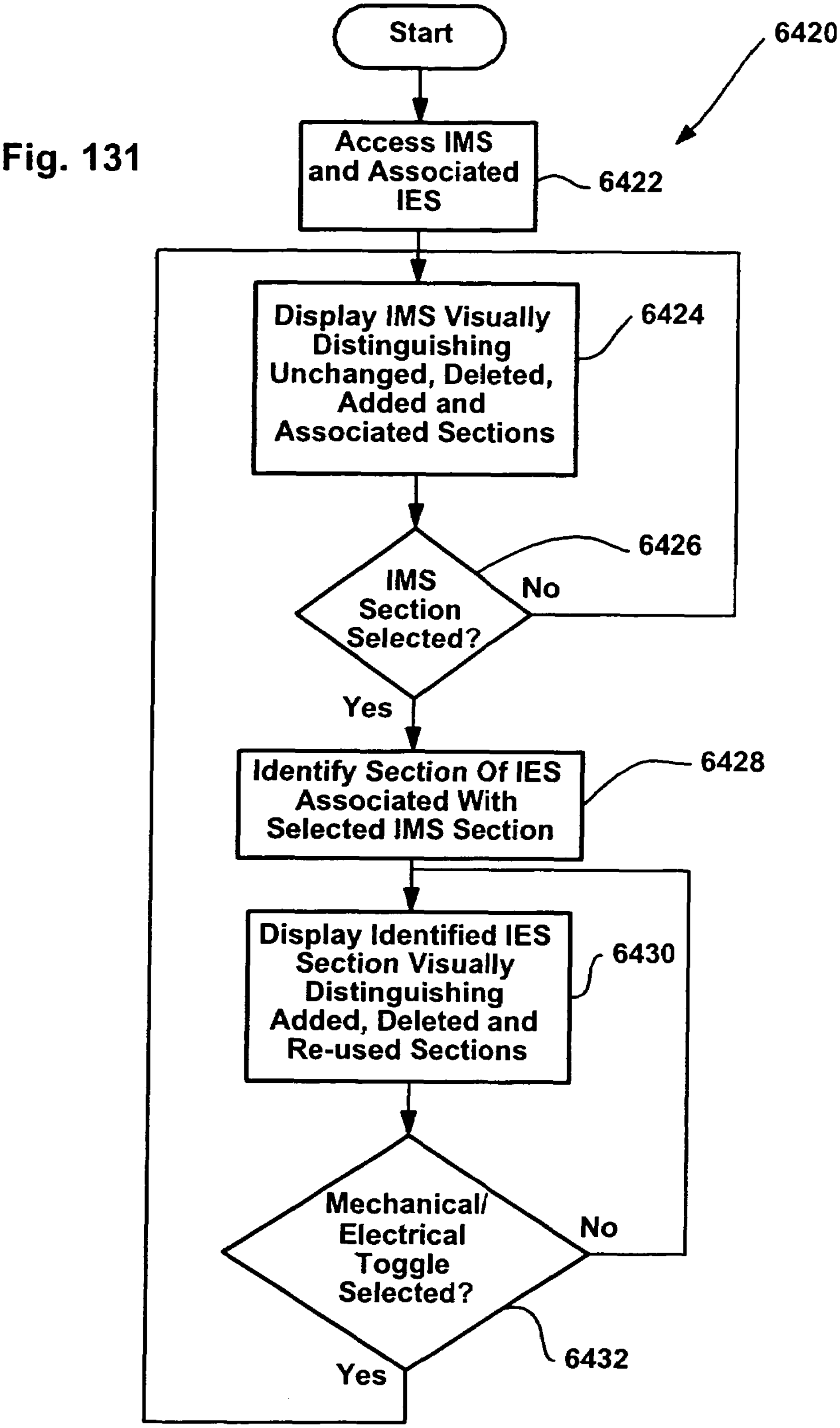
FIG. 131 is a flow chart illustrating one additional method according to the present invention.
Figure 132:
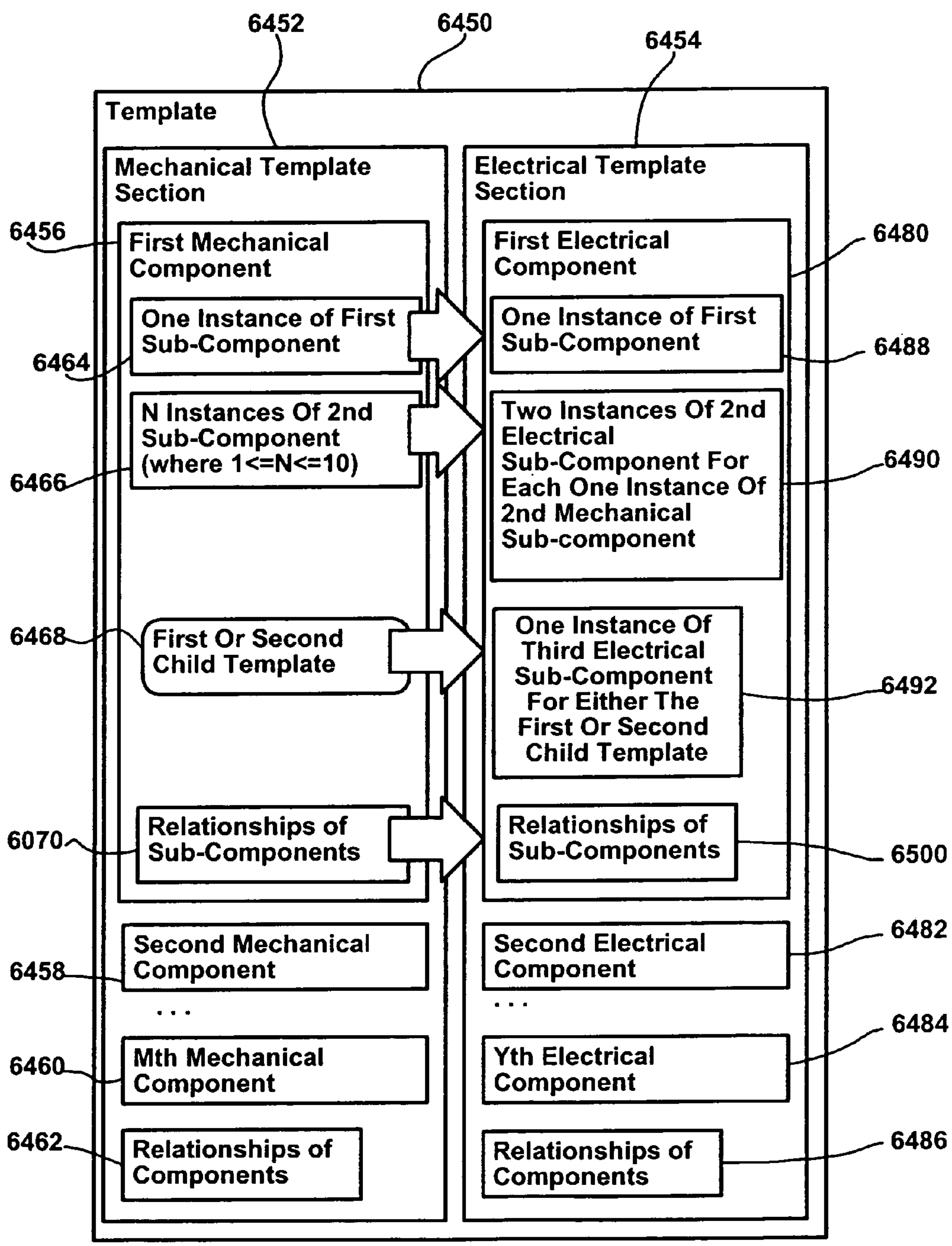
FIG. 132 is a schematic diagram of an exemplary template according to one inventive aspect.

Referring now to FIG. 131, a method 420 for accessing and examining the road map by modified IESs and IMSs is illustrated. At block 422, processor 6022 accesses a stored IMS and associated IES. At block 6424, processor 6022 displays the IMS via screen 6018 and visually distinguishes unchanged icons and relationships, deleted icons and relationships and added icons and relationships. At block 6426, processor 6022 monitors workstation 6012 for selection of any of the sections of the IMS displayed on screen 6018. Once a section is selected, control passes to block 6428 where processor 6022 identifies the section of the IES associated with the selected IMS section. At block 6430, processor 6022 displays the identified IES section visually distinguishing added, deleted and reused sections. At block 6432, processor 6022 monitors a mechanical/electrical toggle icon or the like and, when the toggle icon is selected, control passes back up to block 6424 where the IMS is displayed.

Although not illustrated, it is contemplated that a complete set of related IMSs and IESs may be downloaded to a hand held or portable computing device that has graphical capabilities and that, once downloaded, the mechanical-electrical toggle function could be employed on a factory floor to aid in assembly/system reconfiguration. In addition, as changes are manually made to electrical components to reflect the information on the hand held device, the device may be used to indicate a completed change and cause the device to eliminate the changes from the IMS and IES.

While the invention may be susceptible to various modifications and alternative forms, specific embodiments have been shown by way of example in the drawings and have been described in detail herein. However, it should be understood that the invention is not intended to be limited to the particular forms disclosed. For example, in at least some cases, it has been recognized that where a system user manually defines a template to be used with pre-existing schematics, it may be difficult for the user to actually specify a template including mechanical and electrical sections that will match existing schematic segments. Thus, for instance, a user may believe ten separate electrical components will be arranged in specific relationships whenever they appear in a segment to support a specific mechanical segment and therefore may define an electrical template section including the ten components and expected relationship. Here, in some cases, actual component subsets may include only eight of the components specified by the user or may include all ten of the components but in different relationships than expected by the user. In these cases no matches would be recognized.

To overcome the above problem, in at least some inventive embodiments, processor 6022 may be programmed to recognize "near matches" where a certain percent of template detail matches a schematic segment. Thus, in this case, where a user imperfectly specifies template characteristics, processor 6022 would nevertheless be able to identify one or more matches if the template characteristics at lease somewhat accurately represented a relationship in the schematics. Where potential or near matches occur and are identified, it is contemplated that processor 6022 would give a choice list or the like to the system user to indicate possible matches and then would allow the user to affirmatively select a specific instance from the list. Other ways to provide near match choices are also contemplated such as via scrolling presentation of possible choices and so on.

As another example, it is contemplated that, for at lest some systems, more than one template or template sections from different templates may match a schematic segment of interest. For instance, referring again to FIG. 122, each of the mechanical template sections 6036 and 6040 may be identical while related electrical template sections 6038 and 6042 are different so that more than one option is provided to support the related mechanical icons associated with each of sections 6036 and 6040. In this case, a modified method is contemplated wherein processor 6022 would identify all templates having mechanical template sections that match a schematic section of interest and would provide options for the system user to select. In an alternative process, where two or more mechanical template sections match a schematic segment of interest, processor 6022 may search for both electrical template sections and, where only one of the sought sections is located, may only provide that segment. Where one or more of each sought section is located, processor 6022 may present a selection list in a manner similar to the lists described above.

As one other example, a parent-child template hierarchy is contemplated wherein a parent template includes one or more "place holders" for references to more detailed child templates so that a relatively small number of templates can be combined by processor 6022 to construct a relatively large number of different permutations of templates. Here, the percent of schematic segment-template section matches can be increased appreciably and hence, a better overall system can be provided.

To this end, referring to FIG. 122, an exemplary more complex template 6450 is illustrated which, consistent with the above description, includes mechanical and electrical template sections 6452 and 6454, respectively. Mechanical section 6452 includes first, second . . . and Mth mechanical components 6456, 6458 and 6460, respectively, that are arranged according to relationships specified in a relationships segment 6462 of mechanical section 6452. Exemplary first mechanical component 6456 includes at least one instance of a first sub-component 6464, may include anywhere from one to ten instances of a second sub-component 6466, includes one instance of either a first or a second child template 6468 and specific relationships between the sub-components and child templates indicated via a relationships segment 6470. Although not illustrated it is contemplated that each of components 6458-6460 may include a separate specification including child template requirements and ranges of component instances that may be included in an instantiated instance of a template. In addition, it is contemplated that, in at least some cases, variable numbers of child templates may be specified within a parent template specification.

Referring still to FIG. 122, electrical template section 6454 includes first, second . . . and Yth electrical components 6480, 6482 and 6484, respectively, that are related in various ways to the mechanical components in mechanical template section 6452, the relationships specified by relationship section 6486. First electrical component 6480 includes instances of first, second and third electrical sub-components 6488, 6490 and 6492, respectively. More specifically, component 6480 includes one instance of first sub-component 6488, two instances of second electrical sub-component 6490 for each instance of the second mechanical sub-component 6466 and one instance of a third electrical sub-component 6492 for either of the first or second child templates 6468 where the electrical sub-components are arranged according to relationships specified by segment 6500.

Each of the first and second child templates 6468 may, in at least some embodiments, have a form similar to the template form illustrated in FIG. 122 including both mechanical and electrical template sections where each section specifies components, sub-components, either optional or mandatory child templates and ranges of the number of child templates and/or components that may be included in an instance of a template or required in an instantiated template instance. There, the methods described above simply call for a processor to perform more detailed methods but the general concepts are similar.

Moreover, it should be appreciated that, in some cases, a single electrical component or sub-set of components may be useable or modifiable to be useable to support more than one mechanical component or sub-set of components. Thus, for instance, in the case of a power distribution bus, the number of terminal blocks on a single bus may be modifiable so that the bus can provide power to many different motors. Here, in some cases, a single electrical template section for a power distribution bus may be used to support several different mechanical template sections and there would not be a one-to-one mechanical-electrical template section relationship.

In this case, where a mechanical component is added to a mechanical schematic and must be supported by an electrical component that is capable of supporting more than one mechanical component, a processor would first determine if an electrical component of the required type exists. Next, where an electrical component of the required type does not exist, the processor specifies that an instance of the component is required, adds the instance to the electrical schematic and indicates the mechanical-electrical relationship in some fashion. Where an electrical component of the required type already exists, the processor determines if the existing electrical component has excess capability required to support the added mechanical component. Where an existing electrical component cannot support the added mechanical component the processor adds an additional instance of the electrical component to the electrical schematic and indicates relationships. Where an existing electrical component can support the added mechanical component, the processor associates the components and indicates association in some suitable manner. Thus, in at least some cases cross-template support where one electrical template provides electrical components for more than one mechanical component in more than one template is contemplated.

Furthermore, in at least some embodiments it is contemplated that the inventive template sets described above will be useable independent of mechanical schematics where legacy electrical schematics exist to review the legacy electrical schematics for poorly designed configurations. To this end, it is contemplated that the templates will, in general, reflect best and generally most practical design practices. Therefore, component relationships and use reflected in existing legacy electrical schematics that do not conform to template specifications will, in most cases, be inconsistent with best design practices and, in most cases, an engineer charged will efficiently constructing the electrical system, will want to modify the poorly designed electrical sub-systems. To this end, according to yet another inventive method, a processor may be programmed to examine an existing electrical schematic set to identify all electrical schematic sections that do not conform to template specified relationships and to visually indicate those sections as sections that likely do not conform to best design practices. As above, indication may include displaying poorly designed sections of the electrical schematics in a visually different manner than sections that are consistent with best practices as reflected in the template. In some cases, the processor may be programmed to, when possible, make best practice suggestions to a system user and to enable the user to accept or reject the suggestions. For instance, where legacy schematics include eight electrical racks but all of the electrical components could fit in seven racks, the system may suggest the change. In other cases the processor may be programmed to automatically affect best design practices by amending the electrical schematics appropriately.

Previous Description

While it is contemplated that the inventive editors and database may be implemented in any of several different computer technologies, preferably, the editors are implemented using universal technologies such as JAVA by Sun Microsystems or ActiveX by Microsoft. Also, while it is contemplated that the PLC logic may be implemented in any of several different computer languages, because most PLCs run relay ladder logic (LL) programs, it is preferred that the PLC logic be in the LL language and is described as such hereinafter.

Unless indicated otherwise, identical numbers and legends on different Figures are used to refer to identical system components, signals, constructs and so on.

While the invention includes various interfaces and editors for enabling a system user to specify logic, initially an industrial controls paradigm will be explained which serves as a foundation for the inventive editors, compiler and simulator. This paradigm will make all of the aspects of the present invention more easily understandable. After the industrial controls paradigm is described, a CA editor, an HMI editor and a diagnostics editor are described which use the controls paradigm to specify controls logic. Next, the inventive compiler is described followed by the inventive simulator which uses compiler output to drive a virtual machine line using real world execution code.

A. Industrial Control Paradigm

When performing the controls engineering tasks, a control engineer has to provide many different types of controls information including, among other types: (1) control mechanism specification; (2) logic or execution code to control the control mechanisms; (3) logic or execution code to support diagnostic requirements; (4) logic or execution code to support HMIs; (5) schematic electrical and hydraulic diagrams and so on. Hereinafter, all of the controls information provided at the end of a control engineering process will be referred to generally as "control products."

It has been recognized that system control can be divided into a hierarchy of separate control levels, each level including similar control concepts and each higher level including instances of control concepts from the immediately lower level. It has also been recognized that each of the separate control levels lends itself uniquely to specifying one or more types or sub-types of the control information which must be specified during the control engineering process.

The hierarchy consists primarily of four separate control levels which can be used together to specify, virtually construct, simulate and debug a control system for any mechanical process including any type of mechanical resource. The four levels include what will be referred to hereinafter as factory floor input and output signals (i.e. the I/O level), control devices, control assemblies and control sequencing.

1. Factory Floor I/O

As a general rule, a mechanical resource itself is simply a tool which, although capable of certain movements, cannot cause a movement to occur. To cause mechanical resource movement, one or more control mechanisms have to be linked to the mechanical resource. For example, in the case of a clamp which includes a clamping surface (i.e. the surface which moves toward an opposite surface to close), the control mechanisms may include a cylinder and a two position valve wherein a cylinder piston is linked to the clamp surface and the valve includes both extend and retract solenoids which can be controlled to extend or close the clamp surface or to retract or open the surface, respectively. When the extend solenoid is excited, an armature linked thereto allows high pressure air to force the piston and clamp surface into the extended position. When the retract solenoid is excited, the armature allows air to force the piston and clamp surface into the retracted position. Thus, in this case, two control mechanisms, the cylinder and the valve, are required to move the clamp between the open and closed positions.

Similarly, as a general rule mechanical resources themselves do not generate signals which can be used to determine mechanical resource position for monitoring purposes. Instead, specific control mechanisms have to be provided to facilitate monitoring. To this end, in the case of the clamp above, where it is important to confirm clamp position during a process, the cylinder may be equipped with proximity sensors for sensing the position of the cylinder piston to ensure that the piston is in the retracted and extended positions when required by the process.

To control or manage control mechanisms, control output signals are provided by a PLC to the control mechanisms and, the PLC receives input signals from the control mechanisms indicating current control mechanism and mechanical resource status. For example, an exemplary valve solenoid includes a "hot" terminal and a "common" terminal. To excite a solenoid, for safety purposes it is customary to require that each of the hot and common terminals be excited. Thus, for a two position valve including two solenoids, a PLC must provide four output signals, one hot and one common terminal signal for each of the two separate solenoids. For a two sensor cylindicator (i.e. a cylinder with proximity sensors for the piston inside), no PLC outputs are required but the cylindicator provides two input signals, one indicating an extended piston and the other indicating a retracted piston.

Thus, from the perspective of a control engineer, each of the control mechanisms has the appearance of a proverbial "black box" having specific inputs (i.e. feedback inputs to the PLC) and outputs (Control Signals from the PLC). Control mechanism I/O constitute the factory floor inputs and outputs which make up the lowest or I/O controls level.

2. The Control Device (Signal Container)

In addition to input and output signals, other control information can be specified for each of the control mechanisms. For instance, given a specific structure, each control mechanism also has specific "normal" or expected states and specific "failure" or unexpected states. For example, for the cylindicator described above, a failure state occurs when both the extended and retracted proximity sensors generate signals (i.e. indicate piston proximity). All other combinations of cylindicator inputs are normal (i.e. both sensors indicating negative or one sensor negative while the other is positive).

Moreover, for each failure state the control information may include a specified activity (e.g. reporting the failure state). For example, where two cylindicator sensors simultaneously indicate proximity of the piston, the activity may include generating a text message for indicating mechanism failure such as "Cylindicator Sensor Failure".

Furthermore, given a specific structure, each control mechanism can be represented by a standard schematic symbol preferably similar to the symbols used in the industry to represent the specific control mechanism and including connection points for different energy transferring media (e.g. electrical, pneumatic and hydraulic inputs and outputs, water, mechanical linkages, etc.). In this regard part information relating to the specific control mechanism may be included with the schematic symbol.

According to the present invention, all of the control information associated with each control mechanism is encapsulated in a single data construct referred to herein as a "control device" (CD). An exemplary control device includes a device name, a logic section, a schematic section and a diagnostics section. While the exemplary CD's include each of logic, schematic and diagnostics sections, other less complete CD's are contemplated. For example, a CD may not include a schematic section, a diagnostics section or a logic section.

Three separate examples of control devices are provided hereinafter to illustrate some of the concepts described above. The three examples include a cylindicator (see FIG. 81), a two-position valve (see FIG. 82) and a spring return valve (see FIG. 83). It should be understood that the three exemplary control devices described herein are not meant to be exhaustive and that many other control devices are contemplated by the present invention.

In addition to representing real control mechanisms a control device may also represent a "virtual" device such as a robot controller which receives and provides inputs and outputs, respectively, from a PLC to enable control and feedback.

Thus, control devices have both a logic aspect which defines inputs and outputs to and from a controller and a hardware aspect which specifies parts, manufacturers, properties and so on.

Despite the fact that many control devices include more than just a grouping of input and output signals and that other CD's may not include I/O groupings, it is helpful to think of an exemplary control device as a signal container including all of the input signals provided by a control mechanism to a PLC and all of the output signals provided to the control mechanism by the PLC.

a. Cylindicator

Figure 81:
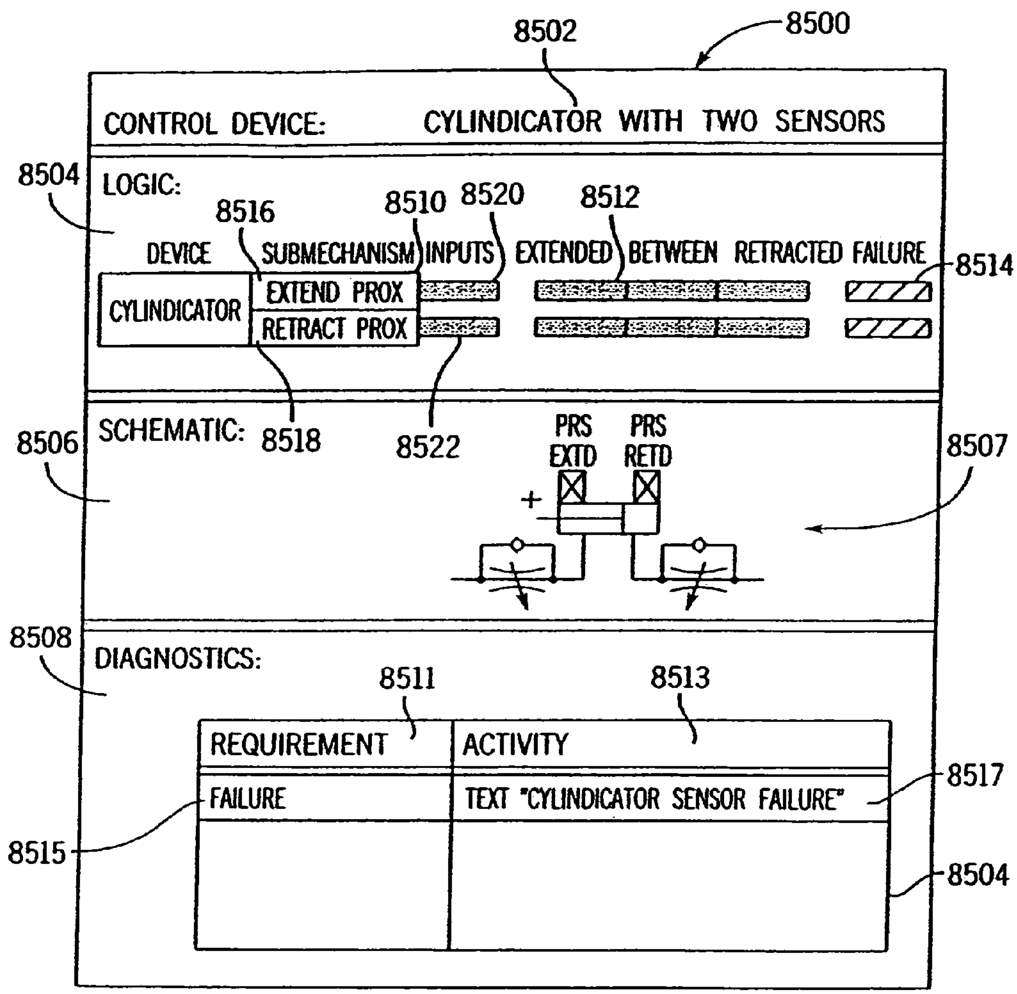
FIG. 81 is a schematic representation of an exemplary control device for controlling a cylindicator control mechanism.

Referring to FIG. 81, a cylindicator control device 8500 includes a device name 8502, a logic section 8504, a schematic section 8506 and a diagnostic section 8508. The device name 8502 is chosen such that the name will be recognized by an exemplary control engineer and will be associated with a corresponding control mechanism. Thus, in the present example, the control device 8500 in FIG. 81 is named "cylindicator with two sensors" and corresponds to a cylindicator with two proximity sensors as described above.

Hereinafter, when describing logic in the context of I/O, I/O generating components will be said to be active or excited on one hand or passive on the other hand meaning that the components are either providing energized and providing a true signal on one hand or passive and providing a negative signal, respectively. In the context of a LL coil, an excited coil is associated with a true signal and a coil which is not excited is associated with a false signal. In the context of a LL contact, a closed contact is associated with a true signal and an open context is associated with a false signal. In addition, in I/O tables, condition tables and bar charts which follow, cross hatched boxes indicate active or excited I/O and clear boxes indicate passive I/O.

Logic section 8504 includes an I/O table 8510, a normal conditions table 8512 and a failure conditions table 8514. I/O table 8510 indicates sub-mechanisms of each control mechanism which are actually linked to specific I/O. Thus, the cylindicator includes both the extended proximity sensor 8516 and the retracted proximity sensor 8518 and indicates PLC inputs 8520, 8522 which are provided by sensors 8516 ad 8518, respectively. In the case of a cylindicator there are no outputs (i.e. terminals which receive control signals from a PLC) and therefore none are listed.

Normal conditions table 8512 indicates all possible normal combinations of inputs 8520 and 8522. To this end, table 8512 indicates that when the cylindicator is extended, the extend sensor 8516 generates a positive signal indicating piston proximity and the retract sensor 8518 is negative, when the cylindicator is retracted, the retract sensor 8518 generates a positive signal indicating piston proximity and the extend sensor 8516 is negative and when the cylindicator is between the extended and retracted positions, both of the sensors 8516 and 8518 are negative or passive.

The failure table 8514 indicates all possible failure combinations of inputs 8520 and 8522. To this end, the only possible failure combination is when each of sensors 8516 and 8518 generate positive signals indicating piston proximity (i.e. it is impossible for a piston to be simultaneously extended and retracted).

Referring still to FIG. 81, schematic section 8506 includes a schematic diagram 8507 of the control mechanism associated with control device 8500. In this case, the schematic 8528 is of a cylindicator with two sensors and includes connector nodes. Although not illustrated, other part information may be provided with the schematic (e.g. cost, specific mechanical requirements, etc.)

The diagnostics section 8508 includes information indicating rules for identifying I/O conditions which are "interesting conditions" from a diagnostics perspective and indicating activities which should be performed when an interesting condition is identified. To this end, section 8508 includes a diagnostics table 8509 including I/O requirements 8511 and corresponding activities 8513 wherein each I/O requirement 8511 identifies a specific set of interesting conditions (i.e. I/O) and the activity 8513 indicates the activity to be performed when a corresponding I/O requirement occurs. In the case of a cylindicator an interesting condition occurs when both extended and retracted proximity sensors 8516 and 8618 generate active input signals indicating the failure condition 8514. In table 8509 "failure" 8515 is listed as one requirement or interesting condition. The activity associated with failure 8515 is to generate an alphanumeric text phrase "cylindicator sensor failure" 8517.

Other interesting conditions may include normal condition sets which, for some reason (e.g. their order within a sequence), render the normal set diagnostically useful. For example, if a particular sequence is not observable in the real world but is important from a diagnostics perspective, it may be advantageous to provide the end condition set of the sequence as a requirement in table 8509 and include some type of indicating activity in activities column 8513.

Other activities, in addition to reporting, may also include diagnostics based on prior experience. For example, the text message specified in the activity may indicate the likely cause(s) of the interesting condition. Moreover, the text message may also specify a prescription to eliminate the diagnosed cause.

Furthermore, the diagnostic activity 8513 may also be proactive in diagnosing the cause of an interesting condition. To this end, the activity 8513 may specify additional I/O to be checked if a specific interesting condition occurs and, based on the additional I/O, the activity 8513 may select from a list of other diagnostic activity.

Moreover, the diagnostic activity 8513 may be proactive in eliminating an interesting condition. To this end, the activity 8513 may specify output signals which should be modified when a particular interesting condition occurs. For example, in FIG. 81, when a failure condition (e.g. 8514) occurs, in addition providing a text phrase, the activity 8513 may also modify output signals to clamp valves to open the clamps.

In any of these diagnostic cases, the requirements 8511 include a sub-set of specific I/O conditions of the control mechanism and the activities include outputs. The diagnostic outputs are, in the case of a text phrase or other indication, to an HMI and, in the case of proactive diagnostics or I/O modification, to one or more control mechanisms.

b. Two-Position Valve

Figure 82:
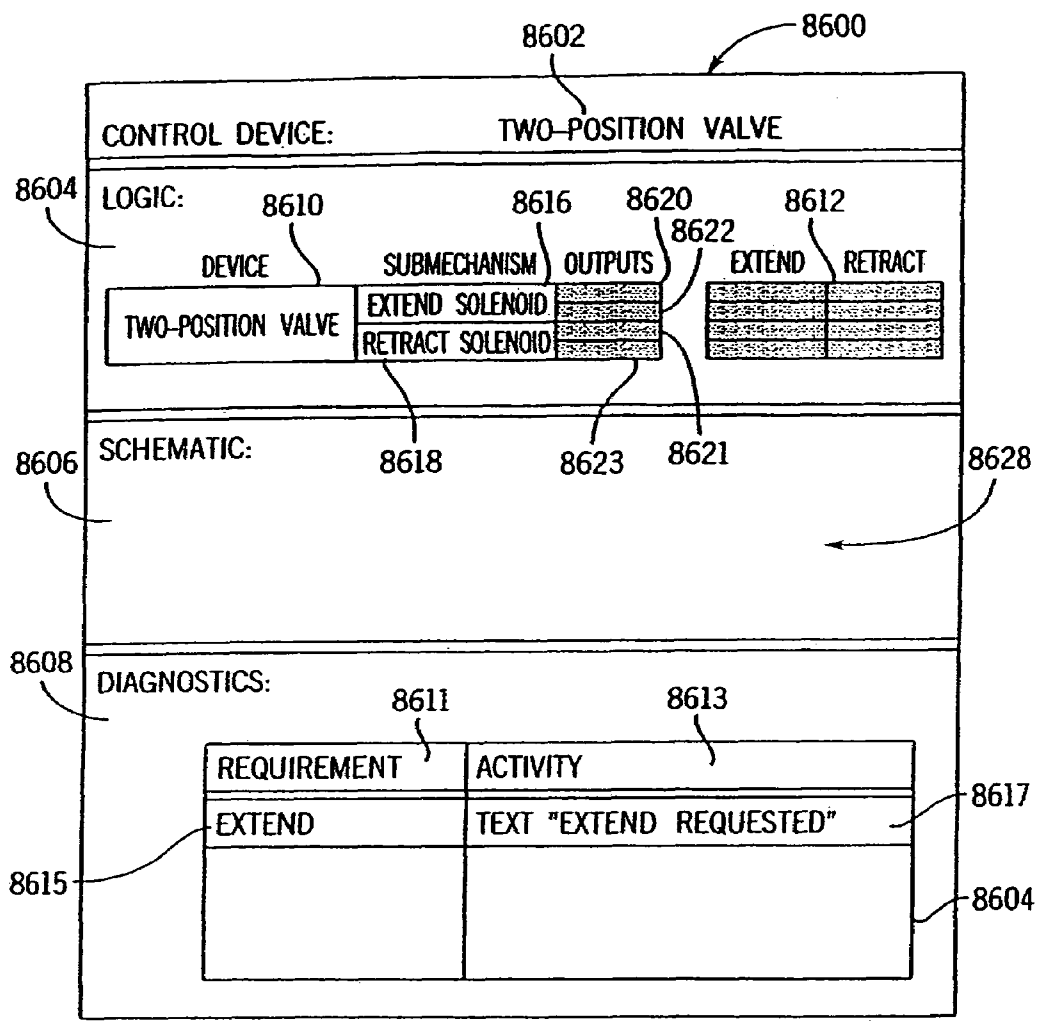
FIG. 82 is similar to FIG. 81, albeit for a two position valve control mechanism.

Referring to FIG. 82, a two-position valve control device 8600 includes a device name 8602, a logic section 8604, a schematic section 8606 and a diagnostic section 8608. The device name 8602 is "two-position valve."

The logic section includes an I/O table 8610 and a normal conditions table 8612. I/O table 8610 indicates sub-mechanisms of each control mechanism which are actually linked to specific inputs and outputs. Thus, table 8610 lists both the valve's extend solenoid 8616 and retract solenoid 8618 and indicates the PLC outputs provided for each of the two solenoids (i.e. outputs 8620 and 8622 to solenoid 8616 and outputs 8621 and 8623 to solenoid 8618. In the case of a two position valve there are no inputs (i.e. PLC feedback signals) and therefore none are listed.

Normal conditions table 8612 indicates all possible normal combinations of outputs 8620 through 8623. To this end, table 8612 indicates that when the outputs to solenoid 8616 are active, the outputs to solenoid 8618 must be passive and vice versa.

Note that there is no failure conditions table for the two-position valve despite the fact that a failure condition could occur. For example, all four outputs 8620 through 8623 could be active. While a failure table could be provided, providing a failure table is a matter of control device designer choice and may depend on the likelihood of a failure occurring, the importance of such a failure occurring and which part of a control system likely causes a failure. For example, in the case of a valve having no inputs and one or more outputs, any failure in outputs would likely be caused by the PLC itself and thus the PLC, not the device being controlled thereby, should determine failure.

The schematic section 8606 includes a schematic diagram 8628 of a two position valve including connector nodes.

The diagnostics section 8708 includes diagnostics table 8604 having requirement and activity columns 8611 and 8613, respectively. In this case, because there are no failure conditions specified for the two position valve, no failure diagnostics are provided. However, the example herein includes diagnostics for another "interesting condition." In this case, the interesting condition is when the extend solenoid hot and common outputs are both excited and the retract solenoid hot and common outputs are both passive. This condition corresponds to an extend request and extend requirement 8615. When the extend requirement 8615 is met, the prescribed activity 8617 provides a text message "Extend Requested" to an HMI for display.

Although a requirement and an activity are listed in table 8609 for exemplary purposes, hereinafter, to simplify this explanation, it will be assumed that diagnosis table 8609 is empty.

c. Spring Return Valve

A spring return valve is a valve which includes a single solenoid, an armature and a spring. The solenoid, like other solenoids described above, includes both a hot terminal and a common terminal, each of which have to be excited to activate the solenoid. The armature is linked to the solenoid and, when the solenoid is activated, the armature is extended against the force of the spring. When solenoid power is cut off, the spring forces the armature and solenoid back to a steady state position.

Figure 83:
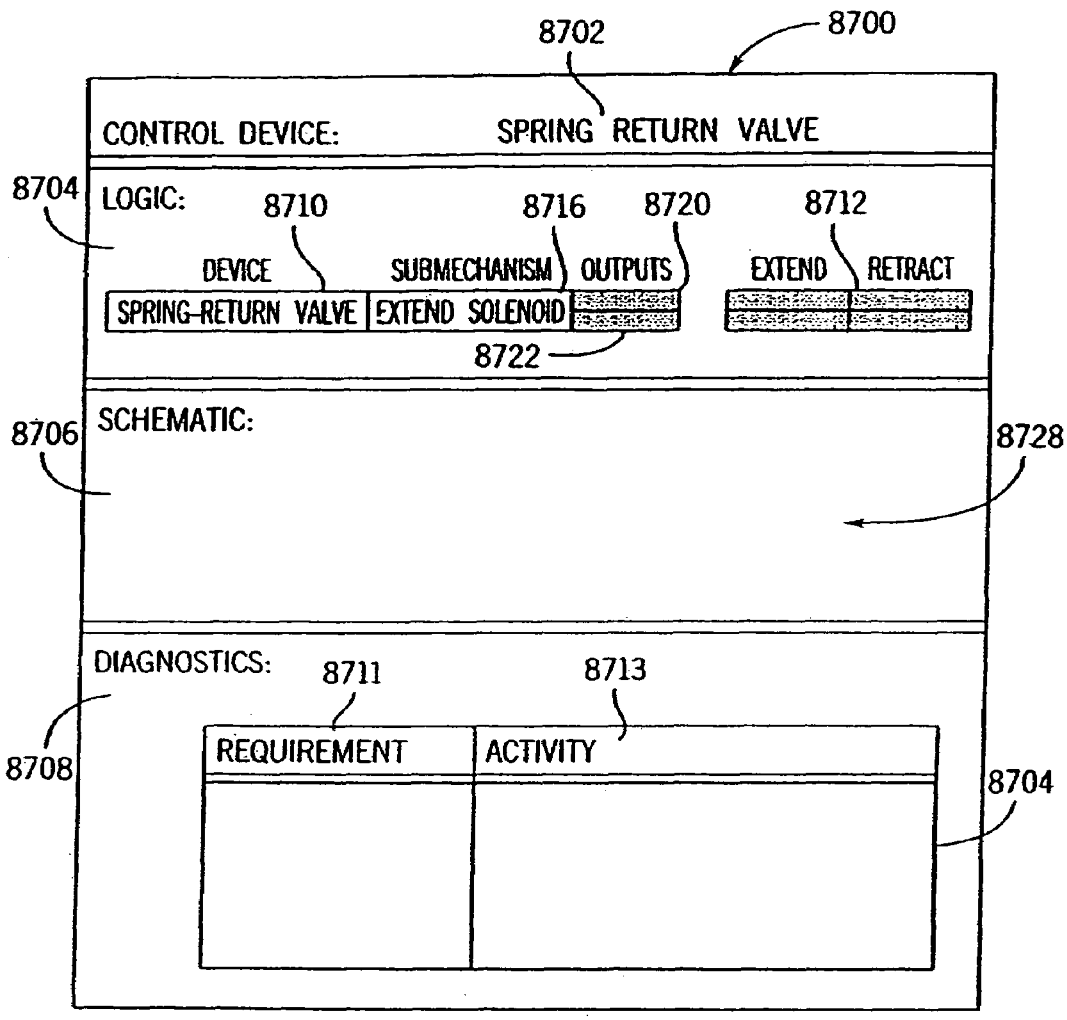
FIG. 83 is similar to FIG. 81, albeit for a spring return valve control mechanism.

Referring to FIG. 83, a spring return valve control device 8700 includes a device name 8702, a logic section 8704, a schematic section 8706 and a diagnostic section 8708. The device name 8702 is "spring return valve."

The logic section includes an I/O table 8710 and a normal conditions table 8712. I/O table 8710 indicates sub-mechanisms of the control mechanism which are linked to specific inputs and outputs. Thus, table 8710 lists the valve's extend solenoid 8716 and indicates the PLC outputs provided to the extend solenoid (i.e. outputs 8720 and 8722). In the case of a spring return valve there are no inputs (i.e. feedback signals to the PLC) and therefore none are listed.

Normal conditions table 8712 indicates all possible normal combinations of outputs 8720 and 8722. To this end, table 8712 indicates that the outputs to solenoid 8716 have to either be both active or both passive. As with the two-position valve there is no failure conditions table for the spring return valve. The schematic section 8706 includes a schematic diagram 8728 of a spring return valve including connection nodes.

The diagnostics section 8708 includes a diagnostics table 8709 including a requirement column and an activity column 8711, 8713, respectively. In this case, because there are no failure conditions specified for the spring return valve, no failure diagnostics are provided. Moreover, no other interesting conditions are specified and therefore table 8709 is left blank.

Thus, a control device is a database construct which includes, but is not limited to, all of the control information about a control mechanism which would be specified during the control engineering phase of a development process. In addition, as will be understood shortly, the control device is a building block from which control assemblies are formed.

3. The Control Assembly (Control Device Container)

Like the control device, a control assembly (CA) according to the present invention is a data construct which includes control information. However, while a control device includes essentially all of the information which a control engineer specifies with respect to a specific control mechanism (e.g. a cylindicator, a valve, etc.), the CA configuration has been designed to include essentially all of the information which a control engineer specifies with respect to a specific mechanical resource (e.g. a clamp, a robot, etc.) or, in some cases, with respect to a group of mechanical resources (e.g. a plurality of clamps which are synchronous). To this end an exemplary CA operates proverbially as a "device container" for all of the control devices which operate together to control a mechanical resource.

The invention contemplates a plurality of different CAS. For example, a process engineer may have the choice to select any of three different mechanical clamps for clamping a work item in place along a transfer line wherein each of the three clamps requires different control mechanisms to control the clamp.

A first clamp type may require only two control mechanisms including one two-position control valve and a cylinder. The second clamp type may also require only two control devices but the required devices may be different than those required for the first clamp type. For example, the second clamp type may require a two position valve and a cylinder including two proximity sensors (i.e. a cylindicator). The third clamp type, like the second, may require a two-position valve and a cylindicator and, in addition, may also require a redundant spring return valve. In this case, the spring return valve is positioned between the two position valve and the cylinder. When the spring return solenoid is excited, the spring armature extends against the force of the spring and allows high pressure air to force the piston and clamp surface into the closed and extended position and, when solenoid power is cut off, the spring forces the valve into the retracted position allowing the air to force the piston and clamp surface into the open and retracted position. The spring return valve causes the clamp to open if power is cut off from the solenoids.

In this case, a CA library would include three separate clamp CAS, a separate CA for each of the possible clamp types. The information in one CA all corresponds to a single mechanical resource and the control devices within the CA which are required to control the mechanical resource. For instance, in the clamp example above, the CA corresponding to the third clamp type would include only information corresponding to a two-position valve, a spring return valve and a cylindicator.

In addition to the three CAS described above, the invention contemplates a CA library including many more CAS, each CA corresponding to a different set of control devices used to control a specific mechanical resource. For example, there may be ten different CAS corresponding to ten different robot configurations (i.e. mechanical resources), there may be three CAS corresponding to three different pin locator configurations, there may be eight CAS corresponding to eight different slide configurations and so on.

a. Exemplary CA Structure

In the interest of simplifying this explanation and an explanation of the control paradigm on which the invention rests, an exemplary CA will be described which is specifically designed to include control information for the third clamp type above (i.e. a CA including a two-position valve, a spring return valve and at least one cylindicator). It will be assumed that the exemplary CA can be used to specify control information for anywhere between one and four separate clamps for each CA instance. To this end, it has been recognized that certain control assemblies and corresponding control mechanisms may be capable of controlling more than a single mechanical resource. For example, if air pressure generated by an air source is high enough, air pressure passing through a single valve has enough force to simultaneously move two or more clamps. To minimize system costs, a single valve design, or any design which reduces the number of control mechanisms, is advantageous. While a single valve may be required to move a plurality of clamps, each clamp requires a dedicated cylindicator. Thus, the exemplary CA includes control devices for controlling up to four cylindicator.

In a preferred embodiment a CA is divided into information fields or specifications, a separate specification for each one of the different types of control information. For example, referring to FIG. 84, an exemplary CA 9000 may include, among other information specifications, five control information specifications including (1) logic specification 9002; (2) schematics specification 9004; (3) HMI specification 9006; (4) diagnostic specification 9008; and (5) simulation specification 9300.

In addition, the CA is also provided with a template type indicator 9001. As with the control device names, type indicators 9001 are chosen to reflect the nature of the CA type so that the content of the CA template can be understood by a control engineer essentially from the CA template type identifier 9001. In the present example the type indicator 9001 is "SafeBulkHeadClampSet" indicating that the template type is for controlling a clamp and defines a redundant spring return valve for safety purposes.

In a preferred embodiment of the invention, the CA template includes all controls information required for a specific mechanical resource and which can be used over and over again to specify the information in separate template instances. When a template is accessed for use, the specific template use is referred to as an instance of the CA and the act of using the template is referred to as instantiating an instance of the CA. When a CA is instantiated, the specific CA instance is given a unique name which is then used thereafter to reference the specific CA instance and to identify control system parameters corresponding to the instance. For example, where two identical clamp CAS are required to control different clamps, the first CA instance may be provided the name "1stclamps" and the second CA instance may be provided the name "2nd clamps". Hereinafter, the exemplary CA 9000 described will be referred to by the name 1stclamps 9003.

Hereinafter, each of the CA specifications is described separately. Initially, each of the exemplary specifications would be generic in the sense that the specification would not be parameterized to reflect encapsulated information about a specific CA instance. The described specifications, however, reflect CA instance parameterized as will be explained in more detail below.

i. Logic Specification

Figure 84:
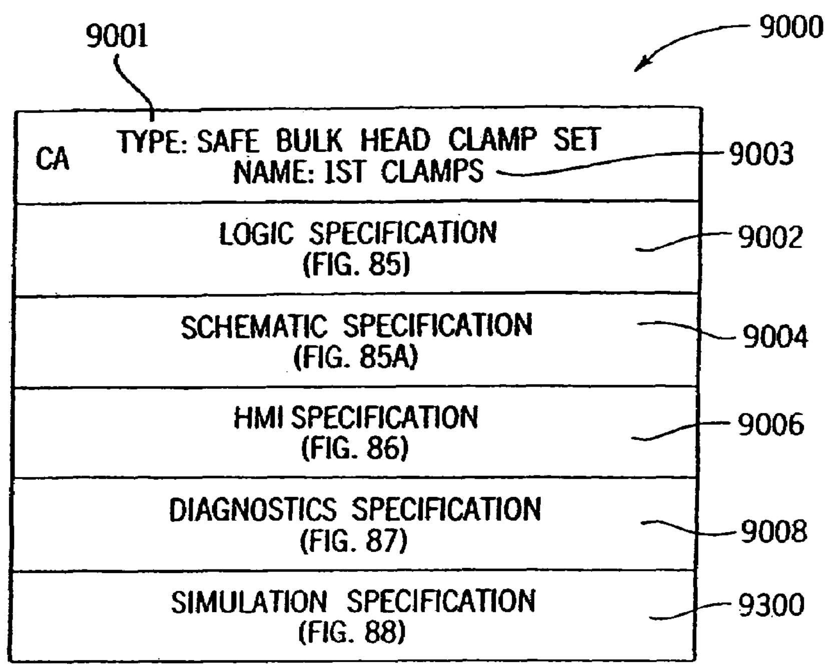
FIG. 84 is a schematic illustrating the various sections of an exemplary control assembly.
Figure 85A:
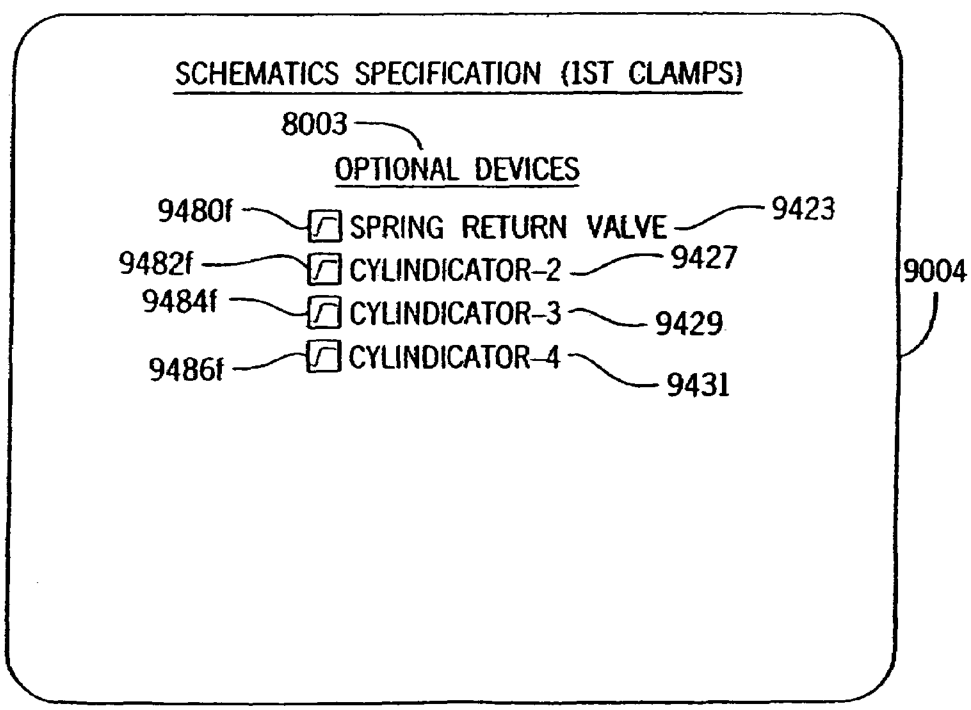
FIG. 85 is a schematic diagram illustrating an exemplary logic specification of FIG. 84.
Figure 85:
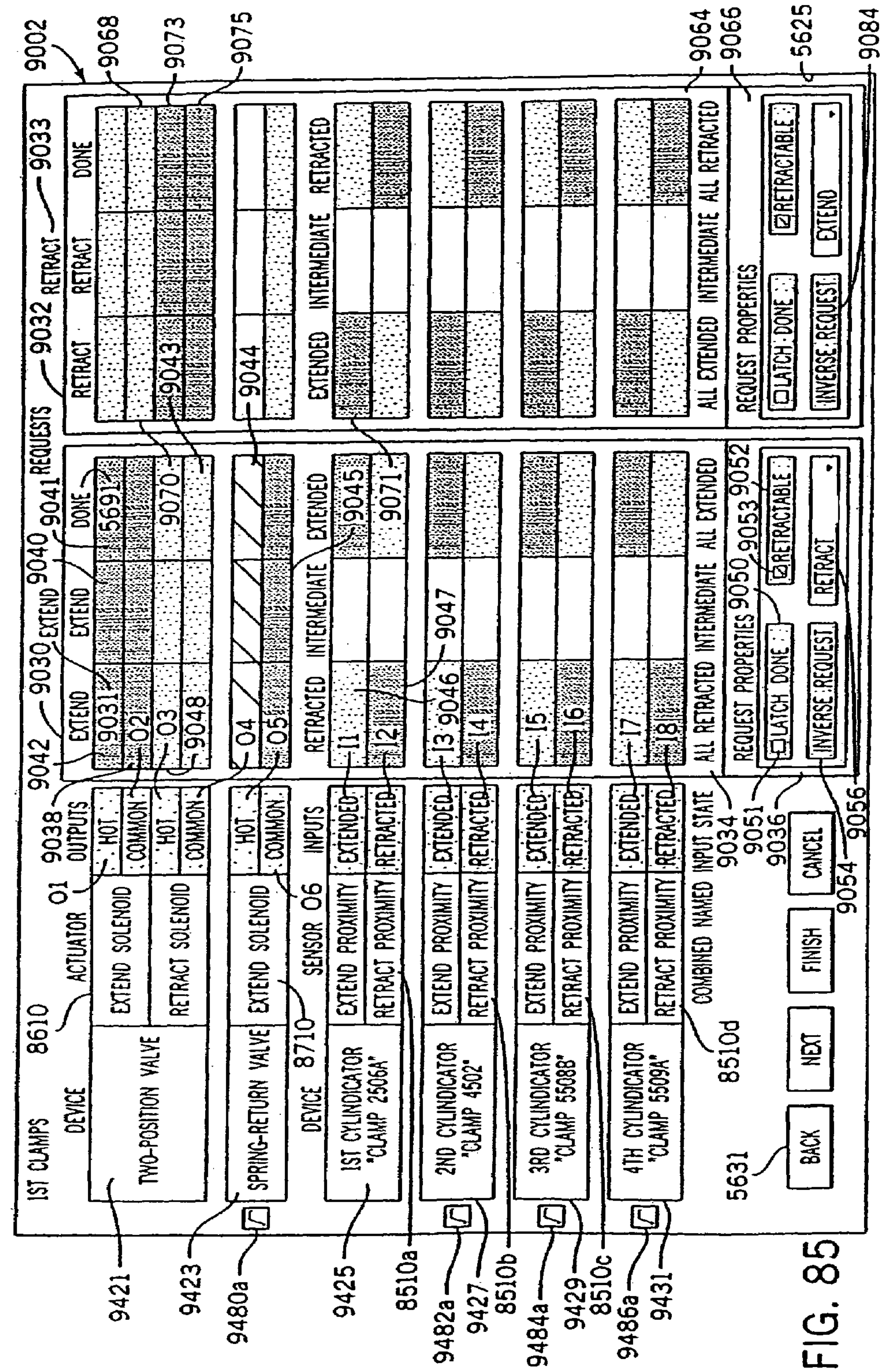

Referring to FIGS. 84 and 85, logic specification 9002 includes I/O tables corresponding to each of the control devices which may possibly be included in the CA. Thus, for a CA including a two-position valve 9421, a spring return valve 9423 and capable of supporting four cylindicators 9425, 9427, 9429 and 9431 (i.e. one cylindicator for each controllable clamp), logic specification 9002 includes I/O tables 8510*a*, 8510*b*, 8510*c*, 8510*d*, 8610 and 8710 (see also FIGS. 81-83). For the purpose of this explanation the two-position valve 9421 outputs are referred to as 01, 02, 03 and 04, the spring return valve 9423 outputs are referred to as 05 and 06 and the cylindicator inputs are referred to as I1 through I8. In addition, logic specification 9002 also includes I/O request charts including an extend request chart 9030 and a retract request chart 9032 corresponding to extend and retract requests 9031, 9033, respectively.

Extend chart 9030 includes a sequence section 9034 and a properties section 9036. Properties Section 9036 is explained below. Sequence section 9034 includes a bar chart 9038 including a separate bar for each of the inputs and outputs in the I/O tables 8510*a*, 8510*b*, 8510*c*, 8510*d*, 8610 and 8710. Thus, bar chart 9038 includes bars 9040 through 9043 corresponding to I/O table 8610, bars 9044 and 9045 corresponding to I/O table 8710 and bars 9046 and 9047 corresponding to I/O table 8510 and so on. Note that chart 9038 is separated into six sections corresponding to tables 8610 and 8710 for illustrative purposes only and would more likely appear as a single table.

The extend clamp request begins at the left edge 9048 of chart 9038 and bars 9040 through 9047 indicate the I/O combinations during an extend clamp request. Chart 9038 is divided into three separate I/O combinations named "all retracted", "intermediate" and "all extended". Initially, referring only to the first cylindicator 9425, at left edge 9048, the retracted proximity input signal (bar 9046) is active indicating that the cylindicator piston is in the retracted position. To extend the piston, at edge 9048, both terminals of the two-position valve extend solenoid and both terminals of the spring return valve extend solenoid are activated (see bars 9040, 9041, 9044 and 9045). For a short time the all retracted conditions persist until the retract proximity sensor no longer senses the cylindicator piston.

During the period when neither the extended nor retracted sensors sense the cylindicator piston, the intermediate conditions exist. During this period, the extend solenoids of each of the two-position and spring-return valves remain excited (see bars 9040, 9041, 9044 and 9045) so that the piston and clamp surface secured thereto continue to move toward the extended position.

Eventually the extended proximity sensor senses the cylindicator piston and generates an active input (see bar 9047) and the all extended conditions occur. During this time and until the extend command subsides, each of the valve extend solenoids remain activated. Similar input conditions occur for cylindicators 9427, 9429 and 9431 during an extend request.

Retract chart 9032 also includes a sequence section 9064 and a properties section 9066. Properties section 9066 is explained below. Sequence section 9064 includes a bar chart 9068 including a separate bar for each of the inputs and outputs in I/O tables 8510*a*-8510*d*, 8610 and 8710, respectively. Once again, chart 9068 is separated into six sections only for illustrative purposes and would more likely appear as a single table.

The retract clamp request begins at the left edge 9070 of chart 9068 and the bars of chart 9068 indicate I/O combinations during a retract clamp request. Chart 9068 is again divided into three separate I/O sections named "all extended", "intermediate" and "all retracted". Initially, referring only to cylindicator 9425, at left edge 9070, the extended proximity input signal is active (see bar 9071) indicating that the cylindicator piston is in the extended position. To retract the piston, at edge 9070, both terminals of the two-position valve retract solenoid (see bars 9073 and 9075) are activated. For a short time the all extended conditions persist until the extend proximity sensor no longer senses the cylindicator piston.

During the period when neither the extended nor retracted sensors sense the cylindicator piston, the intermediate conditions exist. During this period, the retract solenoid of the two-position valve remains excited so that the piston and clamp surface secured thereto continue to move toward the retracted position.

Eventually the retracted proximity sensor senses the cylindicator piston and generates an active input and the all retracted conditions occur. During this time and until the retract command subsides, the two-position valve retract solenoid remains activated. Similar input conditions occur for cylindicators 9427, 9429 and 9431 during an extend request.

It is also contemplated that a resource editor will configure an interface screen which resembles the image illustrated in FIG. 85. It is contemplated that resource editor is useable to parameterize unique CA instances as will be explained in more detail below.

Thus, logic specification 9002 defines I/O combinations during each possible request for a mechanical resource which is associated with the CA. In the case of the exemplary clamp, the requests include extend and retract requests including the sequences of I/O combinations illustrated in FIG. 85.

ii. Schematic Specification

Referring again to FIGS. 84 and 85 and also to FIG. 85A schematic specification 9004 includes a table 8001 including a list 8003 of the control devices in logic section 9002. The list 8003 includes devices which are optional in the CA 9000 as will be explained in more detail below. In the present example optional devices include the spring return valve 9423 and the second through fourth cylindicators 9427 through 9431.

iii. HMI Specification

Figure 86:
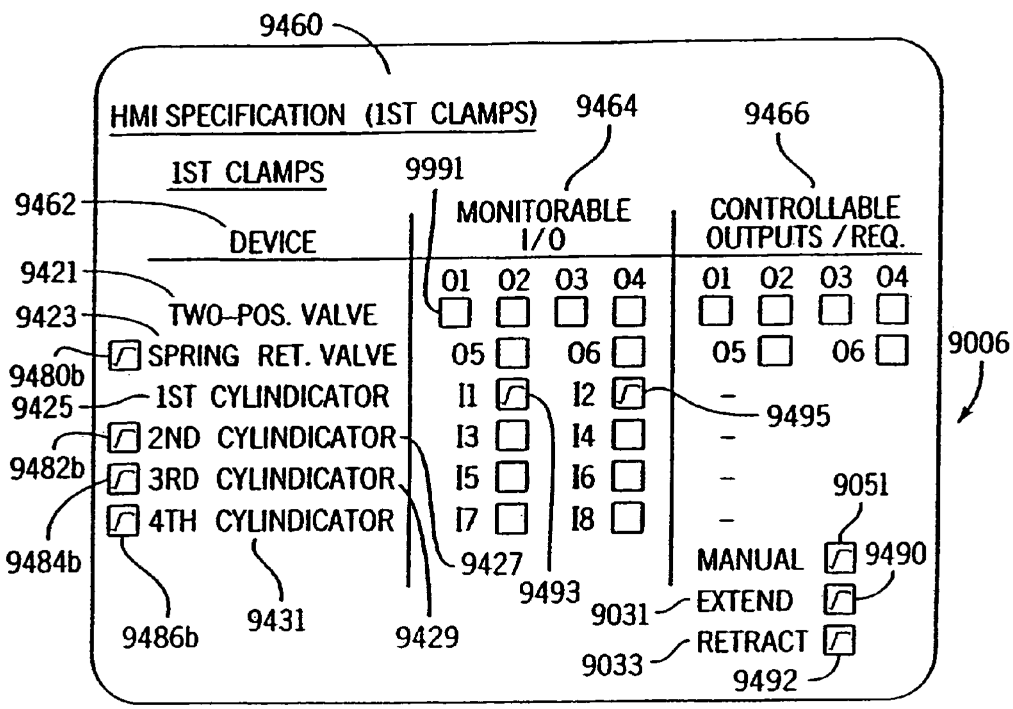
FIG. 86 is a schematic illustrating an exemplary HMI specification of FIG. 84.

Referring to FIG. 84, HMI specification 9006 may take any of several different forms. Referring also to FIG. 86, in a preferred embodiment HMI specification 9006 includes an HMI specification table 9460. Consistent with the present example, table 9460 includes information specifying all possible monitorable and controllable I/O for the 1stclamps CA instance. To this end, table 9460 includes a device column 9462, a monitorable I/O column 9464 and a controllable output/request column 9466. Device column 9462 includes a listing of all possible control devices which can be included in a particular assembly. In the present example, possible 1stclamps control devices include two-position valve 9421, spring return valve 9423 and first through fourth cylindicators 9425, 9427, 9429 and 9431, respectively.

I/O column 9464 lists all monitorable I/O corresponding to control devices in column 9462. To this end, all of the outputs corresponding to two position valve 9468 are monitorable and therefore, each of those outputs (i.e. O1, O2, O3, O4) are listed in column 9464 in the row corresponding to valve 9421. Both outputs O5 and O6 of spring return valve 9470 are monitorable and therefore, each of those outputs appears in column 9464. First, cylindicator 9425 includes two outputs I1 and I2, each of which are monitorable, and each of which appears in column 9464 in the row corresponding to first cylindicator 9425. Similarly cylindicators 9427, 9429 and 9431 each have two inputs which are monitorable and which appear in column 9464.

Controllable outputs/requests column 9466 includes a list of all outputs corresponding to the control devices in column 9462 which are potentially manually controllable via an HMI. To this end, all of the two position valve outputs O1, O2, O3 and O4 are provided in column 9466 in the row corresponding to valve 9421. Both outputs O5 and O6 of spring return valve 9423 are included in column 9466. None of cylindicators 9425-9431 include outputs and therefore blanks corresponding to each of the cylindicators appear in column 9466.

In addition to controllable outputs, potentially manually controllable requests are also provided in column 9466. In the present case, there are only two requests which correspond to the 1stclamps CA instance including extend request 9031 and retract request 9033. Each of requests 9031 and 9033 correspond to the similarly named requests in logic specification 9002 (see FIG. 85) and each is listed in column 9466.

When any of the outputs or requests in column 9466 is selected for manual control, a manual control request 9035 is also selected. Subsequently, when an HMI is configured, the HMI provides means for controlling each of the selected outputs and selected requests in column 9466 as will be explained in more detail below and provides means for observing each of the selected inputs. Referring to FIGS. 85 and 86, it should be appreciated that table 9460 includes a large number of monitorable I/O and controllable outputs and requests. While such an extensive table 9460 is possible for each CA, whether or not table 9460 is extensive is a matter of choice for the engineer who designs the initial CA template. For example, the engineer designing the initial CA template may have, instead of providing an exhaustive table 9460, provided a table wherein only cylindicator inputs are monitorable and the valve outputs O1 through O6 would not be monitorable. Similarly, the engineering designing the template may have decided that only the extend and retract requests 9490, 9492, respectively, should be controllable and that the outputs for the valves 9468 and 9470 should not be controllable.

In addition, it should be appreciated that table 9460 is simply a data construct for keeping track of selected control devices and corresponding selected monitorable I/O and controllable outputs and requests. It is contemplated that other interface tools to be described below are used to select and deselect control assemblies and monitorable and controllable signals and requests and that table 9460 is simply used to track selection and de-selection facilitated via the other tools.

iv. Diagnostic Specification

Figure 87:
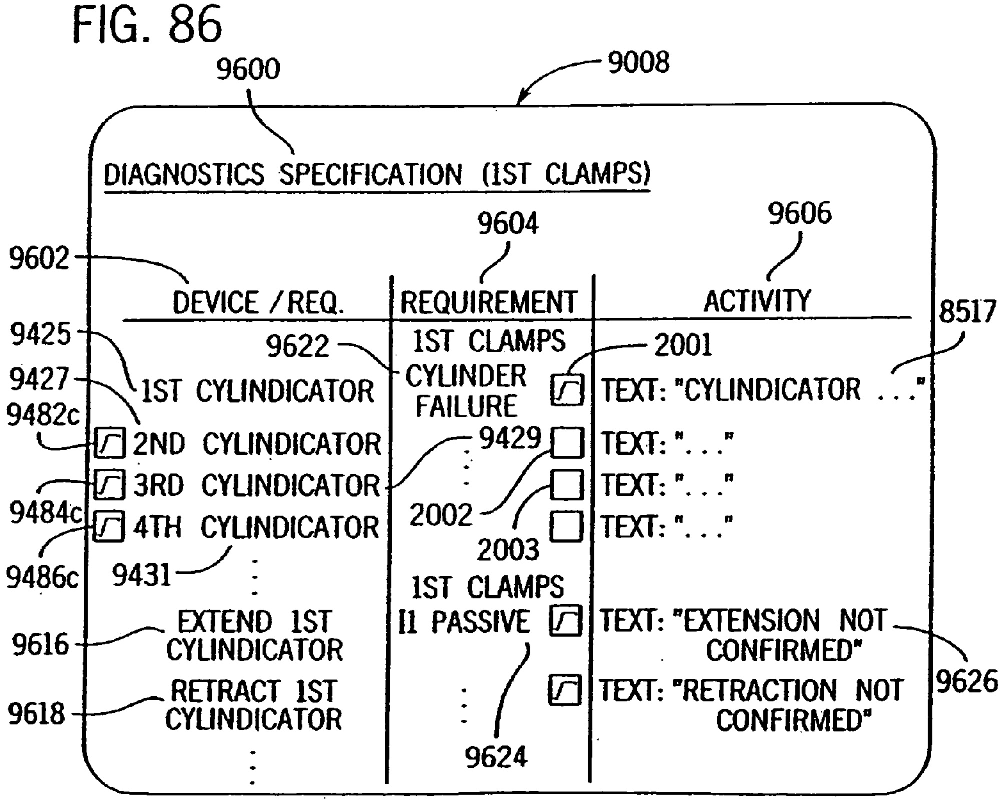
FIG. 87 is a schematic illustrating an exemplary diagnostics specification of FIG. 84.

Referring again to FIG. 84, diagnostic specification 9008 serves as a repository for control device diagnostic rules which have been designed into the CA template by the engineer who configured the template. Referring also to FIG. 87, diagnostic specification 9008 includes a diagnostic specification table 9600. Table 9600 includes information specifying all possible diagnostic requirements and corresponding activities which may be selected for support by a subsequently compiled execution code. Table 9600 includes three columns including a device/request column 9602, a requirement column 9604 and an activity column 9606.

Column 9602 includes a list of devices which include built-in diagnostics. In the present case, first clamps includes at least a first cylindicator 9425 which supports diagnostics. Referring again to FIG. 81, when a failure condition occurs wherein both the extended and retracted proximity sensors indicate presence of a cylindicator piston (see 5418), the diagnostics portion of the control device should indicate, via an HMI, the text "cylindicator sensor failure." Thus, first cylindicator 9425 is listed within column 9602. Similarly, each of the second, third and fourth cylindicators also correspond to diagnostic messaging when a failure condition occurs. Therefore, each of the second, third and fourth cylindicators 9610, 9612 and 9614 appear in column 9602.

In addition to the cylindicators, exemplary requests associated with "interesting conditions" are also provided in column 9602. The exemplary requests include extend and retract requests 9616 and 9618 corresponding to the 1st cylindicator 9425 input signals.

Requirement column 9604 indicates the specific diagnostic condition which must occur for corresponding diagnostic activity in column 9606 to take place. Thus, for example, the requirement in column 9604 corresponding to first cylindicator 9425 is a failure condition 9622 (i.e. each of the extended and retracted proximity sensors in FIG. 81 must indicate piston location at the same time). In this case, referring to FIGS. 87 and 81, the activity in column 9606 corresponding to failure 9622 is to provide text 8517 indicating "cylindicator sensor failure". Similar requirements and activities correspond to each of the second, third and fourth cylindicators 9427, 9429 and 9431, respectively.

Referring still to FIG. 87, the requirement 9624 corresponding to the extend request for first cylindicator 9425 is that input I1 remain passive. When input I1 remains passive after an extend request is issued, this indicates that the extended proximity sensor does not generate an active input signal I1 and therefore, for some reason, an error in the system has occurred. The activity corresponding to a passive input I1 is to indicate an error 9626. A similar requirement corresponds to the retract request for cylinder C1 as illustrated.

It should be appreciated that, while several diagnostics requirements and activities have been provided in table 9600, table 9600 is by no means exhaustive and other diagnostics devices and requests and corresponding requirements could be specified and, certainly, other activities could also be specified. Thus, table 9600 is meant to be exemplary only and not exhaustive.

One particularly useful type of diagnostics which is preferably included in the diagnostics specification is referred to as "status based" or simply "status" diagnostics. Status diagnostics includes diagnostics which, instead of providing a likely diagnosis of a specifically identified abnormal or interesting condition, simply indicates the next expected event in a control process. Thus, when a line shuts down because of a malfunction, an operator can determine the next event and, based thereon, can typically determine how to eliminate the condition which caused the line to stop.

One way to facilitate status based diagnostics is for a programmer to go through an entire RLL program and, for each event which occurs during the program, provide status code which, prior to the even occurring and subsequent to the occurrence of a preceding event, indicates the status of the next event to occur via a displayed text message. Unfortunately, the programming task of providing such diagnostic code is so time consuming and complex that such a task is impractical and is not attempted despite the advantages which would result.

Importantly, the reusable CA model for programming, execution logic and diagnostics can be used to facilitate status based diagnostics programming. This is because each CA diagnostics specification can include status based diagnostic messages for each event which occurs during one of the CA requests. Each time a new instance of a CA is instantiated, a CA request is sequenced in a control bar chart and the requests are compiled, the code supporting the status based diagnostics messages can be duplicated and interspersed throughout the execution logic code. In this regard, the status based code is added to the execution code and has nothing to do with operation of the execution code. The status based code simply identifies the next event to occur and then generates a text message for visual display indicating the next event to occur. Once the next event to occur has been achieved, the diagnostics displays the next event to occur and so on.

Which events should be reported is a matter of designer choice. For example, for a specific request, several events may take place. For instance, to extend a clamp, a first event may be extension of a valve and a second event may be extension of a cylindicator associated with the clamp. In this case, either one or both of the events corresponding to the request may be supported by status based diagnostics. In one embodiment only termination events are supported by status based diagnostics where termination events are the last events which occur in a request and where commencement of subsequent requests depends on completion of the termination events. In other embodiments intermediate events (i.e. non-termination events) are also supported.

Referring also to FIG. 87A, an exemplary status based diagnostics specification 3501 corresponding to the 1st clamps CA is illustrated. Specification 3501 includes a specification table 3503 including information specifying all 1st clamps CA requests and all request events. To this end, table 3503 includes a request column 3505, a requirement column 3507 and an activity column 3509.

Column 3505 includes a list of all 1st clamps CA requests. Referring also to FIG. 85, 1st clamps includes only two requests including extend and retract requests 9031 and 9033, respectively and therefore extend and retract requests 3511 and 3513, respectively, appear in column 3505.

Requirements column 3507 include consecutive I/O combinations which correspond to events which must occur during an associated request (e.g. in this case an extend or retract request). For example, referring to FIGS. 85 and 87A, when an extend 9031 1st clamps request is made first, two position valve 9421 must be activated. Valve 9421 is activated when outputs 01 and 02 are high and outputs 03 and 04 are low. Thus, the requirement for two-position valve activation is 01=1; 02=1; 03=0 and 04=0. All of the other 1st clamps I/O have nothing to do with the status (i.e., active or inactive) of two-position valve 9421. In column 3507 other I/O for which the status is not important for a specific event are identified as "don't care" I/O by a "-". Thus, the requirement for the two-position valve extend event is I/O combination 3515.

Referring still to FIGS. 85 and 87A, the next event to occur during the 1st clamps extend request is a spring return valve extend event which occurs when outputs 05 and 06 are high. The status of all other 1st clamp I/O is unimportant with respect to the spring return valve extend event. The I/O combination requirement in column 3507 for the spring return valve extend event is identified by numeral 3517.

Note that in reality, both two-position valve 9421 and spring-return valve 9423 would achieve their respective extend states simultaneously. Nevertheless, by providing status based diagnostics which checks events consecutively, each event is reported separately and if one event does not occur, the single event which does not occur is reported for an operators observation.

Referring again to FIGS. 85 and 87A, the next event to occur during a 1st clamps extend request is a 1st cylindicator extended event which occurs when input I1 is high and input I2 is low. This event corresponds to I/O combination requirement 3519 in column 3507. Although not numbered, column 3507 includes other I/O combination requirements which correspond to extended second, third and fourth cylindicators 9427, 9429 and 9431, respectively.

Similarly, column 3507 also includes I/O combination requirements corresponding to consecutive events which occur during the 1st clamps retract request (see 9033 in FIG. 85). For instance, a two-position retract event is identified by numeral 3521.

Column 3509 includes a single activity corresponding to each requirement in column 3507. For example, activity 3523 corresponds to the two-position value extend event requirement 3515 and specifies text "two-position valve extend" to be displayed. Similarly, activity 3525 specifying text "spring-return valve extend" corresponding to the spring-return valve extend event requirement 3517 and so on.

Activities in column 3523 are performed from the time when a previous event is completed until the time the corresponding requirement in column 3507 occurs. For example, after a request prior to a 1st clamps extend request has been completed, message "two-position valve extend" is displayed until I/O combination requirement 3515 is achieved. After requirement 3515 is achieved message "spring-return valve extend" is displayed until requirement 3517 is achieved. After requirement 3517 is achieved message 1st cylindicator extended" is displayed and so on.

V. Simulation Specification

Referring again to FIG. 84, simulation specification 9300 is used to facilitate virtual three dimensional CAM simulation using real world PLC execution code generated by compiling control logic. The execution code specifies I/O for specific control mechanisms which in turn control mechanical resources linked thereto. When linked to the control mechanisms correctly, the execution code causes a prescribed manufacturing process to be performed.

It has been recognized that in the virtual world, while the mechanical resources which form a manufacturing line and their possible movements can be represented by video clips of the resources in operation, unfortunately, control mechanisms have no virtual representation. Thus, while the execution code specifies I/O for controlling virtual mechanical resources via control mechanisms, because there are no virtual control mechanisms, there is a disconnect between the execution code and the virtual mechanical resources.

Exemplary specification 9300 effectively maps the PLC outputs to corresponding video clips of the virtual mechanical resources. In addition, simulation specification 9300 also maps signals corresponding to specific occurrences in the video clips back to the PLC as PLC inputs.

Figure 88:
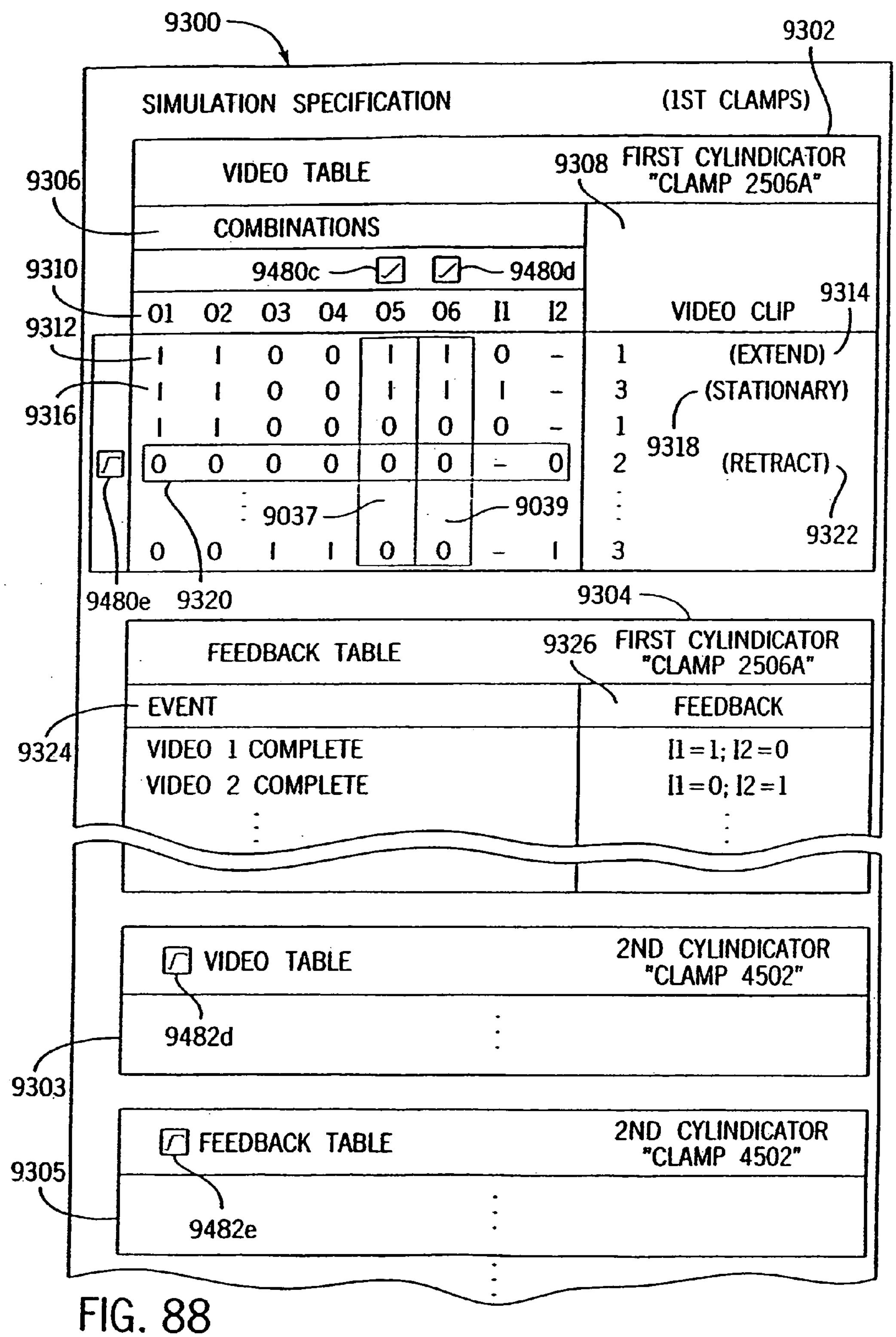
FIG. 88 is a schematic illustrating an exemplary simulation specification of FIG. 84.

Referring now to FIG. 88, an exemplary simulation specification 9300 corresponding to 1stclamps logic specifications 9002 is illustrated and includes video tables and feedback tables for each of the four possible cylindicators 9425-9431. Thus, for the first cylindicator 9425, specification 9300 includes video table 9302 and feedback table 9304. For the second cylindicator 9427, specification 9300 includes video table 9303 and feedback table 9305 and, although not illustrated, similar video and feedback tables are provided for third and fourth cylindicators 9429 and 9431, respectively. Each of the video tables is similar and therefore, to simplify this explanation, only tables 9302 and 9304 are explained here in detail.

Video table 9302 includes an I/O combination column 9306 and a video clip column 9308. Combination column 9306 includes an I/O row 9310 which lists all of the I/O in logic specification 9002 which is associated with operation of the first cylindicator 9425 to move an associated clamp. Thus, row 9310 includes outputs 01 through 06 and inputs I1 and I2. In the video and feedback tables corresponding to the second, third and fourth cylindicators 9427-9431, combination columns would be essentially identical to column 9306 except that inputs I1 and I2 would be I3, I4; I5, I6; and I7, I8, respectively.

Referring still to FIG. 88, below row 9310 is a list of I/O combinations which includes every possible I/O combination corresponding to the I/O in row 9310. In the column 9306 list, a "1" indicates an active signal, a "0" indicates a passive signal and a "-" indicates a "don't care" condition. Thus, for example, the first I/O combination 9312 includes active outputs O1, O2, O5 and O6, passive outputs O3 and O4, a passive input I1 and the state of input I2 does not matter.

Video clip column 9308 includes a list of video clip indicators corresponding to the I/O combinations in the rows of column 9306. In the present example (i.e. a clamp associated with the first cylindicators), only three possible video clips can occur. The first video clip identified by "1" corresponds to a video illustrating a clamp extending. A second video clip identified by "2" corresponds to a video illustrating a clamp retracting. The third video clip "3" corresponds to a video illustrating a stationary clamp.

Referring to FIGS. 85 and 88, the first combination 9312 corresponds to an extend request in logic specification 9002 and, as desired, is associated with the extend video clip 1 (9314). The second I/O combination 9316 in column 9306 includes outputs which correspond to an extend request in specification 9002. However, input I1 is also active indicating that the extend video has already occurred. In this case, the combination 9316 corresponds to the stationary video 3 (9318). Continuing, the fourth I/O combination 9320 includes all passive outputs and a passive second input I2. In the case of first clamps, a passive input I2 indicates that the clamp is not yet in the retracted position. In addition, because all outputs O1 through O6 are passive, the spring in the spring return valve should force the clamp into the retracted position. Therefore, the video clip corresponding to fourth I/O combination 9320 is clip 2 (9322) which shows the clamp retracting.

Thus, table 9302 receives PLC I/O combinations corresponding to a first clamp to be controlled and maps each combination to a specific video clip which illustrates what a clamp in the real world would be expected to do as a result of the specific I/O combination. Video tables for the second, third and fourth clamps which are controllable via the first clamps CA operate in a similar fashion.

Referring still to FIG. 88, feedback table 9304 includes both an event column 9324 and a feedback column 9326. Event column 9324 includes events corresponding to specific occurrences in video clips which should be linked to PLC inputs. In the present example, the 1stclamps inputs include extended proximity and retracted proximity signals I1 and I2 which should change from passive to active when an associated clamp video reaches fully extended and fully retracted positions, respectively. In the case of the clamp videos, the fully extended position is achieved at the end of video clip 1 and the fully retracted position is achieved at the end of video clip 2. Therefore, the events in column 9324 include video clip 1 complete and video clip 2 complete.

Feedback column 9326 includes feedback input signals for the PLC corresponding to each event in column 9324. For example, at the end of video clip 1, input I1 is set equal to 1 and input I2 is set equal to 0. Similarly, at the end of video clip 2 when the clamp achieves the fully retracted position, input I1 is set equal to 0 and input I2 is set equal to 1 indicating a fully retracted clamp.

It should be appreciated that the tables 9302 and 9304 in FIG. 88 are not exhaustive and that other combinations in corresponding video clips could be added to table 9302 and other events and corresponding feedback could be added to table 9304.

In addition, it should be appreciated that, instead of being used with a video module which plays video clips, the simulation specification may be used in conjunction with a CAD or CAM system which can simulate three-dimensional movement of three-dimensional virtual mechanical resources on the display of a work station. In this case instead of mapping I/O combinations to specific video clips, the I/O combinations may be mapped to specific requests in a mechanical resource timing diagram which in turn cause the CAD or CAM system to display corresponding mechanical resources in operation. In addition, in this case, instead of linking feedback events to specific occurrences in video clips, the feedback events would be linked to specific occurrences during CAD or CAM simulation. Moreover, other types of simulation specification are contemplated and are described in more detail below.

b. CA Parameterization

While it would be preferable if all controls information in a CA were completely rigid, unfortunately, as indicated in the Background section above, such a system would likely result in an unworkably large number of CAS. For example, for clamps, if there were five clamp CA features in addition to basic (i.e., a valve and a cylinder) clamp CA requirements, the number of different feature combinations would require a huge number of separate clamp CAS.

To avoid requiring a massive CA template library, the inventive CA templates have been designed to strike a compromise between parameterization and permanently specified controls information. While each of the CAS include predefined controls information, some or all of the CAS may include information which can be "parameterized" or "customized". In this context the term "parameterized" means that a portion of the CA can be modified so that CA features accommodate specific design requirements.

While many schemes for facilitating parameterization are contemplated by the present invention, in the interest of simplifying this explanation a single parameterization scheme will be described. In the exemplary scheme each CA template defines all of the control information which is required to support a maximum number of control devices and corresponding HMI characteristics, diagnostics and simulation. However, at least some of the control information defined in each parameterizable CA is selectable and de-selectable via parameterization tools to be described. When CA information is selected, the information is said to be instantiated in the specific CA instance and is subsequently used by a compiler to generate a control execution code, to configure an HMI, to generate schematics and to provide simulation tools. Information which is not selected and instantiated is said to "exist" in the CA instance but is not subsequently used during compilation to generate execution code, configure an HMI, provide control system schematics or to support virtual system simulation.

Generally, two types of parameterization referred to as "property setting" and "feature selection" are contemplated. Referring again to FIG. 85, property setting parameterization involves properties sections 9036 and 9066. Properties section 9036 includes indicators for indicating specific properties of the 1stclamps CA instance extend request. To this end, the indicators include a latch set 9050, a restart set 9052 and an inverse request set 9054. Latch set 9050 indicates whether a latch (i.e. a switch) should be set at the end of the extend request. When a latch is set, the latch can be used as a trigger or a condition for other system requests. The latch set 9050 is set when a flag (i.e. a check) appears in the flag box 9051. In FIG. 85 the latch set is not set.

Restart set 9052 indicates whether or not the extend request is restartable. Restartable means that during execution of a request, if another identical request is initiated, the second request can restart the request cycle. Some requests cannot be restarted. For example, a particular sequence of robot movements most often would not be restartable without modifying an end result. For instance, if a request requires a robot to move a welding point 12 inches forward and 10 inches to the left during a request, after the robot moves 8 inches forward, if the request was restarted, the end result would be incorrect.

Referring still to FIG. 85, in the case of the extend request cycle indicated by chart 9038, it makes no difference during an extend request if another extend request is received, the second extend request can restart the cycle. Thus, a check in a "restartable" flag box 9053 indicates a restartable request.

Inverse request set 9054 indicates the inverse request for the extend request. Virtually all requests include an inverse request which is the inverse of the request which returns a mechanical resource back to an initial state. For example, in the case of a clamp, the inverse of an extend request is often a retract request. In the case of a robot, the inverse of a request moving 12 inches forward and 8 inches to the left may be to move 8 inches to the right and 12 inches rearward. While only extend and retract requests are illustrated in FIG. 85, mechanical resources other than a clamp may have many more than two requests specified in their logic specifications 9002. For example, in the case of a robot, a robot may have ten different requests which can be called to cause the robot to cycle through ten different movement sequences. In this case, five of the requests may by the inverse requests for the other five requests and the inverse requests would be indicated using the inverse request set 9054 and an accompanying window 9056. In the present case, window 9052 indicates the inverse request as the retract request specified by retract request chart 9032. Referring again to FIG. 85. Properties section 9066 is similar to section 9036 and therefore will not be explained again in detail. The main difference between sections 9036 and 9066 is that the inverse request set 9084 in section 9066 indicates the extend request instead of the retract request.

The 1stclamps request properties in properties sections 9036 and 9066 are an example of features which are parameterizable via property setting. Thus, when the 1stclamps CA instance is instantiated, the control engineer can specify if a latch should be set at the end of the extend request (see latch set 9050), if the extend request is to be restartable (see restart set 9052) and which request is the inverse of the extend request (see inverse request set 9054). Similar parameterization is enabled in properties section 9066.

The second type of parameterization, feature selection, as the name implies, simply provides a control engineer the option to select or de-select optional CA control features for compilation which, although desired in certain applications, are not required in all applications. To this end, some of the devices in CA logic specification 9002 are required and others of the listed devices are not necessarily required for the 1stclamps CA to operate properly.

In addition, some of the control devices are included in the CA template as default devices whereas others of the listed control devices may optionally be added to the CA as required. Optional default control devices can be deselected so that they are effectively removed from a specific CA instance. For example, the devices in specification 9002 include three default control assemblies including two position valve 9421, spring return valve 9423 and 1st cylindicator 9425. Of the three default control devices 9421, 9423 and 9425, it is assumed that only the two position valve 9421 and first cylindicator 9425 are required, the spring return valve 9423 being optional.

Throughout FIGS. 85, 85A, 86, 87, 87A and 88, a plurality of flag boxes (e.g. 9480*a*, 9482*a*, 9484*a*, 9486*a*, 9480*b*, 9480*c*, etc.) are provided, each of which corresponds to a CA device or characteristic which may be selected or de-selected to parameterize a specific CA instance. Flag boxes which include a flag (e.g. see box 9480*a* in FIG. 85) indicate selection or designation and boxes which are clear (e.g. see box 9991 in FIG. 86) indicate un-selected or un-designated devices or characteristics.

Generally there are two different types of flag boxes, designation boxes and selection boxes. On one hand, a designation box is used to designate an associated device, characteristic or characteristic set as an item which is later presented as a selectable item for additional parameterization. Thus, a characteristic or characteristic set which is designated by a flag in a designation box is not instantiated but is later presented for possible instantiation. On the other hand, a selection box is used to select and instantiate a corresponding characteristic for subsequent compilation.

Referring again to FIG. 85, to indicate the optional nature of spring return valve 9423, a selection box 9480*a* is provided adjacent valve 9423. Initially, as value 9423 is a default control device, a flag mark (i.e. check) appears within box 9480 a. Because each of control devices 9468 and 9472 are required, flag boxes are not provided adjacent those two control devices in column 9462. It is contemplated that a tool will be provided for de-selecting valve 9423 by removing the flag from box 9480*a*. One such tool is described below.

In addition to default control devices 9421, 9423 and 9425, the devices in the "SafeBulkHeadClampSet" CA template logic specification 9002 also includes three optional control devices including second, third, and fourth cylindicators 9427, 9429 and 9431. Because each of cylindicators 9427-9431 can optionally be selected or deselected to remove, respectively, the cylindicators from the control assembly, selection boxes 9482*a*, 9484*a* and 9486*a* are provided adjacent each of the cylindicators 9427, 9429 and 9431, respectively. While flags are provided in boxes 9482*a*, 9484*a* and 9486*a*, initially, because each of cylindicators 9427-9431 are not default control devices, flags would not be provided in boxes 9482*a*, 9484*a* and 9486*a*. If cylindicators 9427-9431 are selected flags are placed within corresponding selection boxes to indicate selection. FIG. 85 reflects the state of boxes 9482*a*, 9484*a* and 9486*a* after selection of cylindicators 9427-9431.

Referring to FIGS. 85 and 85A, separate selection boxes 9480*f*, 9482*f*, 9484*f* and 9486*f* which correspond to selection boxes 9480*a*, 9482*a*, 9484*a* and 9486*a*, respectively, are provided adjacent representations "spring return valve" 9423, "2nd cylindicator" 9427, "3rd cylindicator" 9429 and "4th cylindicator" 9431, respectively. As described below, when a selection or de-selection is made in specification 9002, selection ripples through schematics specification 9004 providing flags in corresponding selection boxes 9480*f*, 9482*f*, 9484*f* and 9486*f*. As indicated above, flags in any of boxes 9480*f*-9486*f* indicate that subsequently, when the schematic is compiled and constructed for the 1stclamps CA instance, the compiler must include representations in the schematic for corresponding control devices (e.g. spring return valve 9423, 2nd cylindicator 9427, etc.)

Initially, because spring return valve 9423 is a default control device, a flag appears in box 9480*f*. Similarly, because each of cylindicators 9427, 9429 and 9431 are not default devices, initially no flags appear in boxes 9482*f*, 9484*f* and 9486*f*. FIG. 85A shows the state of boxes 9482*f*, 9484*f* and 9486*f* after corresponding cylinders have been selected for inclusion in the 1stclamps CA instance.

Referring to FIGS. 85 and 86, separate designation boxes 9480*b*, 9482*b*, 9484*b* and 9486*b* which correspond to selection boxes 9480*a*, 9482*a*, 9484*a* and 9486*a*, respectively, are provided next to the representations "spring return valve" 9423, "cylindicator-2" 9427, "cylindicator-3" 9429 and "cylindicator 4" 9431, respectively. As described below, when a selection or de-selection is made in specification 9002, the selection ripples through HMI table 9460 providing flags in corresponding designation boxes 9480*b*, 9482*b*, 9484*b* and 9486*b*. Boxes 9482*b*, 9484*b* and 9486*b* include flags indicating designation.

In addition, a separate selection box (e.g. 9991) is provided under each of outputs O1 through O4 for indicating selection of those outputs to be supported by a corresponding HMI. For each of outputs O1 through O4 which is selected to be monitored via an HMI, some type of an HMI indicator is specified during subsequent compilation which corresponds to the selected output. As illustrated in FIG. 86, none of the output selection boxes includes a flag and therefore none of the outputs are selected. Selection boxes (e.g. 9493, 9495) are also provided for outputs 05 and 06 and for each input I1-I8 in column 9464. As illustrated, boxes 9493 and 9495 include flags and therefore have been selected.

Referring still to FIG. 86, as with the outputs listed in column 9464, a separate selection box is provided for each of outputs in column 9466 to indicate whether or not the corresponding outputs are selected to be included in the HMI. As illustrated, none of the outputs are presently selected (i.e. the selection boxes are empty). Also, selection boxes are provided each of outputs 05 and 06 in column 9466. Selection boxes 9490, 9492 are also provided adjacent "extend" and "retract" requests in column 9466. Boxes 9490 and 9492 include flags indicating selection.

Referring to FIGS. 85 and 87, separate designation boxes 9482*c*, 9484*c* and 9486*c* which correspond to boxes 9482*a*, 9484*a* and 9486*a*, respectively, are provided next to cylindicators 9427, 9429 and 9431, respectively. As described below, when a selection or de-selection is made in specification 9002, the selection ripples through diagnostics table 9600 providing a flag in a corresponding designation box 9482*c*, 9484*c* or 9486*c*. In addition, selection boxes 2001, 2002, 2003, etc. are provided next to each requirement in list 9604 to enable further parameterization as described below. Each of boxes 9482*c*, 9484*c* and 9486*c* include flags indicating designation while box 2001 includes a flag indicating selection.

Referring to FIG. 87A, where a status based diagnostics specification is employed, separate designation boxes, 9480*g*, 9482*g*, 9484*g* and 9486*g* which correspond to boxes 9480*a*, 9482*a*, 9484*a* and 9486*a* (see FIG. 85), respectively, are provided next to spring return valve extend requirement 3520 and so on. Similarly, boxes 9480*g*, 9482*g*, 9484*g* and 9486*g* are provided next to return request event requirements which are associated with spring-return valve 9423, second cylindicator 9427, third cylindicator 9429 and fourth cylindicator 9429. Once again, when a selection or de-selection is made in specification 9002. The selection ripples through diagnostics table 3503 providing or eliminating a flag in corresponding designation boxes 9480*g*, 9482*g*, 9484*g* and/or 9486*g*.

With respect to status based diagnostics, when a designation box is blank, upon compilation status based diagnostics code is not provided for a corresponding event. For example, referring to FIGS. 85 and 87A, where box 9480*a* is deselected to remove the flag therein, the de-selection ripples through table 3501 and removes the flag from boxes 9480*g*. Then, upon compilation, the status based diagnostics specifies that after requirement 3515 is achieved, requirement 3519 corresponds to the next event and the displayed status based diagnostics message is "1st-cylindicator extended."

Referring to FIGS. 85 and 88, selection boxes 9480*c*, 9480*d* and 9480*e* which correspond to box 9480*a* are provided in video table 9302. Box 9480*c* corresponds to column 9037 below output 05. When the spring return valve 9423 is selected, output 05 exists and therefore should affect table 9302. However, when valve 9423 is deselected, output 05 does not exist and hence must not affect the video to be displayed. An empty selection box 9480*c* renders data in column 9037 under output 05 ineffective. The remaining I/O combinations are still effective for mapping purposes. Box 9480*d* has a similar relationship to output 06 and column 9039 therebelow.

Box 9480*e* corresponds to the I/O combination 9320 to the right thereof in column 9306. In the present example, if spring return valve 9423 is de-selected, certain I/O combinations, including the combination to the right of box 9480*e*, are incorrect and therefore should not affect the video to be displayed. An empty selection box 9480 e renders I/O combination 9320 to the right thereof ineffective.

Referring still to FIGS. 85 and 88, selection boxes 9482*d* and 9482*e* are provided in tables 9303 and 9305 which correspond to box 9482*a*. When cylindicator 9427 is selected in specification 9002, simulation tables like tables 9302 and 9304 must be provided for the second cylindicator 9427. To this end, flags in boxes 9482*d* and 9482*e* select and instantiate tables 9303 and 9305 for subsequent compilation. Boxes 9482*d* and 9482*e* each include a flag and therefore indicate selection of corresponding tables 9303 and 9305, respectively. Although not illustrated, similar selection boxes are provided for video and feedback tables corresponding to third and fourth cylindicators 9429 and 9431, respectively.

Referring to FIG. 85, as indicated above, spring return valve 9423 is an initial default control device but is optional. Referring to FIGS. 84 and 85 if valve 9423 is de-selected using an editor described below and as indicated by removing the flag from box 9480*a*, de-selection ripples through each CA specification 9004, 9006, 9008 and 9300 to modify tables therein to reflect de-selection.

To this end, referring to FIGS. 85 and 85A, initially a flag appears in box 9480*f* indicating a default device and that spring return valve 9423 must be represented in a CA schematic representation upon compilation. However, when the flag is removed from box 9480*a* (see FIG. 85), the flag in box 9480*f* is also removed. When the flag in box 9480*f* is removed, spring return valve 9423 is de-selected and, upon compilation, will not be represented in the CA schematic. Referring to FIGS. 85 and 86, initially, a flag appears in box 9480*b* indicating a default control device and indicating that I/O in columns 9464 and 9466 will subsequently be presented for selection and instantiation via an HMI editor (i.e., corresponding I/O in columns 9464 and 9466 has been designated for subsequent possible selection and instantiation). However, when the flag is removed from flag box 9480*a* in logic specification 9002, the flag in box 9480*b* is also removed. The practical effect of removing the flag from box 9480*b* is that monitorable I/O in column 9464 and controllable output in column 9466 corresponding to valve 9423 are undesignated and therefore, upon subsequent presentation of monitorable and controllable I/O for selection and instantiation, these I/O are not presented.

Referring to FIG. 87, diagnostic specification table 9600 does not specify diagnostics for the spring return valve and therefore no flags are modified in table 9600 when spring return valve 9423 is de-selected in logic specification 9002.

Referring to FIG. 88, selection boxes 9480*c* and 9480*d* are provided for outputs 05 and 06 which correspond to spring return valve 9423 and which are associated with flag box 9480*a*. Initially, because valve 9423 is a default control device, flags are provided in each of boxes 9480*c* and 9480*d* meaning that outputs 05 and 06 in column 9306 are to be included in I/O combinations. When the flag is removed from box 9480*a*, the flags in boxes 9480*c* and 9480*d* are also removed thereby effectively de-selecting and eliminating outputs 05 and 06 from the combinations in column 9306.

In addition, when outputs 05 and 06 are eliminated by de-selection, some of the video clips corresponding to combinations in column 9306 may be rendered incorrect. For example, referring still to FIGS. 85 and 88 and specifically to combination 9320, if spring return valve 9423 is de-selected, because the safety spring in the return valve is eliminated, when all of inputs 01 through 04 are passive (i.e. zeros), the clamp linked to the first cylinder will remain stationary. For this reason, the retract video clip 9322 is incorrect. Thus, selection boxes (one illustrated) 9480*e* corresponding to combination/video clips which are to be de-selected and hence rendered un-instantiated upon de-selection are provided adjacent each such combination. Once again, initially a flag appears in box 9480*e* as spring return valve 9423 is a default device.

Referring to FIG. 84, all other controls information in CA 9000 is also updated when a second cylindicator control device is selected and added to CA 9000 to control a second clamp. Referring to FIGS. 85 and 86, when a flag is placed in selection box 9482*a*, a flag is also placed in designation box 9482*b*. A flag in box designation 9482*b* indicates that the monitorable and controllable I/O corresponding to the second cylindicator 3 should be subsequently presented for selection and instantiation via an HMI editor. In the present example second cylindicator 9427 includes inputs I3 and I4 which are monitorable and includes no controllable outputs.

Referring to FIGS. 85 and 87, when a flag is placed in box 9482*a*, a corresponding flag is placed in designation box 9482*c* indicating that the requirement and activity in the row corresponding to the second cylindicator 9427 should be subsequently provided for selection and instantiation via a diagnostics editor. If box 9427 is empty, corresponding requirements/activities are not subsequently provided for selection.

Referring to FIGS. 85 and 88, when a flag is placed in selection box 9482*a*, corresponding flags are placed in selection boxes 9482*d* and 9482*e*. Flags in boxes 9482*d* and 9482*e* select and instantiate tables 9303 and 9305 for subsequent compilation.

Referring to FIGS. 85, 85A, 86, 87 and 88, each of the selection boxes 9484*a* and 9486*a* correspond to designation and selection boxes in each of schematics table 800, HMI table 9460, diagnostics table 9600 and simulation specification 9300 and, as with box 9482*a*, flags in boxes 9484*a* and 9486*a* ripple through tables 800, 9460 and 9600 and through specification 9300 to designate (i.e., designate information for subsequent selection) and select (i.e., instantiate information for subsequent compilation), respectively.

In this manner, any change to logic specification 9002 ripples through other specification sections of control assembly 9000.

4. Control Sequence Bar Chart

Figure 89:
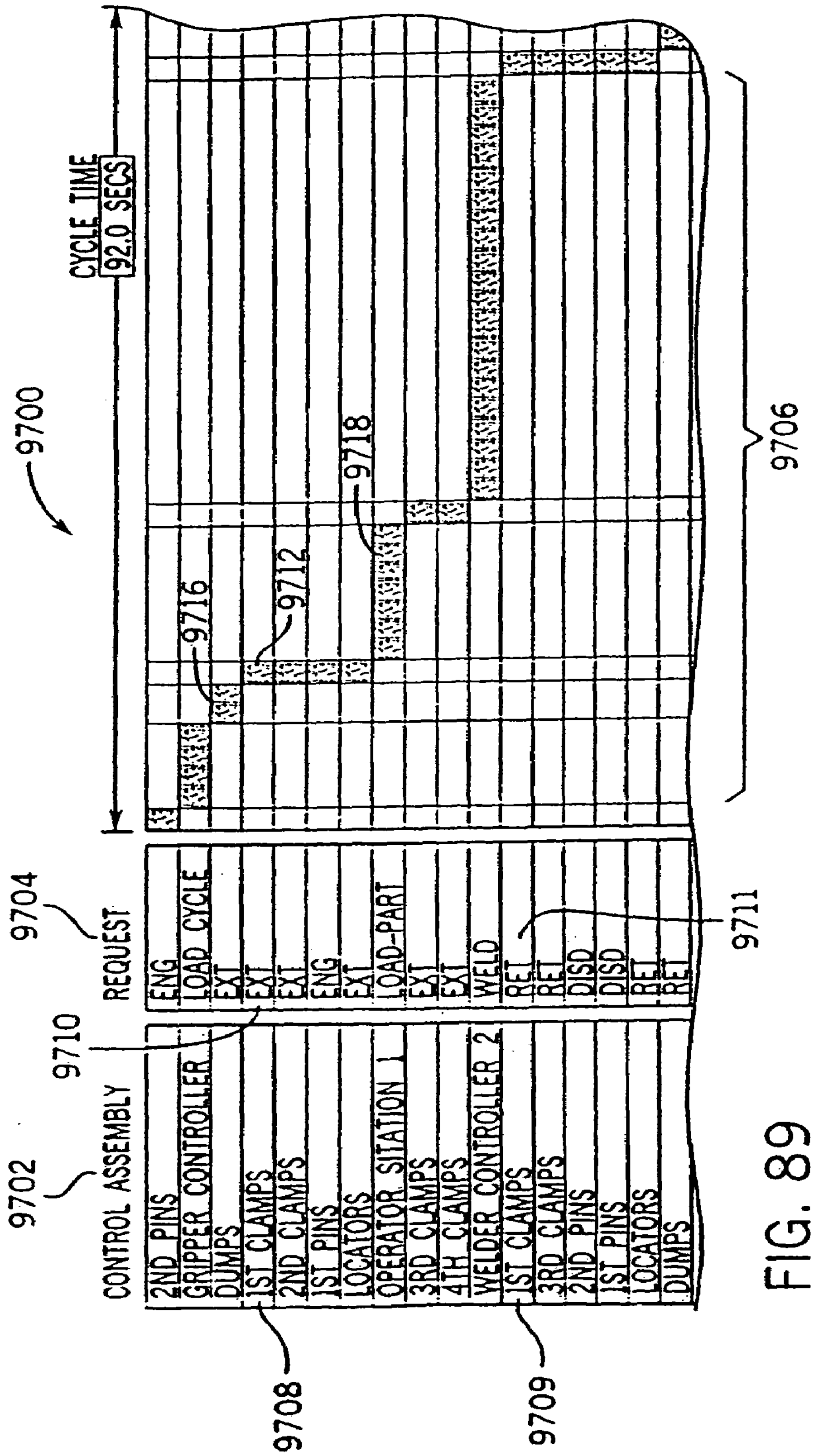
FIG. 89 is an exemplary control bar chart used to sequence control assemblies according to the present invention.

CA requests can be sequenced to cause a plurality of mechanical components to operate in a specified order to carry out a manufacturing process. Referring to FIG. 89, preferably, the sequencing process is accomplished using a control bar chart 9700. Chart 9700 includes a control resource column 9702, a requests column 9704 and a bar chart diagram 9706 which corresponds to the columns 9702 and 9704. The resources column 9702 includes a list of CA instances which have been chosen to control the mechanical resources (not illustrated) which are associated with a specific manufacturing process. To this end, as illustrated, the CAS include controllers, pins, clamps, dumps, locators and so on. One of the specified CA instances is the 1stclamps CA instance described above which appears twice in column 9702 at 9708 and 9709.

Requests column 9704 includes a list of requests corresponding to the CAS in column 9702. Referring to FIGS. 85 and 89, the 1stclamps "extend" request 9710 corresponds to extend request 9031 in CA logic specification 9002. Similarly, the 1stclamps "retract" request 9711 corresponds to retract request 9033 in CA logic specification 9002.

Diagram 9706 is temporally spaced along a horizontal axis and includes a separate bar for each request in column 9704. For example the bar corresponding to 1stclamps extend request 9710 is bar 9712. The bars are sequenced from left to right and top to bottom according to the order in which the requests associated therewith occur during the manufacturing process. For example, in section 9706, the extend request associated with bar 9712 occurs after the request associated with bar 9716 and just before the request associated with bar 9718 and so on. Hereinafter, to simplify this explanation, the bars in FIG. 89 will be referred to generally as requests.

By selecting and parameterizing CA instances to control each mechanical resource in a manufacturer line and sequencing CA instance requests using a control bar chart like the chart illustrated in FIG. 89, virtually all of the controls information which is required to generate execution code, schematics, HMI code, diagnostics code and simulation tools is completely specified. Thereafter, a compiler is used as explained below to generate the execution code for simulation and PLC control.

B. General Overview of System

Figure 90:
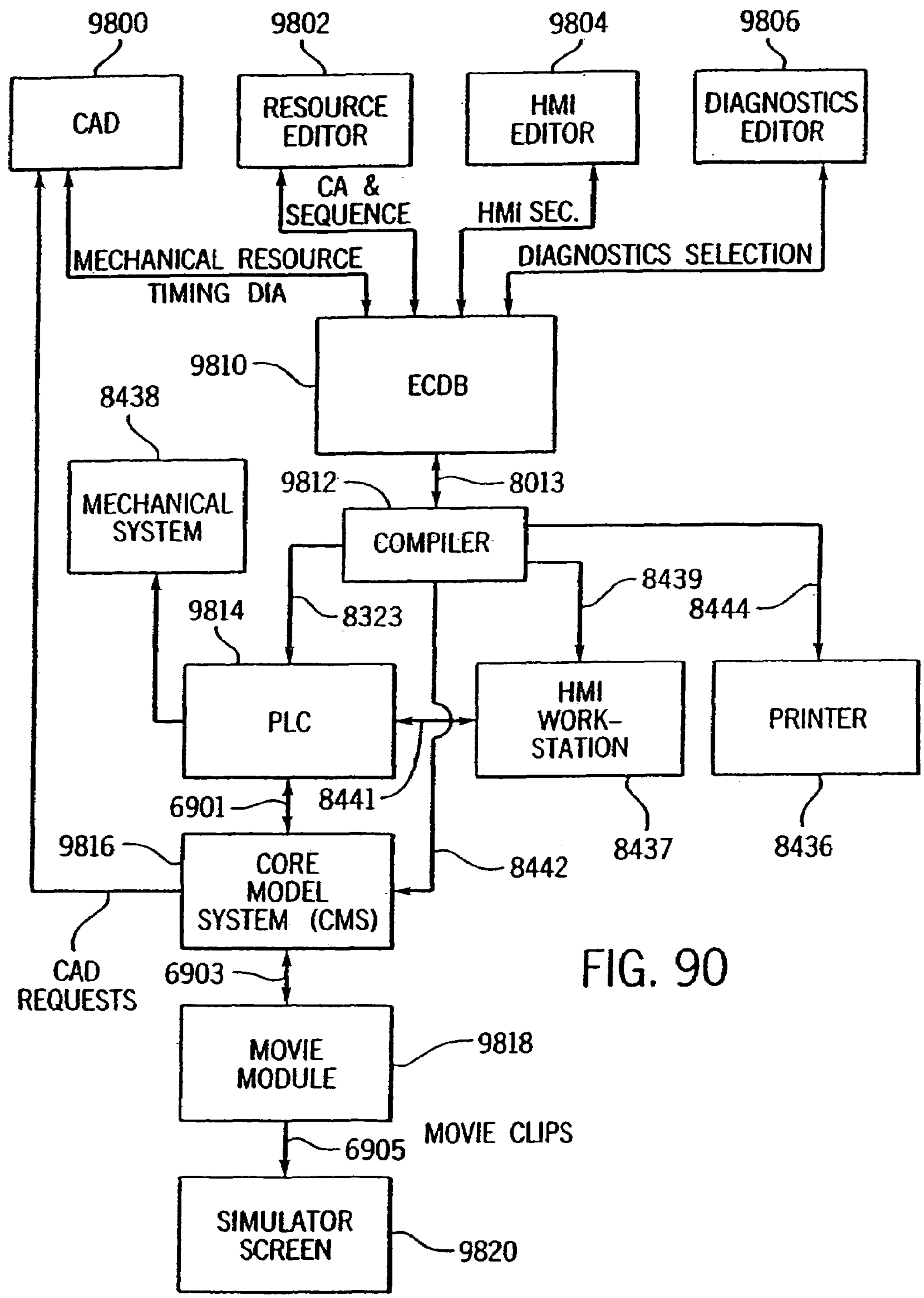
FIG. 90 is a block diagram illustrating various components of a system used to practice the present invention.

Referring now to FIG. 90, an exemplary system according to the present invention includes a plurality of networked components including a CAD system 9800, a resource editor 9802, an HMI editor 9804, a diagnostics editor 9806, an enterprise control data base 9810, a compiler 9812, a PLC 9814, a simulator or core modeling system (CMS) 9816, a movie module 9818, an HMI work station 8437, a simulation screen 9820 and a printer 8436. System 8458 represents all of the mechanical control mechanisms which are to be controlled by PLC 9814. Hereinafter, each of the components, editors or systems in FIG. 90 will be explained separately or, where advantageous, in conjunction with other components.

1. CAD System/Movie Module

Referring still to FIG. 90, it is contemplated that CAD system 9800 has a plurality of capabilities. First, CAD system 9800 is useable to define three dimensional mechanical resources such as clamps, robots, mills, and so on. Second, CAD system 9800 is able to define model movements and movement ranges and limits.

These two capabilities, to define 3D mechanical resources and their ranges of motion, enable a process engineer to envision a controls process. In addition, in at least one embodiment these two abilities can be combined with simulation specifications to virtually simulate a manufacturing process.

Third, CAD system 9800 can be used by an engineer to label specific model movements or cycles with mechanical resource activity names. Fourth, CAD system 9800 provides tools which allow an engineer to sequence the named activities. Preferably the sequencing is provided using a mechanical resource timing diagram, a tool which is already well known within the controls industry.

Movie module 9818 includes exemplary video clips or motion pictures of mechanical resources traversing through each possible mechanical resource activity required during a manufacturing process. For example, in the case of a clamp, the video clips include extend and retract clips corresponding to clamp videos showing extend and retract movements. The clips also include stationary clips showing corresponding static mechanical resources. Video module 9818 is capable of playing a plurality of video clips simultaneously and arranged on a display in a manner which reflects actual layout and configured relationships of mechanical resources. Module 9818 is linked to screen 9820 for this purpose. Module 9818 receives command signals from simulator 9816 indicating clips to play. Module 9818 is also capable of recognizing specific occurrences in video clips and providing feedback signals to PLC 9814 via CMS 9816 for simulation purposes.

At this point, it will be assumed that CAD system 9800 has already been used to define all mechanical resources to be used in an exemplary manufacturing process, mechanical resource activity cycles have been given activity names and a mechanical timing diagram has been provided which is stored in database 9810.

Figure 91:
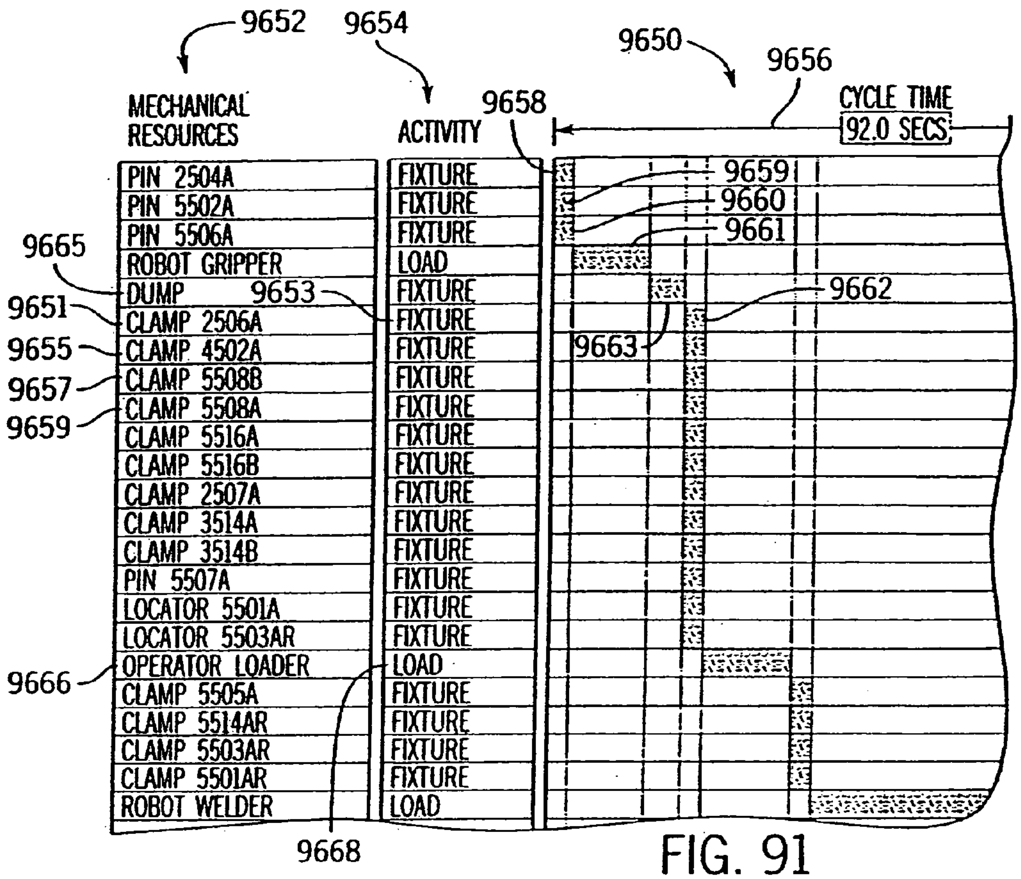
FIG. 91 is an exemplary mechanical resource timing diagram.

Referring now to FIG. 91, a portion of an exemplary mechanical resource timing diagram 9650 is illustrated. Diagram 9650 includes a mechanical resource column 9652, an activities column 9654 and a timing diagram 9656. Resource column 9652 lists all of the mechanical resources which a process engineer has specified for an exemplary manufacturing process in the order in which corresponding mechanical resource activities will occur. Although not illustrated, most of the mechanical resources will be listed more than once in resource column 9652 as most mechanical resources perform more than a single activity during a manufacturing process. For example, a clamp will typically extend and retract at least once during a manufacturing process and therefore would appear at least once for an extend activity and at least a second time for a retract activity.

The activity column 9654 includes a list of activities corresponding to the mechanical resources of column 9652. For example, with respect to a clamp 9651, a specified activity 9653 is "Fixture" meaning that the clamp 9651 should fix or close or extend onto a work item. Similarly, a plurality of other clamps are to extend along with clamp 9651, the other clamps including, among others, clamps 9655, 9657 and 9659.

Timing diagram 9456 is temporarily spaced along a horizontal axis and includes a plurality of bars which are arranged in sequential order from left to right and top to bottom, a separate bar corresponding to each of the activities in column 9654. Thus, bars 9658 through 9660 indicate fixture of three pins (i.e., mechanical resources), bar 9661 indicates a loading activity by a robot gripper, bar 9663 indicates fixture of a dump 9665, bar 9662 indicates fixture of clamp 9651, and so on. Clamp 9651 does not begin to close until after dump 9665 fixture is complete and clamp 9651 must be closed before an operator loader 9666 can load (i.e., perform the specified activity 9668).

With a complete mechanical timing diagram specified, the inventive resource editor and other editors can now be described.

2. Editors

Referring to FIG. 90, the present invention includes resource editor 9802 and is meant to be used with both HMI editor 9804 and a diagnostics editor 9806. Each of the resource, HMI and diagnostics editors are described separately.

a. Resource Editor

Referring still to FIG. 90, resource editor 9802, as well as all of the other editors 9804, 9806 used with the present invention, preferably, is provided via software which runs on a work station or the like, enabling a control engineer to use display screen tools such as tables, windows and work spaces and a mouse-controlled icon for selecting various buttons and pull-down menus to specify controls information with the aid of a CA template library which is stored in ECDB 9810.

Figure 55:
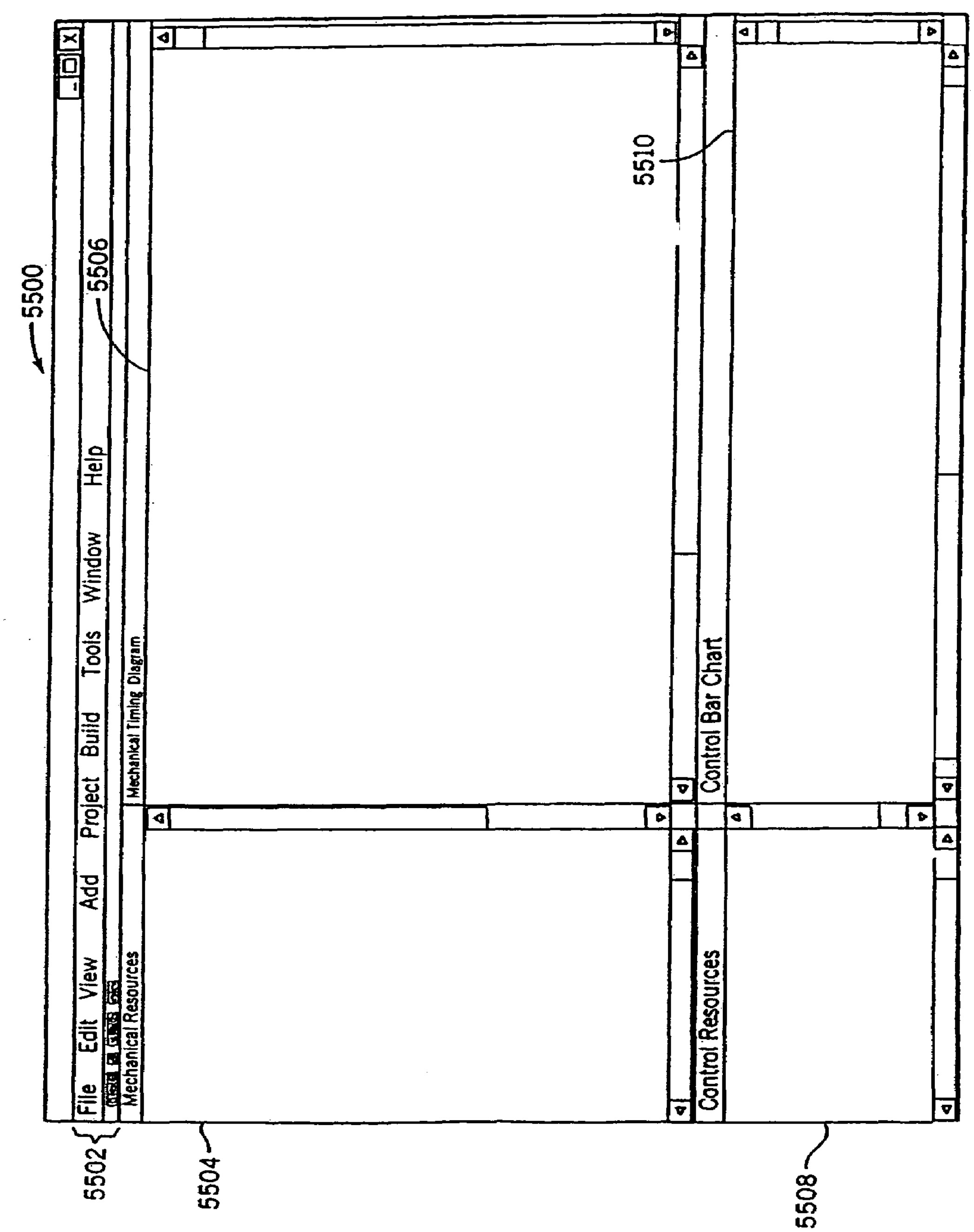
FIG. 55 is the initial display for the Designer Studio in accordance with a preferred embodiment.

To this end, referring to FIG. 55, an exemplary resource editor image which may be displayed on a work station display screen is illustrated. Hereinafter resource editor 9802 is often referred to as a designer studio. Screen 5500 includes a tool bar 5502 and four work space windows. The work space windows include a mechanical resources window 5504, a mechanical timing diagram window 5506, a control resources window 5508 and a control bar chart window 5510. Tool bar 5502 includes editing tools which will be described in more detail below through exemplary use. When a mechanical timing diagram is imported into the resource editor environment, the mechanical timing diagram is presented within mechanical timing diagram window 5506 and each mechanical resource within the diagram is provided within a list inside the mechanical resources window 5504.

Figure 57:
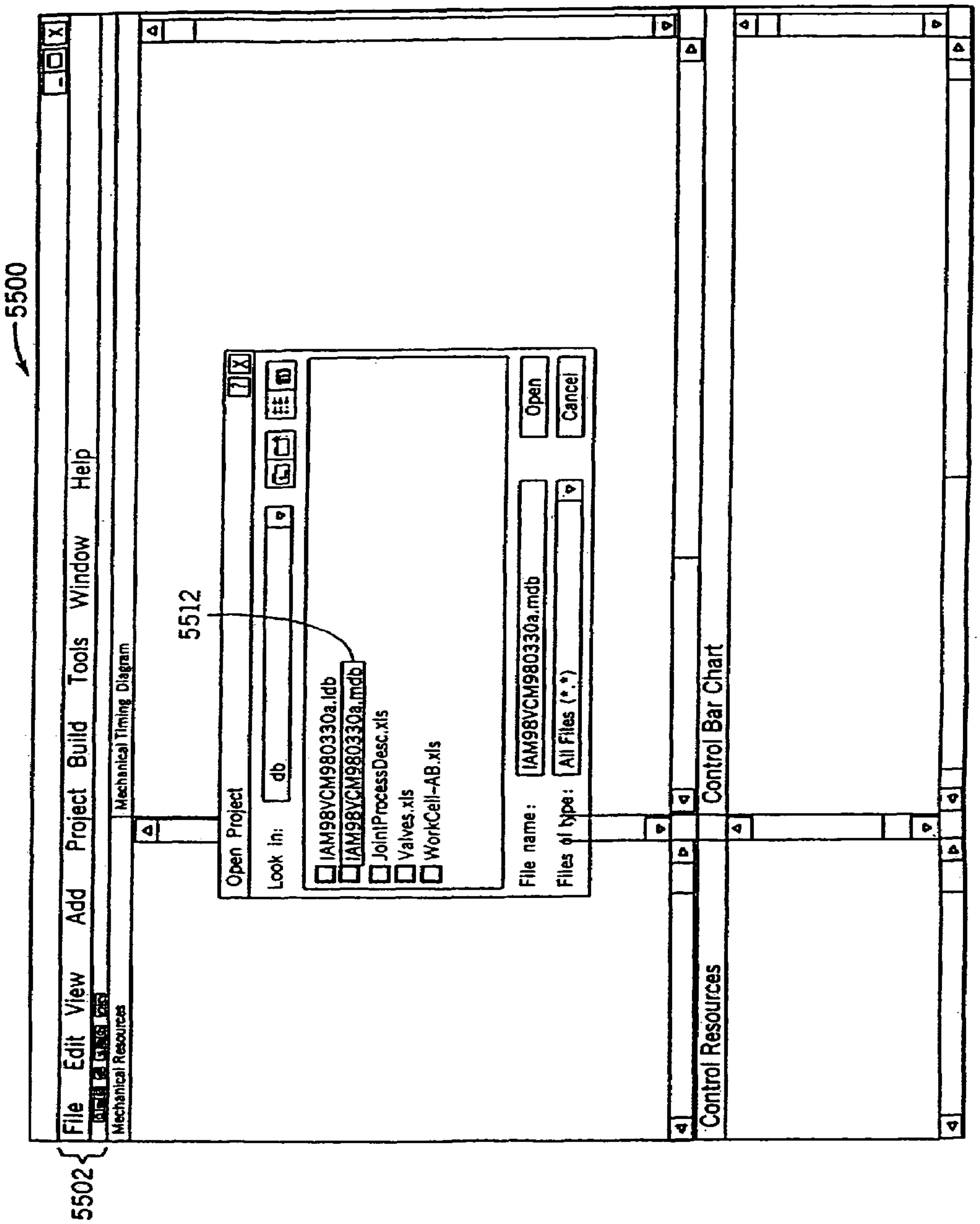
FIG. 57 illustrates a display menu that is utilized to select an existing project to load in accordance with a preferred embodiment.
Figure 58:
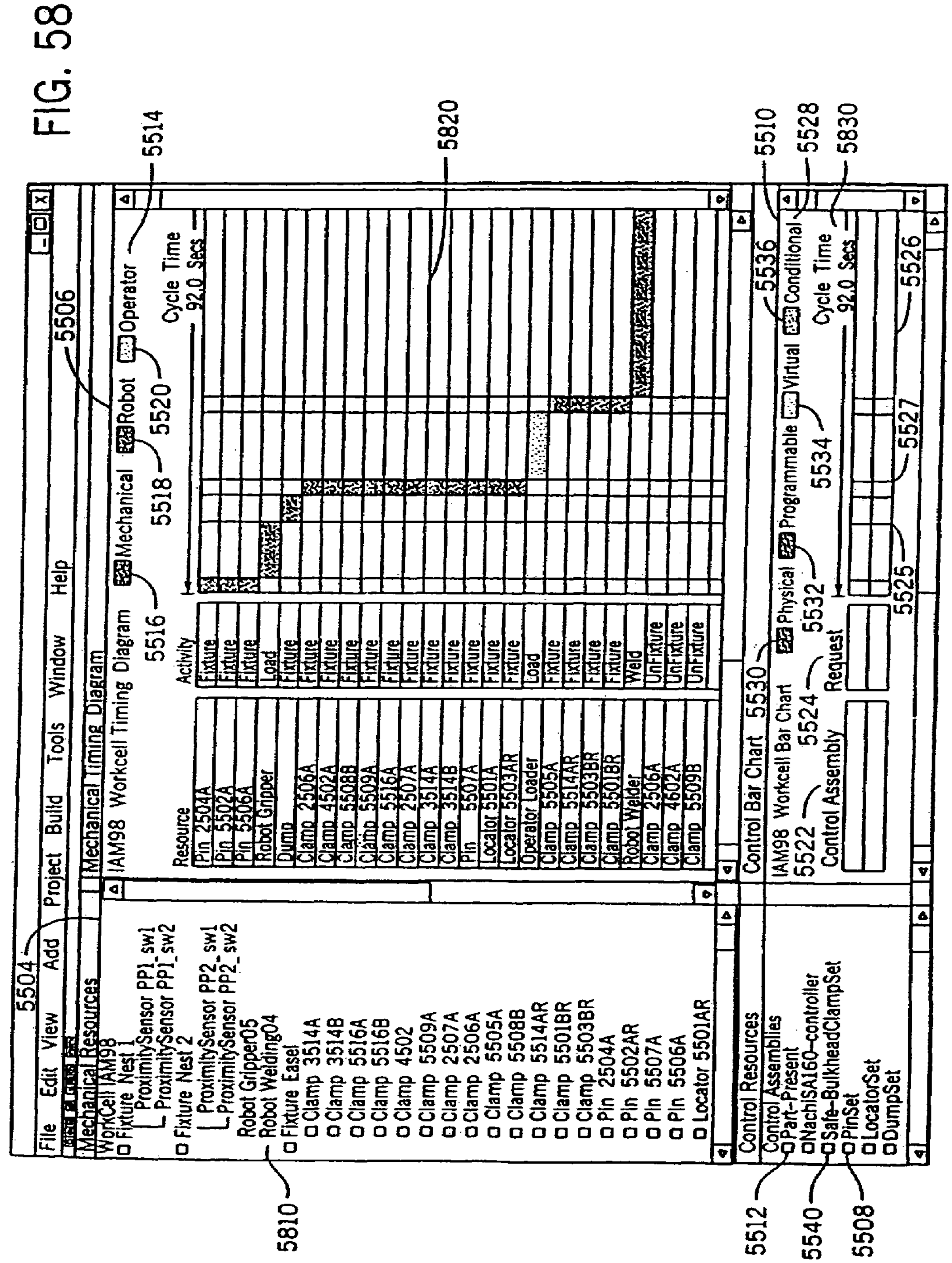
FIG. 58 illustrates an Open Project dialog in accordance with a preferred embodiment.

Initially, it will be assumed that a plurality of different manufacturing processes have been defined using CAD system 9800 and that a separate mechanical timing diagram corresponding to each one of the defined manufacturing processes is stored in data base 9810. Referring now to FIG. 57, a mouse-controlled cursor (not illustrated) can be used along with the tool bar 5502 to select one of the stored mechanical resource timing diagrams by selecting the manufacturing process name 5512 from a list. Referring also to FIG. 58, once a mechanical timing diagram has been selected, the mechanical timing diagram is imported into window 5506, and the list of mechanical resources is provided in window 5504. The mechanical timing diagram in this case is identified by 5820 while the mechanical resource list is identified by 5810.

Referring to FIGS. 58 and 91, it should be appreciated that the mechanical timing diagram 5820 is identical to the diagram 9650. It should also be recognized that only a small portion of the mechanical timing diagram is illustrated in window 5506, the diagram extending to the right and downward further than window 5506 will allow. In addition, diagram 5520 includes a key 5514 above the timing diagram section. Key 5514 indicates differently shaded bars corresponding to different types of resources. A dark bar 5516 corresponds to a mechanical activity, a darkly shaded bar 5518 corresponds to a robot activity (an activity for which additional programming is required) and a lightly shaded bar 5520 corresponds to an activity which must be performed by a human operator.

In addition, when a mechanical timing diagram is imported into the resource editor environment, resource editor 9802 assumes that a control system is to be defined for controlling the mechanical resources in the timing diagram. Therefore, resource editor 9802 automatically provides a list 5512 of control assemblies in control resources window 5508, the list 5512 including all possible control assemblies which may be used to control mechanical resources in diagram 5820. Of particular interest in explaining operation and features of the present invention, note that one of the CAS in list 5512 is a "safe bulk head clamp set" CA 5540, CA 5540 corresponding to the clamp template described in detail above.

Moreover, resource editor 9802 automatically constructs an initial and blank control bar chart image 5830 within control bar chart window 5510. Referring to FIGS. 58 and 89, image 5830, like control bar chart 9700, includes a control assembly column 5522, a requests column 5524 and a bar chart diagram 5526. While blank diagram 5526 does include a timing grid which is initially identical to the grid of mechanical timing diagram 5820 including identical spaced edges (e.g. 5523, 5527, etc.) and period durations which is helpful for subsequent sequencing of CA requests. In addition, editor 9802 provides a key 5528 above bar chart diagram 5526. Key 5528 specifies four differently shaded bars corresponding to characteristics of associated requests. A black bar 5530 indicates a physical request (i.e. typically a mechanical operation), a bar having a first shading characteristic 5532 indicates a programmable request (i.e. typically a request to a robot), a bar having a second shading characteristic 5534 indicates a virtual request (i.e. a request which is performed by an entity which is not controlled by the control system such as a human operator) and a bar having a third shading characteristic 5536 indicating a conditional (i.e. a characteristic which must be met prior to other requests occurring thereafter.)

Figure 59:
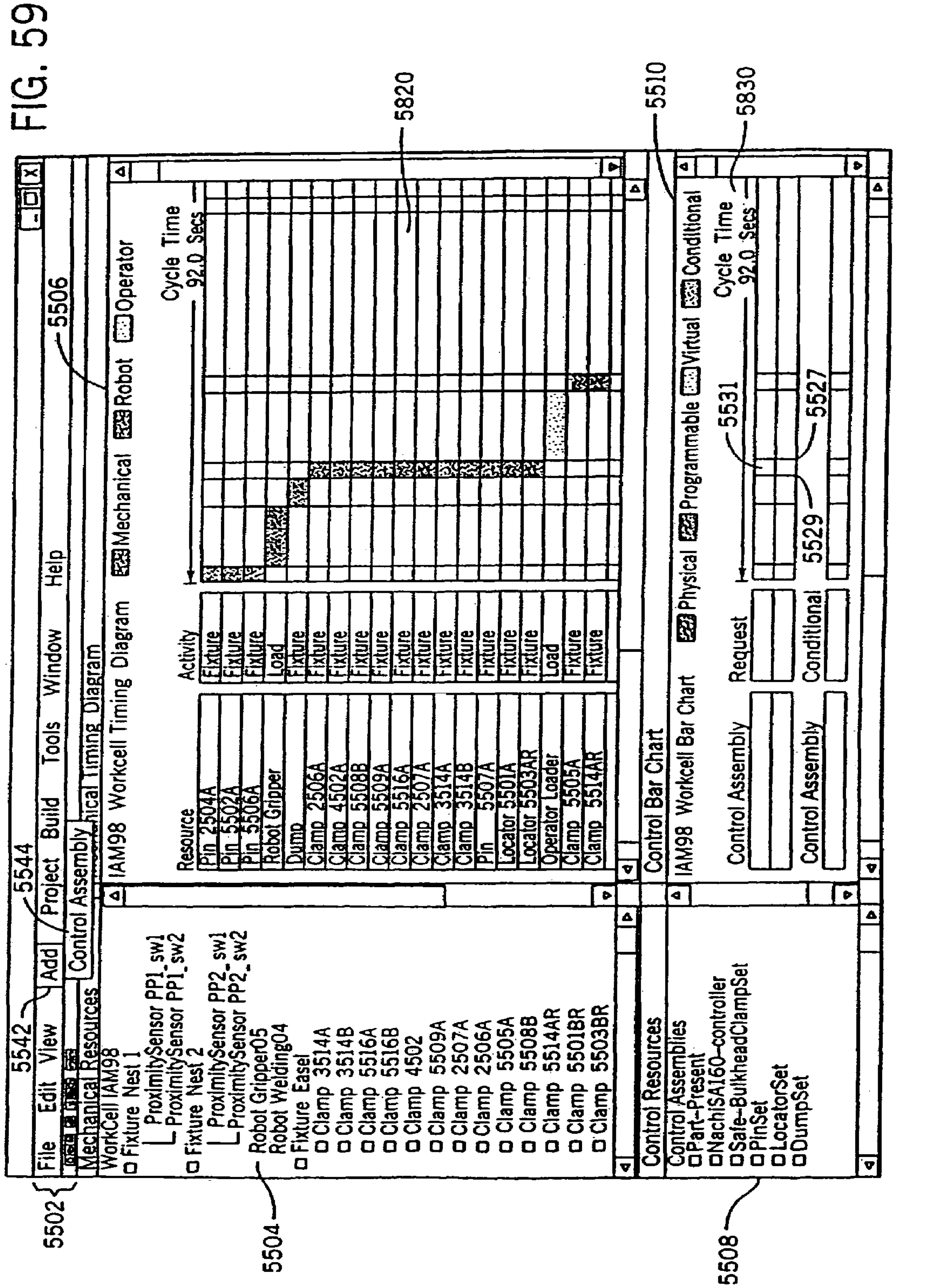
FIG. 59 illustrates a menu display for facilitating an "Add CA" dialog 5900 in accordance with a preferred embodiment.
Figure 60:
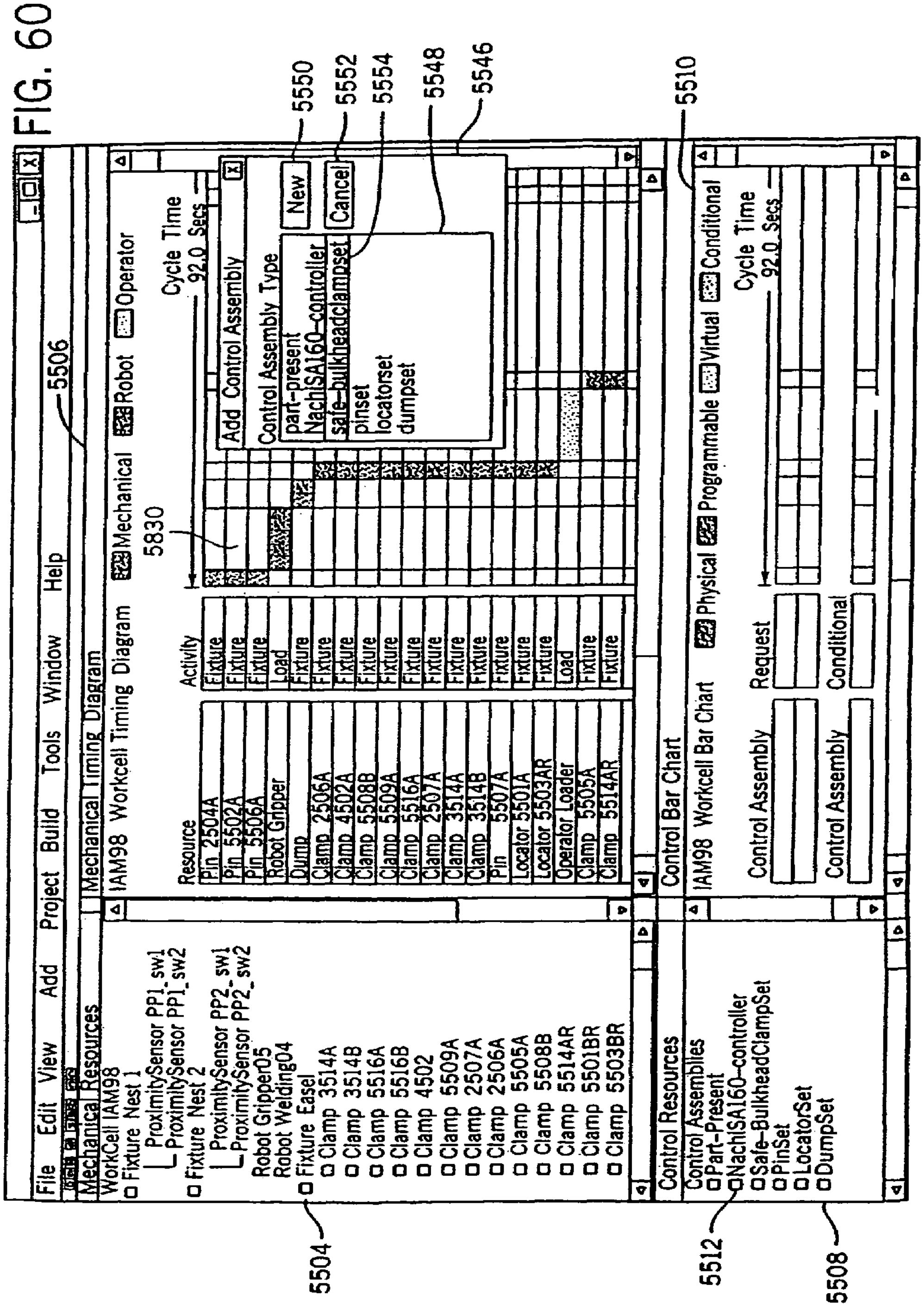
FIG. 60 illustrates the first menu in an "Add CA" dialog in accordance with a preferred embodiment.

Referring now to FIG. 59, to begin specifying CAS for controlling the mechanical resources in timing diagram 5820, a control engineer selects an add icon 5542 from tool bar 5502 which opens a pull down window with a single option 5544 entitled "control assembly." Referring to FIG. 60, when option 5544 is selected, a window menu 5546 opens up which includes a control assembly type list 5548, a "new" icon 5550 and a "cancel" icon 5552. The CA types in list 5548 include each of the CAS in list 5512 including "safe bulk head clamp set type" 5554. The engineer may select any CA type from list 5548. In the present example, it is assumed that, initially, the engineer wishes to select a CA for controlling four clamps which move simultaneously during the mechanical procedure specified by timing diagram 5830. To this end, the engineer selects the "safe bulk head clamp set" type 5554 and thereafter selects the new icon 5550 indicating that a new CA instance is being specified.

When the "safe bulk head clamp set" type 5554 is selected, although not illustrated and observable by a system user, resource editor 9802 automatically identifies every mechanical resource within mechanical resource window 5504 which could possible be controlled via an instance of the "safe bulk head clamp set" CA and stores the list of mechanical resources in ECDB 9810 (see FIG. 90). The controllable mechanical resource list is subsequently provided to the system user to help the system user identify mechanical resources to be controlled by the specific CA instance as will be explained in more detail below with respect to FIGS. 64 and 65.

Figure 61:
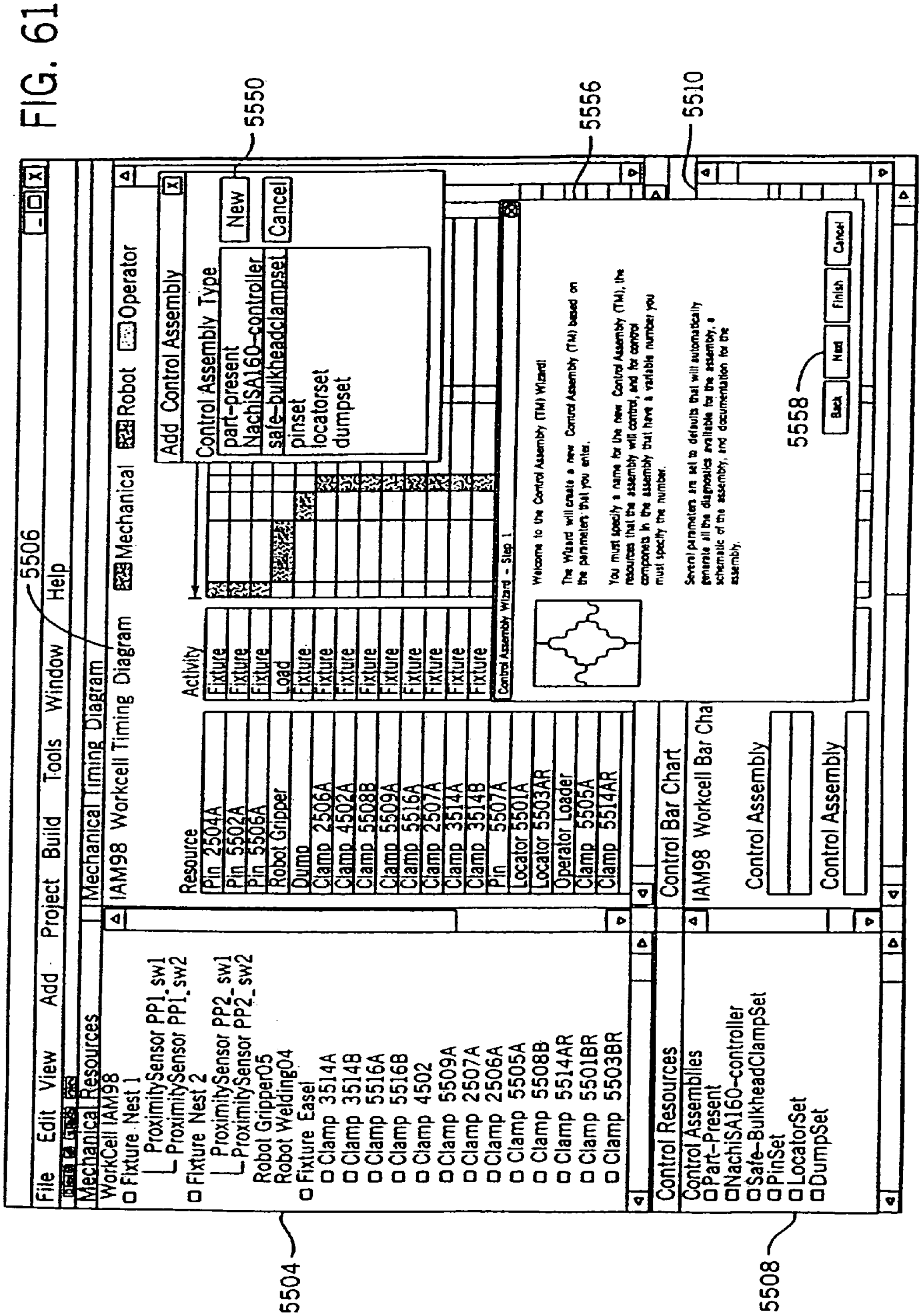
FIGS. 61 to 67 illustrate a user experience with a wizard in accordance with a preferred embodiment.

Referring to FIG. 61, when new icon 5550 is selected, an instructions window 5556 opens which helps guide the engineer through use of resource editor 9802. To this end, window 5556 indicates that a name must be specified for the specific CA instance being created or instantiated, the resources that will be controlled by the CA must be specified and, for control devices in the CA which have a variable number, the number of control devices to be included in the CA must be specified.

Figure 62:
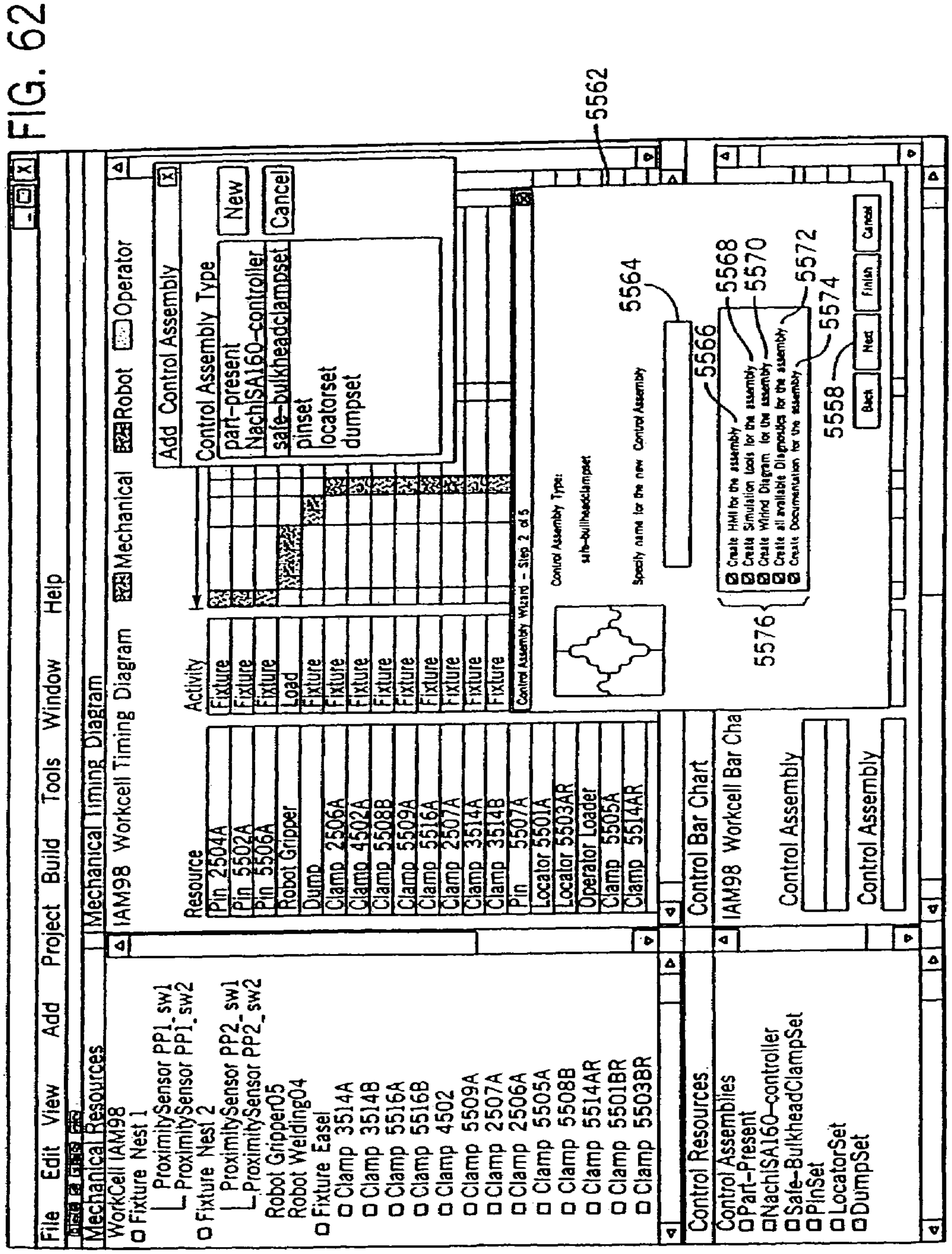

When a "next" icon 5558 is selected, referring to FIG. 62, a window 5562 opens up which includes a name field 5564 for specifying a name for the specific instance of the "safe bulk head clamp set" CA being instantiated. The engineer specifies the name in window 5564. In addition, window 5562 includes a plurality of different options and corresponding flag boxes for selecting those options for the CA. The options include specifying an HMI for the assembly 5566, specifying simulation tools for the assembly 5568, creating a wiring diagram for the assembly 5570, creating diagnostics for the assembly 5572 and creating documentation for the assembly 5574.

Flag boxes corresponding to the options 5560 through 5574 are identified generally by numeral 5576. When a flag appears in one of flag boxes 5576, the function associated therewith is requested. Initially it is assumed that each of flag boxes 5576 includes a flag so that, initially, each of the options 5560 through 5574 is initially selected.

To deselect one of the functions, the mouse controlled cursor is positioned within a particular flag box 5576 and a mouse selection button is activated at which point the flag is removed from the box. Once the flags in boxes 5576 have been set as desired and a name has been provided in box 5564, "next" icon 5558 is again selected.

Figure 63:
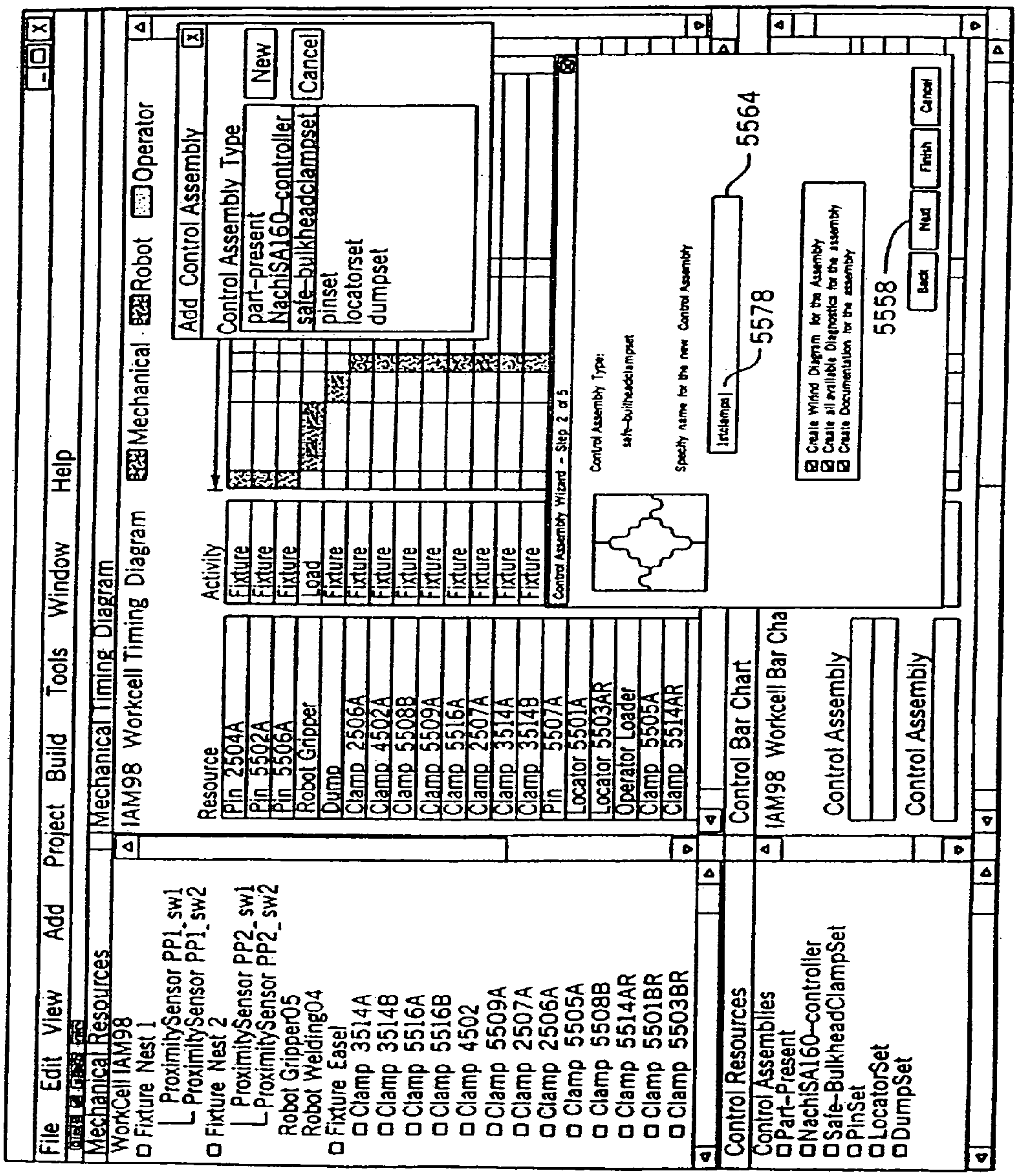

As illustrated in FIG. 63, in the present example, the CA instance name 5578 provided in box 5564 is "1stclamps". When "next" icon 5558 is selected, referring to 64, another window 5580 is provided which includes a mechanical resource list window 5582 and a selected resource list window 5584 along with "add" and "delete" icons 5586 and 5588, respectively.

As indicated above with respect to FIG. 60, when the "SafeBulkHeadClampSet" CA type was selected (see FIG. 60), resource editor 9802 automatically accessed the mechanical resource list in window 5504 and identified each mechanical resource in window 5504 which could possibly be controlled via the selected CA type. For example, in the present case, because the "SafeBulkHeadClampSet" CA type 5554 was selected, editor 9802 searched the resource list in window 5504 and identified every clamp within window 5504 to form a list of possible mechanical resources to be controlled by the particular instance of the "safe bulk head clamps set" CA. The list of clamps controllable by the first clamps control assembly is provided in mechanical resource list window 5582. Initially, selected resource list 5584 is blank.

To select clamps from the list in window 5582 to be added to the selected resource list window 5584, an engineer uses a mouse controlled cursor to highlight one or more of the clamps in list 5582 and then selects "add" icon 5586. In the present example it is assumed that a CA is only capable of controlling a maximum of four clamps at one time. Thus, referring to FIG. 65, after four clamps 5590, 5592, 5594 and 5596 have been added to list window 5584, no more clamps can be added. To remove a clamp from window 5584 and hence deselect the clamp, the clamp is highlighted in window 5584 and the "delete" icon 5588 is selected.

Figure 65:
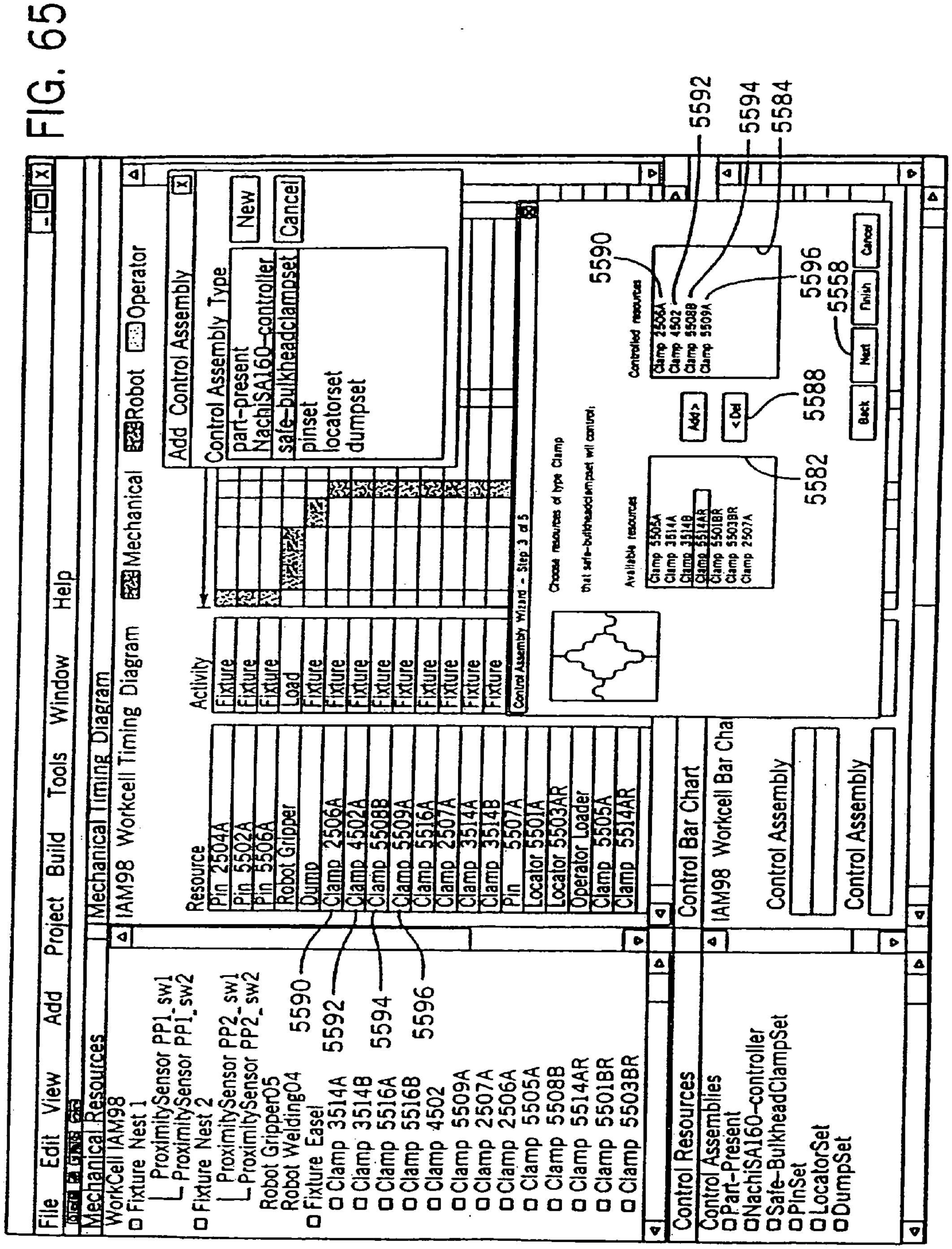

Referring now to FIGS. 65 and 85, each time a clamp is added to list 5584, a flag is provided in another one of flag boxes 9482*a*, 9484*a* or 9486*a* to select an additional set of cylindicator logic for instantiation in the CA logic specification 9002. In addition, a clamp indicator name indicating a specific clamp associated with the cylindicator logic is provided. For example, 1st cylindicator 9425 is labeled "clamp 2506A", 2nd cylindicator 9427 is labeled "clamp 4502" and so on. Therefore, at the end of adding each of clamps 5590, 5592, 5594 and 5596 to list 5584, four distinct sets of cylindicator logic corresponding to cylindicators 9425, 9427, 9429 and 9431 are instantiated in logic specification 9002.

Referring to FIGS. 85 and 85 A, when a flag is provided in one of boxes 9482*a*, 9484*a* or 9486*a*, a flag is also provided in a corresponding selection box 9482*f*, 9484*f* and 9486*f*, respectively. Flags in boxes 9482*f*, 9484*f* and 9486*f* indicate that corresponding cylindicators 9427, 9429 and 9431, respectively, will be represented in a compiled schematic.

In addition, referring to FIGS. 65, 85 and 86, each time a clamp is added to list 5584 so that a flag is provided in one of boxes 9482*a*, 9484*a* or 9486*a*, a flag is also provided in a corresponding flag box 9482*b*, 9484*b* or 9486*b*, respectively. These flags indicate that additional monitorable I/O and controllable outputs/requests corresponding to the second through fourth cylindicators 9427, 9429 and 9431, respectively, should be designated for presentation during subsequent HMI feature selection using the HMI editor 9804 described below.

Moreover, referring to FIGS. 65, 85 and 87, each time a flag is provided in one of boxes 9482*a*, 9484*a* or 9486*a*, a flag is provided in a flag box 9482*c*, 9484*c* or 9486*c* corresponding to an associated cylindicator listed in column 9602. The flags in column 9602 indicate that additional diagnostics corresponding to each of the flag cylindicators is designated for presentation during subsequent diagnostics feature selection using the diagnosis editor 9806 described below.

Furthermore, referring to FIGS. 65 and 88, each time a clamp is added to list 5584 so that a flag is provided in one of boxes 9482*a*, 9484*a* or 9486*a*, corresponding flags are provided in flag boxes in simulation specification 9300. For example, if a flag is placed in box 9482*a* corresponding to second cylindicator 9427, corresponding flags are placed in boxes 9482*d* and 9482*e* which likewise correspond to second cylindicator 9427. Flags in boxes 9482*d* and 9482*e* indicate instantiation of the information in tables 9303 and 9305 for subsequent compilation.

In addition, when a table in specification 9300 is instantiated, the name mechanical resource to be controlled by a cylindicator corresponding to the table is added to the table. For example, resource name "clamp 2506A" is added to tables 9302 and 9304 corresponding to 1st cylindicator 9425 which will control clamp 2506 A, resource name "clamp 4502" is added to tables 9303 and 9305 corresponding to 2nd cylindicator 9427 which will control clamp 4502. Similarly, resource names corresponding to clamps 5508B and 5509A are provided for 3rd and 4th cylindicator tables like tables 9302 and 9304.

Figure 66:
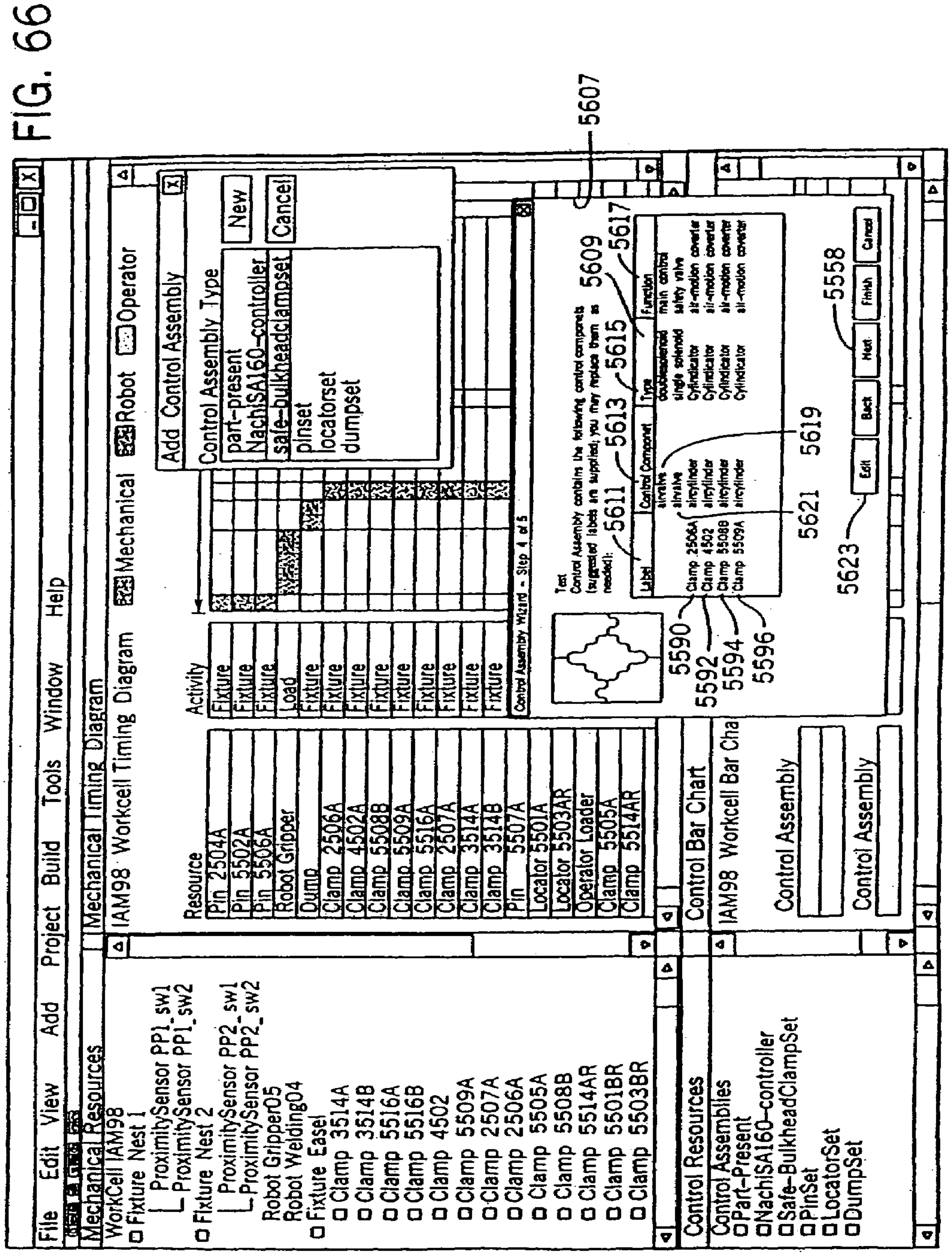

Referring to FIGS. 65 and 66, after clamps 5590, 5592, 5594 and 5596 have been added to list 5584, the control engineer may select "next" icon 5558 which opens a 1stclamps summary window 5607. Summary window 5607 includes a summary table 5609 including a label column 5611, a control component column 5613, a type column 5615 and a function column 5617. Label column 5611 lists each of the mechanical resources which are to be controlled by the "1stclamps" CA and therefore includes clamps 5590, 5592, 5594 and 5596.

Control component column 5613 lists all of the control components or control mechanisms which are controlled by the "1stclamps" CA and correlates control components with mechanical resources in column 5611. To this end, a separate air cylinder is correlated with each of clamps 5590, 5592, 5594 and 5596. In addition, air valves 5619 and 5621 corresponding to the two position valve 9421 and the spring return valve 9423 (see FIG. 85) are also provided in column 5613.

Type column 5615 lists control mechanism types corresponding to each of the control components in column 5613 and, to this end, lists a double solenoid corresponding to air valve 5619, a single solenoid corresponding to air valve 5621 and separate cylindicators corresponding to each of the air cylinders in column 5613.

Function column 5617 lists the function of each of the control components in column 5613. To this end, column 5617 indicates that air valve 5619 provides main control for the "1stclamps" CA, that air valve 5621 is a safety valve and that each of the air cylinders in column 5613 is provided as an air-motion converter. Thus, table 5609 simply summarizes the various control components, their types and functions which have already been specified with respect to the "1stclamps" CA.

To further parameterize the "1stclamps" CA, the control engineer may select "edit" icon 5623. Referring to FIGS. 66 and 85, when "edit" icon 5623 is selected, an editing window 5625 is opened which enables the control engineer to further parameterize the "1stclamps" CA. To this end, window 5625 essentially displays all of the logic in the "1stclamps" CA logic specification 9002 including each of the control devices (i.e. two position valve 9421, spring return valve 9423, and first through fourth cylindicators 9425, 9427, 9429 and 9431), each of their inputs and outputs, the extend logic and retract logic charts and properties sections 9036 and 9066. Various types of parameterization can be performed using window 5625 and a mouse controlled cursor. To this end, using the mouse controlled cursor, an engineer can modify any of the latch, restart, or inverse request properties in properties sections 9036 and 9066 by either placing flags in flag boxes 9051, 9053, etc., or removing flags from those boxes. In addition, the control engineer can select or deselect any of the spring return valve 9423, cylindicator 9427, cylindicator 9429, or cylindicator 9431 by placing flags in or removing flags from boxes 9480*a*, 9482*a*, 9484*a* or 9486*a*, respectively. As indicated above, flag manipulation in boxes 9480*a*, 9482*a*, 9484*a* and 9486*a* ripples through other CA specifications (see FIGS. 85A, 86, 87 and 88). Referring still to FIG. 85, after properties within sections 9036 and 9066 have been set as desired and the control devices have been selected as desired, the control engineer may select the "back" icon 5631 to return to summary window 5607 illustrated in FIG. 66. Although not illustrated, when the engineer returns to window 5607, if the spring return valve 9423 has been deselected, air cylinder 5621 and other information within table 5609 corresponding thereto will not appear within table 5609 or, may appear in a form which is recognizable as a form indicating a deselected control component and corresponding information (i.e. air valve 5621 and information corresponding thereto may be highlighted in some manner). Hereinafter it will be assumed that the control engineer does not de-select valve 9423 and therefore valve 9423 remains instantiated in the 1stclamps CA instance.

Figure 67:
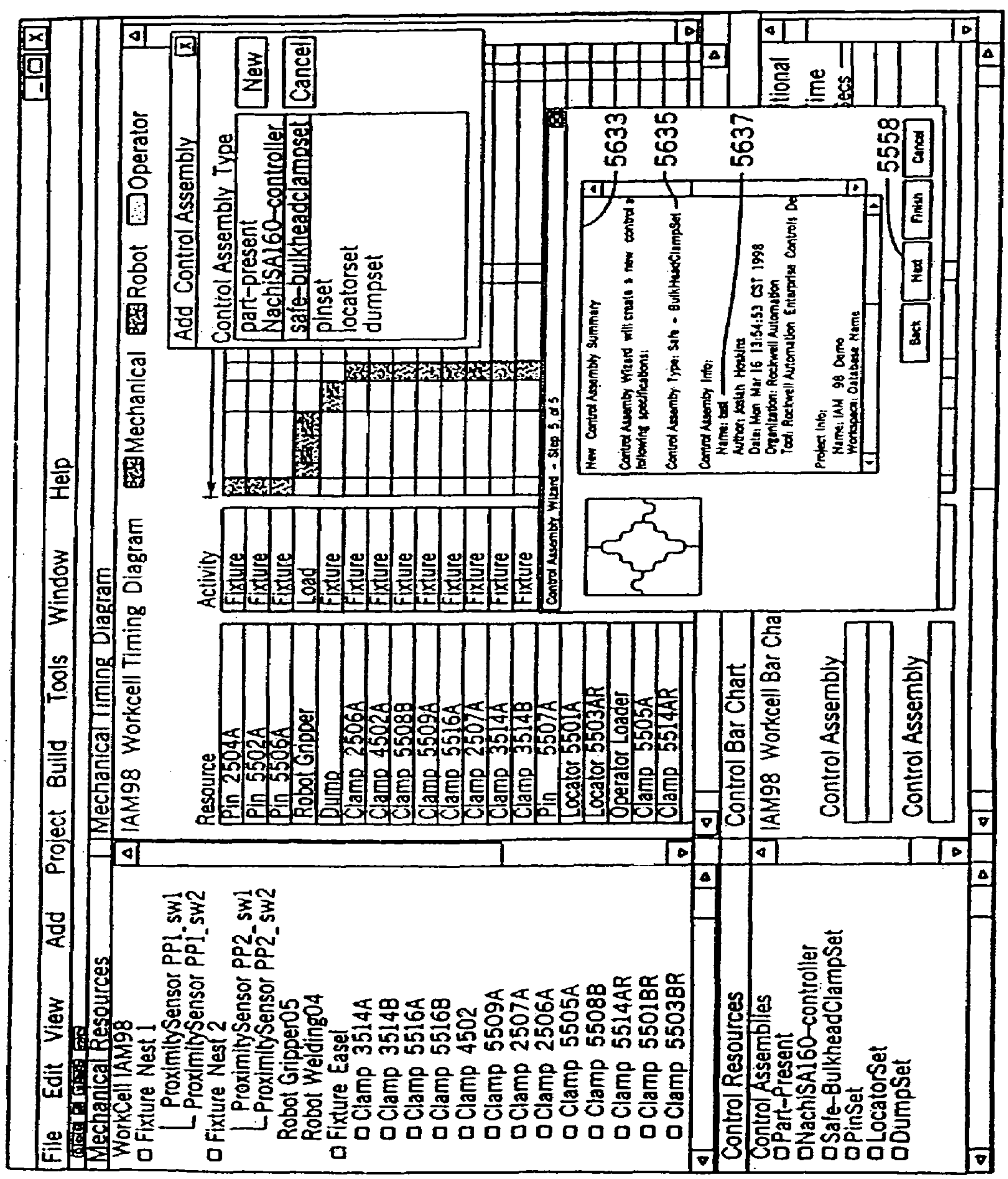

Referring to FIG. 66, to continue, the control engineer selects "next" icon 5558 which opens a completed assembly summary window 5633 illustrated in FIG. 67. Window 5633 specifies the new control assembly type as a "SafeBulkHeadClampSet" 5635 type, the instance of which is named "1stclamps" 5637. In addition, window 5633 also provides information about the CA instance author, the date of instantiation, and other useful information corresponding to the "1stclamps" CA.

Figure 92:
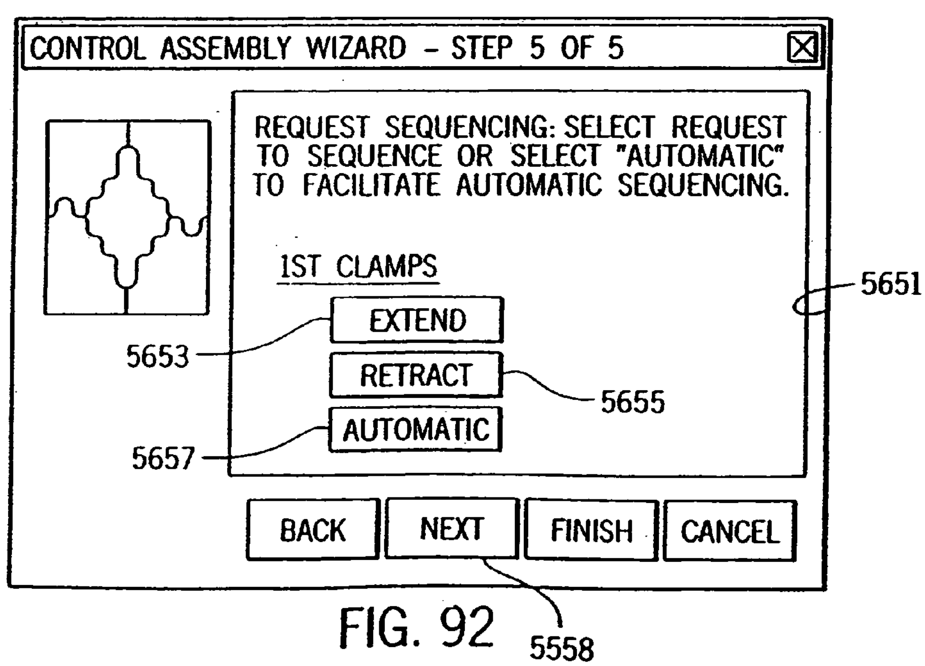
FIG. 92 is a schematic illustrating an exemplary resource editor window according to the present invention.

Referring to FIGS. 67 and 92, after confirming the correctness of all of the information in window 5633, the control engineer selects "next" icon 5558 which opens a sequencing window 5651. Window 5651 provides instructions to the engineer indicating that the engineer may either manually sequence 1stclamps CA instance requests or, in the alternative, may allow the resource editor 9802 to automatically sequence the 1stclamps requests. To this end, editor 9802 provides an icon for each possible 1stclamps CA request and an "automatic" icon 5657. Referring again to FIG. 85, because the 1stclamps CA only includes extend and retract requests 9031, 9033, respectively, editor 9802 provides an "extend" icon 5653 and a "retract" icon 5655 within window 5651.

To manually place the "1stclamps" "extend" request within the control bar chart in window 5510, the control engineer selects "extend" icon 5653. Referring also to FIG. 59, after selecting "extend" icon 5653, the control engineer uses a mouse controlled cursor to select either a space or an edge within bar chart 5830 for placement of the extend request. In FIG. 59, exemplary edges are identified by numerals 5529 and 5527 which define an empty space 5531 therebetween. In the present example, it will be assumed that the engineer selects space 5531 by placing the cursor therein and activating a mouse selection button. When space 5531 is selected, referring also to FIG. 69, editor 9802 places a black bar within space 5531, identifies 1stclamps in control assembly column 5522 and identifies extend request 7001 in the request column 5524. A similar manual operation can be performed to place the 1stclamps retract request in bar chart 5830, a black bar corresponding thereto placed in space 5671 is illustrated in FIG. 70. In the alternative, referring again to FIGS. 90 and 92, by selecting "automatic" icon 5657, the control engineer causes resource editor 9802 to automatically sequence both the 1stclamps "extend" and "retract" requests. To this end, when "automatic" icon 5657 is selected, referring also to FIG. 70, editor 9802 automatically sequences the 1stclamps "extend" request with the period in mechanical timing diagram 5820 corresponding to extension of the clamps 5590, 5592, 5594 and 5596 in the 1stclamps CA. To this end, the clamp extension period is identified in mechanical timing diagram 5820 as period 5673. Therefore, because space 5531 corresponds to period 5673, editor 9802 automatically places a bar within space 5531, identifies 1stclamps in column 5522 and identifies "extend" request in column 5524. Similarly, editor 9802 automatically places the 1stclamps retract request in space 5671 corresponding to the period 5675 during which the clamps 5590, 5592, 5594 and 5596 associated with the 1stclamps CA retract.

Initially, it may appear as though manual sequencing of requests is not necessary and that an engineer should always allow resource editor 9802 to automatically sequence CA requests. While this may be true for simple devices such as a clamp or a pin locator, many other mechanical resources are much more complex and may perform separate requests during a complete manufacturing process, some of which are not reflected in the mechanical timing diagram 5820. For example, in the case of an exemplary robot, many robots are programmed to perform housekeeping requests at the beginning of each new manufacturing cycle (a manufacturing cycle corresponding to a single pass through mechanical timing diagram 5820). In this case, while the exemplary robot may perform a single "forward" request during a fifth mechanical timing diagram period and may perform a "reverse" request during a twelfth mechanical timing diagram period, it may be necessary for the robot to perform housekeeping functions/requests prior to the first period in the mechanical timing diagram 5820. In the alternative, it may be necessary for the robot to perform the housekeeping requests at some other time (e.g. between the third and fourth diagram periods) or more than once during a manufacturing cycle. In this case, the robot requests to be sequenced would include a housekeeping request, a "forward" request and a "reverse" request. While resource editor 9802 may be able to automatically place the forward and reverse requests as a function of the sequencing of similar activities in mechanical timing diagram 5820, editor 9802 would have no way of determining where to sequence the housekeeping request. Although not described here in detail other circumstances requiring manual placement of requests do occur.

Referring once again to FIG. 69, after the 1stclamps "extend" and "retract" requests have been placed within diagram 5830, the "1stclamps" CA instance of the "SafeBulkHeadClampSet" template type is identified within control resources window 5508 as"1stclamps" 6910 in a hierarchal fashion and the "extend" and "retract" requests are placed under 1stclamps 6910 as requests 6911 and 6913, respectively.

Figure 71:
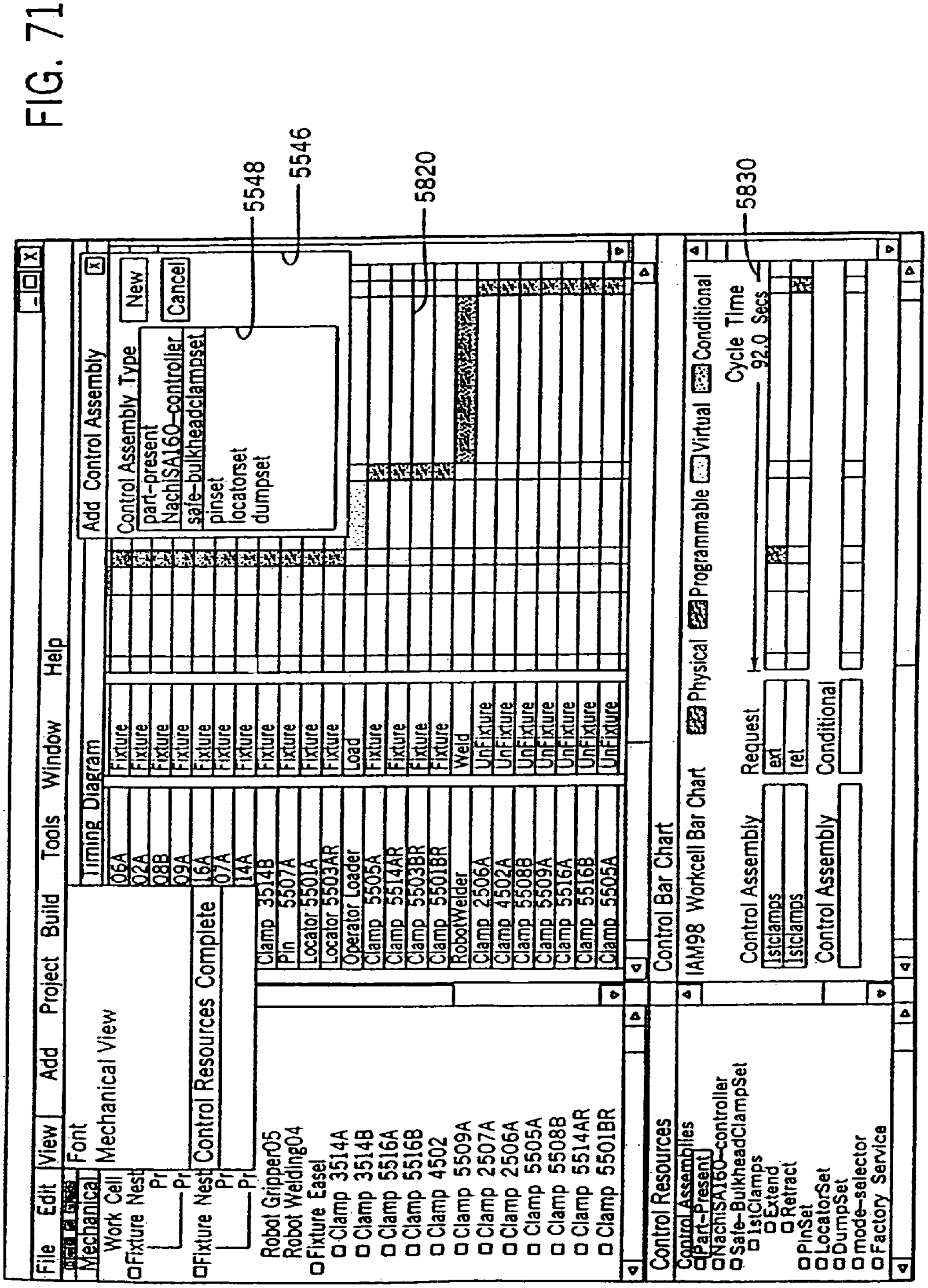
FIGS. 71 to 79 provide additional displays in accordance with a preferred embodiment.

Referring now to FIG. 71, after the 1stclamps "extend" and "retract" requests have been sequenced within diagram 5830, the control engineer again access window 5546 to select another control assembly type from list 5548 for controlling additional mechanical resources in diagram 5820. The process described above is repeated until CA instances have been instantiated (i.e. specified, parameterized and sequenced) for every mechanical resource in diagram 5820. An exemplary completed control bar chart 5830 is illustrated in FIG. 72.

Figure 72:
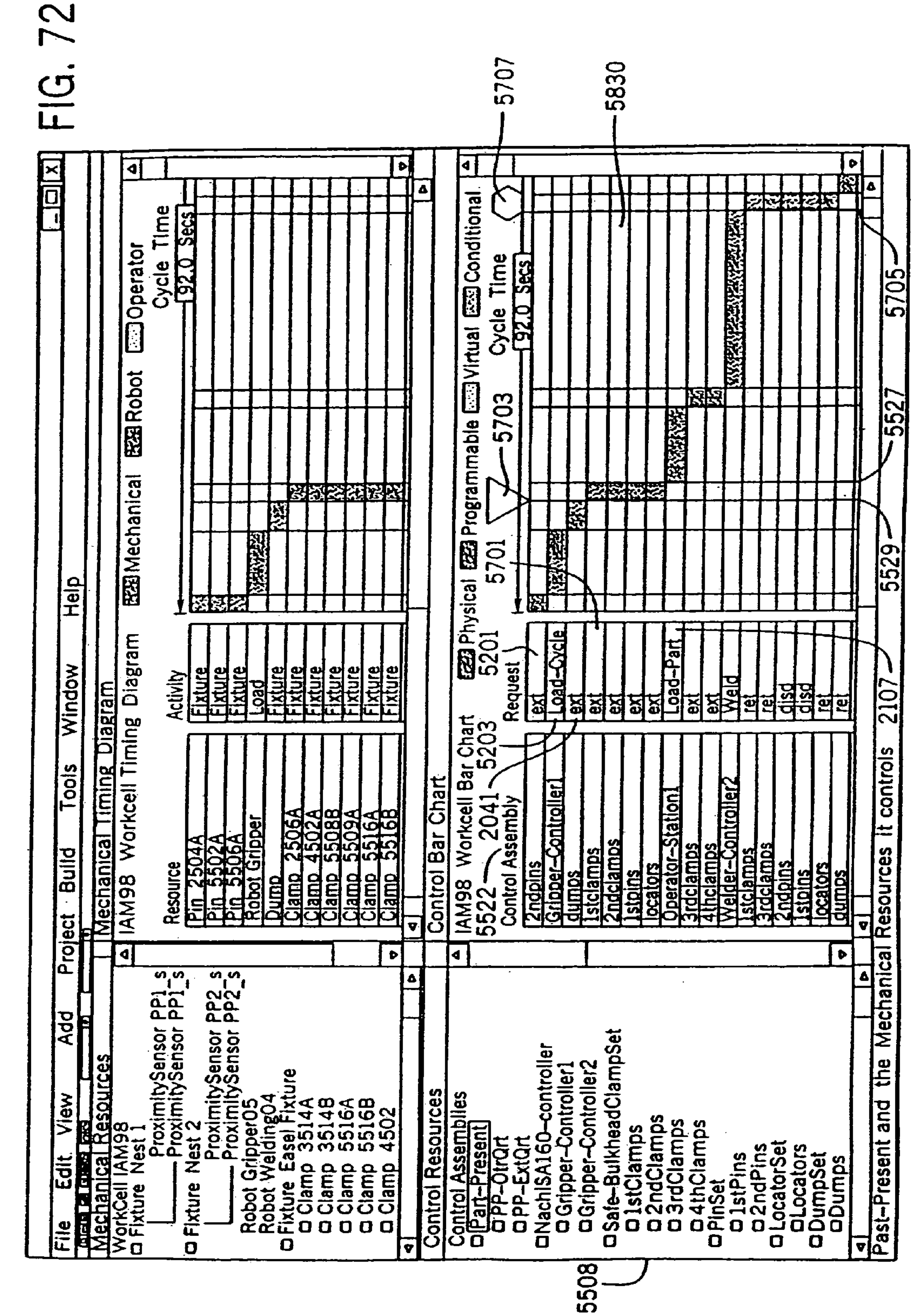
Figure 73:
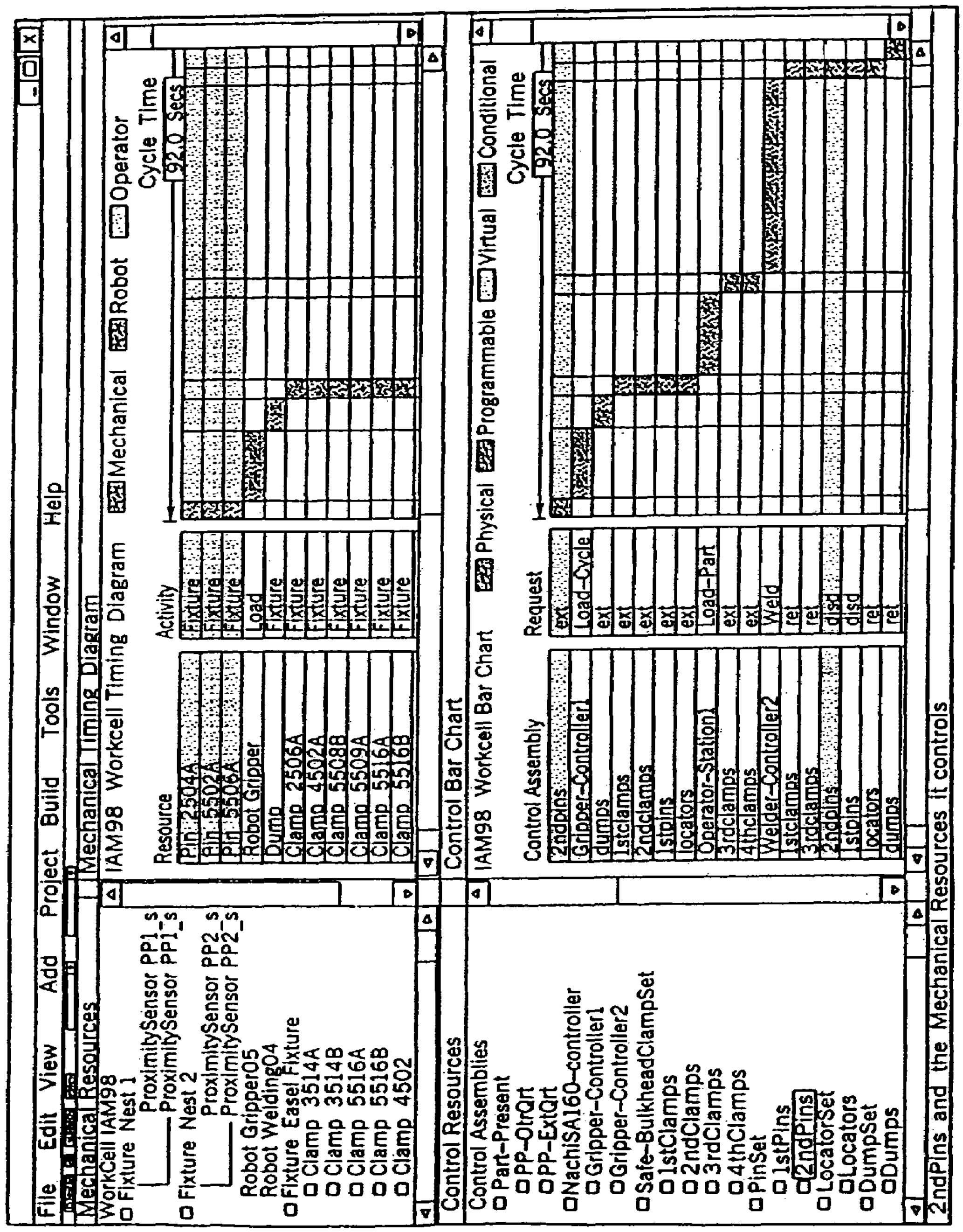
Figure 74:
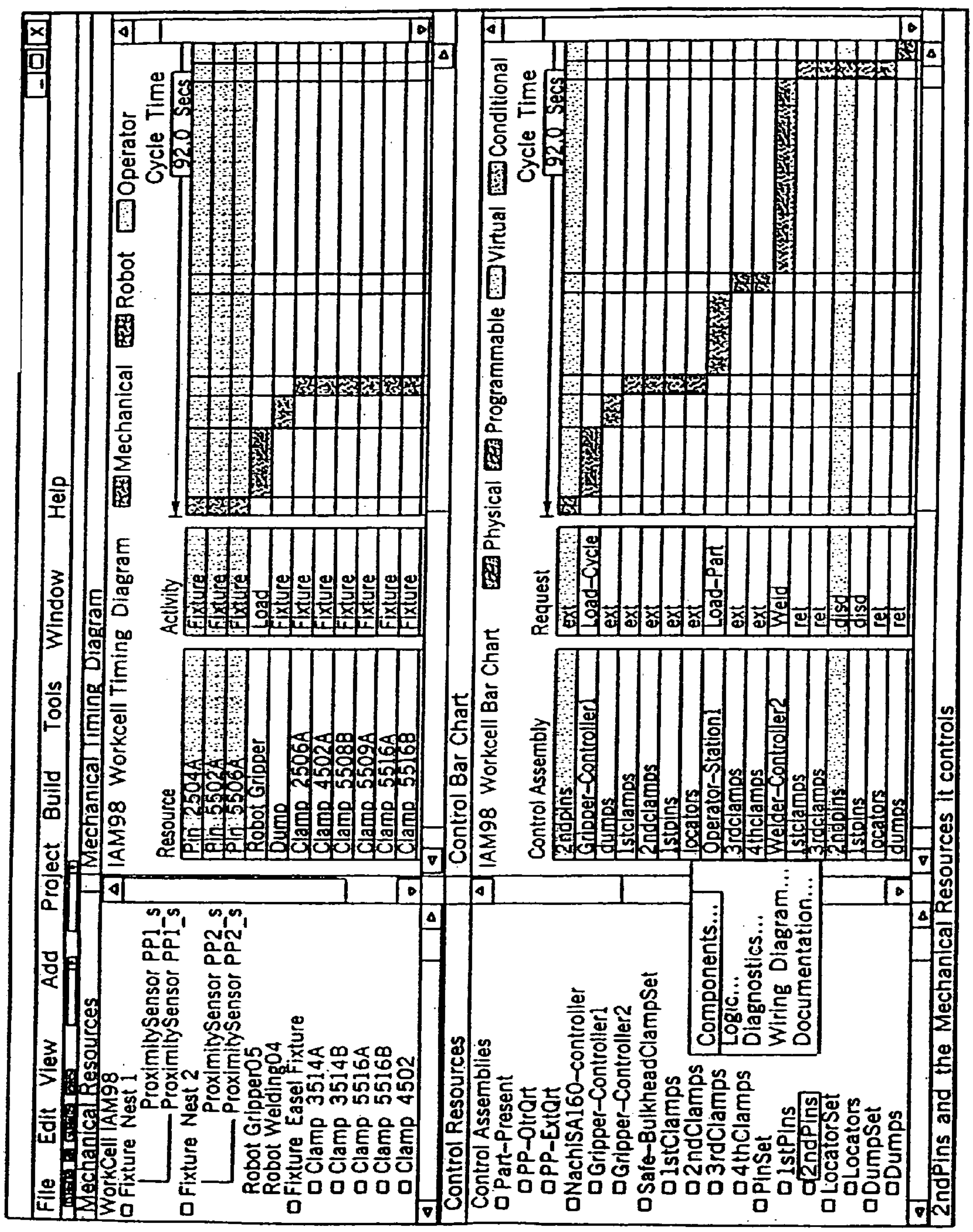
Figure 75:
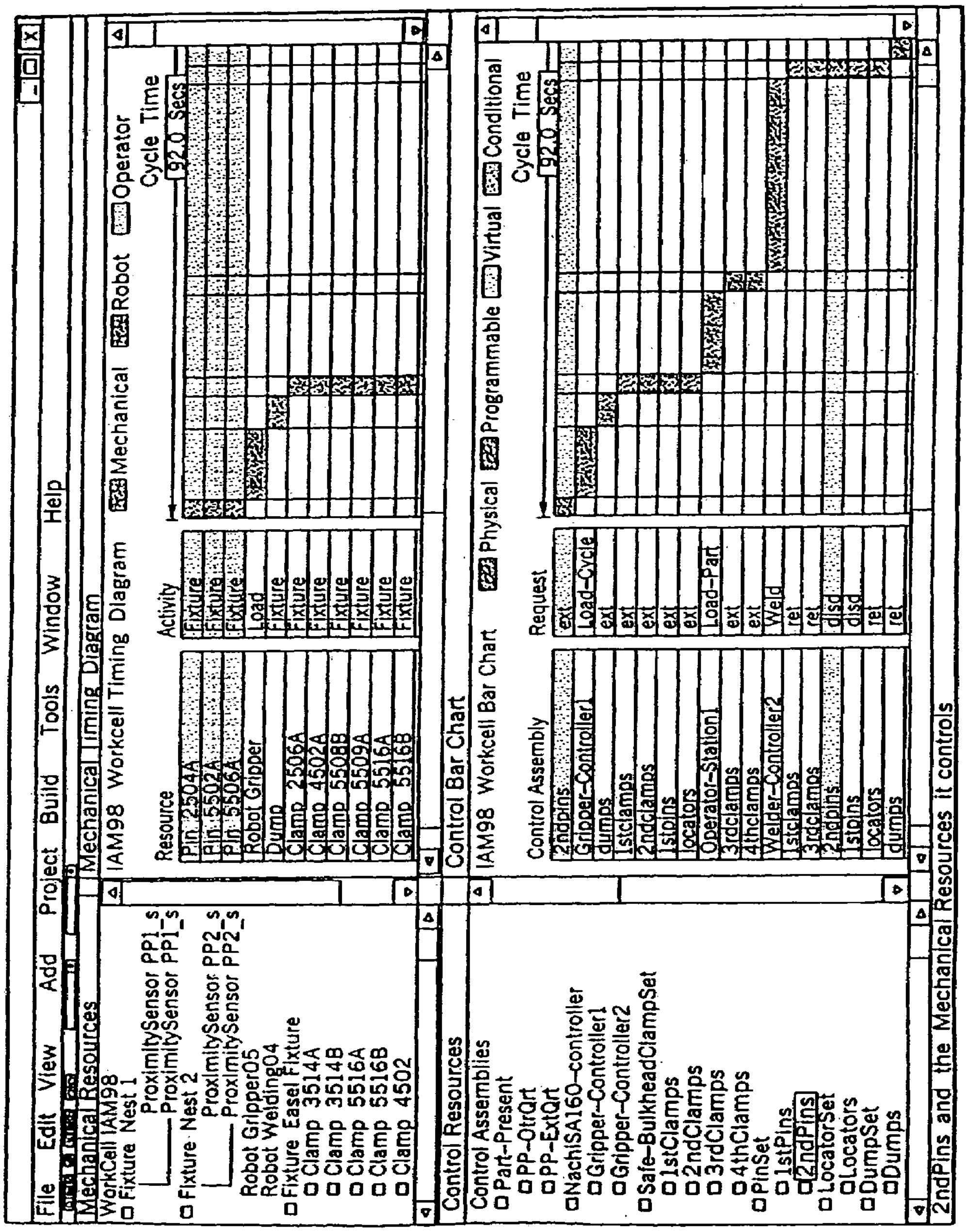
Figure 76:
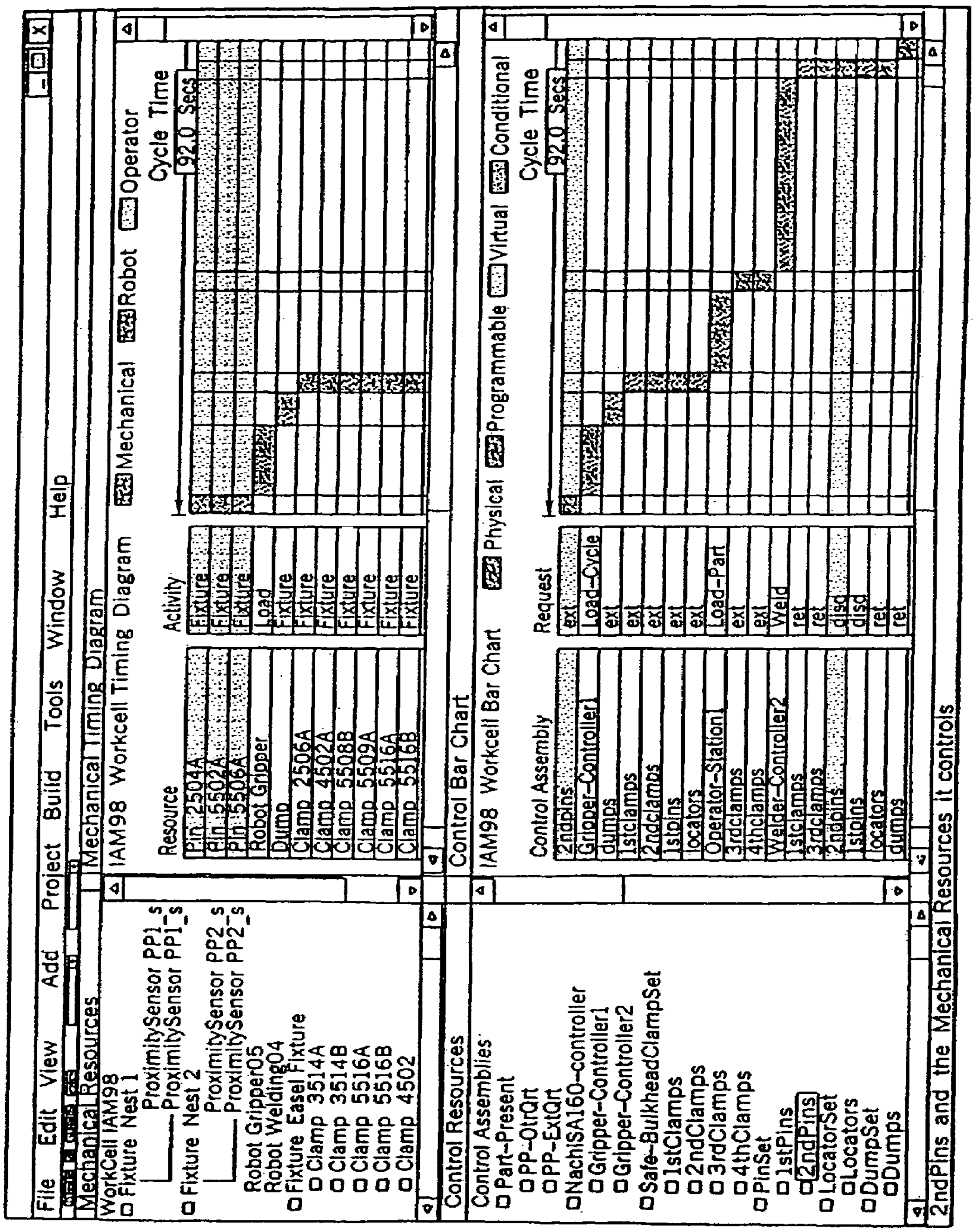
Figure 77:
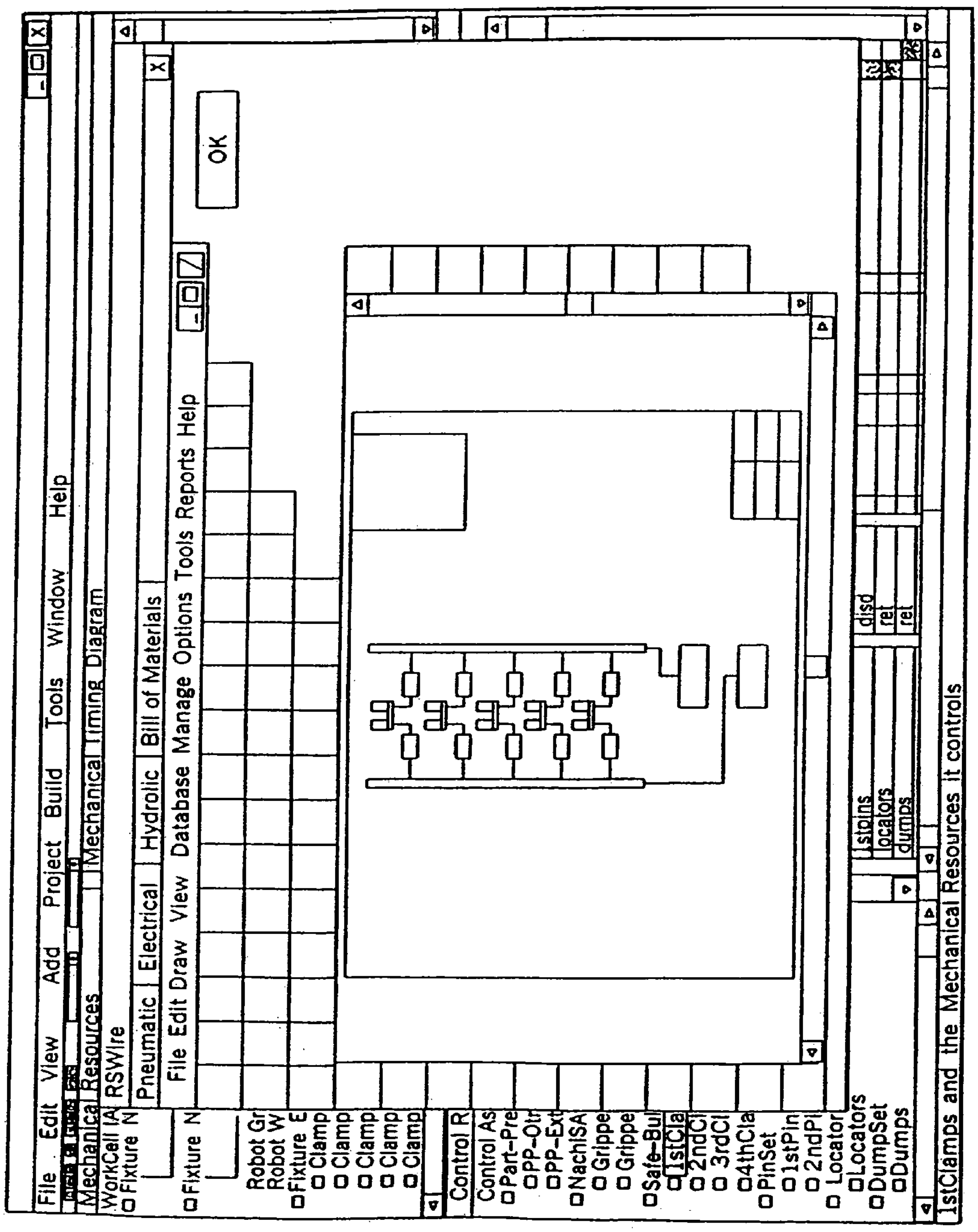
Figure 78:
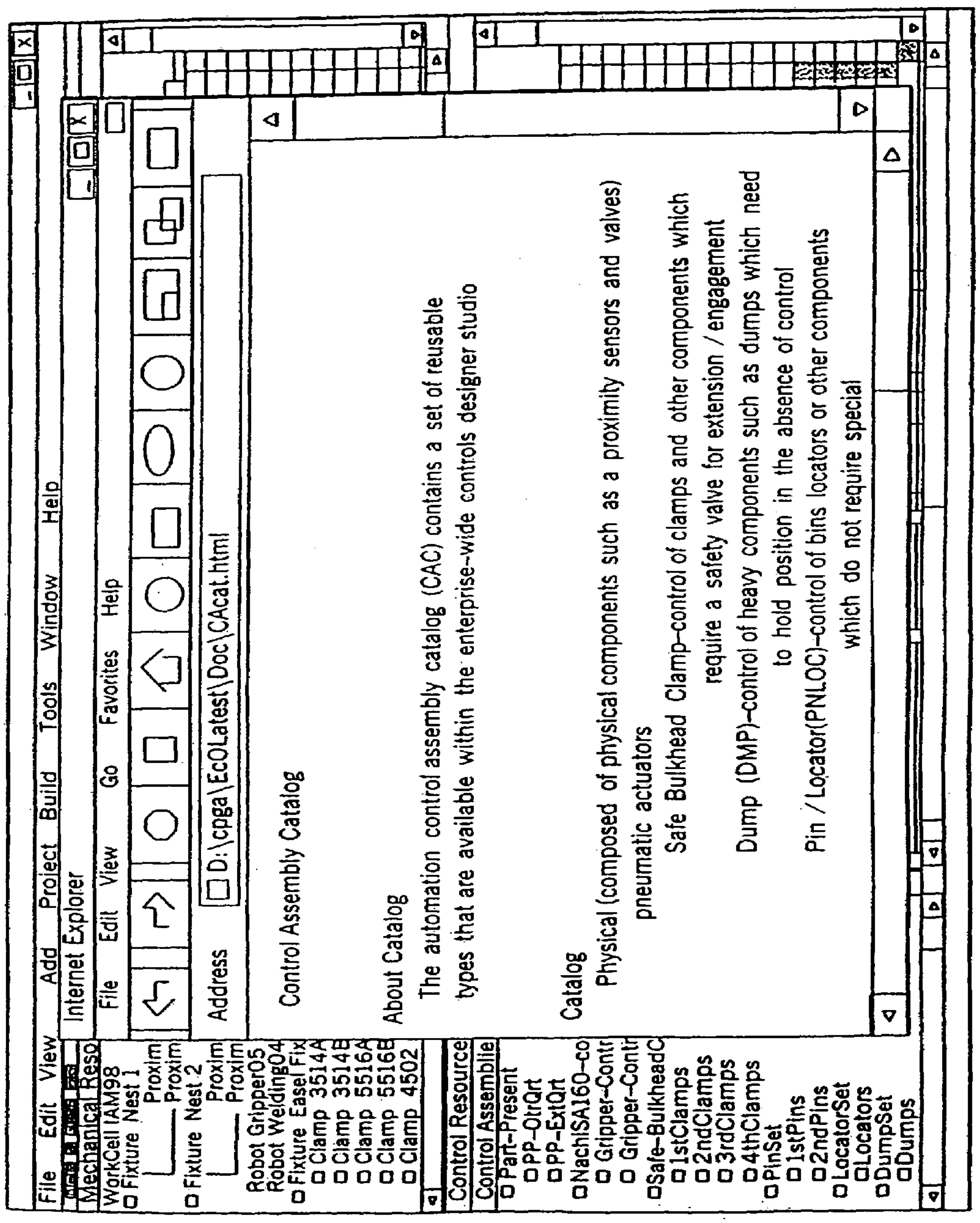
Figure 79:
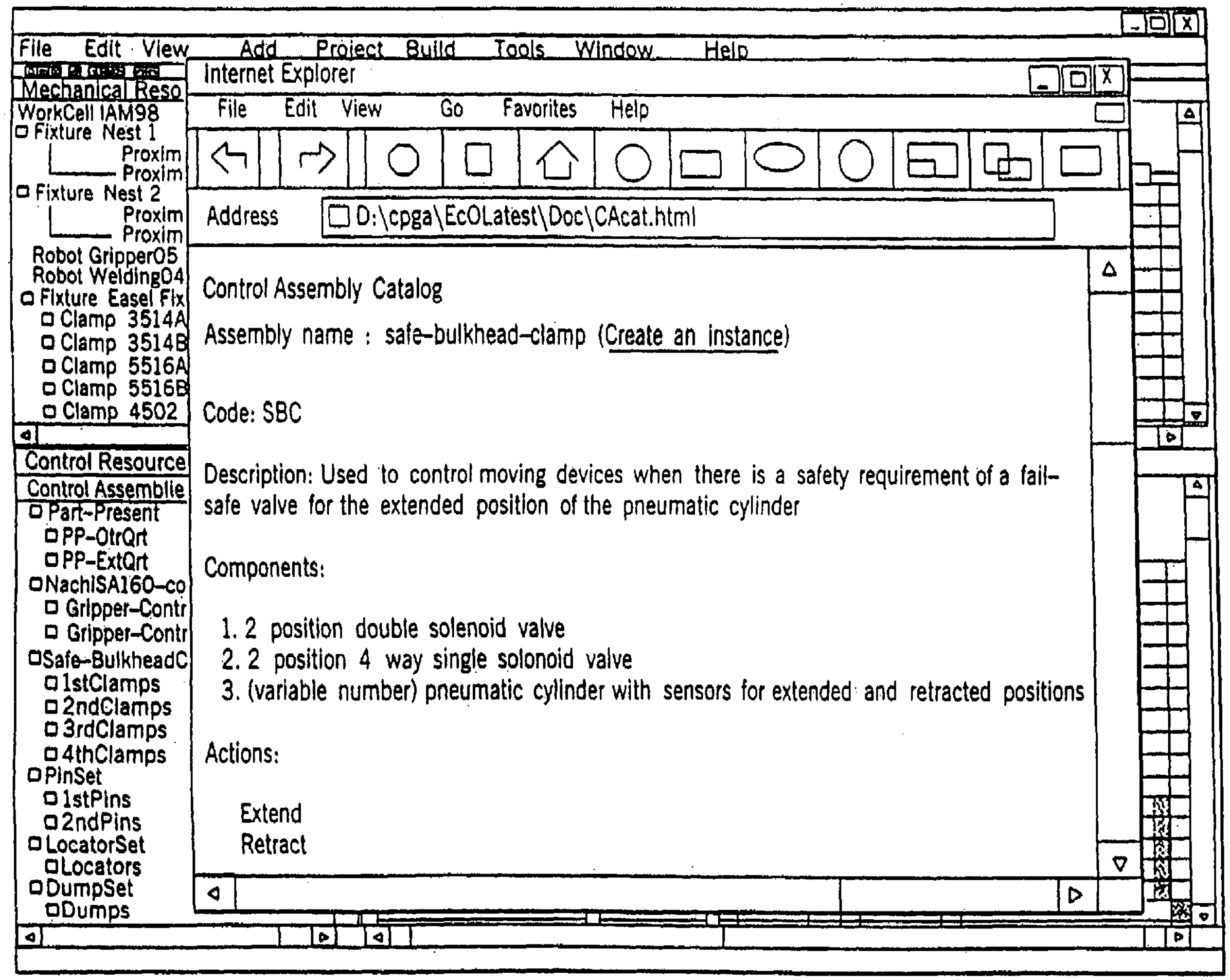
Figure 93:
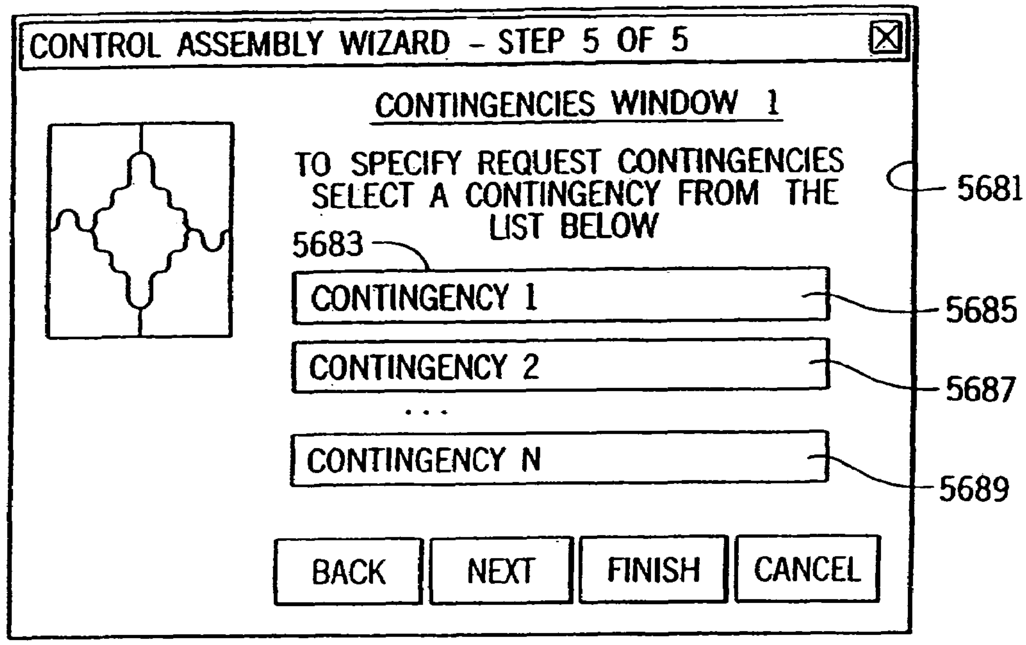
FIG. 93 is similar to FIG. 92, albeit illustrating a second editor window.

Referring to FIGS. 72 and 92, after CA sequencing the control engineer again selects "next" icon 5558 which, as illustrated in FIG. 93, opens up a contingencies window 5681. Window 5681 includes a list 5683 of contingencies 5685, 5687, . . . 5689 upon which a request may be made contingent. Generally, resource editor 9802 generates contingency list 5683 by gleaning the "done" I/O combinations corresponding to every CA request for every CA included in list 5522 (see FIG. 72). For example, referring also to FIG. 85, the done condition 5691 corresponding to the 1stclamps extend request 9031 requires active solenoid outputs O1, O2, O5 and O6, passive solenoid outputs O3 and O4, active proximity sensor inputs I1, I3, I5 and I7 and passive proximity sensor inputs I2, I4, I6 and I8. Other contingencies, in addition to done I/O combinations may also be specified within list 5683. For example, referring again to FIG. 85, another exemplary contingency may simply require that outputs O1 and O2 be active and may be independent of the condition of other outputs and cylindicator inputs in the 1stclamps CA instance which contingencies are provided in list 5683 is a matter of CA designer choice.

Figure 94:
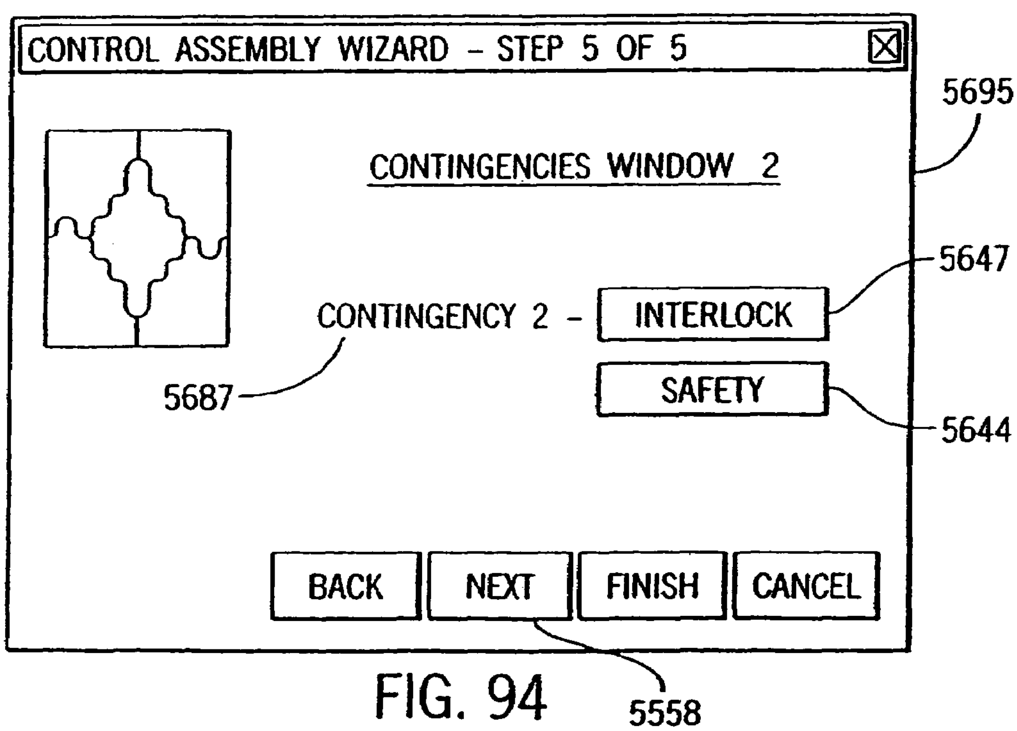
FIG. 94 is similar to FIG. 92, albeit illustrating yet another editor window.

Referring to FIGS. 93 and 94 after a contingency from list 5683 has been selected, a second contingencies window 5695 opens. In the present example, it is assumed that the second contingency 5687 has been selected from list 5683 and therefore, the second contingency 5687 is indicated in window 5695. In addition, editor 9802 provides an "interlock" icon 5697 and a "safety" icon 5699 adjacent contingency 5687 in window 5695.

On one hand an interlock is a contingency which must be met and must exist at the beginning of a request subject thereto but need not continue to exist during performance of the request. For example, an interlock may require that a clamp be parked in a retracted position prior to a transfer bar moving a work piece adjacent thereto. After the transfer bar begins to move, continued transfer bar movement does not required that the clamp remain parked. On the other hand a safety is a contingency which must exist at the beginning of, and must continue to exist during the course of, a request which is subject thereto. For example, if a parked clamp is a safety linked to transfer bar movement, as a transfer bar moves, if the clamp is moved, the transfer bar is immediately stopped.

Referring again to FIG. 93, any of the contingencies in list 5683 may be labeled as either an interlock or a safety. Referring also to FIGS. 94 and 72, assuming "interlock" icon 5697 is selected, editor 9802 provides bar chart 5830 as illustrated and allows the control engineer to select any edge (e.g. 5529, 5527, etc.) by placing a mouse controlled cursor on the edge and activating a mouse selection button. For example if the second contingency corresponds to a parked transfer bar and the control engineer wishes to make the 1stclamps "extend" request 5701 contingent upon the transfer bar being parked, the control engineer may select edge 5529.

Referring still to FIG. 72, when an edge is selected for placement of an interlock or a safety, preferably some contingency indication is added to control bar chart 5830. To this end, in the present example, a "yield" icon 5703 is provided at the top of bar chart 5830 which is linked to the selected edge 5529. It is contemplated that, if icon 5703 is selected by an engineer, editor 9802 will open another window (not illustrated) which will specify the nature of the interlock associated with the corresponding edge.

Referring to FIGS. 72 and 94, by selecting "safety" icon 5699, a procedure similar to the procedure described above for selecting an edge for an interlock is used to select an edge for the safety. In FIG. 72 it is assumed that edge 5705 is selected for the safety. In this case, instead of providing a "yield" icon 5703, where a safety is associated with an edge, a "stop" icon 5707 is provided which is linked to the selected edge (see 5705 ). Once again, if an engineer selects icon 5707, editor 9802 opens a window (not illustrated) which specifies the nature of the safety associated with the corresponding edge.

Referring still to FIG. 72, while only a single interlock contingency 5703 and a single safety contingency 5707 are illustrated, many different contingencies may be added to bar chart 5830. In addition, it is contemplated that more than a single interlock or safety or, indeed, both interlocks and safeties may be linked to a single edge. Where both interlocks and safeties are linked to a single edge, editor 9802 provides both a "yield" icon and a "stop" icon above the corresponding edge. In addition, is should be appreciated that other way to indicate interlocks and safeties and specifying interlocks and safeties are contemplated by the present invention and that the present invention should not be limited by the description included herewith. For example, another way to indicate interlocks and safeties may be to provide a comment directly on bar chart 5830 which comprises text in a conditional horizontal space where the edge occurs.

b. HMI Editor

In addition to the logic and sequencing described above in the context of resource editor 9802, it is also necessary to specify features of each sequenced CA which are to be monitored and controlled via an HMI. For example, referring again to FIG. 86, with respect to the 1stclamps CA described above, while virtually all 1stclamps I/O may possibly be monitored and all 1stclamps outputs and extend and retract requests 9031, 9033 may be controllable, it is unlikely that a control engineer or a system operator would require or desire such extensive monitoring and control capabilities. Instead, in the context of the 1stclamps example, it is more likely that a system operator would only require or desire a sub-set of the I/O to be monitored and would only require a sub-set of the outputs and possible requests to be controllable. In the present example it will be assumed that the operator only requires controls for separately controlling the "extend" and "retract" requests and monitorable indicators to indicate the active/passive status of the first cylindicator 9425 inputs I1 and I2.

Figure 95:
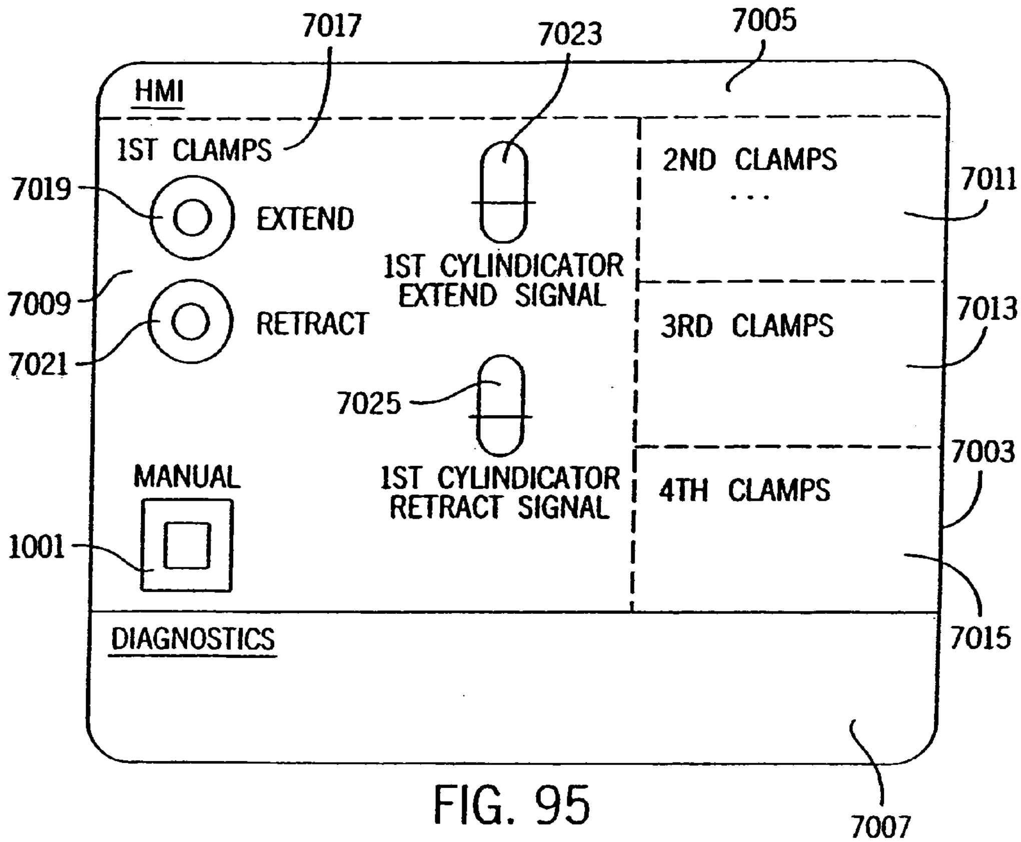
FIG. 95 is a schematic illustrating an exemplary HMI screen.

To this end, referring to FIG. 95, an exemplary HMI screen 7003 suitable for controlling and monitoring the 1stclamps CA in the manner indicated above is illustrated. Screen 7003 is divided into an HMI section 7005 and a diagnostic section 7007. HMI section, 7005 is divided into separate control sections 7009, 7011, 7013 and 7015. Diagnostic section 7007 is described in more detail below.

Referring also to FIG. 72, it is contemplated that HMI section 7005 may potentially include a separate controls section for each control assembly listed in control assembly column 5522. In the alternative, a control system may include a plurality of controls screens, a separate screen for controlling and monitoring each control assembly in column 5522 or to separate screens for controlling distinct sub-sets of the control assemblies is column 5522. In FIG. 95, only four control sections 7009, 7011, 7013 and 7015 are illustrated, the control sections 7009, 7011, 7013 and 7015 corresponding to the above described 1stclamps CA and 2nd, 3rd and 4th clamps CAS, respectively. Only control section 7009 is shown with some detail, sections 7011, 7013 and 7015 abbreviated to simplify the present explanation. Nevertheless, it should be understood that each of sections 7011, 7013 and 7015 and additional control sections (not illustrated) corresponding to other CA instances would include control tools and monitoring indicators of various types and configurations.

Referring still to FIG. 95, exemplary control section 7009 includes an indication 7017 of the CA instance (i.e. 1stclamps) which is controllable and monitorable via section 7009 and also includes control tools and monitoring indicators corresponding to the 1stclamps CA. To this end, the exemplary control section 7009 includes a virtual "extend" button icon 7019 and a virtual "retract" button icon 7021. It is contemplated that a mouse controlled cursor (not illustrated) can be used by a system operator to select either of icons 7019 or 7021 to cause the control mechanisms associated with the 1stclamps CA to force corresponding clamps into the extended and retracted positions, respectively. In the alternative, where a system is equipped with touch screen HMI's, each of icons 7014 and 7021 is selectable via touch.

In addition to icons 7019 and 7021, control section 7009 also provides a representation of each 1stclamps control device for which I/O is to be monitored. In the present example, referring again to FIG. 86 and also to FIG. 95, because it has been assumed that inputs I1 and I2 corresponding to the first cylindicator 9425 are to be monitored, the first cylindicator 9425 is identified in section 7009. Moreover, monitoring indicators, 7023 and 7025 are provided for first cylindicator 9425. Indicators 7023 and 7025 indicate extended and retracted first cylindicator conditions. Thus, extended and retracted 1st cylindicator labels are provided adjacent indicators 7023 and 7025, respectively.

It should be appreciated that while one configuration for an HMI is described above and with respect to FIG. 95, other HMI configurations are contemplated by the present invention and the invention should not be limited by the described configuration. To this end, it is contemplated that each CA is simply used to indicate I/O to be monitored and controlled and that the compiler 9812 (see FIG. 90) includes rules for specifying HMI configuration based on CA specified I/O which must be supported by an HMI.

In addition, referring again to FIG. 90 while the HMI editor 9804 could be entirely separate from resource editor 9802 and could be used after sequenced CAS have been compiled, in the present example, HMI editor 9804 will be described as an editor which can be used in a seamless manner to move from using resource editor 9802 to HMI tools for specifying I/O to be monitored and controlled. To this end, referring once again to FIG. 94, after all interlocks and safeties have been specified for sequenced CAS, the control engineer selects "next" icon 5558 once again. When icon 5558 is again selected, referring to FIG. 96, resource editor 9802 provides a window 7027 enabling the engineer to specify either HMI or diagnostics information. Window 7027 includes an "HMI" icon 7029 and a "diagnostics" icon 7031. By selecting "diagnostics" icon 7031 the engineer enters the diagnostics editor 9806 described in more detail below.

Figure 96:
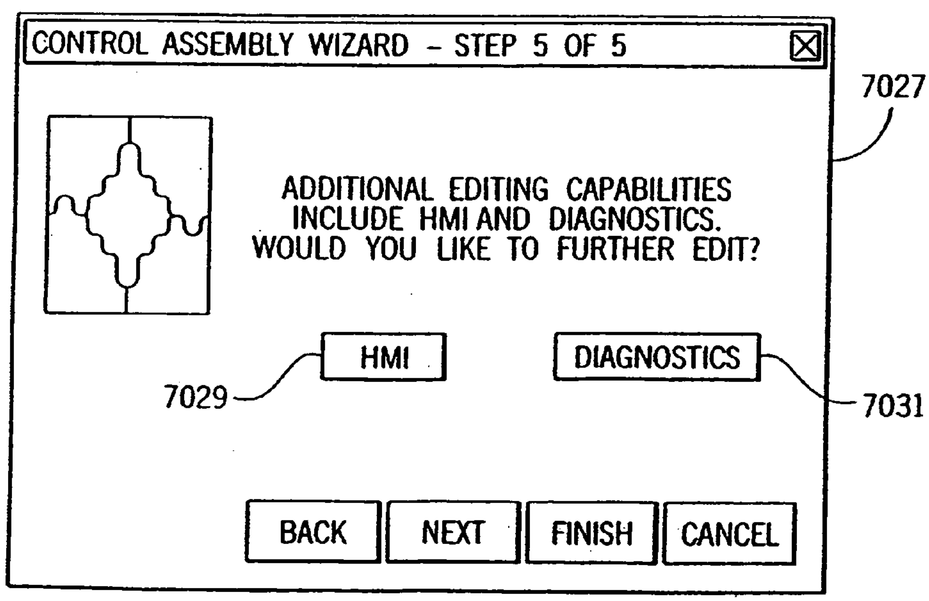
FIG. 96 is a schematic similar to FIG. 92, albeit illustrating yet another editor window.
Figure 97:
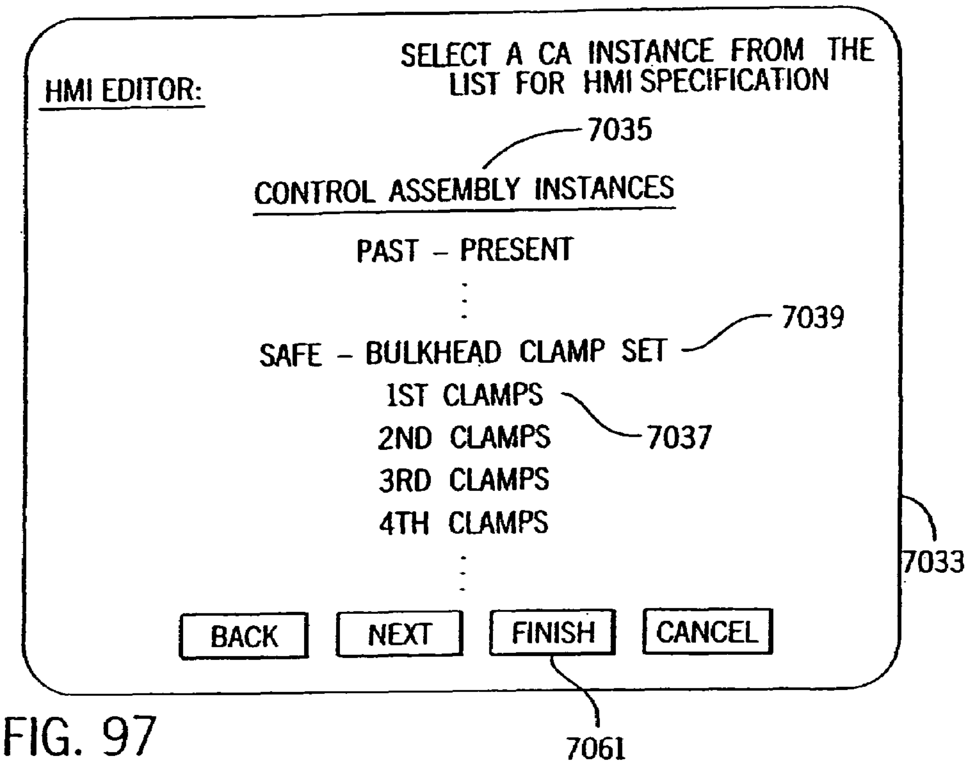
FIG. 97 is a schematic diagram illustrating an HMI editor screen according to the present invention.

Referring to FIGS. 96 and 97, when "HMI" icon 7029 is selected, control is shifted to HMI editor 9804 which provides-a first HMI editor screen 7033. Referring also to FIG. 72, list 7035 includes all of the CA instances grouped by CA type which appear in control resources window 5508. Thus, the 1stclamps CA instance 7037 appears along with the 2nd clamps, 3rd clamps and 4th clamps instances under the CA type "SafeBulkHeadClampSet" 7039 in list 7035. Once again a mouse controlled cursor (not illustrated) is used by the control engineer to select one of the CA instances at a time for identifying I/O to be monitored and controlled via an HMI to be subsequently configured by compiler 9812 (see FIG. 90).

Figure 98:
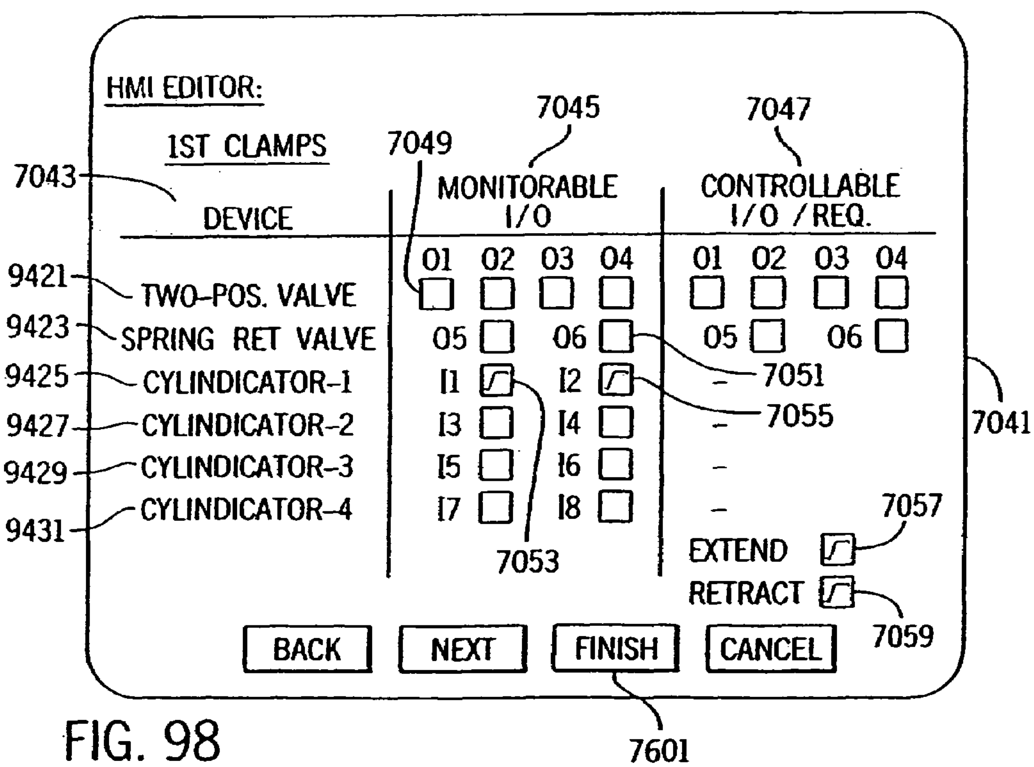
FIG. 98 is a schematic illustrating an HMI editor screen for selecting monitorable and controllable I/O.

Referring to FIGS. 97 and 98, when the control engineer selects the 1stclamps instance 7037, editor 9804 provides a second HMI screen 7041. Referring also to FIG. 86, it should be appreciated that the information provided on screen 7041 is similar to the information stored in HMI table 9460 including a device column 7043, a monitorable I/O column 7045 and a controllable outputs/requests column 7047.

While the information provided on screen 7041 appears similar to the information in table 9460, there are a number of important distinctions. First, referring to FIGS. 86 and 95, the information provided on screen 7041 reflects only required and selected control devices and corresponding monitorable and controllable I/O from table 9460. In the present example, both two position valve 9421 and cylindicators 9425 are required and therefore appear on screen 7041. Spring return valve 9423 has remained selected and each of the second through fourth cylindicators 9427, 9429 and 9431 have been selected and therefore each of those devices also appear in table 7041. However, if spring return valve 9423 had been de-selected (i.e. via box 9480 a in FIG. 85), spring return valve 9423 and corresponding monitorable and controllable I/O would not appear on screen 7041. Similarly, if one or more of the second, third or fourth cylindicators 9427, 9429 or 9431 had not been selected (i.e. via boxes 9482*a*, 9484*a* and 9486*a* in FIG. 85), the cylindicator(s) not selected and corresponding monitorable and controllable would not appear on screen 7041.

Second, at this point it is contemplated that the control devices for the 1stclamps CA instance have already been selected using resource editor 9802 and therefore, cannot be selected or de-selected using the HMI editor 9804. Therefore, while flag boxes 9480*b*, 9482*b*, 9484*b* and 9486*b* appear in table 9460, none of those boxes appear adjacent device representations in column 7043.

Referring still to FIG. 98, initially flag boxes (e.g. 7049, 7051, etc.) corresponding to monitorable and controllable I/O and requests in columns 7045 and 7047 are blank (i.e. do not include flags). It is contemplated that any of the flag boxes may be selected via a mouse controlled cursor by selecting the box and activating an activation button on the mouse. In the present example, it is assumed that the control engineer would like to provide control tools for controlling each of the extend and retract requests and would like to provide monitorably indicators for each of the first cylindicator 9425 inputs I1 and I2 (e.g. see exemplary HMI screen in FIG. 95.) To specify monitorably and controllable I/O, the control engineer uses the mouse controlled cursor to place flags in boxes 7053 and 7055 corresponding to inputs I1 and I2, respectively, and to place flags in boxes 7057 and 7059 corresponding to extend and retract requests, respectively. These flags are illustrated in FIG. 98. To specify other I/O to be monitored/controlled the engineer places additional flags in boxes.

To de-select a selected I/O, the engineer simply re-selects the corresponding box to remove the flag.

Referring to FIGS. 86 and 98, when flags are placed in boxes 7053, 7055, 7057 and 7059, editor 9804 provides corresponding flags in boxes 9493, 9495, 9490 and 9492, respectively. Thus, HMI editor 9804, including screens 7033 (ee FIG. 97) and 7041 (see FIG. 98), is used to select a sub-set of the monitorable and controllable I/O and requests corresponding to designated control devices. The selected I/O and requests are indicated in table 9460 and later used during compilation to provide execution code to support the HMI and to generate a HMI program to support the HMI tools/indicators, etc.

In addition, when a flag is placed in any of the boxes in column 7047 indicating manual control, a flag is automatically placed in a manual selection box 9051 indicating that a control tool for selecting manual system operation must be provided on a final HMI.

When the control engineer is finished setting the flags on screen 7041 corresponding to the 1stclamps CA instance, the engineer selects the "finish" icon 7061 which again brings up the HMI editor screen 7033 (ee FIG. 97). Next, the engineer may select any of the other CA instances in list 7035 for selecting monitorable and controllable I/O in the manner described above. When another CA instance is selected from list 7035, another HMI editor screen similar to screen 7041 (see FIG. 98) is displayed which includes monitorable and controllable I/O specified by the CA instance and which can be selected via flags to be supported by a subsequently compiled execution code.

Referring to FIGS. 96 and 97, after the control engineer has set all of the flags corresponding to monitorable and controllable I/O which have to be supported by an HMI and corresponding execution code, the engineer selects "finish" icon 7061 to return to window 7027. At this point, HMI specification is complete.

c. Diagnostics Editor

Referring again to FIG. 87, while diagnostic specification tables like table 9600 designate a large number of diagnostic conditions and associated activities for CAS sequenced via resource editor 9802, as in the case of the HMI specification (see FIG. 86), often a control engineer will only require a sub-set of possible diagnostic capabilities. Thus, referring to FIGS. 87 and 90, diagnostics editor 9806 provides tools which enable a control engineer to select a sub-set of the requirement/activity possibilities in table 9600 to be supported by a subsequently compiled execution code. Referring also to FIG. 95, in the present example, while the execution code is running, when a diagnostic condition to be reported occurs, the condition is reported in diagnostics section 7007 as a text phrase.

Figure 99:
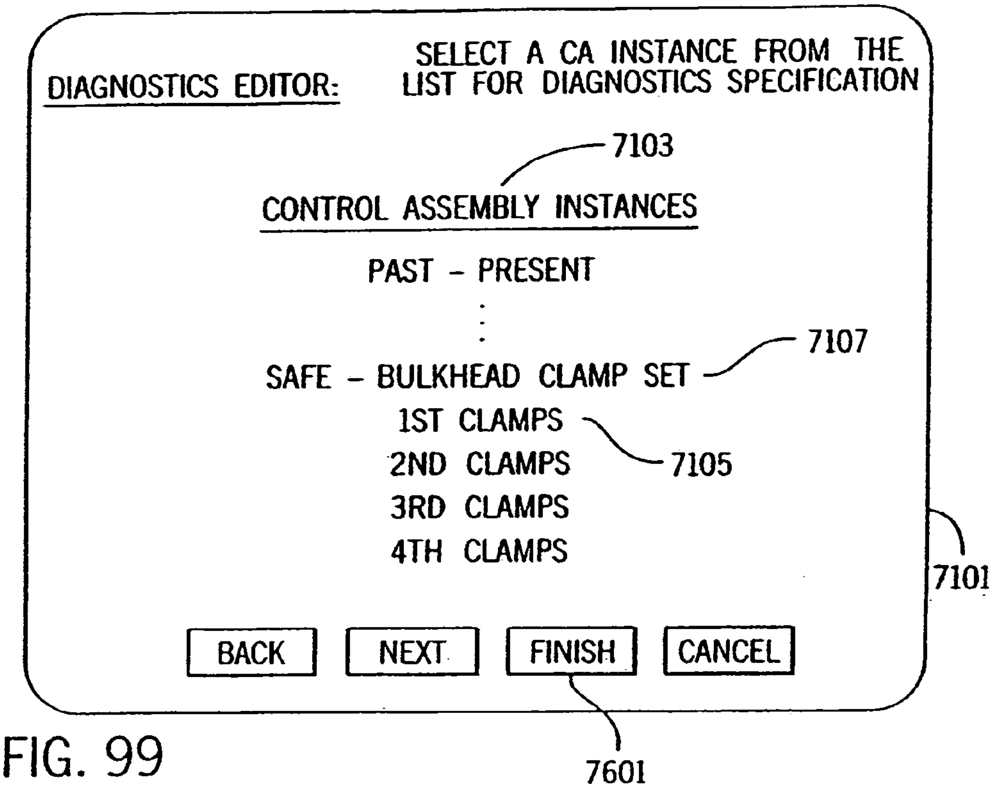
FIG. 99 is a schematic illustrating a diagnostics editor screen.

Referring to FIGS. 96 and 99, a control engineer selects "diagnostics" icon 7031 to specify diagnostics to be supported by the execution code. When icon 7031 is selected, diagnostics editor 9806 provides diagnostics editor screen 7101. Screen 7101, like HMI editor screen 7033 illustrated in FIG. 97, provides a control assembly instances list 7103 which, referring once again to FIG. 72, lists each control assembly instance, according to control assembly type, from control resources window 5508. Thus, once again, the "first clamps" CA 7105 is listed as an instance of the "safe bulkhead clamp set" control assembly type 7107 in list 7103.

Referring still to FIG. 99, using a mouse controlled-cursor (not illustrated), the control engineer selects each of the CA instances from list 7103 one at a time for which diagnostics is to specified. Continuing with the present example, referring also to FIG. 100, it is assumed that the engineer selects the "first clamps" CA 7105 at which point diagnostics editor 9806 provides diagnostics editor window 7109.

Figure 100:
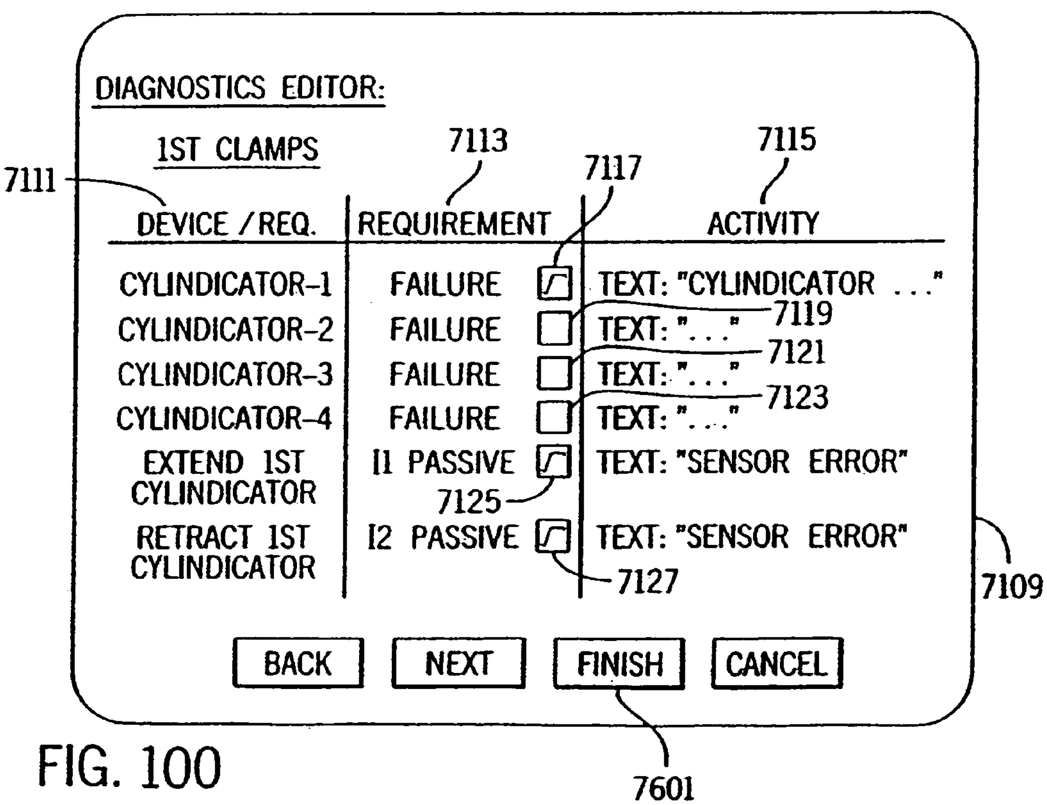
FIG. 100 is a schematic diagram illustrating a diagnostics editor screen for selecting diagnostics to be supported by a control system.

Referring to FIGS. 87 and 100, window 7109 provides essentially all of the information from diagnostic specification table 9600 and therefore includes a device/requests column 7111, a requirements column 7113, and an activities column 7115. Each device in the "1stclamps" CA instance for which diagnostic specification is provided in diagnostics table 9600 is listed in device/requests column 7111. Requirements corresponding to each device in column 7111 are listed in column 7113 and corresponding activities to be performed if the requirement in column 7113 is met are listed in column 7115. In addition, selection boxes 7117, 7119, 7121, 7123, 7125, and 7127 are provided adjacent each requirement representation in column 7113. Initially, in the present example, it is assumed that each of boxes 7117 through 7127 is blank indicating that diagnostics to be supported by execution code are not initially selected. However, using a mouse-controlled cursor, a flag may be placed in any of boxes 7117 through 7127, in a sub-set of those boxes, or in each of those boxes, indicating that the diagnostics corresponding to the specific device or request and corresponding requirements and activities should be supported. In FIG. 100, exemplary flags are illustrated in boxes 7117, 7125, and 7127.

Referring still to FIGS. 87 and 100, when a flag is placed in any of boxes 7117 through 7125, diagnostics editor 9806 places a corresponding flag in a diagnostic specification table box 2001, 2002, 2003, etc. Thus, diagnostics editor 9806 including screens 7101 (see FIG. 99) and 7109 (see FIG. 100) which are used to further specify or select information in diagnostics table 9600 which is to be subsequently compiled.

When the flags have been selected and deselected as desired on screen 7109, the engineer selects "finish" icon 7601 and editor 9806 again provides screen 7101 illustrated in FIG. 99. Next, the engineer selects another CA instance from list 7103 to select diagnostics to be supported and follows the flag selecting and deselecting procedure described above for the newly selected instance. This procedure is repeated for each CA instance for which diagnostics is to be supported by the execution code. Thereafter, referring still to FIG. 99, the engineer again selects "finish" icon 7601 and is returned to screen 7027 illustrated in FIG. 96.

Referring again to FIG. 87A, in the alternative, where CAS include status based diagnostic specifications, it is contemplated that, in a preferred embodiment, the diagnostics specification is not edited. Instead, upon compiling, diagnostics specified in each diagnostics specification is repeated for each instantiated CA thereby generating diagnostics code which is interspersed within execution code and which indicates the next event to occur. In this manner, the daunting task of providing diagnostics code to support status based diagnostics is simplified through automatic code generation.

At this point, all of the information required to generate execution code for controlling the exemplary manufacturing process and for supporting both HMI and diagnostics has been specified. In addition, all the information required to generate schematic diagrams detailing all aspects of a control assembly have also been specified. Moreover, all of the information required to support virtual simulation of the exemplary manufacturing process has been specified. Next, the sequenced bar chart and instantiated CA instances are stored in database 9810 until compiled.

Hereinafter, although many bar charts and corresponding CA instances may be stored in database 9810, to simplify this explanation, it will be assumed that only single bar chart 5830 (see in FIG. 72) and corresponding CA instances are stored in database 9810.

3. PLC and HMI

Although it may seem logical to explain operation of compiler 9812 next, some general information about PLC 9814 and HMI 8437 is instructive in laying a foundation for an understanding of how compiler 9812 operates. Specifically, it is instructive to understand the structure of the control products which must be generated via the compilation process to support execution code and an HMI. Generally the control products required to support code and an HMI include a parameterized PLC I/O table, an HMI configuration/linking table and a diagnostics linking table.

Figure 101:
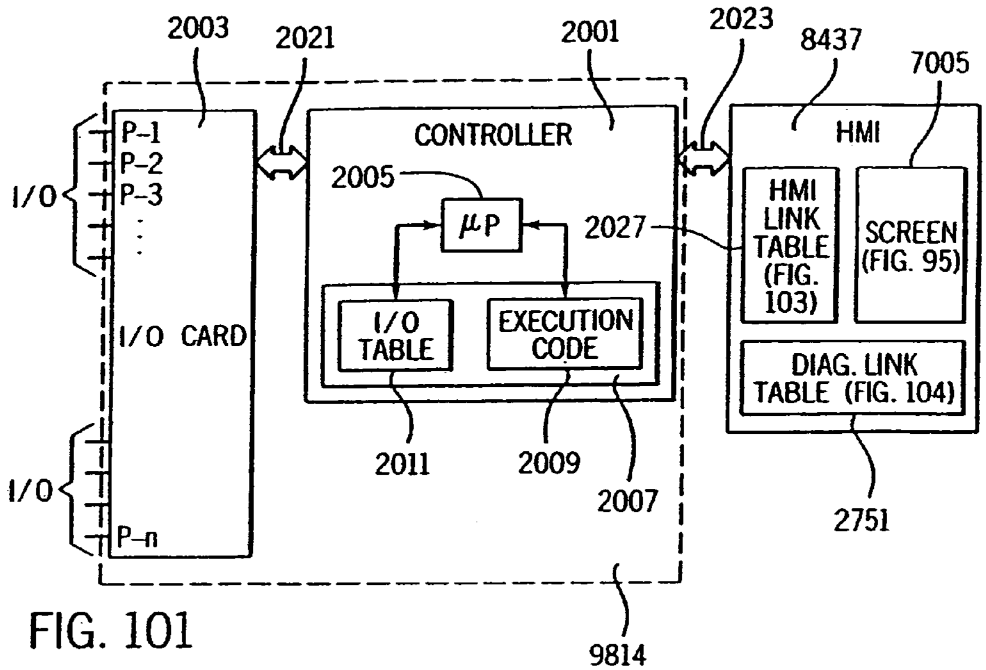
FIG. 101 is a schematic diagram of the PLC of FIG. 90.

Referring to FIGS. 90 and 101, PLC 9814 includes a controller 2001 and at least one I/O card 2003. Controller 2001 includes a microprocessor 2005 and a memory 2007. Memory 2007 is used to store both an execution code 2009 and a PLC I/O table 2011. Code 2009 includes an RLL control program for controlling mechanical resources 8438. As well known in the controls art, an RLL program includes sequential LL rungs including contacts and coils. The contacts represent PLC inputs and the coils represent PLC outputs. When contacts within a rung all close, an associated rung coil is excited. Thus, PLC inputs (contacts) change the states of PLC outputs (coils). PLC inputs are associated with mechanical resource sensors and indicate resource conditions. PLC outputs are linked to mechanical resource activators or to PLC input contacts to cause resource control or further processing.

Figure 102:
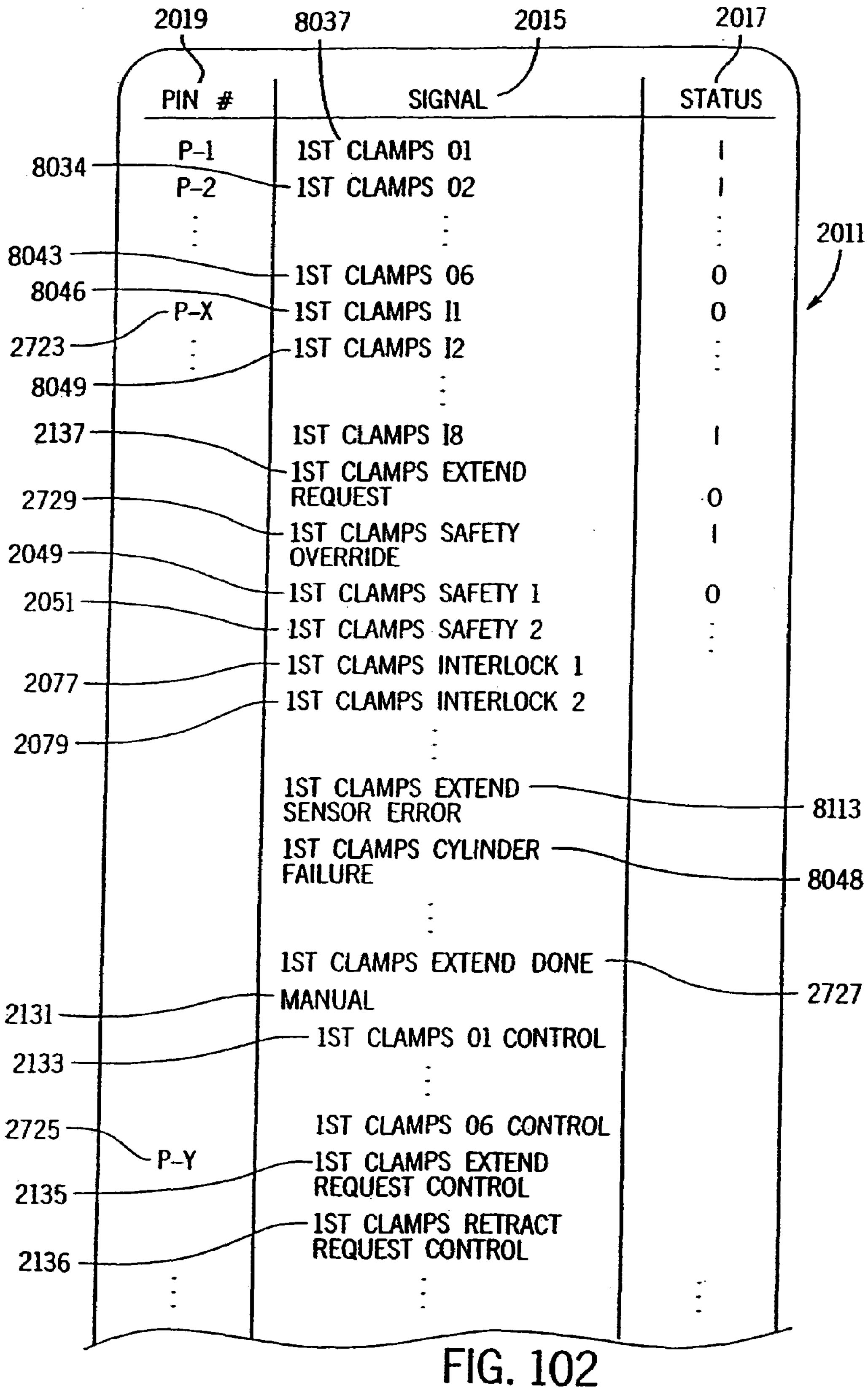
FIG. 102 is a schematic diagram illustrating an exemplary PLC I/O table.

I/O table 2011 is a repository for PLC I/O and PLC signals generally. Referring also to FIG. 102, an exemplary parameterized I/O table 2011 includes signal column 2015 and a status column 2017. Column 2015 lists all PLC signals. For example, for the 1stclamps CA instance, the signal list includes inputs 1stclamps I1-I8 and outputs 1stclamps 01-06. For brevity sake table 2011 is abbreviated. 1stclamps 01, 02 and 06 are identified by numerals 8037, 8039 and 8043, respectively. 1stclamps I1 and I2 are identified by numerals 8049 and 8046, respectively. Column 2015 also includes entries "1stclamps extend request" 2137, "1stclamps safety override" 2729, "1stclamps safety 1" 2049, "1stclamps safety 2" 2051, "1stclamps interlock 1" 2077, "1stclamps interlock 2" 2079, "1stclamps extend sensor error" 8113, "1stclamps cylinder failure" 8048, "1stclamps extend done" 8727, "manual" 2113, "1stclamps 01 control" 2133 and so on. Each signal in column 2015 corresponds to contact and or a coil in execution code 2009.

Status column 2017 includes a list of instantaneous statuses of signals in column 2015. Exemplary statuses include closed or active which is identified by a "1" and open or passive which is identified by a "0". The statuses active and passive correspond to coils while closed and open correspond to contacts.

Referring still to FIG. 101, I/O card 2003 is linked to controller 2001 via a two-way bus 2021. Card 2003 includes a plurality of I/O pins P-1, P-2, etc. Referring also to FIG. 102, each input pin is linked to a mechanical resource sensor while each output pin is linked to a mechanical resource activator. I/O card 2003 takes parallel input from pins P-1, P-2, etc. and converts the input to serial input signals which are provided to processor 2005 to update I/O table 2011. Similarly, card 2003 receives serial PLC output signals from table 2011 and converts those output signals to serial outputs provided on output pins for controlling mechanical resources. To map I/O pins to code I/O, table 2011 includes a pin number column 2019. Not all PLC signals in column 2015 includes a pin number as some signals are internal to PLC 9814. For example, "1stclamps extend request" 2137 is a condition which is internal to PLC 9814 and therefore, does not correspond to a pin number.

HMI 8437 is linked to controller 2001 via a two-way serial bus 2023 for retrieving PLC I/O which is to be monitored and for providing command signals for manual PLC control. HMI 8437 includes screen 7005 and both an HMI configuration/linking table 2027 and a diagnostics linking table 2751.

Referring to FIG. 95, exemplary HMI touch screen 7005 includes extend button 7019, retract button 7021 and manual button 1001. In addition, screen 7005 includes both "1st cylindicator extend signal" and "1st cylindicators retract signal" indicators 7023 and 7025, respectively.

Hereinafter, while many different control tools and indicators are contemplated, in order to simplify this explanation it will be assumed that the exemplary HMI only supports a single type of binary button and a single type of binary indicator.

Referring still to FIGS. 95 and 101, to define and support HMI screen 7005, an HMI configuration table 2027 must include at least three types of information. First, for each tool to be included on screen 7005, the table must indicate tool type (e.g. indicator or button). Second, for each tool, the table must specify a corresponding label (e.g. extend, retract, "1st cylindicator extend signal", etc.). Third, for each tool, the table must specify a corresponding PLC signal to, in the case of an indicator, be monitored and, in the case of a control button, be controlled.

Figure 103:
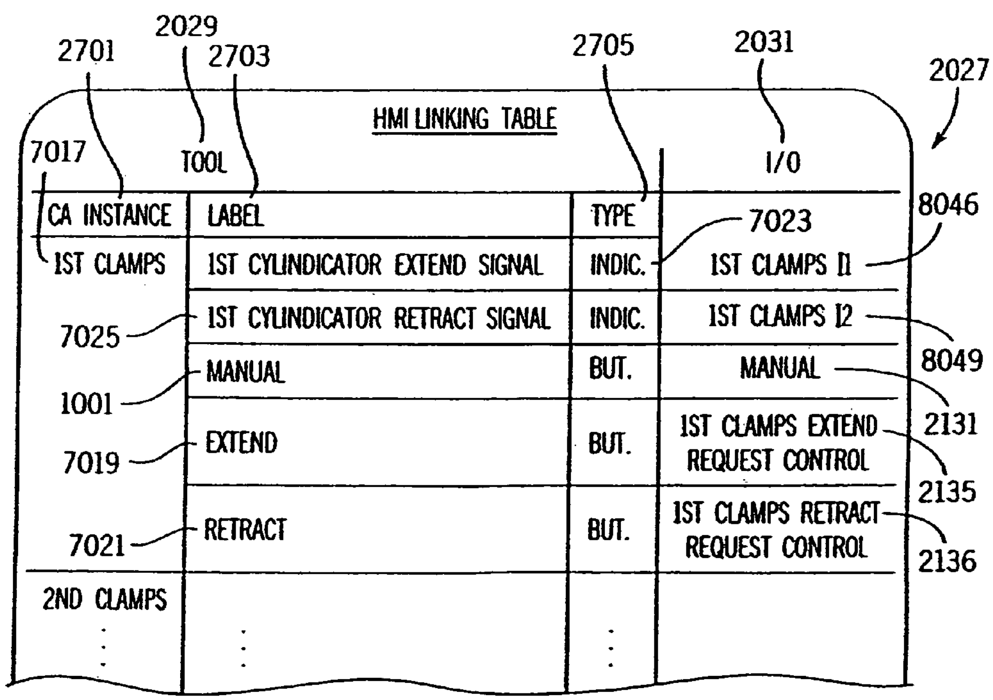
FIG. 103 is a schematic diagram illustrating an exemplary HMI linking table.

To this end, referring also to FIG. 103, exemplary parameterized HMI table 2027 includes a tool column 2029 and an I/O column 2031. Tool column 2029 includes three subcolumns including a CA instance column 2701, a label column 2703 and a type column 2705. Referring also to FIG. 72, instance column 2701 lists all CA instances in bar chart 5830 which require HMI indicators or control buttons. 1stclamps instance 7017 appears in column 2701.

Referring to FIGS. 102 and 103, signal column 2031 lists all PLC signals from PLC I/O table column 2015 for each CA instance in column 2701 which must be either monitored or controlled. Referring also to FIG. 86, consistent with HMI specification 9460, "1stclamps I1", "1stclamps I2", "Manual", "1stclamps extend request control" and "1stclamps retract request control", 8046,8049, 2131, 2135 and 2136, respectively, are included in column 2031.

Type column 2705 lists the tool type required to monitor or control PLC signals in column 2031. To this end, indicators are listed for PLC signals to be monitored while buttons are listed for signals to be controlled. For example, indicator 7023 is specified for "1stclamps I1" signal 8046. Label column 2703 lists a label for each tool in column 2705. Label-type pairs are singularities which correspond to indicators and control buttons which appear on HMI screen 7005. For example, referring also to FIG. 95, indicator 7023 and its corresponding label in FIG. 103 corresponds to indicator 7023 in FIG. 95. Indicator 7025 and its corresponding label "1st cylindicators retract signal" correspond to indicator 7025. Similarly, button 1001 and label "Manual" correspond to button 1001, button 7019 and its label in FIG. 103 correspond to extend button 7019 and button 7021 and its label in FIG. 103 correspond to retract button 7021.

Referring again to FIG. 95, diagnostic section 7007 of screen 7005 provides text error messages to a system operator when a supported diagnostic condition occurs. To support diagnostics functions, a diagnostics table must include at least two types of information. First, for each supported diagnostic condition, the diagnostics table must identify a PLC signal which indicates occurrence of the diagnostic condition. Second, for each supported diagnostic condition, the table must specify the message to be provided.

Figure 104:
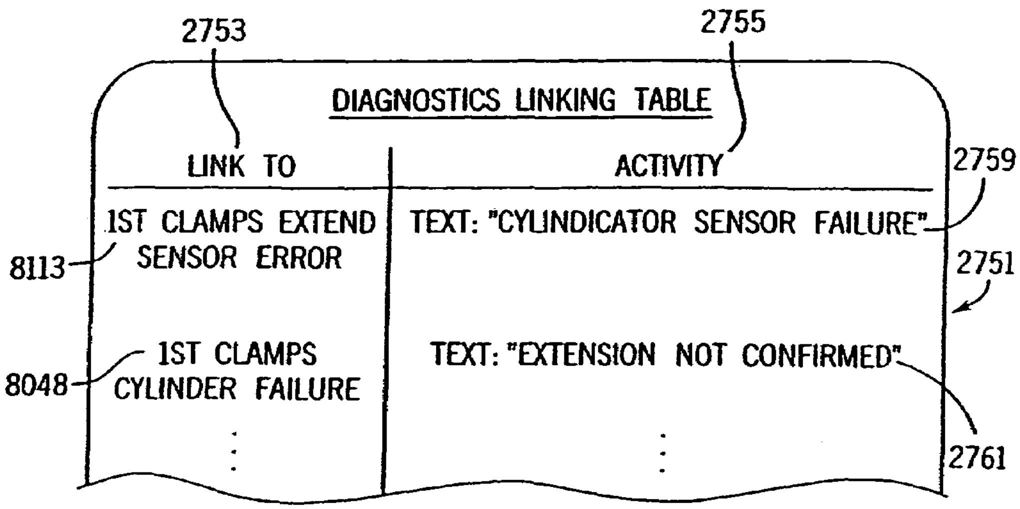
FIG. 104 is a schematic diagram illustrating an exemplary diagnostics linking table.

To this end, referring to FIGS. 101 and 104 exemplary parameterized diagnostics linking table 2751 includes a "link" column 2753 and an activity column 2755. Referring also to FIG. 102, link column 2753 lists PLC signals from column 2015 which correspond to supported diagnostic conditions. In exemplary table 2751 in the interest of brevity, only two supported conditions are listed including 1stclamps extend sensor error"8113 and "1stclamps cylinder failure" 8048.

Column 2755 includes a text phrase to be provided in diagnostics section 7007 of screen 7005 when a corresponding signal in column 2753 is active. Thus, when signals 8113 is active (as specified in table 110), the phrase 2759 to be provided in section 7007 is cylindicator sensor failure. When signal 8048 is active, the phrase 2761 is provided.

Thus, referring to FIGS. 95 and 101 through 104, in addition to execution code 2013, PLC I/O table 2011 is required to link code 2009 to I/O card pin numbers and hence to mechanical resources, HMI configuration/linking table 2027 is required to configure HMI screen 95 and to link HMI buttons and indicators to PLC signals in table 2011 and diagnostics linking table 2751 is required to link diagnostic signals from PLC I/O table 2011 to diagnostic activities reported on HMI screen section 7007.

4. Compiler

Referring to FIGS. 72, 90, 95, 102, 103, and 104, compiler 9812 accesses bar chart 5830 and corresponding CA instances in database 9810 and uses information therein to generate control products including execution code 2009 to be run by PLC 9814 to drive control mechanisms in the manner required by bar chart 5830, and PLC I/O table 2011 for mapping code I/O to I/O card 2003 pins, HMI configuration/linking table 2027 to define one or more HMIs including HMI indicators for monitoring and buttons for manually controlling control mechanisms in a manner consistent with the CA instances and to link indicators and buttons to PLC signals, a diagnostics linking table 2751 for linking diagnostic PLC signals to diagnostic activities and a schematic representation of the entire control system which is also consistent with the CA instances. In addition, in this embodiment, compiler 9812 also generates a simulation table for driving virtual simulator 9816.

Compiler 9812 is linked to database 9810 via a two-way bus 8013 and is also linked to PLC 9814, simulator 9816, HMI workstation 8437 and printer 8436 via buses 8323, 8442, 8434 and 8444, respectively. During compilation compiler 9812 also stores information on database 9810 and may store the final control products on database 9810 as well.

Figure 105:
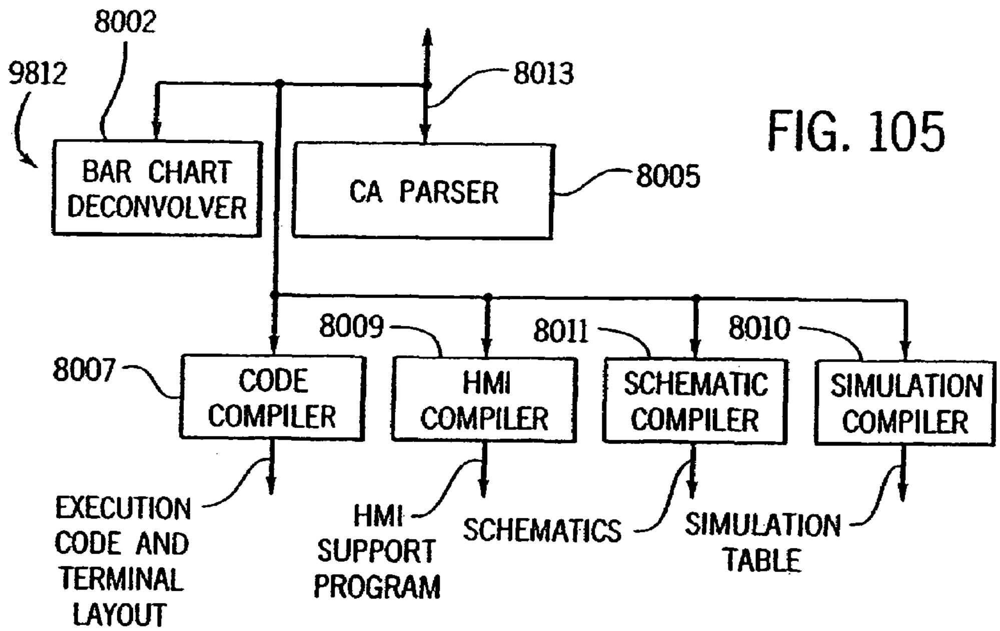
FIG. 105 is a schematic diagram illustrating the compiler of FIG. 90.

Referring now to FIG. 105, compiler 9812 includes a bar chart deconvolver 8002, a CA parser 8005, a code compiler 8007, an HMI compiler 8009, a schematic compiler 8011 and a simulation compiler 8010. All of the components illustrated in FIG. 101 are linked via two way bus 8013.

Deconvolver 8002 performs two functions. First, referring also to FIG. 72, deconvolver 8002 accesses bar chart 5830 and uses chart 5830 to sequence compilation. To this end, deconvolver 8002 works sequentially through bar chart 5830, one request at a time, causing compilers 8007, 8009, 8011 and 8010 to simultaneously compile information for each bar chart request in an orderly fashion. For example referring to bar chart 5830, deconvolver 8002 begins by causing information related to the "2ndpins engage" request 5201 (i.e. the first request in chart 5830) to be processed and compiled by each of compilers 8007, 8009, 8011 and 8010. Thereafter, deconvolver 8002 causes information related to the "Gripper controller Load-Cycle" request 5203 to be processed and compiled and so on.

While compilers 8007, 8009, 8011 and 8010 generally process information for a request simultaneously, in the exemplary embodiment a parameterized PLC I/O table generated by code compiler 8007 is provided to schematic compiler 8011 and therefore, some intra-request information processing is sequential. Nevertheless, in the present example all compilation for one request is completed prior to initiating compilation corresponding to a subsequent request.

To cause compilation, deconvolver 8002 provides a "current request" signals to parser 8005 via bus 8013 indicating a single bar chart request at a time for which information is to be compiled. When parser 8005 receives a current request signal, parser 8005 provides a sub-set of CA information for the current request to each compiler 8007, 8009, 8011 and 8010. Then, compilers 8007, 8009, 8011 and 8010 process received information to generate control products. When each compiler 8007, 8009, 8011 and 8010 has completed its processing, the compiler sends a "request complete signal" to deconvolver 8002 via bus 8013. When deconvolver 8002 receives a request complete signal from each compiler 8007, 8009, 8011 and 8010, deconvolver 8002 provides the next request in bar chart 5830 as a next current request signal to parser 8005.

After information corresponding to the last request in bar chart 5830 has been processed, when deconvolver 8002 receives request complete signals from each of compilers 8007, 8009, 8011 and 8010, deconvolver 8002 provides an "end sequence signal" to each of compilers 8007, 8009, 8011 and 8010 indicating that the final compiling steps should be performed and final parameterized control products should be provided.

Hereinafter, consistent with the present example, processing and compilation is described in the context of the "1stclamps extend" request 5701 in FIG. 72.

Second, deconvolver 8002 also identifies safeties and interlocks from bar chart 5830 and generates a safeties/interlocks (S/I) table which correlates CA instances with safeties and interlocks. The S/I table is provided to compiler 8007 via bus 8013. Although not illustrated, the S/I table is described in more detail below.

Referring still to FIGS. 72 and 105, in addition to receiving the current request signal, parser 8005 also accesses each CA instance corresponding to bar chart 5830 and parses the instances into their separate CA specifications. Thus, referring also to FIG. 84, parser 8005 separates each CA instance into a logic specification 9002, a schematic specification 9004, an HMI specification 9006, a diagnostic specification 9008 and a simulation specification 9300.

The specification sub-sets corresponding to each specific bar chart request are simultaneously provided to each compiler 8007, 8009, 8011 and 8010. For example, when deconvolver 8002 indicates that the "1stclamps extend" request is to be processed, parser 8005 provides specification sub-sets corresponding to the 1stclamps extend request to each of compilers 8007, 8009, 8011 and 8010.

The specification sub-set provided to compiler 8007 includes logic, HMI and diagnostic specifications 9002, 9006 and 9008, respectively. The specification sub-set provided to HMI compiler 8009 includes the HMI specification 9006 and diagnostic specification 9008. The sub-set provided to compiler 8011 includes schematic specification 8003. The sub-set provided to simulation compiler 8010 includes only the simulation specifications 9300. Each of the compilers 8007, 8009, 8011 and 8010 is described separately below.

In addition to storing bar chart 5830, CA type templates and instantiated CA instances corresponding to the stored bar chart, database 9810 also stores a plurality of database tables including information which compiler 9812 combines with CA instance information to generate the control products. The tables include a code building table (see FIG. 106), an HMI building table (see FIG. 110), a diagnostics building table (see FIG. 111) a schematic building table (see FIG. 113) and a simulation building table (see FIG. 115). Content and use of the building tables is described below.

In the example which follows, while many different methods (e.g. building, duplicating, canceling, etc.) for parameterizing code, support tables, schematics and simulation tools are contemplated, only a single method which is particularly easy to visualize is described here in order to simplify this explanation. Generally, according to the method described herein, virtually all information which might be required to support a control product is defined and, upon compilation some of the defined information is eliminated. For example, with respect to execution code, code required to support every aspect, including both required and parameterizable aspects, of a CA request is provided and, upon compilation, code rungs which correspond to required and selected request characteristics remain in the code while rungs corresponding to un-selected request characteristics are effectively removed from the code.

a. Code Compiler

Referring to FIGS. 72, 101 and 105, compiler 8007 receives logic, HMI and diagnostic specifications and the S/I table for a specific CA instance, gleans information therefrom and applies a set of rules to the gleaned information to generate parameterized execution code segments and to form PLC I/O table sections for each bar chart 5830 request. Parameterized code segments are appended to each other in sequential order to form complete execution code 2009 for controlling the control process defined by bar chart 5830 and associated CA instances. Referring also to FIG. 102, the PLC I/O table sections are combined to form complete PLC I/O table 2011.

Figure 106:
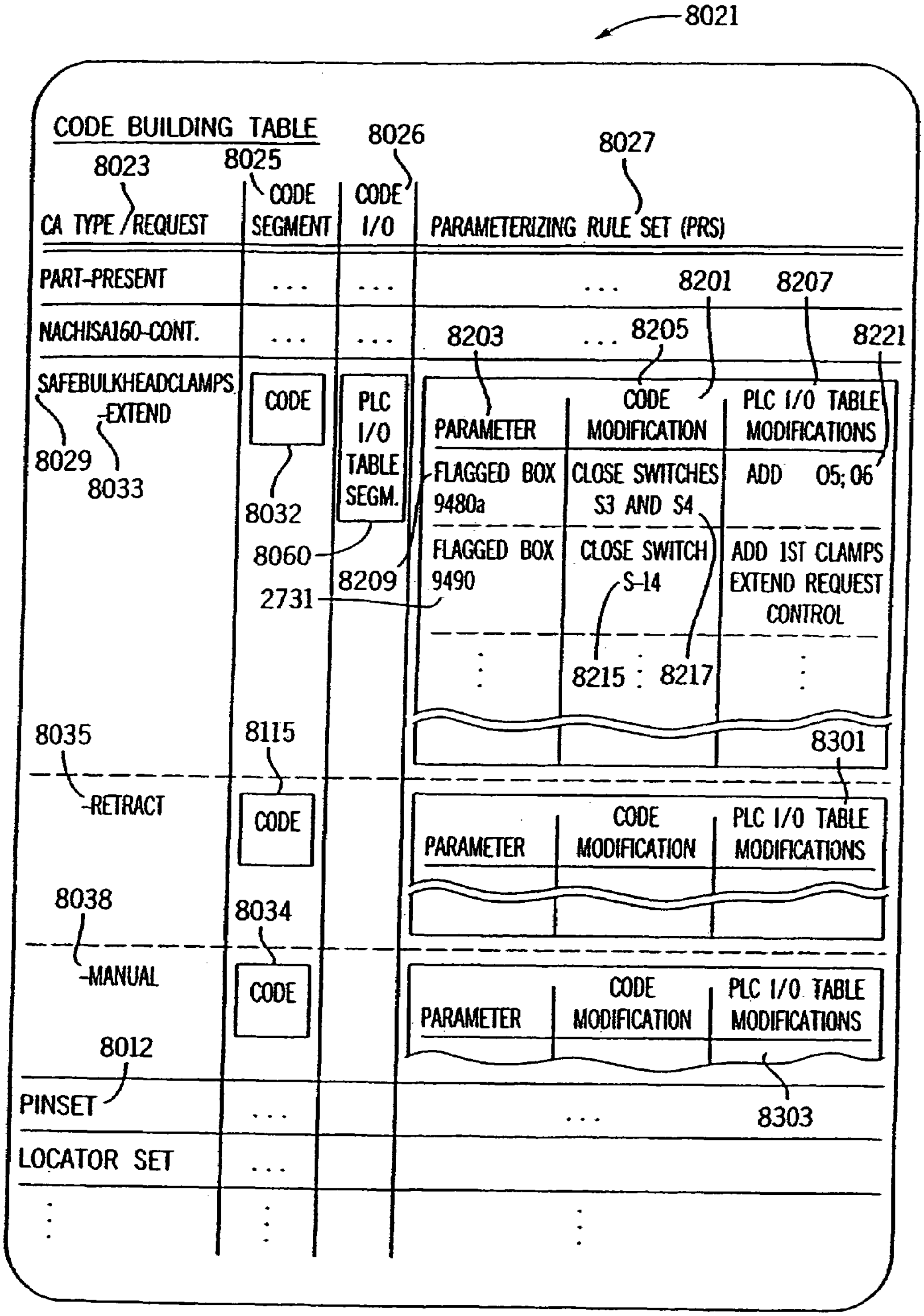
FIG. 106 is a schematic diagram illustrating an exemplary code building table.

The rules applied by compiler 8007 to build execution code 2009 and PLC I/O table 2011 are stored in a code building table on database 9810. Referring to FIG. 106, exemplary code building table 8021 defines virtually all execution code which may possibly be required to support CA instances in a control bar chart assembled using resource editor 9802. Thus, table 8021 defines code corresponding to every selectable CA type, every selectable CA request, every required CA type control device and characteristic, every selectable CA type device and characteristic, every selectable monitorable/controllable parameter or condition and every selectable diagnostic requirement/activity combination.

While virtually all code which may be required is defined in table 8021, only code corresponding to required and selected (i.e. instantiated) CA types, characteristic, devices, HMI features and diagnostic combinations is compiled. Thus, for example, while code corresponding to a "pinset" CA type 8012 is defined in table 8021, if, upon selecting resources for control via resource editor 9802, a control engineer does not select and instantiate at least one "pinset" CA instance, the code corresponding to the "pin set" CA type 8012 it not compiled.

Table 8021 includes a CA type/request column 8023, a code column 8025, an I/O column 8026 and a parameterizing rule set (PRS) column 8027. Column 8023 lists every CA type which is selectable by the control engineer via resource editor 9802. In the present example, among other CA types, column 8023 includes the "SafeBulkHeadClampSet" type of which 1stclamps is a single instance. For each CA type, column 8023 independently identifies each request in the CA type logic specification. For example, referring again to FIG. 85, each "SafeBulkHeadClampSet" CA type includes both an extend request and a retract request. Thus, in column 8023, under the "SafeBulkHeadClampSet" type 8029, each of the "extend" and "retract" requests 8033, 8035, respectively, are listed.

In addition to requests which are associated with a logic specification, a "manual" request 8038 which is associated with a corresponding HMI specification is listed under each CA type. The manual request 8038 corresponds to execution code which may be required to support manual operation of control mechanisms associated with a CA instance. Unlike code associated with a logic specification request (e.g. extend, retract), code associated with the manual request is generally only provided once in an execution code.

Figure 107:
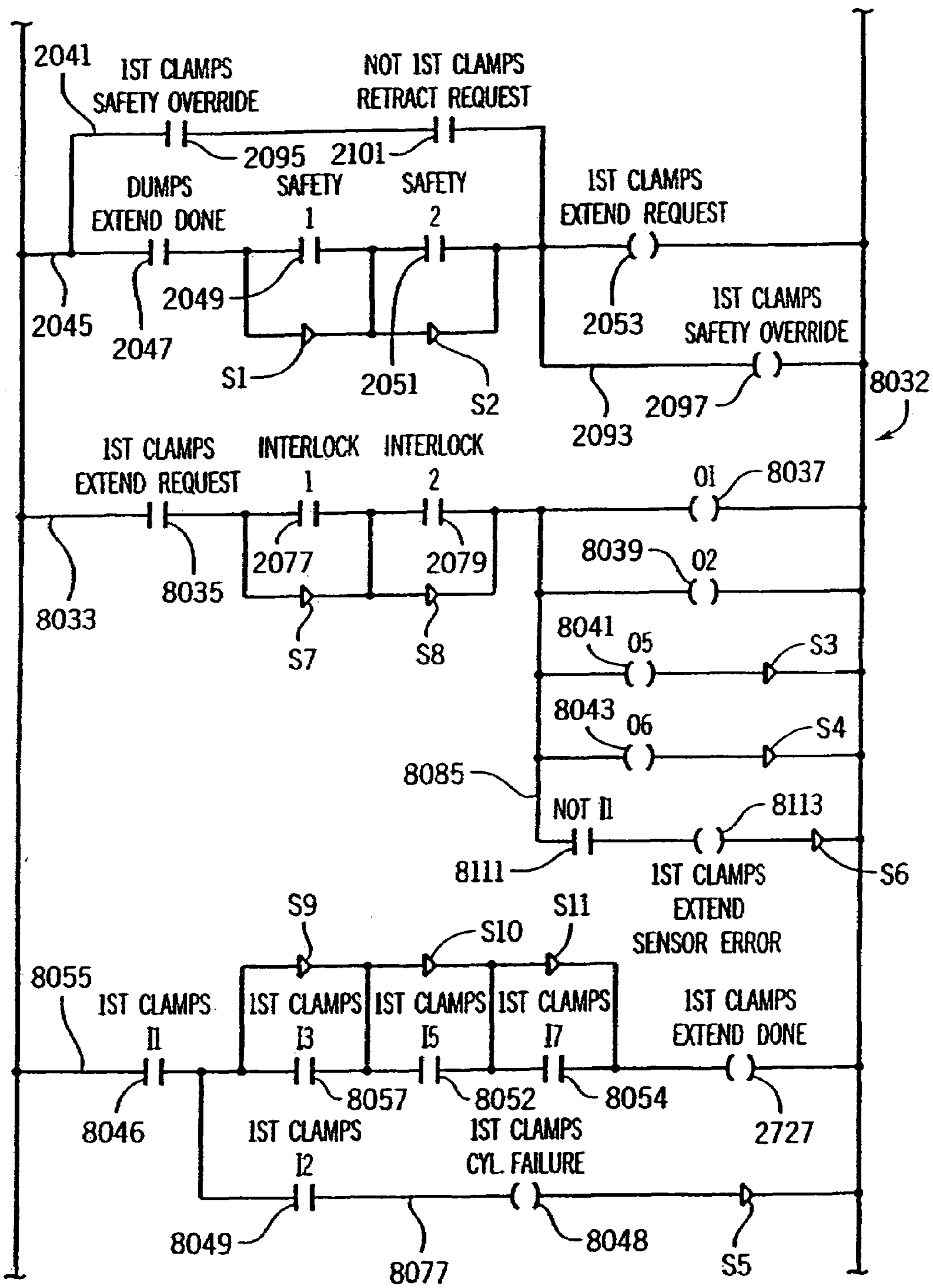
FIG. 107 is a schematic diagram illustrating the exemplary PLC I/O table segment of FIG. 106.

Code column 8025 includes an RLL segment corresponding to each request in column 8023. Each RLL segment includes LL rungs corresponding to every possible control device and characteristic which may be associated with the corresponding request. Referring to FIG. 107, exemplary "SafeBulkHeadClampSet" extend request code segment 8032 is illustrated. Segment 8032 is abbreviated to simplify this explanation and, in reality, would include many more rungs. As illustrated, segment 8032 includes a "safety" rung 2045, a "1stclamps extend request" rung 8033 and a "1stclamps done" rung 8055. As illustrated, segment 8032 has already been partially parameterized to associate segment 8032 with the 1stclamps CA instance. For example, many contacts and coils in FIG. 107 include a descriptor including the term 1stclamps. It is contemplated that prior to compilation, the term "name" would appear in FIG. 103A each time 1stclamps appears. Upon compilation, the term "name" is replaced by the CA instance name (i.e. 1stclamps). Similarly, other contact descriptors may be parameterized upon compilation.

Safety rung 7045 renders the 1stclamps extend request dependent on completion of at least one and perhaps several requests or conditions in bar chart 5830. For example, in FIG. 72, the 1stclamps extend request 5701 should not begin until the dumps extend request 2041 has been completed at edge 5529. In addition, other conditions or request done states may have to occur prior to execution of the 1stclamps extend request 5701. These other conditions are reflected by the conditions corresponding to bar chart yield icons (e.g. 5703 in FIG. 72).

Referring to FIGS. 102 and 107, contacts and coils in FIG. 107 correspond to PLC I/O signals which have identical names in table 2011. For example, when the status of "1stclamps I1" 8046 turns from passive to active in table 2011, contact "1stclamps I1" 8046 in rung 8055 closes, when coil "1stclamps extend done" 2727 in rung 8055 is excited, signal "1stclamps extend done" 2727 in table 2011 changes from passive to active and so on.

Referring still to FIGS. 72 and 107, rung 2045 makes 1stclamps extend request 5701 dependent upon completion of dumps extend request 2041 and upon completion of other safety conditions (not specified). A completed request is referred to hereinafter as a "done" request. Rung 2045 includes a "dumps extend done" contact 2047 and first and second "safety" contacts 2049, 2051 in series with a "1stclamps extend request" coil 2053. As with the 1stclamps descriptors, the descriptor "dumps extend done" reflects parameterization which is consistent with bar chart 5830. Initially, a generic identifier such as "previous request done"

is linked to contact 2047. Upon compilation, the phrase "previous request" would be replaced with the phrase "dumps extend".

In the present example, rung 2045 has been configured to accommodate a maximum of two safeties and hence there are only two safety contacts 2049, 2051. However, it is contemplated that a "SafeBulkHeadClampSet" instance may require more than two safeties and for that purpose, code segment 8032 would include additional series contacts, one for each additional safety.

Referring still to FIGS. 72 and 107, when the dumps extend request 2041 is done, contact 2047 closes. Similarly, when each of the first and second safety conditions corresponding to contacts 2049 and 2051 are done, contacts 2049 and 2051, respectively, close. When all of contacts 2047, 2049 and 2051 close, coil 2053 is excited. When "1stclamps extend request" coil 2053 is excited, related "1stclamps extend request" contacts (e.g. contact 8035 in rung 8033 ) close. Thus, rung 8033 is dependent on each of the conditions associated with contacts 2047, 2049 and 2051 occurring.

Because rung 2045 is a safety rung, the conditions represented by contacts 2047, 2049 and 2051 need not be maintained during execution of 1stclamps extend request 5701. Thus, branches 2091 and 2093 are provided which, after the conditions corresponding to contacts 2047, 2049 and 2051 have been met, override the safety conditions and thereby enable the extend request despite the current status of the safety conditions. Branch 2091 includes a "1stclamps safety override" contact 2095 in series with a "not 1stclamps retract request" contact 2101, the series pair in parallel with contacts 2047, 2049 and 2051. Branch 2093 includes a "1stclamps safety override" coil 2097 in parallel with coil 2053. When the term "not" is included in a contact label, the term "not" indicates the opposite of the condition modified thereby. For example, with respect to contact 2101, "not" means that a 1stclamps retract request has not been made. After a 1stclamps retract request is made, contact 2101 opens.

In operation, referring to FIGS. 72 and 107, after dumps extend request 2041 has been completed, contact 2047 closes. Similarly, when conditions corresponding to contacts 2049 and 2051 occur, contacts 2049 and 2051 close causing each of coils 2053 and 2097 to excite. Coil 2097 causes contact 2095 to close. It is assumed that the 1stclamps retract request is not pending and therefore contact 2101 remains closed. Thus, after all of contacts 2047, 2049 and 2051 close, those contacts are bypassed by closed contacts 2095 and 2101 until a 1stclamps retract request occurs which opens contact 2101. During this bypass period, coil 2053 remains excited and therefore contacts associated therewith remain closed. When contact 2101 opens, (i.e. when a 1stclamps retract request occurs), coil 2097 is no longer excited and therefore contact 2095 opens and safeties 2047, 2049 and 2051 are again functional to limit the next 1stclamps extend request.

Rung 8033 is designed to cause 1stclamps to extend when "1stclamps extend request" coil 2053 or some other identically named coil is excited. Rung 8033 includes a "1stclamps extend request" contact 8035 and first and second interlock contacts 2077 and 2079, respectively, in series with a parallel coil arrangement including coils 8037, 8039, 8041 and 8043 corresponding to outputs 01, 02, 05 and 06, respectively.

The interlock contacts 2077 and 2079 render a corresponding request dependent on completion and maintenance of corresponding conditions. Thus, if an interlock condition ceases to exist during execution of a dependent request, request execution is halted. Referring also to FIG. 72, interlock conditions are reflected by the conditions corresponding to bar chart stop icons (e.g. 5707). Each of contacts 2077 and 2079 are linked to a separate interlock condition. When an interlock condition is done, the corresponding contact 2077 or 2079 is closed. When an interlock condition is not done the corresponding contact is open.

As with safeties above, a "SafeBulkHeadClampSet" CA instance 8029 may be interlocked to more than two conditions and in this case, additional contacts, one for each additional interlock contingency, would be provided in series with contacts 2077 and 2079.

Referring to FIGS. 102 and 107, when all contacts 8035, 2077 and 2079 are closed, coils 8037-8043 are excited or activated and their status in a PLC I/O table 2011 is updated. When the PLC I/O table 2011 is updated, the active output signals cause valves associated therewith via I/O pins (e.g. P1, P2, etc.) to provide air to cylindicators linked thereto to extend associated clamps.

Referring still to FIG. 107, "1stclamps extend done" rung 8055 indicates when a 1stclamps extend request has been completed or is done. Rung 8055 includes, among other components, a "1stclamps I1" contact 8049, a "1stclamps I3" contact 8057, a "1stclamps I5" contact 8052 and a "1stclamps I7" contact 8054 in series with a "1stclamps extend done" coil 2727. Referring also to FIG. 85, contacts 8049, 8057, 8052 and 8054 correspond to cylindicator extended solenoid sensor signals I1, I3, I5 and I7. When each of signals I1, I3, I5 and I7 is active, contacts 8046, 8057, 8052 and 8054, respectively, close and coil 2727 is excited indicating that the 1stclamps extend request has been completed. Although not illustrated, referring also to FIG. 72, when coil 2727 is excited, a contact corresponding to edge 5527 closes indicating that the 1stclamps extend is done and that, at least with respect to that contingency, the "operator-station 1 Load-Part" request 2107 can begin.

Other rungs and branches which may be required to support parameterization include diagnostic rungs and branches corresponding to diagnostic functions which are selectable via diagnostics editor 9806 (see FIG. 90). Diagnostic functions are listed in the diagnostics table in FIG. 87.

While it is contemplated that segment 8032 would include LL rungs to support virtually every possible diagnostic requirement/activity, in the interest of simplifying this explanation, only two exemplary rungs are illustrated and described. For example, referring to FIG. 87, with respect to cylindicator 9425, 1stclamps cylinder failure requirement 9622 occurs when each of proximity sensor inputs I1 and I2 indicate proximity of a valve piston. Upon the occurrence of requirement 9622, a diagnostics message is required as specified by activity 8517.

In FIG. 107, branch 8077 defines code to recognize requirement 9622 facilitate activity 8517 when requirement 9622 occurs. To this end, branch 8077 is in series with contact 8046 and includes "1stclamps 12 " contact 8049 in series with "1stclamps cylindicator failure" coil 8048. Contacts 8046 and 8049 correspond to inputs I1 and I2, respectively, and close when corresponding proximity sensor signals are active. When both contacts 8049 and 8046 close (i.e. requirement 9622 ), coil 8048 is excited. Referring to FIGS. 87, 102 and 107, coil 8048 update a "1stclamps cylinder failure" signal 8048 status. Referring also to FIG. 95, when coil 8048 is excited, HMI 8437 generates a diagnostic message indicating failure as described in more detail below.

Referring still to FIGS. 87 and 107, when a 1stclamps extend request occurs and conditions associated with contacts 2077 and 2079 occur, if extended proximity sensor I1 remains passive (i.e. "1stclamps I1 Passive" requirement 9624), an error occurs and activity 9626 is required. Segment 8032 includes branch 8085 which defines code to recognize requirement 9624 and facilitate activity 9626 when requirement 9624 occurs. Branch 8085 is in series with contacts 8035, 2077 and 2079, and includes contact 8111 and a series coil 8113. Contact 8111 corresponds to the opposite of input I1 (i.e. if I1 is active, "not I1" is passive and vice versa). Thus, if contacts 8035, 2077 and 2079 close to perform an extend request and contact 8111 remains closed (i.e. I1 is passive), coil 8113 is excited. When coil 8113 is excited, HMI 8437 generates the diagnostic message required by activity 9262. Although not illustrated, a delay may be provided between contact 8111 and coil 9113 so that coils 8037, 8039, 8041 and 8043 and related mechanical mechanisms have a reasonable amount of time to cause 1stclamps to extend prior to diagnostic activity 9626 occurring.

As indicated above, segment 8032 is extremely abbreviated and is contemplated that many other LL rungs will be provided in each LL segment. For example, additional diagnostic rungs will be provided as well as rungs to support other parameterizable features such as latches, request restartability and so on. These additional rungs have not been described here in order to simplify this explanation and because they are not needed for an understanding of the present invention.

Referring still to FIGS. 106 and 107, although not illustrated, a code segment 8115 corresponding to "SafeBulkHeadClampSet" CA type retract request 8035 is similar to code segment 8032 except that, instead of defining code for controlling an extend request, the retract segment would define code for controlling a retract request.

Figure 108:
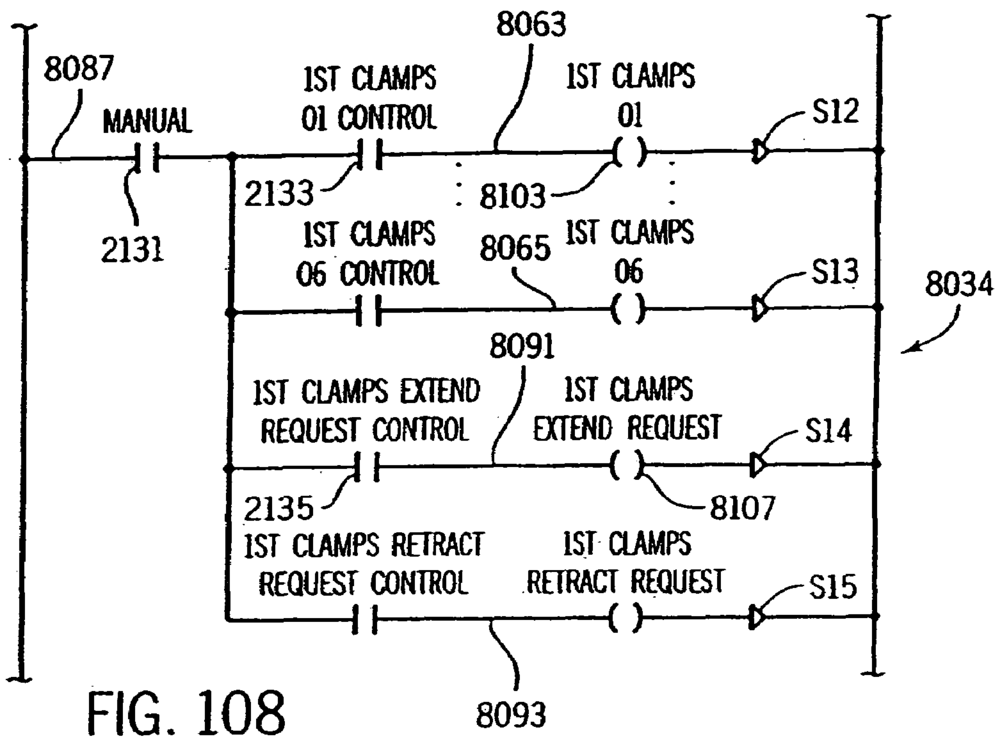
FIG. 108 is a schematic diagram similar to FIG. 107 albeit illustrating a different table segment.

Referring now to FIGS. 106 and 108, an exemplary manual request code segment 8034 is illustrated. Referring also to FIG. 86, each of 1stclamps outputs 01 through 06 may be selected to be controlled during manual system operation. In addition, each of the extend and retract requests may also be selected for manual control. Thus, LL rungs for controlling each of outputs 01-06 and extend and retract requests must be defined such that, if selected for compilation, the rungs can be provided in the execution code. However, unlike requests (e.g. extend, retract, etc.) which may be performed more than once during an execution code cycle and therefore may have to be represented more than once during a cycle, manual control code need only be provided once in an execution code.

In addition, generally the location of manual code in an execution code is unimportant. Thus, in the present example, it is assumed that, if manual operation is selected via HMI editor 9804 as indicated above and therefore must be supported by execution code, the manual code is placed after the first occurrence of any related request. For example, referring to FIGS. 72 and 106, if 1stclamps extend request 5701 is the first "SafeBulkHeadClampSet" request in bar chart 5830, immediately after compiling code for extend request 5701, if selected via HMI editor 9804, manual code is compiled and linked to the end of the extend request code. Thereafter, manual segment 8034 does not again appear in the execution code.

As in the extend request code segment 8032 described above, contacts and coils in manual segment 8034 correspond to similarly labeled and numbered signals in table 102. Exemplary manual segment 8034 comprises rung 8087 including a "manual" contact 2131 and a plurality of branches 8063, 8065, 8091 and 8093.

If manual control is selected for compilation for 1stclamps, upon compilation manual contact 2131 is linked to an HMI control button which, when activated, closes contact 2131. Although not illustrated, it is also contemplated that when contact 2131 is closed, the normal sequence of requests as specified by bar chart 5830 is halted until normal operation is again actively selected. While contact 2131 remains closed, branches 8063, 8065, 8091 and 8093 may be functional depending on if related outputs or requests (i.e. 01-06, extend, retract) were previously selected for compilation.

Branch 8063 defines code for controlling 1stclamps 01 via HMI 8437 and includes a contact 2133 and a coil 8103. If selected to be compiled, contact 2133 is linked to an HMI control button which, when activated, closes contact 2133. When contact 2133 closes, coil 8103 excites which closes a related 1stclamps 01 contact. Branch 8065 is similar to branch 8063 except that a contact corresponds to a button for controlling output 06 and a coil corresponds to output 06. Although not illustrated, branches like branch 8063 are also provided for each of outputs 02-05.

Branch 8091 defines code for manually controlling the 1stclamp extend request. Branch 8091 includes a contact 2135 and a coil 8107. If selected to be compiled, contact 2135 is linked to an HMI control button which, when activated, closes contact 2135. When contact 2135 is closed, coil 8107 excites and closes related "1stclamps extend request" contacts. Referring also to FIG. 107, when "1stclamps extend request" coil 8107 excites, contact 8035 closes, causing outputs 01, 02, 05 and 06 to excite (assuming conditions associated with contacts 2077 and 2079 are met) which in turn cause control mechanisms linked thereto to extend clamps associated with the 1stclamps CA instance. Rung 8093 is similar to rung 8091 except that, instead of defining code for manual control of the extend request, rung 8093 defines code for manual control of the retract request.

Many of the characteristics and, indeed, for each CA type, even some of the control devices, are optional and therefore may or may not be selected for subsequent compilation. Therefore, referring again to FIGS. 106, 107 and 108 while each code segment (e.g. 8032, 8034) defines LL rungs to support virtually every required and parameterizable CA characteristic for a request, every LL rung or branch in a code segment which corresponds to a parameterizable (i.e. selectable or de-selectable) CA feature is provided in series or in parallel with a switch so that the rung or branch can be discarded upon compilation. When a series switch is closed or a parallel switch is open, the corresponding rung is compiled and when a series switch is open or a parallel switch is closed, the corresponding rung is discarded upon compiling. In FIGS. 107 and 108 switches are identified by triangles and are labeled with descriptors "Sn" where n is an integer (e.g. S1, S2, etc.)

Rungs which are required within a CA type do not include switches. For example, referring to FIGS. 85 and 107, two position valve 9421 is required in the "SafeBulkHeadClampSet" CA type. Therefore, no switches are in series or in parallel with coils 8037 and 8039 (corresponding to the required two position valve 9421 ). Similarly, it is required that the "previous request done" requirement be met prior to executing the 1stclamps extend request and therefore, no switches are in series or in parallel with "dumps extend done" contact 2047.

However, spring return value 9423 is optional (i.e. in the present example may be selected or de-selected using resource editor 9802). Thus, switches are provided within code segment 8032 which, when open, effectively de-select code corresponding to spring return value 9423 and, when closed, select code for valve 9423. In FIG. 107, switches S3 and S4 correspond to valve 9423. Thus, if switches S3 and S4 are open, upon compilation branches including coils 8041 and 8043 are eliminated from segment 8032.

Similarly, referring to FIGS. 87 and 107, each of diagnostics branches 8085 and 8077 is optional and therefore, switches S5 and S6 are provided in those rungs, respectively.

When one of switches S5 or S6 is opened, a corresponding branch is eliminated upon compilation.

Moreover, it is contemplated that the 1stclamps extend request may not be contingent upon additional safeties and interlocks. In this case, safety contacts 2049 and 2051 and interlock contacts 2077 and 2079 should be eliminated. To this end, switches S1, S2, S7 and S8 are provided in parallel with contacts 2049, 2051, 2077 and 2079, respectively. When one of switches S1, S2, S7 or S8 is closed, a parallel contact is eliminated upon subsequent compilation.

Furthermore, referring to FIGS. 85 and 107, 2nd, 3rd and 4th cylindicators 9427, 9429 and 9431 are optional. In rung 8055, if second cylindicator 9427 is not included in 1stclamps, contact 8057 corresponding to the second cylindicator extended proximity sensor signal I3 must be eliminated in segment 8032. Similarly, if cylindicator 9429 is not included, contact 8052 must be eliminated, and if cylindicator 9431 is not included, contact 8054 must be eliminated. To this end, switches S9, S10 and S11 are in parallel with contacts 8057, 8052 and 8054, respectively. If switch S9, S10 or S11 is closed a corresponding parallel contact is removed from segment 8032 upon compilation.

Referring to FIGS. 86 and 108, controllability of outputs 01-06 and controllability of extend and retract requests is also optional. Therefore, switches S12, S13, S14 and S15 are provided in series with branches 8063, 8065, 8091 and 8093, respectively. When one of switches S12-S15 is open the corresponding branch is eliminated upon compilation.

Referring once again to FIG. 106, column 8026 includes a single generic PLC I/O table segment for each CA type independent of the number of requests which correspond to the CA type. Generic segment 8060 corresponds to "SafeBulkHeadClampSet" type 8029.

Segment 8060 includes a PLC signal list corresponding to an unparameterized "SafeBulkHeadClampSet" CA type. In other words, the PLC signal list in table 8060 includes signals which must be included in a PLC I/O table when a "SafeBulkHeadClampSet" CA type instance is instantiated, regardless of parameterization. For example, referring also to FIG. 107, for CA type 8029, generic segment 8060 includes every contact in segment 8032 which is not in series or in parallel with a switch S1-S11. In addition, referring to FIG. 108, table 8060 includes every contact in segment 8034 which is not in series or in parallel with one of switches S12-S15. In segment 8034 all contacts are in series or parallel with at least one of switches S12-S15 and therefore, unless also included in one of segments 8032 or 8035 none of those contacts is included in the initial PLC signal list.

Generic segment 8060 is modified by compiler 8007 as a function of parameterization. Eventually, in the present example and after compilation, generic segment table 8060 looks like table 2011 including signals in column 2015 corresponding to every contact and coil in parameterized and compiled code segments 8032, 8115 and 8034 (i.e. corresponding to all "SafeBulkHeadClampSet" requests).

Referring still to FIG. 106, PRS column 8027 includes a separate PRS table corresponding to each request in column 8023. An exemplary PRS table 8201 which corresponds to the "SafeBulkHeadClampSet" CA type extend request 8033 is illustrated. PRS table 8201 includes a parameterization column 8203, a code modification column 8205 and a PLC I/O table modification column 8207.

Column 8203 includes a list of possible parameterizations corresponding to the CA type and request in column 8023. Each parameterization in column 8203 is associated with a separate one of the flag boxes in one of specifications 9002, (s FIG. 85), 9006 (see FIG. 86) or 9008 (see FIG. 87) or is associated with a yield or stop icon in FIG. 72. For example, referring also to FIG. 85, one parameterization 8209 includes "flagged box 9480a" indicating selection of spring return valve 9423. Referring to FIGS. 87 and 106, second exemplary parameterization 2731 is "flagged box 9490" indicating selection of the 1stclamps extend request to be controlled via an HMI. Many other parameterizations are contemplated and would be listed in column 8203.

Column 8205 includes modifications to the code segments in column 8025 which correspond to specific parameterizations in column 8203. For example, modification 8217 corresponding to the "flagged box 9480a" parameterization 8209 is to close switches S3 and S4. Referring also to FIG. 107, when switches S3 and S4 are closed, coils 8041 and 8043 corresponding to outputs 05 and 06 are included in code segment 8032. Modification 8215 corresponding to "flagged box 9490 " parameterization 2731 is to close switch S14. Referring to FIG. 108, when switch S14 is closed, rung 8091 is included in segment 8034 and manual control of the 1stclamps extend request is supported by segment 8034.

Referring still to FIG. 106, column 8207 lists PLC I/O table modifications corresponding to parameterizations in column 8203. For example, referring also to FIG. 85, where box 9840 a is flagged (i.e. parameterization 8209 ), outputs 05 and 06 are added to segment 8060 according to modification 8221. Similarly, where box 9490 is flagged (i.e. parameterization 2731), signal "1stclamps extend request control" corresponding to contact 2135 (see FIG. 108) is provided in segment 8060 to facilitate manual control of the 1stclamps extend request via an HMI, and so on.

Although not illustrated in detail, PRS tables 8301 and 8303 which are similar to table 8201 are provided for each of retract request 8035 and manual request 8038 and are provided for each request associated with other CA types in column 8023.

Referring now to FIGS. 72 85, 86, 87 and 105, in the present example, after compiler 8007 compiles and links execution code segments for each request prior to 1stclamps extend request 5701, deconvolver 8002 causes parser 8005 to provide logic, HMI and diagnostic specifications 9002, 9006 and 9008, respectively, which correspond to 1stclamps extend request 5701 to compiler 8007 and deconvolver 8002 provides the S/I table which corresponds to the "1stclamps extend" request to compiler 8007.

The S/I table (not illustrated) is simply a table which lists all 1stclamps extend request contingencies including the previous request from bar chart 5830 (see FIG. 72), and all safeties and interlocks listed in yield and stop icons, respectively, which are linked to the front edge of the 1stclamps extend request. Thus, referring to FIG. 72, the S/I table for 1stclamps extend request 5701 includes "dumps extend" request 2041 and any contingencies from icon 5703.

Figure 109:
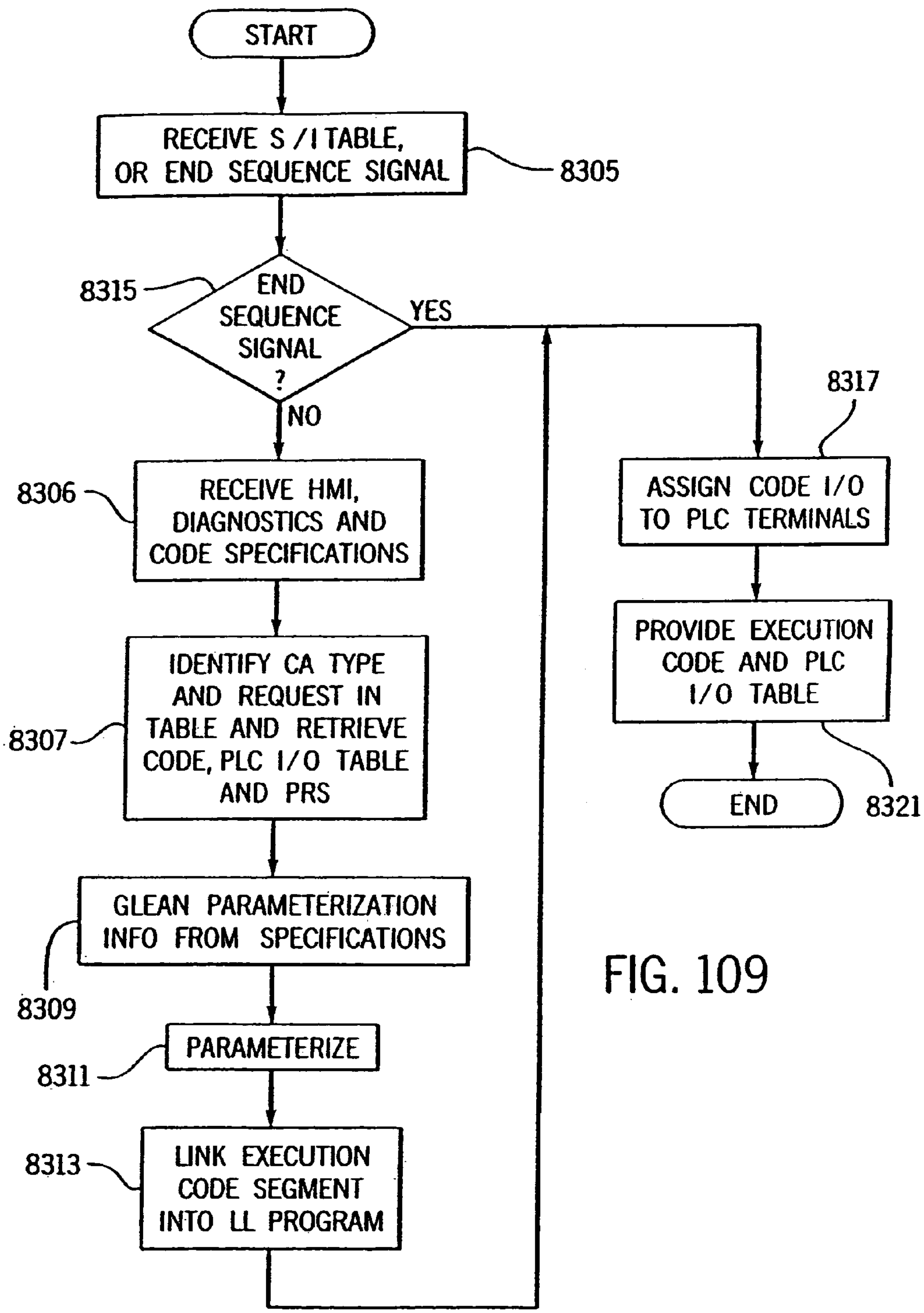
FIG. 109 is a block diagram illustrating an exemplary code and PLC I/O compilation method according to the present invention.

Referring also to FIG. 109, an exemplary compiling process performed by compiler 8007 is illustrated. At block 8305, compiler 8007 either receives an end sequence signal or an S/I table from deconvolver 8002. The end sequence signal indicates that information corresponding to the last request in bar chart 5830 has been compiled and that final compilation steps should be performed by compiler 8007. At decision block 8315, compiler 8007 determines if an end sequence signal has been received. If an end sequence signal has been received control passes to process block 8317. In the present example, 1stclamps extend request 5701 is not the last request in chart 5830 and therefore control passes to block 8306. At block 8306 compiler 8007 receives specifications 9002, 9006 and 9008 and the S/I table corresponding to the 1stclamps instance. At block 8307 compiler 8007 accesses code table (see FIG. 106) 8021 via bus 8013, identifies the "SafeBulkHeadClampSet" CA type 8029 and the extend request 8033 corresponding to 1stclamps extend request 5701 and retrieves code segment 8032, generic segment 8060 and PRS 8201. Continuing, at block 8309 compiler 8007 gleans parameterization information from logic specification 9002, HMI specification 9006, diagnostic specification 9008 and the S/I table. At process block 8311 compiler 8007 applies the rules from PRS table 8201 to the gleaned information to modify the code segment 8032 by opening/closing rung switches and to modify PLC I/O table segment 8060 as described above. In addition, at block 8311 compiler 8007 substitutes the CA name (e.g. 1stclamps) for generic contact and coil descriptions (e.g. "name") in code segment 8032 and in segment 8060.

Next, at process block 8313, compiler 8007 links the parameterized execution code segment 8032 to previously compiled segments to continue to form a complete LL program and adds the parameterized segment 8060 to other I/O specifications corresponding to previously compiled segments.

Referring again to FIGS. 72 and 101, at this point a complete execution code 2009 for controlling mechanical resources as required by bar chart 5830 has been provided. In addition, referring to FIG. 102, columns 2015 and 2017 of PLC I/O table 2011 have been defined. Next, I/O card pins have to be assigned to I/O signals in column 2015.

Herein it is assumed PLC card 2003 includes a sufficient number of I/O terminals to control and monitor the control system corresponding to bar chart 5830 as parameterized by the CA instances related thereto. At block 8317 compiler 8007 assigns signals from PLC I/O table 2011 column 2015 to I/O card terminals P-1, P-2, . . . P-N to fill in column 2019 and complete table 2011. At block 8321, compiler 8007 provides the execution code and PLC I/O table 2011.

Referring again to FIG. 90, the execution code 2009 and PLC I/O table 2011 are provided to database 9810 for storage and subsequent access. In addition, the execution code 2009 and I/O table 2011 are provided to PLC 9814. Referring to FIG. 101, I/O table 2011 is also provided to schematic compiler 8011 via bus 8013.

At this point all of the execution code for controlling the process and control mechanisms associated with bar chart 5830, the code for supporting HMIs as required by HMI specifications and the code for supporting diagnostics as required by diagnostic specifications has been provided.

It should be appreciated that while the compilation example above is described in the context of a system of CAS which does not support status based diagnostics, a similar process would be performed where CAS include status based diagnostics specifications, the only difference being that the generated code would include additional status based diagnostics code. The additional code would facilitate next event reporting such that, when a next event fails to occur, a PLC running the code would indicate the next event to occur thereby indicating symptoms to a system user which the user could then use to determine the likely cause of failure. In this regard, the diagnostics code, a diagnostics processor and a driver which indicates the next event to occur operate together as a diagnostics agent to report failure non-occurring events. This aspect of the invention is described in more detail below.

b. HMI Compiler

Referring again to FIGS. 84 and 101, HMI compiler 8009 receives HMI specification 9006 and diagnostic specification 9008 from code compiler 8007. Exemplary HMI specification table 9460 is illustrated in FIG. 86 while exemplary diagnostic specification table 9600 is illustrated in FIG. 87. With respect to HMI table 9460, compiler 8009 gleans information from table 9460 and, referring also to FIG. 110, applies rules from an HMI building table 8401 to the gleaned information to construct an HMI screen including indicators and control buttons and to link the indicators and buttons to PLC signals.

To this end, building table 8401 defines virtually all HMI indicator and control buttons which may possibly be required to support monitoring and control of CA characteristic. Table 8401 includes a CA type column 8403, a monitorable column 8405 and controllable column 8407. Monitorable column 8405 defines HMI indicators and PLC signal links whereas controllable column 8407 defines control buttons and associated PLC signal links. CA type column 8403 includes a list of every possible CA type which may be selected by a control engineer using resource editor 9802. For the purposes of this explanation, "SafeBulkHeadClampSet" CA type 8029 is listed in column 8403.

Monitorable column 8405 is divided into subcolumns including an I/O column 8411, a "label" column 8413 and a "link" column. I/O column 8411 includes a list of all monitorable inputs and outputs corresponding to each specific CA type in column 8403. Thus, referring to FIGS. 86 on 110, because an exemplary "SafeBulkHeadClampSet" CA type 8029 may include monitorable outputs 01-06 and monitorable inputs I-1-I8, each of outputs 01-06 and each of inputs I-1-I8 are included in column 8411 corresponding to the "SafeBulkHeadClampSet" CA type 8029. In order to simplify FIG. 110, only an abbreviated list (i.e., 01, 02, 03 . . . I1, I2 . . . ) is provided in column 8411.

Column 8413 includes a separate label corresponding to each I/O in column 8411. Each label in column 8413 defines a descriptor for an HMI indicator. For example, for 01 in column 8411, the label in column 8413 is "2-position value hot extend output" 8727 which describes the hot output 01 of two-position valve 9421 in FIG. 85. For 02, in column 8411, the label in column 8413 is "2-position value common extend out" 8729 which describes the common output 02 of two-position valve 9421 in FIG. 85. For I1 in column 8411 the label is "1st cylindicator extend signal" 8731 which describes first cylindicator 9425 input I1 in FIG. 85 and for I2 in column 8411 the label is "1st cylindicator retract signal" 8733 which describes first cylindicator 9425 input I2 in FIG. 85.

Column 8725 includes a PLC signal link for each I/O in column 8411. Each link in column 8725 includes a generic descriptor "name" which, upon compilation, is replaced with the CA instance name. Thus, in the present example, general descriptors "name" in FIG. 110 is replaced with 1stclamps upon compilation. Link "name" I1 corresponds to I1 in column 8411, link "name" I2 corresponds to I2 and so on. After compilation, link "name" I1 and link "name" I2 are replaced by "1stclamps 11 " and "1stclamps I2," respectively, which link associated indicators with similarly identified PLC signals 8046 and 8049, respectively, in table 2011 (ee FIG. 102).

Referring still to FIG. 110, controllable column 8407 is also divided into subcolumns including an I/O column 8417, a "label" column 8419 and a "link" column 8735. Column 8417 includes a list of all I/O and requests which may be selected to be controllable via HMI editor 9804 and which are associated with a corresponding CA type. Referring also to FIG. 86, for the "SafeBulkHeadClampSet" CA type 8029, outputs which may possibly be selected for control include outputs 01 through 06 and requests which may possibly be selected for control include extend and retract requests. To simplify FIG. 110, only outputs 01 and 02 are listed.

Column 8419 includes a separate label corresponding to each I/O or request in column 8417. Each label in column 8419 defines a descriptor for an HMI button. For example, for "extend" in column 8417 the label in column 8419 is "extend" and for "retract" in column 8417 the label in column 8419 is "retract."

Column 8735 includes a PLC signal link for each I/O or request in column 8417. Once again, upon compilation the generic descriptors "name" are replaced with CA instance name "1stclamps." Thus, after compilation, requests extend and retract are linked to "1stclamps extend request control" 2135 and "1stclamps retract request control" 2136 signals, respectively, in table 2011 (see FIG. 102).

Upon compilation, referring to FIGS. 86 and 110, compiler 8009 identifies all selected I/O and requests for monitoring and control in table 9460, identifies the selected I/O and requests in columns 8411 and 8417 and uses information in table 8401 to build an HMI configuration/linking table like table 2027 illustrated in FIG. 103. The compilation process is described in more detail below.

Figure 113:
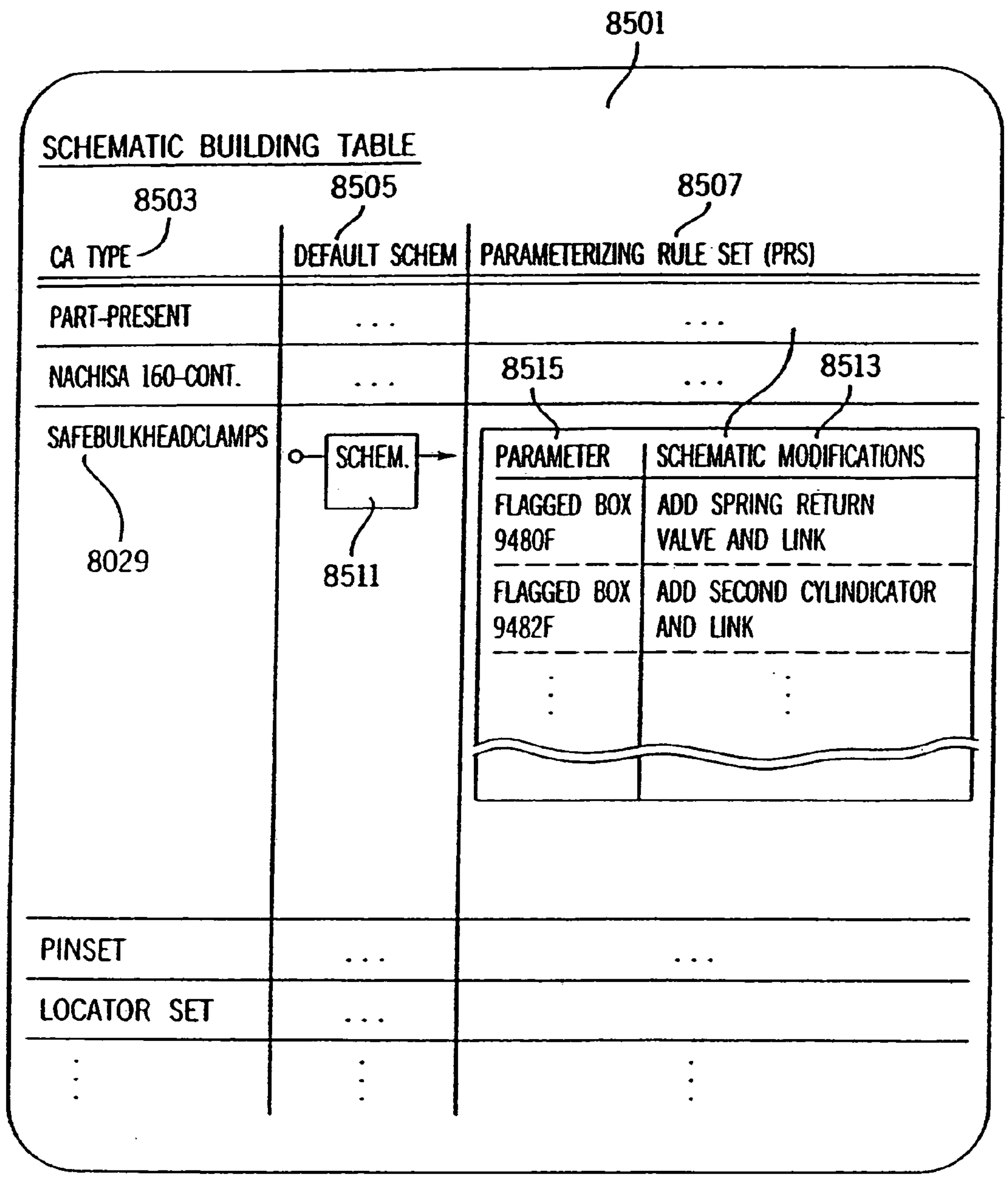
FIG. 113 is a schematic diagram of an exemplary schematic building table.

Referring to FIGS. 87 and 105, with respect to diagnostics table 9600, compiler 8009 gleans information from diagnostic specification table 9600 and, referring also to FIG. 113, applies diagnostics building table 8739 to the gleaned information to construct a parameterized diagnostics linking table (see FIG. 104).

Figure 111:
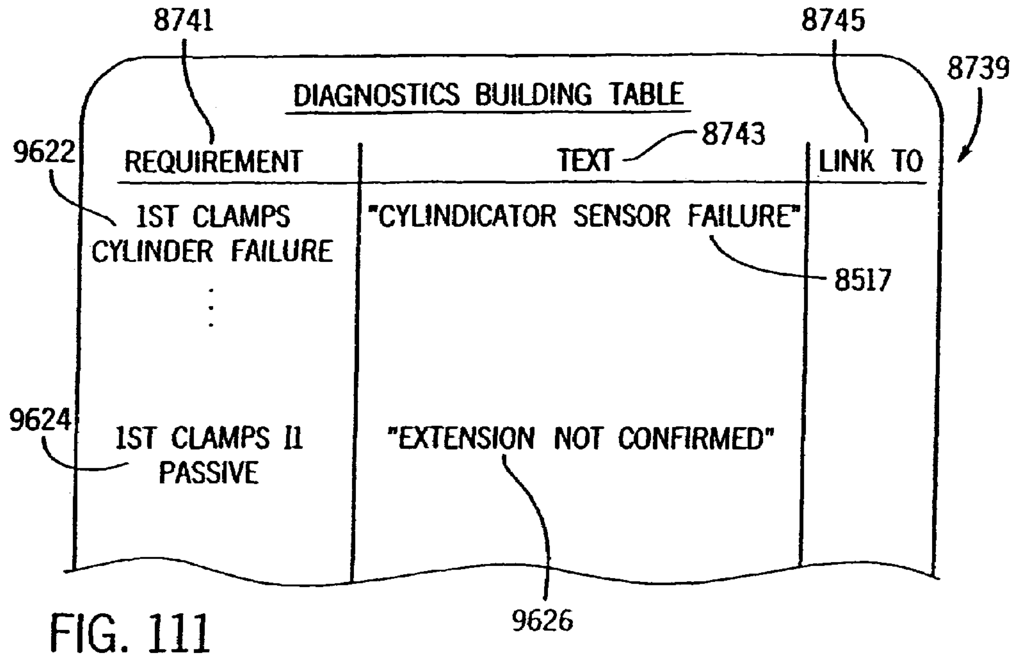
FIG. 111 is a schematic diagram of a exemplary diagnostics building table.

To this end, diagnostics building table 8734 includes a "requirement" column 8741, a "text" column 8743 and a "link" column 8745. Referring to FIGS. 87 and 111, column 8741 includes an entry corresponding to each requirement in column 9604 and text column 8743 includes an entry corresponding to each activity in column 9606. In particular, among other requirements and activities, "1stclamps cylinder failure" requirement 9622 and "1stclamps extend sensor error" requirement 9624 and associated text activities are listed in columns 8741 and 8743.

Upon compilation, referring to FIGS. 87 and 111, compiler 8009 identifies all selected diagnostics requirements for supporting in table 9600 identifies the selected requirements in column 8741 and uses information in table 8739 to build diagnostics linking table like table 2751 illustrated in FIG. 104.

Figure 112:
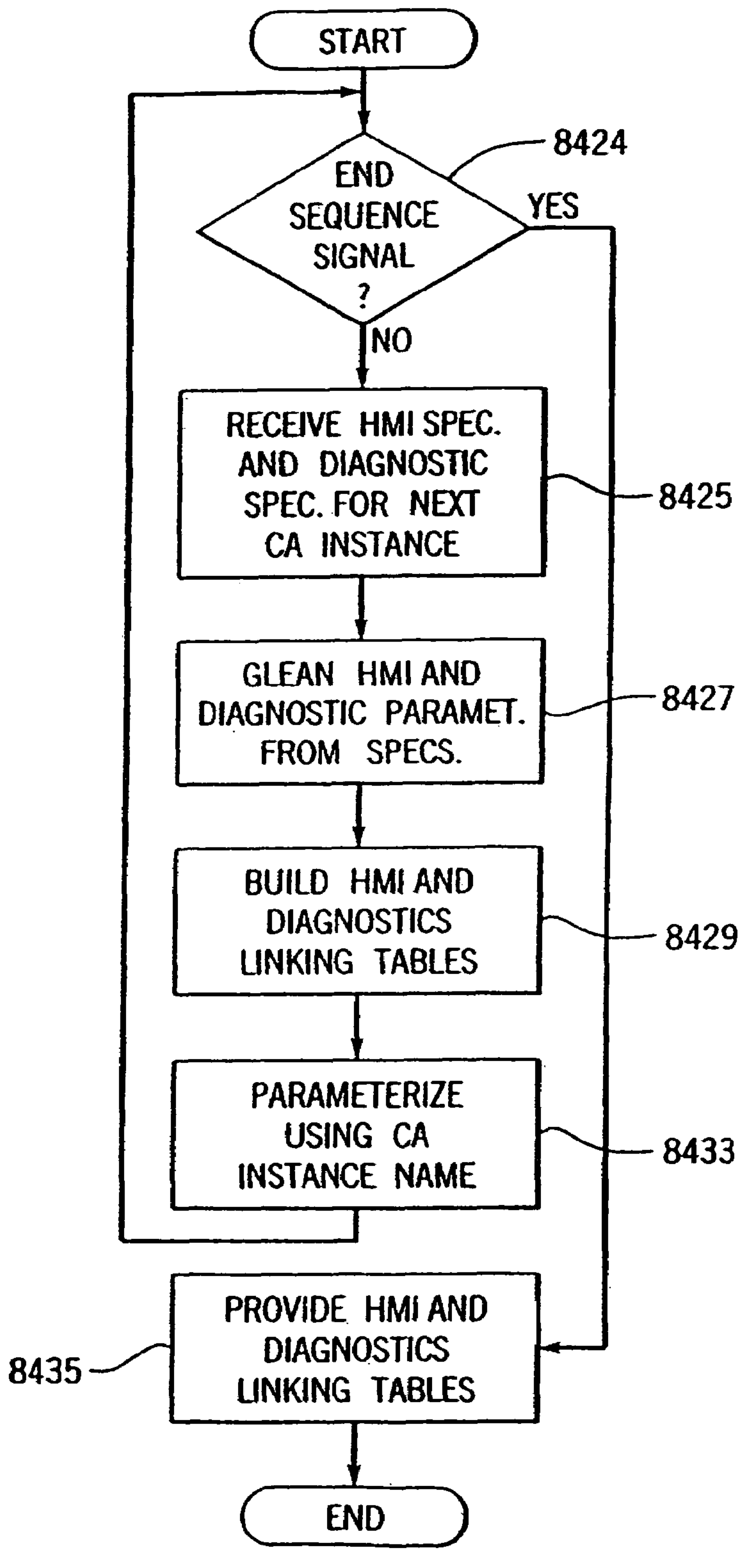
FIG. 112 is a block diagram of an exemplary method for compiling and HMI linking table and a diagnostics linking table.

Referring to FIG. 112, an exemplary compiling process performed by compiler 8009 is illustrated. Referring also to FIGS. 101 and 105, at decision block 8424, processor 8009 determines if deconvolver 8002 has provided an end sequence signal indicating the end of bar chart 5830. IF an end sequence signal has been provided, control skips to block 8435 where compiler 8009 provides both HMI linking table 2027 (see FIG. 103) and diagnostics linking table 2751 (see FIG. 104). In the present example, 1stclamps extend request 5701 is not the last request in chart 5830 and therefore control passes to block 8425.

At block 8425, referring also to FIGS. 86 and 87, compiler 8009 receives HMI and diagnostic specifications 9006, 9008, respectively, corresponding to the 1stclamp CA instance. At process block 8427, compiler 8009 gleans HMI requirements from HMI specification 9006 and gleans diagnostic requirements from the diagnostic specification 9008. To this end, compiler 8009 identifies clear and flagged boxes in each of columns 9464 and 9466, identifies CA instance name 1stclamps and identifies clear and flagged boxes in column 9604.

Referring to FIGS. 105, 110 and 112, at block 8429 compiler 8009 applies table 8401 to the gleaned information and builds parameterized HMI linking table 2027 as illustrated in FIG. 103. To this end, for every selected monitorable I/O (i.e., I/O in FIG. 86 which has been flagged), compiler 8009 identifies the selected I/O in column 8411 of table 8401 and copies the label and link information corresponding thereto into parameterized HMI linking table 2027. Similarly, for every selected I/O and request to be controlled, compiler 8009 identifies the selected I/O or request in column 8417 of table 8401 and copies label and link information into parameterized HMI linking table 2027.

Similarly, referring to FIGS. 105 and 112 at block 8429, compiler 8009 applies table 8739 to the gleaned information and builds parameterized diagnostics linking table 2751 as illustrated in FIG. 104. To this end, for every selected requirement in table 9600 (see FIG. 87), compiler 8009 identifies the requirement in column 8741 of table 8739 and copies the text and link information corresponding thereto into parameterized diagnostics table 2751.

At block 8433, compiler 8009 substitutes CA instance name 1stclamps for generic descriptor "name" and may substitute other specific descriptors as required. Therefore, control passes back to block 8424.

After specifications corresponding to the last request in chart 5830 have been compiled, control passes to process block 8435 where parameterized HMI and diagnostics linking tables 2027 and 2751, respectively, are provided.

Referring also to FIG. 90, HMI and diagnostics linking tables 2027 and 2751 are provided to HMI workstation 8437 via a bus 8439. It is assumed HMI 8437 includes software which, with a simple specification such as tables 2027 and 2751, can configure a screen like exemplary screen 7005 illustrated in FIG. 95. Station 8437 is linked to PLC 9814 via a two-way bus 8441 for controlling PLC 9414 during manual PLC operation and for monitoring PLC 9814 during both normal PLC operation and manual operation.

At this point a complete HMI configuration for both manual and automatic control and monitoring of the control process associated with bar chart 5830 and corresponding CA instances have been provided. In addition, tables for linking HMI tools and diagnostic activities to PLC signals have been provided.

c. Schematic Compiler

Referring again to FIGS. 72, 84, 85A and 105, as compilers 8007 and 8009 process specifications for the 1stclamps CA extend request 5701, schematic compiler 8011 simultaneously processes 1stclamps schematic specification 9004. Compiler 8011 gleans information from schematics specification 9004 and, referring also to FIG. 113, applies rule from a schematic building table 8501 to the gleaned information to build a parameterized control system schematic.

Exemplary schematic building table 8501 includes a CA type column 8503, a default schematic column 8505, and a parameterizing rule set (PRS) column 8507. Column 8503 includes a list of each CA type which a control engineer may select using resource editor 9802. For the purposes of the present explanation, a "SafeBulkHeadClampSet" CA type 8029 is included in column 8503.

Default schematic column 8505 includes a separate default schematic corresponding to each CA type in column 8503. With respect to the "SafeBulkHeadClampSet" CA type 8029, the default schematic is illustrated in block form as 8511. As explained above, for the "SafeBulkHeadClampSet" CA type 8029, required control devices include a two-position valve and at least a first cylindicator. Therefore, default schematic 8511 includes a schematic illustration showing a two-position valve and a single cylindicator linked together in an operative manner.

PRS column includes a separate table corresponding to each CA type in column 8503. Table 8513 corresponds to the "SafeBulkHeadClampSet" CA type 8029 and includes a parameterization column 8515 and a schematic modification column 8517.

Referring to FIGS. 85A and 113, column 8515 includes a list of possible parameterizations which correspond to schematic specification 9004. Column 8517 includes one or more schematic modifications corresponding to each parameterization in column 8515. For example, the schematic modification corresponding to a "flagged box 9480f" parameterization is that a spring return valve representation should be added to default schematic 8511 and linked accordingly. Thus in FIG. 85A, when spring return valve 9523 is selected by placement of a flag in box 9480*f*, the corresponding spring return valve schematic is added to schematic 8511 upon compilation.

Similarly, the modification corresponding to a "flagged box 9482f" parameterization is that a second cylindicator schematic should be added to the default schematic 8511 and linked accordingly. Although not illustrated, other parameterizations and associated schematic modifications are contemplated. Default schematics and associated PRSs are provided in table 8501 for each CA type listed in column 8503.

Referring to FIG. 90, schematic I/O which are to be linked to PLC 9814 are labeled with PLC signal names. For example, referring to FIGS. 85 and 113, two-position valve 9421 receives four PLC outputs 01-04 and therefore schematic 8511 illustrates four PLC outputs 01-04 for linking to PLC 9814. The schematic outputs 01-04 are labeled "1stclamps 01", "1stclamps 02", "1stclamps 03", and "1stclamps 04". If selected for compilation, spring return valve 9423 includes outputs "1stclamps 05", and "1stclamps 06", and corresponding schematic outputs for valve 9423 are so labeled. Cylindicator inputs I1 through I8, if selected are similarly labeled on the schematic.

After a parameterized schematic diagram for the 1stclamps CA instance has been provided, the diagram is linked to previously parameterized diagrams corresponding to other CA instances associated with bar chart 5830. Once all parameterized schematics have been linked and after compiler 8007 has generated a complete PLC I/O table 2011 (see FIG. 102), table 2011 is provided to schematic compiler 8011. Compiler 8011 then schematically links I/O card pin numbers to similarly named schematic I/O. For example, "1stclamps 01" is schematically linked to the pin number corresponding to "1stclamps 01" in table 2011, "1stclamps I1" in the schematic is schematically linked to the pin number corresponding to "1stclamps I1" in table 2011 and so on.

Figure 114:
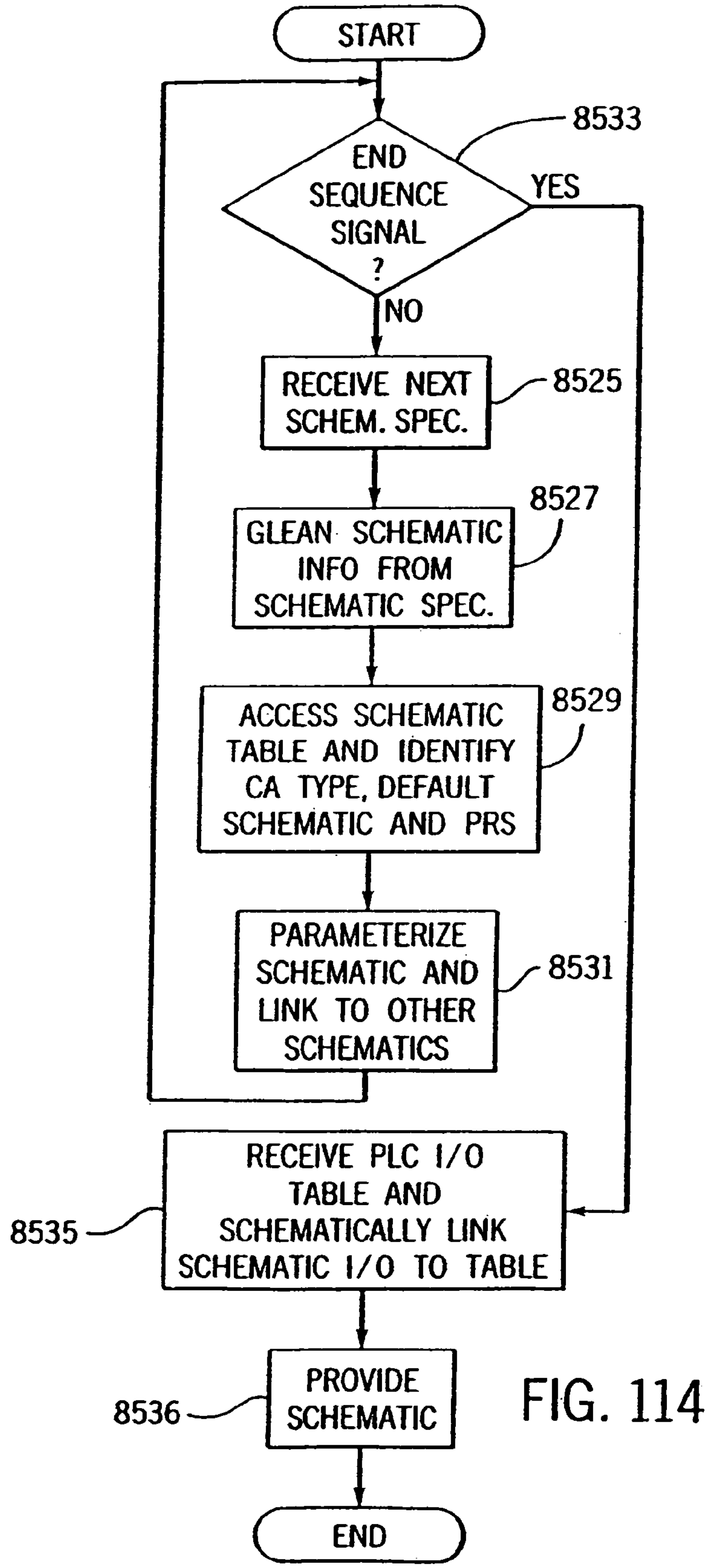
FIG. 114 is a block diagram of an inventive method for compiling a schematic diagram according to the present invention.

Referring now to FIG. 114, an exemplary compiling process performed by compiler 8011 is illustrated. At decision block 8533 compiler 8011 determines if an end sequence signal indicating the end of bar chart 5830 has been received from deconvolver 8002. Where an end sequence signal has been received control passes to block 8535. Where an end sequence signal has not been received control passes to block 8525.

Referring also to FIG. 85A, at block 8525 compiler 8011 receives 1stclamp schematic specification 9004. At process block 8527 compiler 8011 gleans information from schematic specification 9004. Referring also to FIG. 113, at block 8529 compiler 8011 accesses schematic building table 8501, identifies the CA type as a "SafeBulkHeadClampSet" type and identifies the default schematic 8511 and PRS table 8513.

Continuing, at process block 8531, compiler 8011 parameterizes default schematic 8511 as a function of gleaned information and in the manner specified by PRS table 8513 and links the parameterized schematic to previously parameterized schematics. Thereafter control passes back up to decision block 8533.

After the end sequence signal is received and control passes to block 8535, referring also to FIGS. 102 and 105, compiler 8011 receives PLC I/O table 2011 from code compiler 8007 and schematically links schematic I/O to pin numbers in column 2019 which correspond to signals in column 2015 which have names in common with the schematic I/O. Thereafter, at block 8536, compiler 8011 provides the complete parameterized control system schematic.

Referring again to FIG. 90, the schematic can be stored on database 9810 and/or can be printed out via printer 8436.

d. Simulation Compiler

Figure 115:
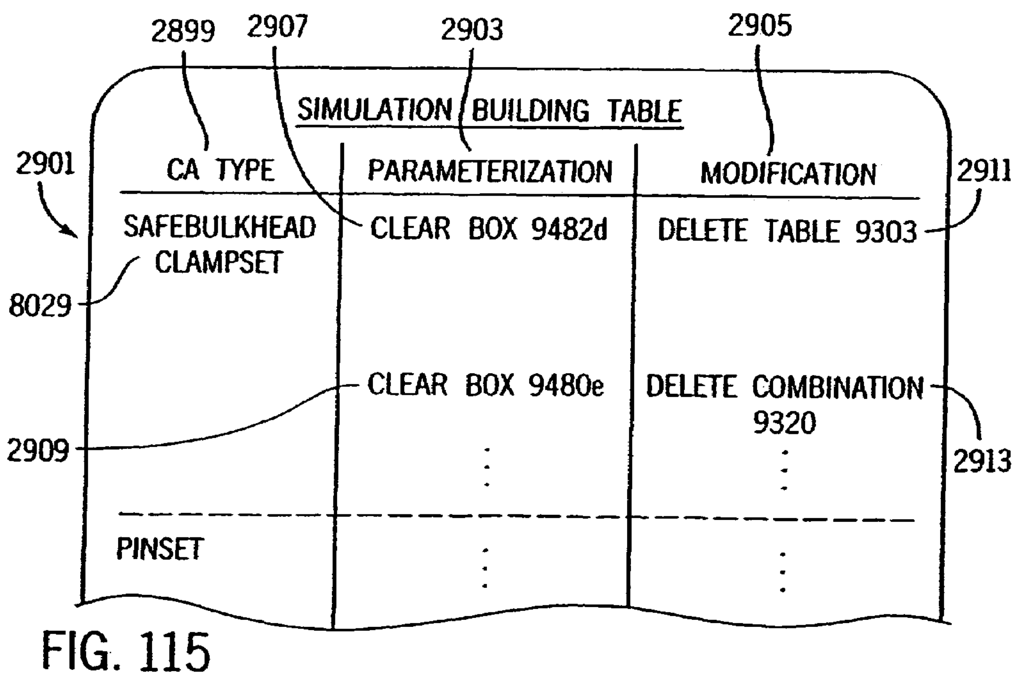
FIG. 115 is a schematic diagram of an exemplary simulation building table.

Referring to FIG. 88 and 105, as compilers 8007, 8009 and 8011 compile specifications corresponding to CA instance 1stclamps, simulation compiler 8010 simultaneously receives simulation specification 9300 corresponding to the 1stclamps CA instance. Referring also to FIG. 115, compiler 8010 gleans information from simulation specification 9300 (see FIG. 88) and applies rules from simulation building table 2901 to the gleaned information to generate video and feedback tables which are in turn used to drive simulator 9816 (see FIG. 90).

To this end, table 2901 includes a CA type column 2899, a "parameterization" column 2903 and a "modifications" column 2405. CA type column 2894 lists every CA type which may be selected via resource editor 9802. For the purposes of the present invention "SafeBulkHeadClampSet" CA type 8029 is included in column 2894.

Referring to FIGS. 88 and 115, parameterization column 2903 lists every possible parameterization which may be selected via resource editor 9802 which may alter and eliminate any aspect of a video or feedback table corresponding to the related CA type in column 2894. For CA type 8029, in the interest of brevity, only two parameterizations are listed in column 2903 including "clear box 9482d" parameterization 2907 and "clear box 9480e" parameterization 2904. Many other parameterizations are contemplated. Column 2905 includes one or more modifications to specification 9300 corresponding to each parameterization in column 2903. For example, modification 2911 is to "delete table 9303" when box 9482*d* is clear. Referring also to FIG. 85, box 9482*d* corresponds to box 9482*a* and hence is clear only when box 9482*a* is clear indicating that a particular CA instance does not require the second cylindicator (i.e. second cylindicator 9427 was not selected). Where second cylindicator 9427 is not selected, video table 9303 is not needed and therefore is deleted.

As another example, modification 2913 is to "delete combination 9320" when box 9480*e* is clear. Referring also to FIG. 85, box 9480*e* corresponds to box 9480*a* and hence is clear only when box 9480*a* is clear indicating that a particular CA instance does not require the spring return valve 9423 (i.e. value 9423 was not selected). Where value 9423 is not selected, combination 9320 no longer is accurate and therefore is deleted.

Figure 116:
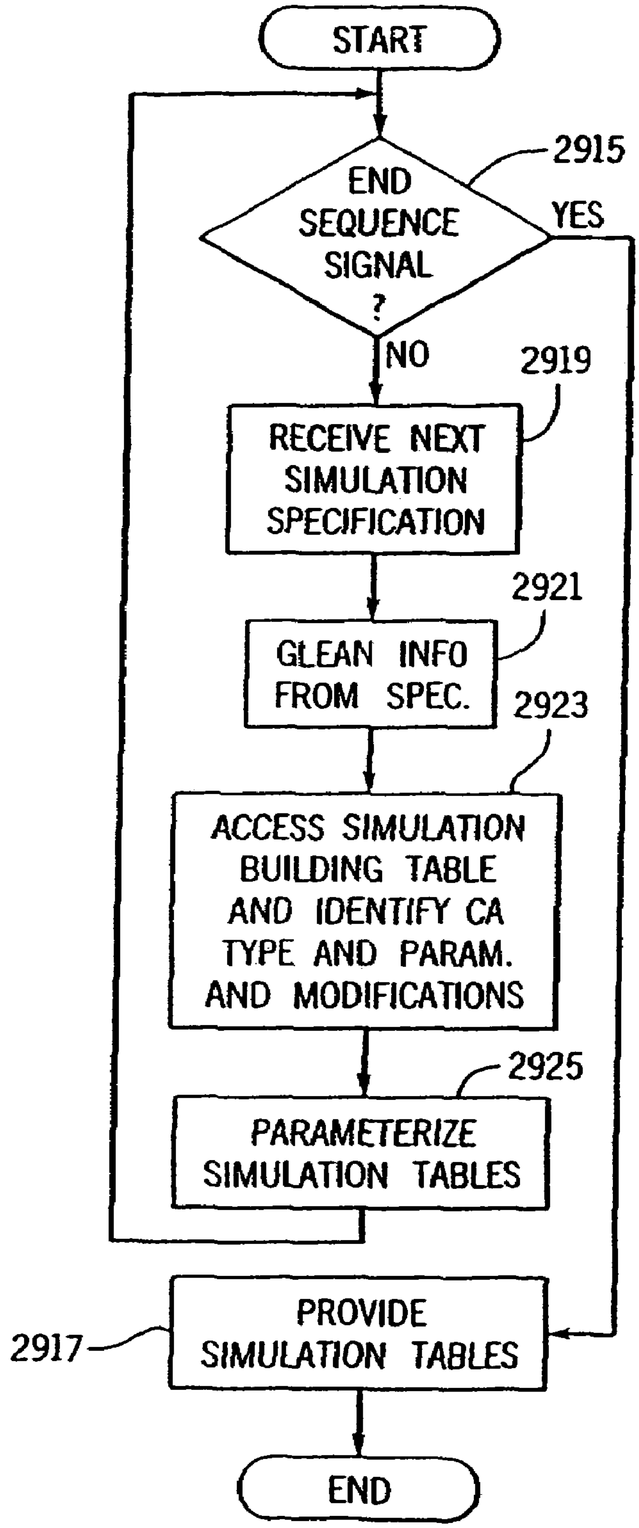
FIG. 116 is a block diagram of a inventive simulation table compiling process.
Figure 119:
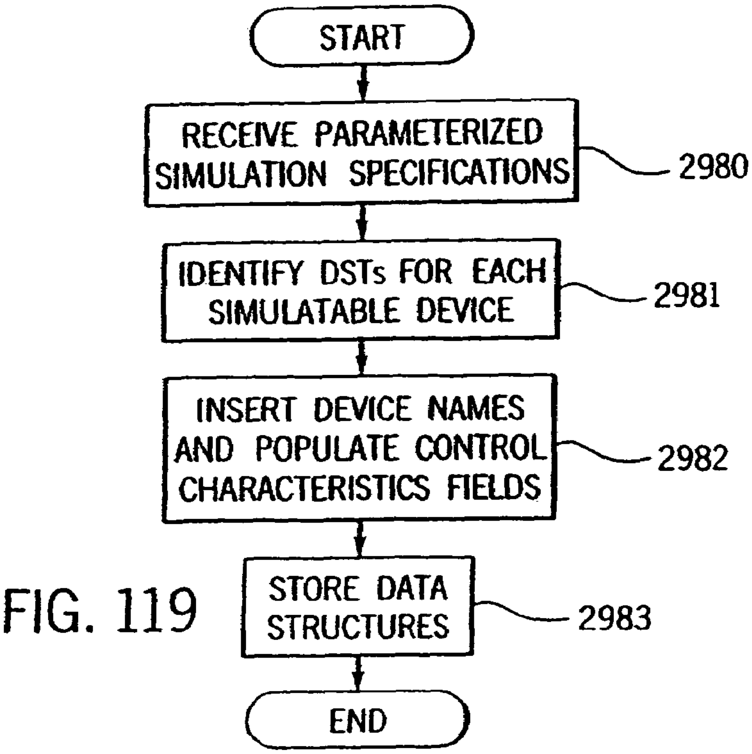
FIG. 119 is a flow chart illustrating an inventive method for combining control characteristics from simulation specifications and circumstantial characteristics to provide instantiated data structure instances.

Referring now to FIG. 116, an exemplary compilation process performed by compiler 9810 is illustrated. At decision block 2915 compiler 8010 determines if an end sequence signal has been received from deconvolver 8002. If an end sequence signal has been received, control passes to block 2917 where compiler 8010 provides all of the parameterized video and feedback tables. If an end sequence signal has not been received, control passes to block 2919.

At block 2919, compiler 8010 receives the simulation specification corresponding to the next request in chart 5830 to be compiled. In the present example, compiler 8010 receives simulation specification 9300 (see FIG. 88) corresponding to CA instance 1stclamps. Continuing, at block 2921 compiler 8010 gleans parameterization information from specification 9300. At block 2923, compiler 8010 accesses simulation building table 2901 and identifies CA type "SafeBulkHeadClampSet" 8029 and corresponding parameterizations and modifications. At block 2925 compiler 8010 parameterizes tables in specification 9300 according to the modifications in table 2901 and then control passes back up to decision block 2915.

Referring to FIGS. 88, 90 and 116, after the end sequence signal is received at block 2915 and control passes to block 2917, compiler 8010 provides a complete set of simulation tables to simulator 9816 via bus 8442.

At this point virtually all controls products have been generated for constructing, simulating and controlling the control system and control process specified in the control bar chart 5830 of FIG. 72. Referring also to FIG. 101, the control products include an execution code 2009, a PLC I/O table 2011, HMI configuration/linking table 2027, diagnostics linking table 2751, a schematic diagram and a simulation table.

An engineer can use the control tools to simulate operation of the mechanical resources or to configure actual mechanical resources thereby building a machine line. In either case, after configuring a line (either virtually or in the real world), a PLC or a soft PLC (i.e., a PLC model run using software) can be used to control the mechanical resources and to generate diagnostic messages which indicate next events to occur. When an expected event does not occur, the diagnostic message indicates the event which did not occur to help an operator determine the cause of the failure.

5. Core Modeling System

Referring to FIGS. 72, 88, 90 and 101, after the execution code 2009 and I/O table 2011 have been provided to PLC 9814, each of HMI linking table 2027 and diagnostics linking table 2751 have been provided to HMI 8437 and a parameterized set of simulation tables (i.e. video and feedback tables) have been provided to CMS 9816, HMI 8427, PLC 9814, CMS 9816, module 9818 and screen 9820 can be used to virtually simulate the process specified by bar chart 5830 and corresponding CA instances. To this end, PLC 9814 is linked to CMS 9816 via a two way bus 6901, CMS 9816 is linked to module 9818 via a two way bus 6903 and module 9181 is linked to screen 9820 via a bus 6905.

To simulate the process of bar chart 5830, PLC 9814 runs the execution code stored therein under the direction of HMI workstation 8437. PLC outputs are provided to CMS 9816 via bus 6901. Referring also to FIG. 88, CMS 9816 accesses parameterized video tables and based on output combinations, selects one or more video clips to be played via screen 9820 to virtually present the process of chart 5830. Video clip commands are provided by CMS 9816 via bus 6903 to module 9818. Module 9818 accesses the video clips required by the received video clip request signals and plays the clips on screen 9820.

As described above, in this embodiment module 9818 is capable of identifying specific events during the playing of video clips and providing feedback signal indicating the event. For example, module 9818 can recognize the end of a video clip and send one or more feedback signals to CMS 9816. When a feedback signal is received, CMS 9816 accesses a feedback table and identifies PLC input signals which correspond to the feedback event. For example, when a 1stclamps extend video is completed, 1stclamps I1 and 1stclamps I2 PLC inputs should be changed to "1" and "0", respectively, (see 9304 in FIG. 88).

CMS 9816 provides the feedback PLC input signals to PLC 9814 via bus 6901. When the input signals are received, referring also to FIG. 101, controller 2001 modifies I/O table 2011 accordingly which affects operation of code 2009.

Referring still to FIGS. 72, 88 and 90, in the alternative, it is contemplated that CMS 9816 may be capable of animating actual CAD images of mechanical resources in the manner prescribed by bar chart 5830.

Although a relatively simple simulation system is described above wherein compilation of a simulation specification results in a PLC mapping table for effectively converting PLC I/O into video commands for module 9818, other simulation systems are contemplated which support other than a one-to-one conversion of I/O combinations to video clips. In this regard, it has been recognized that most mechanical resources do not respond in an ideal manner to requests to perform activities and that operation of mechanical resources in response to specific I/O combinations are not always identical for various reasons. As a simple example, consider a hydraulic clamp and an I/O combination which indicates that the clamp should be extended. Ideally, upon receiving an extend request the clamp immediately changes its position from retracted to extended. In reality, however, because the clamp has mechanical components, clamp extension is not instantaneous but rather requires a finite time. Thus, the mechanical nature of the clamp renders ideal operation impossible (i.e., instantaneous extension is impossible).

An approximation of actual clamp operation can be facilitated by assuming a clamp requires an exemplary estimated amount of time to extend. For example, it may be assumed clamp extension requires five seconds. In this case a simulated video clip may be controlled such that a clamp extension appears to require five seconds to close. While a five second rule may more closely reflect reality than instantaneous closure, such a rule is, as indicated above, nothing more than another estimate of reality which may or may not be accurate.

In most cases a single rule such as extension time will be inaccurate to some unspecified degree. Variance between operation in reality and an estimated operating rule can be attributed to a plethora of sources. For example, in most cases the mechanical resources associated with a CA may be configured using hardware manufactured by any of several different vendors. In the case of clamp extension, all other things being equal, clamp hardware from one vendor may extend in three seconds while another vendor's clamp hardware may require six and one-half seconds while still another vendor's hardware may extend in five seconds. Clearly, in this case, an estimate of five seconds for clamp extension would be inaccurate much of the time.

As another example, variance may also be attributed to resource environment. For instance, a clamp which extends in five seconds in a 70° F. plant where the humidity level is 20% may require nine seconds when the temperature is reduced to 0° F. and 0% humidity and may require seven seconds where the temperature is 70° F. and the humidity is 60%.

Still another exemplary variance source is temporally proximate operation. For instance, a clamp which is routinely and rapidly extended and retracted may require a shorter extension period than the same clamp if the clamp is infrequently extended and retracted. Other variance sources (e.g., wear and tear) are contemplated.

While operating approximations may be sufficient in some simulation applications, such approximations are often insufficient. This is particularly true in complex simulation applications where two or more mechanical resources may cause components to travel within the same space at different times. Similarly, operating approximations are insufficient where process time is important for cost justification purposes. In these cases it is extremely important that, to the extent possible, operating characteristics of resources be modeled as precisely as possible.

Furthermore, discrete event simulation which simply simulates event order and which does not reflect event duration is relatively useless for simulating fault or exception (i.e., process description) management. For instance, with a discrete event simulator, if a user simulates a faulty clamp extend sensor by disabling the sensor, the discrete event simulator simply simulates subsequent events in rapid succession until a "wait" state is achieved. In this case, because the subsequent events are rapidly simulated, very little can be gleaned from the simulation about how the PLC actually managed the faulty condition.

It has been recognized that "relative time" simulation is a better alternative to discrete event simulation for the purpose of identifying fault management operation and capabilities. To this end, it is contemplated that a simulator includes a relative time clock (not illustrated) which, during simulation, maintains relative time periods of event execution. For example, if extension of one clamp type requires two minutes and extension of a second clamp type requires one minute, while the simulator may be programmed to compress event execution time, the period duration ratio remains the same such that, if simulation of the first clamp type is compressed to twenty seconds instead of two minutes, simulation of the second clamp type is compressed to ten seconds to maintain the 2-to-1 ratio. Thus, mechanical resource operating variances corresponding to both event execution and fault maintenance must be specified for each mechanical resource.

Unfortunately it would be extremely difficult to specify all resource operating characteristics (e.g., stroke speed, temperature and humidity effects, etc.) within a CA. While this task is possible and is contemplated by another embodiment of this invention, a huge number of parameterizations and contingencies would have to be specified within the CA which would render the above described parameterization process daunting. For example, resource hardware, operating environment, recent temporal activities and so on would have to be specified for each resource during parameterization. In addition, to modify any one of these aspects a new CA would have to be instantiated, parameterized and compiled. Such complexity no doubt would render the entire system difficult to use.

In addition to mechanical resource operation variance, other information corresponding to a process to be simulated must be specified. For example, in addition to interaction between mechanical resources and PLCs, other entities, referred to collectively herein as "third entities", typically interact with the mechanical resources and PLCs during a process and third entity characteristics need to be modeled. For instance, emergency or "E" stops are routinely provided along machine lines which consist of stop buttons, switches, or the like which can be activated to cut power off to line stations thereby rendering the stations safe for operator entry. E-stop/PLC interaction is typically limited to an activation signal sent to the PLC when an E-stop is activated. Nevertheless, E-stop activation clearly has a much greater affect on line operation than simply signaling a PLC. The E-stop affect has to be modeled to facilitate realistic simulation.

As another instance, a PLC may provide a signal causing a shot pint to be fired into a position which locks two mechanical devices together until the pin is subsequently removed via PLC instruction. In this case, the shot pin has characteristics independent of PLC control which affect the overall process. For instance, even where the process fails for some reason or where an E-stop is used to halt the process, a locking shot pin which locks two devices together remains locked and that characteristic must be modeled.

As still one other instance, many processes require operator intervention or cooperation. For example, a process may require a machine line operator to load components at a first station, subsequently lock-out, tag-out and enter a third station to check part orientation, un-tag and un-lock the third station and so on. Although these process steps are not controlled by a PLC, these steps affect process execution and therefore must be modeled to facilitate realistic process simulation.

According to a second embodiment of the inventive simulation aspect, simulation information required for realistic simulation is divided into first and second information sets including "control characteristics" and the combination of both "circumstantial characteristics" and third entity characteristics. Control characteristics are characteristics which, after CA parameterization, are identical for resources corresponding to the CA and are independent of other circumstantial considerations which affect request execution. For example, in the case of a SafeBulkHeadClampSet CA, control characteristics include the devices specified in the CA, resource requests and corresponding I/O combinations and feedback events and corresponding I/O combinations. From a controls perspective all of these characteristics of resources corresponding to a CA are identical.

Circumstantial characteristics, as the name implies, are characteristics which may vary for a given CA resource and which affect request execution. Circumstantial characteristics may vary with the hardware used to configure a resource, resource environment, recent resource activities, etc. For example, in the case of a clamp, one circumstantial characteristic may be that extending speed is dependent upon environmental and other circumstantial conditions. For instance, extending speed may vary with humidity and/or temperature. Similarly, extending speed may depend on recent clamp activity. To this end, where a clamp has recently been stagnant for a period, extending speed may be slower than where a clamp has been active (i.e., extending and contracting). In addition circumstantial characteristics typically are related to hardware used to configure resources. Thus, hardware from one vendor often will have different extending speed characteristics than hardware from another vendor.

As described above, third entity characteristics include characteristics which are related to system hardware, software and system operators which function, at least in part, independent of PLC commands. These characteristics include the existence of the third entities, how the third entities respond to PLC commands or interact with mechanical resources which are controlled by the PLC and so on.

It has been recognized that because of the universal and fundamental nature of control characteristics, these characteristics can easily be specified within a CA simulation specification. Moreover, control characteristics can generally be gleaned from non-simulation information which must be specified for other CA purposes such as specifying characteristics required to generate execution code.

It has also been recognized that a core modeling system (CMS) can be used to specify circumstantial characteristics of resources and to specify third entity characteristics, to combine circumstantial, control and third entity characteristics via various modeling algorithms and to, based on the combined characteristics , facilitate relatively realistic simulation. Thus, resource characteristics which are essentially unchanging from a controls perspective are specified within the CA simulation specification and all other circumstantial and third entity characteristics which affect request execution are specified by the CMS 9816.

Referring now to FIGS. 90 and 117, an exemplary CMS 9816 which supports this second embodiment of the invention includes a CMS processor 2950, an interface 2948 and a database 2951. Processor 2950 is linked to interface 2948 via a two way bus 2947 and to database 2951 via a two way bus 2949. Processor 2950 is a standard microprocessor which is capable of performing various functions as described in more detail below.

Initially, database 2951 includes data structure templates (DSTs) 2974. After CMS 9816 imports control characteristics from simulation specifications the control characteristics are used to populate DTSs and generate separate instantiated data structure instances 2953 for each resource to be simulated. Data structure instantiation is described in more detail below. Referring still to FIG. 117, a separate DST 2974 is provided for each simulatable resource type which is included in any CA supported by ECDB 9810 (see FIG. 90). For example, referring to FIGS. 84 and 85, CA 9000 includes six resources (i.e., two valves and four cylindicators). Herein it is assumed that CMS 9816 cannot simulate valve movement but can simulate clamp extension and retraction. Therefore, DSTs 2974 do not include a DST which models a valve but do include a DST which models a clamp. Because each of the four cylindicators in CA 9000 may be simulated with a similar video clip, only one DST 2974 is required to support all four cylindicators.

Referring to FIGS. 117 and 118, an exemplary instantiated data structure 2952 is illustrated. While structure 2952 is already instantiated (i.e., control characteristics have already been included), the general configuration of an exemplary DST can be appreciated by examining structure 2952. In this preferred embodiment each DST includes a name field 2970, a control characteristics field 2971 and a circumstantial characteristics field 2972. Name field 1970 and control characteristics field 2971 are initially blank. Upon importation of CA information, name field 2970 is filled with a specific device name. In FIG. 118 field 2970 is already filled with device name "1st cylindicator clamp 2506A".

Despite being initially blank, it is contemplated that field 2971 will have some structure which is designed to receive imported information. In the present example, referring again to FIG. 88 and 118, it is assumed field 2971 is configured to store a portion of a simulation specification corresponding to a single clamp resource. For example, referring also to FIGS. 85 and 88, after parameterization, tables 9302 and 9304 correspond to the "1st cylindicator clamp 2506A" device and therefore, if field 2970 specifies 1st cylindicator clamp 2560A, upon import of CA information, field 2971 is populated with tables 9302 and 9304. Tables 9302 and 9304 are illustrated in field 2972.

Referring still to FIG. 118, circumstantial characteristics field 2972 includes two sub-fields including a circumstantial variables field 2975 and a simulation rule set field 2976. Field 2975 includes a list of variables correlated with variable values which correspond to information which effects request execution. For example, field 2975 may include a temperature variable, a humidity variable, a stroke speed variable during extension of a clamp, etc.

Field 2976 includes simulation rules or modeling algorithms corresponding to requested resource activities. In essence, simulation rules are equations or algorithms which, when an activity is requested, determine how an activity would be executed in the real world and generate data useable by CMS processor 2950 to affect realistic simulation. For example, assume a PLC I/O combination is received by CMS 9816 requesting a retract clamp video clip. Simulation rule set 2976 may include a rule which specifies that at one temperature the video clip will be completed in five seconds and at a relatively cooler temperature the clip will be completed in seven seconds. Here it is contemplated that a simulation temperature is specified in circumstantial information sub-field 2975. Thus, referring also to FIG. 117, when a retract I/O combination is received, processor 2950 accesses an appropriate rule from field 2976, identifies circumstantial information required by the rule, retrieves the circumstantial information from field 2975, applies the rule to the circumstantial information to generate a video clip speed signal and then controls video clip speed to facilitate realistic simulation. Many other simulation rule sets are contemplated.

Figure 121:
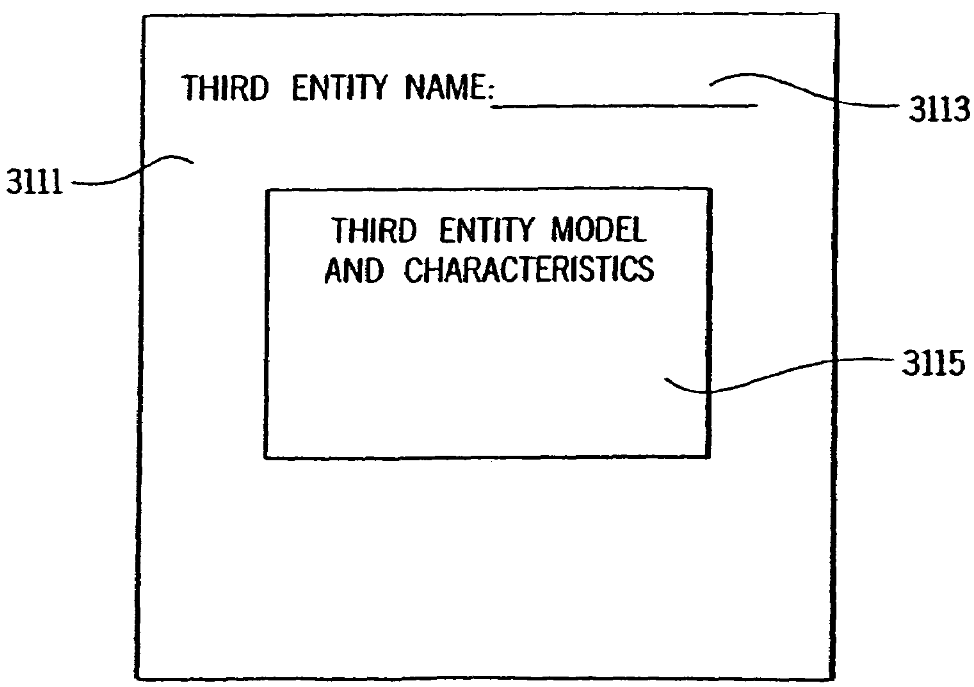
FIG. 121 is a schematic diagram of a third entity data structure according to the present invention.

Referring again to FIG. 117, in addition to including a separate DST 2974 for each simulatable resource type included in a CA supported by ECDB 9810, data base 2951 also includes a separate DST 2974 for each third entity which may be required to interact with PLC and affect process operation. The DSTs 2974 corresponding to third entities are different than the DSTs 2974 corresponding to simulatable resources in that the third entity DSTs 2974 include entity characteristics as well as software which models entity operation. Referring also to FIG. 121, an exemplary third entity DST 3111 is illustrated which includes an entity name field 3113 and an entity model and characteristics field 3115.

Upon compilation of sequenced requests and activities, CA requests and activities are gleaned to identify third entities which must be supported for simulation purposes. For example, where a CA has been instantiated which corresponds to a mechanical resource for firing a shot pin to lock two devices together, the simulation compiler recognizes the simulation requirement that a third entity data structure corresponding to a shot pin be instantiated.

Similarly, where an operator activity has been included in a control bar chart, upon compilation the simulation compiler identifies the requirement for an operator data structure to be instantiated.

As with the resource DSTs described above it is contemplated that the third entity DSTs will include a separate DST for each third entity type. Referring to FIG. 121, upon compilation, when a third entity data structure is required, the compiler identifies the entity type, selects an appropriate DST 2974, populates the DST with an entity name in field 3113 and more populate other information in field 3115 such as, in the case of an E-stop, information indicating how the data structure will interfere with PLC I/O. After compilation, the third entity data structures are used in conjunction with the resource data structure to facilitate simulation.

During simulation it is contemplated that clock speed may be modified by a system operator to increase or decrease simulation speed while still maintaining relative event duration speeds. Thus, if first and second strokes initially require five and ten seconds, respectively, and the clock is slowed down such that the first stroke requires ten seconds, the second stroke would require twenty seconds thereby maintaining the relative durations of the strokes. In this manner relatively unintersecting simulation can be sped through and more interesting simulation can be slowed so that nuances can be identified.

Referring again to FIG. 118, generally, a system user will standardize with specific hardware provided by specific vendors and therefore many simulation rule sets for a specific user can be set once for a particular resource and used routinely thereafter. In fact, it is contemplated that many if not all of the rule sets in field 2976 may be provided by a hardware manufacturer for installation. In addition, in regulated environments where temperature and humidity is maintained at constant levels some of the circumstantial variables in field 2975 may also be set once and used routinely thereafter.

While many of the rule sets in fields 2976 may be provided by manufacturers of hardware, variables in field 2975 often will need to be specified and, in some cases, it may be advantageous to modify the simulation rule sets in field 2976. To this end, referring again to FIG. 117, it is contemplated that interface 2948 is equipped to enable a system user to access DSTs 2974 and/or separate data structures 2953 to modify circumstantial variables and/or rule sets in field 2975 and 2976, respectively. For instance, a temperature variable in field 2975 may be modified to modify a simulation environment. It is also contemplated that interface 2948 may be used to globally modify certain circumstantial variables such as temperature and/or humidity, etc. for all DSTs and all data structures. Any interface known in the computing arts would suffice for these purposes.

Referring again to FIG. 117, upon import of simulation control characteristics a separate data structure 2953 is instantiated for each simulatable resource. A complete example of how data structures 2953 are generated is helpful.

To this end, referring again to FIGS. 88 and 90, as described above, after CA parameterization and compiling (via compiler 9812 ), parameterized simulation specifications like specification 9300 result. Referring also to FIG. 85, herein it will be assumed all resources in logic specification 9002 have been selected via logic specification 9002 and therefore parameterized simulation specification 9300 includes eight tables including a separate video table (e.g. 9302 ) and a separate feedback table (e.g., 9304) corresponding to each of the four cylindicators. Moreover, it will be assumed PLC I/O terminals have been assigned to specific resources for providing I/O requests to resources and receiving I/O feedback signals from sensors.

Referring to FIGS. 88, 90, 117 and 119, at processor block 2980 processor 2950 receives simulation specifications (e.g. 9300) from compiler 9812. At block 2981 processor 2950 identifies a DST (e.g., 2952 ) for each simulatable resource which is included in each simulation specification and a DST for each third entity indicated in a simulation specification or in a sequenced bar chart. For example, as described above, simulation specification 9300 (see FIG. 88) includes four (only two shown) simulatable resources (i.e., the clamps corresponding to the first through fourth cylindicators) and therefore processor 2950 identifies four separate instances of the DST corresponding to a clamp, a separate clamp DST instance for each resource.

Operation of CMS 9816 with respect to each simulatable resource and each third entity is similar and therefore, in the interest of simplifying this explanation, CMS 9816 operation will only be described in the context of the first cylindicator clamp 2506 A resource.

With respect to the clamp 2506 A resource, at block 2982, processor 2950 places the resource name in name field 2970. In addition, at block 2982 processor 2950 populates control characteristics field 2971 with video and feedback tables (i.e., tables 9302 and 9304) corresponding to the clamp 2506 A resource. Finally, at block 2983, processor 2950 stores the instantiated data structure instance. After data structures for each simulatable resource in each imported simulation specification have been stored in database 2951, CMS 9816 is equipped to support relatively realistic simulation.

It should be appreciated that after simulation information has been imported by CMS 9816, the CA has no other function with respect to simulation. In other words, the CA is a specifying data construct simulation is handled by CMS 9816.

Figure 120:
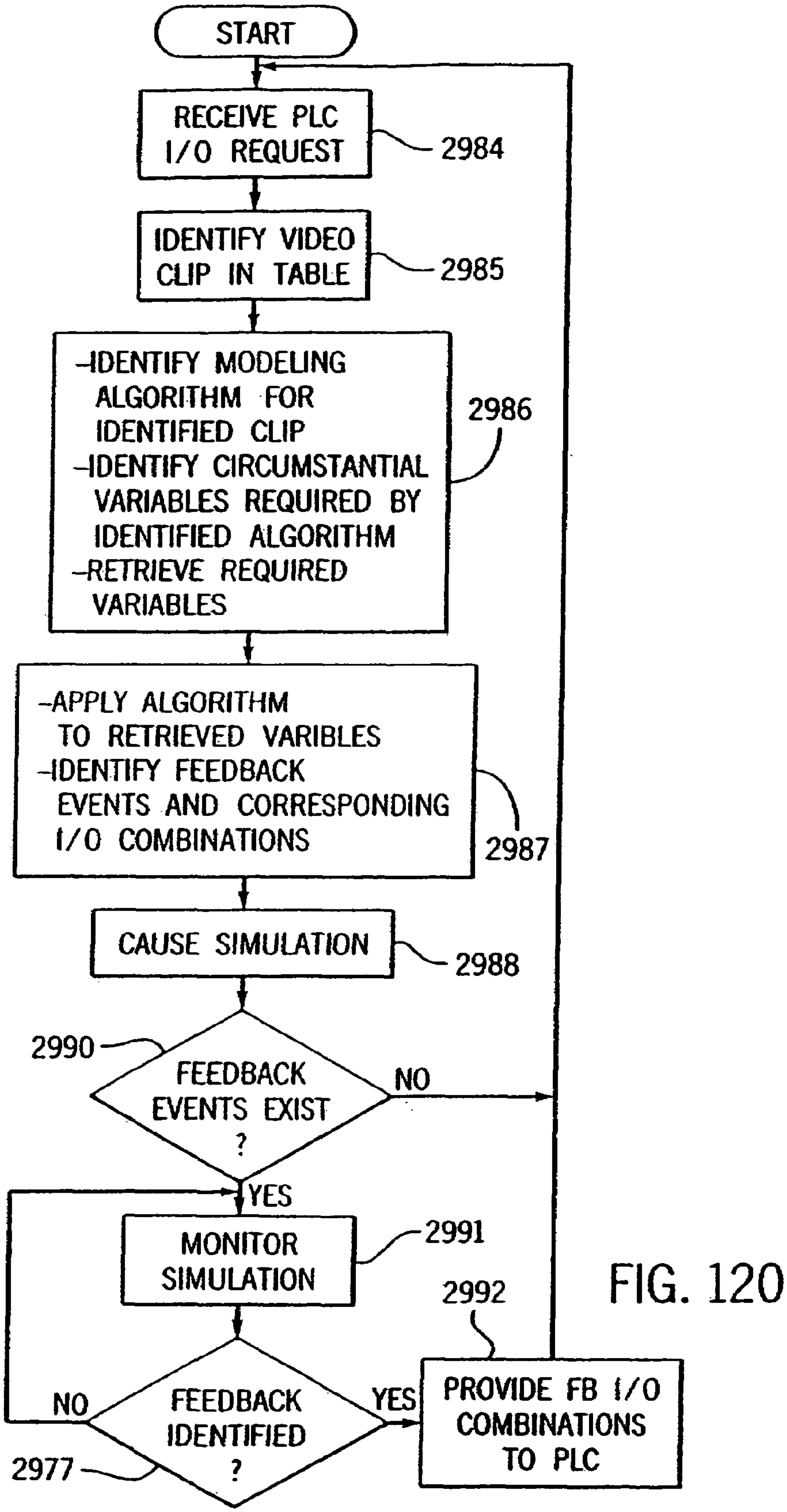
FIG. 120 is a flow chart illustrating an exemplary simulation method using the data structures of FIG. 117.

Referring now to FIG. 120, an exemplary simulation method is illustrated. Referring also to FIGS. 90, 117 and 118, at process block 2984 processor 2950 receives a PLC I/O combination requesting a resource to perform an activity. In this example, it will be assumed the request is for 1st cylindicator clamp 2506A to retract (e.g., see again combination 9320 in FIG. 88). When the I/O combination request is received, at block 2985 processor 2950 maps the combination into the video table associated with the PLC I/O terminals which generated the combination. In the present example, the combination is mapped into a video table (e.g., 9302 in FIG. 88) in control characteristics field 2971 at block 2985. This mapping enables processor 2950 to identify a retract video clip as the clip to be generated.

After a video clip to be generated is identified, at block 2986, processor 2950 accesses simulation rule set 2976 to identify a rule which can be used to identify how circumstantial characteristics affect request execution. Also, at block 2986, processor 2950 identifies circumstantial information required by the identified simulation rules and retrieves the requested information from circumstantial information subfield 2975.

Continuing, at block 2987 processor 2950 applies the identified simulation rules to the retrieved circumstantial information to identify simulation characteristics. At block 2988 processor 2950 accesses the feedback table (e.g., see 9304 in FIG. 88) stored in control characteristics field 2971 to determine if any events corresponding to a video clip should be indicated via feedback I/O to the PLC. If feedback I/O is to be supported, processor 9816 identifies the video clip event which will trigger the feedback signal(s).

At block 2989 processor 2950 controls movie module 9818 such that the video clip is advanced at a speed consistent with a speed corresponding to the circumstantial characteristic's affect on request execution.

Next, at decision block 2990, if feedback events were to be monitored control passes to block 2991. In the alternative control passes back up to block 2984 and the next PLC I/O combination is received. At block 2991, simulation is monitored. At block 2977, when a feedback event (e.g., the end of a clip) is identified, control passes to block 2992 where processor 2950 provides feedback I/O to the PLC.

To simulate varying clamp extending speeds it is contemplated that CMS 9816 can control frame advance speed of video clips displayed by module 9818. Thus, to simulate slow clamp extension CMS 9816 simply slows down frame advance. With a CMS 9816 which can control frame advance, CMS 9816 can identify the end of a stroke or device movement associated with feedback by monitoring frame advance. As in the above example, CMS 9816 provides feedback signals to the PLC to indicate monitored conditions.

In another embodiment some circumstantial characteristics may be specified in a CA simulation specification. For example, consider the exemplary CA described above which specifies a single valve for supporting anywhere from one to four clamps. Also assume that the speed with which a valve can extend clamps is dependent upon the number of clamps which have to be extended (i.e., which are supported) by the valve. Thus, where the valve supports only one clamp, extension may be more rapid than where the valve supports four clamps.

In this case, the number of clamps selected for instantiation in a CA clearly affects request execution in the real world and should be accounted for in virtual simulation. In other words, the number of clamps selected for instantiation in a CA is a circumstantial characteristic which should be included in the CMS modeling algorithms which correspond to the clamps. Despite being a circumstantial characteristic, it makes sense to include clamp quantity in the CA simulation specification as clamp quantity is specified during CA parameterization and can be gleaned from the CA. Thus, in this case, when CA simulation specifications are imported by CMS 9816, both control characteristics and at least one circumstantial characteristic are imported and stored in appropriate data structure fields. It is contemplated that other circumstantial characteristics may also be specified in a simulation specification.

Thus, it should be appreciated that the simulation aspects of the inventive enterprise control system may be embodied in many different forms, the underlying inventive concept being that at least some information specified in CAS is exported from the CAS and used for generating simulation data structures. The data structures are then used by a CMS to drive a virtual video simulation as a function of PLC I/O combinations and to provide feedback to the PLC as simulation progresses. Hence, CAS are used for specifying and data structures are used for simulation.

The invention has been described above with respect to preferred embodiments. Obviously, modifications and alterations will occur to others upon reading and understanding the preceding detailed description. It is intended that the invention be construed as including all such modifications and alterations in so far as they come within the scope of the following claims or equivalents thereof. For example, while some of the specifications described above are described as being essentially complete in that little if any additional information is added to the specifications upon compiling to generate the control tools, it is contemplated that upon compiling information may be added to virtually any of the specifications, the important aspect of the invention being that most information required to specify the control tools is provided in the CAS. For instance, while the schematic specifications described above include compete schematics corresponding to all CDs in a CA, in another embodiment the schematic specification may only include information about CA I/O. In this case it is assumed that a schematic compiler would include schematics for each schematically displayable component of a CA, each schematic including I/O terminals. Upon compiling, each CA specifies the schematics required to illustrate the mechanical resources associated with the CA and also labels I/O terminals with CA I/O. Parameterization still occurs during CA specification and is reflected in the schematics chosen and I/O labeling during compilation. Once again, the important aspect is that information which is specified once and can be used for various specifying purposes is used several times to reduce the work required to configure all of the control tools.

This invention relates to electronic programmable controllers for operating industrial equipment and visualizing the industrial environment being controlled. Electronic programmable controllers utilize a programming language to develop control programs to control industrial equipment.

Programmable controllers are well-known systems for operating industrial equipment, such as assembly lines and machine tools, in accordance with a stored program. In these controllers, a stored program is executed to examine the condition of specific sensing devices on the controlled equipment, and to energize or de-energize selected operating devices on that equipment contingent upon the status of one or more of the examined sensing devices. The program not only manipulates single-bit input and output data representing the state of the sensing and operating devices, but also performs arithmetic operations, timing and counting functions, and more complex processing operations.

One industry that extensively uses programmable controllers is the automotive industry. In the automotive industry, various automotive parts are conveyed along machine lines consisting of many consecutive workstations. Most workstations include at least one tool that performs some function to alter the characteristics of work pieces as they are delivered to the station. For example, an unfinished cast engine block that requires a plurality of holes, bores, and threads, as well as other metal-removing procedures, may be provided at the beginning of a machine line that produces finished engine blocks. The machine line may consist of any number of different stations, each station performing a different procedure on the unfinished block. An indexer in the form of a transfer bar can be arranged to move each block from one station to the next following a completed process. Typically, at each station the block would be clamped prior to any metal-removing operation.

In this type of system, a programmable controller would receive inputs from all of the various tools at all of the workstations and would provide activating output signals to synchronize machine operation. During metal-removing periods with the transfer bar out of the way, all of the tools would perform their functions. In between metal-removing periods during transfer periods, the tools would be parked, the clamps unclamped, and the transfer bar would advance work pieces from one station to the next.

Industrial controllers are frequently programmed in Ladder Logic (LL) where instructions are represented graphically by "contacts" and "coils" of virtual relays connected and arranged in ladder-like rungs across power rails. LL, with its input contacts and output coils, reflects the emphasis in industrial control on the processing of large amounts of input and output data.

LL also reflects the fact that most industrial control is "real time"; that is, an ideal industrial controller behaves as if it were actually composed of multiple relays connected in parallel rungs to provide outputs in essentially instantaneous response to changing inputs. Present industrial controllers do not, in fact, employ separate parallel relay-like structures, but instead simulate the parallel operation of the relays by means of a conventional Harvard or Von Neumann-type computer processor which executes instructions one at a time, sequentially. The practical appearance of parallel operation is obtained by employing extremely fast processors in the execution of the sequential control program.

As each rung is executed, inputs represented by the contacts are read from memory (as obtained from inputs from the controlled process or the previous evaluation of coils of other rungs). These inputs are evaluated according to the logic reflected in the connection of the contacts into one or more branches within the rungs. Contacts in series across a rung represent boolean AND logic whereas contacts in different branches and thus in parallel across the rung represent boolean OR logic.

Typically a single output coil at the end of each rung is set or reset. Based on the evaluation of that rung, this setting or resetting is reflected in the writing to memory of a bit (which ultimately becomes an output to the industrial process or to another LL rung).

Once a given rung is evaluated the next rung is evaluated and so forth. In the simplest form of LL programming there are no jumps, i.e. all rungs are evaluated in a cycle or "scan" through the rungs. This is in contrast to conventional computer programming where branch and jump instructions cause later instructions or groups of instructions to be skipped, depending on the outcome of a test associated with those branch or jump instructions.

While LL is well suited for controlling industrial processes like those in the automotive industry, LL programming is not an intuitive process and, therefore, requires highly skilled programmers. Where hundreds of machine tool movements must be precisely synchronized to provide a machining process, programming in LL is extremely time-consuming. The time and relative skill associated with LL programming together account for an appreciable percentage of overall costs associated with a control system. In addition, the final step in LL programming is typically a lengthy debugging and reworking step that further adds to overall system costs.

One way to streamline any type of programming is to provide predefined language modules, expressed in a language such as LL, which can be used repetitively each time a specific function is required. Because of the similar types of tools and movements associated with different machine-line stations, industrial control would appear to be an ideal industry for such language modules.

The predefined logic module approach works quite well for certain applications, like small parts-material handling or simple machining. The reason for this is that the LL required for these applications tends to be very simple. In small parts material handling applications the I/O count is low and the interfaces between modules are minimal. In fact, the mechanisms are often independent units, decoupled from neighboring mechanisms by part buffers such that no signals are required to be exchanged between modules. These "loosely coupled" systems lend themselves to "cut and paste" programming solutions.

But the predefined, fixed logic module approach does not work well for other applications, for example metal-removing applications. There are two main reasons for this. First, there can be considerable variation in how components, such as sensors and actuators, combine to produce even simple mechanisms. Second, processes like metal removing normally requires tightly controlled interaction between many individual mechanisms. Exchanging signals called interlocks, between the control logic modules of the individual mechanism controls the interaction. The application of specific interlocks depends on knowledge of the process and the overall control strategy, information not generally needed, or knowable, when the control logic for each mechanism is defined.

For example, a drill is a typical metal-removing tool used in the automotive industry. In this example an ideal drill is mounted on a carriage that rides along a rail between two separate limiting positions on a linear axis, an advanced position and a returned position. Two limit switches, referred to herein as returned and advanced LSs, are positioned below the carriage and, when tripped, signal that the drill is in the returned and advanced positions, respectively. Two separate dogs (i.e. trigger extensions), an advanced dog and a returned dog, extend downwardly from the bottom of the carriage to trip the LSs when the advanced and returned positions are reached, respectively. In the ideal case, both LSs may be assumed to be wired in the same "normally opened" manner, so that electrically speaking they are open when released and closed when triggered. In this ideal case, where the physical characteristics of the switches are limited, a single LL logic rung can determine when the drill is in the returned position and another rung can determine when the drill is in the advanced position.

Unfortunately, in reality, there are electrically two types of LSs, one LS type being wired normally opened and the other type wired normally closed. Furthermore, any LS can be mechanically installed in a tripped-when-activated configuration, or a released-when-activated configuration. All combinations of these types are used for various types of applications. Thus, application requirements may demand control logic capable of handling any configuration of LS types.

Simple mathematics demonstrates that with two different electrical types of LSs and two mechanical configurations, there are sixteen possible configurations of a two-position linear slide. Consider the language modules required to implement position logic for all these configurations. To accommodate all sixteen-switch configurations, there could be sixteen different language modules, each containing fixed LL logic, and each named for the case it could handle. In this case, there would be duplicate logic under different names. Alternatively, four unique language modules could be provided, but then the user would have difficulty identifying which of the sixteen physical configurations that the four modules could handle.

Clearly, even for a simple drill mounted on a two position linear slide, application variables make it difficult to provide a workable library of fixed language modules. Adding more switches to the linear slide only increases, to an unmanageable level, the number of language modules required in the library.

Moreover, the contents of a complete language module for a drill must also consider other variables. These variables include, for example, the number and type of actuators required; the type of spindle, if any; whether or not a bushing plate is required; what type of conveyor is used; whether or not the drill will include an operator panel to enable local control. If an operator panel is included, what type of controls (i.e. buttons, switches and indicator lights) are required, just to name a few. Each tool variable increases the required number of unique LL modules by more than a factor of two, which makes it difficult at best to provide an LL library module for each possible drill configuration.

Taking into account the large number of different yet possible machine-line tools, each tool having its own set of variables, the task of providing an all-encompassing library of fixed language modules becomes impractical. Even if such a library could be fashioned, the task of choosing the correct module to control a given tool would probably be more difficult than programming the required LL logic from scratch.

For these reasons, although attempts have been made at providing comprehensive libraries of fixed language modules, none has proven particularly successful and much LL programming is done from scratch.

Manufacturing customers have long desired an integrated environment for generating an initial design schematic specifying a functional description of a manufacturing environment without the need for specifying product and manufacturing details. The system is provided with a designer studio that utilizes a common database of pre-architected modules to integrate a total system solution for the enterprise. The pieces of this system include design, simulation, implementation and maintenance information for both product and manufacturing.

The foregoing problems are overcome in an illustrative embodiment of the invention in which a system for designing, simulating, implementing and maintaining an enterprise solution for an enterprise is disclosed. The system includes software that controls an enterprise. The software includes one or more components for controlling one or more aspects of an industrial environment with code that creates a database of components, each of the components containing control, diagnostic and resource information pertaining to enterprise resources utilized in the industrial environment. The software system also generates code that controls resources comprising cognitive and timing information that synchronizes events throughout the enterprise. The database of components includes code that updates the database to reflect changes in the enterprise that manage the design, simulation, implementation and maintenance of a manufacturing enterprise utilizing the database of components.

The system software defines and illustrates the electrical, pneumatic, hydraulic, logic, diagnostics, external behavior, controlled resources and safety elements of an enterprise control system. The elements of the control system are encapsulated in objects of an object-oriented framework within a control assembly. The control assembly is the fundamental building block for providing object-oriented control of the enterprise.

A control assembly component is a deployable control subsystem that provides an interface using a common object model that is configurable. The control assembly exposes an interface of viewable elements. The logic associated with the interface allows the interface designer to query the control assembly to obtain the viewable elements and retrieve the properties of these viewable elements.

A preferred embodiment of a system in accordance with the present invention is preferably practiced in the context of a personal computer such as an IBM, Apple Macintosh or UNIX based computer. A representative hardware environment is depicted in FIG. 1A, which illustrates a typical hardware configuration of a workstation in accordance with a preferred embodiment having a central processing unit 10, such as a microprocessor, and a number of other units interconnected via a system bus 12. The workstation shown in FIG. 1A includes a Random Access Memory (RAM) 14, Read Only Memory (ROM) 16, an I/O adapter 18 for connecting peripheral devices such as disk storage units 20 to the bus 12, a user interface adapter 22 for connecting a keyboard 24, a mouse 26, a speaker 28, a microphone 32, and/or other user interface devices such as a touch screen (not shown) to the bus 12, communication adapter 34 for connecting the workstation to a communication network (e.g., a data processing network) and a display adapter 36 for connecting the bus 12 to a display device 38. The workstation typically has resident thereon an operating system such as the Microsoft Win/95NT Operating System (OUTSTANDING) or UNIX OUTSTANDING. Those skilled in the art will appreciate that the present invention may also be implemented on platforms and operating systems other than those mentioned.

A preferred embodiment is written using JAVA, C, and the C++ language and utilizes object oriented programming methodology. Object oriented programming (OOP) has become increasingly used to develop complex applications. As OOP moves toward the mainstream of software design and development, various software solutions will need to be adapted to make use of the benefits of OOP. A need exists for these principles of OOP to be applied to a messaging interface of an electronic messaging system such that a set of OOP classes and objects for the messaging interface can be provided.

OOP is a process of developing computer software using objects, including the steps of analyzing the problem, designing the system, and constructing the program. An object is a software package that contains both data and a collection of related structures and procedures. Since it contains both data and a collection of structures and procedures, it can be visualized as a self-sufficient component that does not require other additional structures, procedures or data to perform its specific task. OOP, therefore, views a computer program as a collection of largely autonomous components, called objects, each of which is responsible for a specific task. This concept of packaging data, structures, and procedures together in one component or module is called encapsulation.

In general, OOP components are reusable software modules that present an interface that conforms to an object model and which are accessed at run-time through a component integration architecture. A component integration architecture is a set of architecture mechanisms which allow software modules in different process spaces to utilize each others capabilities or functions. This is generally done by assuming a common component object model on which to build the architecture.

It is worthwhile to differentiate between an object and a class of objects at this point. An object is a single instance of the class of objects, which is often just called a class. A class of objects can be viewed as a blueprint, from which many objects can be formed.

OOP allows the programmer to create an object that is a part of another object. For example, the object representing a piston engine is said to have a composition-relationship with the object representing a piston. In reality, a piston engine comprises a piston, valves and many other components; the fact that a piston is an element of a piston engine can be logically and semantically represented in OOP by two objects.

OOP also allows creation of an object that "depends from" another object. If there are two objects, one representing a piston engine and the other representing a piston engine wherein the piston is made of ceramic, then the relationship between the two objects is not that of composition. A ceramic piston engine does not make up a piston engine. Rather it is merely one kind of piston engine that has one more limitation than the piston engine; its piston is made of ceramic. In this case, the object representing the ceramic piston engine is called a derived object, and it inherits all of the aspects of the object representing the piston engine and adds further limitation or detail to it. The object representing the ceramic piston engine "depends from" the object representing the piston engine. The relationship between these objects is called inheritance.

When the object or class representing the ceramic piston engine inherits all of the aspects of the objects representing the piston engine, it inherits the thermal characteristics of a standard piston defined in the piston engine class. However, the ceramic piston engine object overrides these ceramic specific thermal characteristics, which are typically different from those associated with a metal piston. It skips over the original and uses new functions related to ceramic pistons. Different kinds of piston engines will have different characteristics, but may have the same underlying functions associated with it (e.g., how many pistons in the engine, ignition sequences, lubrication, etc.). To access each of these functions in any piston engine object, a programmer would call the same functions with the same names, but each type of piston engine may have different/overriding implementations of functions behind the same name. This ability to hide different implementations of a function behind the same name is called polymorphism and it greatly simplifies communication among objects.

With the concepts of composition-relationship, encapsulation, inheritance and polymorphism, an object can represent just about anything in the real world. In fact, our logical perception of the reality is the only limit on determining the kinds of things that can become objects in object-oriented software. Some typical categories are as follows:

Objects can represent physical objects, such as automobiles in a traffic-flow simulation, electrical components in a circuit-design program, countries in an economics model, or aircraft in an air-traffic-control system.

Objects can represent elements of the computer-user environment such as windows, menus or graphics objects.

An object can represent an inventory, such as a personnel file or a table of the latitudes and longitudes of cities.

An object can represent user-defined data types such as time, angles, and complex numbers, or points on the plane.

With this enormous capability of an object to represent just about any logically separable matters, OOP allows the software developer to design and implement a computer program that is a model of some aspects of reality, whether that reality is a physical entity, a process, a system, or a composition of matter. Since the object can represent anything, the software developer can create an object which can be used as a component in a larger software project in the future.

If 90% of a new OOP software program consists of proven, existing components made from preexisting reusable objects, then only the remaining 10% of the new software project has to be written and tested from scratch. Since 90% already came from an inventory of extensively tested reusable objects, the potential domain from which an error could originate is 10% of the program. As a result, OOP enables software developers to build objects out of other, previously built, objects.

This process closely resembles complex machinery being built out of assemblies and sub-assemblies. OOP technology, therefore, makes software engineering more like hardware engineering in that software is built from existing components, which are available to the developer as objects. All this adds up to an improved quality of the software as well as an increased speed of its development.

Programming languages are beginning to fully support the OOP principles, such as encapsulation, inheritance, polymorphism, and composition-relationship. With the advent of the C++ language, many commercial software developers have embraced OOP. C++ is an OOP language that offers a fast, machine-executable code. Furthermore, C++ is suitable for both commercial-application and systems-programming projects. For now, C++ appears to be the most popular choice among many OOP programmers, but there is a host of other OOP languages, such as Smalltalk, common lisp object system (CLOS), and Eiffel. Additionally, OOP capabilities are being added to more traditional popular computer programming languages such as Pascal.

The benefits of object classes can be summarized, as follows:

Objects and their corresponding classes break down complex programming problems into many smaller, simpler problems.

Encapsulation enforces data abstraction through the organization of data into small, independent objects that can communicate with each other. Encapsulation protects the data in an object from accidental damage, but allows other objects to interact with that data by calling the object=s member functions and structures.

Subclassing and inheritance make it possible to extend and modify objects through deriving new kinds of objects from the standard classes available in the system. Thus, new capabilities are created without having to start from scratch.

Polymorphism and multiple inheritance make it possible for different programmers to mix and match characteristics of many different classes and create specialized objects that can still work with related objects in predictable ways.

Class hierarchies and containment hierarchies provide a flexible mechanism for modeling real-world objects and the relationships among them.

Libraries of reusable classes are useful in many situations, but they also have some limitations. For example:

Complexity. In a complex system, the class hierarchies for related classes can become extremely confusing, with many dozens or even hundreds of classes.

Flow of control. A program written with the aid of class libraries is still responsible for the flow of control (i.e., it must control the interactions among all the objects created from a particular library). The programmer has to decide which functions to call at what times for which kinds of objects.

Duplication of effort. Although class libraries allow programmers to use and reuse many small pieces of code, each programmer puts those pieces together in a different way. Two different programmers can use the same set of class libraries to write two programs that do exactly the same thing but whose internal structure (i.e., design) may be quite different, depending on hundreds of small decisions each programmer makes along the way. Inevitably, similar pieces of code end up doing similar things in slightly different ways and do not work as well together as they should.

Class libraries are very flexible. As programs grow more complex, more programmers are forced to reinvent basic solutions to basic problems over and over again. A relatively new extension of the class library concept is to have a framework of class libraries. This framework is more complex and consists of significant collections of collaborating classes that capture both the small scale patterns and major mechanisms that implement the common requirements and design in a specific application domain. They were first developed to free application programmers from the chores involved in displaying menus, windows, dialog boxes, and other standard user interface elements for personal computers.

Frameworks also represent a change in the way programmers think about the interaction between the code they write and code written by others. In the early days of procedural programming, the programmer called libraries provided by the operating system to perform certain tasks, but basically the program executed down the page from start to finish, and the programmer was solely responsible for the flow of control. This was appropriate for printing out paychecks, calculating a mathematical table, or solving other problems with a program that executed in just one way.

The development of graphical user interfaces began to turn this procedural programming arrangement inside out. These interfaces allow the user, rather than program logic, to drive the program and decide when certain actions should be performed. Today, most personal computer software accomplishes this by means of an event loop that monitors the mouse, keyboard, and other sources of external events and calls the appropriate parts of the programmer's code according to actions that the user performs. The programmer no longer determines the order in which events occur. Instead, a program is divided into separate pieces that are called at unpredictable times and in an unpredictable order. By relinquishing control in this way to users, the developer creates a program that is much easier to use. Nevertheless, individual pieces of the program written by the developer still call libraries provided by the operating system to accomplish certain tasks, and the programmer must still determine the flow of control within each piece after it's called by the event loop. Application code still "sits on top of" the system.

Even event loop programs require programmers to write a lot of code that should not need to be written separately for every application. The concept of an application framework carries the event loop concept further. Instead of dealing with all the nuts and bolts of constructing basic menus, windows, and dialog boxes and then making these things all work together, programmers using application frameworks start with working application code and basic user interface elements in place. Subsequently, they build from there by replacing some of the generic capabilities of the framework with the specific capabilities of the intended application.

Application frameworks reduce the total amount of code that a programmer has to write from scratch. However, because the framework is really a generic application that displays windows, supports copy and paste, and so on, the programmer can also relinquish control to a greater degree than event loop programs permit. The framework code takes care of almost all event handling and flow of control. The programmer's code is called only when the framework needs it (e.g., to create or manipulate a proprietary data structure).

A programmer writing a framework program not only relinquishes control to the user (as is also true for event loop programs), but also relinquishes the detailed flow of control within the program to the framework. This approach allows the creation of more complex systems that work together in interesting ways, as opposed to isolated programs, having custom code, being created over and over again for similar problems.

Thus, as is explained above, a framework basically is a collection of cooperating classes that make up a reusable design solution for a given problem domain. It typically includes objects that provide default behavior (e.g., for menus and windows). Programmers use it by inheriting some of that default behavior and overriding other behavior so that the framework calls application code at the appropriate times.

There are three main differences between frameworks and class libraries:

Behavior versus protocol. Class libraries are essentially collections of behaviors that you can call when you want those individual behaviors in your program. A framework on the other hand, provides not only behavior but also the protocol or set of rules that govern the ways in which behaviors can be combined, including rules for what a programmer is supposed to provide versus what the framework provides.

Call versus override. With a class library, the class member is used to instantiate objects and call their member functions. It is possible to instantiate and call objects in the same way with a framework (i.e., to treat the framework as a class library), but to take full advantage of a framework=s reusable design, a programmer typically writes code that overrides and is called by the framework. The framework manages the flow of control among its objects. Writing a program involves dividing responsibilities among the various pieces of software that are called by the framework rather than specifying how the different pieces should work together.

Implementation versus design. With class libraries, programmers reuse only implementations, whereas with frameworks, they reuse design. A framework embodies the way a family of related programs or pieces of software work. It represents a generic design solution that can be adapted to a variety of specific problems in a given domain. For example, a single framework can embody the way a user interface works, even though two different user interfaces created with the same framework might solve quite different interface problems.

Thus, through the development of frameworks for solutions to various problems and programming tasks, significant reductions in the design and development effort for software can be achieved. HyperText Markup Language (HTML) is utilized to implement documents on the Internet together with a general-purpose secure communication protocol for a transport medium between the client and the merchant. HTML is a simple data format used to create HyperText documents that are portable from one platform to another. HTML documents are Standard Generalized Markup Language (SGML) documents with generic semantics that are appropriate for representing information from a wide range of domains. HTML has been in use by the World-Wide Web global information initiative since 1990. HTML is an application of ISO Standard 8879:1986 Information Processing Text and Office Systems; SGML.

To date, Web development tools have been limited in their ability to create dynamic Web applications which span from client to server and interoperate with existing computing resources. Until recently, HTML has been the dominant technology used in development of Web-based solutions. However, HTML has proven to be inadequate in the following areas:

Poor performance;

Restricted user interface capabilities;

Can only produce static Web pages;

Lack of interoperability with existing applications and data; and

Inability to scale.

Sun Microsystem's Java language solves many of the client-side problems by:

Improving performance on the client side;

Enabling the creation of dynamic, real-time Web applications; and

Providing the ability to create a wide variety of user interface components.

With Java, developers can create robust User Interface (UI) components. Custom "widgets" (e.g. real-time stock tickers, animated icons, etc.) can be created, and client-side performance is improved. Unlike HTML, Java supports the notion of client-side validation, offloading appropriate processing onto the client for improved performance. Dynamic, real-time Web pages can be created. Using the above-mentioned custom UI components, dynamic Web pages can also be created.

Sun's Java language has emerged as an industry-recognized language for "programming the Internet." Sun defines Java as: "a simple, object-oriented, distributed, interpreted, robust, secure, architecture-neutral, portable, high-performance, multithreaded, dynamic, buzzword-compliant, general-purpose programming language. Java supports programming for the Internet in the form of platform-independent Java applets." Java applets are small, specialized applications that comply with Sun's Java Application Programming Interface (API) allowing developers to add "interactive content" to Web documents (e.g. simple animations, page adornments, basic games, etc.). Applets execute within a Java-compatible browser (e.g. Netscape Navigator) by copying code from the server to client. From a language standpoint, Java's core feature set is based on C++. Sun's Java literature states that Java is basically "C++, with extensions from Objective C for more dynamic method resolution."

Another technology that provides similar function to JAVA is provided by Microsoft and ActiveX Technologies, to give developers and Web designers wherewithal to build dynamic content for the Internet and personal computers. ActiveX includes tools for developing animation, 3D virtual reality, video and other multimedia content. The tools use Internet standards, work on multiple platforms, and are being supported by over 100 companies. The group's building blocks are called ActiveX Controls, small, fast components that enable developers to embed parts of software in HyperText markup language (HTML) pages. ActiveX Controls work with a variety of programming languages including Microsoft Visual C++, Borland Delphi, Microsoft Visual Basic programming system and J++. ActiveX Technologies also includes ActiveX Server Framework, allowing developers to create server applications. One of ordinary skill in the art will readily recognize that ActiveX could be substituted for JAVA without undue experimentation to practice the invention.

Figure 1B:
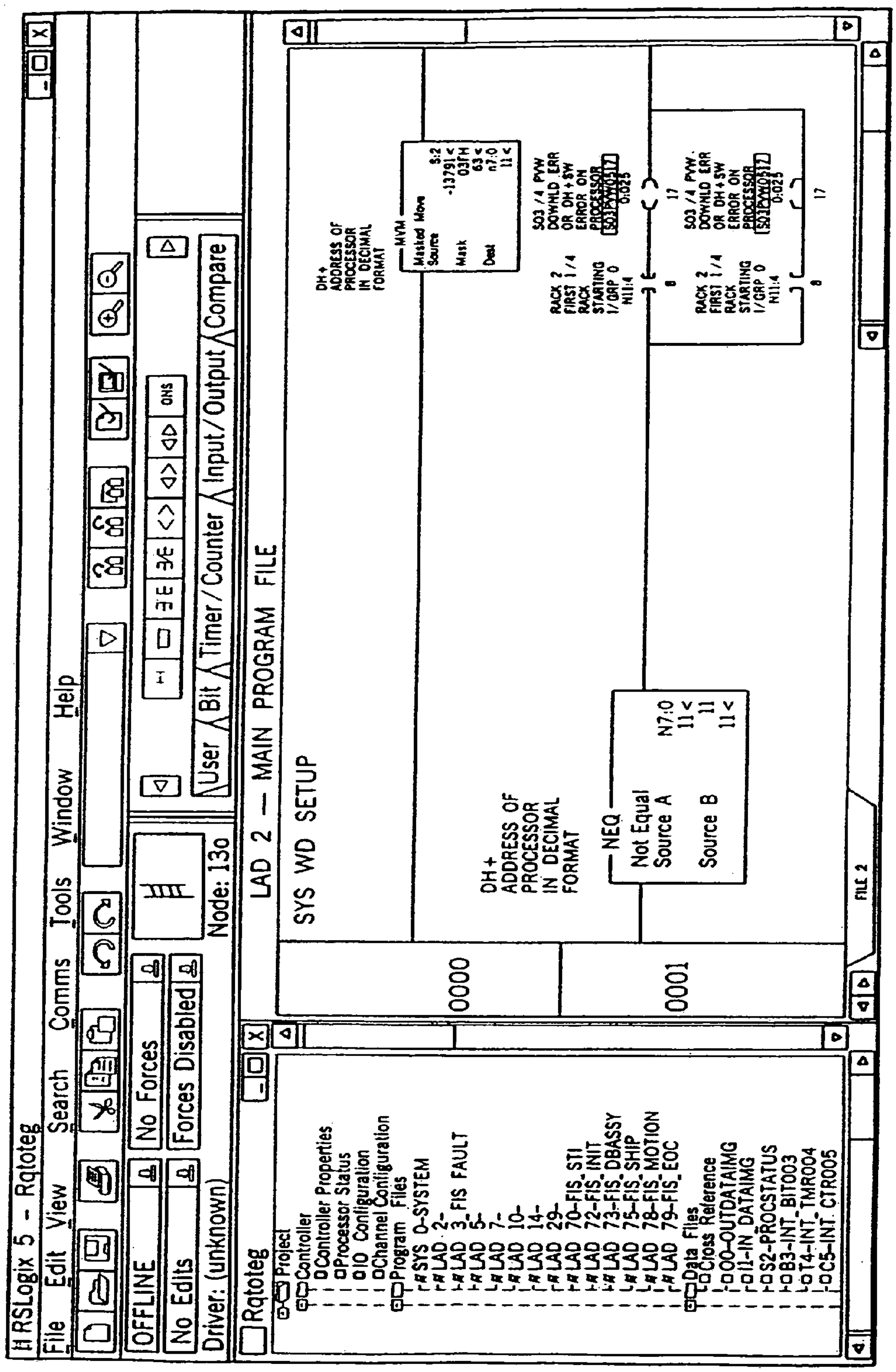
FIG. 1B provides a display of ladder logic in accordance with a preferred embodiment.

A ladder logic editor in accordance with a preferred embodiment allows a user to program and display a PLC's ladder program as illustrated in FIG. 1B. The program utilized is the RSLogix program manufactured and sold by the assignee of the subject patent. The programming tool provides a graphical user interface to facilitate rapid prototype and production of programs for execution in a PLC. Information is organized in rungs of sequential instructions organized in the shape of a ladder (ladder logic). The tool allows an operator to determine if a particular hardware entity is in a particular state and thereby allows the operator to exercise complete control over the environment. The RSLogix program tool supports traditional ladder logic and nontraditional control languages such as C, C++ and Java. It takes advantage of a current and future pool of developing control programmers and supports a large base of legacy applications. The emphasis of this tool is to improve a programmer's productivity in entering control code.

Although tools for programming a particular PLC to perform a particular task utilizing ladder logic exist, an integrated solution for designing, simulating, implementing and maintaining both product and manufacturing information across an enterprise has not existed until now. An enterprise wide solution is important to achieve important customer goals such as reducing commissioning time by allowing validation of the design before investing significant resources in implementing a design that may not address customer requirements. A preferred embodiment also provides consistent information across the enterprise without requiring redundant information. A single database is employed to capture and maintain design, simulation, implementation and maintenance information concerning the enterprise wide solution. The single database also facilitates consistent design and implementation details since changes in the product and process are stored as changes to the control are effected.

Another customer goal is to reduce downtime. This goal is addressed in accordance with a preferred embodiment by the architecture of the system. In accordance with a preferred embodiment, each component is designed with data and logic associated with various pieces of information that are critical to the operation of the component and the system. One set of information that is designed into each component is the logic and data for diagnosing problems with the component. Thus as models of the enterprise are built utilizing these components, the diagnostic system is automatically constructed based on carefully thought-out information for each of the components. Thus, as a sensor level measuring proper performance levels falls below an approved threshold, information about the particular component and the level is available with non-ambiguous data that can be communicated back to the operator to solve the problem.

Today, major manufacturers are digitally integrating their design, simulation, implementation and maintenance manually and also integrating their processes and the processes of their suppliers. They are being driven to a solution in accordance with a preferred embodiment because design and manufacturing processes of major manufacturers are complex and the scale of their operations is enormous. Complex, large scale integration requires that all design, simulation, implementation and maintenance information must be accessible digitally across an enterprise in a common format. Each enterprise design domain (e.g., part, machine, control, and diagnostic) must be modeled in a computer representation containing syntax (format of the domain representation) and semantics (meaning of the domain representation). Finally, an integrated data model in accordance with a preferred embodiment must be adhered to by the entire enterprise to establish mappings between the domains and their respective representations. The resultant solution eliminates the barriers that traditionally exist between the design and manufacturing domains.

Figure 2:
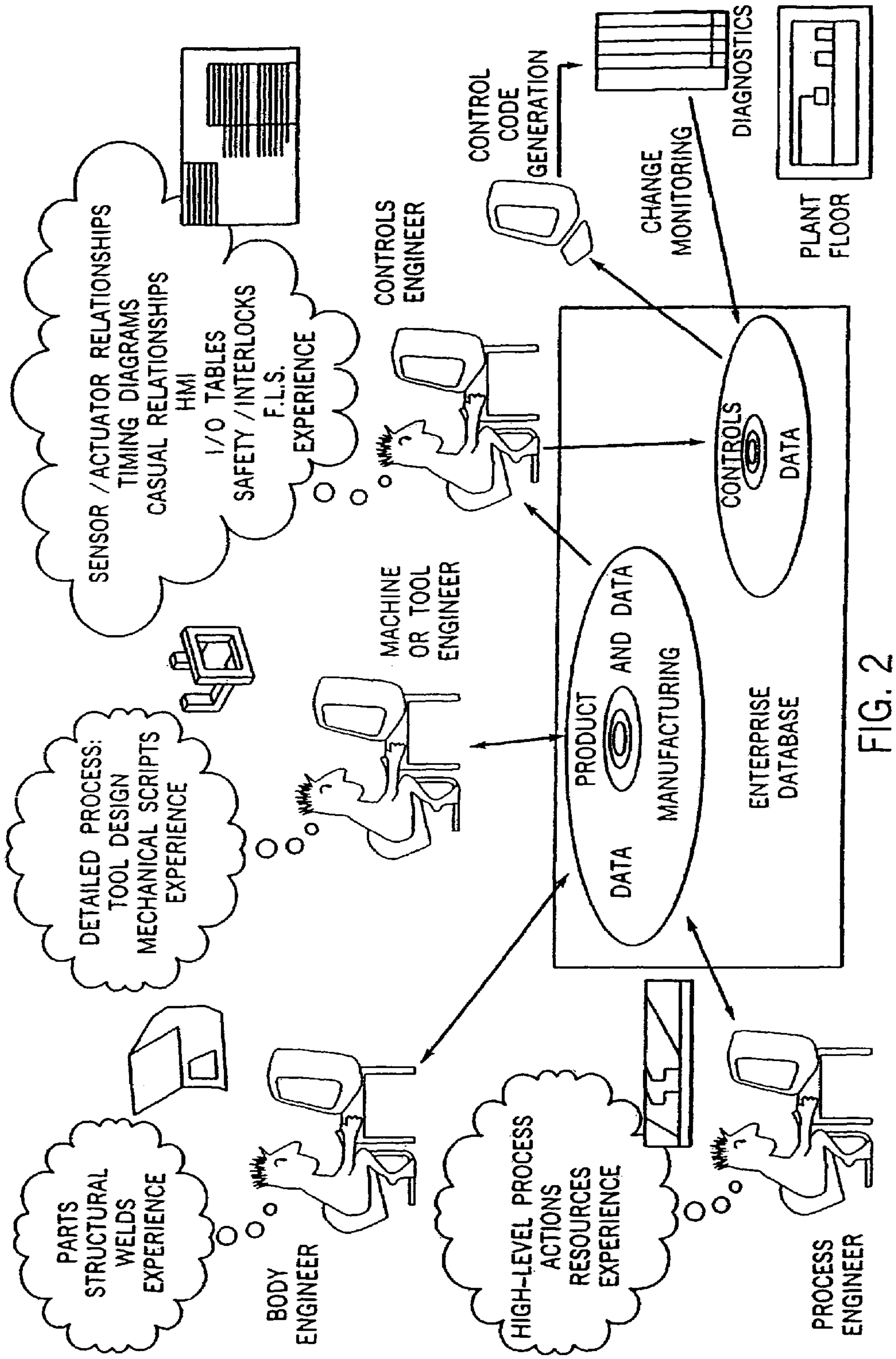
FIG. 2 illustrates an enterprise control system in accordance with a preferred embodiment.

FIG. 2 illustrates an enterprise solution in accordance with a preferred embodiment. In today's environment a body engineer designs a door assembly based on experience of parts, structural knowledge and welding information. This information is given to a machine or tool engineer to design a detailed process and tools for manufacturing the door based on other experience and existing manufacturing information. Then, the control engineer must design the sensor/actuator relationships to implement the manufacture of the door in an automated environment based on experience. Timing diagrams, causal relationships, a Human Machine Interface (HMI), input/output tables, safety and diagnostic information must be integrated into the design after the fact and control logic must be generated to execute on the PLCs to implement the manufacturing processes. Then the control environment including clamps, hydraulics, electrical, robots and transport systems must be integrated with the PLC to begin testing the feasibility of the architecture. Resultant changes and additional diagnostic information are cycled through as time marches on. Finally, the process engineer translates management numbers for finished goods into a high-level process of actions and resources based on acquired experience and provides raw materials and goals to drive the manufacturing process. Currently, without the subject invention, this process can literally take years.

Enterprise wide controls in accordance with a preferred embodiment are necessary to organize and manage the increasing amount of information necessary to facilitate effective control of machines, processes and products. Management of this information includes validation statistics for the manufacturing enterprise, diagnostics and an organizational structure that avoids redundancies to avoid storage and execution inefficiencies. Feedback of control information into the design system is also critical to maintain a current view of the enterprise at all times and to synchronize information so that all engineers are literally singing out of the same hymnal.

Enterprise wide controls construct a control system within an integrated, enterprise-wide model that reuses control assemblies from existing subscription libraries and linkages between products, processes, machine and control models. Controls, diagnostics and HMI code from the control system model database is systematic with full coverage diagnostics from the start of the process to completion. The code is always consistent with product, process, machine and control models. The enterprise wide control system generates code that is utilized to animate simulation and subsequent production displays with a graphical depiction at various levels of hierarchical detail of the enterprise. An operator can zoom in to observe particular areas based on information from the enterprise to control large parts of the enterprise from a central control station.

An Enterprise Control Database (ECDB) acts as a single repository of enterprise information containing instantaneous access to engineering bill-of-material (EBOM) data for parts and assembly of parts as well as maintaining manufacturing bill-of-material (MBOM) which tracks the finished goods inventory as it is built. Factory service records are also captured and stored in the database as they occur. Control assemblies and control components are also stored in the ECDB. Diagnostic assemblies and diagnostic components are also stored with the control system configuration (processor, racks, networks and wiring diagrams).

A control component in accordance with a preferred embodiment is a machine part that either accepts inputs from the control system and/or generates outputs to the control system. A control assembly (descriptive class) is a configuration of control components and the defined set of states the control component can attain. The control assembly generates additional machine resource requirements and requests to the mechanical design system. A schematic of each control assembly is stored in the ECDB.

A control assembly is also responsible for performing one or more actions defined as a discrete action class. For example, a class action may be an input signal that requests an action in an external word, or an input signal that confirms completion of a particular task. A class action in accordance with a preferred embodiment can appear as a bar on a barchart. A class input, often referred to by old-time control engineers as a digital input or DI could be an input signal indicative of a state in the enterprise.

For example, when a heater reaches a threshold temperature, the process can proceed. Other examples include emergency stop, part present or a mode switch. Typically, class inputs are utilized as safeties, interlocks, cycle enablers or diagnostic inputs. A class output, digital output (DO) is an output signal to the enterprise to signal information. For example, turning on a cycle complete light. These entities readily lend themselves to implementation in an object-oriented abstraction as realizable classes for use in instantiating object instances of the classes. Examples of realizable classes in accordance with a preferred embodiment include PartPresent, ControlRobot, DumpSet, PinSet and SafeBulkHeadClampSet.

Figure 3:
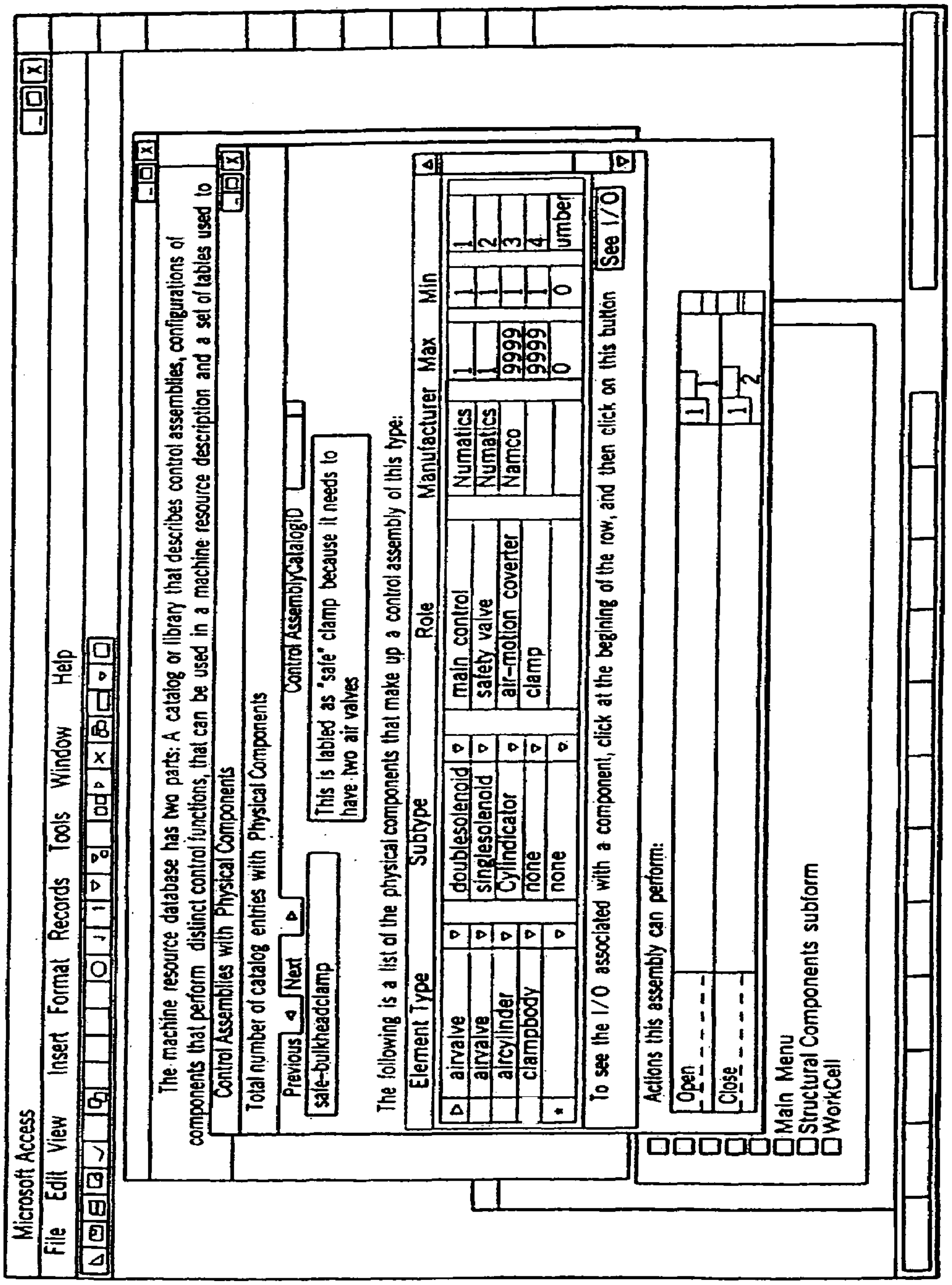
FIG. 3 illustrates a CA display from an enterprise control database in accordance with a preferred embodiment.

FIG. 3 illustrates a database entry for a SafeBulkHeadClampSet in accordance with a preferred embodiment. Each of the control valves, cylinders and other clamp information is stored in a single record completely defining the clamp and its characteristics to enable it to open and close on a target assembly effectively and safely. In addition, the database keeps track of how many catalog entries have incorporated this physical component into their design.

A diagnostic component in accordance with a preferred embodiment is an electrical, mechanical or pneumatic component that has no direct connection to the control system and is architected into the component for diagnostic purposes.

A diagnostic assembly (descriptive class) is a configuration of control components and diagnostic component in which the configuration is determined by the causal relationships that are useful for diagnostic purposes. Additional machine resource requirements may be required to generate requests to the mechanical design system.

Figure 4:
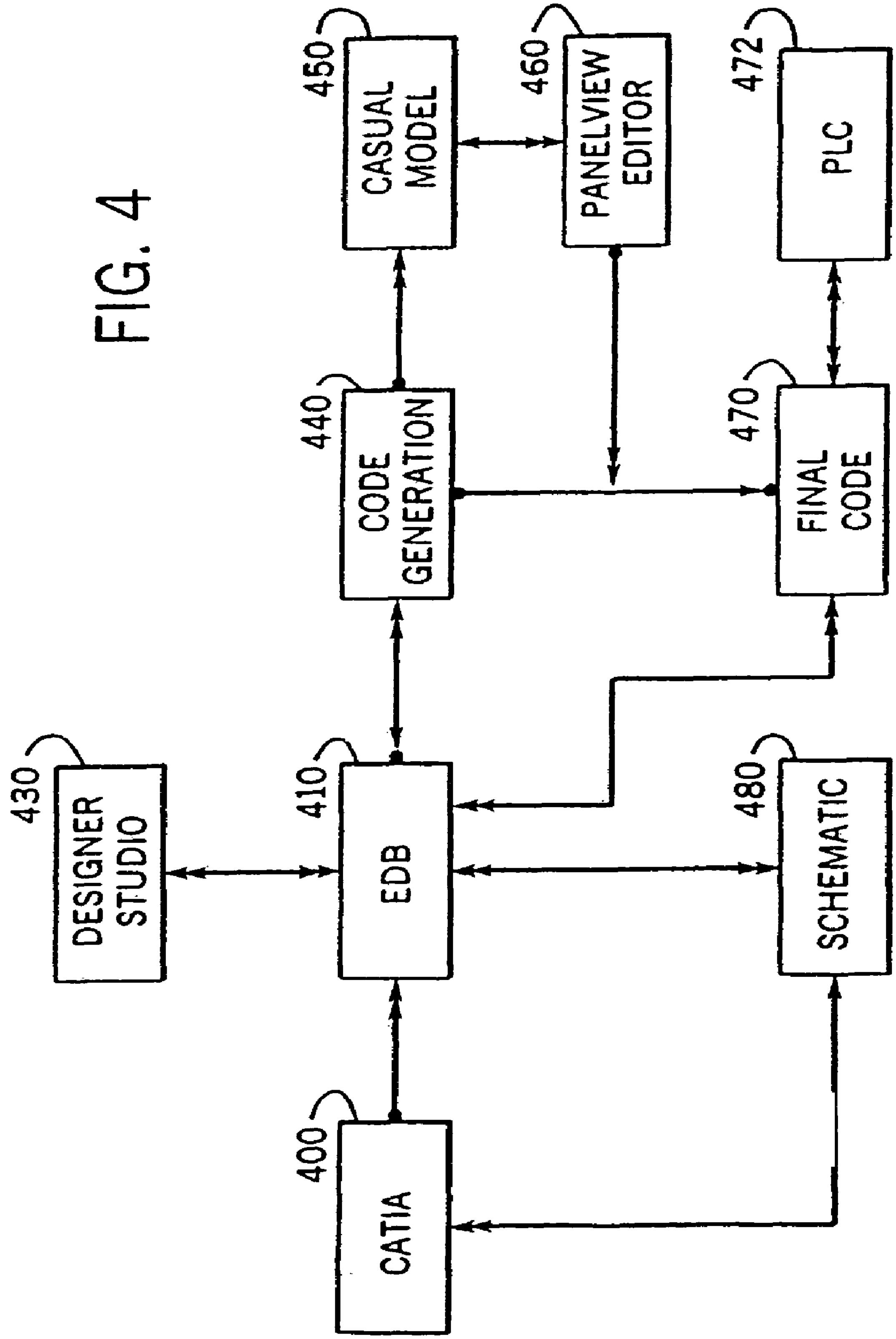
FIG. 4 is a block diagram depicting the logical flow of the enterprise control system in accordance with a preferred embodiment.

FIG. 4 is a block diagram of the enterprise system in accordance with a preferred embodiment. A CATIA design station 400 utilizes a CNEXT interface to transmit design information, activities (process steps) and resources (a description of the tooling machine) to the Enterprise Database (ECDB) 410. The design information is a picture, for example a door welding station, with robot welders, clamps, a PLC and a transport mechanism. The ECDB receives information from the CATIA CNEXT interface defining activities and resources that will be necessary to build the station.

The ECDB integrates information from the CATIA CAD package 400, Designer Studio 430, code generation 440, final code 470 and the causal model subsystem 450. The activities and information that come from the CATIA interface 400 are created by a mechanical tool designer and they omit key information that comes from the control designer.

The Designer Studio 430 completes the activity and resource information in the ECDB 410 utilizing a graphical user interface that is C++ based Java code. The key organizing concept throughout an enterprise system in accordance with a preferred embodiment is CONTROL ASSEMBLY. Control assembly refers to utilizing a component based software assembly just as hardware designers utilize chip assemblies in hardware design and manufacture. A template type building block architecture is enabled for designing and managing enterprises. Software and hardware components are cataloged in the ECDB 410 for maximal reuse of the components. The ECDB 410 is a relational database implemented in a Microsoft Access product in accordance with a preferred embodiment. One of ordinary skill in the art will readily comprehend that other databases (relational or network) could readily be substituted without undue experimentation.

Once the database is populated, then information from the database is utilized to construct a code generation data structure 440 in a tree format as described later in detail. The database is also utilized to create the causal model 450. The causal model 450 is utilized to enable system diagnostics. The causal model is a LISP knowledge base.

The causal model 450 and the code generation data structure 440 is utilized as input for the PanelView Editor to automatically generate the operator's interface. Old code modified to work with new interface. The PanelView Editor also generates control code in the form of ladder logic. The causal model 450 generates diagnostic ladder logic that is mixed with the control code from the code generation 440 to create the final code 470 for controlling and monitoring the enterprise. The ladder logic is downloaded to the PLC 472 for controlling the enterprise.

The relay ladder logic code for control and diagnostics are merged by multiplexor code. The PanelView Editor generates code that enables the user interface to display graphical depictions of what is happening in the process and also to display diagnostic output.

The ECDB is also used by the RSWire schematic processor 480 to create schematic depictions of the sensor environment and transmit the schematic results back to the CNEXT system in CATIA where the tool design was also performed. This architecture, in accordance with a preferred embodiment, facilitates the location of changes in the processing efficiently which streamlines location of modification locations in the stations and control logic downstream.

The output from the ECDB is also provided to a schematic detailing package (RSWire) which enables a control engineer to decide where each of the clamps on a welding machine should be and locates valves, pneumatic piping etc. on the schematic detailing. A control engineer can place the cylinders and the schematic is generated from this information for wiring, piping and/or HVAC layout. Components are predesigned that enable design of an enterprise wide control system in accordance with a preferred embodiment of the invention. Control assemblies are merely objects encapsulating data and functions for performing standard control functions. Another set of macros are architected in accordance with a preferred embodiment for wiring diagrams that are componentized.

What we do for simulation is to load the PLC code into a PLC simulator SOFTLOGIX 5 (A/B product). This is utilized to drive a CAD simulator. The PLC Simulator & CAD Simulator utilize information from the CATIA database and the ECDB in accordance with a preferred embodiment. Then, when the code has been debugged, it is downloaded to the PLC 472 for production testing and ultimately running the enterprise.

The final schematics generated by the schematic tool 480 are ultimately sent back to CATIA 400 utilizing the standard CNEXT interface. This feedback mechanism is necessary to synchronize the CATIA database with the ECDB 410. This feedback mechanism also facilitates the addition of geometry to the original CAD drawings.

The database design of the ECDB includes tables that map activities into information appearing in the tables that is imported from the existing CATIA drawings. The resource import table is called Structural Components. It is implemented in accordance with a preferred embodiment in an ACCESS database with a record of the following structure: U:~1VCM980330a.mdb Monday, Mar. 30, 1998

```
U:~1VCM980330a.mdb                                   Monday, March 30, 1998
Table: StructuralComponents
        Properties
Date Created:    3/6/98 11:18:49 AM    Def. Updatable:    True
Last Updated:    3/30/98 2:14:37 PM    OrderByOn:         True
RecordCount:     56
        Columns
    Name Type                                  Size
    StructuralComponentID Number (Long)   4
        AllowZeroLength:       False
        Attributes:            Fixed Size, Auto-Increment
        Collating Order:       General
        ColumnHidden:          False
        ColumnOrder:           Default
        ColumnWidth:           Default
        Ordinal Position:      1
        Required:              False
        Source Field:          StructuralComponentID
        Source Table:          StructuralComponents
    ExtID Text                                 255
        AllowZeroLength:       False
        Attributes:            Variable Length
        Collating Order:       General
        ColumnHidden:          False
        ColumnOrder:           Default
        ColumnWidth:           8268
        Description:           unique id for this spatial component
        DisplayControl: Text Box
        Ordinal Position:      2
        Required:              False
        Source Field:          ExtID
        Source Table:          StructuralComponents
    Label Text                                 50
        AllowZeroLength:       False
        Attributes:            Variable Length
        Collating Order:       General
        ColumnHidden:          False
        ColumnOrder:           Default
        ColumnWidth:           1620
        Description:           label to show on graphic renditions of
                               this component
        DisplayControl: Text Box
        Ordinal Position:      3
        Required:              False
        Source Field:          Label
        Source Table:          StructuralComponents
    Class Text                                 50
        AllowZeroLength:       False
        Attributes:            Variable Length
        Collating Order:       General
        ColumnHidden:          False
        ColumnOrder:           Default
        ColumnWidth:           1545
        Description:           class of spatial components to which
                               this instance belongs - determines
                               what types of control components
                               can be in this spatial component
        DisplayControl: Text Box
        Ordinal Position:                4
        Required:              False
        Source Field:          Class
        Source Table:          StructuralComponents
```

-continued

```
    WorkCellID Number (Long)                   4
        AllowZeroLength:       False
        Attributes:            Fixed Size
        Bound Column:          1
        Caption:               WorkCell
        Collating Order:       General
        Column Count:          1
        Column Heads:          False
        Column Widths:         1440
        ColumnHidden:          False
        ColumnOrder:           Default
        ColumnWidth:           1140
        Decimal Places:        Auto
        Default Value:         0
        Description:           workcell that this component is part of -
                               either this field or the next one is
                               mandatory
        DisplayControl:        Combo Box
        Limit To List:         False
        List Rows:             8
        List Width:            1440twip
        Ordinal Position:      5
        Required:              False
        Row Source Type:       Table/Query
        Row Source:            SELECT DISTINCTROW [WorkCell].
                               [WorkCellID] FROM [WorkCell];
        Source Field:          WorkCellID
        Source Table:          StructuralComponents
    PartOf Text                                255
        AllowZeroLength:       False
        Attributes:            Variable Length
        Collating Order:       General
        ColumnHidden:          False
        ColumnOrder:           Default
        ColumnWidth:           5985
        Description:           other spatial component that this
                               component is part of - if this field is 0,
                               it is a top level component
        DisplayControl: Text Box
        Ordinal Position:      6
        Required:              True
        Source Field:          PartOf
        Source Table:          StructuralComponents
    Comment Memo                               —
        AllowZeroLength:       False
        Attributes:            Variable Length
        Collating Order:       General
        ColumnHidden:          False
        ColumnOrder:           Default
        ColumnWidth:           Default
        Ordinal Position:      7
        Required:              False
        Source Field:          Comment
        Source Table:          StructuralComponents
Relationships
    Reference26
        StructuralComponents     ControlAssemblyInstance
          StructuralComponentID       StructuralComponentID
        Attributes:           Not Enforced
        Attributes:           One-To-Many
    Reference27
        StructuralComponents     PCCInstanceElements
          StructuralComponentID       StructuralComponentsID
        Attributes:           Not Enforced
        Attributes:           One-To-Many
Table Indexes
    Name                              Number of Fields
    PrimaryKey                        1
        Clustered:             False
        Distinct Count:        56
        Foreign:               False
        Ignore Nulls:          False
        Name:                  PrimaryKey
        Primary:               True
        Required:              True
        Unique:                True
        Fields:                StructuralComponentID, Ascending
```

-continued

| | |
|---|---|
| SpaceComponentID | 1 |
| Clustered: | False |
| Distinct Count: | 56 |
| Foreign: | False |
| Ignore Nulls: | False |
| Name: | SpaceComponentID |
| Primary: | False |
| Required: | False |
| Unique: | False |
| Fields: | ExtID, Ascending |
| StructuralComponentsID | 1 |
| Clustered: | False |
| Distinct Count: | 56 |
| Foreign: | False |
| Ignore Nulls: | False |
| Name: | StructuralComponentsID |
| Primary: | False |
| Required: | False |
| Unique: | False |
| Fields: | StructuralComponentID, Ascending |
| WorkCellID | 1 |
| Clustered: | False |
| Distinct Count: | 1 |
| Foreign: | False |
| Ignore Nulls: | False |
| Name: | WorkCellID |
| Primary: | False |
| Required: | False |
| Unique: | False |
| Fields: | WorkCellID, Ascending |
| User Permissions | |
| ACR | |
| admin | |
| ALA | |
| ALA2 | |
| BJB | |
| CPI | |
| Group Permissions | |
| Admins | |
| Guests | |
| LETTERS | |
| MODIFY | |
| READ ONLY | |
| REPAIR | |
| Users | |

Items that utilize the control assembly catalog have the following structure:

TABLE

ControlAssemblyCatalog

Properties
Date Created: 10/22/97 1:25:38 PM Def. Updatable: True
Description: CUnit stands for "control unit" Last Updated: 3/30/98 1:45:32 PM
These are the generic types of assemblies that are relevant for control. The description only specifies how to interact with assembly from a control standpoint; it doesn't say how the instance will be used.
OrderByOn: False RecordCount:
Columns

| Name | Type | Size |
|---|---|---|
| ControlAssemblyCatalogID | Number (Long) | 4 |
| AllowZeroLength: | False | |
| Attributes: | Fixed Size, Auto-Increment | |
| Collating Order: | General | |
| ColumnHidden: | False | |
| ColumnOrder: | Default | |
| ColumnWidth: | 1092 | |
| Description: | unique idenitifier for the component structure | |

TABLE-continued

ControlAssemblyCatalog

| | | |
|---|---|---|
| Ordinal Position: | 1 | |
| Required: | False | |
| Source Field: | ControlAssemblyCatalogID | |
| Source Table: | ControlAssemblyCatalog | |
| Label Text 25 | | |
| AllowZeroLength: | False | |
| Attributes: | Variable Length | |
| Collating Order: | General | |
| ColumnHidden: | False | |
| ColumnOrder: | Default | |
| ColumnWidth: | Default | |
| Description: | human readable name for the component structure | |
| DisplayControl: | Text Box | |
| Ordinal Position: | 2 | |
| Required: | False | |
| Source Field: | Label | |
| Source Table: | ControlAssemblyCatalog | |
| DecompositionType Text 50 | | |
| AllowZeroLength: | False | |
| Attributes: | Variable Length | |
| Bound Column: | 1 | |
| Collating Order: | General | |
| Column Count: | 1 | |
| Column Heads: | False | |
| Column Widths: | 1440 | |
| ColumnHidden: | False | |
| ColumnOrder: | Default | |
| ColumnWidth: | 1944 | |
| Description: | whether this assembly can be broken down into discrete components or whether it is a single object like a robot or a PanelView. | |
| DisplayControl: | Combo Box | |
| Limit To List: | False | |
| List Rows: | 8 | |
| List Width: | 1440twip | |
| Ordinal Position: | 3 | |
| Required: | False | |
| Row Source Type: | Value List | |
| Row Source: | "Virtual";"Physical";"Programmable" | |
| Source Field: | DecompositionType | |
| Source Table: | ControlAssemblyCatalog | |
| TemplateType Text | | 50 |
| AllowZeroLength: | False | |
| Attributes: | Variable Length | |
| Collating Order: | General | |
| ColumnHidden: | False | |
| ColumnOrder: | Default | |
| ColumnWidth: | 1890 | |
| Description: | Polaris template type to use with this element | |
| DisplayControl: | Text Box | |
| Ordinal Position: | 4 | |
| Required: | False | |
| Source Field: | TemplateType | |
| Source Table: | ControlAssemblyCatalog | |
| Comment Memo | | — |
| AllowZeroLength: | True | |
| Attributes: | Variable Length | |
| Collating Order: | General | |
| ColumnHidden: | False | |
| ColumnOrder: | Default | |
| ColumnWidth: | 6012 | |
| Description: | a brief comment on the use of the control assembly - should fit into 2 or 3 lines | |
| Ordinal Position: | 5 | |
| Required: | False | |
| Source Field: | Comment | |
| Source Table: | ControlAssemblyCatalog | |
| Explanation Memo | | — |
| AllowZeroLength: | False | |
| Attributes: | Variable Length | |
| Collating Order: | General | |
| ColumnHidden: | False | |
| ColumnOrder: | Default | |

TABLE-continued

| ControlAssemblyCatalog | |
|---|---|
| ColumnWidth: | Default |
| Description: | a longer comment about properties of the assembly |
| Ordinal Position: | 6 |
| Required: | False |
| Source Field: Explanation | |
| Source Table: | ControlAssemblyCatalog |
| Relationships | |
| Reference1 | |
| ControlAssemblyCatalog | DCCElements |
| ControlAssemblyCatalogID | ControlAssemblyCatalogID |
| Attributes: | Not Enforced |
| Attributes: | One-To-Many |
| Reference11 | |
| ControlAssemblyCatalog | DCCActions |
| ControlAssemblyCatalogID | ControlAssemblyCatalogID |
| Attributes: | Not Enforced |
| Attributes: | One-To-Many |
| Reference2 | |
| ControlAssemblyCatalog | DCCElements |
| ControlAssemblyCatalogID | ControlAssemblyCatalogID |
| Attributes: | Not Enforced |
| Attributes: | One-To-Many |
| Reference6 | |
| ControlAssemblyCatalog ControlAssemblyInstances | |
| ControlAssemblyCatalogID | ControlAssemblyCatalogID |
| Attributes: | Not Enforced |
| Attributes: | One-To-Many |
| Table Indexes | |
| Name | Number of Fields |
| PrimaryKey | 1 |
| Clustered: | False |
| Distinct Count: | 19 |
| Foreign: | False |
| Ignore Nulls: | False |
| Name: | PrimaryKey |
| Primary: | True |
| Required: | True |
| Unique: | True |
| Fields: | ControlAssemblyCatalogID, Ascending |
| User Permissions | |
| ACR | |
| admin | |
| ALA | |
| ALA2 | |
| BJB | |
| CPI | |
| Group Permissions | |
| Admins | |
| Guests | |
| LETTERS | |
| MODIFY | |
| READ ONLY | |
| REPAIR | |
| Users | |

Code Generation 240 is performed by a system which builds a SmallTalk tree that is organized via a template file. The organization and logic associated with this processing is presented in detail below in a section entitled Template Language. A template architecture facilitates descriptions of discrete part manufacture. Transfer Machine templates are types that are encapsulated with data and logic associated with the templates. Template is not an object but a specification for transfer machine. Information organized in a tree structure.

TM1—All transfer machines will have some level of indexes. Modular list of type indexers—conveyers, transfers, shuttles, . . .

TM2—Master control panel B push buttons etc.

TM2—Transfer Machine Tree for generating according to rules For Machines, batch (cookie)

Because of understanding of Discrete parts manufacture, a generic model results that allows the granularity and modularity to be architected and organized in a structure that works well for diagnostics. The architecture lends itself to adding diagnostics in a modular. Key to the diagnostics is the system provides a structured environment that lends itself to modular diagnostics which are tied to the individual components in a logical manner. This allows a designer to have diagnostics architected into the actual components.

Business Model utilizes a simulation to represent real world activities in a componentized fashion. Utilize a well defined interface (API) to obtain information &/or modify the real world. Export the interface as an OLE interface. They are defining the interface now. However, to utilize it today, they use Smalltalk and send strings in the OLE interface representative of Smalltalk commands.

Instead of commands to the existing system via scripts, there will be an architected API to the business model. Create an object of discrete axis made up of XYZ component. Builds a tree, builds an access model and sends commands to build the code. Sending commands instead of a text string that is interpreted. With the template library, a user can add components. Sometimes the new component will need some definition to be added on the fly.

The Causal Model Structure 250 is an expert system that relates generally to discrete event control systems that control the operation of an automated machine, and more particularly to a system and method for developing diagnostic rules by observing the behavior of the machine and for using the diagnostic rules to detect malfunctions in the behavior of the machine.

Discrete event control systems, such as an automated industrial control system, generally control a machine having a large number of components (e.g., sensors and actuators), which may malfunction due to transient errors and other hard or soft failures. Because of the immense number of possible failure points in the machine, attempts have been made to provide control systems that automatically diagnose the malfunction and pinpoint the failure point, thus reducing costly down-time of the industrial plant.

Known systems have approached the diagnostic problem with varying success. For example, the diagnostic engines of prior art systems often are based on state-machine models that can detect only certain hard failures. Thus, transient errors and the erroneous occurrence of events are not diagnosed and predictions of malfunctions are not feasible. Further, such diagnostic engines often must be explicitly programmed. Or, if the engine is capable of autonomously learning the behavior of a machine, the learning session often is based on data gathered while the machine is operating in one machine state, in a fixed environmental condition, and at the beginning of the life of the machine. Accordingly, real-time changes in the behavior of the machine, that may be due to environmental conditions or the natural wear and aging process, are often erroneously diagnosed as malfunctions. To be able to take the various operating conditions into account, the diagnostic engine must either undergo a lengthy reprogramming process or be subjected to a new learning session.

Prior art systems also generally are incapable of discerning the optimum state-machine model to use for developing the rules to diagnose the behavior of the machine. For example, the state-machine model will include a number of known sequential and temporal patterns that indicate the proper occurrences of the various discrete events associated with the manufacturing process. The diagnostic engine, however, may indiscriminately develop diagnostic rules based on these patterns. Thus, a particular rule may be based on a pattern corresponding to a known causal relationship between events, a pattern including a sequence of a large number of discrete events, or a pattern including a long time interval between discrete events. Each of these scenarios presents disadvantages and inefficiencies. In particular, restraining diagnostic rules to known causal relationships prevents the engine from selecting non-intuitive timing patterns that may produce simpler, more efficient rules. Moreover, a long sequential pattern necessitates the use of a larger amount of memory to store the occurrences of the multiple discrete events in the pattern and consumes more computing power, while a rule based on a long temporal pattern may result in a tardy diagnosis of a machine malfunction. Further, known diagnostic engines typically are not capable of determining the minimum number of patterns necessary to adequately diagnose the machine's behavior and predict malfunctions or of judging which patterns provide the most reliable indicators of the machine's health.

Accordingly, it would be desirable to develop a versatile diagnostic engine for discrete event control systems capable of discriminately developing diagnostic rules for diagnosing the behavior of an automated machine. The diagnostic engine would not be restricted by known causal relationships and, thus, could autonomously select and learn the optimum discrete event patterns for reliably diagnosing and predicting the behavior of the machine. Moreover, the diagnostic engine would be capable of automatically adapting to changed operating conditions of the machine, such as environmental variations, modifications to the machine, wear and aging of the machine, and different machine states.

The present invention comprises a system and method for developing diagnostic rules that are based on discrete event timing patterns that occur during operation of the machine. The system and method further evaluate the occurrences of the discrete events relative to the diagnostic rules to identify malfunctions in the behavior of the machine.

According to a first embodiment of the invention, a system and method for developing diagnostic rules for diagnosing the behavior of a machine is provided. The system and method include a plurality of control elements which cooperate to perform at least one discrete event process and which are configured to transition between at least two different states. Each state transition represents a discrete event in the process, and the occurrence of each discrete event is communicated to a main controller. The main controller is configured to detect a timing pattern in the occurrence of the discrete events, which includes a trigger event, a result event, and a time interval between the trigger and result events. A diagnostic rule is then defined based on a statistical analysis of repetitions of the timing pattern. The diagnostic rule is then updated in real time based on a detected change in the timing pattern.

According to one aspect of the invention, the statistical analysis includes calculating a mean time interval between the trigger and result events and a standard deviation from the mean time interval. A diagnostic rule is defined based on the statistical analysis if the timing statistics satisfy certain defined criteria. For example, a rule may be defined if the magnitude of the ratio of the standard deviation to the mean time interval is less than a predetermined maximum magnitude. Alternatively, the diagnostic rule may be defined if the duration of the mean time interval is less than a predetermined maximum duration.

In another aspect of the invention, a diagnostic rule may be replaced due to a detected change in the timing pattern. For example, the main processor may detect a change in which the result event follows a different trigger event. This change in effect creates a new timing pattern. If the standard deviation associated with the new timing pattern is smaller than the standard deviation associated with the original timing pattern, the main processor will replace the original diagnostic rule with the new rule.

Alternatively, a machine has a first machine state for performing a first discrete event process and a second machine state for performing a second discrete event process. The main processor looks for a timing pattern common to at least both machine states and then defines a diagnostic rule based on the common timing pattern.

In another embodiment, a plurality of control modules are coupled to a communication link to communicate the occurrences of the discrete events to a main processor. Each of the control modules is configured to detect state transitions of at least one of the control elements. In anther aspect, a method for diagnosing the behavior of a machine configured to perform a discrete event process is disclosed. A plurality of control elements are configured to transition between at least two states. The occurrence of each state transition, which represents a discrete event in the process, is communicated to a main processor via a communications link. The main processor is configured to detect in real time a timing pattern in the occurrences of the discrete events, including a trigger event, a result event, and a time interval between the trigger and result events. A diagnostic rule is then defined based on a real-time statistical analysis of repetitions of the timing patterns. Occurrences of the discrete events are evaluated in real time relative to the diagnostic rule to identify whether a malfunction in the machine's behavior is present.

Automated control systems, such as are used in manufacturing plants, are often used to control an industrial machine comprising a large number of sensors and actuators which cooperate to perform a dynamic process, such as a manufacturing or assembly process. As the automated system runs, the sensors and actuators (i.e., "control elements") transition between states in repetitive sequential, and oftentimes temporal, patterns. For example, in an automated system which controls a machine, such as an automated assembly line, a proximity sensor will transition between states, indicating the presence of an object (e.g., an empty bottle). Some time interval after this event, an actuator will transition between states, indicating, for instance, the initiation of an operation on the object (e.g., filling the bottle with a liquid). Next, a photodetector sensor will transition between states, indicating that the bottle is full. If the assembly line is functioning properly, the timing relationships between these discrete events will be quite regular. If, however, any component of the system malfunctions, the regular timing patterns will be disrupted. Accordingly, these regular timing patterns can provide reliable behavioral indicators useful for diagnosing the machine's health.

However, these timing patterns may vary over the life of the machine because of environmental factors, modifications of the machine, normal wear on the components, and other variables. Moreover, the timing patterns may vary depending on the state of the machine. For example, in the above-described scenario, the same assembly line may be used to fill both large bottles and small bottles. As another example, the conveyor speed may change from one state to the next. Accordingly, a variation in the duration of the time interval between initiating and completing the injection of the bottle with fluid will necessarily exist but will not be indicative of a malfunction. The present invention provides a system and method for diagnosing the machine's behavior which are capable of adapting to such operational changes. In accordance with this system and method, diagnostic rules are discriminately defined, selected, and updated based on the observation of the machine's discrete event timing patterns.

Figure 5A:
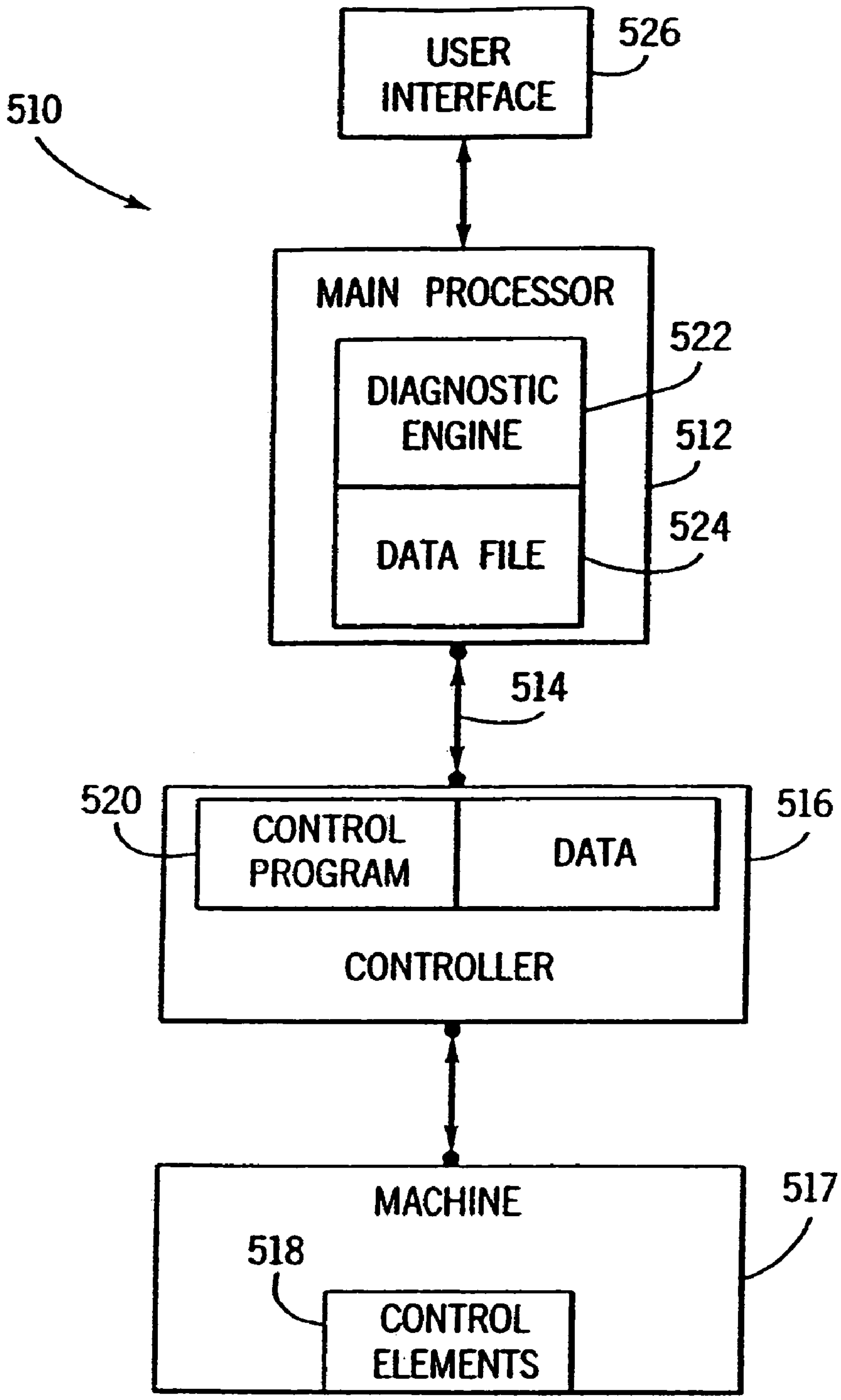
FIG. 5A is a block diagram schematic representing a system including a diagnostic engine for diagnosing the behavior of a machine controlled by a discrete event control system in accordance with a preferred embodiment of the present invention.

Referring now to FIG. 5*a*, a block diagram representation of a system 510 according to a preferred embodiment of the invention is illustrated. System 510 includes a main processor 512, a communication link 514, a controller 516, and a machine 517 which comprises a plurality of control elements 518. Control elements 18 include a plurality of sensors and actuators which cooperate to perform a dynamic, discrete event manufacturing process. A control program, which is stored in a memory 520 of controller 516 and executed by the controller's processor (not shown), governs the manufacturing process during which control elements 518 transition between states in a deterministic sequence as a result of the flow of materials or parts.

Each state change of a control element 518 is a discrete event that is detected by controller 516 and stored as data in its memory 520. For example, in the preferred embodiment, controller 516 is a programmable logic controller, such as a PLC-5 available from Allen-Bradley Company of Milwaukee, Wis., which is programmed to periodically scan the control elements 518 to determine their respective states. Controller 516 then compares the state of each element to the value of its state on the previous scan. A state change represents the occurrence of a discrete event, and a list of discrete events is accumulated in memory 520. Controller 516 reports the discrete events to main processor 512 via communication link 514, which comprises, for example, copper conductors, an RF link or other types of links suitable for conveying digital data.

In the preferred embodiment, main processor 512 is embodied in a general purpose personal computer and includes, for example, a microprocessor and a memory for storing a diagnostic engine 522 and a data file 524. Alternatively, main processor 512 may be incorporated within controller 516. System 510 further includes a user interface 526 which may include a display (e.g., the personal computer's CRT or LCD display, or a peripheral display device) and a separate display memory for providing for the output of text and graphics from main processor 512, a keyboard allowing for the entry of alphanumeric characters to processor 512, and a mouse that facilitates the manipulation of graphical icons which appear on the display.

The user interface 526 preferably resides on a software enabled display including a variety of control windows, data display windows, and dialogue boxes. For example, the control windows and dialogue boxes may include icons and text which aid in configuring system 510. The data display windows may be used to display the occurrences of discrete events in a graphical format. Further, existing and active rules may be displayed in either in a graphical or tabular format. Malfunctions may also be displayed graphically or, alternatively, symbolically or as a text message in a dialogue box.

Referring still to FIG. 5*a* and as is well known in the art, processor 512 may further include various driver and interface circuitry (not shown) to manage the flow of data on communication link 514. For example, the discrete event data reported from controller 516 is conveyed to data file 524 through the driver and interface circuitry. The discrete event data in file 524 may then be passed to diagnostic engine 522. The cognitive engine 522 preferably is a software program which can operate in either a learning mode or a diagnosing mode. During learning, engine 522 is configured to analyze the discrete event data in order to define diagnostic rules, and, during diagnosing, engine 522 evaluates the behavior of machine 517 relative to the diagnostic rules. The cognitive engine 522 may define rules and evaluate behavior in real-time or, alternatively, the discrete event data may be stored in the memory of processor 512, or written to a data storage disk (not shown), for off-line learning of diagnostic rules or evaluation of the machine's behavior by diagnostic engine 522.

Learning Diagnostic Rules

During a learning mode, diagnostic engine 522 observes the occurrences of the discrete events to find repetitive sequences of events which occur in a consistent timing pattern. Each timing pattern preferably consists of two discrete events (i.e., a trigger event and a result event) and a time interval between the two events, although diagnostic engine 522 is not prohibited from selecting timing patterns which include more than two discrete events. The diagnostic engine 522 then defines diagnostic rules based on a statistical analysis of the repetitive timing patterns, compares existing rules to newly defined rules to determine the optimum rules for evaluating the machine's behavior, and updates the existing rules by either updating the statistical analysis based on further repetitions of the timing pattern or replacing the existing rules with better diagnostic rules.

Figure 5B:
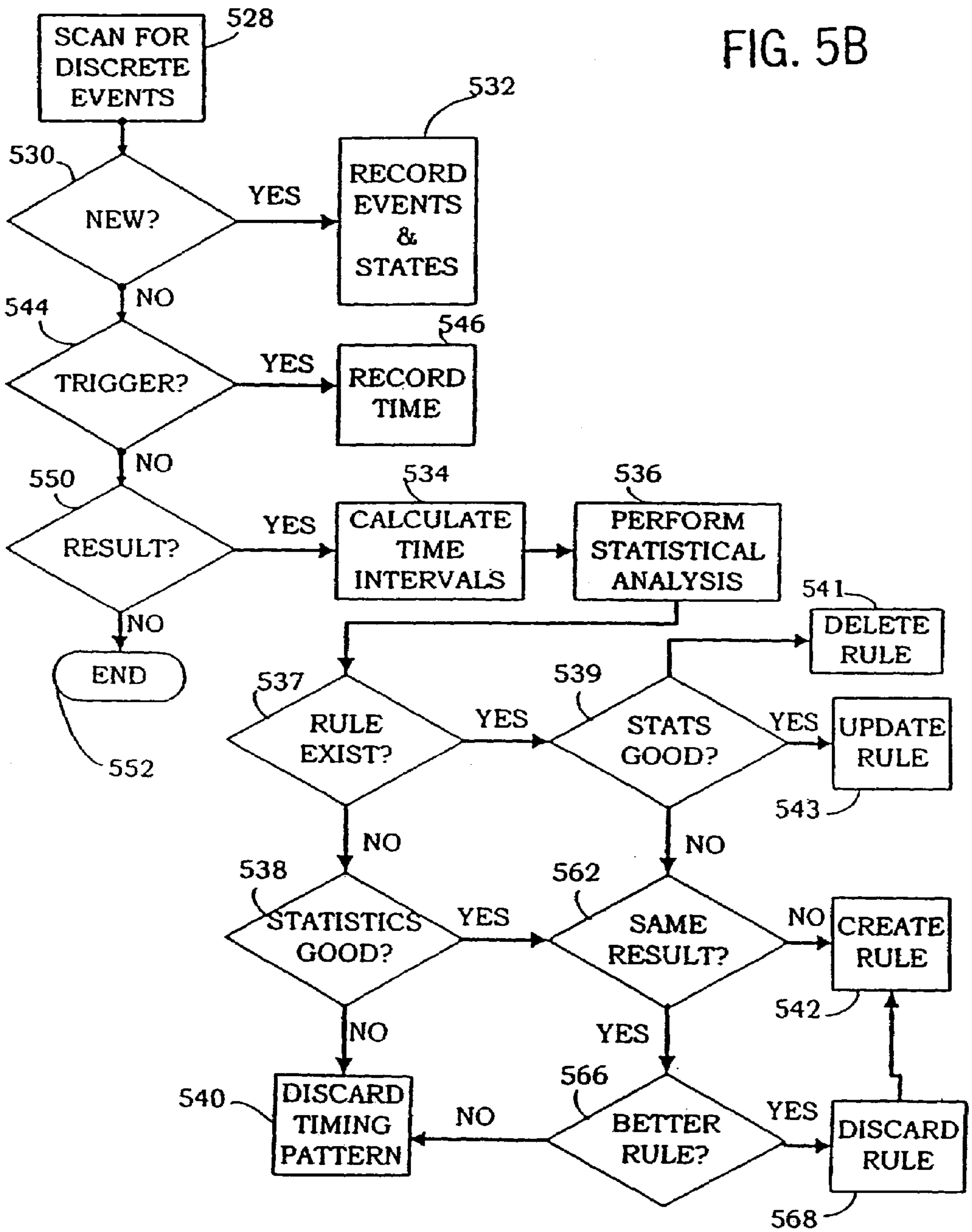
FIG. 5B is a flow chart representing exemplary steps for defining, updating and selecting the optimum diagnostic rules for the system of FIG. 5*a* while the diagnostic engine is in the learning mode.

The various steps involved in obtaining and analyzing the discrete event data for rule learning are illustrated in the flow chart of FIG. 5*b*. In the preferred embodiment, as discussed above, the scan is performed by controller 516 (block 528). However, in alternative embodiments the scan may be performed by other elements of system 510, such as main processor 512. In any event, and regardless of whether reported in real-time or read from memory or disk during an off-line analysis, the occurrences of discrete events are communicated to diagnostic engine 522, which then determines whether the discrete event has been previously detected (block 530) and whether the discrete event is a trigger event for any existing rules (block 544), is a potential or established result event for any rules (block 550), or is an event which has been eliminated as a candidate for a potential rule (block 552 ). The first time a discrete event is detected, it is recorded as an expected event in a file stored in memory of main processor 512. The state of control elements which never experience a discrete event (i.e., do not transition between states) are also stored in this file. During diagnosis, engine 522 may reference this file to identify malfunctions if the occurrence of a discrete event or a state of a control element has been detected that was not previously logged as an expected event.

Returning to FIG. 5*b*, if the detected discrete event is a trigger event of any existing rules, then the event's time of occurrence is recorded (block 546). Otherwise, if the discrete event can be a result event for any rules (block 550), then diagnostic engine 522 determines the timing interval between the discrete event and all possible trigger events (block 534). A statistical analysis is then performed (block 536) which involves incrementally calculating a mean time interval between trigger and result events and a standard deviation about the mean time interval as further repetitions of trigger/result timing patterns are detected.

Next, if a particular trigger/result timing pattern does not correspond to an existing rule (block 537), then the timing statistics of the pattern are evaluated to determine whether the timing pattern is adequate to define a new diagnostic rule (block 38). In the preferred embodiment, a minimum of three repetitions of the timing pattern must be observed before the timing statistics can be evaluated to provide the basis for a diagnostic rule, although clearly a greater number of repetitions would be desirable. Further, if a machine is capable of operating somewhat differently at some times than others (e.g., a conveyor system in which palates are randomly merged from two conveyor lines), the timing statistics will not be sufficient until diagnostic engine 522 has experienced the different operational situations.

Various criteria, or combinations of the criteria, may be used to evaluate the timing statistics. For example, a timing pattern having a mean time interval or a standard deviation that is longer than the cycle time of the manufacturing process will not provide the basis for a useful diagnostic tool. Further, examining the magnitude of the standard deviation and/or the ratio of the standard deviation to the mean time interval may reveal that a resulting diagnostic rule will not be sufficiently precise. If the evaluation criteria are not met (e.g., the mean time interval, the standard deviation, and/or their ratio are too large), then the timing pattern will be discarded as a candidate for a diagnostic rule (block 540), and the timing pattern's discrete events may even be tagged such that they are eliminated as potential candidates for any rules. If, however, the criteria are met and the pattern's result event is not already a result event in an existing rule (block 562), then a diagnostic rule will be defined using the timing statistics of that timing pattern (block 542), thus dictating the timing relationship between the trigger and result events.

As will be explained in more detail below, the diagnostic rules preferably are symmetric rules. That is, the trigger and result events each must occur within an error band about the mean time interval of the other. The error band, which may either be fixed or selectable by a user, is a multiple of the standard deviation and, preferably, is five times the standard deviation.

Once the diagnostic rules are defined, they are either retained or enter a rule competition, as will be explained in detail below. If the rules are retained, they may be updated continuously, including replacement, during the learning process based on the incremental accumulation of timing statistics from further repetitions of the timing patterns. As illustrated in FIG. 5*b,* if a timing pattern occurs that corresponds to an existing diagnostic rule (block 537), the accumulated timing statistics for the pattern are evaluated using the criteria discussed above (block 539). If the accumulated statistics for the rule no longer meet the evaluation criteria, then the rule may be discarded (block 541). If, however, the accumulated statistics are good, then the statistics of the rule are updated to reflect the further repetitions of the associated timing pattern (block 543).

The evaluation criteria applied in blocks 538 and 539 may also provide a basis for rating the merit of timing patterns and existing diagnostic rules. For example, rather than discarding an existing rule if the timing statistics do not meet the criteria, the rule may merely be deactivated. In such a case, the rule remains in existence and is a candidate for activation if its future accumulated timing statistics meet the evaluation criteria. Alternatively, if an existing rule's timing statistics fail to satisfy the evaluation criteria by a wide margin, then the rule may not only be discarded, but also tagged as a rule that should never be considered again. Likewise, if a timing pattern's statistics fail to satisfy the criteria by a wide margin, then future occurrences of the pattern, or even one or all of the discrete events associated with the pattern, may be ignored.

A detected break or inconsistency in a timing pattern also warrants removal of the timing pattern or the corresponding rule from further consideration. For example, a timing pattern or rule may be discarded either if its result event occurs without the prior occurrence of its corresponding trigger event (not shown); or if the rule's trigger event occurs a second time without the intervening occurrence of its corresponding result event (not shown); or if a machine state ends after a trigger event has occurred but before its corresponding result event occurs (not shown). Any of these exemplary breaks in a timing pattern indicates that a rule based on that timing pattern will not provide a consistently reliable indicator of the machine's behavior.

Rule Competition

To minimize memory requirements and optimize the computing efficiency of main processor 512, it is preferable to select only a minimum number of timing patterns. The selected timing patterns should also provide the most precise indicators of the machine's behavior. To achieve these goals, a rule competition procedure may be initiated in which an existing rule can be updated by replacing it with a better rule. The rule competition further allows diagnostic engine 522 to select diagnostic rules that may not necessarily have been intuitive from a knowledge of the machine's architecture.

FIG. 5*b* is a flowchart setting forth the detailed logic of cognitive analysis in accordance with a preferred embodiment. A timing pattern enters into competition with an existing rule if they both include the same result event (block 562). The statistics of the timing pattern are compared to the statistics of the existing rule to determine whether the existing rule indeed provides the most accurate and efficient diagnosis of the behavior of machine 517 (block 566). If the statistics of the timing pattern are better than the statistics of the existing rule, then the existing rule is updated, in effect, by discarding the existing rule (block 568) and creating a new rule based on the better timing pattern (block 542). In the preferred embodiment, the statistics which include the smallest standard deviation are deemed to provide the basis for the better rule. If, however, the magnitudes of the two standard deviations are close in value, then the mean time intervals are also compared. Although the above-described rule competition is presently preferred, diagnostic engine 522 may also be set to retain more than one rule for a given result event and may specify other criteria, or combination of criteria, for the competition.

State-Dependent Learning

The selection of the best diagnostic rules may also be affected by whether machine 517 is capable of running in more than one machine state. For example, machine 517 may be used to manufacture several different types of parts (e.g., a standard truck cab and an extended truck cab), and, thus, the details of the machine's operation will be somewhat different in each state. For instance, some control elements 518 may not be activated in one of the states, or, if active, the timing patterns may be different. Maintaining separate rule bases for each different state would be prohibitive in terms of the computational and memory requirements for main processor 512. On the other hand, defining a single set of rules that will apply to all machine states will be difficult in most situations. Therefore, it is preferable that the diagnostic engine 522 observe the operation of machine 517 in all states, and then define a maximum number of diagnostic rules based on timing patterns that are common to all states and a minimum number of rules based on timing patterns peculiar to a particular state. Further, each resulting rule is preferably tagged with code that indicates the state or states to which the rule applies.

Before defining a common diagnostic rule, the timing statistics of the common timing pattern are subjected to the same evaluation process as described above. If the statistics of the common timing pattern do not satisfy the evaluation criteria (e.g., the mean time interval, the standard deviation or their ratio are too large), however, then diagnostic engine 522 will attempt to discover a version of the common timing pattern that will produce an acceptable diagnostic rule. For example, if the time interval between the trigger and result events varies between states as a result of a change in conveyor speed and a measurement of conveyor speed is available, then a diagnostic rule can be defined having a mean time interval that is a function of the measured speed. As another example, if the manufacturing process can diverge into one of multiple courses of action and then resume a single course, forward or backward-looking diagnostic rules can be defined that diagnose the final and initial events of the individual courses of actions respectively, as will be explained below.

Symmetric and Forward and Backward-Looking Rules

In general, the diagnostic rules can be either symmetric rules, forward-looking rules, or backward-looking rules. In a symmetric rule, an event B always follows an event A and vice versa. The following timing pattern satisfies the requirements of a symmetric rule:

B-----A-----B

In a forward-looking rule, event A is always followed by event B, but not vice versa. Both of the following examples of timing patterns satisfy the test for a forward-looking rule:

B-----A-----B

B-----------B

In a backward-looking rule, event B is always preceded by event A, but not vice versa. Thus:

B-----A-----B

B--A---A----B

Preferably, the diagnostic rules are symmetric rules, and thus also satisfy the tests for forward and backward-looking rules. However, if a symmetric rule does not satisfy the evaluation criteria, a forward or backward-looking rule may be defined instead, and, in the preferred embodiment, the rule includes a code indicating whether the rule is a symmetric, forward-looking, or backward-looking rule. Backward and forward-looking rules have uses other than that discussed above. For example, if a control element experiences bounce, the element's change of state can still be the trigger event of a backward-looking rule.

Grouping of Control Elements

For machines having an extremely large number of control elements 518, the definition of diagnostic rules could involve extensive computation and large amounts of memory. Thus, in the preferred embodiment of the invention, diagnostic engine 522 can employ alternative strategies that prevent the amount of computation time and the amount of memory from becoming excessive. For example, control elements 518 may be divided into independent groups which have little or no interaction with other groups. Rules are then defined on a group basis, and the rules for each group include only those discrete events which correspond to elements 518 within that group.

In practice, however, groups of elements 518 usually do interact with one another, but only on a limited basis. Accordingly, some of the elements of one group can be selected to be visible to another group and are thus included in the rules for the latter group. Selecting the visible elements may be easily accomplished based on a knowledge of the architecture of the control system. Further, grouping of control elements 518 for diagnostic purposes is particularly suited for a control system which includes multiple distributed controllers 516. In such a distributed control system, each controller 516 is associated with a group of control elements 518, and, thus, the system architecture is easily discernible. In alternative embodiments, other strategies may be employed, such as performing the rule definition process in stages in which only certain groups of control elements 18 participate at a given time.

Diagnosis

Figure 5C:
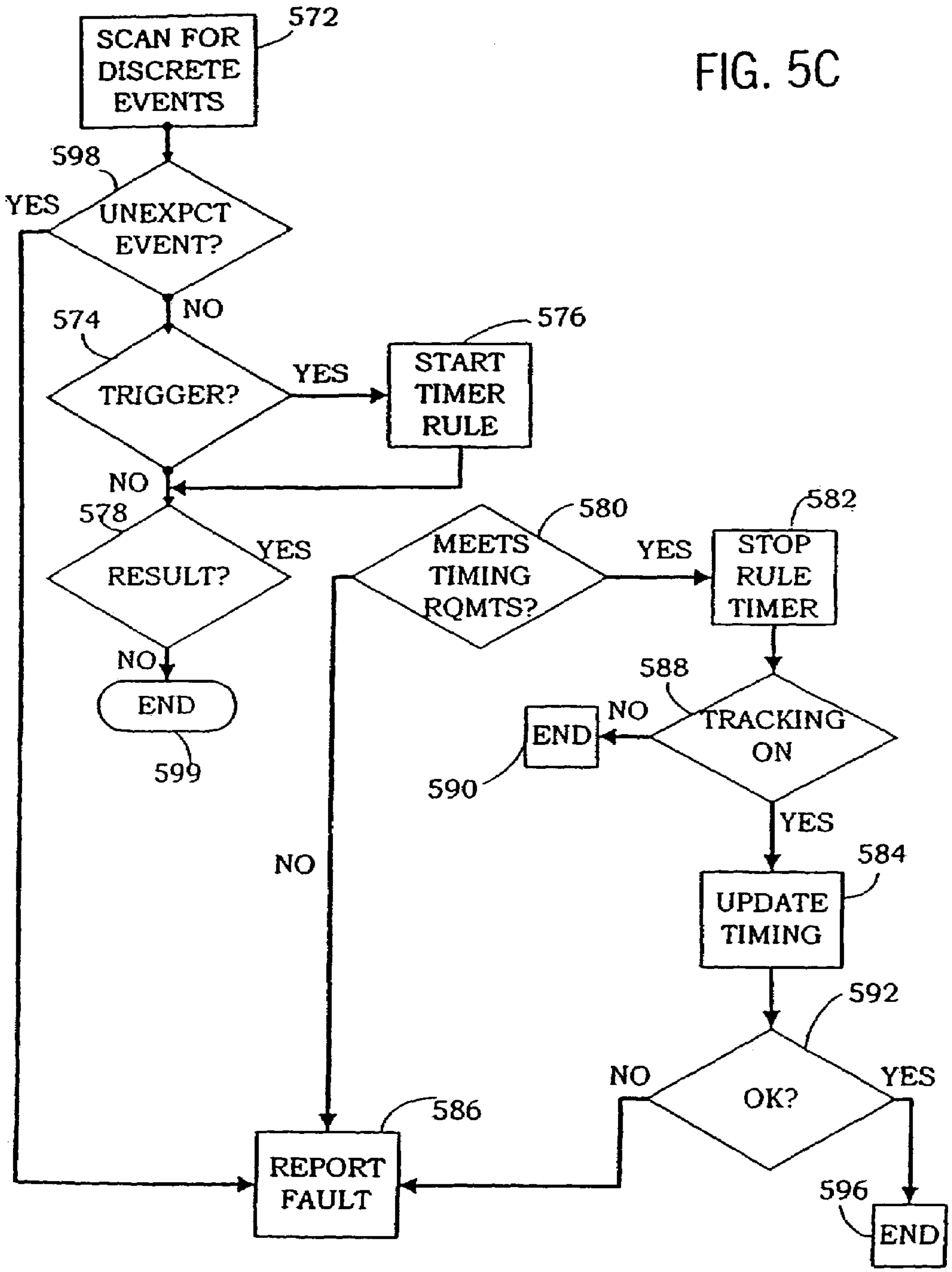
FIG. 5C is a flow chart representing exemplary steps for identifying a malfunction in the behavior of the machine and updating the timing statistics associated with the diagnostic rules while the diagnostic engine of FIG. 5*a* is in the diagnostic mode.

Once diagnostic rules are learned, diagnostic engine 522 may be set to the diagnostic mode in which incoming discrete events are evaluated relative to the diagnostic rules to identify existing or potential malfunctions in the behavior of machine 517. The evaluation of the discrete events may be performed in several alternative manners. For example, referring to FIG. 5*c*, the timing relationship between the trigger and result events may be evaluated relative to the timing statistics learned during the learning process (blocks 585, 582, 588, and 590). Accordingly, if, for instance, the result event does not occur within five learned standard deviations of the learned mean time interval and the corresponding rule is either a symmetric or forward-looking rule, then system 510 will identify that a malfunction in machine 517 has occurred (block 586).

Alternatively, and preferably, the timing statistics are incrementally updated in real time based on observing further repetitions of the timing patterns associated with the diagnostic rule. For example, in the preferred embodiment illustrated in FIG. 5*c*, if a scanned discrete event (block 572) is the trigger event for an active rule (block 574), a rule timer is started (block 576). If the result event for the triggered rule occurs (block 578) within five standard deviations of the mean time interval (block 580), then the timer is stopped (block 582 ) and the timing statistics are updated (blocks 588 and 584). If, however, a result event occurs and its corresponding rule has not been triggered (block 578), or if the result event does not occur within the allotted time interval (block 580), the system 510 identifies that a malfunction in machine 517 has occurred (block 586).

In a preferred embodiment, both the learned timing statistics and the updated timing statistics are retained as separate files in the memory of main processor 512. The learned timing statistics thus provide a baseline reference for evaluating the performance of machine 517, while the updated timing statistics, which may be regularly replaced (e.g., on a daily, weekly or monthly basis), provide a mechanism by which the diagnostic rules can autonomously adapt in real time to changed operating conditions. For example, in the preferred embodiment, occurrences of discrete events may be evaluated by determining whether a result event occurs after its trigger event within a multiple of the learned standard deviation of the updated mean time interval. Using the updated mean time interval in conjunction with the learned standard deviation ensures that system 510 does not interpret changes in the timing pattern caused by manufacturing variations, such as normal machine wear and aging, temperature or other environmental conditions, as machine malfunctions. In alternative applications, however, both the updated mean time interval and the updated standard deviation may be used or only the updated standard deviation may be used. As yet another alternative, the diagnostic rules may be updated by replacing the learned timing statistics with the updated timing statistics.

The diagnostic engine 522 preferably also tracks (block 588) the updated timing statistics against the learned timing statistics, although the tracking feature is optional (block 590). Accordingly, engine 522 can diagnose a large change or drift in the updated timing statistics relative to the learned statistics (block 592) as indicative of an existing or potential malfunction in the behavior of machine 517 (blocks 586, 596).

The criteria that engine 522 employs to identify malfunctions may vary depending on the type of diagnostic rule used. For example, symmetric and forward-looking rules can be used to identify a malfunction (a) when a result event occurs either too soon or too late after its trigger event, (b) when a trigger event reoccurs before its corresponding result event has ever occurred, or (c) when a machine state ends before a result event occurs for a rule that has been triggered. Symmetric and backward-looking rules can be used to identify a malfunction, for example, (a) when a trigger event occurs either too early or too late relative to its corresponding result event, (b) when a result event reoccurs without a corresponding reoccurrence of its trigger event, or (c) when a result event occurs during a particular machine state and its trigger event did not precede it while in that machine state. It should be understood that these types of malfunctions are offered by way of example only, and that one skilled in the art would recognize that other types of malfunctions may be readily diagnosed.

Upon detection of a malfunction, main processor 512 generates an error signal indicative of the malfunction and communicates it to user interface 526. User interface 526 preferably includes a display driver (not shown) which, in response to the error signal, communicates a display signal to the display screen which then provides visible indicia indicating that a malfunction has occurred. For example, alphanumeric characters may appear on the display screen stating that a particular discrete event has occurred at an improper time. Or, a user may provide a custom message to be displayed for a fault of a particular rule or rules. Alternatively, the display may provide a graphical representation of the faulted rule or rules which highlights the problem area, such as with a flashing or colored marker. In other embodiments, other types of displays or audio components for effectively communicating the occurrence of the malfunction, either alone or in combination, may be readily envisioned by those skilled in the art.

In addition to identifying timing errors, the present invention can identify malfunctions that are characterized by the occurrence of an unexpected event. For example, after having observed machine 517 in all operating states and conditions, diagnostic engine 522 may detect the occurrence of a discrete event that it has never seen before or that had never occurred while the machine was operating in the present machine state (i.e., the discrete event has not been recorded in the expected events file stored in memory of main processor 512) (block 598). This unexpected event may be indicative of a malfunction or of an unusual condition, such as the opening of a safety gate. In any event, diagnostic engine 522 will generate an error signal (block 86) that is translated into an error message that is displayed on the display screen of user interface 526.

Unexpected events also include detection of a control element which is in the wrong state. For example, in some machine states, a control element may never experience a discrete event and, thus, is always in one particular state. Accordingly, if engine 522 detects that the control element is in or has transitioned to the other state (block 598), the unexpected event will be diagnosed as a malfunction (block 586).

It should also be understood that some discrete events may not be either a trigger or a result event for any diagnostic rule (blocks 574 and 578). In such a case, and provided the discrete event is not an unexpected event (block 598), diagnostic engine 522 will simply ignore its occurrence (block 99).

Although the foregoing description has been provided for the presently preferred embodiment of the invention, the invention is not intended to be limited to any particular arrangement, but is defined by the appended claims. For example, either the rule definition process or the diagnostic process, or both, may be performed off-line using discrete event data that has been stored in memory. Or, the diagnostic rules initially may be defined by a user and then may be updated or replaced based on real-time observation of discrete events. Alternatively, a user may manually modify the diagnostic rules after the rules have been defined based on real-time observation. Further, the diagnostic rules may be based on other variations or types of statistical analyses of the repetitions of the timing patterns.

Designer Studio

Figure 6:
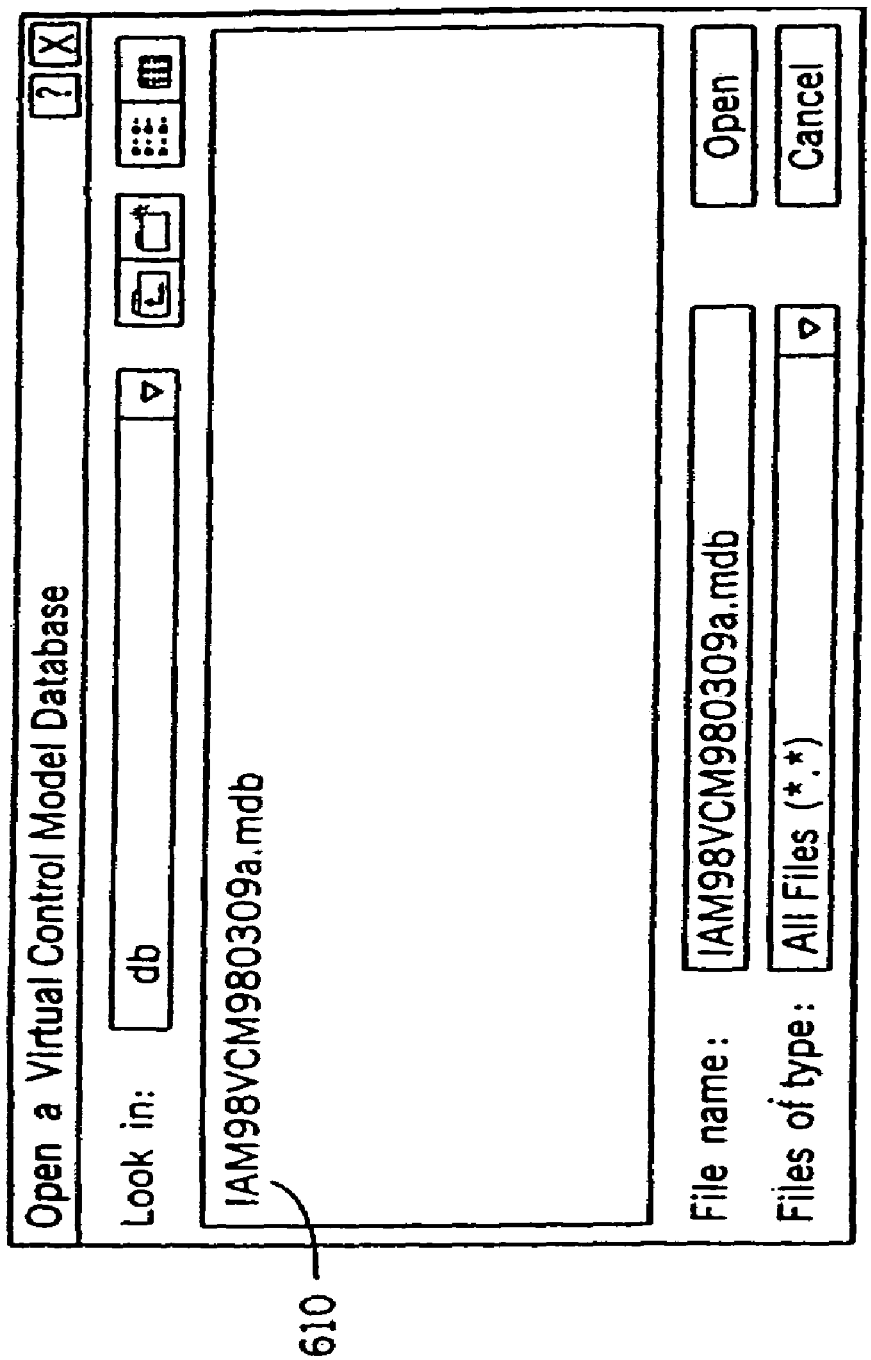
FIG. 6 illustrates the user display for opening a project in accordance with a preferred embodiment.

The Designer Studio is a software tool set for integrating control system design, simulation, implementation and maintenance; and integrating the control system design with external product, process and machine (data) models. A user commences operation by opening a new or existing project. FIG. 6 illustrates the user display for opening a project in accordance with a preferred embodiment. All existing projects are listed in the window 610 for a user to select from. When the user selects a project 610 it opens a Designer Studio window. FIG. 7 is a Designer Studio window in accordance with a preferred embodiment. The first panel that is created when a project is opened is the Resources panel 710. In this panel, a filtered hierarchical list of the project resources is presented for further control definition. The timing diagram panel 720 is presented for sequencing workcell operations. It also joins the resources necessary to perform the operations at the appropriate times. The control resources window 730 provides an predictive list of control assemblies for a user to select from based on the resources 710 and the activities 720.

Figure 8:
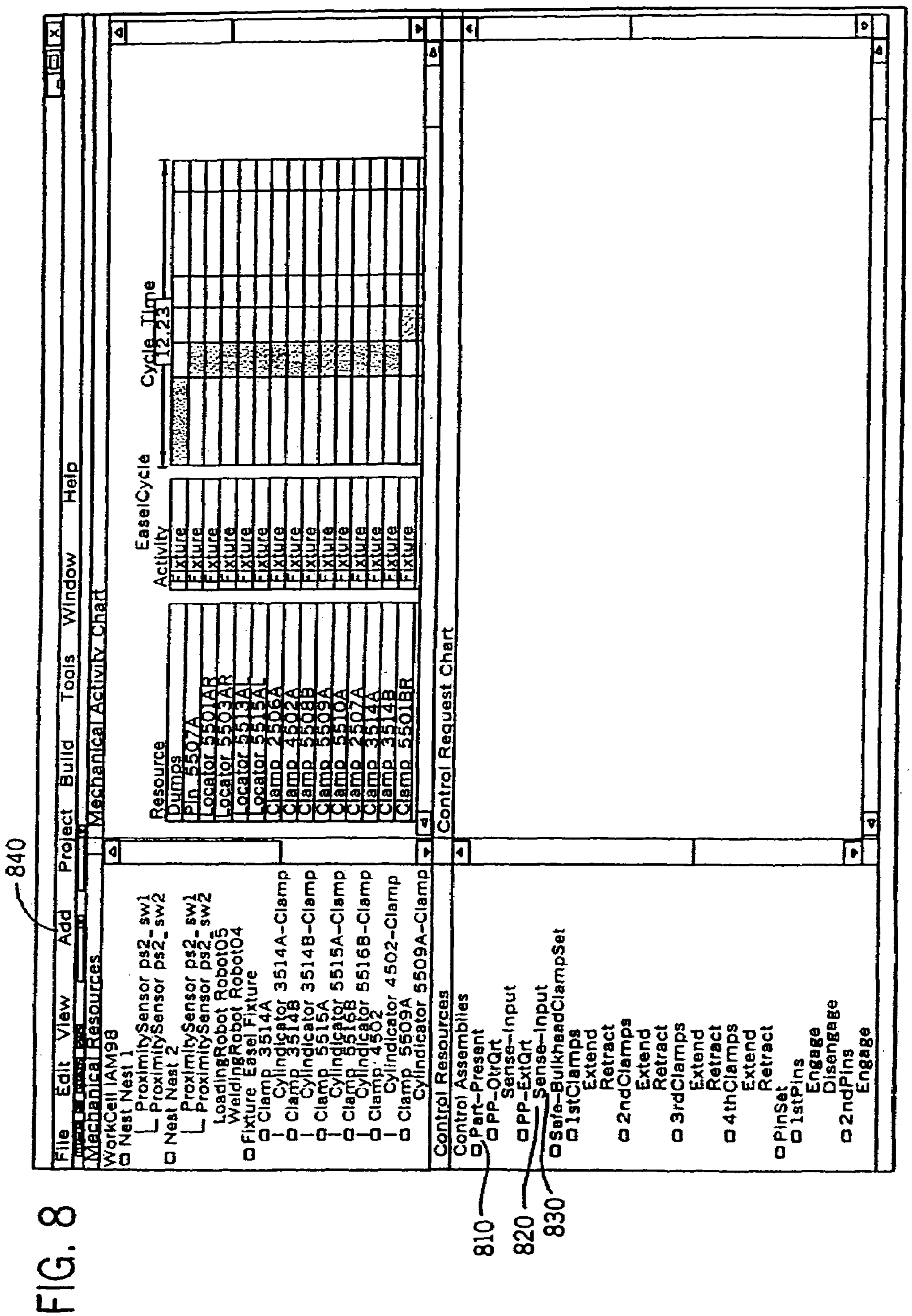
FIG. 8 is a Designer Studio display with CAS completed in accordance with a preferred embodiment.

FIG. 8 is a Designer Studio display with control assemblies completed in accordance with a preferred embodiment. A hierarchical list of the control assembly types 810, control assembly instances 820, and control assembly instance requests 830. One of the options that a user can exercise in the Designer Studio is the add operation 840 which invoked the add control assembly logic of the add operation. This prompts the user with an add control assembly dialog box. From the dialog box, a user can select a control assembly type and select the new button to go to the control assembly wizard FIG. 9.

Figure 9:
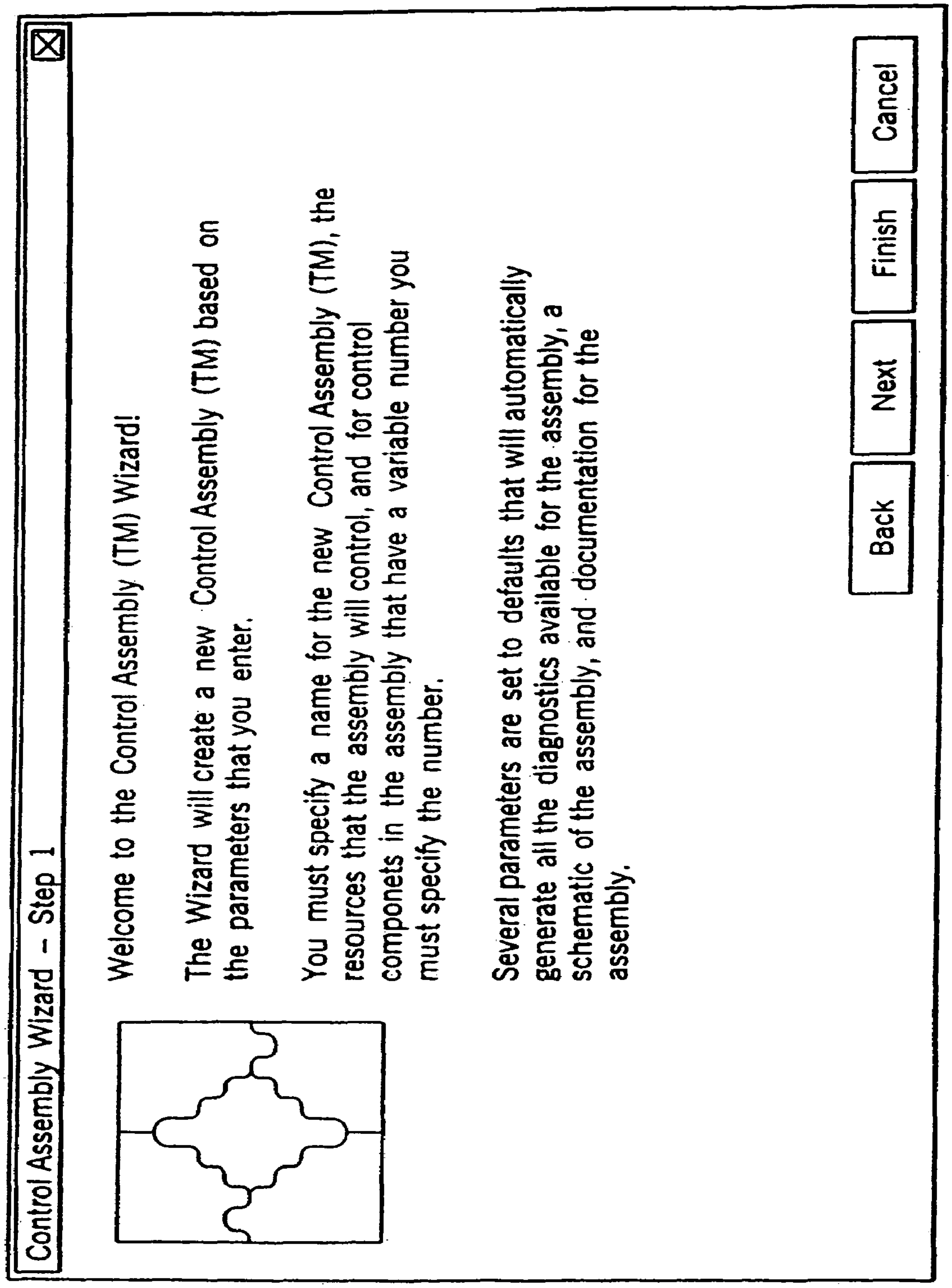
FIG. 9 is a CA wizard in accordance with a preferred embodiment.

FIG. 9 is a control assembly wizard in accordance with a preferred embodiment. The information in the display acclimates a user with the wizard experience.

Figure 10:
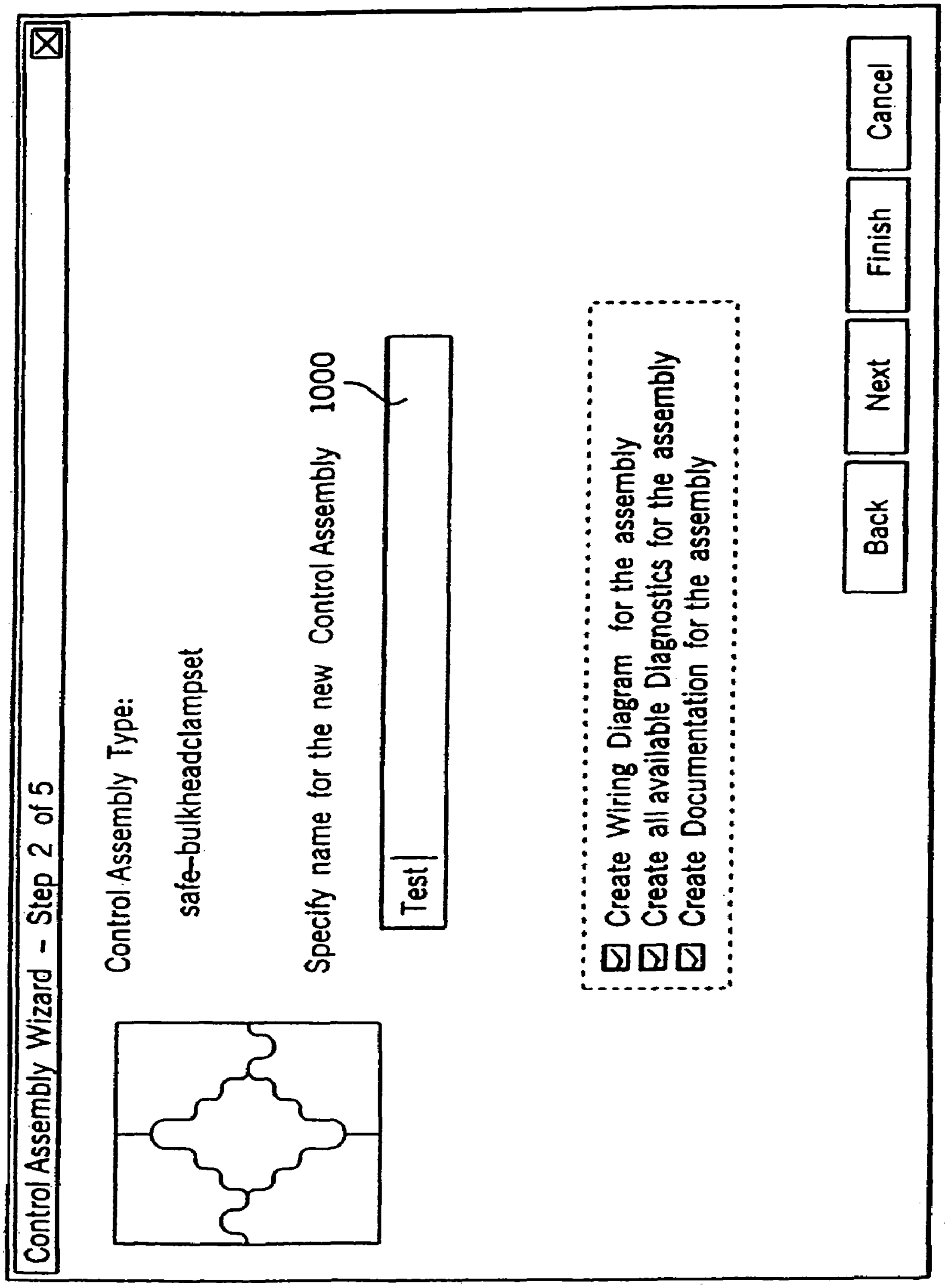
FIG. 10 is a CA wizard name operation in accordance with a preferred embodiment.

FIG. 10 is a control assembly wizard name operation in accordance with a preferred embodiment. The user must specify a name 1000 indicative of the new control assembly instance that will be generated utilizing this wizard. The user also has the option of selecting various options to initiate other processes to create wiring diagrams, diagnostics and documentation for the named instance of the control assembly.

Figure 11:
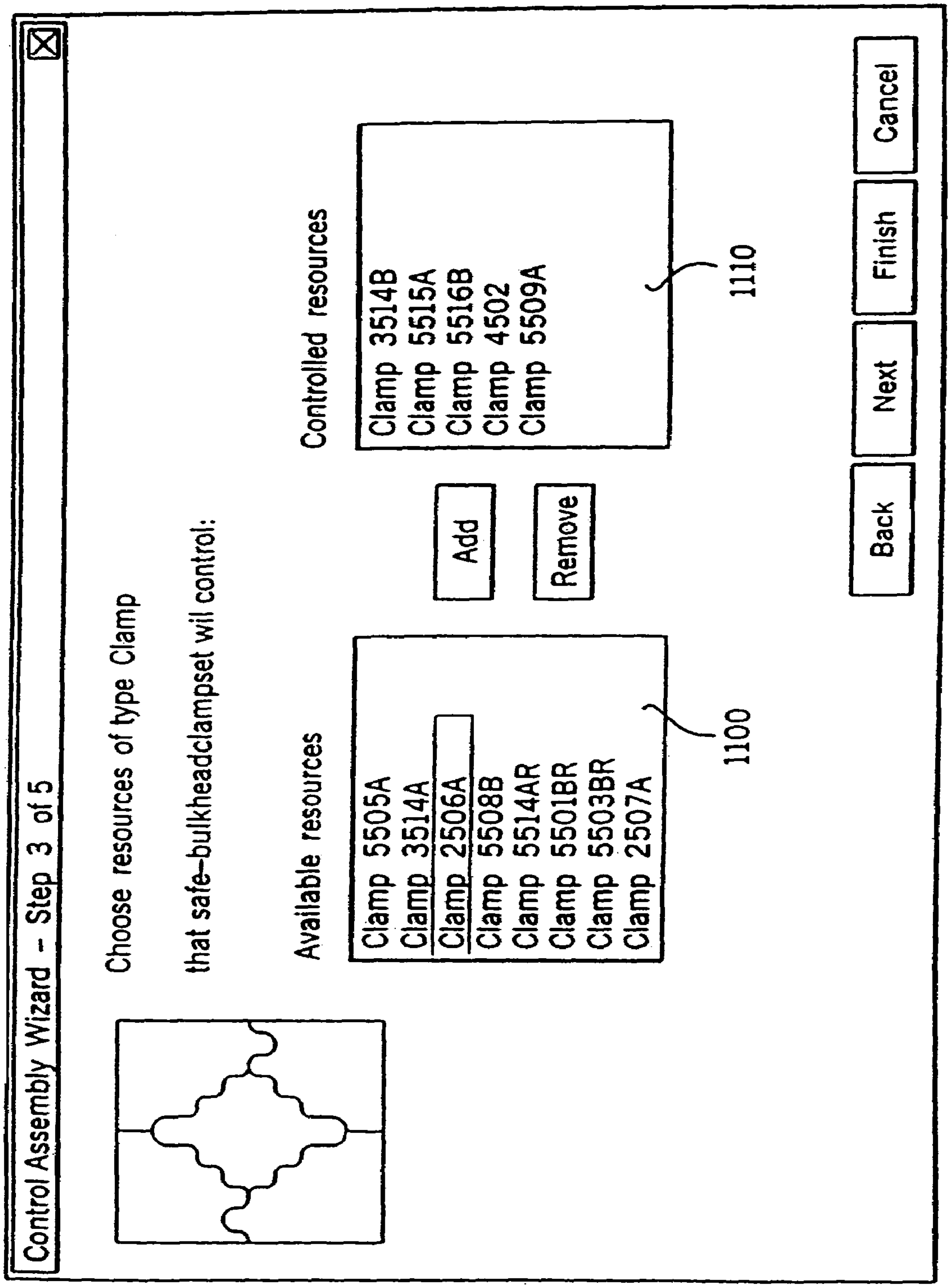
FIG. 11 is a CA wizard to select control resources in accordance with a preferred embodiment.

FIG. 11 is a control assembly wizard to select control resources in accordance with a preferred embodiment. The available resources of the appropriate type are presented to the user in a window 1100. A user selects resources that will be controlled by the named control assembly instance from window 1100 and presented back to a user in a window 1110. Selection logic is provided which is consistent with the activity timing diagram 720. When a particular resource is selected, all other resources that conflict with that selected resource are greyed out to prevent conflict selection.

Figure 12:
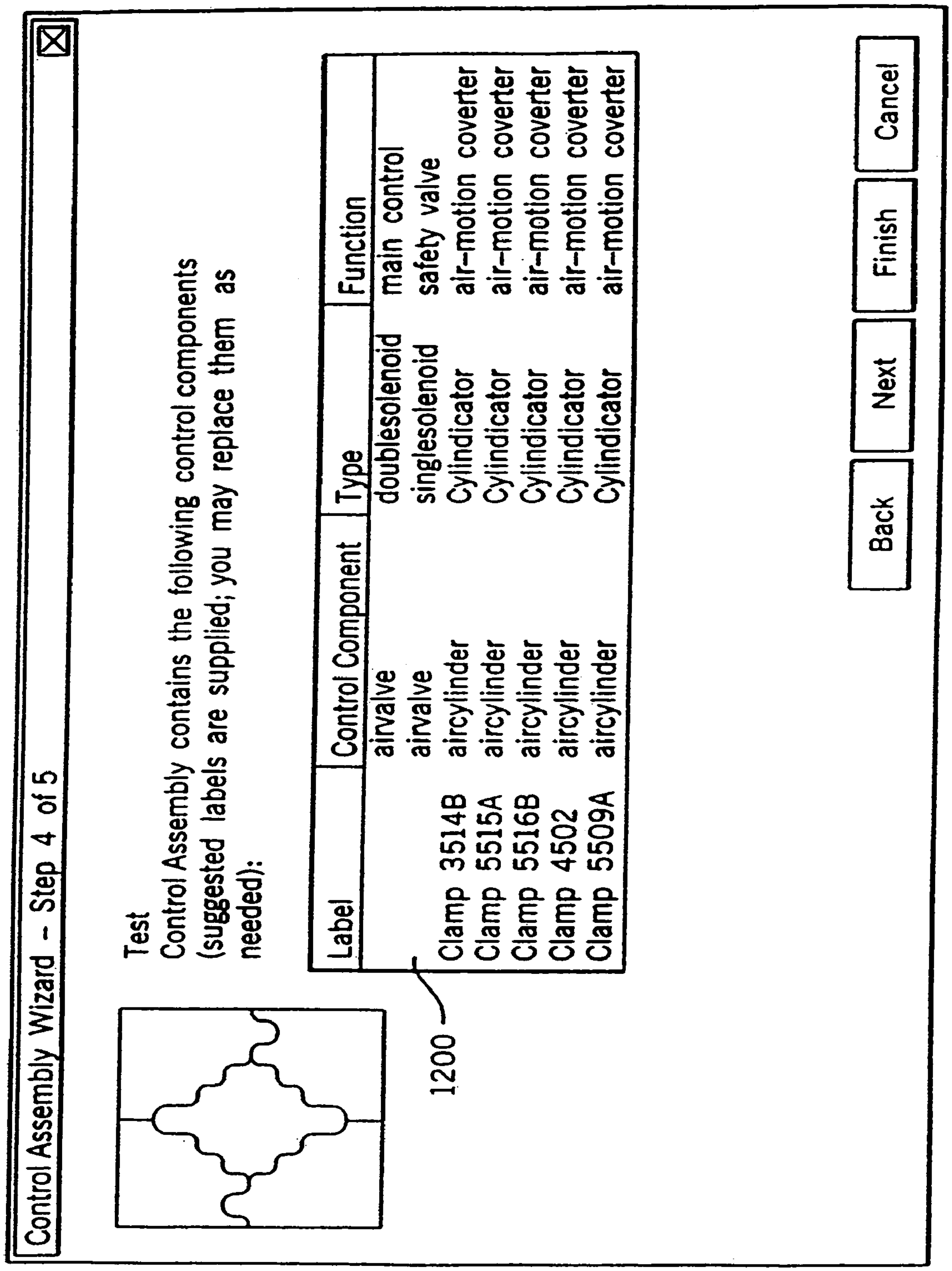
FIG. 12 is a CA wizard to label components associated with the CA in accordance with a preferred embodiment.

FIG. 12 is a control assembly wizard to label components associated with the control assembly in accordance with a preferred embodiment. Label comments 1200 are entered for each of the components at the user's discretion.

Figure 13:
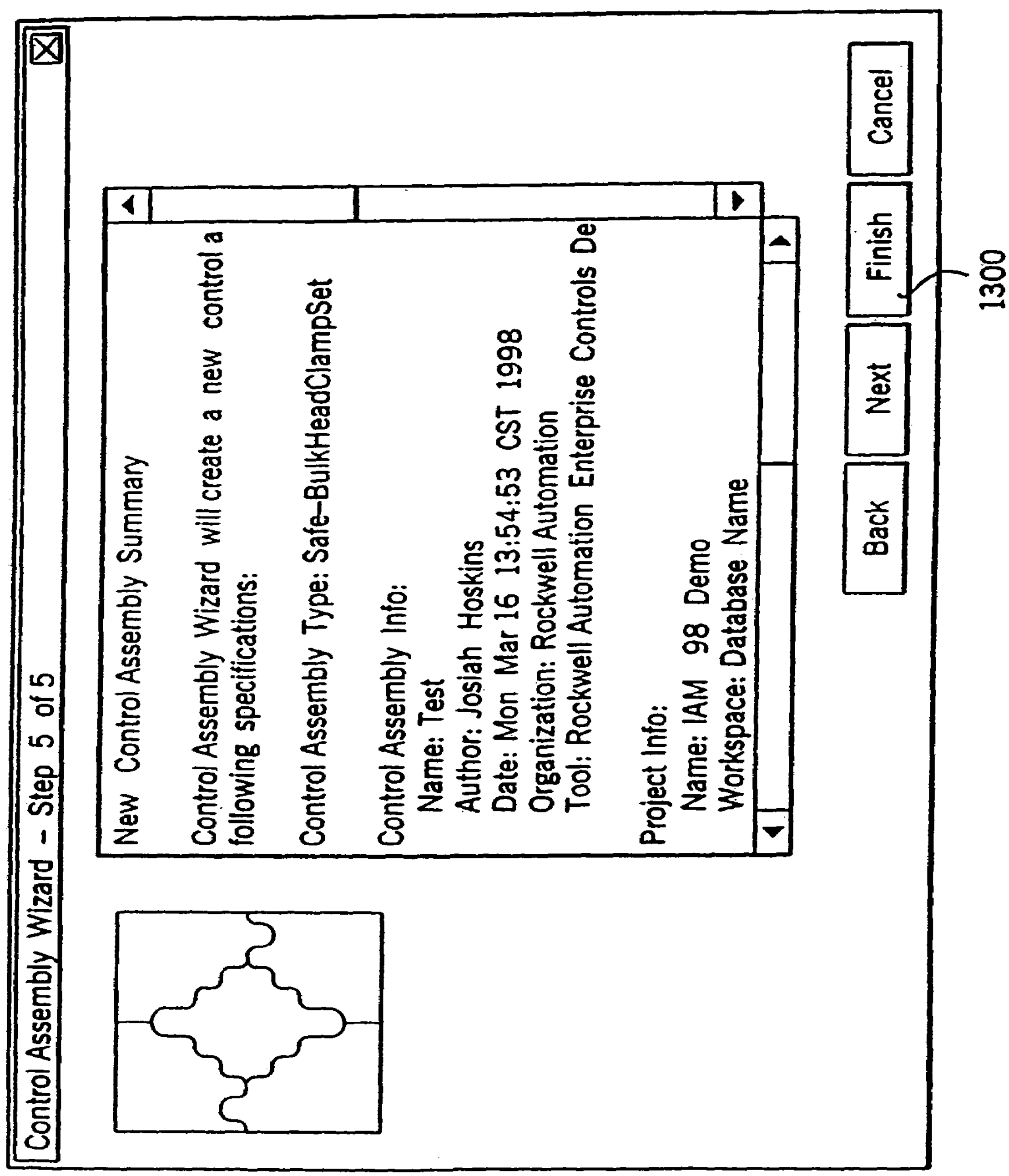
FIG. 13 is a CA wizard summary in accordance with a preferred embodiment.

FIG. 13 is a control assembly wizard summary in accordance with a preferred embodiment. When a user selects 1300 the wizard completion processing occurs and the control assembly is created conforming to the user's selections.

Figure 14:
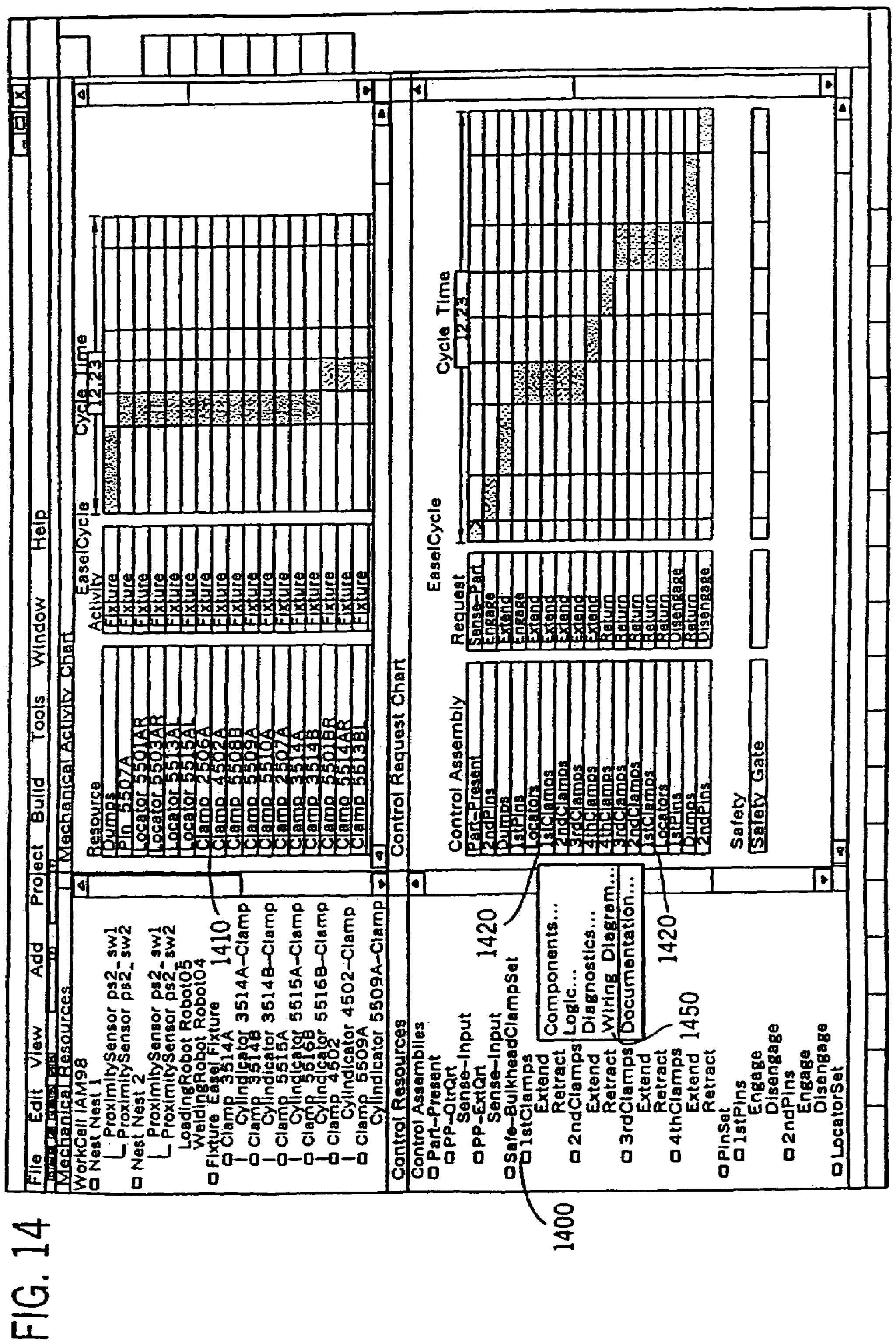
FIG. 14 is a Designer Studio display of a new CA integration in accordance with a preferred embodiment.

FIG. 14 is a Designer Studio display of a new control assembly integration in accordance with a preferred embodiment. The new control assembly instance 1400 is added into the Control Resources control assembly tree utilizing the selected type and the data model of that particular type combined with the user selected information from the wizard and that combined information is written into the ECDB. The selected resources that are under the control of the newly created control assembly named 1stClamps 1400 are the resources 1410 as shown in the Control Request Chart 1420 and 1430. The prescribed order of the mechanical operations for the resources 1410 refers to the time window that particular resources are utilized. The order of events from the prescribed order must be maintained in the Control request chart as illustrated by the placement of the Control Assembly's 1420 and 1430. Other intervening assemblies can occur, but the prescribed order is always maintained.

A popup window that details each of the types and instances of assemblies appears at label 1450. A Control Assembly type comprises the following information. A control component which is an entity that either sends a control signal, receives a control signal, or both sends and receives control signals. Examples of control components include a solenoid valve (receives), proximity sensor (sends), Robot interface (both), PanelView interface (both), pushbutton (sends), indicator light (receives) or a motor controller.

Logic refers to the control and fault states, the transitions between states that the control components can attain (i.e., the state space of the control assembly), the controller outputs which produce the transitions, and inputs to the controller determine the current state.

For example, an n-sensor
PartPresent (input) has states such as Part Absent,
Part Present, Part out of position, Transitions
Part Absent transititioning to a Part Present state.
Part Present transititioning to a Part out of position state.
Part out of position transititioning to a Part Absent state.
Part Absent transititioning to a Part Present state.
Part Absent transitioning to a Part out of position state.
Part out of position transititioning to a Part Present state.

There are also logic for Input only types, such as:
all n off (Part Absent);
all n on (Part Present);
k of n on (k<n, k>0) (Part out of position);

There are also logic for output only types, such as:
ClearToEnterLight (output) (e.g., single light also could be multiple lights); which also has various states such as LightOn; LightOff with Transitions, such as: LightOn transitioning to LightOff; and LightOff transitioning to LightOn.

There are also status based and causal based Diagnostics.

Status-based diagnostics—specifies the step(s) that the machine is currently waiting to occur (if a fault occurs it specifies the step(s) that were waiting to occur at the time of the fault, i.e., the symptoms).

Causal model-based diagnostics—use a model of causal relationships to develop rules that relate machine status to root causes.

For example, consider that a human mechanic has incorrectly moved the mount location of a part present proximity sensor so that it is out of alignment. Then the Status-based diagnostics would place the following message in an internal diagnostic table that could be displayed: "waiting for part present sensor #2" (no automatic inference possible).

In another situation, a proximity sensor on a clamp cylinder could fail. Then, the status-based diagnostics would place the following information into an internal diagnostic table that could be displayed: determines that a machine is "waiting for clamp cylinder 2504A."

In a causal model-based diagnostic system the logic infers that the extend proximity sensor on cylinder 2504 A has failed, or that cylinder 2504 A is stuck and informs an operator accordingly. The causal model utilizes a set of rules and a tree structure of information to determine the probable root causes based on factual scenarios.

Schematic A schematic (i.e., "wiring diagram") is a representation of the logical and functional connections among a set of control and mechanical components. The connections include electrical, pneumatic, and hydraulic. The preferred embodiment presents a view of each of these connection types and the bill of materials that make up the control and mechanical components of the control assembly type or instance.

Figure 15:
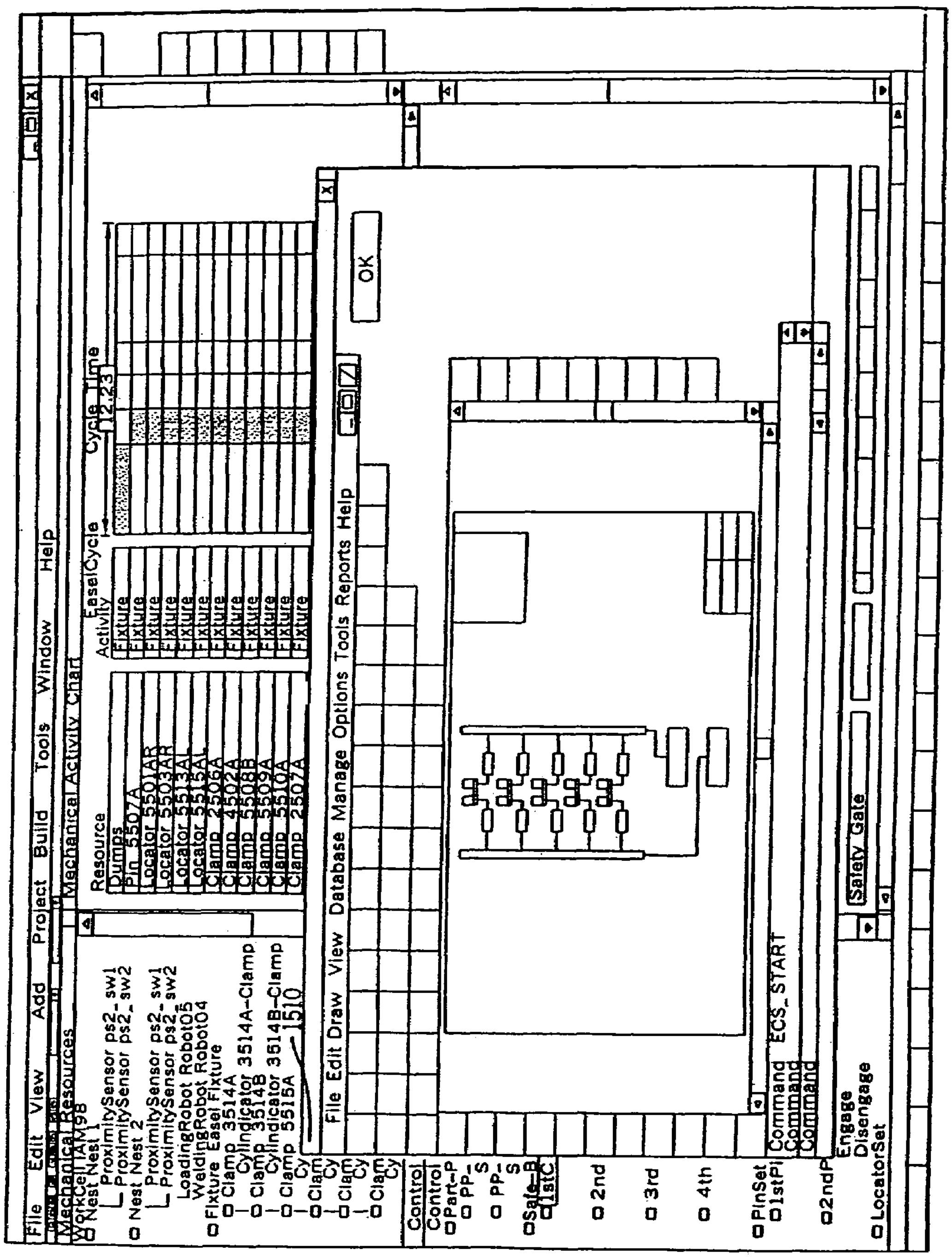
FIG. 15 is a schematic of a pneumatic system of a control environment in accordance with a preferred embodiment.

FIG. 15 is a schematic of a pneumatic system of a control environment in accordance with a preferred embodiment. RSWire is the application created and manufactured by the assignee. RSWire 1510 utilizes a computer aided design engine for creating, displaying, manipulating and storing schematics of electrical and hydraulic systems. Various views are all enabled withing the enterprise system in accordance with a preferred embodiment. System wide information, including detailed electrical, pneumatic and hydraulic information, is all stored in the ECDB.

Visualization

A visualization comprises entities within the control assembly that are useful to portray textually or graphically. For example, Control Components can be displayed as text or a graphical representation of the control component could be utilized.

Logic can be displayed as LL, function blocks or in axis-like diagrams. Diagnostics can be displayed as status messages, causal messages and as indicators on a graphic display. The information includes a three dimensional depiction of a work cell.

One way to streamline any type of programming is to provide predefined language modules which can be used repetitively each time a specific function is required. Because of the similar types of tools and movements associated with different machine line stations, industrial control would appear to be an ideal industry for such language modules. For example, various stations in a single machine line could employ drilling tools having identical limiting motion and configuration parameters.

In this case the idea would be to design a ladder logic language module for a drill once, place the drill language module into a control library and thereafter, each time drill logic is required, download the drill language module into a control program. Similarly, language modules for other types of tools could be designed once and then used repetitively to reduce programming and debugging time. The module library could be expanded until virtually all tool movements are represented. Library components would be viewed as "black boxes" with predefined interfaces, in much the same way that integrated circuits are used in the electronics industry.

In addition, to make it easier to program in LL, a comprehensive module library would also facilitate automated LL programming using a programming editor. For example, an entire module library could be stored in the memory of an electronic editing apparatus. Using the apparatus, a user could designate all characteristics of a machine. Thereafter, using the designated characteristics, the apparatus could select language modules from the module library and assemble an LL program to control the machine.

The module library approach would work quite well for certain applications like small parts material handling or simple machining. The reason for this is that the LL logic required for these applications tends be very small and highly reusable because the I/O count is minimal and interactions between modules are simplistic.

Unfortunately, there are many areas of industrial control for which it is particularly difficult to provide reusable language modules due to relatively large and varying job specific I/O requirements and the complexity and variability of interaction between modules.

One area of industrial control that defies the predefined language module approach is sequential control. Sequential control is the synchronization of individual tool movements and other subordinate processes to achieve a precisely defined sequence of machining operations. While it may be easy to enumerate all of the possible sequences involving just a few simple tool movements, the number of possibilities increases rapidly as the number and complexity of the tool movements increases, to the point where any attempt to enumerate them all is futile.

For example, a typical machine station configuration may include five different tools, each of which performs six different movements for a total of thirty movements. In this case, each tool movement must be made dependent on the position of an associated tool. In many cases, movement of a tool must also be conditioned upon positions of all other tools at the station. In addition, tool movements at one station are often tied to tool movements at other stations or the completion of some portion of a cycle at some other station. Furthermore, tool movement may also be conditioned upon the states of manual controls.

Taking into account the large number of machine line tools, tool movements, manual control types, manual control configurations, and cross-station contingencies that are possible, the task of providing an all encompassing module library capable of synchronizing tool movements becomes impractical. Even if such a library could be fashioned, the task of choosing the correct module to synchronize station tools would probably be more difficult than programming required LL logic from scratch.

For these reasons, although attempts have been made at providing comprehensive language module libraries, none of the libraries has proven successful at providing comprehensive logic to synchronize tool movements. In addition, none of the libraries has made automated LL programming a reality. Thus, typically synchronization programming in LL is still done from scratch.

Therefore, in order to reduce programming time and associated costs, it would be advantageous to have a more flexible means of specifying control logic for controlling machine sequences. It would be advantageous if such a means enabled less skilled programmers to provide sequential control logic. Furthermore, it would be advantageous if reusable logic templates, comprising the basic components of a sequential control program, could be composed into a library of templates that would be employed to produce sequential control logic with consistent behavior and form. Moreover, it would be advantageous if such a library of templates could be accessed using a programming apparatus such as a personal computer, or the like, to further minimize programming time required to program machine sequential control in LL.

In accordance with a preferred embodiment, a programming apparatus is disclosed to construct a bar chart image or graphical depiction on a computer screen which resembles a bar chart programming tool. A bar chart is a conventional controller programming tool that consists of a graphical cycle representation illustrating all related tool movements in a cycle. Control engineers regularly generate bar charts on paper to visualize sequences of motion. The apparatus gleans information from the bar chart image and, using a template based programming language, constructs a template based machine model.

A template is a language module that includes some truly reusable machine logic and a section wherein other templates can be designated that are required to provide machine logic for job-specific control requirements. When compiled, the model provides complete LL logic for controlling sequenced tool movements.

Thus, one object of the present invention is to provide an apparatus that can reduce the time and cost associated with programming sequences of tool movements in cycles. Using the inventive apparatus, a user can quickly construct a bar chart image on a computer screen that contains all of the information necessary to sequence tool movements. The apparatus includes an editor that gleans all required information from the bar chart image, determines if additional templates are required to provide job specific logic and, where additional templates are required, creates required templates and populates existing templates with references to the new templates. Compilation is a simple process so that, after a bar chart image has been created, the apparatus itself can completely convert bar chart information into sequencing logic thus minimizing programming time and associated cost.

Another object of the present invention is to minimize the amount of training required before a user is competent in programming sequencing logic. Control engineers are already familiar with the process of constructing and using bar charts as an aid for cycle visualization. Because the inventive apparatus interfaces with a user via a bar chart image, control engineers should be comfortable using the present apparatus.

Yet another object is to provide a module library that includes logic that can be altered to accommodate job-specific requirements for sequencing cycle functions and making functions contingent upon various function conditions including function states in cycle, instantaneous states of other cycles, and instantaneous conditions of manual control devices. The present invention includes a "bucketing" means whereby certain conditions of related functions are placed in different groupings depending upon relationships between the functions and an associated function. Control logic including an output, is provided for each group indicating when all conditions in the group are true or when one or more are false. The outputs are mapped into the logic module associated with a function to provide synchronized automatic and manual function control that is conditioned as required, on the states of the related functions. In this way, function module logic is altered to accommodate job-specific requirements for a cycle.

IV. Template Language

In order to understand the template language concept, it is first necessary to understand that all machine attributes, including machine components, component physical and operational characteristics, and component movements, can generally be referred to as control-tasks and that there is a natural hierarchical relationship between various control-tasks. Any machine and associated industrial process can be subdivided into a network of separate, related control-tasks that form a hierarchy of control-tasks. For example, a single machine usually has specific control-tasks (i.e. indexers, stations, work-units, and movements . . . ). While the machine includes several different physical tools or control-tasks, one of its fundamental characteristics is that it includes a number of unique tools. There is a hierarchical relationship between the machine and its unique tools and every machine can be defined in part, by a list of its unique tools.

Figure 16:
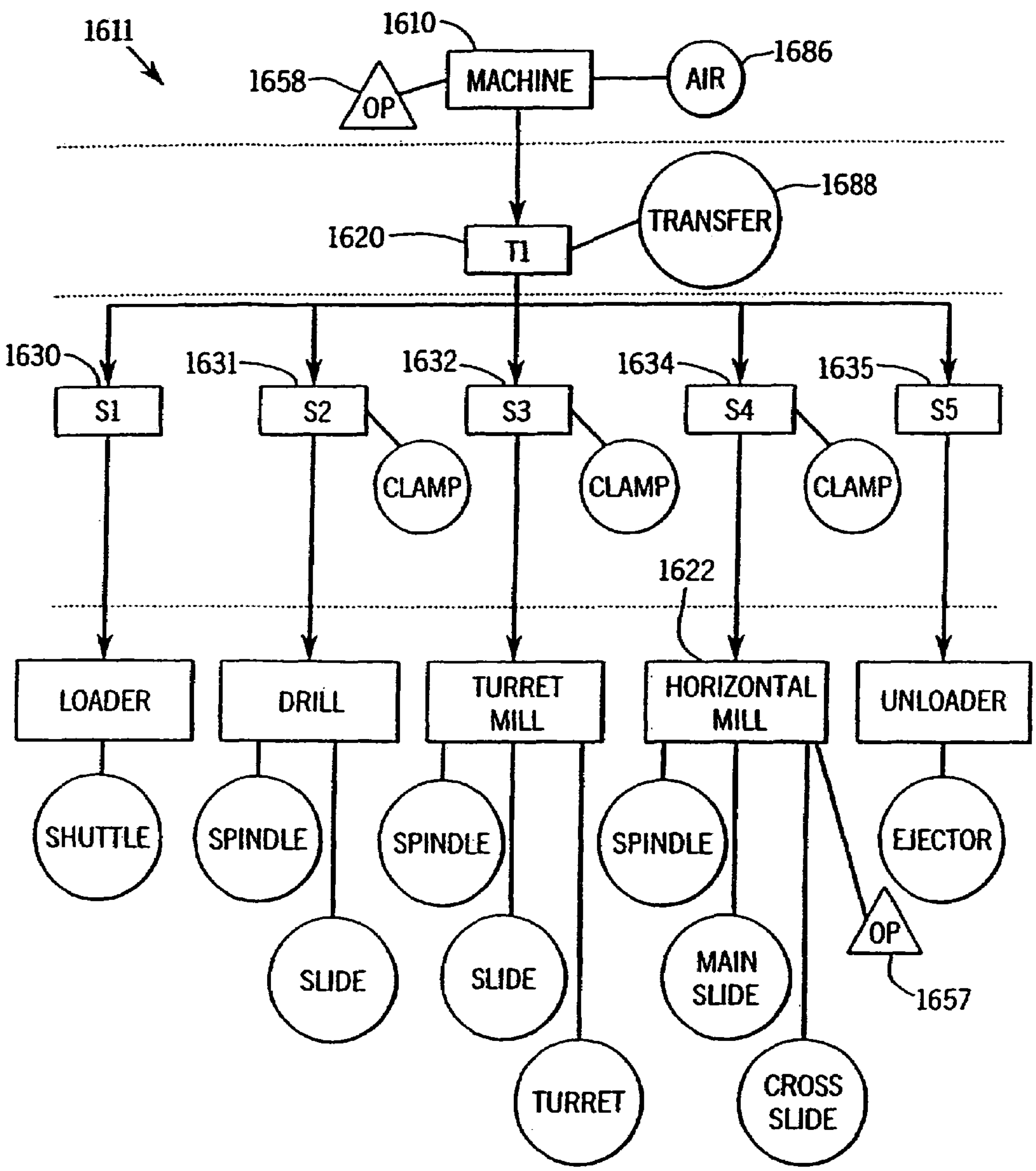
FIG. 16 illustrates the hierarchical relationship between a machine and an indexer in accordance with a preferred embodiment.

Referring to FIG. 16, a machine tree 1611 corresponds to machine 1610 is illustrated. In FIG. 16, direct connection between two elements signifies a parent/child relationship between two elements where the higher control-task in the tree is the parent and the lower control-task is the child. Where a parent/child relationship exists, the child control-task represents one fundamental characteristic of the parent control-task. In FIG. 16, the hierarchical relationship between the machine 1610 and the indexer 1620 is illustrated at the top portion of the machine tree 1611.

The most fundamental characteristic of indexer 1620 is that it includes five stations 1630-1635 and therefore, stations 1630-1635 can be hierarchically related to the indexer as illustrated. Each work-unit is hierarchically related to its associated station and one or more axes are hierarchically related to each work-unit.

In addition to the hierarchical relationship identified above, each machine tree 1611 component can also have a direct relationship to an axis. For example, all of the indexer 1620, stations and work-units in machine 1610 may require a pneumatic air source for operation. Where a machine-wide air requirement exists, the machine 1610, as opposed to one of its child components, should control an air valve to provide air to all machine components. Thus, in addition to its list of indexers, other fundamental characteristics of a machine as a whole are axes that are directly connected to the machine 1610. In FIG. 16, in addition to being directly connected to its indexer 1620, the machine 1610 is also connected to an air axis 1686 for opening an air valve.

Similarly, the indexer 1620 is connected to a transfer axis 1688 for controlling the transfer bar for all stations 1630-1635. Moreover, each of the stations 1631-1634 that includes a clamp is connected to a different clamp axis for controlling an associated clamp.

A third fundamental defining aspect of each tree component is whether or not the component requires a control panel. In the present example, the machine 1610 includes a main control panel 1658 for controlling the entire machine and therefore, a control panel 1658 is shown on the machine tree 1611 directly connected to the machine 1610. In addition, the horizontal mill 1622 includes a local control panel 1657 for controlling only the mill 1622. A control panel 1657 is shown directly attached to the horizontal mill in tree 1611.

Therefore, the entire industrial process shown can be viewed as a machine tree 1611 made up of the hierarchically-related components or control-tasks shown in FIG. 16. Each control-task can be entirely described by identifying its most fundamental characteristics, including control-tasks from the next hierarchical level, any directly-connected axis control-tasks and any directly-connected, control panel control-tasks. With this understanding of an industrial machine, template language can now be explained.

The template language guides a user to assemble from a set of programming units called modules a complete and correct machine tree 1611. Individual modules are identified with templates, which include truly reusable control logic so that, when a template-based machine tree is compiled, a complete control program for an industrial process is produced.

A template is a model program unit available for repeated use as a pattern for many modules based thereon. A template can be analogized to a data entry form wherein form identification can refer to either a blank instance of a master copy or a completed instance. In this description, the term "template" is used to mean the essence of a pattern as well as a completed instance of the pattern referred to also by the term "module".

The template language includes two types of language statements. A first statement type includes statements that are wholly independent of the underlying control language form. A second statement type includes underlying control language form itself, plus extensions to that form, making the form more flexible. Typically, the underlying language form will be completed in ladder logic. The second statement type is particularly useful where automated electronic editors are used to compile a template based machine tree, thus generating a control program in the underlying control language form. Each statement type will be explained separately.

Statements Independent of the Underlying Control Language Form

Referring again to FIG. 16, a typical set of templates used to provide a program for machine 1610 have a template type corresponding to each machine tree control-task type. For example, a template set for machine 1610 would include machine, indexer, station, workunit, axis and control panel templates. In addition, the set would include other more detailed templates to further define each of the aforementioned templates. A template is a model program unit available for repeated use as a pattern for many modules based thereon.

Figure 17:
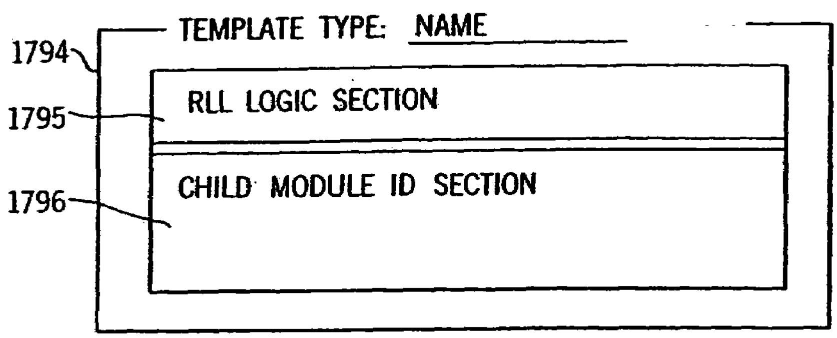
FIG. 17 illustrates a template in accordance with a preferred embodiment.

Referring to FIG. 17, a typical template includes a template type designation and may include a name field which must be filled each time a template is used so that the specific instance of the template can be differentiated from other modules, including other instances of the same template.

In addition, each template 1794 may include LL logic sections 1795 having one or more rungs of LL logic. The idea here is that for each specific template type 1794 used to represent a specific control-task type in a machine tree 1611, there will often be some logic, albeit in many cases minimal, that is always required for the specific control-task type. For example, for safety purposes, a master control panel will always include ON-OFF means for turning the machine on and off. Thus, every machine template will require ON-OFF LL logic and an LL logic section 1795 will provide the universally required logic.

Each template 1794 may also include child module specification sections 1796. The contents of the child module specification section 1796 represents one type of language statement that is wholly separate from the underlying control language form. In the child ID section 1796, the template provides an area where a user can define module specifications that designate other modules required to further define the designating module.

The relationship between a designating module and a designated module is a parent/child relationship wherein the designating module is the parent and the designated module is the child. For example, a machine module for machine tree 1611 would include a module specification designating an indexer module 1620. Similarly, in the present example, the machine module would include two separate module specifications to separately specify a "master control panel" module and an axis module named "air" which further detail the main control panel 1658 and the air axis 1686, respectively. The "master control panel", "air" and "T1" modules would all be child modules of the parent machine module.

Continuing, the indexer 1620 module would include a child module specification designating five separate station modules, one for each of the five stations, 1630-1635, as well as a module specification designating an axis module named "transfer" to control the transfer bar 1620.

The fourth station module 1634 would include a first module specification to a workunit module named "horizontal mill" and a second module specification to specify an axis module named "clamp". The clamp module would detail logic for controlling clamp 1644 by either including complete LL logic or designating other modules that would complete LL logic for clamp control.

The work unit module named "horizontal mill" would specify axis modules named "spindle", "main slide" and "cross slide" as well as a control panel module to define control panel 1657. Similarly, each of the other station and work-unit modules would specify other modules until every control-task in the entire industrial process has been completely defined and reflected in a template-based tree, mirroring machine tree 1611.

Figure 18:
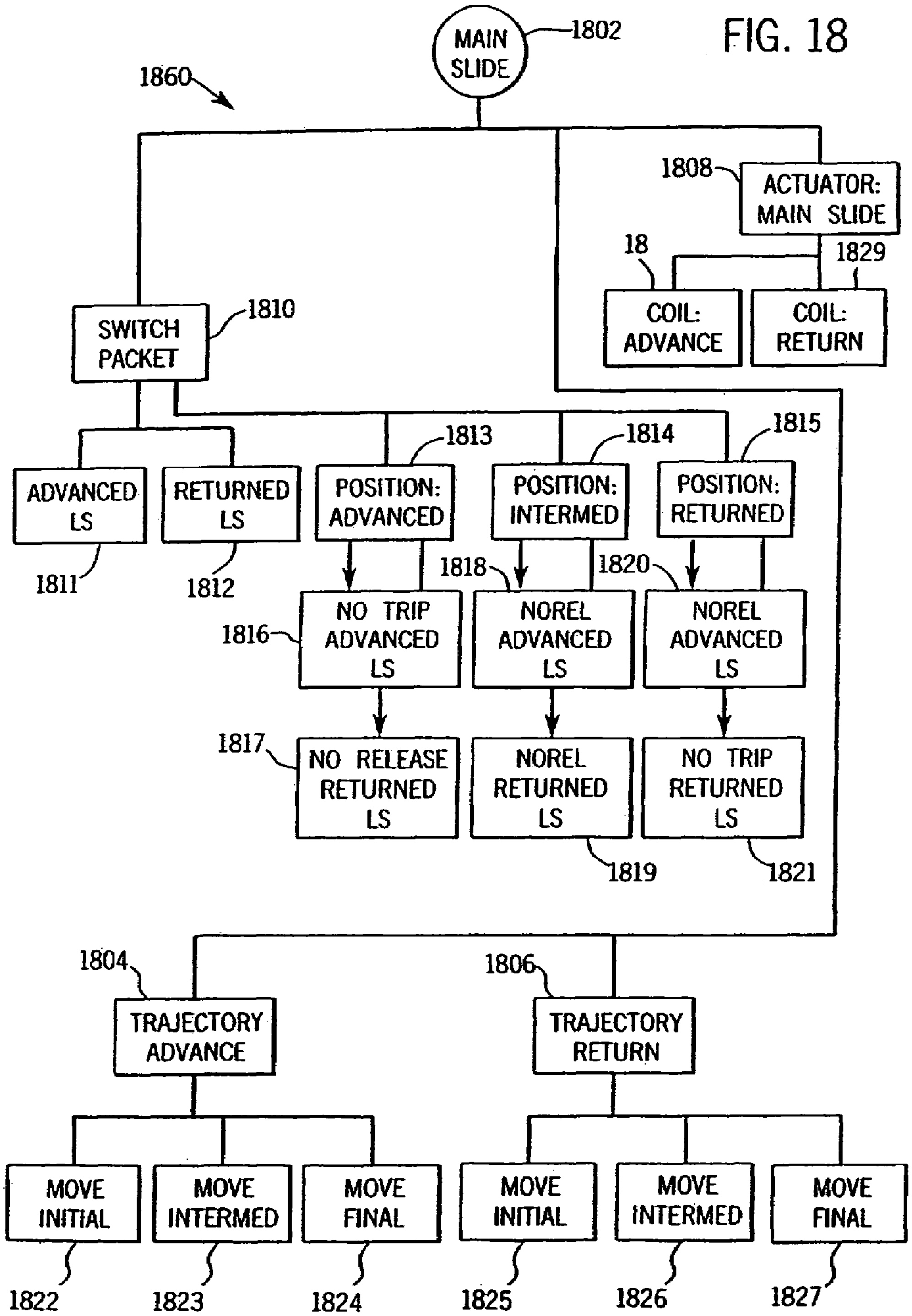
FIG. 18 illustrates a machine tree in accordance with a preferred embodiment.

Referring to FIG. 1800, the machine tree 1811 expands even further, each axis comprising a number of different control-tasks and corresponding modules. In FIG. 1800, only the main slide axis 1802 associated with the horizontal mill 1822 is shown. However, it should be understood that tree branches, like branch 1800 in FIG. 18, must be provided for each axis and each control panel. While the control panel branches will include modules based on templates that are different than the templates required to specify an axis, the process of populating modules with required lists to define parent modules is the same. FIG. 18 will be explained in detail below.

Moving down the machine tree, modules associated with lower tree control-tasks generally include an increasingly larger relative section of control logic. At the extreme, the final modules at the distal lower ends of the tree consist entirely of control logic and have no child specification sections. Surprisingly, only a few dozen templates are required to provide modules that completely describe an industrial process. When compiled, so that LL logic sections in child modules are plugged into their designating parent modules, a complete LL logic program can be provided.

The preferred template language includes different kinds of module specifications that can be used to accommodate different circumstances. For example, one type of module specification is a module "list" which allows zero or more component modules of a specific type (i.e. associated with a specific template). Referring again to FIG. 1600, an indexer module may include a module list called "station" which includes specifications to five modules, one for each of the five machine stations 1630-1635. In this way, a single module specification can reference five station modules. Each station module in the list must be assigned a unique job specific name to ensure that it can be different from other modules designated in a common list specification. In the example here, the stations and, hence station modules, are referred to as 1630-1635.

Yet another kind of module specification is an "optional" module specification which results in either no instances or exactly one instance of the designated type. For example, a preferred indexer template includes an optional module specification for an indexer control panel. While it is not necessary to have an indexer control panel, where a machine line is unusually long, it is often advantageous to include an indexer control panel somewhere along the line to allow local indexer control. The optional module specification gives a programmer the option, based on job specific requirements (i.e. the length of a machine line), to provide LL logic for an indexer control panel when one is desired. In the present example, the indexer does not include a control panel and, therefore, no module would be created.

Another module specification kind is a "renameable" module specification which results in a single named component module of a designated type, but will also allow a job-specific name to override the default name. Another kind of module specification is a "fixed" specification. Here, the template designated by the specification does not result in a child module. When compiled, fixed templates simply expand into the designating modules. Fixed specifications are not named.

Another kind of module specification is a "named" module specification which results in a single, named component module of the type identified in the specification. For example, for safety purposes, all machines require a master control panel. Thus, a preferred machine template includes a named module specification called "master control panel" which identifies a single instance of a master control panel template.

One final kind of module specification is a "choice" specification which makes a selection from a list of mutually exclusive module types based on job specific information. For example, while a control panel requires some type of interactive device for a user to turn a machine on or off, a user may prefer either a push button or a selector switch. To this end, in a control panel template, a choice specification is provided which includes two fixed module specifications, one for a push button and another for a selector switch. Like a fixed module specification, the template associated with a chosen type is simply expanded when the machine tree is compiled (i.e. no module results from a choice specification).

A second type of language statement wholly separate from the standard LL rung form includes data definitions. Data definitions are common in programming language and should be familiar to a person of ordinary skill in the art. Therefore, data definitions will not be explained here in detail. Suffice it to say however, that in template language, data definitions are required to declare and reserve space for all PLC data table types such as inputs, outputs, timers, counters, etc., and allows the association of attributes with each declaration.

Extensions to the Underlying Control Language Form (LL)

While some logic is always the same for a specific machine tree control-task type, other logic is job-specific and distinct to an associated given module and would be extremely difficult to furnish in prewritten LL or other template sections. For example, one typical prerequisite for turning on a machine 1610 to begin an industrial process is that all local control panels (i.e. control panels other than the master control panel) be in remote mode often called "automatic". Remote mode means that a control panel forfeits control over the local machine section to an operator panel located higher up in the machine tree, for instance the master control panel. Local mode (e.g. "manual"), disables the parent operator panel and permits only local control of a section of the machine. Thus, one LL logic rung called "all child nodes remote" in a main control panel module should include a series of contacts, one contact for each local control panel. Each local control panel module would include a coil corresponding to its contact in the "all child nodes remote" rung. When the local control panel is in remote mode, the local panel module coil would be energized, thus closing the corresponding contact in the "all child nodes remote" rung. Thus, a coil at the end of the "all child nodes remote" rung would indicate when all local panels are in automatic or remote mode allowing the machine 1610 to be turned on.

Prior to designing a machine there is no way of knowing how many local control panels will be required. One machine may not require any local control panels while another machine may require ten or more local control panels. The number of local control panels required for a machine is job-specific. This means that prior to designing a machine 1610, there is no way to determine the number of contacts required in the "all child nodes remote" rung in a main control panel module. Unfortunately, standard LL rung forms do not allow for variable numbers of contacts and, therefore, cannot adjust to job-specific requirements. While a programmer could alter the form of an "all child nodes remote" rung while manually programming using templates, when the programmer is using automated editors there is presently no easy way to change rung form to accommodate job-specific parameters.

To overcome this limitation, the template language includes both macro instructions and a symbolic expression language that are extensions to the standard LL rung form itself. One macro instruction is an "AND list" instruction which provides a mechanism by which variable numbers of series contacts can be provided in an LL rung. The number of contacts can be tied to job specific requirements. For example, where four local control panels are required in an "all child nodes remote" rung, the "AND list" macro would provide four contacts, one for each local panel. In the alternative, where ten local panels are provided the "AND list" macro would provide ten contacts, one for each local panel.

The symbolic expression language is used with the macro instructions to designate macro operands. The symbolic expressions include single characters that may be concatenated with template-authored symbolic names (defined using Data Definition statements) to form reusable operand specifiers. These symbolic expressions may be used by placing them above LL instructions in an LL rung. A preferred set of symbols consists of three path specifiers and two separators.

Path specifiers indicate where relevant operand definitions can be found. Separators allow concatenation of more path information such as the name of a specific child module, data item, or attribute. A first path specifier is the symbol "$". Specifier "$" indicates the name of the module that the specifier appears in. For example, if specifier "$" appeared in the master control panel module, the specifier would provide a path to the master control panel module. In addition, the specifier would also provide partial paths to all main control panel child modules.

A second path specifier is symbol "#". Symbol "#" indicates the instance of a particular member of a list. A third path specifier is symbol "^" which may be followed by a template type name. Symbol "^" represents the first ancestor (i.e. parent, grandparent . . . ) module whose type matches the type designated after the symbol.

A first separator is symbol ".". Symbol "." indicates that the text following is the symbolic name of a child module or data definition within the program unit designated by the path specifier preceding the separator. A second separator is symbol " indicating that the text following it is the symbolic name of an attribute associated with the entity designated by the path specifier preceding the separator. For the purposes of this explanation, attributes will include module list names.

Figure 19:
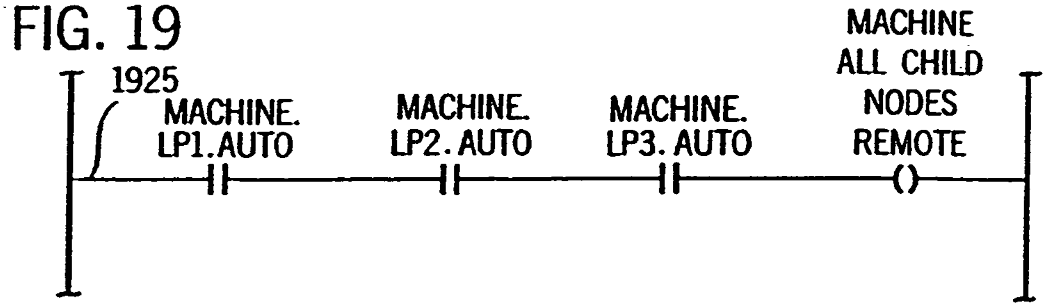
FIG. 19 illustrates a master control panel in accordance with a preferred embodiment.

Referring to FIG. 19, a standard "all child nodes remote" LL rung 1925 that might appear in master control panel logic is illustrated. The rung 1925 includes three contacts MACHINE.LP1.AUTO, MACHIINE.LP2.AUTO and MACHINE.LP3.AUTO and a single coil named MACHINE.ALL CHILD NODES REMOTE. Each of the three contacts "MACHINE.LP1.AUTO", MACHINE.LP2, AUTO", and "MACHINE.LP3.AUTO" corresponds to a separate local control panel (not shown).

Figure 20:
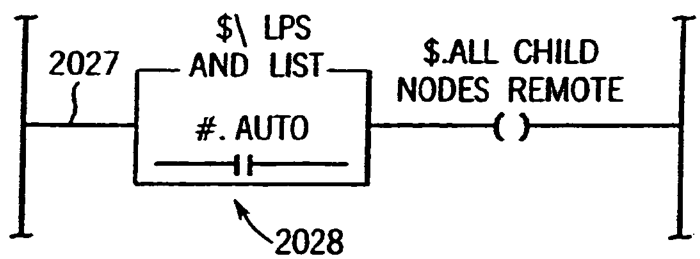
FIG. 20 illustrates the symbolic expression language in accordance with a preferred embodiment.

Referring also to FIG. 20, the symbolic expression language described above can be combined with an "AND list" macro to provide an LL rung 2027 that can expand into rung 1925 having three contacts when compiled. An AND list macro 2028 and a single "all child nodes remote" coil make up rung 2027. The "AND list" macro 2028 includes symbol "$" which specifies a path to the present module. The " indicates that the symbolic name "LPS" that follows is an attribute associated with the present module. In this case "LPS" is a module list associated with the main control panel module. Thus, the expression "$" represents a module list in the main control panel module. The module list provides operands to the "AND list" macro. The "AND list" macro 2028 includes the condition "Auto" with the path specifier "#". Specifier "#" indicates that the "Auto" condition should be concatenated with the operands above the "AND list" command.

When compiled by an automated compiler (or by hand), the "AND list" macro 2028 expands into series contacts, one contact for each reference in the module list "LPS." For example, assuming the module list "LPS" included a job-specific membership of three instances name "LP1," "LP2" and "LP3," rung 2027 would expand into rung 1925. Similarly, if the module list "LPS" included a job-specific membership of ten instances, rung 2027 would expand into a rung having ten series contacts, each contact named for a different one of the ten instances in the list. Thus, using the symbolic expression language in conjunction with the "AND list" macro, the number of series contacts can vary, depending upon job-specific parameters.

Figure 21:
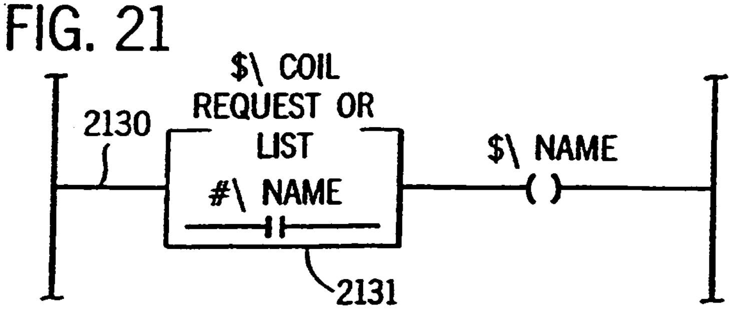
FIG. 21 illustrates an exemplary rung in accordance with a preferred embodiment.

A second macro instruction is an "OR list" instruction. The "OR list", like the "AND list", when combined with the symbolic expression language, provides for variable rung forms, depending upon job-specific parameters. However, instead of providing series contacts, the "OR list" macro provides variable numbers of parallel contacts. An exemplary rung 2130 including an OR list macro 2131 is illustrated in FIG. 21. "$Requests" specifies a module list named "Coil Requests" having a job-specific membership. Each instance in the "Coil Requests" list is to be concatenated with a coil request name and all instances are to be placed in parallel in rung 2130 when the rung 2130 is compiled. Therefore, if module list "Coil Requests" includes three job-specific instances, three parallel contacts (one contact named for each instance) will replace the "OR list" macro 2131 when compiled. If the module list "Coil Requests" includes ten job-specific instances, the "OR list" macro 2131 would be replaced by ten, uniquely named parallel contacts.

The "OR" and "AND list" macros are extremely powerful and add a level of flexibility to programming in the template language that cannot be provided using the standard LL rung form. Using the macros in conjunction with the symbolic expression language facilitates templates that refer to variable job-specific parameters and to data items defined in other modules by associated templates even before the job specific parameters and data items are defined.

In addition to the macros and symbolic expression language, there is one other type of extension to the standard LL rung form itself called pseudoinstructions. Pseudoinstructions take three forms: XPC, XPO and OTX which correspond to standard XIC (examine if closed), XIO (examine if open) and OTE (output enable) LL instructions. XPC and XPO stand for examine predicate closed and examine predicate open, respectively. OTX stands for output expansion.

One of the problems with any LL programming shortcut based on a modular library of LL logic components is that logic must be provided to accommodate all possible requirements. Therefore, in many cases logic that is not required in a specific application will be provided to cover general requirements. Moreover, sometimes logic required in general applications are not permitted in specific applications.

For example, typically there is less danger associated with movements in a cycle's second half than with movements in the first half and therefore, a reduced set of conditions may be provided for second half-cycle movements than for first half-cycle movements. The first half-cycle includes movements that shift the mill spindle toward or into a workpiece. The second half-cycle includes movements that shift the spindle out of and away from the workpiece. Prior to any axis movement there is typically a set of conditions that must be met to ensure a safe move. Therefore, a reduced set of conditions can apply to second half-cycle movements, the reduced set reflecting the reduced possibility of danger.

The preferred template set includes only one template type corresponding to axis movement. Therefore, the axis movement template must include logic for both the full set of conditions used in the case of a first half-cycle movement and the reduced set of conditions used in the case of a second half-cycle movement. Referring to FIG. 22, a required full set of conditions will show up in an LL logic rung 2234 as a full set 2233 of series-connected contacts C1-C5. When all of the conditions are met, all of the contacts C1-C5 are closed and an associated output coil OUT is energized, indicating that an associated axis movement can begin.

The reduced set of conditions corresponding to the second half-cycle shows up in LL logic as a branch 2235 parallel to the full set 2233 of contacts, the branch including a reduced set of contacts C6, C7; one contact for each condition in the reduced condition set. Thus, the axis movement template provides LL logic 2233, 2235 for movements in both the first and second half-cycles. While both the full and reduced logic sets may be applicable to movement in the second half-cycle, they are not both applicable to movements in the first half-cycle. In other words, if an axis movement module corresponds to a first half-cycle movement, branch 2235 including the reduced logic set is not permitted, but branch 2235 is required for a second half-cycle movement.

XPC and XPO pseudoinstructions are used to examine compile time constants representing configuration options such as the ones shown in FIG. 22. The effect of the evaluation will be either a short or an open circuit in the generated program, depending on evaluation result. For instance, the result of an XPC on a true condition is a short circuit while the result of an XPO on a true condition is an open circuit. In FIG. 22, an XPC contact 2236 identifying a second half-function is provided in series with the logic of branch 2235. The XPC contact 2236 shorts when rung 2234 is associated with a second half-cycle movement and is an open circuit when rung 2234 is associated with a first half-cycle movement. Therefore, upon compiling, the XPC contact 2236 leaves branch 2235 in rung 2234 when a corresponding movement is in a second half-cycle and removes branch 2235 when a corresponding movement is in the first half-cycle.

A side effect of the compile time evaluation of pseudoinstructions can be further optimization of the generated logic. For instance, an open circuit in series with other input instructions renders the other instructions unnecessary. A branch that is shorted renders parallel branches unnecessary. With the XPO and XPC instructions, unnecessary instructions can be removed from their associated circuits without changing the meaning of the circuit. Upon compilation, optimization can ripple recursively through a program, potentially causing entire rungs, including coils, to be discarded.

Template language allows expression and encapsulation of that, and only that, which is universally true of a particular machine component or operating characteristic. A side effect of this is that the granularity of some of the templates can be very fine. This means that the topology of some of the circuits after expansion can be very inefficient. For example, referring to FIG. 22, the redundant branch 2233 including contacts C1-C5 would be produced for second half functions. To rectify this, the OTX pseudoinstruction enables the template author to instruct the compiler to optimize certain circuits. When the compiler encounters an XIC or XIO instruction whose contact is an OTX coil, it will replace the instruction with an in-line expansion of the actual contents of the rung associated with the OTX coil.

For example, referring to FIG. 22-1, a first LL rung 2220 includes contacts A and B and an OTX coil C. A second LL rung 2222 includes contacts C and D and other "stuff" where contact C corresponds to the OTX coil C. When compiled, coils A and B corresponding to OTX coil C are expanded into the coil in branch 2222 yielding branch 2224 as shown in FIG. 22-2. This provides the template author with a large degree of control over the resulting topology of the generated circuits.

Figure 23:
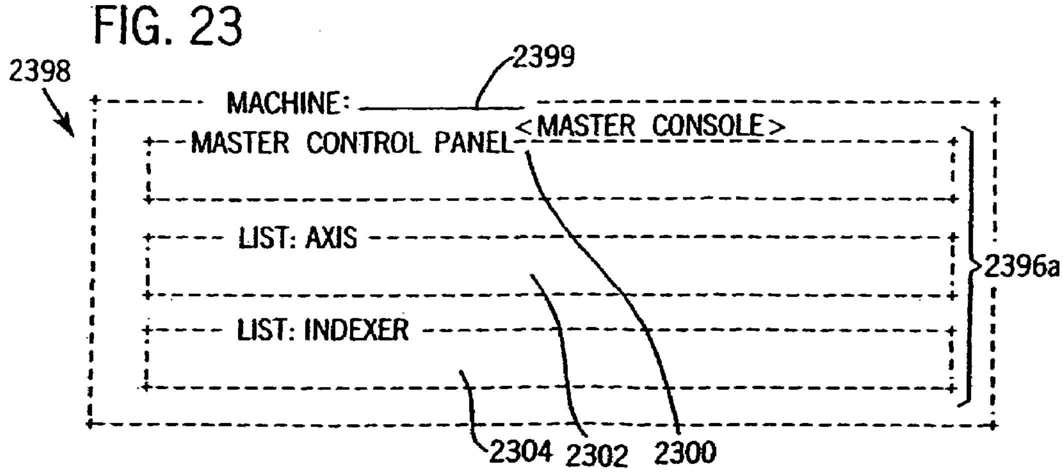
FIGS. 23-35 illustrate an exemplary set of templates in accordance with a preferred embodiment.

Referring now to FIGS. 23-35 an exemplary set of templates is provided which can be used to better understand template language generally. The preferred template group is a subset of a template set specifically designed for the metal-removal industry. Referring to FIG. 23, a machine template 2398 includes the template type designation "machine" and a blank name field 2399 that has to be filled in to identify a specific machine module. The machine template 2398 itself does not directly include LL logic and hence, has no LL logic section. Instead, the machine template has a child module specification section 2396 a including several module specifications including a named module specification called "master control panel" 2300 and both axis- and indexer-list module specifications 2302, 2304, respectively. Because each machine must include at least one control panel for safety purposes, every machine template (and hence every machine module) must include a master control panel specification 2300.

Figure 24:
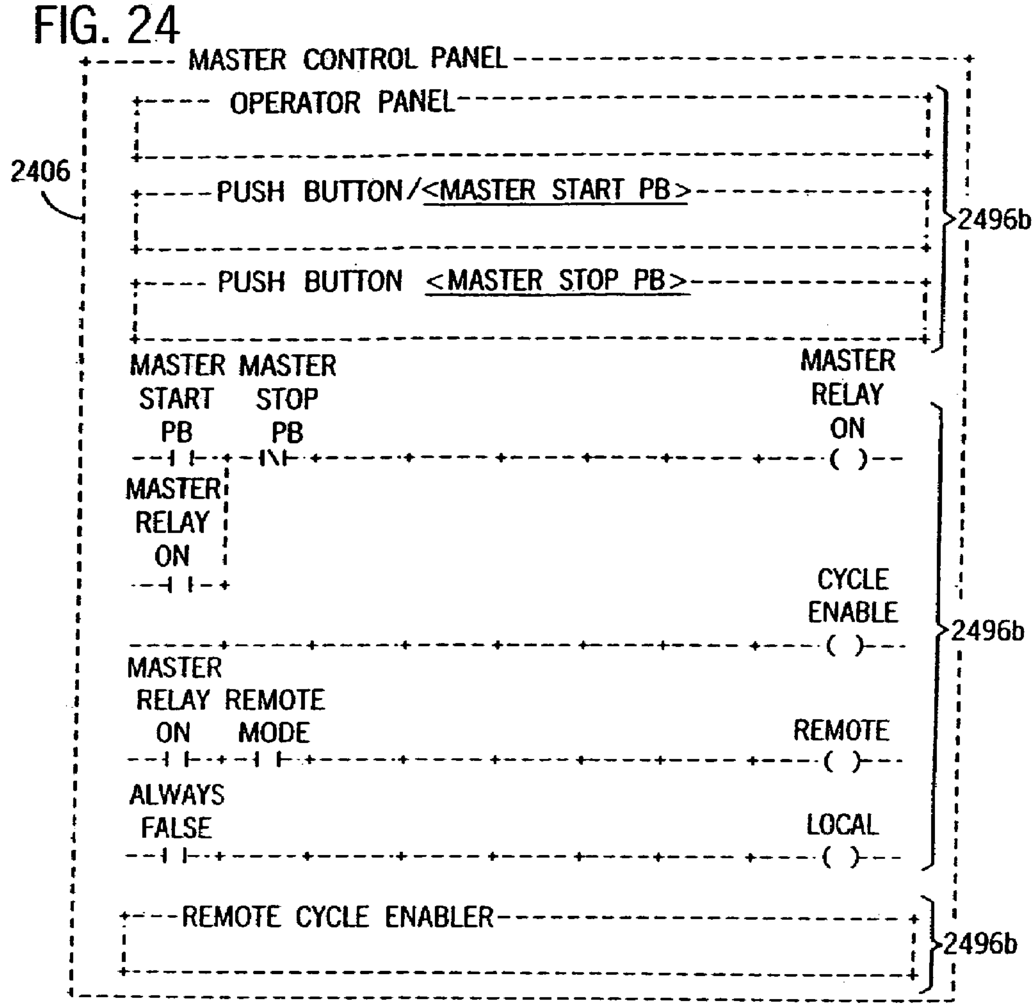

Referring to FIG. 24, a master control panel template 2406 includes an LL logic section 2494*b* required for start and stop push buttons. The logic in section 2494*b* is universally required for all master control panels. In addition, the master control panel template 2406 includes a child module specification section 2496*b* that references other modules using module specifications. The modules designated in the child module specification section 2496*b* may be required to completely provide LL logic to control the master control panel 2458. Whether or not modules must be designated in the child ID section 2496*b* depends on job specific requirements. Note that named module specification "remote cycle enabler" and fixed module specification "operator panel" are required attributes of any master control panel module.

Figure 25:
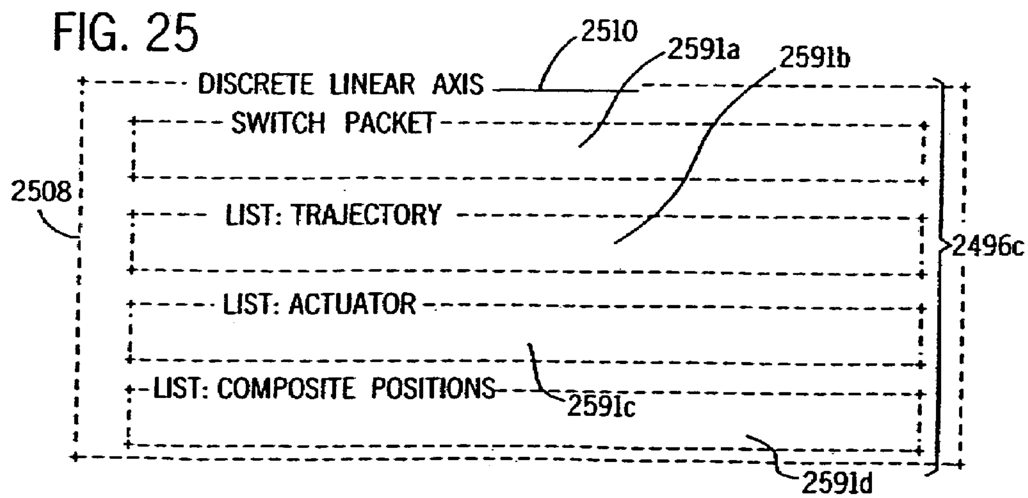

Referring again to FIG. 23, the module list named "axis" 2302 includes a list of all machine-wide axes. In the present example, the "air" axis is the only machine-wide axis and therefore, the axis-module list specification would include only a single specification called "air". Referring to FIG. 25, an axis template 2508 includes an axis template designation, a name field 2510, and a child module specification section 2596*c* having three separate module specifications for switch packet, trajectory and actuator, all of which have to be detailed to completely define an axis.

Figure 26:
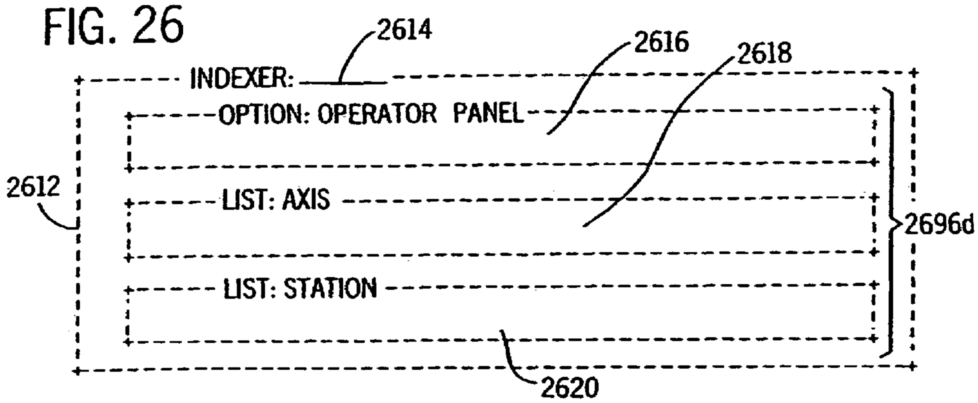

Referring again to FIG. 23, the indexer module list specification 2304 includes a list of indexer modules, one for each machine indexer. In the present example, there is only a single indexer T1 and, therefore, only one indexer entry, identifying indexer module T1, would appear in the indexer list specification. Referring to FIG. 26, an indexer module includes an indexer template designation, name field 2614, and a child module specification section 2696*d*. The module ID section 2696*d* includes an optional module specification 2616 for a control panel and two module list specifications, one for axis 2618 and another for station 2620. In the present example, because there is no indexer control panel, the optional control panel would not be designated. Because we have one indexer axis (i.e. "transfer"), there would be one specification in the axis module list specification 2618 named "transfer". In addition, because there are five stations, there would be five specifications in the station module list specification 2620. Each station designated in module list 2620 would identify a different station module corresponding to a different one of the five stations S1S5.

Figure 27:
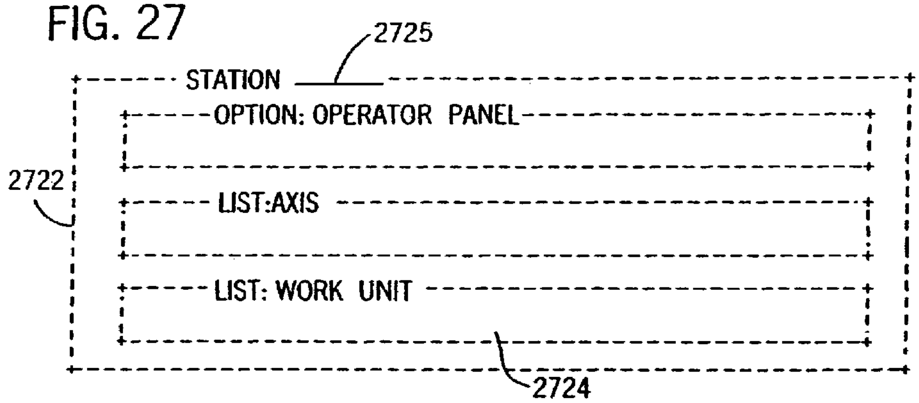

Referring now to FIG. 27, the station template 2722 is nearly identical to the indexer template 2712 of FIG. 27, except that, instead of having a station module list specification, the station template 2722 includes a work-unit module list specification 2724. In the present example, there would be five separate station modules like the one in FIG. 27, each module identified by a different name in the name field 2725 and corresponding to a like-named station in the station module list 2720 of the indexer module named "T1".

Figure 28:
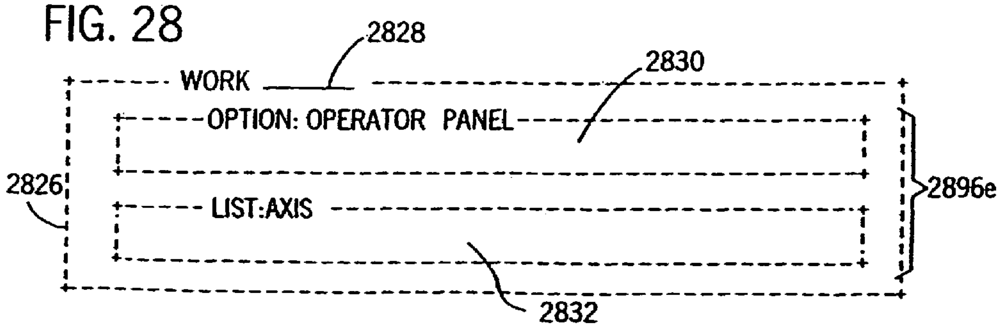

Referring now to FIG. 28, a work-unit template 2826 includes a work-unit designation, a name field 2828, and a child module specification section 2896*e* having only two module specifications, an optional operator panel module specification 2830, and an axis module list specification 2832 identifying all axes associated with a work-unit. In the present example, because the horizontal mill 2822 includes three axes (spindle, main slide, and cross slide), three separate specifications would be included in the axis module list specification 2832 identifying three separate and distinctly named axis templates. In addition, because the horizontal mill 2822 includes a local control panel 2857, the optional operator panel module specification would be designated.

The templates in FIGS. 37-43, represent all of the templates required to completely specify an axis. To specify an axis, it is necessary to define all positions associated with an axis and switches that indicate positions. The switches act as controller inputs for the axis. In addition, it is necessary to define possible axis-movement requests, herein referred to as trajectories. Moreover, it is also necessary to define actuators used to effect trajectories and how a controller will communicate with the actuators (i.e. coils and coil requests). Coils and coil requests act as controller outputs to the actuators.

Referring also to FIG. 18, a template-based tree branch 1800 for one axis, the main slide axis of the horizontal mill, is illustrated showing the hierarchical relationship between modules required to define the main slide axis. Referring also to FIG. 25, to accommodate all the information required to specify an axis, the axis template 2508 includes a child ID section 2596*c* having a named "switch package" module specification 2591*a* and sections 2591*b* and 2591*c* for trajectory and actuator module list specifications, respectively. Therefore, in module list specification 2591*b*, the trajectory list would only include two specifications, one for "advance" and one for "return". In FIG. 18, the "advance" and "return" trajectories are shown as child modules 1804 and 1806.

Figure 37:
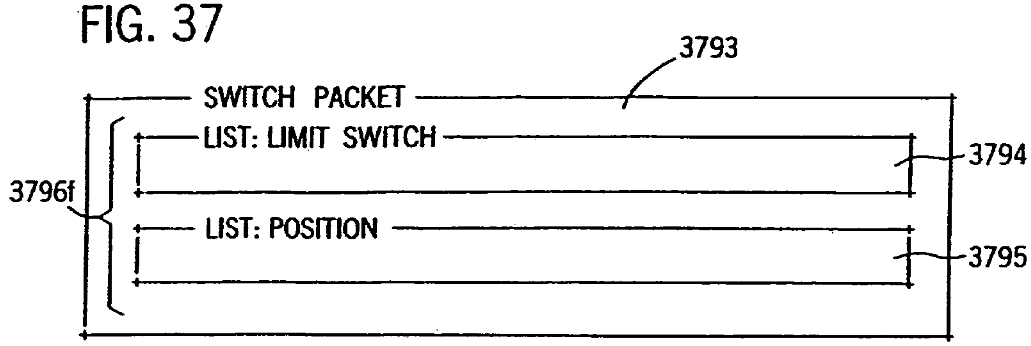
FIGS. 37-43, represent all of the templates required to completely specify an axis in accordance with a preferred embodiment.

Referring still to FIG. 25, the main slide subassembly includes only a single motor, which is the main slide actuator. Therefore, only one actuator "motor" will be designated in the actuator module list specification 2591*c*. In FIG. 18, the main slide actuator is shown as child module 1808. Switch package module 1810 is also a child module of main slide axis module 1802. Referring also to FIG. 37, the switch package template 3793 includes child ID section 3796*f* having two module list specifications 3794 and 3795. A "limit switch" module list specification 3794 is used to specify axis switches. The main slide axis includes advanced switch 3739 and returned switch. Thus, switch module list specification 3794 would specify two switches as switch package child modules named "advanced LS" and "returned LS."

Figure 38:
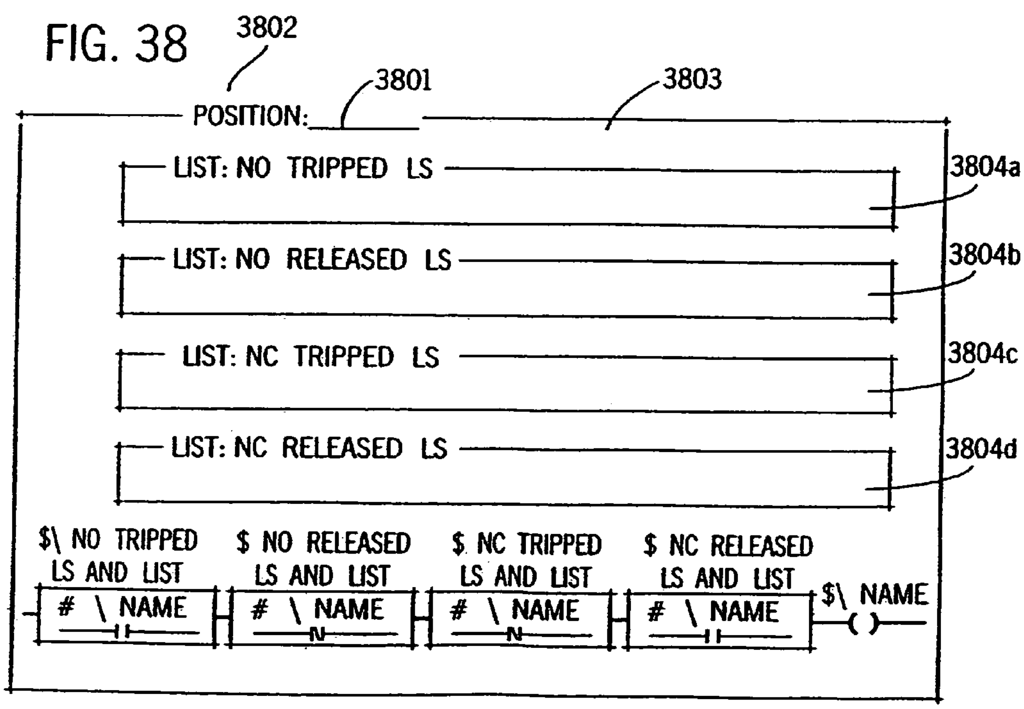

The two switches define three main slide positions named "advanced," "intermediate" and "returned." Therefore, position module list specification 3795 would specify three positions as switch package child modules named "advanced," "intermediate," and "returned." Referring to FIGS. 37 and 38, a position template 3803 is used to provide a position module for each position designated in position list section 3795. Each position template 3802 includes a name field 3801 for identifying the specific position modules (i.e. in the present case "advanced", "intermediate" and "returned"). In addition, each position template 3803 includes four separate module list specifications 3804*a*, 3804*b*, 3804*c* and 3804*d* corresponding to two possible types of limit switches and two possible states of each type of switch (i.e., normally open (NO) tripped, NO released, normally closed (NC) tripped, and NC released).

Each of the lists 3804*a*, 3804*b*, 3804*c* and 3804*d* is populated with switches from switch module list specification 3894 that are in a corresponding state (i.e., tripped or released). For example, when a main slide subassembly is in the advanced position, the advanced switch is tripped and the returned switch is released. Assuming both switches are wired normally open (NO), the advanced switch would be listed in the NO tripped LS module list specification 3804*a* while the returned switch would be listed in the NO released LS module list specification 3804*b* (in this case no switches would be listed in module list specifications 3804*c* and 3804*d*). Referring again to FIG. 18, the NO tripped advanced switch and NO released returned switch are shown as child modules 1816 and 1817 for the position module 1813 named "advanced."

Similarly, position templates for the "intermediate" and "returned" positions would be populated with appropriate switches. In FIG. 18 intermediate position module 1814 has two child modules, "NO released advanced LS" 1818 and "NO released returned LS" 1819 while returned position module 1815 has child modules "NO released advanced LS" 1820 and "NO tripped returned LS" 1821.

Figure 39:
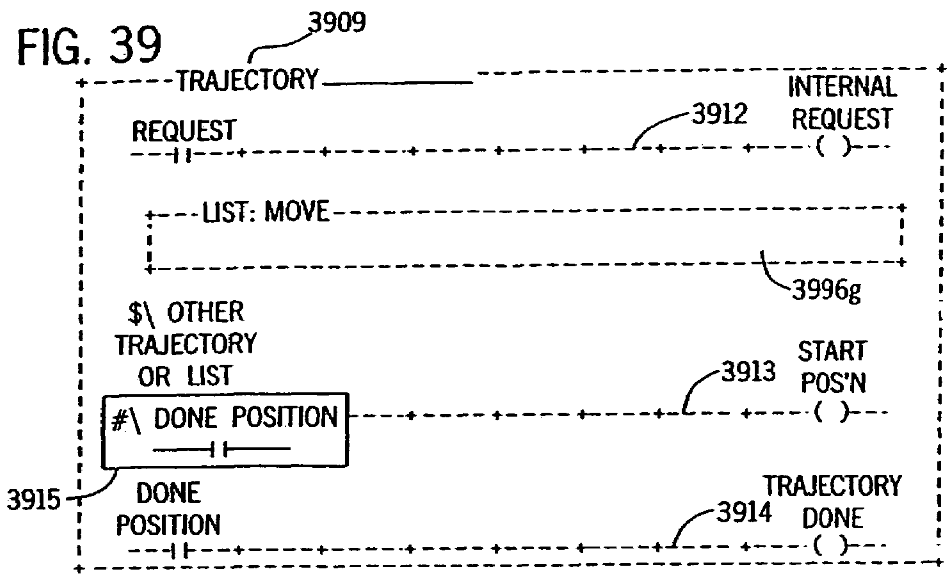

Referring to FIGS. 25 and 39, a trajectory template would have to be designated and populated for each axis trajectory (i.e., each movement request). For the horizontal mill main slide, there are two trajectories, "advance" and "return". Therefore, there would be two trajectory modules, one named "advance" and a second named "return" which are shown as child modules 1804 and 1806, respectively, in FIG. 18.

Each trajectory can be divided into various moves. A simple single speed linear trajectory includes three moves. An "initial" move begins trajectory motion followed by an "intermediate" move between two positions, the trajectory ending with a "final" move that stops the motion. Thus, referring still to FIG. 39, the trajectory template 3909 includes a child module specification section 3996*g* for a move module list specification. Referring also to FIG. 18, the "advance" trajectory module 1804 includes "initial" 1822, "intermediate" 1823 and "final" 1824 move child modules. The "return" trajectory 1806 includes similar child modules 1825, 1826, 1827.

Figure 40:
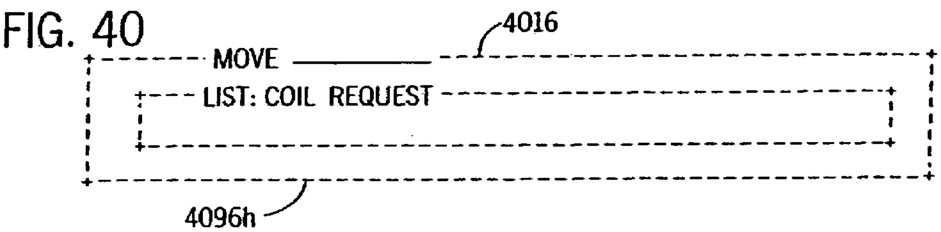
Figure 41:
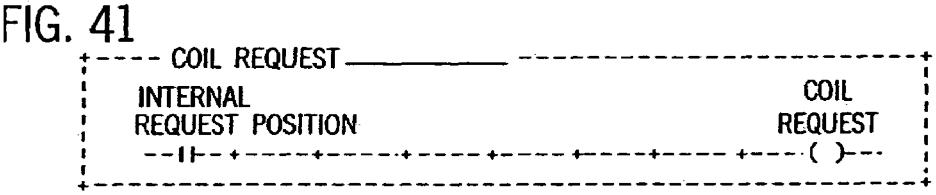

Referring to FIG. 40, a move module based on move template 4016 must be provided for each move in child module specification section 4096*h*. Each move template 4016 includes a child module specification section 4096*h* for a coil request module list specification. A coil request is a request to a specific coil to actuate an actuator (e.g. motor) when a specific position associated with a move has been reached. For example, on a two speed motor, one coil may drive the motor at one speed to facilitate one move. A second sequential move, however, may require excitement of two coils to activate two motors to achieve a greater speed once an intermediate position has been reached. Thus, a single move may require two or more different coil requests. A coil request module based on the coil request template shown in FIG. 41 must be provided for each coil request designated in the child module specification section 4096*h* of a move module.

Figure 42:
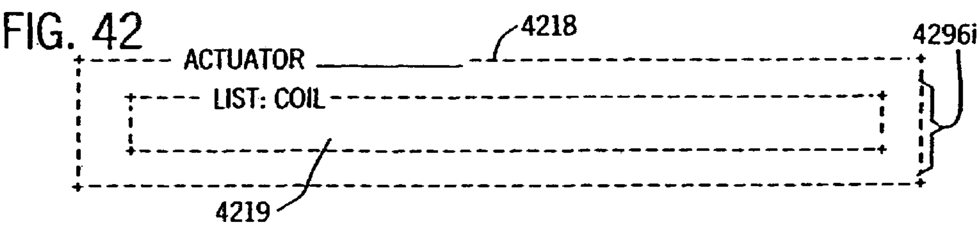
Figure 43:
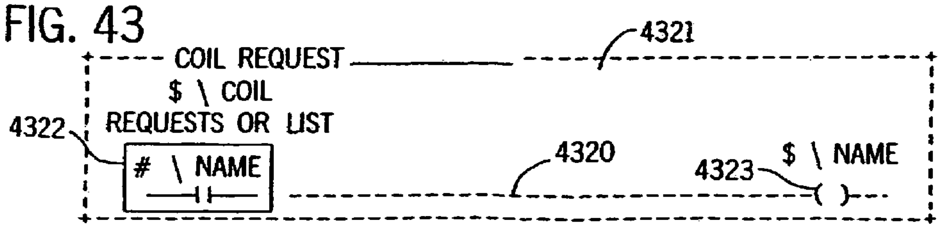

Referring to FIGS. 25 and 42, for each actuator designated in actuator module list specification 2591*c,* an actuator module based on actuator template 4218 must be provided. Each actuator module must be named to distinguish specific modules. The actuator template 4218 includes a child module specification section 4296*i* for designating a coil module list specification 4219. A coil is an output to drive a motor or the like. Referring also to FIG. 18, for the horizontal mill main slide there are only two coils, a "work" coil and a "home" coil shown as child modules 1828 and 1829. Referring to FIG. 43, a coil module based on coil template 1821 must be provided for each coil module designated in a specification 1819.

Once all the trajectories, actuator, limit switches, positions, moves, coil requests, and coils have been identified and associated module list specifications have been populated and required modules have been provided, the tree branch and corresponding LL logic required to completely control the axis has been designated. Modules based on all of the templates illustrated in FIGS. 37- 43 are required to define each axis.

C. Function Contingencies

Using a complete template set it should be fairly easy for one skilled in the art to construct a complete template-based machine tree using the template set. However, at least one template-based programming aspect is not entirely intuitive based upon a perusal of the complete template set. This complex template programming aspect is how the function template 4936 in FIGS. 49A and 49B which controls function performance is to be used.

Function performance must be limited by the instantaneous characteristics of other functions in the same cycle. These instantaneous characteristics can be gleaned from a bar chart. For the purposes of referring to various functions in this explanation, where one function is observed from the perspective of another function, the function observed will be referred to as an observed function and the other function will be referred to as the observing function.

Four separate relationships exist between any two of the four functions, (or, more precisely, between the action of the observing function and the done condition of the observed function). A first relationship is a "stable/unstable" relationship. Stable simply means that an observed function does not start or stop during an observing function. A second relationship is a "cancel by other/cancel by me" relationship. Where an observed function is unstable from the perspective of an observing function, the state of the observed function is changed either by the observing function or by some other condition. When the observing function changes the observed function state, the observed function is said to be canceled by the observing function. From the perspective of the observing function, the second function is categorized as "canceled by me". When some condition other than the observing function changes the observed function state, from the observing function perspective, the observed function is "canceled by other".

A third relationship is a "my half-cycle/other half" relationship. "My half-cycle" means that an observed function starts before an observing function in the observing function's half of a cycle. "Other half" means that the observed function is either in the opposite half-cycle as the observing function or, if both observing and observed functions are in the same half-cycle, the observed function starts after the observing function.

The fourth relationship is a "position/latch" relationship. This relationship deals with the nature of the observed function itself. A function can have one of three different natures, position, latch or a combination of both. Functions of the position nature will end when a specific axis position is reached.

Referring now to FIG. 50, an attributes table 5031 is illustrated that includes an attributes column 5032, twelve "bucket" columns A-L, and a list of the possible function attributes described above. A user can employ this table 431 to categorize, from the perspective of an observing function, all other observed functions in a cycle into one of the twelve buckets A-L. For example when function B1 is the observing function, observed function B2 is a stable, other half, position function which places function B2 in bucket J. Similarly, with function B1 observing, observed functions B3 and B4 would be placed in bucket J.

With function B2 observing, observed function B1 is a stable, my half of cycle, position function which places function B1 in bucket I. With function B2 observing, both observed functions B3 and B4 go in bucket J. With function B3 observing, observed functions B1 and B2 are stable, other half, position functions placed in bucket J while observed function B4 is an unstable, canceled by me, other half, position function placed in bucket F. With function B4 observing, functions B1 and B2 go in bucket J while function B3 is a stable, my half-cycle, position function in bucket I. Note that with function B4 observing, function B3 is considered "stable" because the cutter clear position CCP, once achieved, is not reversed until after function B4 has been completed.

For every function B1-B4, there is an inverse function in an opposite half-cycle that is stable and is a position. For example, function B3 is the inverse of function B1 while function B2 is the inverse of function B4. Thus, all cycle functions can be divided into two groups, a first group being the inverse of the other. Gathering information about both function groups requires duplicative effort. Therefore, when defining a function by its relationships with other cycle functions, only a function corresponding to the first group, or, in the alternative, the second group, is required. When bucketing functions with function B1 observing, a user would work backwards through the cycle bucketing functions until a duplicative function is encountered. Working back, as explained above, observed function B4 would be placed in bucket J. Observed function B3, however, is the inverse of function B1 and therefore represents duplicative information. Here, because function B3 is the inverse of function B1, B3 could not possibly be performed during B1 and therefore, B3 need not be bucketed. As for function B2 information, that information is reflected in the bucketing of function B4 and is not needed.

Thus, for each function in a cycle, only one other function would be bucketed (i.e. B4 bucketed for B1, B3 for B4, B2 for B1, and B1 for B2). Obviously, the present example is extremely simple. However, one of ordinary skill in the art should easily be able to apply these teachings to bucket functions for complex cycles.

In addition to instantaneous characteristics of other functions in the same cycle, commencement and continuance of a function is also contingent upon three other conditions. A first condition is that a function will not start in an automatic sequencing mode of operation unless it is in its start position. A second contingency is that a function will not start in a manual discrete stepping mode of operation until all required control buttons have been triggered by a user. A third contingency is that a function will not start in any operating mode unless prescribed safety requirements are met.

Referring again to FIG. 50, the attributes column 5032 includes attributes "my start position", "push button", and "safety" corresponding to each of the three contingencies identified above. Three additional bucket columns M-O are provided, each column corresponding to a different one of the three conditions. Each instance of a condition is bucketed into an appropriate column, M-O.

Figure 49A:
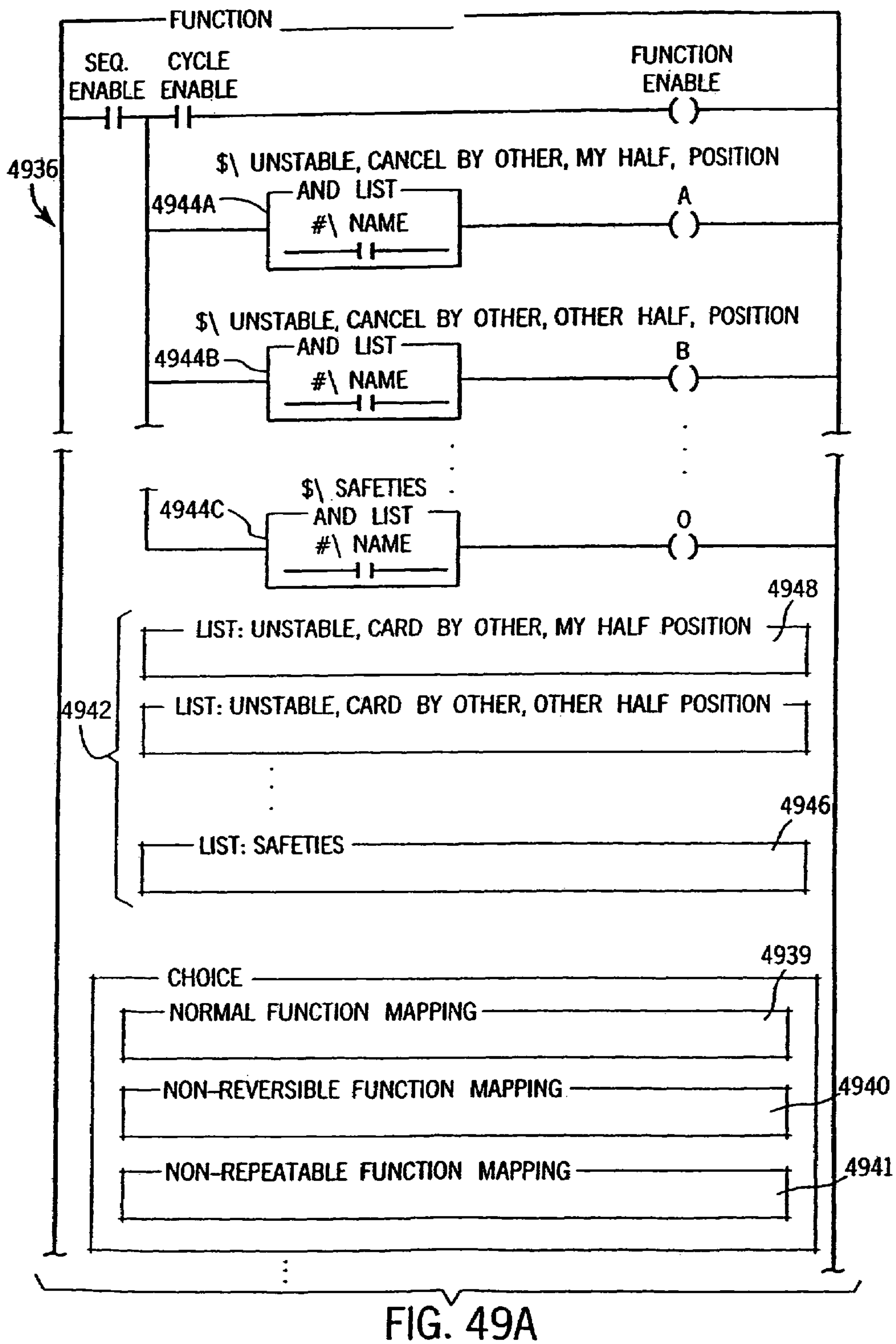
FIG. 49A and 49B are ladder logic displays in accordance with a preferred embodiment.

Referring to FIGS. 49A and 50, after all functions and contingencies that must be bucketed have been bucketed according to attributes table 5031, they can be used to populate lists in a module list specification section 2342. The list specification section 2342 includes one module list specification for each bucket A-O in table 5031. Each module list should be populated with functions or other contingencies corresponding to the list name.

Referring to FIG. 49A, the function template 2336 also includes a plurality of "AND list" macros 234A-2340, one macro corresponding to each module list specification in section 2342. When expanded, each "AND list" macro 2344A-2340 expands into a series-connected set of contacts, one contact for each member in an associated module list specification. The coils in series with the macro are excited only when each contact in the series is true. Thus, coil "A" will not be excited unless all functions bucketed and placed in the "unstable, canceled by other, my half, position" module list specification 2348 are true. Similarly, coil "O" will not be excited unless all safeties in safety module list specification 2346 are true.

In addition to the instantaneous characteristics of other functions in the same cycle and the other contingencies identified above, function performance may also depend on the physical characteristics of an axis. Physical characteristics of an axis or an industrial process can put additional constraints on the manner in which a function can safely be performed. Functions can be divided into three types based on the kinds of constraints placed on them.

A first function type is a normal function. Normal functions can be performed either in forward or reverse directions without damaging a workpiece or an associated machine's components. Performing a function in reverse means making the axis move in the opposite direction of the trajectory related to the function. This may produce the same effect as, but in terms of function logic is not the same as, performing the functions inverse function.

A second function type is a non-reversible function meaning that, after the function has been performed in whole or in part, in the forward direction, it cannot be reversed and performed in the other direction. An example of a non-reversible function is a transfer bar forward movement function which cannot be reversed once it has started forward as it might cause damage to work pieces or a fixture's axis components.

The third function type is a non-repeatable function. A non-repeatable function cannot be started forward a second time once it has been performed to completion. For example, where an axis device places a pin in a hole while performing a function, after the function is performed, the function cannot again be performed because the hole is already blocked by the first pin. Hence, the function is non-repeatable.

To accommodate the three separate function types (i.e. normal, non-reversible and non-repeating), template 2336 includes a choice module specification 438 having "normal function mapping" 2339, "non-reversible function mapping" 440 and "non-repeatable function mapping" 2341 specifications. Depending upon function types, a user would choose one of said specifications 2339-2341 and provide an associated mapping module.

The only other function characteristic that must be determined to completely define the function template 2336 is to specify in which half-cycle a function occurs, first or second. Cycle half specification is required for contact 2350 in FIG. 49B.

Figure 51:
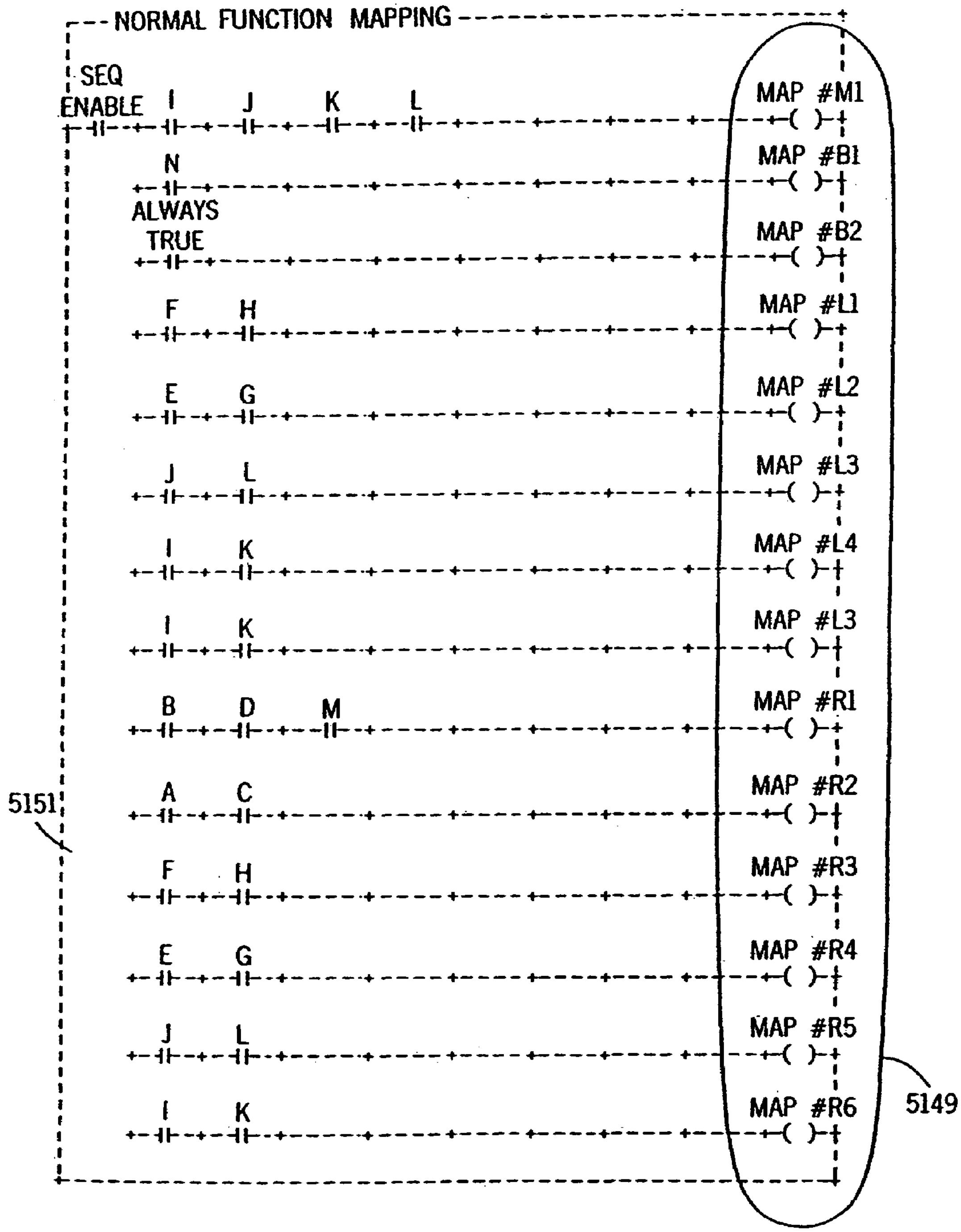
FIG. 51 is a ladder logic display in accordance with a preferred embodiment.

After all of the module specifications have been designated for the function template 49A, 49B, the user is done programming control of the specific function. Referring to FIGS. 49A and 51 when normal function mapping is chosen in template 5136, the bucketed functions and conditions from table 5031 are mapped into mapping coils 5149 according to a normal function mapping template 5151. Similarly, where the non-reversible or non-repeating mapping choices are made in template 2336, other mapping templates are used to map bucketed functions and conditions slightly differently. Thus, using a template set, function performance can be made contingent upon axis physical characteristics, instantaneous characteristics of functions sharing a cycle, the state of a cycle itself, the state of any control means associated with the function, and whether or not job-specific safeties associated with a function have been met.

D. Editors

In addition to providing truly reusable subsets of control logic, a template set makes automated programming possible wherein programming editors mirror the diagraming conventions which are already widely used in industrial control programming.

Figure 29:
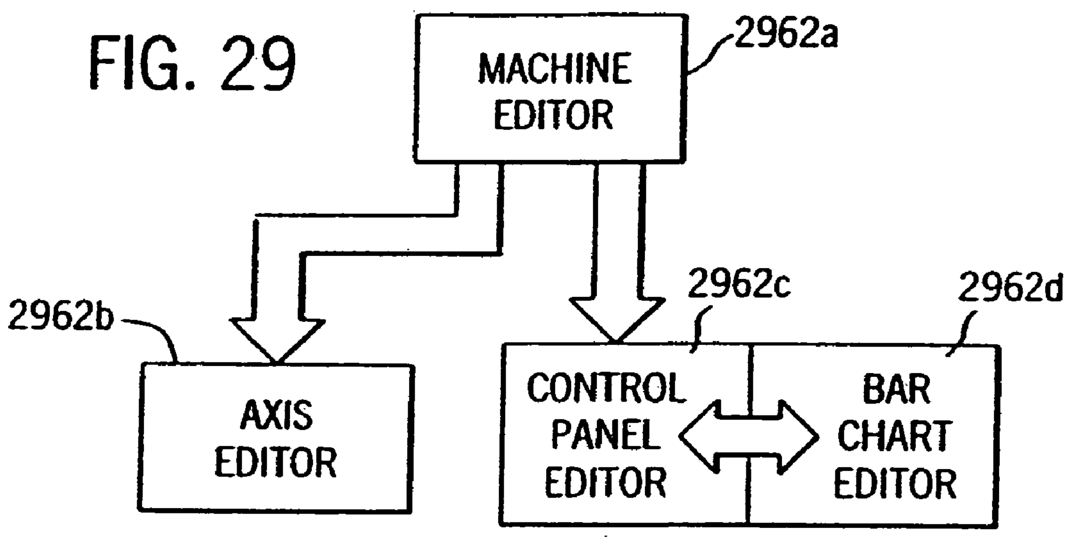

The editors allow a user to construct images that are similar to conventional diagrams and documentation. During image construction, the editors use information from the images to create modules and populate specifications in existing modules. After a user has used the editors to describe all aspects of a machine, all required modules have been populated and a complete template-based machine tree is formed in editor memory. Then, a computer is used to compile the machine tree and provide required LL control logic. Referring to FIG. 29, the four editors are referred to herein as a machine editor 2962*a,* an axis editor 2962*b*, a control panel editor 2962*c,* and a bar chart editor 2962*d.*

In addition to imitating traditional diagrams, each of the editors has been designed to incorporate conventional computer interface features that most programmers should already be comfortable using. Conventional features include an interactive computer terminal that presents programming options in pull down menu form and allows option selection using a mouse or other similar selection means.

1. Machine Editor

The machine editor 2962*a* allows a user to build a floor plan image directly on a computer monitor. During image construction, the machine editor 2962*a* constructs a template-based machine tree reflecting the floor plan image. In addition, while a user is constructing a template-based tree, the editor 2962*a* is simultaneously gleaning information from the tree and either creating new template-based modules or populating existing modules so as to provide a template-based tree specification.

The machine editor 2962*a* only facilitates construction of the floor plan and the portion of a machine tree corresponding thereto. The machine editor 2962*a* cannot specify specific aspects of an axis, an operator panel, or a sequence of events. Specification of these more detailed aspects of a machine are reserved for the axis 2962*b,* control panel 2962*c,* and bar chart 2962*d* editors, respectively. As depicted in FIG. 29, the machine editor 2962*a* accesses the other special editors when specific detail is required.

Figure 30:
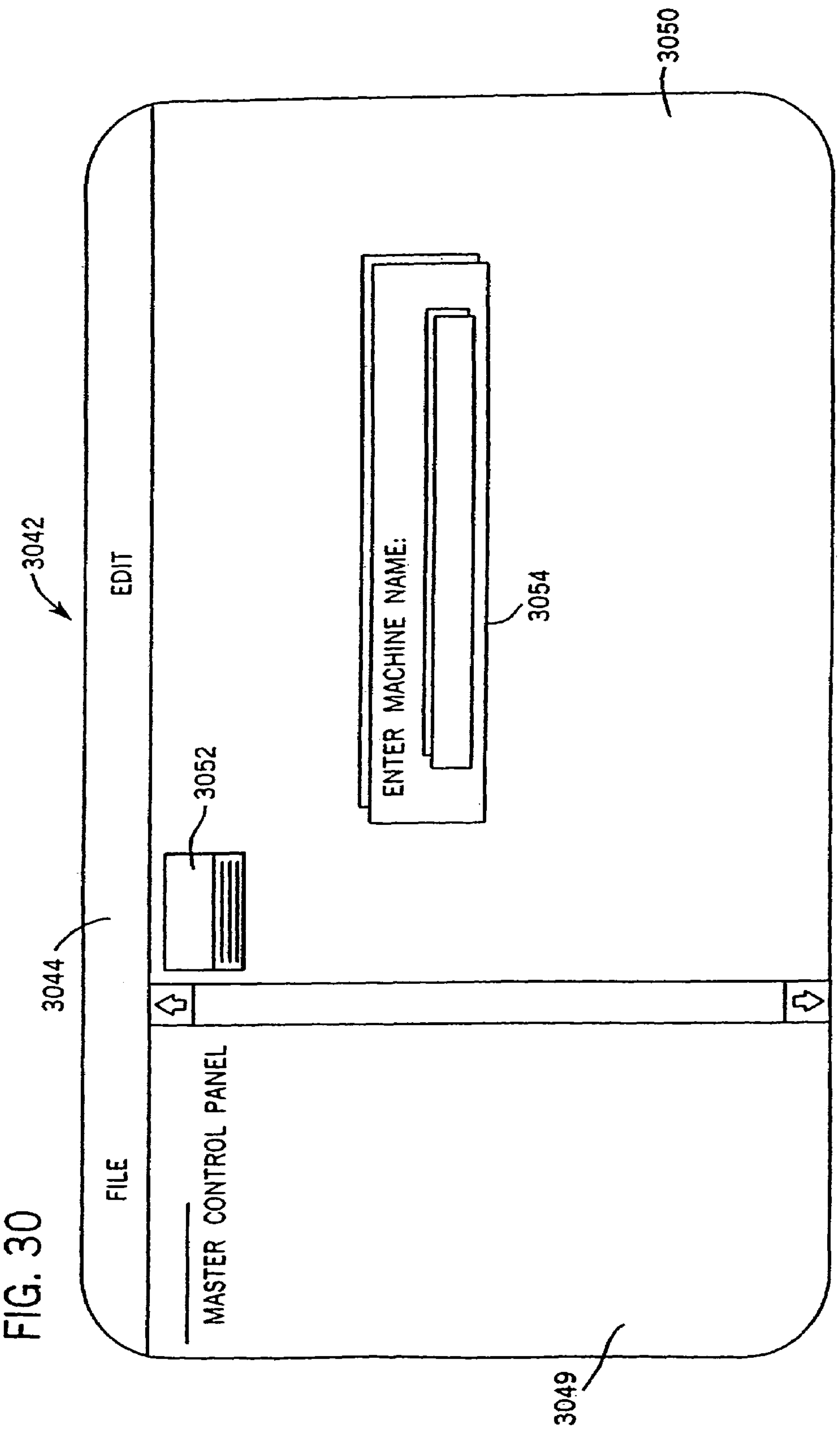

Referring now to FIG. 30, an initial machine editor image 3042 that is displayed on a monitor at the beginning of a programming session includes a menu bar 3044 at the top of the image 3042 and a split screen having a tree section 3049 and a floor plan section 3050. The tree section 3049 provides an area wherein the editor 2962 a visually displays a template machine tree as a corresponding floor plan is constructed. The floor plan section 3050 is where the floor plan itself is constructed.

The menu bar 3044 includes two choices, FILE and EDIT. The FILE choice allows a user to store, retrieve, and delete files from memory. The FILE choice operates in a manner that should be familiar to an artisan of ordinary skill in the art and therefore will not be explained here in detail. The EDIT choice allows a user to simultaneously construct and edit both a floor plan in the floor plan section 3050 and a template-based tree in the tree section 3049.

Initially, a single icon 3052 corresponding to a main control panel appears in the upper left-hand corner of the floor plan section 3050 and both a machine module reference and a master control panel reference appear in the upper left-hand corner of the tree section 3049. The master control panel reference is below the machine module reference and indented to show a hierarchical parent-child relationship. These initial entries are provided to a user because they are always required as designated in the templates. Every template-based tree must begin with a machine module and every machine must have a master control panel for safety purposes. The machine module reference corresponds to the entire floor plan as constructed in the floor plan section 3050. The master control panel module corresponds to the control panel icon 3052.

Furthermore, to uniquely identify the machine, the editor 2962*a* initially provides a floating name box 3054 prompting the user to enter a machine name. The machine name is used by the editor 2962*a* to identify the correct machine module for a given industrial process. In the example above, the process is named "AB1" and therefore, the machine module name is AB1 and AB1 is eventually placed at the top of the tree representation in tree section 3049 (see FIG. 31).

After entering the machine name, a user can start building a floor plan by selecting the EDIT choice from menu bar 3044. When EDIT is selected, the editor 2962*a* provides a menu of possible programming options for further detailing whatever item in the floor plan section 3050 is selected. At the beginning of a programming session, there are only two possible items that can be selected, the machine itself or the master control panel. To select the master control panel, the user would click on the master control panel icon 3052. To select the machine, the user would click on an area of the floor plan section 3050 that does not include an icon. Typically, a user would wait until near the end of a programming session to detail the master control panel because he would know more about the machine at that time.

Figure 31:
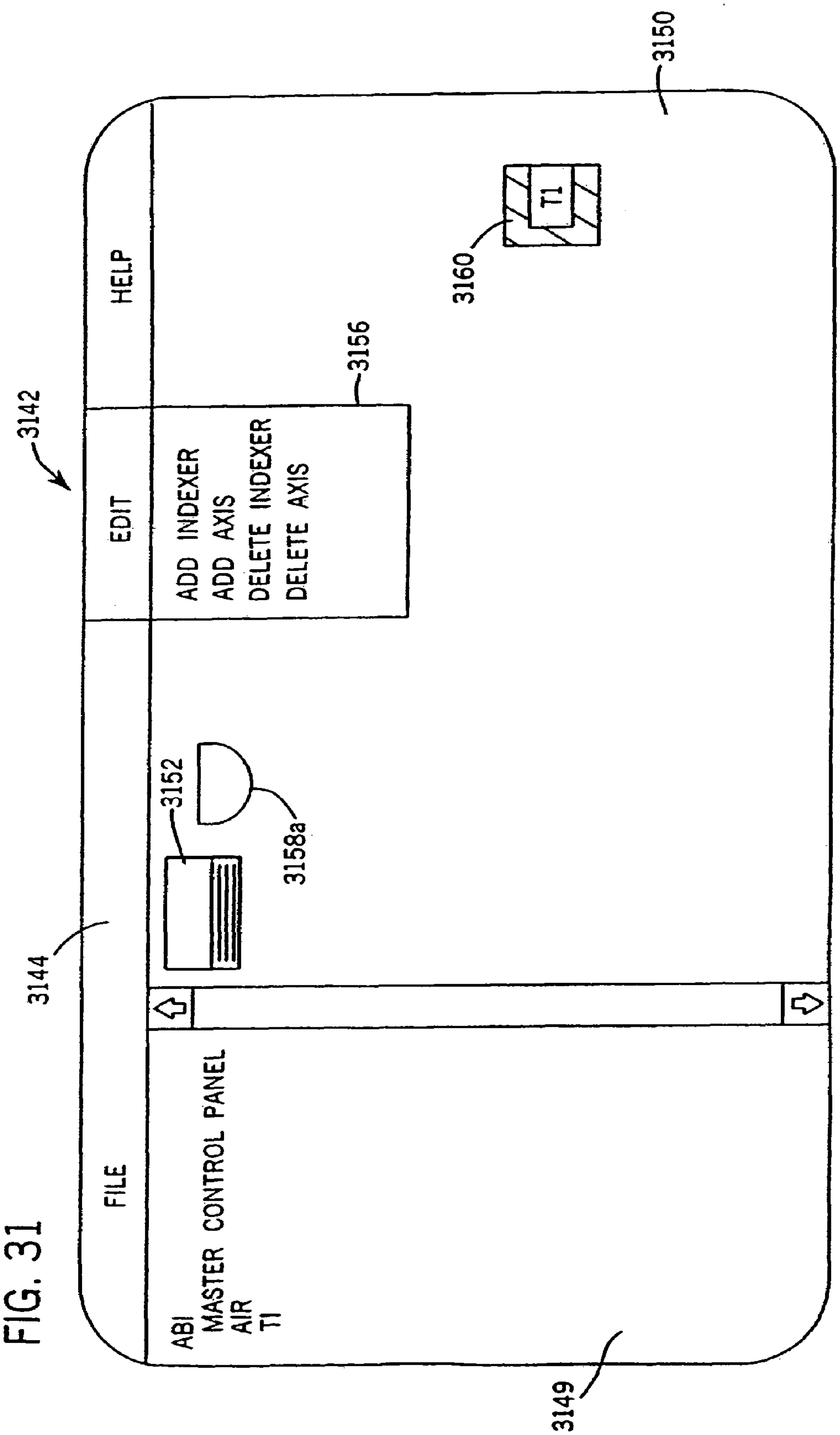

Referring now to FIG. 31, with the machine selected for editing and the EDIT choice chosen, a pull-down menu 3156 appears providing options for editing the machine module AB1. Referring also to FIG. 23, a machine template 2398 can only be edited by adding to or subtracting from the axis 2302 or indexer 2304 module list specification. Therefore, the pull-down menu 3156 includes the only four possible machine module options: ADD INDEXER, ADD AXIS, DELETE INDEXER, and DELETE AXIS. (Delete options are only provided after an axis or indexer has already been added.) Referring also to FIG. 16, in the present example, because the machine requires a single directly-connected axis, the user would select ADD AXIS from the menu 3156. Because each axis requires a unique name, after selecting ADD AXIS, the editor 2962 a would request a name for the new axis using a floating name box (not shown).

In the present case, a user would enter "air" as the name of the axis. Then, the editor 2962*a* would provide an axis module reference named "air" below the AB1 module reference in the tree section 3149 and would also provide an air axis icon 3158*a* next to the master control panel icon 3152 in the floor plan section 3150. The "air" module reference, like the master control panel reference, will be indented from the AB1 module reference to show a parent/child relationship.

Figure 32:
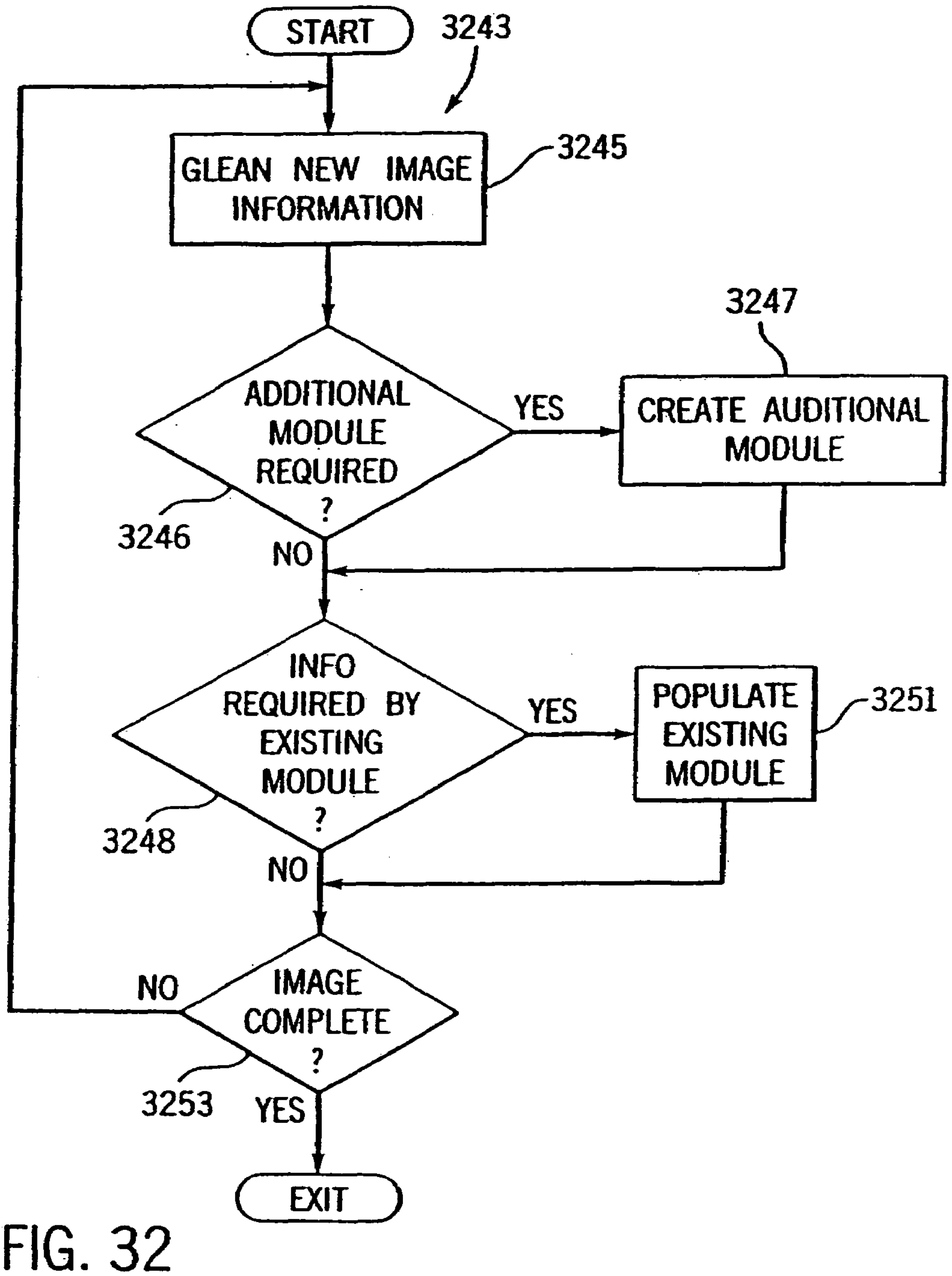

While the editor 2962*a* is forming the floor plan in floor plan section 3150, the editor 2962*a* is also creating modules and populating existing module specifications. Referring to FIG. 32, the method 3243 of creating and populating begins at process block 3245 where the editor 2962*a* gleans new image information from the image. Where an "air" axis image has been added to the floor plan and named, the editor 2962*a* would identify a new axis designated "air".

At decision block 3246 the editor 2962*a* determines if the new information requires an additional module. Where an additional module is required, at block 3247 the editor 2962*a* creates an additional module. Here, after the "air axis has been named, the editor 2962*a* creates an axis module named "air". Next, at decision block 3248, the editor 2962*a* determines if the newly-gleaned information is required to populate an existing module. If so, at block 3251 the editor 2962*a* populates the existing module.

After the required modules have been created and existing modules populated, at block 3253 the editor 2962*a* determines if the image in section 3250 is complete. Typically image completion will be signaled when a user stores an image via the FILE option in menu bar 3144. When the image is complete, the editor 2962*a* exits process 3243. If the image is not complete, the editor 2962*a* cycles back to process block 3145 and continues to glean new image information used to create additional modules and populate existing modules.

After the "air" axis has been added to the floor plan and named, the user again selects EDIT from the menu bar 3144, this time selecting the ADD INDEXER choice to add an indexer T1. When ADD INDEXER is selected, because each indexer module requires a unique name, the editor 2962*a* would request an indexer name using another floating name box.

After entering "T1" to identify the indexer in the present example, the editor 2962*a* would provide a "T1" module reference below and indented from the AB1 module reference in the tree section 3149 and would also provide an indexer icon 3160 in the floor plan section 3150. Using the mouse the programmer could click on the indexer icon 3160 and drag it into a desired position suitable for building the desired floor plan. In FIG. 31, the indexer icon 3160 is shown in the right hand portion of the floor plan section 3150. Referring again to FIG. 32, each time new information is added to the floor plan image, the editor 2962*a* follows process 3243 to create new modules and populate existing ones.

If needed, a user can again select EDIT and add additional indexers and axes to provide a template-based machine tree and floor plan that corresponds to any machine configuration. For example, if a machine requires a source of pressurized coolant in addition to the air source, a coolant axis could be added to the machine module by again selecting ADD AXIS in the EDIT menu. In the present example, however, the machine includes only one axis ("air"), one indexer ("T1") and the required master control panel. Thus, at this point, fundamental characteristics (i.e. axis, indexers, and control panel) of the machine module have been identified.

Next, the user can further specify either the indexer "T1" or the "air" axis. To further specify the indexer T1, the user selects the indexer icon 3160 with the mouse and then again selects EDIT. Referring again to FIG. 26, the indexer template 2612 can be edited only by adding an operator panel, a station or an axis specification, or by deleting a station or axis specification. Therefore, referring to FIG. 33, in this case, the EDIT menu would provide five options: ADD STATION, ADD AXIS, ADD OPERATOR PANEL, DELETE STATION, and DELETE AXIS (delete options are only provided after station or axis has been added). At the indexer level an operator panel is optional and should only be provided when required to meet job specific characteristics.

As with the machine module, here, where an axis is to be added to the indexer Ti, the user would select ADD AXIS and name the axis. The editor 2962*a* would then provide an axis module reference below the indexer module reference Ti and indented in the tree section 3149 and provide an axis icon in the floor plan section 3150. In the present example, the indexer T1 includes a "transfer" axis shown below the indexer "T1" reference in section 3149 and shown as transfer icon 3158*b* in section 3150 of FIG. 33. The transfer icon 3158*b* initially appears near the top of the floor plan section 3150 and is dragged down next to the indexer icon 3160 to signify the relationship therebetween.

To add a station to the indexer, the user selects ADD STATION and names the specific station. The editor 2962*a* then provides a station module reference in the tree section 3149 and a station icon in the floor plan section 3150 which can be dragged into its proper location next to the indexer icon 3160. Additional stations are selected in the same manner but must be provided different names.

Figure 33:
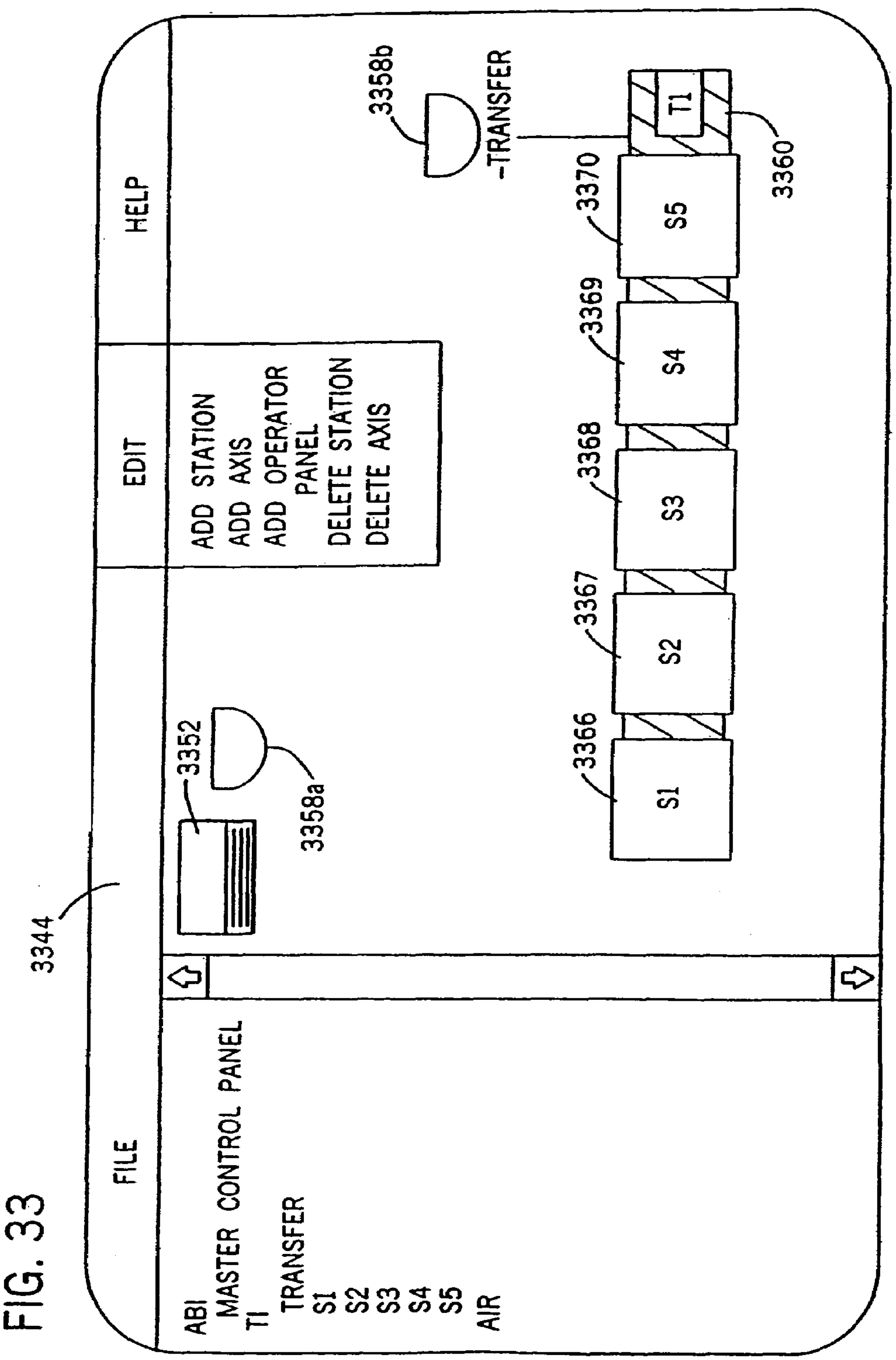

In the present example, because there are five separate stations, the user adds five separate stations to the floor plan, each of which is individually represented in both the tree 3149 and floor plan 3150 sections. In FIG. 33, all five stations, named S1-S5, are shown as five separate icons 3366, 3367, 3368, 3369 and 3370. The icons have been positioned to show machine component relationships.

This process of selecting and naming menu items to construct both the template-based machine tree and the floor plan continues until the floor plan is completely designated, from the machine level down to the axis level. A complete floor plan for the process is shown in FIG. 34 including icons representing the indexer, five stations, a work-unit named "LH" at the first station corresponding to a loader, a work-unit named "LV" at the second station corresponding to a drill, an LV unit at the third station corresponding to a turret drill, an LV unit at the fourth station corresponding to a horizontal mill, an "RH" at the fifth station corresponding to an unloader, an operator panel represented by icon 3400, a master control panel represented by icon 3452, and a separate icon for each axis.

In the tree section 3149, LH stands for "left horizontal" meaning the work-unit is positioned on the left hand side of its associated station and moves horizontally with respect to the station. Similarly, LV stands for "left vertical" meaning movement is along a vertical axis and RH stands for "right horizontal" meaning the work-unit is positioned on the right hand side of its associated station and moves horizontally with respect to the station. Despite the drill, turret drill, and horizontal mill all having the name LV, each is distinguishable because of their parent/child associations with different parent stations. Importantly, the parent/child associations are recognized by the compiler.

Figure 34:
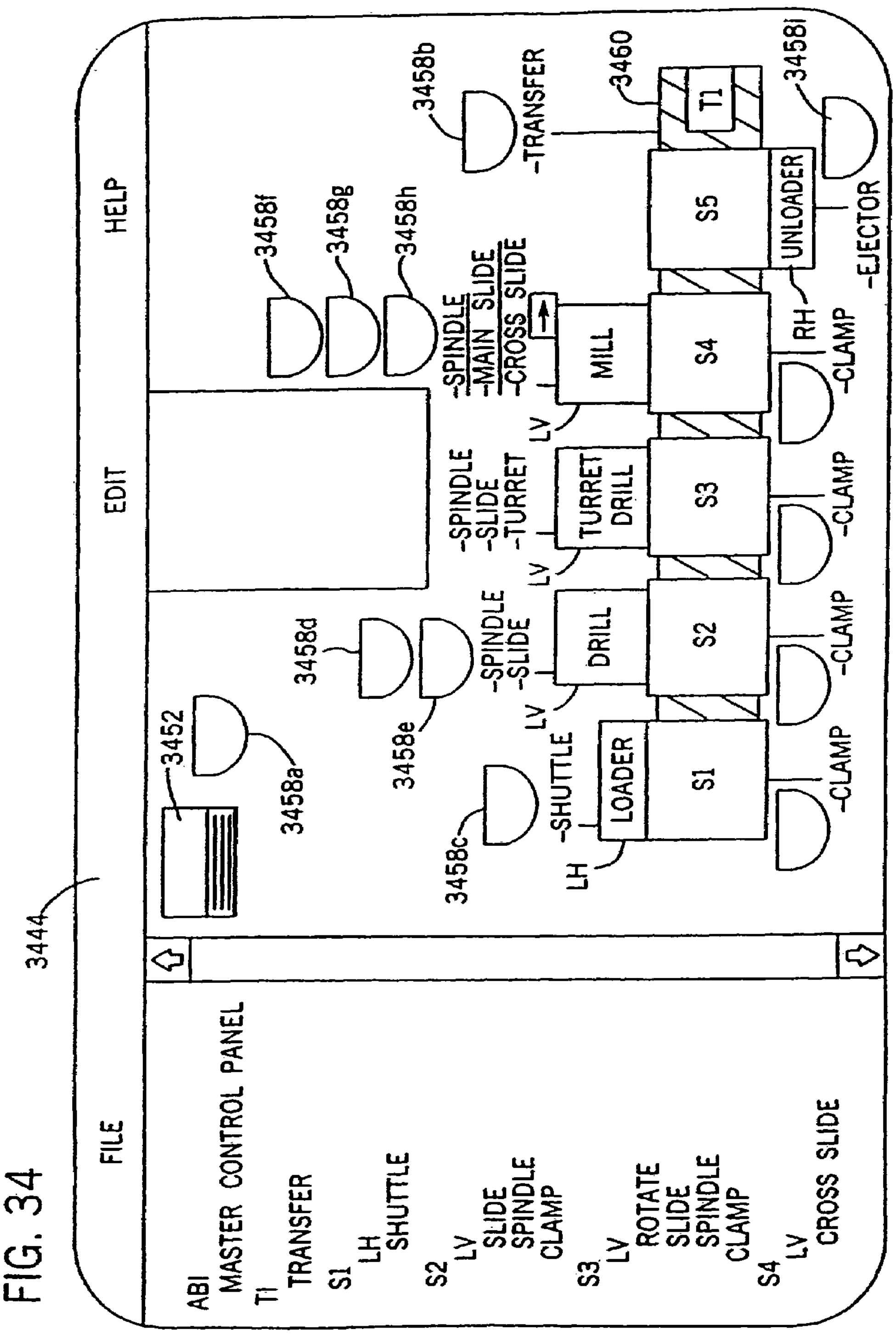

As in FIG. 16, the loader at station S1 in FIG. 34 includes a single axis named "shuttle" 3458*c*. Similarly, the drill at station S2 includes two axes named "spindle" 3458*d* and "slide" 3458*e*, and the turret drill at station S 3 includes axes named "spindle", "slide" and "turret" (icons not shown). The mill includes axes named "spindle" 3458*f*, "main slide" 3458*g* and "cross slide" 3458*h*, and the unloader includes an axis named "ejector" 3458*i*.

When the floor plan is completed, the portion of the template-based machine tree in tree section 3149 is completely designated. Next, the special editors can be used to define the characteristics of each axis 3458*a*-3458*i* and the control panels, as well as define sequences of axis movement.

Referring to FIG. 34, the horizontal mill is represented in the floor plan image as the fourth station S4 and all other components connected thereto. Thus, station S4 includes a left vertical mill LV having a local control panel represented by icon 3400 and spindle, main slide and cross slide axis represented by axis icons 3458*f*, 3458*g*, 3458*h*.

2. Axis Editor

Referring again to FIG. 34, when an axis icon is selected, the machine editor 2962*a* switches editing control to the axis editor 2962*b* which allows a programmer to specify axis characteristics. Referring again to FIG. 29, the axis editor 2962*b*, like the machine editor 2962*a*, follows the same process for gleaning new image information to create new modules and populate existing modules. The only difference is that the axis editor 2962*b* and machine editor 2962*a* glean required information from different images and create and populate different module types.

Figure 35:
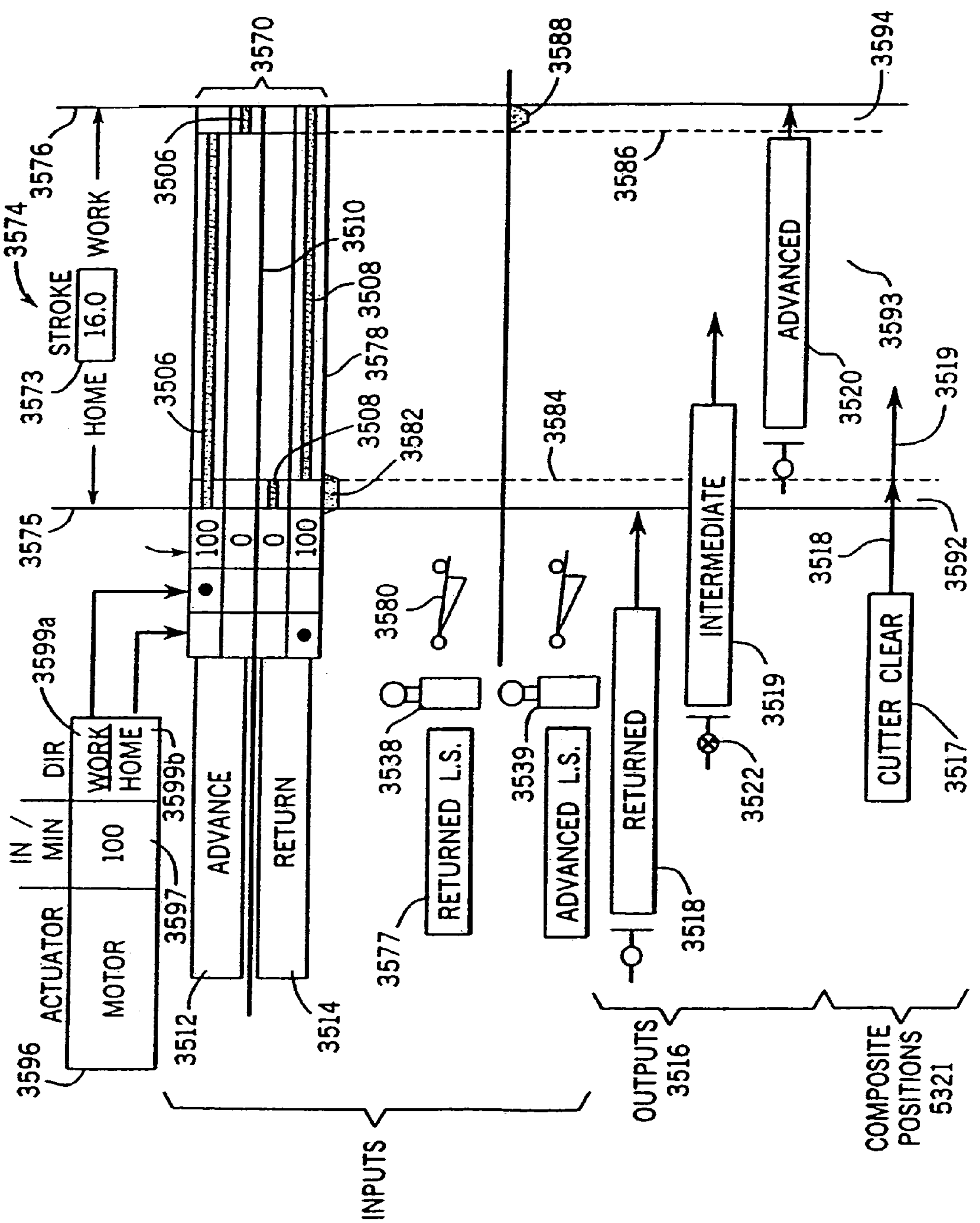
Figure 36:
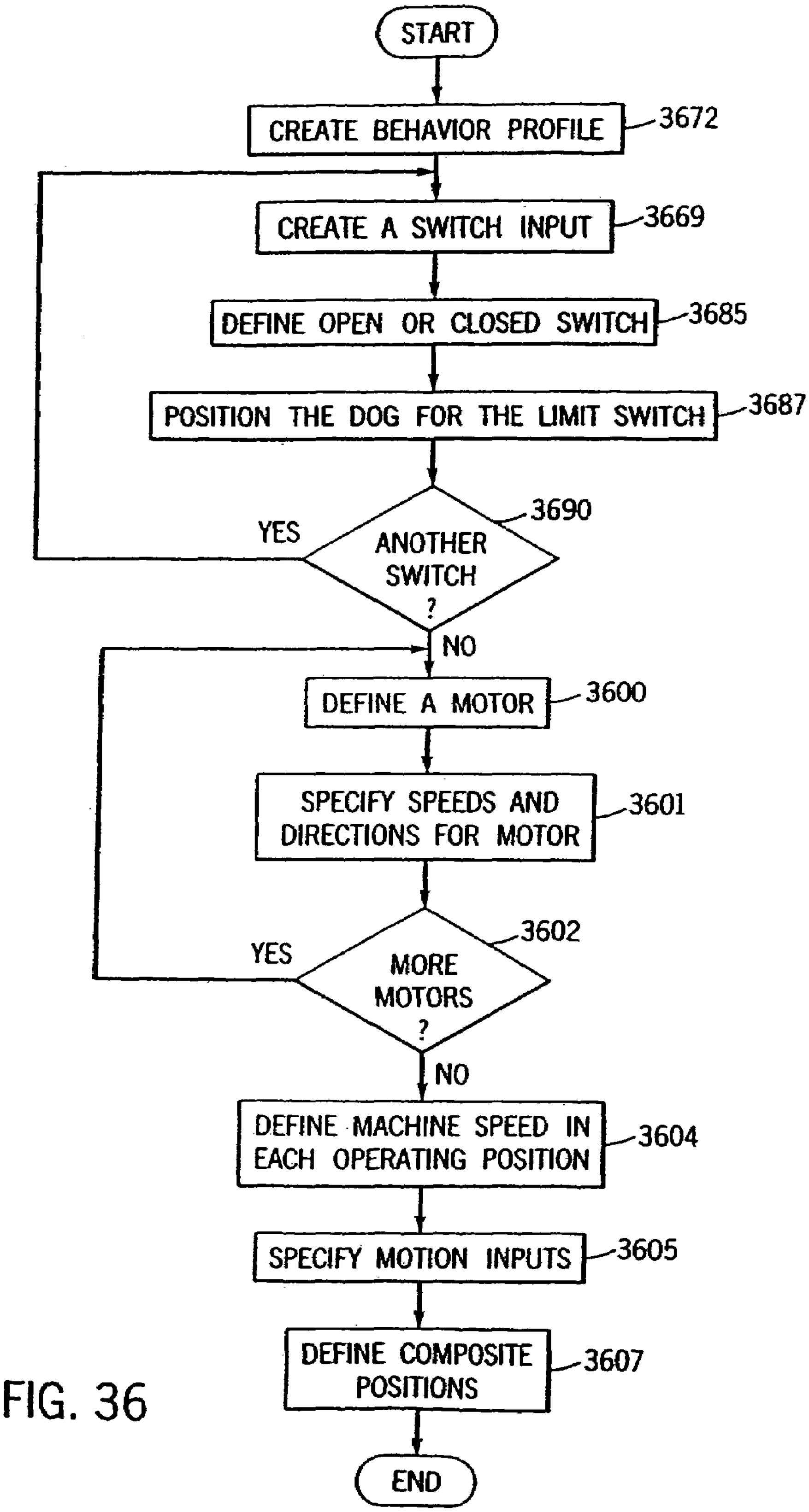
FIG. 36 is a flow chart of the process by which the user creates the control diagram in accordance with a preferred embodiment.

FIG. 35 depicts a control diagram 3574 for the main slide linear axis, as displayed on a programming monitor, along with additional information required to derive data for a template compiler. A flow chart of the process by which the user creates the control diagram is depicted in FIG. 36. Initially at process step 3572, the user constructs a behavior profile 3570 that is similar to the control metaphor for the desired machine cycle. The behavior profile 3570 is illustrated in the upper right portion of the display in FIG. 35 between lines 3575 and 3576 representing the extremes of the linear motion. The remainder of the display designates "physical attributes" of the axis, which attributes constitute the input and output signals required to operate the machine according to the behavior profile.

At the outset of defining the operation of the main slide axis, a blank behavior profile is displayed with only the outer lines 3575 and 3576 that correspond to the extremes of the linear movement of the main slide subassembly. An EDIT choice appears at the top of the profile in a menu bar which, when selected, provides a menu of items that can be used to define the axis. In particular, the menu will include switches, actuators, and work requests. A box 3573 in which the user enters the length of the machine stroke, i.e. the distance between positions D0 and D1 also appears. In the present example, the stroke distance is 16.0 inches and can be entered in the box 3573 by selecting the box 3573 and entering an appropriate stroke via a keyboard.

In FIG. 36 the user uses the edit menu to select a menu item on the terminal screen to define one of the limit switches, for example a switch for the fully returned position of the subassembly. After that selection, a limit symbol is displayed on a monitor and box 3577 appears to the left of the symbol within which the user enters the switch name, such as "returned LS". A schematic representation 3580 of the limit switch appears adjacent to its symbol to indicate whether the limit switch contacts close or open when struck, or tripped, by a subassembly dog. A dog symbol 3582 also appears on a horizontal line 3578 which represents the linear axis of movement. One end of the dog symbol 3582 initially abuts the LEFT vertical line 3575 and another vertical line 3584 appears at the other end of the dog symbol.

The graphical representation of the limit switch indicates when the limit switch is sending an active input signal to a programmable controller with respect to the positions of travel by the main slide subassembly. At step 3585, the user indicates whether the switch is normally opened or closed. This is accomplished by using a mouse or the keys on a keyboard to place the cursor over the schematic symbol 3580 and press the button to toggle the symbol open or closed. In a similar manner at step 3587, the user "grabs" the dog symbol 3582 to position the symbol along line 3578 to indicate positions on the axis where the dog trips the limit switch. The length of the dog symbol 3582 can be changed by using the cursor to grab one end of the symbol and stretch or contract the dog symbol. As the position and length of the dog symbol changes, so does the position of the vertical line 3584 which indicates the location along the linear axis at which the dog engages and disengages the corresponding limit switch. The dog symbol 3588 for the advanced limit switch also is created on the control diagram in this manner by the user again selecting the limit switch menu item at step 3590. Defining the other limit switch (i.e. "advanced LS") also creates an additional vertical line 3586 on the control diagram 3566.

The definition of the two limit switches divides the stroke length into three segments referred to as positions 3592, 3593, and 3594. The location and length of the dog symbols 3582, 3588 designate in which of these positions 3592-3594 the corresponding limit switch will be tripped by a carriage dog. In the present example, the returned limit switch is tripped by the dog when the subassembly is stopped in the "returned" position 3592. The advanced limit switch is tripped by the dog only when the subassembly is at the "advanced" position 3594. When neither the advanced nor returned LSs are tripped, the subassembly is in an "intermediate" position. As the limit switches are employed to signal when subassembly motion should be stopped, the operational positions 3592-3594 relate to different sections of the control metaphor. Specifically, "returned" position 3592 corresponds to the stopped position at distance D0 and position 3593 corresponds to the subassembly moving between distances D0 and D1. Similarly, position 3594 corresponds to the fully advanced position when the subassembly is stopped at distance D1. The terms "position" and "operational position," as used herein, refer to physical locations at which the machine has different operating characteristics, for example movement speed and direction. A position may be a single physical location or a region of physical locations, such as the region between distance D0 and D1.

After defining the signals for the two limit switches, the user then specifies the number of actuators (motors) which are employed to drive the subassembly. A separate block 3596 is created each time the user selects an ADD ACTUATOR menu item from the program editor software at step 3590. This enables the user to specify the number of motors, in this case one for the main slide motor. Each block 3596 is subdivided into three boxes for actuator name, speed (IN/MIN) and direction. The blocks 3596 may be subdivided further depending upon the types of actuators, i.e. . . . single speed-single direction, single speed-two direction, two speed-single direction, or two speed-two direction motors. In the present example, the main slide motor is a single-speed, two-direction device and thus its block 3596 has a single-speed box 3597 and two-direction boxes "work" 3599*a* and "home" 3599*b*. At step 3600, the user enters the speed of the slide motor in box 3597 but does not designate direction since both the advancing and retracting motions are provided by this actuator type. The editor software loops through steps 3600-3602 until information has been provided for each actuator selected.

Each time an actuator block 3596 is added, removed or edited, the graphical editor has a column for every direction and/or speed coil for the motors and a line which corresponds to all of the possible combinations of motor speeds going toward and away from the workpiece. The exemplary main slide motor can advance the subassembly toward a workpiece at 100 inches per minute. Similarly, the motor can be used to retract the subassembly from a workpiece at 100 inches per minute. A black dot in various matrix locations indicates which of the motors are energized and their direction to produce the speed listed in the right column of the matrix 3604.

When the matrix 3604 is formed, separate horizontal bars 3606 and 3608 are created across the behavior profile 3570 above and below the zero speed axis 3610. Each of the horizontal bars 3606 and 3608 is formed by individual segments within each of the operational positions 3592-3594. At step 3604, the user grabs the segments of the horizontal bars 3606 and 3608 in the behavior profile 3570 and positions the segments vertically to indicate the advancing and returning speed at which the subassembly is to move within each of the positions 3592-3594. For example, when an advance request is received, the subassembly is to move from the returned position 3592 through the intermediate position 3593 at a speed of 100 inches per minute. Upon the subassembly reaching the advanced position 3594 at distance D1, the speed goes to zero by stopping the motor. Thus, the portion of the behavior profile 3570 above the zero speed axis 3510 corresponds to moving the subassembly toward a workpiece. A similar representation in FIG. 35 is given for the speed of the subassembly away from the workpiece by locating the segments of horizontal bar 3608.

Referring still to FIGS. 35 and 36, the user then provides the names of separate request signals that indicate when the subassembly is to advance toward the workpiece and when it is to return. These names are placed into boxes 3512 and 3514 as request signals to be used by the linear axis editor as described below. In the example these request signals have been named simply "advance" and "return".

Next, the user is afforded an opportunity at step 3607 to define composite position signals, which are signals energized when an axis is within a specified region defined using a subset of operational positions 3592-3594. A composite position definition label box CCP 3521 is added to section 3516 of diagram 3574 each time a user selects an ADD COMPOSITE POSITION menu item. For each composite position added a user must enter a name in the label box CCP' and must select one or more operational positions by clicking the mouse-controlled cursor in the vicinity of the intersection of an imaginary horizontal line, extending from the center of the label box CCP', and one of the operating position regions 3592, 3593 or 3594, each selection recorded by the axis editor as a graphical arrow 3518, 3519. In the example, a composite position named "cutter clear" 3517 is defined to be energized whenever the main slide subassembly is in either the "returned" or "intermediate" position.

As the user creates the control diagram 3574 of FIG. 35, the axis editor 2962*b* converts icons and images from the diagram 3574 into module specifications required to define an associated axis module. Referring again to FIG. 25, to completely define both physical and operating characteristics of an axis the editor 2962*b* must glean information from the axis diagram 3574 to populate the module specification named "switch package" 2591_a_ and two module list specifications named "trajectory" 2591_b_ and "actuator" 2591_c_.

Referring to FIGS. 25, 32 and 35, to define the axis module 2508 so as to correspond to control diagram 3574, while a user is constructing the diagram 3574, the editor 2962_b_ identifies all limit switches, positions, composite positions, actuators, trajectories, and moves from the diagram 3574, one at a time, at block 3545.

Each time a user designates a limit switch, request, actuator, position or composite position, the editor 2962_b_ identifies the designation and populates an appropriate module or creates a new module. In the main slide control diagram of FIG. 35, the editor 2962_b_ would identify both the returned limit switch 3538' and advanced limit switch 3539', both the main slide advance 3512 and return 3514 requests, the main slide motor actuator 3596, the main slide positions including "returned", "intermediate", and "advanced" 3592, 3593 and 3594 respectively, the composite position "cutter clear" CCP' and various moves corresponding to both the return 3514 and advance 3512 trajectories. The advance trajectory 3512 would include an "initial" move corresponding to position 3592, an "intermediate" move corresponding to position 3593 and a "final" move, which slows the subassembly to zero speed, corresponding to position 3594.

At block 2251, after each of the axis designations, the editor 2962_b_ populates corresponding lists, placing limit switches in the limit switch module list specification 3794, positions in the position module list specification 3795, trajectories in the trajectory module list specification 2591_b_, actuators in the actuator module list specification 2591_c_, composite positions in the composite position module list specification 2591_d_ and moves in the associated move module lists 2596_g_ in FIG. 25. In addition, for each list entry, the editor 2962_b_ creates a new module at block 147. For example, referring to FIGS. 35 and 37, for the main slide control diagram 3574 the limit switch module list specification 3794 in FIG. 37 would include module references named "returned LS" 3538 and "advanced LS" 3539 while the positions list 3795 would include module references named "returned" 3592, "intermediate" 3593 and "advanced" 3594. Referring to FIGS. 35 and 25, the trajectory module list 2591_b_ would include module references named "advance" and "return" corresponding to requests 3512 and 3514 respectively and the actuator module list specification 2591_c_ would include a single module reference named "motor" of the type actuator corresponding to designation 3596. Referring to FIG. 39, the module list specification named "move" for the module of type trajectory named "advance" would include references to "initial," "intermediate" and "final" moves and the list named "move" for the module of type trajectory named "return" would also include references to "initial," "intermediate" and "final" moves. Each list entry would correspond to a different module.

Referring to FIG. 38 the position template 3803 includes four separate lists 3804_a_, 3804_b_, 3804_c_ and 3804_d_ corresponding to the two possible types of limit switches and the two possible states of each type of switch (i.e. normally open (NO) tripped, NO released, normally closed (NC) tripped, and NC released.) Referring also to FIG. 35, the editor 2962_b_ correlates positions 3592, 3593 and 3594 with tripped and untripped switches and switch type (i.e. NO or NC) to populate each of the module list specifications 3804_a_-3804_b_ of FIG. 38 with switches in conditions that correspond to a position.

For example, referring again to FIG. 35, when the subassembly is in the returned position the "returned LS" 3538 is tripped and the "advanced LS" 3539 is released. Assuming both the returned 3538 and advanced 3539 switches are normally open (NO), the returned position 3592 would include one normally open and tripped returned LS 3538 and one normally open and released advanced LS 3539. Recognizing this, the editor 2962_b_ would populate the NO tripped LS module list specification 3804_a_ with the returned LS 3538 and would populate the NO released LS module list specification 3804_b_ with the advanced LS 3539. The other two list specifications 3804_c_ and 3804_d_ in the position template 3803 would be left empty.

Referring to FIGS. 35 and 38, axis editor 2962_b_ creates a composite position module based on template 3803_a_ for each composite position in section 3516 of diagram 3574. The editor provides each module a name 3801 corresponding to the name in label box CCP' and provides a "selected positions" module list specification 3804_e_ corresponding to the names of the selected operational positions 3518 and 3519. The single rung in template 3803_a_ generates a simple logic circuit that energizes a signal whose name corresponds to module name 3801_a_ whenever any one of the positions in the selected positions module list specification 3804_e_ is energized.

Referring to FIGS. 25 and 39 the editor 2962_b_ creates a trajectory module based on trajectory template 3909 for every trajectory referenced in the trajectory module list specification 2591_b_.

The second rung 3913 determines if the trajectory associated with the specific module is at its start position. This is done by using an OR list macro as explained above. The OR list macro and associated logic 3915 determines if any other trajectories are done. Where any other trajectory is done, it is assumed that the present trajectory is at its start position. The third rung 3914 simply checks if the trajectory associated with the module is completed and is used by other trajectory modules to determine if they are at their start positions. The start and done status of each trajectory is used by the bar chart editor 2962_d_ as described in more detail below.

Referring now to FIG. 40, a move module based on move template 4016 is provided by the editor 2962_b_ for each potential move designated in a trajectory module. Each move template 4016 includes a unique module list named "coil request". The editor provides a coil request module based on the coil request template shown in FIG. 41 for each coil request referenced in a move module 4016.

Referring to FIG. 42 the editor 2962_b_ creates an actuator module based on actuator template 4218 for each actuator module referenced in the axis template 108. Each actuator module 4218 includes a module list 4219 called coil wherever a list of uniquely named coils are provided for the actuator associated with the parent actuator template 4218.

Because the axis editor gleans information from diagram 3574 while a user is constructing the diagram and simultaneously constructs the portion of the template-based machine tree corresponding to the axis being designated, by the time diagram 3574 is completed, all of the information required to provide LL logic to specify the axis is complete. This process must be repeated for each axis on the floor plan 3150.

3. Control Panel and Bar Chart Editors

Referring again to FIG. 34, at this point the only icons on the floor plan image that have not been completely defined are the main control panel 3452 and horizontal mill control panel 3400. In addition, while all of the separate axes for each machine element have been designated at this point, none of the axis movements have been linked together.

To specify a control panel, a user must designate mode selection, manual control, and indicator devices. In addition, for each manual control device and each indicator device, the user must designate both the cycle and the specific function in the cycle to which the device relates. To this end, with reference to FIG. 29, although the control panel 2962*c* and bar chart 2962*d* editors are separate, they must be used together. Initially, the control panel editor 2962*c* is used to identify modes of operation, mode selector switches corresponding to the modes of operation, and various cycles that are controllable via the control panel. Then, the bar chart editor 2962*d* is used to define the different functions and their temporal relationships that make up each cycle that is controllable via the control panel. Finally, after the cycles are completely defined, the control panel editor 2962*c* is again used to identify manual control devices, including lights, buttons and switches, that correspond to desired functions in the defined cycles.

To define the horizontal mill control panel, a user selects icon 3400 in FIG. 34. When icon 3400 is selected, editing control passes in FIG. 29 from the machine editor 2962*a* to the control panel editor 2962*c*. Referring yet again to FIG. 32, the control panel 2962*c* and bar chart 2962*d* editors, like editors 2962*a* and 2962*b*, follow process 3243 in FIG. 32 to glean information from screen images to create new modules and populate existing modules during image construction. There is one exception to this general rule and that is that the bar chart editor must also perform a bucketing step using the attributes table 5031 of FIG. 50 after a cycle has been defined to populate function lists in the module list specification sections of associated function modules. This will be described below.

Figure 44:
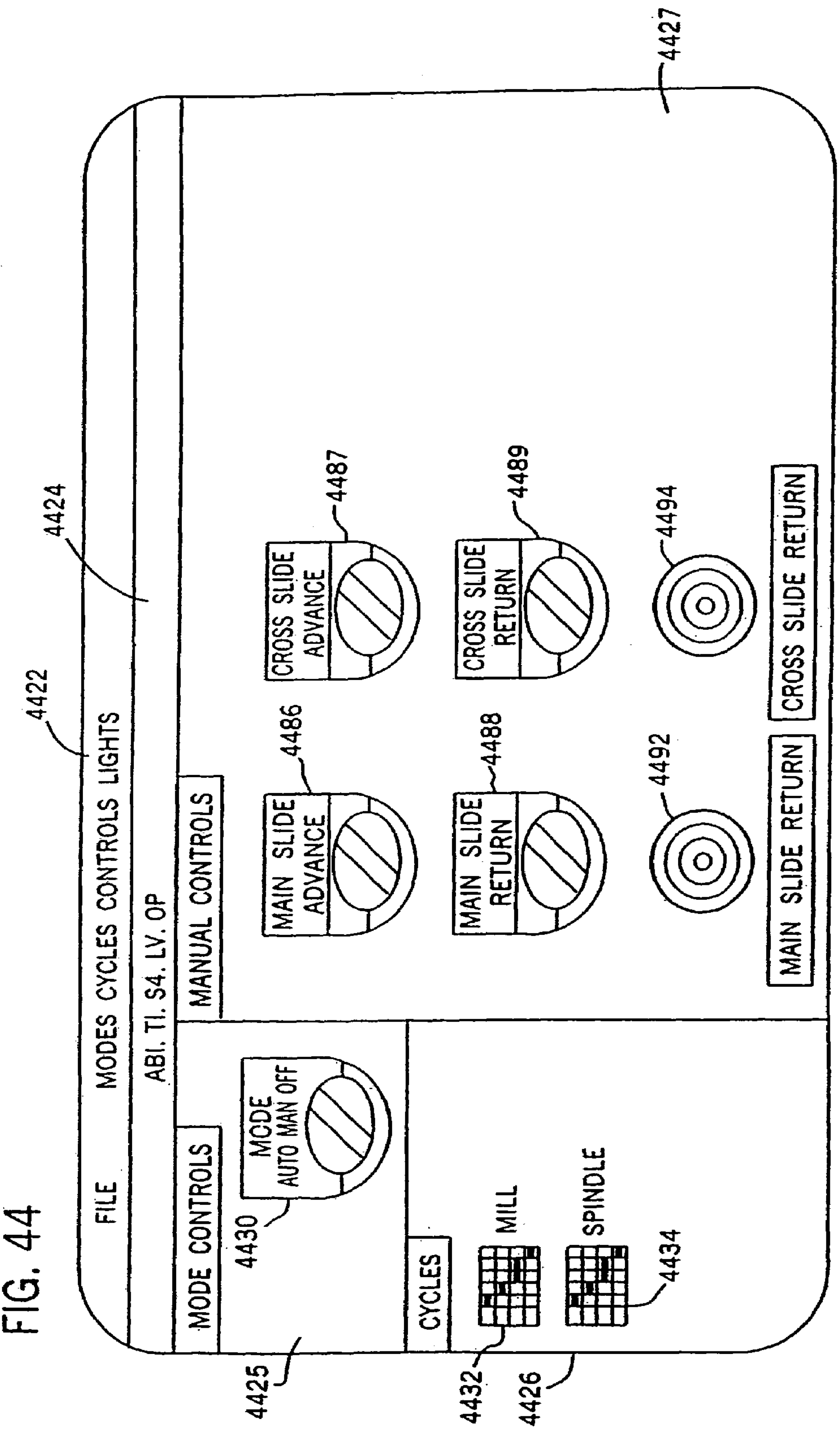
FIG. 44 illustrates a control panel editor in accordance with a preferred embodiment.

Referring now to FIG. 44, the initial display for a preferred control panel editor 2962*c* includes a menu bar 4422, a name field 4424, and three specification fields: MODE CONTROLS, CYCLES, and MANUAL CONTROLS referred to by numerals 4425-4427, respectively. The menu bar 4422 includes five options, a conventional FILE option and MODES, CYCLES, CONTROLS and LIGHTS options that can be used to add or delete modes of operation, cycles, specific controls, or lights respectively.

Because all control panels have at least local and remote modes of operation, the control panel editor 2962*c* initially designates a single three-pole selector switch represented in the MODE CONTROLS field 4425 by icon 4430 which can be used to choose either a remote mode (AUTO), local mode (MAN), or an off state (OFF). If desired, a user can use the MODES option in menu bar 4422 to pull down a mode menu for creating other modes (tool change or service modes). If a third mode is designated via the modes menu, the icon 4430 is automatically altered to show a four-pole selector switch in the MODE CONTROLS field 4425.

Other than icon 4430, initially there are no other designations in fields 4425, 4426 and 4427. Because manual controls have to be related to some cycle function, prior to designating manual controls, machine cycles have to be defined. To this end, a user can choose the CYCLES option from menu bar 4422 to pull down a cycles menu to designate required cycles. When a single cycle is added, the editor 2962 c prompts the user to name the cycle. When a cycle is added, an icon including a user-assigned name is placed in the CYCLES field 4426. In the present example, the horizontal mill control panel includes only two cycles, a mill cycle including movements of the main slide and cross slide subassemblies, and a spindle cycle for turning on and off spindle. Therefore, two cycle icons 4432 and 4434 corresponding to mill and spindle cycles are referenced in field 4426.

Figure 45:
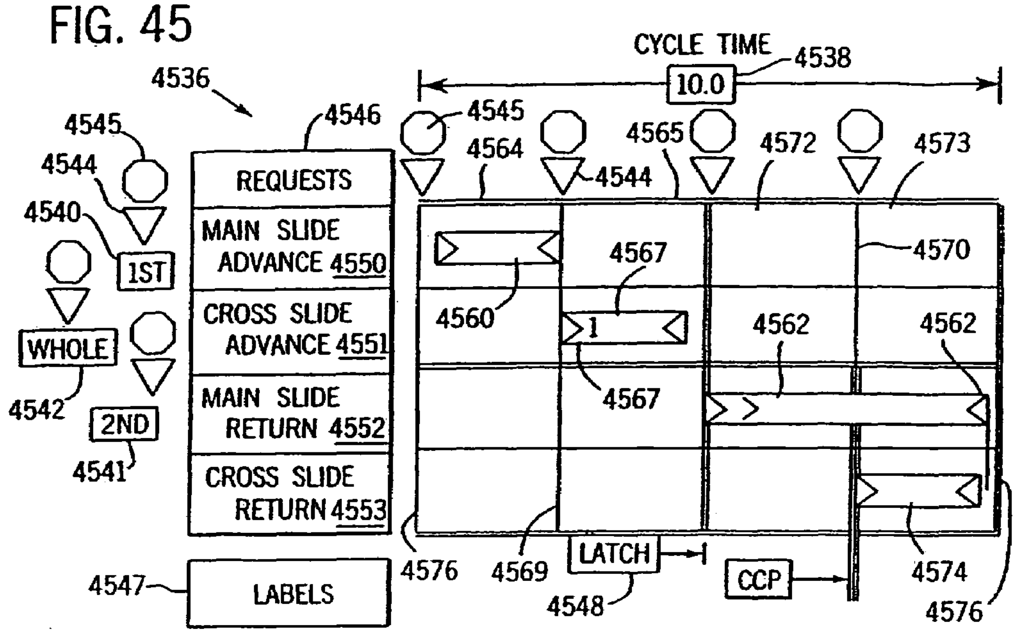
FIGS. 45 & 46 illustrate bar chart images in accordance with a preferred embodiment.

To define each cycle, the user separately selects each of the cycle icons 4432, 4434 to enter the bar chart editor 2962 d two different times. Referring to FIG. 45, a bar chart image 4536 that would be constructed for the mill cycle using the bar chart editor 2962*d* is depicted. It should be readily apparent that the bar chart image 4536 constructed using the bar chart editor 2962*d* is very similar to a conventional chart. The similarity between a conventional bar chart and image 4536 is meant to make it easy for a user trained in the use of conventional diagrams to use the bar chart editor 2962*d*.

When a user enters the bar chart editor 2962*d*, the initial image only includes basic required bar chart designations. Required designations include the cycle time box 4538, first sequence 4540, second sequence 4541 and whole cycle 4542 icons, interlocking yield 4544 and stop 4545 symbols corresponding to icons 4540, 4541 and 4542 and REQUESTS 4546 LABELS 4547 and LATCH 4548 headings.

The editor 2962*d* also provides a menu bar (not shown) including a REQUESTS option which allows a user to add or delete requests from the bar chart and a LABELS option allowing a user to label specific locations in the bar chart. To construct the bar chart image 4536, a user selects an ADD REQUESTS option from a pull down request menu. Thereafter, the editor 2962*d* provides a complete listing of every possible request associated with the horizontal mill. For example, possible requests for the horizontal mill would include: cross slide advance, cross slide return, main slide advance, main slide return, spindle run, and spindle not run. In addition, other possible requests would include whole cycle, reset, first sequence, and second sequence requests to any other cycle, exclusive of the cycle depicted on the bar chart, defined subordinate to the horizontal mill in the machine tree (in this case, the spindle cycle 4434 identified in the cycle field 4426 of FIG. 44).

The bar chart editor 2962*d* gleans the axis request options directly from the axis images for the horizontal mill that were constructed using the axis editor 2962*a*. For example, referring again to FIG. 35, main slide advance and return requests were designated in boxes 3512 and 3514. The cross slide advance and return requests would have been designated when the user constructed an axis image like the one in FIG. 35 for the cross slide subassembly axis. The spindle requests would have been designated when the user constructed an axis image for the spindle axis.

Figure 46:
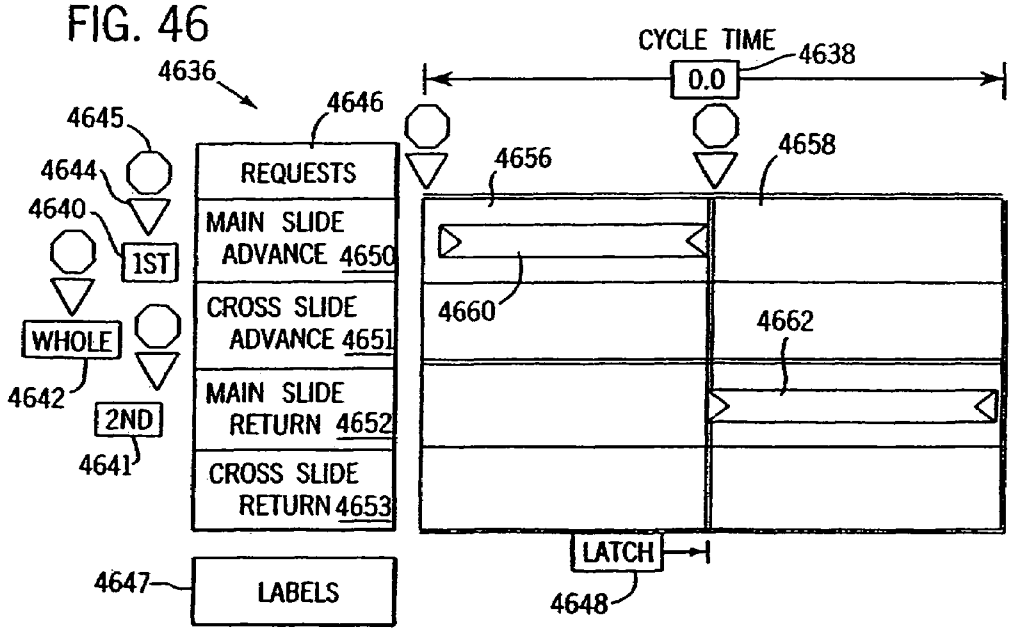

To specify a mill cycle, a user selects requests from the request menu for main slide advance, cross slide advance, main slide return and cross slide return. Each time a request is selected, the editor provides a request box 4550, 4551, 4552 or 4553 in FIG. 45 under the REQUESTS heading. In addition, referring also to FIG. 46, the editor 2962*d* provides two blank sequence boxes to the right thereof under the CYCLE TIME designation 4638, the sequence boxes divided by the LATCH designation indicating division between first and second sequences. Thus, there are two separate columns 4656, 4658 next to the request boxes 4650-4653, a first sequence column 4656 and a second sequence column 4658.

With all of the requests selected, the user begins to order the sequence of requests by selecting the box in the first sequence column 4656 corresponding to the first request in the cycle. In the present example, the sequence of requests is main slide advance, cross slide advance, main slide return and cross slide return. Therefore, the user would first select the box in the first sequence column corresponding to the main slide advance request in box 4650. The editor 2962*d* would respond by placing a bar 4660 adjacent request box 4650 in the first sequence column 4656.

Next, the user would select the box in the second sequence column corresponding to the first request in the second sequence. In the present example, the first request in the second sequence is main slide return. The user would select the box in the second sequence column 4658 corresponding to the main slide return. The editor 2962*d* then places a function bar 4662 in the selected box. At this point, the beginning requests in the first and second sequences have been identified.

Next the user must select the second requests in the first and second sequences. In the present example, the second request in the first sequence is the cross slide advance request in request box 4651. To place a function bar for the cross slide advance request, the user selects box 4651 and drags a ghost image (not shown) of the box into first sequencing column 4656. To place the cross slide advance request after the main slide advance request, the user drags the ghost image until it is clearly in the second half of the first sequence column 4656. The user then releases the ghost image. To place the cross slide advance request in front of the main slide advance request, the user would release the ghost in the first half of the first sequence column 4656. The ghost image is depicted as a cross hair to aid the user in this process.

Referring again to FIG. 45, when the ghost image is released, the editor 2962*d* divides the first sequence column into first and second columns 4564, 4565 using a vertical "done" line 4569 and provides a bar 4567 corresponding to the cross slide advance request in box 4551. In addition, the editor 2962*d* shortens bar 4560 so that bar 4560 ends where bar 4567 begins, indicating that functions related to bars 4560 and 4567 do not overlap. In other words, the function related to bar 4560 is done at done line 4569.

A function bar for the cross slide return request may be placed in the second sequence in a similar fashion, but closer inspection reveals that correct placement of the cross slice return function bar requires another technique.

In this case, the cross slide return action is expected to start as soon as the main slide reaches the intermediate cutter clear position CCP, and is expected to continue in parallel with the remainder of the main slide return action until both actions are complete. So, referring again to FIGS. 45 and 46, before a function bar for the cross slide return request can be correctly placed, it is necessary to indicate on bar chart 4636 an intermediate "done" line bisecting the extent of the main slide return function bar 4662 that represents the achievement of the cutter clear position CCP.

A bar chart editor 2962*d,* although capable of gleaning information from its functions about intermediate positions, is not capable of determining which of many such positions are needed on the display 4536, while displaying all such positions is clumsy and detracts from the overall usefulness of the display. In the preferred embodiment, a user is required to assist the editor 2962*d* by choosing, on a function by function basis, which intermediate positions in each function need to be indicated on the display 4536. This is done through a function dialog that is activated by clicking between the end triangles of a function bar with the mouse-controlled cursor.

Referring again to FIGS. 45, 46 and 35, a user first selects the bar 4562 associated with the main slide return request. A function dialog gleans information about outputs 3516 and composite positions from a control diagram 3574 of the main slide axis captured by an axis editor 2962*b*. The function dialog presents this information to a user in a list of "positions" traversed by the main slide return trajectory—initial, intermediate, and final-in chronological order of traversal. A user may select one or more intermediate, positions for display. In this case, a user indicates that the composite position "cutter clear" CCP' is needed on the display. The bar chart editor 2962*d* then creates a vertical line 4570, bisecting the main slide return function bar 4662, and splitting the second sequence column 4658 into columns 4572 and 4573.

With reference to FIG. 45, a user can select a box at the intersection of the row containing the cross slide return request box 4553 and the newly created column 4573. The bar chart editor 2962*d* then creates the cross slide return function bar 4574 in the selected box such that the leftmost end of bar 4574 meets the intermediate position line 4570 and the rightmost end of bar 4574 meets the vertical line 4576.

Initially, all functions provided on a bar chart image 4536 using the editor 2962*d* are assumed to be normal functions (i.e. can be performed in either forward or reverse directions and can be repetitively performed during manual operation in a single cycle). However, the preferred editor 2962*d* allows a user to specify non-reversible or non-repeatable functions. This is accomplished by again activating the function dialog by clicking between the end triangles of a function bar and making the appropriate selection in the function type section of the dialog. For example, by clicking bar 4567 and selecting "non-repeatable" in the function type section of the function dialog (not shown), the function associated with bar 4567 can be made non-repeatable. Similarly, a bar can be made non-reversible by activating the function dialog and selecting "non-reversible" in the function type section. A non-repeatable function is designated by a bar having the number "1" adjacent its leftmost triangle. In FIG. 45, bar 4567 is so designated. Similarly, a ">" appearing adjacent to the leftmost triangle indicates a non-reversible function (see bar 4562 ). This information is gleaned by the editor 2962 d for choosing function mapping in function modules (see FIG. 49A).

Referring to FIG. 45, as a user creates different functions on the bar chart image 4536, the editor 2962*d* creates additional stop and yield icons corresponding to various image elements. In particular, at the beginning of each separate function 4560, 4567, 4562, 4574 the editor 2962*d* provides both a stop 4545 and a yield 4544 icon above the bar chart grid. The stop 4545 and yield 4544 icons allow a user to condition functions on the completion of other functions, cycles or other system input sequences. For example, to limit the possibility of spindle damage, it may be desired to make performance of the cross slide advance request contingent upon the horizontal mill spindle being in an "on" state. Either of the stop 4545 or yield 4544 symbols can be used for this purpose.

Figure 47:
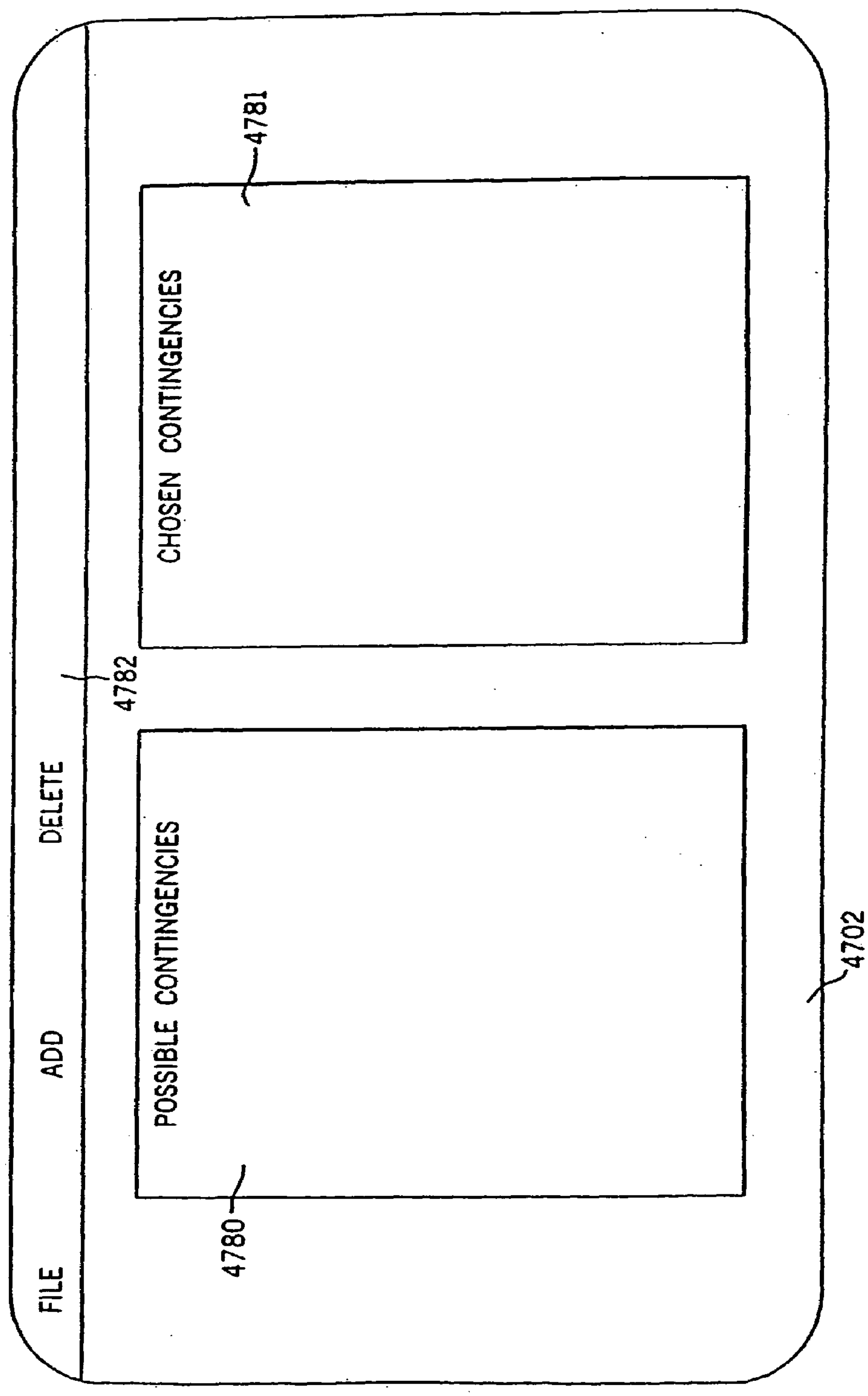
FIG. 47 is a contingency screen in accordance with a preferred embodiment.

To define contingencies for the cross slide advance request in request box 4551, a user may select yield icon 4544 which would provide a contingency screen 4574 allowing a user to add or remove contingencies from a contingency list. Referring also to FIG. 47, one embodiment of a contingency screen would include two separate fields, one field 4780 listing all possible machine contingencies. The other field, a CHOSEN CONTINGENCY field 4781, would list selected contingencies. In addition, the screen 4702 would include a menu bar 4782 allowing a user to add and delete contingencies to and from the CHOSEN CONTINGENCY field 4781. To make the cross slide advance contingent upon a spindle on state, the user selects a spindle on contingence from field 4780. The editor then adds the "spindle on" contingency to field 4781. Once a complete contingency list has been formed, the user saves the list and performance of the cross slide advance of FIG. 45 is then conditioned upon all contingencies in the list associated with yield icon 4544 being completed.

The stop symbols 4545 are similar to the yield symbols in that a list of contingencies can be formed which must be satisfied prior to continuing a sequence. However, whereas yield symbols 4544 apply only to functions beginning at the yield icon, a stop symbol 4545 applies to all functions beginning at or after the stop icon but before the end of an associated half-cycle sequence. For example, contingencies referenced in a contingency list associated with stop symbol 4545" must be met at line 4576 and at line 4569.

In addition to contingencies on functions, sometimes it is necessary to put contingencies on the performance of the first and second sequences of a cycle. This kind of contingency affects the performance of a sequence independently of the contingencies on the functions making up that sequence. In other words, these are contingencies on "cycling" a cycle.

Contingencies specified using a stop sign 4545 are conditions needed in order to initiate and continue performance of the first sequence of the cycle. In contrast, contingencies specified using a yield symbol 4544 are conditions needed only to initiate performance of the first sequence of the cycle, but are not required thereafter.

For example, a user may select yield icon 4544 associated with first sequence request 4540 causing the bar chart editor to provide a contingency screen 4574 for the first sequence. By placing a "spindle on" condition in the CHOSEN CONTINGENCY field 4781, the user makes initiation of the first sequence conditional upon the spindle being in an "on" state. This contingency is in addition to a similar, but different, contingency placed on the cross slide advance request, which is a function performed as a part of the first sequence.

Both the function and first sequence contingencies apply the same "spindle on" condition, but the meanings are different and, what's more, complementary. Sequence contingencies are used to avoid initiating, continuing, or resuming performance of a sequence of operations that have little or no hope of being completed successfully or safely. In this case, if the spindle state is not "on" when a first sequence request is made, there is little or no hope that the spindle will be "on" when the cross slide advance request requires it to be so. Specifically, the first sequence contingency avoids advancing the main slide when it is already known that the cross-slide cannot advance. This avoids unnecessary machine activity that wastes time, energy, and may require the attention of a machine operator to undo before that cycle can be restarted. Sequence contingencies specified using a stop symbol also prevent unintended "spontaneous" resumption of sequence performance and, therefore, any requested functions that may have stopped due to a related function contingency, should a required condition that was lost suddenly be rectified.

Similarly, second sequence contingencies may be specified using stop and yield symbols associated with a second sequence request icon 4541, while sequence contingencies may be specified common to both sequences using stop and yield symbols associated with whole cycle request icon 4542.

Referring again to FIG. 51, preferably, after a complete cycle has been defined using the bar chart editor 2962*d,* the editor 2962*d* gleans information for each individual function from the bar chart image 4536 and assigns buckets, start positions, and safeties to each function according to FIG. 50 attributes table 5031. Every start position is uniquely named and placed in a bucket M while every safety designated using icons 4544 or 4545 is placed in a bucket O.

Figure 52:
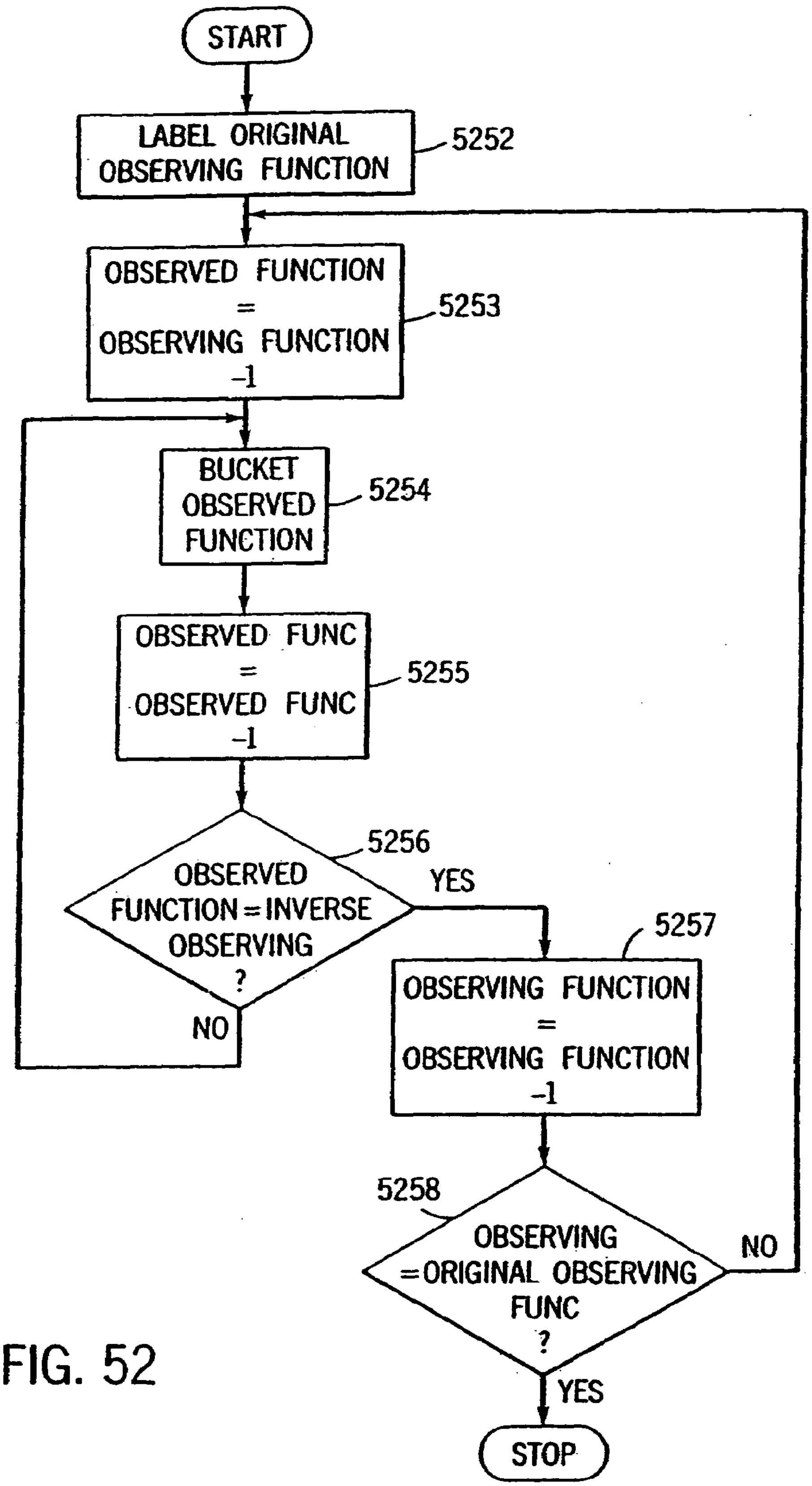
FIG. 52 is a flowchart of observed functional processing in accordance with a preferred embodiment.

Referring to FIG. 52, to assign buckets for all functions, the editor 2962*d* starts with the first function in a bar chart, labels that function an original observing function at block 5252, and works backward to bucket all other cycle functions until it reaches the inverse of the observing function. Referring also to FIG. 45, to assign buckets for functions 4560, 4567, 4562 and 4574, the editor 2962*d* would first label function 4560 the observing function. Then at block 4553, the editor 2962*d* would label the function prior to function 4560, in this case function 4574, as the observed function. At block 4554, the editor 2962*d* assigns the observed function 4574 to a bucket of the observing function 4560 according to the attributes table 5031 illustrated in FIG. 50. The bucketing process is explained below with reference to FIG. 53.

Figure 53:
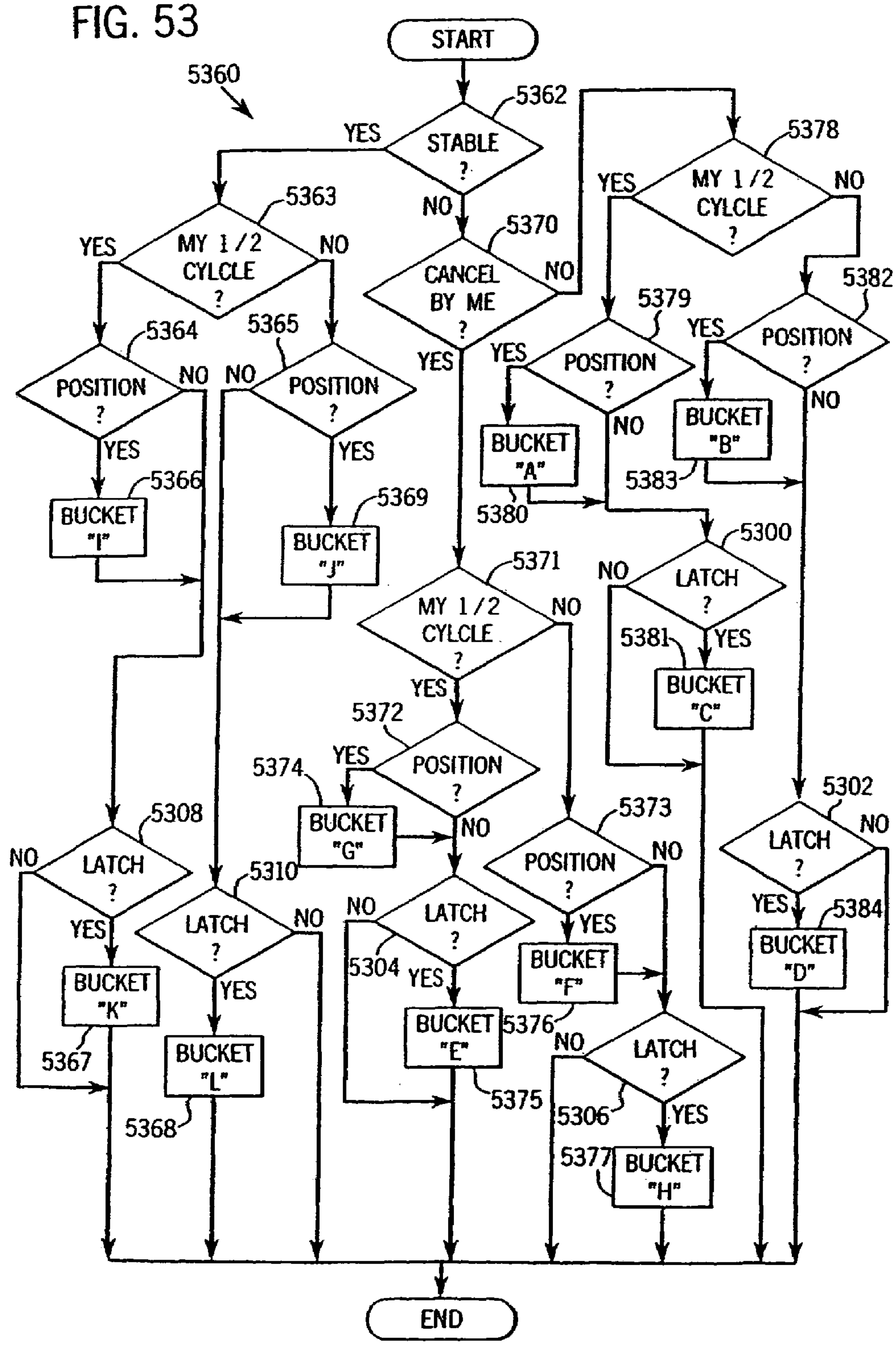
FIG. 53 is a flowchart of bucket processing in accordance with a preferred embodiment.

In FIG. 52, at block 5255, the editor 2962 d labels the function prior to the instantaneous observed function as the next observed function. In FIG. 53, function 5362 would be labeled the observed function. At decision block 5256 the editor 2962*d* determines if the observed function 5362 is the inverse of the observing function 5360. Where the observing function 5362 is not the inverse, the editor 2962*d* returns to block 5254 and buckets the observed function. The editor 2962*d* repetitively cycles through blocks 5254-5256 until the observed function is the inverse of the observing function.

In a preferred embodiment, the observed function 5362 is the inverse of observing function 5360 and therefore, at decision block 5256, the editor 2962*d* branches to block 5257 and labels the function prior to the instantaneous observing function as the observing function. In the present case, function 4574 would be labeled the observing function. At decision block 5258, the editor 2962 d determines if the observing function is the original observing function. If this condition is met, the editor 2962*d* stops the bucketing process. If the observing function is not the original observing function, the editor 2962*d* passes control back up to block 5253 and begins the process over again. Thus, the editor 2962*d* assigns to buckets all of the needed required functions for every function in a cycle.

Referring now to FIG. 53, the bucketing process of block 5254 is illustrated as process 5360. To bucket an observed function, the editor 2962*d* first determines whether or not the observed function is stable relative to the observing function at decision block 5362.

Where the observed function is not stable, the editor 2962*d* determines if the observed function is canceled by the observing function or canceled by some other function at decision block 5370. Where the next function is canceled by some other function, the editor 2962*d* next determines whether or not the observed function is in the same half-cycle as the observing function at block 5378. Where the observed function is in the same half-cycle as the observing function, at decision block 5379 the editor 2962*d* determines whether or not the observed function incorporates a position or a latch. Where the observed function incorporates a position, at block 5380 the editor 2962*d* buckets the observed function as type A. Referring also to FIG. 49*a,* assigning a function to a bucket entails placing a unique name for the function in the appropriate list in the module list specification section 2342 of the function template 2336 associated with the observing function. In this case, where a function is placed in bucket A, the function is unstable, is canceled by the observing function, is in the same half-cycle as the observing function and incorporates a position and therefore would be placed in module list specification. Similarly, as other functions are assigned to buckets, they are placed in other lists in the module list specification section 2342.

After blocks 5379 and 5380, at block 6000 the editor 2962*d* determines if the observed function incorporates a latch. Note that a function can incorporate both a latch and a position. Where the observed function is not stable, is canceled by a function other than the observing function, is in the same half-cycle as the observing function and incorporates a latch, at block 5381 the editor 2962*d* assigns the observed function to bucket C.

Referring again to decision block 5378, where the observed function is not stable, is canceled by a function other than the observing function, and is not in the same half-cycle as the observing function, the editor 2962*d* passes control to decision block 5382 to determine whether or not the observed function incorporates a position. Where the observed function incorporates a position, the editor 2962*d* assigns the observed function to bucket B at block 5383. At blocks 6002 and 5384, where the observed function incorporates a latch, the editor 2962*d* assigns the observed function to bucket D.

Referring again to decision block 5370 where the observed function is not stable but is canceled by the observing function, the editor 2962*d* passes control to decision block 5371 and determines whether or not the function is in the same half-cycle as the observing function. Where the observed function is in the same half-cycle as the observing function, the editor 2962*d* determines whether or not the observed function incorporates a position or a latch at decision block 5372. Where the observed function incorporates a position, the editor 2962*d* assigns the observed function to bucket G at block 5374. Where the observed function incorporates a latch, the editor 2962*d* assigns the function to bucket E at blocks 6004 and 5375.

Referring again to decision block 5371, where the observed function is not stable, is canceled by the observing function, and is in the half-cycle opposite the observing function, the editor 2962*d* passes control to decision block 5373 to determine whether or not the observed function is a position. Where the observed function incorporates a position, the editor 2962*d* assigns the function to the F bucket at block 5376 and where the observed function incorporates a latch the editor 2962*d* assigns the function to bucket H at blocks 6006 and 5377.

Referring once again to decision block 5362, where the observed function is stable, the editor 2962*d* determines whether or not the observed function is in the same half-cycle as the observing function at decision block 5363. Where the observed function is in the same half-cycle as the observing function the editor 2962*d* determines whether or not the observed function incorporates a position at block 5364. Where the observed function incorporates a position, the editor 2962*d* assigns the function to bucket I at block 5366. Where the observed function incorporates a latch the editor 2962*d* assigns the function to bucket K at blocks 6008 and 5367.

Referring again to decision block 5363, where the observed function is stable and is in the half cycle opposite the observing function the editor 2962*d* determines whether or not the observed function incorporates a position at block 5365. Where the observed function incorporates a position, the editor 2962*d* assigns the function to bucket J at block 5369. Where the observed function incorporates a latch the editor 2962*d* assigns the function to bucket L at blocks 6010 and 5368.

Figure 49B:
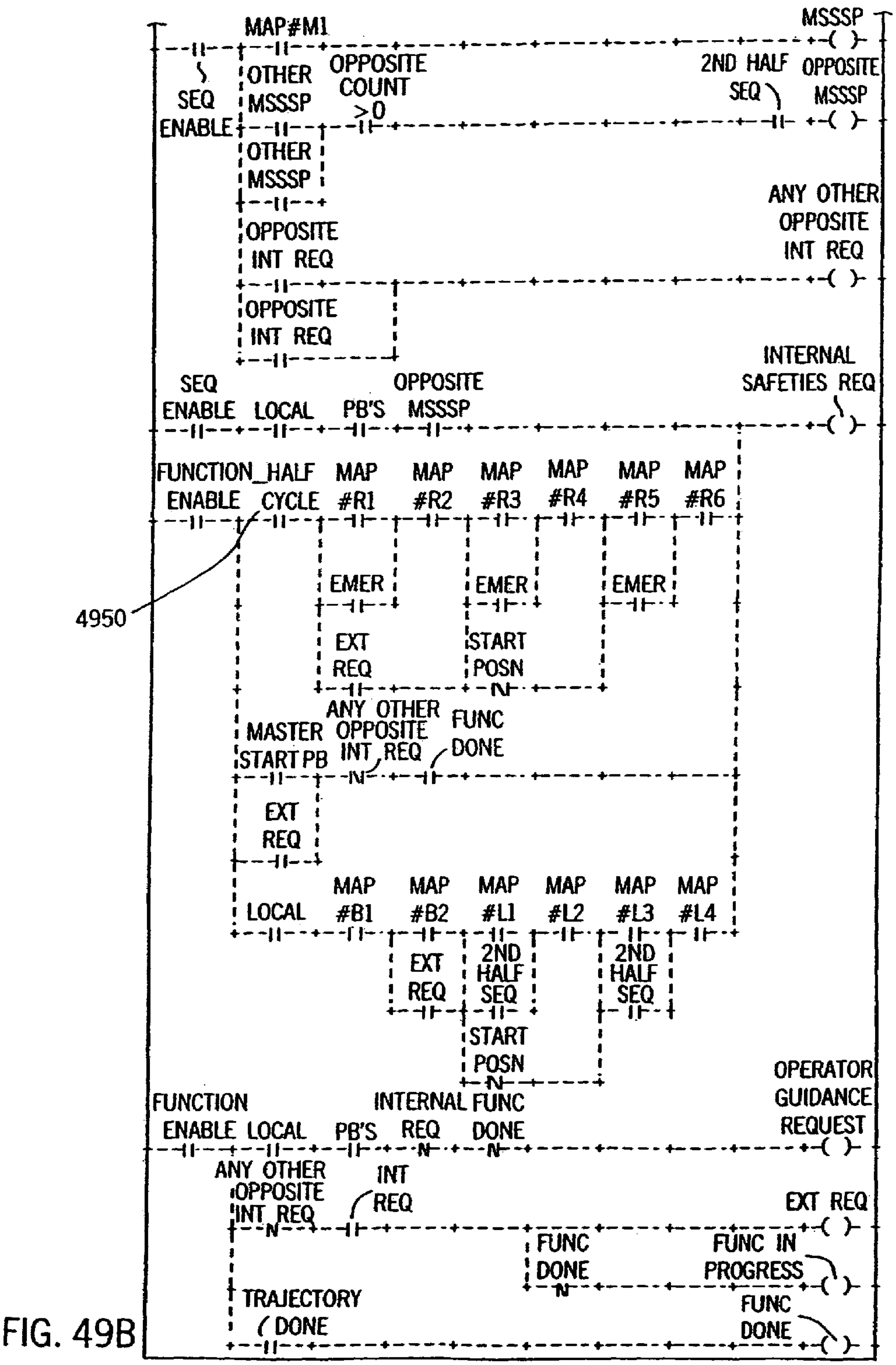

After all of the necessary functions in a cycle have been assigned to buckets and added to appropriate lists by the editor 2962*d*, the editor also gleans from the control diagram 4536 in FIG. 45 which half-cycle the function is in. Referring to FIG. 49B, this information is used to label contact 4950. In addition, this information is used at compile time with the XPO and XPC pseudoinstructions as explained above.

After a user completes the bar chart for the mill cycle including request designation, proper bar sequencing and proper contingency designations, the user must then go back to the control panel editor 2962*c* and select the next cycle to be defined. Referring to FIG. 44, in the present example the user selects the spindle icon 4434 and reenters the bar chart editor 2962*d* to define the spindle cycle. The spindle cycle would include two requests, a "spindle on" request and a "spindle off" request. The spindle on request would constitute the first sequence and the spindle off request would constitute the second sequence. As with the mill cycle, the user would construct a complete bar chart like the one in FIG. 45, including requests, bars and contingencies for the spindle cycle. During construction, the editor 2962 d would continue to glean information required to populate modules and create new modules and to assign buckets as described above.

After complete bar charts have been constructed for each cycle identified in CYCLE field 4426, if desired, the user can then define manual control devices and tie those devices to specific requests in the bar charts.

In accordance with the example, it will be assumed that a user requires four separate manual push buttons on the horizontal mill control panel, one button each for the main and cross slide advance requests and one button each for the main and cross slide return requests. While buttons could be included for the spindle on and spindle off requests, for the purposes of this explanation it will be assumed that they are not needed. To define a push button for the main slide advance request, the user selects the CONTROLS option from menu bar 4422 which would provide a complete list of all requests associated with the cycles identified in the CYCLE field 4426. In the horizontal mill example, the request list includes "main slide advance", "main slide return", "cross slide advance", "cross slide return", "spindle on", "spindle off", and "whole cycle", "first sequence" and "second sequence" requests for both the mill and spindle cycles. To designate a main slide advance button the user selects the main slide advance request from the list. The editor 2962*c* then provides a button icon 4486 labeled "main slide advance".

In a similar fashion, the user selects the CONTROLS option three more times, each time selecting a different possible request, the three selected requests being "cross slide advance", "main slide return" and "cross slide return". Each time a different request is selected, the editor 2962*c* provides a new icon 4487, 4488, 4489 labeled accordingly. At this point all of the manual control buttons have been defined and associated with different requests.

To define indicator lights, the user selects the LIGHTS option from bar 4422. The editor 2962*c* provides a list of possible limiting positions associated with the requests in the mill and spindle cycles. The user selects a limiting position and then the editor 2962*c* provides an associated light icon. In FIG. 44, two light icons are illustrated, one 4492 for the main slide return and another 4494 for the cross slide return.

As with the machine 2962*a* and axis 2962*b* editors, while a user is constructing a control panel image and corresponding bar chart images using the control panel 2962*c* and bar chart 2962*d* editors, the editors 2962*c* and 2962*d* are simultaneously gleaning information from the images to further develop the template-based machine tree according to the process shown in FIG. 32. Thus, additional modules are created and existing modules are populated until all required images have been completed.

With all of the modes, manual control and indicator light devices defined and all of the cycles corresponding to the horizontal mill defined, the editors have all the information required to provide LL logic to control the horizontal mill. To provide information required for all of the machine components, the user would step through editing with the axis 2962*b*, control panel 2962*c*, and bar chart 2962*d* editors for all machine components.

Figure 48:
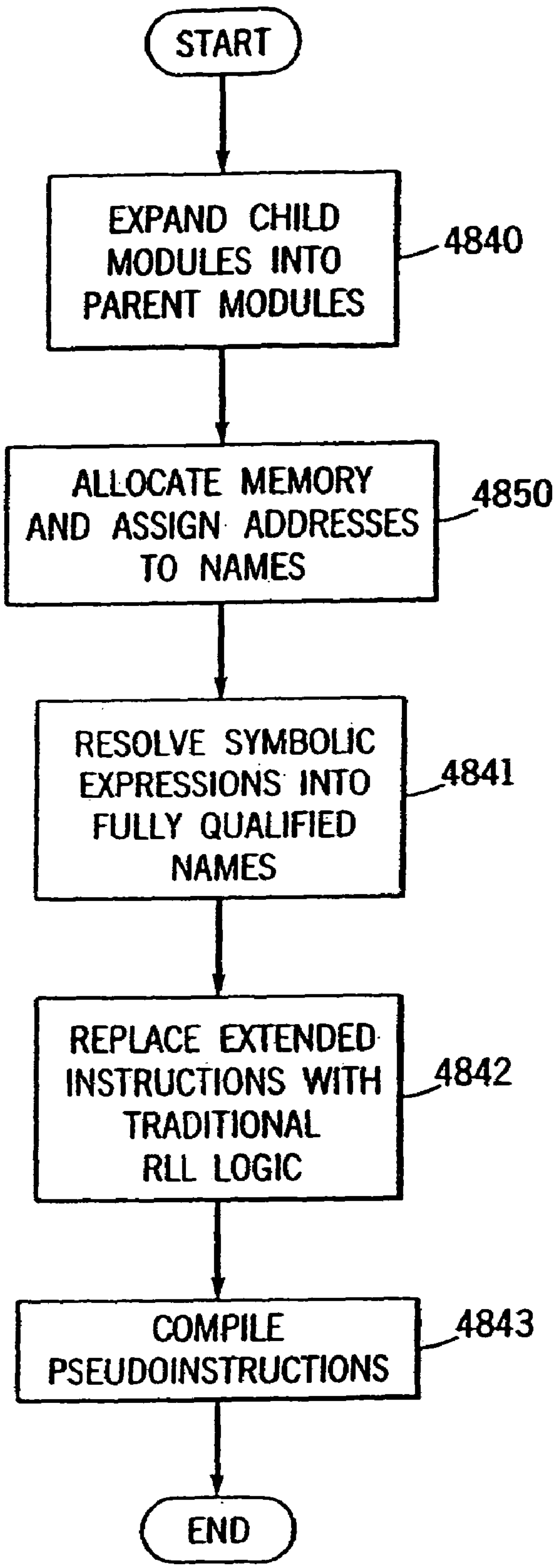
FIG. 48 is a flowchart detailing the logic associated with compilation in accordance with a preferred embodiment.

After all required physical and operational characteristics of machine components are completely defined using the editors described above, the user would instruct the programming terminal to compile the entire template tree. Compilation is relatively simple and is depicted in FIG. 48. Initially, at block 4840, the compiler expands all child modules into specifications in parent modules. For example, referring again to FIGS. 23 and 24, the master control panel module 2406 is placed in the machine module 2398 where the master control panel is referenced at 2300. Similarly, all axis modules (herein the module name "air") are expanded into the machine module 2398 in place of the module list specification named Axis 2302 and all indexer modules (herein the module named "T1") are expanded into the machine module 2398 in place of the module list specification named Indexer 2304. The compiler works its way through the entire template-based machine tree, including portions provided by the axis 2962*b*, control panel 2962*c* and bar chart 2962*d* editors until all child modules have been expanded into their referencing parent modules.

In FIG. 48, at block 4850 the compiler allocates programmable controller memory for the modules and assigns memory addresses to fully qualified names defined by data definition statements in the modules. Next, at process block 4841, the compiler resolves the symbolic expressions into fully-qualified names. For example, a symbolic expression for a push button of a master control panel may be "$.MasterStartPB". In the present example, this symbolic expression would expand into the fully qualified name "AB1.MasterControlPanel.MasterStartPB". Similarly, the left horizontal work-unit of the fourth station in the present example would have the fully qualified name "AB1.T1.S4.LH" wherein LH stands for "left horizontal", S4 for "the fourth station", Ti for "the transfer" and AB1 for "the machine" generally.

After all the symbolic expressions have been expanded into fully qualified names, at block 4842 the extended instructions such as AND and OR lists are replaced with LL logic. Thus an AND list macro corresponding to a list including ten entries will be replaced by a ten contact series set of LL instructions, each contact corresponding to a different list entry. Similarly, OR list macros would be replaced with a set of LL instructions expanded in parallel.

Next, at block 4843 the compiler would compile pseudo-instructions XPC, XPO and OTX, removing LL logic from some LL rungs and expanding logic in others depending on job specific requirements. After block 4843, all that remains is a control program consisting entirely of conventional LL logic that can be used by a programmable logic controller to control the industrial process of a machine.

It should be appreciated by those of ordinary skill in the art that the description herein is given only by way of example and that various modifications and additions might be made, while still coming within the scope of the invention. In particular, while the present template-based language has been developed for use in LL programming, other template-based languages could be developed for use with other industrial controller programming languages such as state diagram programming. The important aspect of the present language is not that it relates to LL, but rather the realization that extensions to normal programming language logic itself in conjunction with extensions that are separate from the language logic can be used to provide truly reusable programming logic that can be tailored to job-specific requirements. In addition, while the exemplary template set detailed above was specifically designed for the metal removal industry, it is anticipated that other template sets that account for industry specific idiosyncrasies will be developed for other industries, and the present invention is meant to cover all other such template sets.

Moreover, while the description above described how computer editors can act as interfaces to facilitate programming, it is contemplated that a user could construct a template-based machine tree and compile a program without the use of a computer editor. In other words, using a template set, a user could designate and populate modules by hand and then compile the modules as in FIG. 48.

Furthermore, while preferred editors are described herein, any type of computer editor could be used to aid a user in programming using the template language. The important aspect of any editor is that the editor allow the user to input information from which the editor can glean a subset of information required to designate and populate required modules. In addition, while the present invention is described in the context of four editors, the inventive template language could be used with more special editors provided for specific applications or in the alternative, one editor could be used separately to provide LL logic for a single portion of a machine tree.

Visualization of Schematics

The Designer Studio also utilizes the ECDB to ascertain typed connections (electrical, pneumatic, network, . . . ) within a control assembly or interfacing from/to a Control Assembly. This visualization enables a user to clearly see disparities between the connections improving the integrity of the resultant system.

Bill of Materials

The system also supports detailed bill of material information visualization. Controlled Resources contain properties of the resource controlled by the control assembly that place requirements (i.e., add constraints) on the structure of the assembly that facilitate more precise renderings of the enterprise control system.

For example, a clamp1 controlled resource has a safety constraint which requires a failing clamp to always fail in the open position.

Requests or Conditions

A request for an operation (optionally with confirmation) or request for a status of the external world determines how to handle complicated actions (initialization, robot protocols, . . . ). For example, to determine if a part is present, control logic must be defined to SensePart with a request status returned to unambiguously determine if a part has been sensed or not.

The placement of the timing chart and the control request bar chart in proximal position facilitates an optimal user experience. Automatic ordering of control commands based on the prescribed order from a timing diagram is a unique and powerful feature in accordance with a preferred embodiment.

EC Integration with External Data Models (Re)Use resources created within the mechanical modeling environment to determine the Mechanical Resources that need to be controlled.

Transform the process description (i.e., sequence of activities that the resources perform) to a timing diagram.

EC Control System Design

Provides catalog of reusable control sub-system components: Control Assembly™ Type (see below for what is in a control assembly)

Allows user to create Control Assemblies™ that correspond to frequently used control subsystem design patterns.

Allows user to sequence the Requests of Control Assembly Instances (i.e., Request/Timing Diagram)

Allows user to connect the Control Assembly Instances electrically, pneumatically, and hydraulically (i.e., "control system-wide schematic")

Allows user to configure exceptional behavior (e.g., manual emergency power recovery).

Allows user to layout HMI

EC Simulation

Visualization the LL execution

Visualization the current step(s) the machine is waiting on

Visualization the "control process", i.e., animate the Timing Diagram

Use generated code via SoftLogix to animate in 3-D the workcell machines that simulate the process and the subsequent creation of the product Note: in EC all these simulations run off the same data model.

EC Control System Implementation

Bill of materials (from RS Wire Schematics)

Make control system bill of materials and control system process available to the Machine and Process designers (i.e., export to CNext)

Code generation

Diagnostics Generation

HMI (Visualization) Generation

EC Control System Maintenance

Diagnostics

Keeping control system design consistent with Product, Process, and Machine Design Password protect to provide restricted access to LL and the capability to record and changes that are made to the LL that must be reengineered into the design.

In an enterprise control system in accordance with a preferred embodiment a user must first abstract enterprise activities that are utilized to assemble parts into their basic steps. No machine or control resources are necessary for this definition process. An example in accordance with a preferred embodiment will be utilized to illustrate this process. To weld a part of a car door assembly together, a part must be loaded, the second part of the door must be loaded (clamped), the first welding operation is performed and the second welding operation is performed. Finally, the welded door assembly is unloaded and transported to its next station.

Conversion of CATIA Activities Data to/from Timing Diagrams

Overview

Rockwell Automation and Dassault Systems are collaborating on a set of tools to design and implement production machinery. This collaboration involves storing both structural information and process information in Dassault's CNext product line. Dassault Systems uses a different model to store process information in CNext than is used in Rockwell Automation's Control Designer Studio. In order to exchange data between Dassault and Rockwell, a Data Interchange File Format has been negotiated. Each company is responsible for converting between its own data stores and the Data Interchange File Format. This document describes the conversion between the Data Interchange File Format and Rockwell's Virtual Control Model database.

Data Interchange Format

The Data Interchange File Format consists of a text file containing only ASCII text divided into lines. Each line is either blank, or it contains one of the keywords (Activities, ActivityResources, ActivityPredecessors, ActivityAttributes, StructuralComponents) or it contains a series of comma-separated data fields appropriate to the preceding keyword. The document defining the fields and their formats follows:

StructuralComponents

StructuralComponentID, PartOf, WorkcellID, Label, Class
string, string, string, string, string
12345, 0, 1, Esl, Support
23456, 12345, 1, Clampset1, Clampset -continued Activities ActivityID, ParentActivityID, ActivityLabel, ActivityType, ActivityDuration
string, string, string, string, numeric ActivityResources ActivityID, StructuralComponentID
string, string ActivityPredecessors ActivityID, PredecessorActivityID
string, string ActivityAttributes ActivityID, AttributeKey, AttributeValue
string, string, string
(a blank line ends one table and begins another)
(there may be as many sections as needed, and the same table may appear several times in a file)

Importing into Virtual Control Model

In the interests of modularity, the function of importing data from this text file into the Rockwell VCM has been split into 2 steps. In the first step, the text file is parsed and an intermediate text stream of SQL statements is created. In the second step, the stream of SQL statements is executed against the VCM database.

Parsing the Input File

The file parsing tool is a Perl script which implements a state machine with the 2 states READ_TABLE_NAME and READ_DATA. It begins in state READ_TABLE_NAME, in which it reads lines of input (ignoring blank lines) until it finds one of the valid keywords. When it finds a keyword, it sets up the expected names and types of data to follow and switches to state READ_DATA. If what it finds is not a valid keyword, it exits after logging an error.

In the READ_DATA state the tool reads successive lines of data, checks for the expected number of fields, and emits one SQL statement for each line read. The SQL statements are all INSERT statements, each inserting one row of data into the correspondingly-named table in the VCM database. When the tool reads a blank line, it changes state to READ_TABLE_NAME. End of file terminates the tool.

ODBC Tool

The tool that executes SQL statements against a database is a Perl script employing the Win32::ODBC extension. It is invoked from the command line with an argument specifying the name of the ODBC data source to be opened. Then it reads its standard input for SQL statements, each of which is executed in turn, and the success or failure of each statement is checked. If any statement fails, the entire process terminates and an error message is logged. After all statements have been executed, the data source is closed and the process terminates.

Conversion to Timing Diagrams

After execution of the preceding processing, the data from the Interchange File resides in a set of intermediate tables in the VCM database. Further processing is required to convert them to the format used by Rockwell's tools to display Timing Diagrams to the user. All of this processing is carried out in a single tool, because it is interrelated, with later steps depending on the results of earlier steps. The processing begins with establishment of an ODBC connection to the VCM data source. An SQL query is executed to Find all top level Activities (usually only one).

Timing Diagram creation

A Timing Diagram is created for the specified Activity, using the Create a Timing Diagram query.

Edge Creation

Every Timing Diagram has at least one Edge, the left Edge. The Create an Edge query is executed to create the left Edge.

Request Creation

The Find all Requests on this Timing Diagram query is executed to identify Activities that will map to Requests. Then the Create a CNextRequest query is used for each of the Requests. For each Request, running a Count subsidiary Activities query determines if this Request requires a subsidiary Timing Diagram. If it does, BarChart creation, Edge creation, and Request creation are called recursively. This will go on until there are no more subsidiary Activities detected. After a subsidiary Timing Diagram has been created, it is necessary to execute Update SubBarChartID in CNextRequest.

Associating Requests with Edges

After all the Activities on a Timing Diagram have been created, they must be organized by relating them to Edges. As many Edges will be created as are needed to organize all the Requests on the Timing Diagram. The processing begins with executing Find all Requests on left Edge of Timing Diagram. Then, for each Request found, Update LeftEdge of Requests with no Predecessors is executed. At this point Create an Edge can be executed to create the new right Edge. Following this a loop is executed, where each iteration begins with executing Find all Requests for next Edge and continues by executing Update LeftEdge of other Requests and Create an Edge if any Requests were found. The loop terminates when no more Requests can be found.

SQL Queries

All of the database processing is carried out by executing SQL statements under control of a script or program. This guarantees portability of the processing between different database servers. The queries are described in the following sections. The words beginning with $ are variables that are substituted into the queries before they are executed. Most of the queries are self-explanatory, but the more complex ones are accompanied by textual clarification.

```
  Find all top level Activities
SELECT * FROM Activities WHERE ParentActivityID = '0'
  Create a Timing Diagram
INSERT INTO BarCharts
    (BarChartID, BarChartStrng, BarChartDescr, ModeID)
    VALUES ($BarChartID, '$barChartStrng', 'From CATIA', 1)
  Create an Edge
INSERT INTO Edges (EdgeID, EdgeNum, BarChartID)
    VALUES ($EdgeID, $edgeCount, $BarChartID)
  Find all Requests on this Timing Diagram
SELECT * FROM Activities WHERE ParentActivityID =
'$ParentActivityID'
    Activities give rise to both BarCharts and CNextRequests, depending
on their position in the hierarchy. A top level (parentless) Activity is
always a BarChart, and a lower level Activity is always a Request, but if
the lower level Activity has children, it will give rise to a subsidiary
BarChart as well as a Request.
  Create a CNextRequest
INSERT INTO CNextRequests
    (RequestID, LeftEdge, BarChartID, RequestOrder, Activity,
Resources, SubBarChartID)
    VALUES ($RequestID, 0, $BarChartID, 0, '$activityID', NULL, 0)
  Count subsidiary Activities
    SELECT COUNT(*) AS ChildCount FROM Activities
    WHERE ParentActivityID = '$activityID'
  Update SubBarChartID in CNextRequest
    UPDATE CnextRequests
    SET SubBarChartID = $newBarChartID
```

-continued

```
WHERE RequestID = $RequestID
  Find all Requests on left Edge of Timing Diagram
    SELECT * FROM Activities
    WHERE Activities.ParentActivityID = '$ParentActivityID'
    AND NOT EXISTS (SELECT * FROM ActivityPredecessors
    WHERE Activities.ActivityID = ActivityPredecessors.ActivityID)
    This query may be paraphrased as "select those Activities belonging
to this BarChart and lacking a predecessor Activity".
  Update LeftEdge of Requests with no Predecessors
    UPDATE CnextRequests
    SET LeftEdge = $edgeID
    WHERE CNextRequests.Activity = '$ActivityID'
  Find all Requests for next Edge
    SELECT R2.RequestID
    FROM CNextRequests AS R1, CNextRequests AS R2,
    ActivityPredecessors AS AP1
    WHERE R1.LeftEdge = $oldEdge
        AND AP1.PredecessorActivityID = R1.Activity
        AND R2.Activity = AP1.ActivityID
This query may be paraphrased as "select those Requests whose
predecessor Activity mapped to a Request linked to the preceding Edge".
  Update LeftEdge of other Requests
    UPDATE CnextRequests
    SET LeftEdge = $edgeID
    WHERE CNextRequests.RequestID = $RequestID
  Select BarChart for export
    SELECT * FROM [BarCharts] WHERE BarChartID = $BarChartID
  Create Ordered Edge List
    SELECT * FROM Edges
    WHERE BarChartID = $BarChartID
    ORDER BY Edges.EdgeNum
  Select Requests for export
    SELECT * FROM Requests
    WHERE Requests.LeftEdge = $EdgeID
    ORDER BY Requests.RequestOrder
  Lookup Request Attributes
    SELECT ControlAssemblyInstances.Label AS InstanceLabel,
        DCCActions.Label AS ActionLabel,
        DCCElementsTimes.Time
    FROM Requests,
        ControlAssemblyInstances AS Cai,
        DCCActions,
        DCCElementsTimes
    WHERE Requests.RequestID = $RequestID
AND Requests.ControlAssemblyInstanceID =
Cai.ControlAssemblyInstanceID
        AND DCCActions.DCCActionsID = Requests.DCCActionsID
        AND DCCElementsTimes.DCCActionsID =
        Requests.DCCActionsID
```

The first step in designing a control system utilizing an enterprise system in accordance with a preferred embodiment is presented below. The example from an actual car manufacturing station for a rear quarter panel assembly is utilized to assist one of ordinary skill in the art to make and use a preferred embodiment without undue experimentation.

A control engineer initiates the Rockwell Automation Enterprise Controls Designer Studio in accordance with a preferred embodiment to initiate the process. The engineer creates a new project by selecting the new project and gives it an appropriate name, like NEWPROJECT. This activity causes the system to load the machine resources that require control to be loaded from the existing CAD database. A process description is also loaded from the existing CAD database.

Data Conversion to/from the ECDB

One of the key tasks in creating an Enterprise Control Database (ECDB) is the creation of a uniform set of data structures and a set of mapping procedures to take data from disparate sources and import it into the ECDB. Some of these data sources include structural information (CAD models, etc.) and process information. In accordance with a preferred embodiment moves data into the ECDB and creates a Data Interchange File Format (DIFF) file, and then use tools that can populate a set of database tables from information in the DIFF.

The ECDB also supports the export of data in a variety of formats than can then be used to generate input to a variety of design analysis and synthesis tools, such as Rockwell Automation's Control Designer Studio or Dassault's CNext process modeling system.

The Data Interchange File Format consists of a text file containing only ASCII text divided into lines. Each line is either blank, contains one of the keywords, or contains a series of comma-separated value (CSV) data fields appropriate to the preceding keyword. Because of the flexibility of CSV, the number of fields and their formats will grow over time to allow very rich structure.

The currently supported table keywords are: (Activities, ActivityResources, ActivityPredecessors, ActivityAttributes, StructuralComponents). These tables are defined below, where the nth element of the "ColumnValues" list is the storage format of the table column whose name is the nth element of the "ColumnNames" list. The table definitions follow:

Table=StructuralComponents
ColumnNames=StructuralComponentID,PartOf,WorkcellID, Label,Class
ColumnValues=string,string,string,string,string
Table=Activities
ColumnNames=ActivityID,ParentActivityID,ActivityLabel, ActivityType,ActivityDuration
ColumnValues=string,string,string,string numeric
Table=ActivityResources
ColumnNames=ActivityID,StructuralComponentID
ColumnValues=string,string
Table=ActivityPredecessors
ColumnNames=ActivityID,PredecessorActivityID
ColumnValues=string,string
Table=ActivityAttributes
ColumnNames=ActivityID,AttributeKey,AttributeValue
ColumnValues=string,string,string This file format supports an arbitrary number of database tables. The format is to be interpreted as follows:

A blank line ends one table and begins another

The first non-blank line after a blank line denotes the table name

Subsequent non-blank lines denote data in CSV format

There may be as many sections as needed, and the same, table may appear several times in a file. An example DIFF is shown below, with keywords highlighted in bold:

StructuralComponents
12345,0,1,Esl,Support
23456,12345,1,Clampset1,Clampset
Activities
12345,4367,Load,45
ActivityResources
12345,23456
ActivityPredecessors
Clampset1,Clampset 2
ActivityAttributes This file format is illustrative only. Extensions (via additional columns) can be added to particular database tables, and new tables added, to support such concepts as Interlocks (triggering events) and Safeties (enabling events).

In the interests of modularity, the function of importing data from the DIFF into the ECDB has been split into two steps. In the first step, the DIFF file is parsed and an intermediate text stream of SQL statements is created. In the second step, the stream of SQL statements is executed against the ECDB database.

Step 1: Parsing the DIFF and generating SOL

The file parsing tool has been implemented as a Perl script which implements a state machine with the two states READ_TABLE_NAME and READ_DATA. Execution of the Perl script begins with the program in state READ_TABLE_NAME, in which it reads lines of input (ignoring blank lines) until it finds a keyword. If the keyword is not a member of the valid keywords, the program logs an error and exits. Otherwise, after finding a valid keyword, the script program initializes a number of variables that define the expected names and types of data to follow. The program then switches to state READ_DATA.

In the READ_DATA state the tool reads successive lines of data, checks for the expected number of fields, and emits one SQL statement for each line that has been read from the DIFF. The SQL statements are all INSERT statements, each inserting one row of data into the correspondingly-named table in the ECDB.

When the Perl script program reads a blank line, it changes its state back to READ_TABLE_NAME.

Reading an End of File (EOF) terminates execution.

Step 2: Executing the stream of SQL statements against the ECDB

The tool that executes SQL statements against a database is a Perl script employing the Win32::ODBC extension. It is invoked from the command line with an argument specifying the name of the ODBC data source to be opened. Then it reads its standard input for SQL statements, each of which is executed in turn, and the success or failure of each statement is checked. If any statement fails, the entire process terminates and an error message is logged. After all statements have been executed, the data source is closed and the process terminates. The standard input stream for this program is usually the standard output of the Perl program of Step 1 above.

For each SQL query attempted, the program checks the return status. If the return status is an error state, the program returns the error text and terminates. Otherwise, the program terminates when all SQL statements have been successfully executed against the ECDB.

At this point, the data has been successfully placed in the Enterprise Database in a canonical format, and can now be accessed by a variety of tools. In general, data translation is required from the ECDB internal format to a format that is acceptable to a specific tool. For example, Rockwell's Designer Studio program uses a format called Timing Diagrams to denote the activities performed by resources and bar charts to denote the requests made to the resources.

Conversion from ECDB to Timing Diagrams

The processing required for exporting data from the ECDB in a format compatible with Rockwell's tools to display Timing Diagrams to the user is described. All of this processing is carried out utilizing a single tool that processes the results of earlier steps. The processing begins with establishment of an ODBC connection to the ECDB data source. A SQL query is executed to Find all top level Activities (usually there is only one).

Timing Diagram creation

A Timing Diagram is created for the specified Activity, using the Create a Timing Diagram query. Code in Perl is shown below for converting information from CATIA process description to a timing diagram for use by the ECDB.

```
# prepare connection to Machine Resource DB
$db = new Win32::ODBC("VCM") || die $!;
# prepare connection to Machine Resource DB
$db = new Win32::ODBC("VCM") || die $!;
=head2 mainline
#for each parentless Activity CreateBarChart recursively
=cut
my $query = "SELECT * FROM Activities WHERE Activities.ParentActivityID = '0'";
my(@rows) = ( );
if (! $db->Sql($query))
{
  # read the entire set of rows
  while ($db->FetchRow( ))
  {
    # store result as a list of hashes
    push @rows, {$db->DataHash( )} ;
  }
}
else
{
  ReportSQLError($query);
}
# iterate through the array of rows, with no further DB access
my $row;
for each $row (@rows)
{
  &CreateBarChart($row->{"ActivityLabel"} , $row->{"ActivityID"} );
}
$db->Close( );
# end of mainline
#for each parentless Activity CreateBarChart recursively
=cut
my $query = "SELECT * FROM Activities WHERE Activities.ParentActivityID = '0' ";
my(@rows) = ( );
if (! $db->Sql($query))
{
  # read the entire set of rows
  while ($db->FetchRow( ))
  {
    # store result as a list of hashes
    push @rows, {$db->DataHash( )} ;
  }
}
else
{
  ReportSQLError($query);
}
# iterate through the array of rows, with no further DB access
my $row;
foreach $row (@rows)
{
  &CreateBarChart($row->{"ActivityLabel"} , $row->{"ActivityID"} );
}
$db->Close( );
# end of mainline
```

Edge Creation

Every Timing Diagram has at least one Edge, the left Edge. The Create an Edge query is executed to create the left Edge. A summary of the steps in the actual execution code follows:

3. CreateBarChart
4. CreateEdge
5. for each Activity with this parent
6. CreateCNextRequest
7. find Activities with this parent with no ActivityPredecessors
8. AssignLeftEdge
9. CreateEdge
10. while any unassigned Activities with this parent remain
11. for each ActivityPredecessor pointing to any Activity on previous edge
12. AssignEdge
13. CreateEdge
14. return BarChartID Request Creation The Find all Requests on this Timing Diagram query is executed to identify Activities that will map to Requests. Then the Create a CNextRequest query is used for each of the Requests. For each Request, running a Count subsidiary Activities query determines if this Request requires a subsidiary Timing Diagram. If it does, BarChart creation, Edge creation, and Request creation are called recursively. This will go on until there are no more subsidiary Activities detected. After a subsidiary Timing Diagram has been created, it is necessary to execute Update SubBarChartID in CNextRequest.

Associating Requests with Edges

After all the Requests on a Timing Diagram have been created, they must be organized by relating them to Edges. As many Edges will be created as are needed to organize all the Requests on the Timing Diagram. The processing begins with executing Find all Requests on left Edge of Timing Diagram. Then, for each Request found, Update LeftEdge of Requests with no Predecessors is executed. At this point Create an Edge can be executed to create the new right Edge. Following this a loop is executed, where each iteration begins with executing Find all Requests for next Edge and continues by executing Update LeftEdge of other Requests and Create an Edge if any Requests were found. The loop terminates when no more Requests can be found.

Export of Timing Diagrams

SQL Queries

All of the database processing is carried out by executing SQL statements under control of a script or program. This guarantees portability of the processing between different database servers. The queries are described in the following sections. The words beginning with $ are variables that are substituted into the queries before they are executed. Most of the queries are self-explanatory, but the more complex ones are accompanied by textual clarification.

```
  Find all top level Activities
SELECT * FROM Activities WHERE ParentActivityID = '0'
  Create a Timing Diagram
INSERT INTO BarCharts
    (BarChartID, BarChartStrng, BarChartDescr, ModelD)
    VALUES ($BarChartID, '$barChartStrng', 'From CATIA', 1)
  Create an Edge
INSERT INTO Edges (EdgeID, EdgeNum, BarChartID)
    VALUES ($EdgeID, $edgeCount, $BarChartID)
  Find all Requests on this Timing Diagram
SELECT * FROM Activities WHERE ParentActivityID =
'$ParentActivityID'
    Activities give rise to both BarCharts and CNextRequests, depending
on their position in the hierarchy. A top level (parentless) Activity is
always a BarChart, and a lower level Activity is always a Request, but if
the lower level Activity has children, it will give rise to a subsidiary
BarChart as well as a Request.
  Create a CNextRequest
INSERT INTO CNextRequests
(RequestID, LeftEdge, BarChartID, RequestOrder, Activity, Resources,
SubBarChartID)
  VALUES ($RequestID, 0, $BarChartID, 0, '$activityID', NULL, 0)
  Count subsidiary Activities
SELECT COUNT(*) AS ChildCount FROM Activities
  WHERE ParentActivityID = '$activityID'
  Update SubBarChartID in CNextRequest
UPDATE CnextRequests
  SET SubBarChartID = $newBarChartID
  WHERE RequestID = $RequestID
  Find all Requests on left Edge of Timing Diagram
SELECT * FROM Activities
    WHERE Activities.ParentActivityID = '$ParentActivityID'
    AND NOT EXISTS (SELECT * FROM ActivityPredecessors
    WHERE Activities.ActivityID = ActivityPredecessors.ActivityID)
This query may be paraphrased as "select those Activities belonging to this
BarChart and lacking a predecessor Activity".
  Update LeftEdge of Requests with no Predecessors
UPDATE CnextRequests
    SET LeftEdge = $edgeID
    WHERE CNextRequests.Activity = '$ActivityID'
  Find all Requests for next Edge
SELECT R2.RequestID
    FROM CNextRequests AS R1, CNextRequests AS R2,
    ActivityPredecessors AS AP1
    WHERE R1.LeftEdge = $oldEdge
        AND AP1.PredecessorActivityID = R1.Activity
        AND R2.Activity = AP1.ActivityID
    This query may be paraphrased as "select those Requests whose
predecessor Activity mapped to a Request linked to the preceding Edge."
  Update LeftEdge of other Requests
UPDATE CnextRequests
    SET LeftEdge = $edgeID
    WHERE CNextRequests.RequestID = $RequestID
  Select BarChart for export
```

-continued

```
SELECT * FROM [BarCharts] WHERE BarChartID = $BarChartID
  Create Ordered Edge List
SELECT * FROM Edges
    WHERE BarChartID = $BarChartID
    ORDER BY Edges.EdgeNum
  Select Requests for export
SELECT * FROM Requests
    WHERE Requests.LeftEdge = $EdgeID
    ORDER BY Requests.RequestOrder
  Lookup Request Attributes
SELECT ControlAssemblyInstances.Label AS InstanceLabel,
        DCCActions.Label AS ActionLabel,
        DCCElementsTimes.Time
    FROM Requests,
        ControlAssemblyInstances AS Cai,
        DCCActions,
        DCCElementsTimes
    WHERE Requests.RequestID = $RequestID
AND Requests.ControlAssemblyInstanceID =
Cai.ControlAssemblyInstanceID
        AND DCCActions.DCCActionsID = Requests.DCCActionsID
        AND DCCElementsTimes.DCCActionsID =
        Requests.DCCActionsID
```

Enterprise Controls

Enterprise Controls (EC) is a single unifying construct for integrating control system design, simulation, implementation, and maintenance processes (via an integrated object model), and integrating control system design and deployment with external product, process, and machine data models (via an integrated enterprise-wide customer data model). The Designer Studio software provides enterprise control in accordance with a preferred embodiment.

This EC Designer Studio incorporates software from various new software including Enterprise Controls Designer Studio, a transfer machine model, status based diagnostics and code generation engine, a PanelBuilder software comprising: a layout editor and a layout compiler, RSWire (schematics), RSLadder (display and monitor LL), RS SoftLogix 5 (simulator), RS Linx (communications gateway/router), PERL Scripting and a relational database such as Microsoft Access.

Figure 54:
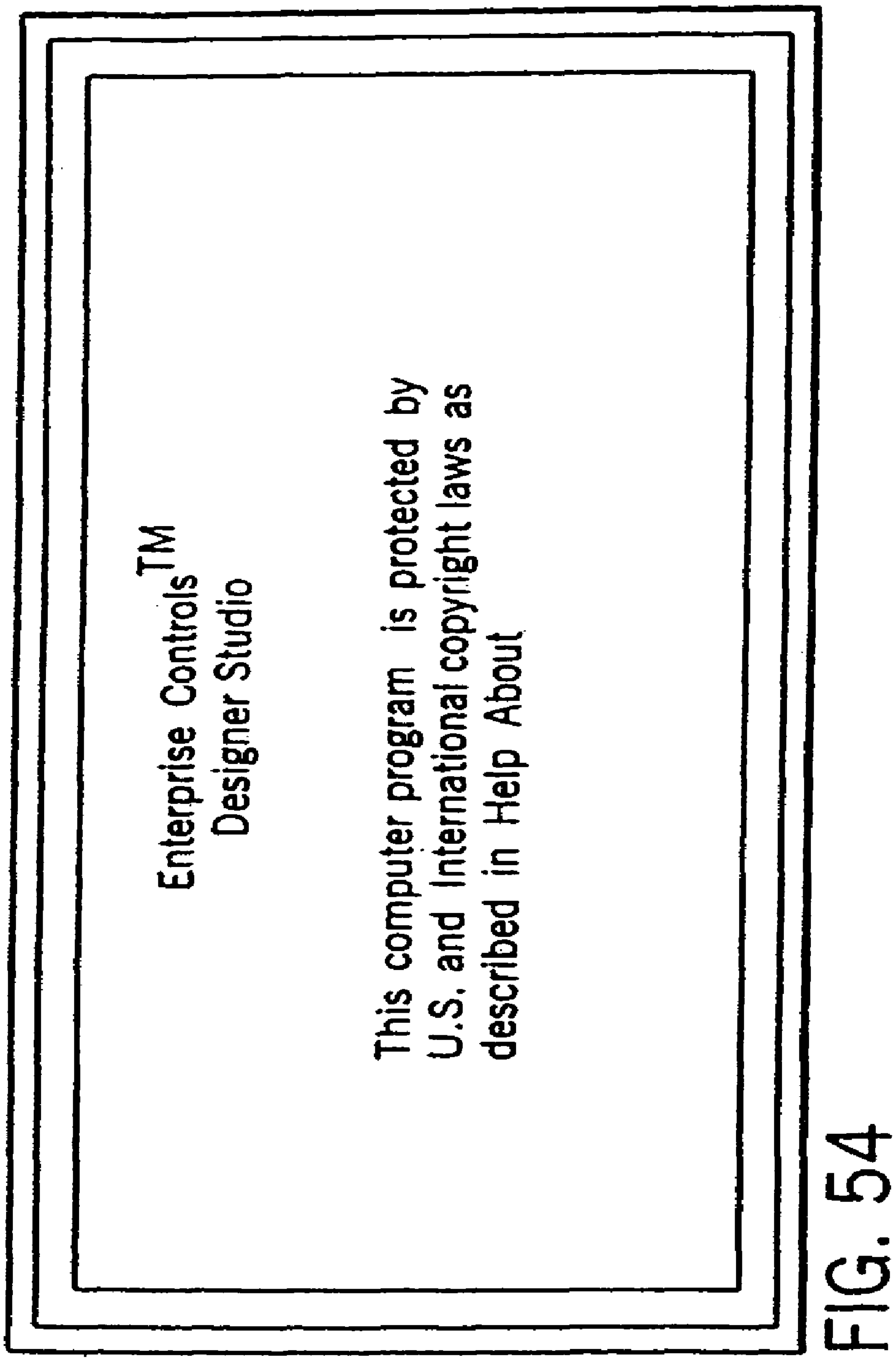
FIG. 54 is a splash screen in accordance with a preferred embodiment.

The EC Designer Studio utilizes Java 1.1, Visual J++ 6.0 and Microsoft Application Foundation Classes (version 2.5). FIG. 54 is a splash screen in accordance with a preferred embodiment. FIG. 55 is the initial display for the Designer Studio in accordance with a preferred embodiment.

The Designer Studio integrates with External Data Models such as Mechanical Resources panel which utilizes resources created within the mechanical modeling environment to provide the resources that need to be controlled. The data models can be based on "BIG" CAD (Unigraphics, SDRC, or CATIA) or "little" CAD (e.g., AutoCAD)] to determine the Resources (Mechanical, Robotic, and Operator). An important part in accordance with a preferred embodiment is a mechanism that determines which elements are to be controlled.

The Designer Studio also integrates a Mechanical Timing Diagram panel which can take on different dimensions based on the particular model which is employed. For example, when CATIA is utilized, the sequence of activities that the resources perform in their process representation of choice are transformed into a Mechanical Timing Diagram in accordance with a preferred embodiment. If AutoCad is utilized, then the Designer Studio must create a Mechanical Timing Diagram.

This process is well suited for processes that use mechanical timing diagrams to describe their sequence of operations.

One of ordinary skill in the art will readily comprehend that real control system design is done in small "chunks" that can be "rationalized" one at a time. In accordance with a preferred embodiment, these chunks will be referred to as Control Assemblies.

Figure 56:
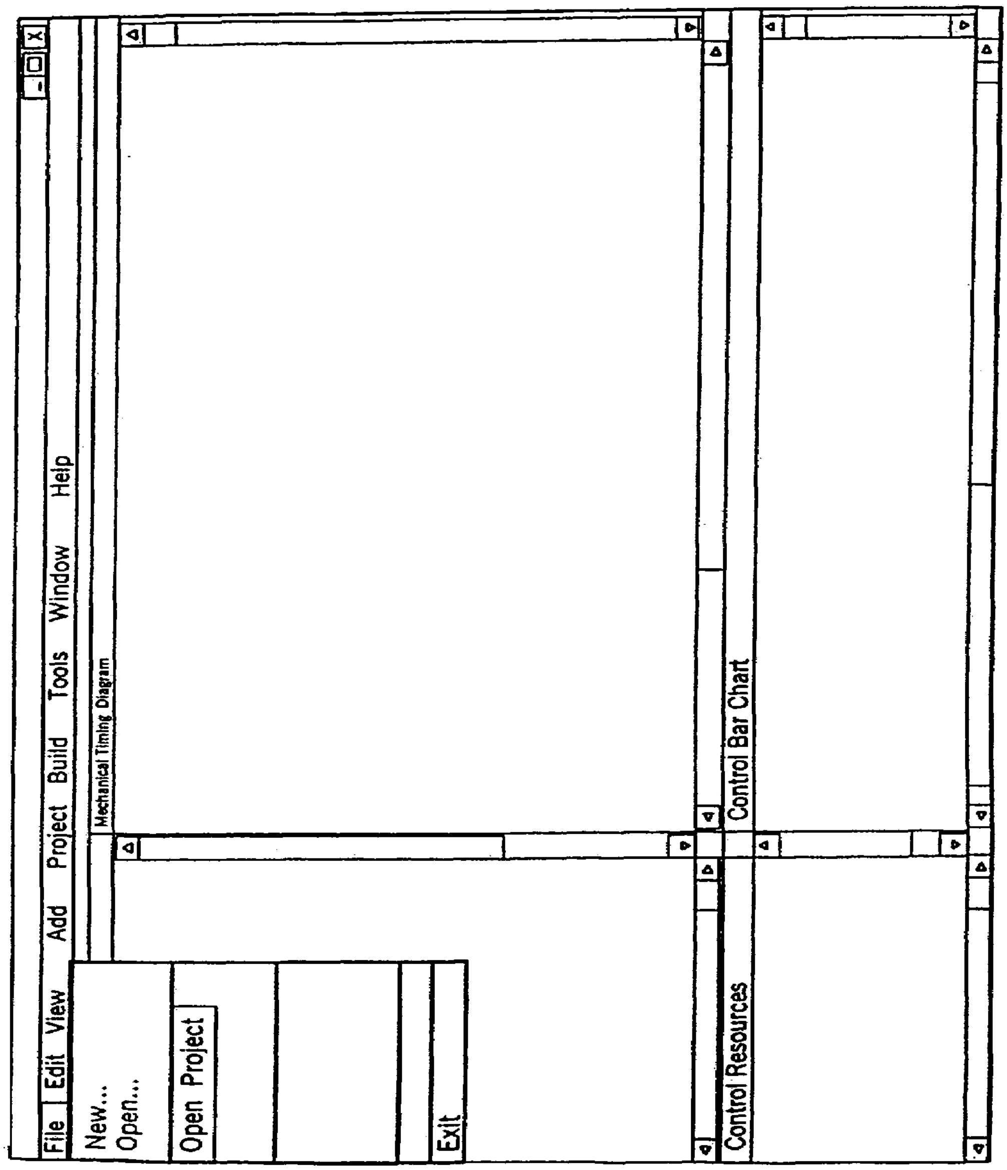
FIG. 56 illustrates a menu that is utilized to open a project in accordance with a preferred embodiment.

FIG. 56 illustrates a menu that is utilized to open a project in accordance with a preferred embodiment. FIG. 57 illustrates a display menu that is utilized to select an existing project to load in accordance with a preferred embodiment. FIG. 58

Illustrates an Open Project dialog in accordance with a preferred embodiment. A user interacts with this display to open a database and read a Mechanical Resources 5810 from the CAD database and transform the process description into a Mechanical Timing Diagram 5820.

One panel 5810 contains a hierarchical tree of the Resources for the IAM 98 Workcell read from the CATIA CAD system and filtered to highlight control information. A second panel 5820 contains a Mechanical Timing Diagram that performs the sequencing of the activities (or operations) that the resources perform. A third panel (Control Resources) 5800 contains the Control Assembly Types that are selected by the EC Designer Studio to be necessary for controlling the Mechanical Resources in the final panel Control Bar Chart 5830 that is populated automatically by the system as control assemblies are created.

EC Control System Design

Control Engineers work on "small", manageable "chunks" of the control system. These chunks or control subsystems are referred to as Control Assemblies as shown in panel 5800. Control Assemblies are created as a first step in defining the enterprise control in accordance with a preferred embodiment. A control engineer creates Control Assemblies (i.e., small chunks of the control system) to control the mechanical resources "that require control" (i.e., resources that have activities in the Mechanical Timing Diagram).

For example a user can create a Control Assembly of type SafeBulkHeadClampSet 5840 in order to control clamps 2506A, 4502A, 5508B, 5509A, 5516A, and 5516B. Note that SafeBulkHeadClampSet was one of the Control Assembly Types predicted by the EC Designer Studio to be useful to the user to control some of the resources in the Mechanical Timing Diagram as evidenced by its name appearing in the Control Resources window 5800.

These clamps perform the activities fixture (close) and release (open) in parallel on the Mechanical Timing Diagram. FIG. 59 illustrates a menu display for facilitating an "Add Control Assembly" dialog 5900 in accordance with a preferred embodiment. FIG. 60 illustrates the first menu in an "Add Control Assembly" dialog in accordance with a preferred embodiment. The Add Control Assembly dialog provides a catalog of reusable control sub-system components: Control Assembly Types (see below for the specification of a Control Assembly. In accordance with the example, the Control Assembly Type selected is a safe-bulkheadclampset 6000.

After selecting the Type the user will click the New button. This user event initiates the Control Assembly Wizard shown in FIG. 61 at 6100.

The Control Assembly Wizard allows a user to create a Control Assembly corresponding to frequently used control subsystem design patterns and allows the user to actuate properties of that Control Assembly. FIGS. 61 to 67 illustrate a user experience with a wizard in accordance with a preferred embodiment.

FIG. 62 illustrates a wizard display in which a control assembly has been selected in accordance with a preferred embodiment. The user must specify a name for the new Control Assembly of Type safe-bulkheadclampset as reflected at 6200.

In FIG. 63, the user specifies the name of the new control assembly in accordance with a preferred embodiment. In the example, the name of the new Control Assembly is 1stclamps. The Control Assembly Type is a reusable component containing a number of user selectable properties (or parameters). 1stclamps is a specific instance of the component for which the user will set the properties. The Control Assembly Wizard defaults are set to automatically create a schematic (i.e., wiring diagram or WD) for the assembly and all the available diagnostics (defined by the Type) for the assembly are preselected. Finally, the documentation format is defaulted to HTML format.

Figure 64:
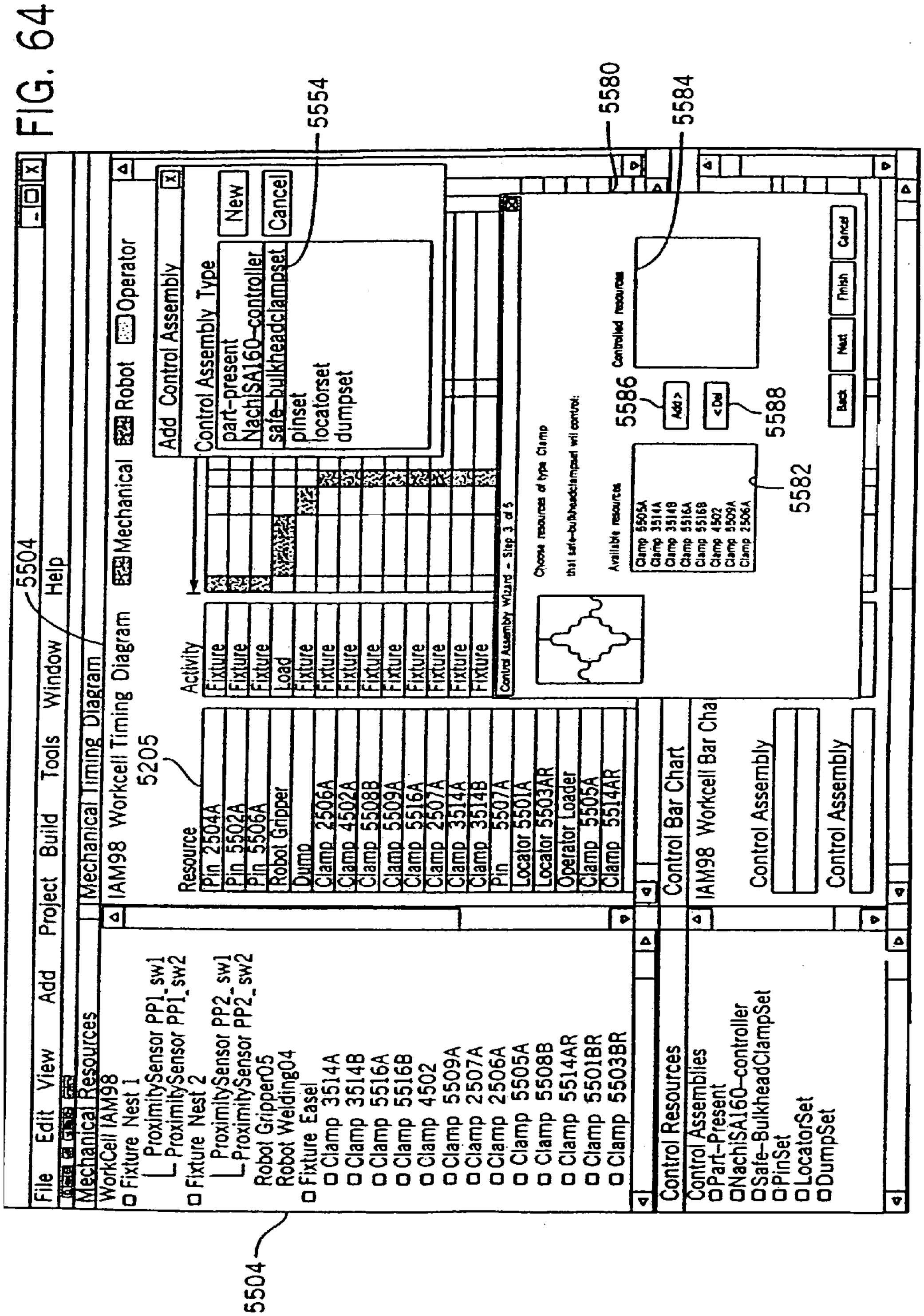

An important feature of the system is the built in diagnostics and documentation that are architected into each component. This feature allows a control engineer to receive a predefined set of diagnostics that are carefully tailored to the characteristics of each component and build diagnostics right into the control system automatically. Moreover, as the system is simulated and ultimately brought into production, the diagnostics are available for integration and analysis from the beginning of the process through the life of the system. Thus, when a failure occurs in the system, there are built-in controls that facilitate immediate identification of the failure and remedy. FIG. 64 illustrates a resource selection display in accordance with a preferred embodiment. A user is presented with a list of available resources 6400 from the Mechanical Timing Diagram that match the type of resource that the control assembly type 6410 can control and are not previously bound to other control assemblies.

FIG. 65 illustrates a selected set of controlled resources in accordance with a preferred embodiment. The selected resources are shown in box 6510 as they are selected from available resources shown at 6500. The user adds resources from the available list 6500 to the controlled resources list 6510 of the resources that will be controlled by the control assembly 1stclamps of type safe-bulkheadclampset 6520.

FIG. 66 informs the user of the control components that will make up the control assembly based on the resources chosen to be controlled in accordance with a preferred embodiment. The control components 6600 and their labels 6610 are provided to assist the user in designing a control strategy. FIG. 67 illustrates the final step in defining control assemblies in accordance with a preferred embodiment. The display window 6700 presents a specification of the control assembly that will be created if a user selects the Finish button.

Figure 68:
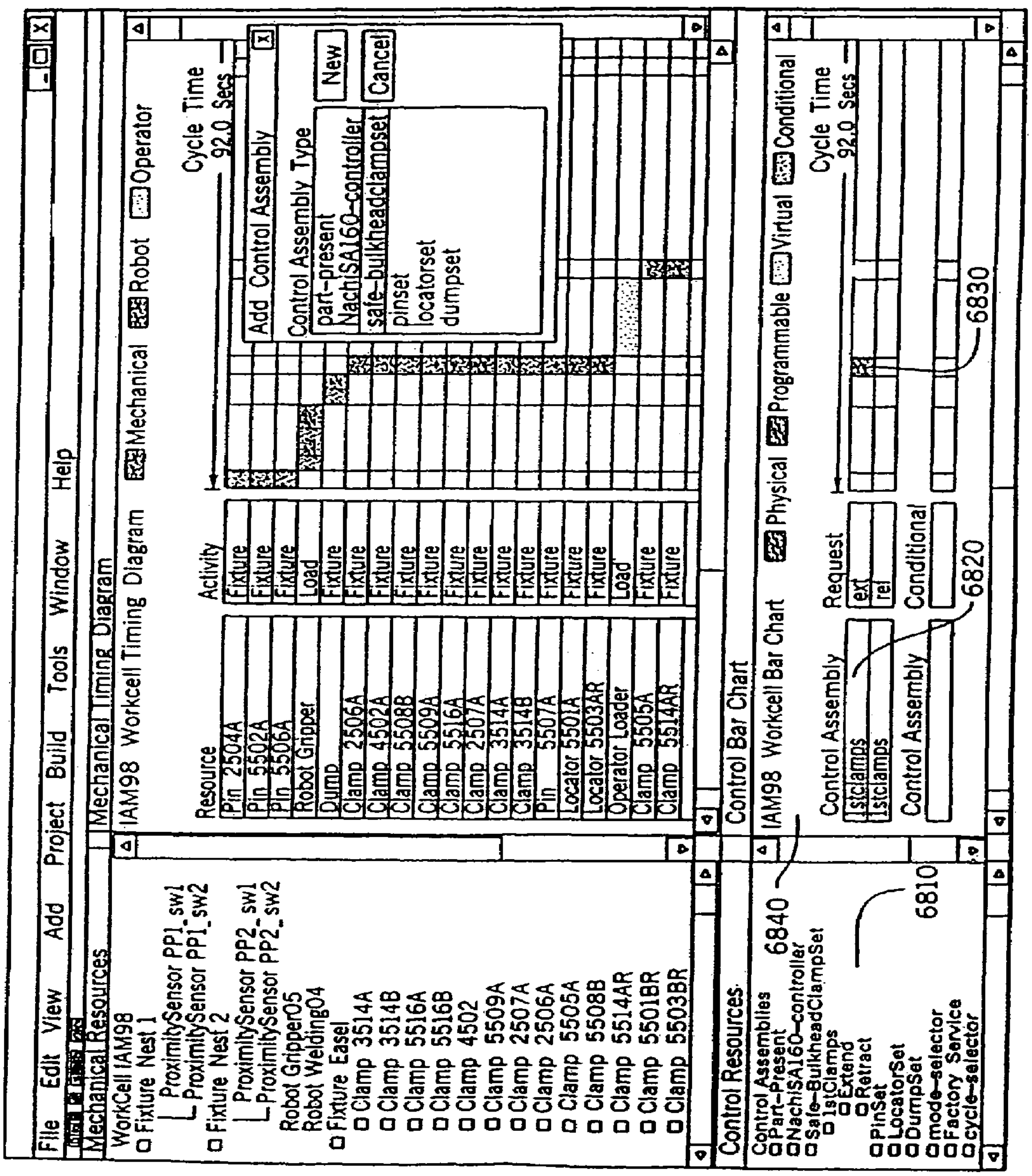
FIG. 68 illustrates the processing that occurs when a user presses the finish button in accordance with a preferred embodiment.

FIG. 68 illustrates the processing that occurs when a user presses the finish button in accordance with a preferred embodiment. First, the Control Assembly 1stClamps is added to the Control Resources hierarchical tree panel in the ECDB. The parent of 1stClamps is the Control Assembly Type SafeBulkHeadClampSet. The children of 1stClamps 6810 are the requests or conditionals that determine the behavior of 1stClamps. In this case 1stClamps has two requests: extend and retract 6810.

The requests (extend and retract) 6810 corresponding to the activities (fixture and release) of the clamps controlled by 1stClamps are automatically added to the Control Bar Chart panel 6840. The bars 6830 denote the time period during which the extend and retract requests occur. The Control Bar Chart panel 6840 shows the sequence of requests made by the Control Assembly 1stClamps. The Control Bar Chart 6840 is a control system-wide tool that shows the sequence of Control Assembly requests.

There are relationships between the control assembly 1stClamps 6810, the Mechanical Resources it controls, the Activities these resources perform, and the requests made by 1stClamps to these resources to initiate their activities.

Figure 69:
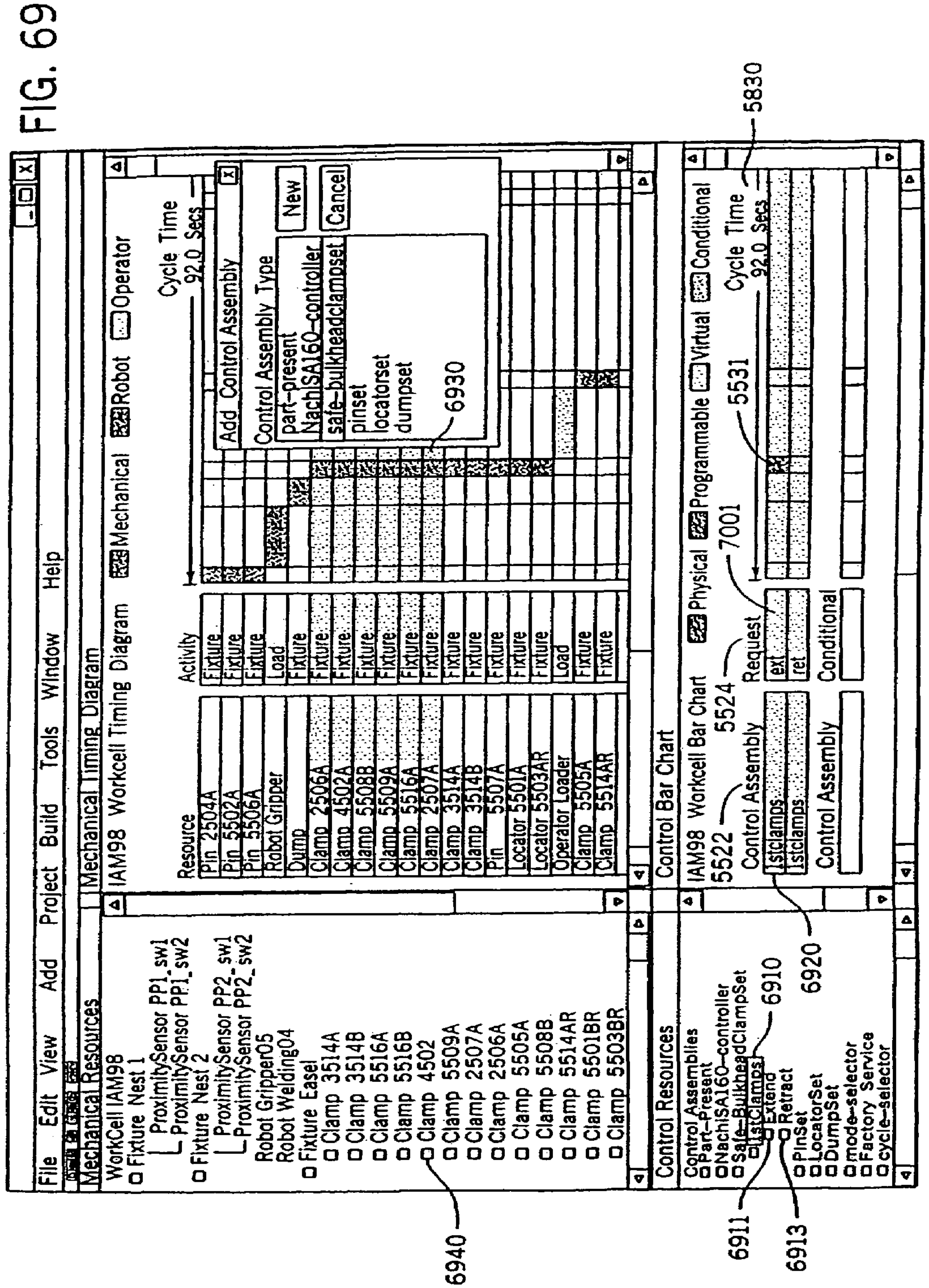
FIG. 69 illustrates the selection processing associated with a particular CA in accordance with a preferred embodiment.
Figure 70:
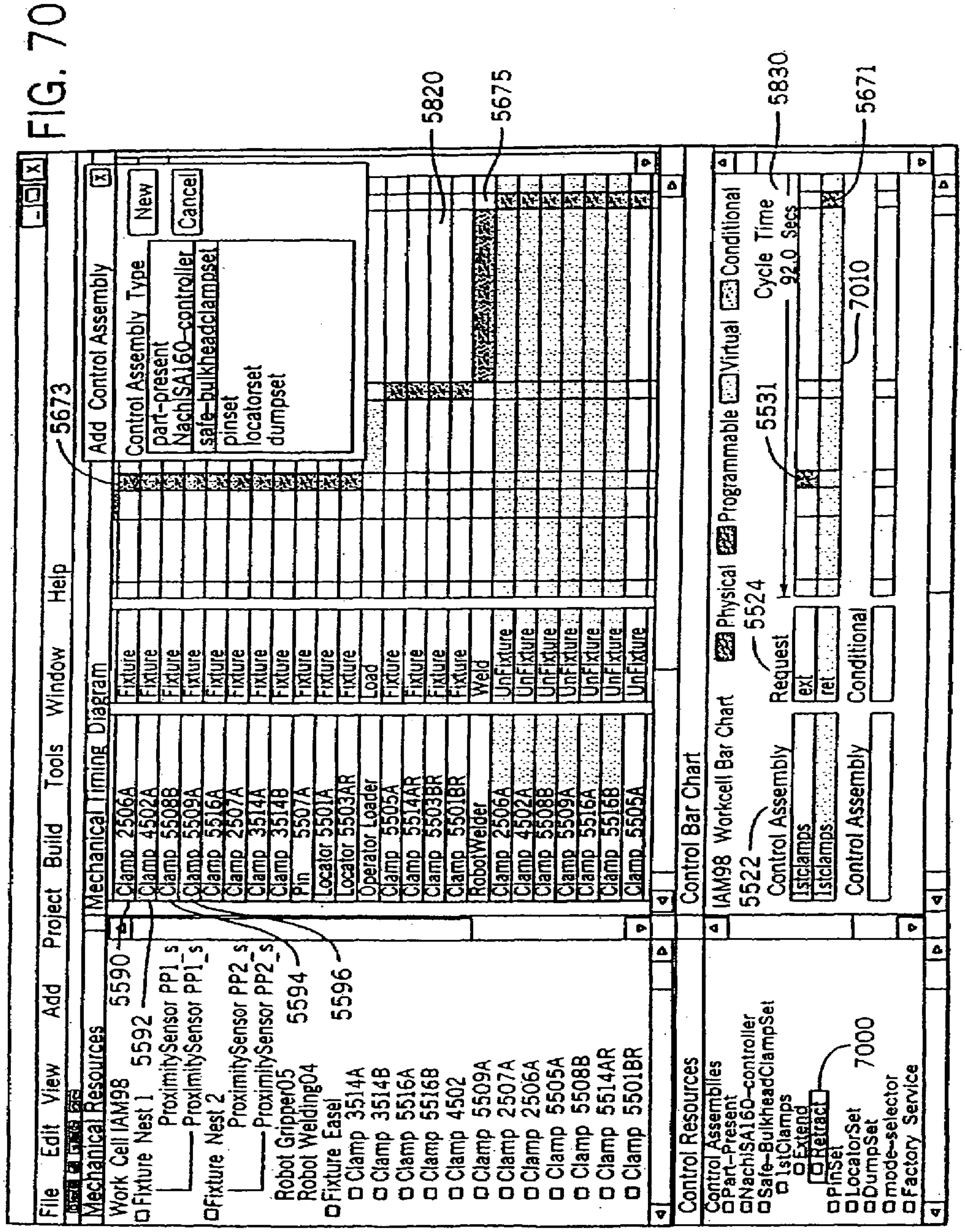
FIG. 70 illustrates the processing of a CA in accordance with a preferred embodiment.

FIG. 69 illustrates the selection processing associated with a particular control assembly in accordance with a preferred embodiment. To see these relationships a user selects 1stClamps 6910 in the Control Resources panel. This action highlights 6940 the clamps that 1stClamps controls in the Mechanical Resources panel, the activities 6930 that these resources perform in the Mechanical Timing Diagram panel, and the requests made by 1stClamps to these resources to actuate their activities in the Control Bar Chart panel 6920.

Using the scroll bars we can arrange the Mechanical Timing Diagram and the Control Bar Chart to see the sequencing relationship between the Timing Diagram of the Mechanical Resource activities and the requests of the 1stClamps control assembly. The activities of the clamps controlled by 1stClamps and the requests of 1stClamps occur in the same columns (i.e., during the same time period of the cycle).

FIG. 70 illustrates the processing of a control assembly in accordance with a preferred embodiment. When a user clicks the mouse on the retract 7000 request of 1stClamps the user can see the activities 7010 controlled by the request. FIGS. 71 to 79 provide additional displays in accordance with a preferred embodiment.

Schematic Tool: Allows user to add the control system-wide schematic components such as factory services, rack layouts, . . . and to connect the Control Assembly Instances electrically, pneumatically, and hydraulically via a control system-wide tool.

e.g., RSWire adapted to work off an integrated data model that allows a local (i.e., Control Assembly) schematic environment and a control system-wide tool that connects Control Assemblies and adds the additional schematics necessary to complete the Control System-wide design (e.g., Factory Services, Rack Layouts, . . . ) HMI Tool: Allows the user to combine the viewable entities in the control assemblies to layouts to monitor and control the process EC Simulation Visualization of the PLC LL execution is enabled by using RSLogix. Visualization of a current step(s) the machine is waiting on Visualization the "control process", i.e., animate the Bar Chart. Use generated code via SoftLogix to animate in 3-D visualization of the workcell machines in order to simulate the process and the subsequent creation of the product Note: in EC all these simulations run off the same data model.

EC Control System Implementation

Bill of materials (from RS Wire Schematics)

Make control system bill of materials and control system process available to the Machine and Process designers (i.e., export to CNext)

Code generation Tool

Diagnostics Generation Tool

HMI (Visualization) Generation Tool

EC Control System Maintenance

Diagnostics

Keeping control system design consistent with Product, Process, and Machine Design Password protect to provide restricted access to RLL and the capability to record and changes that are made to the RLL that must be reengineered into the design.

A Control Assembly Component is a deployable control subsystem that exposes an interface (to Control System-wide tools) that is a composition of the following parts using a common object (or data) model and is easily configurable by setting properties.

1 Control Components
  1 Definition: a control component is an entity that either sends a control signal, receives a control signal, or both sends and receives control signals.
  ___ These components control the flow of the motive forces (electrical, pneumatic, and hydraulic) that cause mechanical operations to occur.
  2 Examples: solenoid valve (receives), proximity sensor (sends), Robot interface (both), PanelView interface (both), pushbutton (sends), indicator light (receives), motor controller (both), ...
___2 Mechanical Components
  ___3 Definition: a mechanical component that is required to implement or deploy the control subsystem (e.g., pneumatic hoses, check valves, ...)
___3 Logic
  ___4 Definition: the logic specifies the control and fault states, the transitions between states that the control components can attain (i.e., the restricted state space of the control assembly), the controller outputs which produce the transitions, and inputs to the controller determine the current state.
___The following examples identify three types of logic groupings: input only, output only, and input/output.
  ___5 Examples:
    ___1 n-sensor PartPresent (input)
      ___1 States
        ___1 Part Absent
        ___2 Part Present
        ___3 Part out of position
      ___2 Transitions
        ___1 Part Absent => Part Present
        ___2 Part Present => Part out of position
        ___3 Part out of position => Part Absent
        ___4 Part Absent => Part Present
        ___5 Part Absent => Part out of position
        ___6 Part out of position => Part Present
      ___3 Outputs
        ___1 None
      ___4 Inputs
        ___1 all n off (Part Absent)
        ___2 all n on (Part Present)
        ___3 k of n on (k < n, k > 0) (Part out of position)
    ___2 ClearToEnterLight (output) (e.g., single light also could be multiple lights)
      ___1 States
        ___1 LightOn
        ___2 LightOff
      ___2 Transitions
        ___1 LightOn => LightOff
        ___2 LightOff => LightOn
      ___3 Outputs
        ___1 LightOnSignal (LightOff => LightOn)
        ___2 Not LightOnSignal (LightOn => LightOff)
    ___3 SafeBulkHeadClamp (both)
      ___1 States
        ___1 Retracted
        ___2 Extended
        ___3 Between
      ___2 Transitions
        ___1 Retracted => Between
        ___2 Between => Extended
        ___3 Extended => Between
        ___4 Between => Retracted
      ___3 Outputs
        ___1 Extend (both valves opened = 4 outputs high)
        ___2 Retract (main valve closed = 2 outputs high)
      ___4 Inputs
        ___1 Retracted (retract proximity sensors on for all cylinders)
        ___2 Extended (extend proximity sensors off for all cylinders)
        ___3 Between (one or more sets of proximity sensors both off)
        ___4 Fault 1 (one set of proximity sensors both on)
        ___5 Fault 2 (one or more of the set of sensors disagrees with the others for a nominally significant time period).

-continued

____4 Diagnostics
____6 Definition: Status-based diagnostics - specifies the step(s) that the machine is currently waiting to occur (if a fault occurs it specifies the step(s) that were waiting to occur at the time of the fault, i.e., the symptoms).
____Note: this information is available for both well behavior and fault behavior.
____7 Definition2: Causal model-based diagnostics - use a model of causal relationships to develop rules that relate machine status to root causes.
____8 Examples:
____1 Consider that a human mechanic has incorrectly moved the mount location of a part present proximity sensor causing a misalignment.
____1 Status-based: determines that the machine is "waiting for part present sensor #2" (no automatic inference possible)
____2 Consider that the proximity sensor on a clamp cylinder has failed
____1 Status-based: determines that machine is "waiting for clamp cylinder 2504A"
____2 Causal model-based: logic infers that the extend proximity sensor on cylinder 2504A has failed, or that cylinder 2504A is stuck.
____5 Schematics
____9 Definition: a schematic is a representation of the electrical, pneumatic, and hydraulic interface to the control assembly.
____10 Examples:
____1 Ielectrical
____2 Ipneumatic
____3 Ihydraulic
____4 ...
____6 Visualization
____11 Definition: entities within the control assembly that are useful to portray textually or graphically.
____12 Examples:
____1 Control Components (textually or graphically)
____2 Logic (graphically: RLL, Function Blocks, Axis-like diagrams, state diagrams ...) what ever conveys the logic to the user.
____3 Diagnostics
____1 Status messages
____2 Causal messages
____4 Schematics
____1 Typed connections (electrical, pneumatic, network, ...) within Control Assembly and to and from the Control Assembly (i.e., the interface to the Control Assembly.
____2 Bill of Materials (to deploy the control assembly)
____3 ...
____5 Controlled Resources
____6 Requests
____7 Controlled Resources
____13 Definition: properties of the resource controlled by the control assembly that place requirements (i.e., add constraints) on the structure of the assembly
____14 Example
____1 Clamp 1
____1 Safety constraint: if lose power clamp must fail open
____8 Requests or Conditions
____15 Definition: request an operation (optionally with confirmation) or request a status of the external world (color code)
____1 Request Action Request Status
____2 Request Action
____3 Request Status
____4 Note: how to handle complicated actions (initialization, robot protocols, ...)
____16 Examples:
____1 PartPresent
____1 SensePart (Request Status)
____2 ClearToEnterLight
____1 TurnOn (Request Action)
____2 TurnOff (Request Action)
____3 SafeBulkHeadClamp
____1 Extend
____2 Retract
____4 SafetyGate
____1 SenseSafe (Request Status)
____9 Documentation
____
____ Control Bar Chart panel: Allows user to sequence the Requests of Control Assembly Instances via a control system-wide tool called a Control Bar Chart.

Schematic Tool: Allows user to add the control system-wide schematic components such as factory services, rack layouts, . . . and to connect the Control Assembly Instances electrically, pneumatically, and hydraulically via a control system-wide tool e.g., RSWire adapted to work off an integrated data model that allows a local (i.e., Control Assembly) schematic environment and a control system-wide tool that connects Control Assemblies and adds the additional schematics necessary to complete the Control System-wide design (e.g., Factory Services, Rack Layouts, . . . )

HMI Tool: Allows the user to combine the viewable entities in the control assemblies to layouts to monitor and control the process EC Simulation Visualization of the LL execution is facilitated through the use of RSLogix (RSLadder is better)

Visualization the current step(s) the machine is waiting on

Visualization the "control process", i.e., animate the Bar Chart

Use generated code via SoftLogix to animate in 3-D visualization of the workcell machines in order to simulate the process and the subsequent creation of the product Note: in EC all these simulations run off the same data model.

Figure 80:
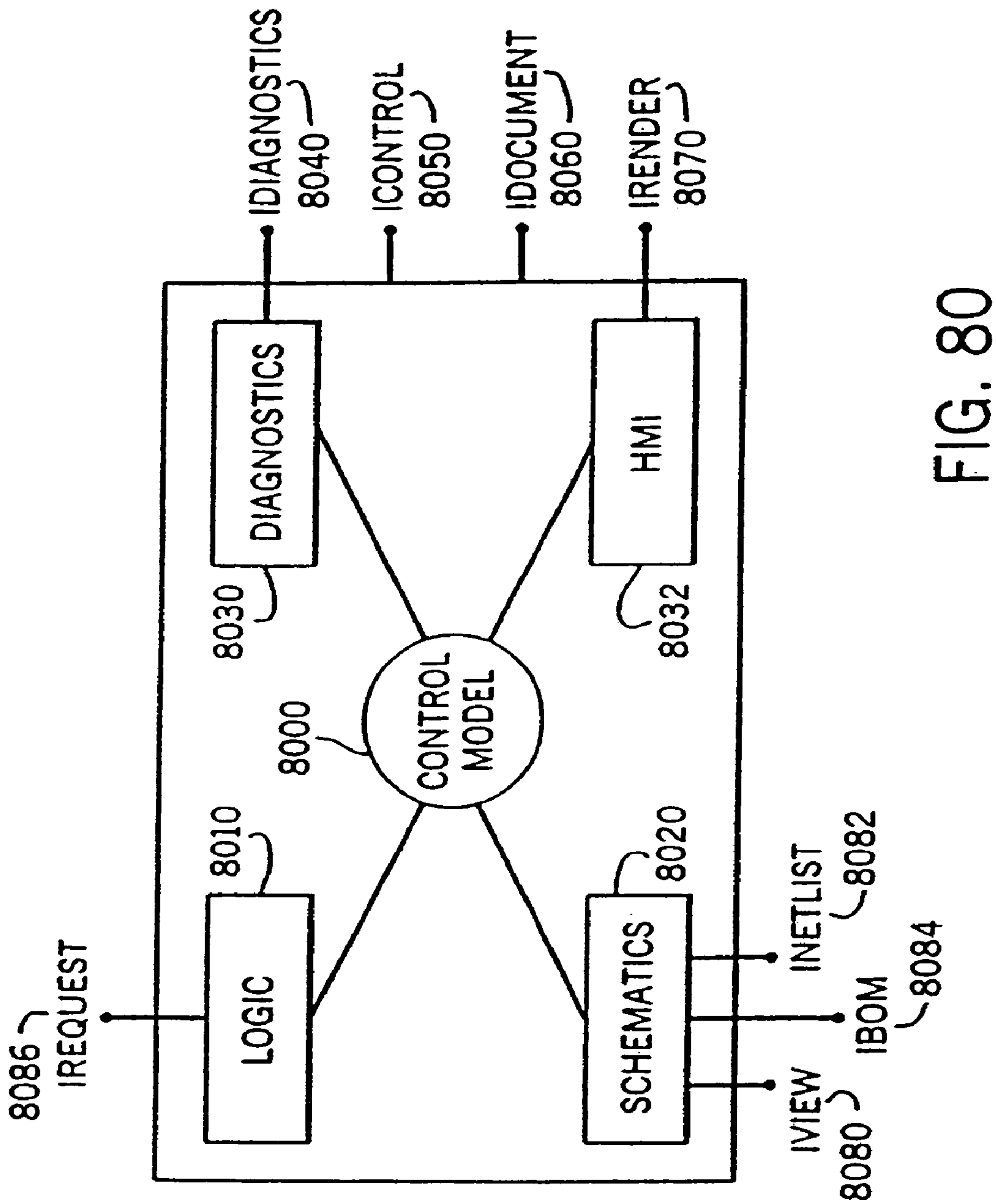
FIG. 80 is a block diagram of a CA in accordance with a preferred embodiment.

____
____ EC Control System Implementation
____ Bill of materials (from RS Wire Schematics)
____ Make control system bill of materials and control system process available to the Machine and Process designers (i.e., export to CNext)
____ Code generation Tool
____ Diagnostics Generation Tool
____ HMI (Visualization) Generation Tool
____
____EC Control System Maintenance
____ Diagnostics
____ Keeping control system design consistent with Product, Process, and Machine Design
____ Password protect to provide restricted access to LL and the capability to record and changes that are made to the LL that must be reengineered into the design.
____
____ Definition: a Control Assembly Component is a deployable control subsystem that exposes an interface (to Control System-wide tools) that is a composition of the following parts using a common object (or data) model and is easily configurable by setting properties. FIG. 80 is a block diagram of a control assembly in accordance with a preferred embodiment. The boxed region designates the control assembly component which is a container. The assembly component is a composition of a logic class 8010, a diagnostics class 8030, schematics class 8020, Human Machine Interface (HMI) class 8032 and a control model 8000. The control model 8000 which contains the common fields and methods (logic) for a control assembly class. The logic 8010 is a class that contains the fields and methods that are unique to the logic portions of a control assembly type. The diagnostics class 8030 is a class that contains the fields and methods that are unique to the diagnostics portions of a control assembly type. The schematics class 8020 is a class that contains the fields and methods that are unique to the schematics portions of a control assembly type. The HMI class 8032 is a class that contains the fields and methods that are unique to the user interface portions of a control assembly type.

The Irequest interface 8086 specifies the external behavior methods (logic) for controlling a controlled resource. For example, the message that invokes the logic for opening and closing a clamp. The IView interface 8080 specifies the external behavior methods (logic) for viewing schematics (electrical, hydraulic and pneumatic). The IBOM interface -continued 8084 specifies the external behavior methods (logic) for retrieving the Bill-Of-Materials (BOM) for a control assembly component. The INetlist interface 8082 specifies the external behavior methods (logic) for retrieving the electrical, pneumatic and hydraulic connections between the control and mechanical devices within a control assembly component.

The IRender interface 8070 specifies the external behavior method (logic) for retrieving viewable elements and their properties and generating a user interface. The IDocument interface 8060 specifies the external behavior method (logic) for producing documentation of the control assembly component. the IControl interface 8050 specifies the external behavior method (logic) for retrieving the resources that the control assembly component is capable of controlling. The IDiagnostics interface 8040 specifies the external behavior method (logic) for selecting diagnostics that are instantiated for a control component.

____10 Control Components
____17 Definition: a control component is an entity that either sends a control signal, receives a control signal, or both sends and receives control signals.
____ These components control the flow of the motive forces (electrical, pneumatic, and hydraulic) that cause mechanical operations to occur.
____18 Examples: solenoid valve (receives), proximity sensor (sends), Robot interface (both), PanelView interface (both), pushbutton (sends), indicator light (receives), motor controller (both), ...
____11 Mechanical Components
____19 Definition: a mechanical component that is required to implement or deploy the control subsystem (e.g., pneumatic hoses, check valves, ...)
____12 Logic
____1 Definition: the logic specifies the control and fault states, the transitions between states that the control components can attain (i.e., the restricted state space of the control assembly), the controller outputs which produce the transitions, and inputs to the controller determine the current state.
____The following examples identify three types of logic groupings: input only, output only, and input/output.
____2 Examples:
____1 n-sensor PartPresent (input)
____1 States
____1 Part Absent
____2 Part Present
____3 Part out of position
____2 Transitions
____1 Part Absent => Part Present
____2 Part Present => Part out of position
____3 Part out of position => Part Absent
____4 Part Absent => Part Present
____5 Part Absent => Part out of position
____6 Part out of position => Part Present
____3 Outputs
____1 None
____4 Inputs
____1 all n off (Part Absent)
____2 all n on (Part Present)
____3 k of n on (k < n, k > 0) (Part out of position)
____2 ClearToEnterLight (output) (e.g., single light also could be multiple lights)
____1 States
____1 LightOn
____2 LightOff
____2 Transitions
____1 LightOn => LightOff
____2 LightOff => LightOn
____3 Outputs
____1 LightOnSignal (LightOff => LightOn)
____2 Not LightOnSignal (LightOn => LightOff)
____3 SafeBulkHeadClamp (both)
____4 States
____1 Retracted
____2 Extended
____3 Between
____5 Transitions
____1 Retracted => Between
____2 Between => Extended
____3 Extended => Between
____4 Between => Retracted
____6 Outputs
____1 Extend (both valves opened = 4 outputs high)
____2 Retract (main valve closed = 2 outputs high)

-continued

____7 Inputs
____1 Retracted (retract proximity sensors on for all cylinders)
____2 Extended (extend proximity sensors off for all cylinders)
____3 Between (one or more sets of proximity sensors both off)
____4 Fault 1 (one set of proximity sensors both on)
____5 Fault 2 (one or more of the set of sensors disagrees with the others for a nominally significant time period).
____13 Diagnostics
____1 Definition: Status-based diagnostics - specifies the step(s) that the machine is currently waiting to occur (if a fault occurs it specifies the step(s) that were waiting to occur at the time of the fault, i.e., the symptoms).
____Note: this information is available for both well behavior and fault behavior.
____2 Definition2: Causal model-based diagnostics - use a model of causal relationships to develop rules that relate machine status to root causes.
____3 Examples:
____3 Consider that a human mechanic has incorrectly moved the mount location of a part present proximity sensor causing a misalignment.
____1 Status-based: determines that the machine is “waiting for part present sensor #2” (no automatic inference possible)
____4 Consider that the proximity sensor on a clamp cylinder has failed
____1 Status-based: determines that machine is “waiting for clamp cylinder 2504A”
____2 Causal model-based: logic infers that the extend proximity sensor on cylinder 2504A has failed, or that cylinder 2504A is stuck.
____14 Schematics
____1 Definition: a schematic is a representation of the electrical, pneumatic, and hydraulic interface to the control assembly.
____2 Examples:
____5 Ielectrical
____6 Ipneumatic
____7 Ihydraulic
____8 ...
____15 Visualization
____20 Definition: entities within the control assembly that are useful to portray textually or graphically.
____21 Examples:
____1 Control Components (textually or graphically)
____2 Logic (graphically: LL, Function Blocks, Axis-like diagrams, state diagrams ...) what ever conveys the logic to the user.
____3 Diagnostics
____1 Status messages
____2 Causal messages
____4 Schematics
____1 Typed connections (electrical, pneumatic, network, ...) within Control Assembly and to and from the Control Assembly (i.e., the interface to the Control Assembly.
____2 Bill of Materials (to deploy the control assembly)
____3 ...
____5 Controlled Resources
____6 Requests
____16 Controlled Resources
____22 Definition: properties of the resource controlled by the control assembly that place requirements (i.e., add constraints) on the structure of the assembly
____23 Example
____1 Clamp 1
____1 Safety constraint: if lose power clamp must fail open
____17 Requests or Conditions
____24 Definition: request an operation (optionally with confirmation) or request a status of the external world (color code)
____1 Request Action Request Status
____2 Request Action
____3 Request Status
____4 Note: how to handle complicated actions (initialization, robot protocols, ...)
____25 Examples:
____1 PartPresent
____1 SensePart (Request Status)
____2 ClearToEnterLight
____1 TurnOn (Request Action)
____2 TurnOff (Request Action)

-continued

| |
|---|
| ___3 SafeBulkHeadClamp |
| ___1 Extend |
| ___2 Retract |
| ___4 SafetyGate |
| ___1 SenseSafe (Request Status) |
| ___9 Documentation |
| ___ |

While the invention is described in terms of preferred embodiments in a specific system environment, those skilled in the art will recognize that the invention can be practiced, with modification, in other and different hardware and software environments within the spirit and scope of the appended claims.

The invention is to cover all modifications, equivalents, and alternatives falling within the spirit and scope of the invention as defined by the following appended claims. To apprise the public of the scope of this invention, the following claims are made:

What is claimed is:

1. A method for identifying sections of an existing schematic that are consistent with design practices, the method comprising the steps of:

providing a template set, each template specifying a sub-set of components and relationships that are consistent with design practices; and using a processor for examining the existing schematic to identify sections of the existing schematic that are inconsistent with the design practices specified in the template set;

wherein the section that is inconsistent with the design practices is an inconsistent section, the method further including the step of, when a section of the existing schematic is inconsistent with the design practices specified in the template set, performing a function on the existing schematic; and wherein the function includes visually displaying the inconsistent section in a distinguishing manner.

2. The method of claim 1 wherein the existing schematic is an electrical schematic and wherein the step of providing a template set includes providing templates that specify both electrical icons corresponding to electrical components and relationships between the electrical icons.

3. The method of claim 1 wherein the design practices are best design practices.

4. A method for identifying sections of an existing schematic that are consistent with design practices, the method comprising the steps of:

providing a template set, each template specifying a sub-set of components and relationships that are consistent with design practices; and using a processor for examining the existing schematic to identify sections of the existing schematic that are inconsistent with the design practices specified in the template set;

wherein the section that is inconsistent with the design practices is an inconsistent section, the method further including the step of, when a section of the existing schematic is inconsistent with the design practices specified in the template set, performing a function on the existing schematic; and wherein the function includes automatically identifying a template that indicates a possible replacement for the inconsistent section and automatically providing at least a section of the identified template.

5. An apparatus for identifying sections of an existing schematic that are consistent with design practices, the apparatus comprising:

a database storing a template set, each template specifying a sub-set of components and relationships that are consistent with design practices; and a processor linked to the database and receiving the existing schematic, the processor programmed to examine the existing schematic to identify sections of the existing schematic that are inconsistent with the design practices specified in the template set;

wherein the section that is inconsistent with the design practices is an inconsistent section, the processor further programmed to, when a section of the existing schematic is inconsistent with the design practices specified in the template set, perform a function on the existing schematic; and further including an interface, wherein the function performed by the processor when a section of the existing schematic is inconsistent with the design practices includes visually displaying the inconsistent section in a distinguishing manner via the interface.

6. The apparatus of claim 5 wherein the existing schematic is an electrical schematic and wherein the template set stored in the database includes templates that specify both electrical icons corresponding to electrical components and relationships between the electrical icons.

7. The apparatus of claim 5 wherein the design practices are best design practices.

8. An apparatus for identifying sections of an existing schematic that are consistent with design practices, the apparatus comprising:

a database storing a template set, each template specifying a sub-set of components and relationships that are consistent with design practices; and a processor linked to the database and receiving the existing schematic, the processor programmed to examine the existing schematic to identify sections of the existing schematic that are inconsistent with the design practices specified in the template set;

wherein the section that is inconsistent with the design practices is an inconsistent section, the processor further programmed to, when a section of the existing schematic is inconsistent with the design practices specified in the template set, perform a function on the existing schematic; and further including an interface, wherein the function performed by the processor when a section of the existing schematic is inconsistent with the design practices includes automatically identifying a template that indicates a possible replacement for the inconsistent section and automatically providing at least a section of the identified template via the interface.

9. A method for identifying sections of an existing schematic that are consistent with design practices, the method comprising the steps of:

providing a template set, each template specifying a sub-set of components and relationships that are consistent with design practices; and using a processor for examining the existing schematic to identify sections of the existing schematic that are inconsistent with the design practices specified in the template set;

wherein a section that is inconsistent with the design practices is an inconsistent section, the method further including the step of, when a section of the existing schematic is inconsistent with the design practices specified in the template set, visually displaying the inconsistent section in a distinguishing manner;

wherein, when a section of the existing schematic is inconsistent with the design practices specified in the template set, automatically identifying a template that indicates a possible replacement for the inconsistent section and automatically providing at least a section of the identified template.

10. The method of claim 9 wherein the existing schematic is an electrical schematic and wherein the step of providing a template set includes providing templates that specify both electrical icons corresponding to electrical components and relationships between the electrical icons.

11. The method of claim 9 wherein the existing schematic is an electrical schematic and wherein the step of providing a template set includes providing templates that specify both electrical icons corresponding to electrical components and relationships between the electrical icons.

12. The method of claim 9 wherein the design practices are best design practices.

* * * * *